US009438237B1

(12) United States Patent
Haigh et al.

(10) Patent No.: US 9,438,237 B1
(45) Date of Patent: Sep. 6, 2016

(54) HIGH-YIELDING STANDARD CELL LIBRARY AND CIRCUITS MADE THEREFROM

(71) Applicants: Jonathan Haigh, Pittsburgh, PA (US); Vyacheslav V. Rovner, Pittsburgh, PA (US)

(72) Inventors: Jonathan Haigh, Pittsburgh, PA (US); Vyacheslav V. Rovner, Pittsburgh, PA (US)

(73) Assignee: PDF Solutions, Inc., San Jose, CA (US)

( * ) Notice: Subject to any disclaimer, the term of this patent is extended or adjusted under 35 U.S.C. 154(b) by 713 days.

(21) Appl. No.: 13/866,487

(22) Filed: Apr. 19, 2013

(51) Int. Cl.
*H03K 19/177* (2006.01)
*H03K 19/0175* (2006.01)

(52) U.S. Cl.
CPC .............................. *H03K 19/017581* (2013.01)

(58) Field of Classification Search
CPC ..................... H03K 19/017581; G06F 17/505
USPC .............................................................. 326/38
See application file for complete search history.

(56) References Cited

U.S. PATENT DOCUMENTS

| | | | | | |
|---|---|---|---|---|---|
| 5,847,421 | A * | 12/1998 | Yamaguchi | H01L 27/11803 257/202 |
| 6,453,447 | B1 * | 9/2002 | Gardner | G06F 17/5068 716/103 |
| 2009/0083691 | A1 * | 3/2009 | Penzes | G06F 17/5031 716/104 |
| 2013/0007676 | A1 * | 1/2013 | Motiani | G06F 17/5045 716/101 |
| 2016/0110486 | A1 * | 4/2016 | Kheterpal | G06F 17/505 716/101 |

* cited by examiner

*Primary Examiner* — Don Le
(74) *Attorney, Agent, or Firm* — David Garrod

(57) ABSTRACT

An improved 20/22 nm standard cell library, as depicted in FIGS. 1-491, achieves surprisingly significant improvements in manufacturing yield, as compared to a commercially-used library for the same fabrication process. The invention relates to product ICs made using this library (or topologically equivalent variants thereof), as well as processes for making such product ICs using said library (or its variants).

18 Claims, 491 Drawing Sheets

HIGH-YIELDING STANDARD CELL LIBRARY AND CIRCUITS MADE THEREFROM

FIELD OF THE INVENTION

The present invention relates generally to the field of integrated circuits, more specifically to integrated circuits that are designed/constructed to achieve high fabrication yield in deep submicron (e.g., 22 nm and below) processes, and also to such circuits rendered using standard cell techniques.

BACKGROUND OF THE INVENTION

Standard cells are a well-established technology for constructing integrated circuits (ICs), especially ICs that contain significant random logic sections, such as system-on-a-chip (SoC) ICs. See S. Saika, "Standard cell library and semiconductor integrated circuit," U.S. Pat. No. 8,302,057 B2 (incorporated by reference herein), J. J. Lee, et al., "Standard Cell Placement Technique For Double Patterning Technology," U.S. Pat. Applic. No. 20130036397 A1 (also incorporated by reference herein), D. D. Sherlekar, "Power Routing in Standard Cell Designs," U.S. Pat. Applic. No. 20120249182 A1 (also incorporated by reference herein), H. H. Nguyen, et al., "7-tracks standard cell library," U.S. Pat. No. 6,938,226 (also incorporated by reference herein), P. Penzes, et al., "High-speed low-leakage-power standard cell library," U.S. Pat. No. 8,079,008 (also incorporated by reference herein), H.-Y. Kim, et al., "Standard cell libraries and integrated circuit including standard cells," U.S. Pat. No. 8,174,052 (also incorporated by reference herein), and O. M. K. Law, et al., "Standard cell architecture and methods with variable design rules," U.S. Pat. No. 8,173,491 (also incorporated herein by reference) for examples of known standard-cell techniques.

As IC feature sizes continue to shrink, difficult-to-predict side effects of lithography and other fabrication processes have challenged the traditional standard cell model. At feature sizes of 28 nm, 22 nm and below, various restrictions—including new "design rules" and unpredictable interactions between features over longer relative distances—combine to create an environment in which traditional "scaling" of existing libraries to meet new design rules produces unacceptable manufacturing yields, unacceptable area efficiency, or both.

One approach to address these problems has been to impose additional "regularity" restrictions (i.e., restrictions beyond mere design rules) on the IC layouts. See, e.g., V. Kheterpal, V. Rovner, T. G. Hersan, D. Motiani, Y. Takegawa, A. J. Strojwas, and L. Pileggi. "Design methodology for IC manufacturability based on regular logic-bricks," DAC '05, pages 353-358; T. Jhaveri, V. Rovner, L. Liebmann, L. Pileggi, A. J. Strojwas, and J. D. Hibbeler, "Co-Optimization of Circuits, Layout and Lithography for Predictive Technology Scaling Beyond Gratings," IEEE Transactions on Computer-Aided Design of Integrated Circuits and Systems, 29(4):509-527, April 2010. Such restricted design approaches have been employed, for example, in U.S. Pat. No. 8,004,315 ("Process for making and designing an IC with pattern controlled layout regions") to Jhaveri, U.S. Pat. Applic. No. 20080137051 ("Lithography and Associated Methods, Devices, and Systems") to Maly, and U.S. Pat. Applic. No. 20100001321 ("Semiconductor Device Layout Having Restricted Layout Region Including Rectangular Shaped Gate Electrode Layout Features Defined Along At Least Four Gate Electrode Tracks with Corresponding Non-Symmetric Diffusion Regions") to Becker et al.

While the restricted approach can be usefully employed and can be effective in addressing the yield impact of unpredictable interactions in deep submicron processes, there remain certain commercially important applications on which restricted approaches can fall short. A prime example involves standard cell libraries. Such libraries typically include a large number (e.g., hundreds) of cells, including many that implement small logic functions. Implementing such libraries directly (i.e., with support for every cell) using restricted approaches typically leads to poor area efficiency. On the other hand, because the users of such libraries (e.g., fabless chip makers) often have large infrastructure investments (e.g., CAD systems, large collections of macro blocks) that depend on the features of particular libraries, there remains a significant need for translation or adaption of existing standard cell libraries to deep submicron processes in a way that avoids and/or reduces the unpredictable effects that can substantially diminish the yield of otherwise design-rule-clean cell libraries. The present invention addresses this, as well as other, needs.

SUMMARY OF THE INVENTION

The present invention relates to the standard cell library depicted in FIGS. 1-491, to "product ICs" (i.e., not test chips or CVs) made, in whole or in part, from said standard cell library, and to electronic systems that include such product ICs. Through actual testing, not mere simulation or speculation based on use of good design practices, the inventors have determined that chips constructed from the inventive standard cell library achieve surprisingly significant improvements in manufacturing yield, as compared to a commercially-used library for the same fabrication process.

Accordingly, generally speaking, and without intending to be limiting, one aspect of the invention relates to product integrated circuits that contain at least a select number (e.g., twenty-five, fifty, seventy-five, one hundred) distinct cells selected from the set consisting of: an AN2D1 cell; an AN2D2 cell; an AN2D3 cell; an AN2D4 cell; an AN2D8 cell; an AN2D10 cell; an AN2XD2 cell; an AN3D1 cell; an AN3D2 cell; an AN3D4 cell; an AN3D8 cell; an AN3XD2 cell; an AN4D1 cell; an AN4D2 cell; an AN4D4 cell; an AN4D8 cell; an AN4XD2 cell; an AO21D1 cell; an AO21D2 cell; an AO21D4 cell; an AO22D1 cell; an AO22D2 cell; an AO22D4 cell; an AO31D1 cell; an AO31D2 cell; an AO31D4 cell; an AO211D1 cell; an AO211D2 cell; an AO211D4 cell; an AO222D1 cell; an AO222D2 cell; an AO222D4 cell; an AOAI211D1 cell; an AOAI211D2 cell; an AOAI211D3 cell; an AOAI211D4 cell; an AOAI211D6 cell; an AOI21D1 cell; an AOI21D2 cell; an AOI21D3 cell; an AOI21D4 cell; an AOI21D6 cell; an AOI21XD2 cell; an AOI21XD4 cell; an AOI22D1 cell; an AOI22D2 cell; an AOI22D3 cell; an AOI22D4 cell; an AOI22D6 cell; an AOI22XD1 cell; an AO122XD2 cell; an AOI22XD4 cell; an AOI31D1 cell; an AOI31D2 cell; an AOI31D3 cell; an AOI31D4 cell; an AOI31D6 cell; an AOI32D1 cell; an AOI32D2 cell; an AOI32D3 cell; an AOI32D4 cell; an AOI32D6 cell; an AOI211D1 cell; an AOI211D2 cell; an AOI211D3 cell; an AOI211D4 cell; an AOI211D6 cell; an AOI211XD1 cell; an AOI211XD2 cell; an AOI211XD4 cell; an AOI221D1 cell; an AOI221D2 cell; an AOI221D3 cell; an AOI221D4 cell; an AOI221D6 cell; an AOI222D1 cell; an AOI222D2 cell; an AOI222D3 cell; an AOI222D4 cell; an AOI222D6 cell; an AOI222XD1 cell;

an AOI222XD2 cell; an AOI222XD4 cell; a BUFFD1 cell; a BUFFD2 cell; a BUFFD3 cell; a BUFFD4 cell; a BUFFD5 cell; a BUFFD6 cell; a BUFFD7 cell; a BUFFD8 cell; a BUFFD9 cell; a BUFFD10 cell; a BUFFD12 cell; a BUFFD14 cell; a BUFFD16 cell; a BUFFD20 cell; a BUFFD24 cell; a BUFFXD3 cell; a BUFFXD6 cell; a BUFFXD9 cell; a BUFFXXD2 cell; a BUFFXXD4 cell; a BUFFXXD6 cell; a CKAN2D0P5 cell; a CKAN2D1 cell; a CKAN2D1P5 cell; a CKAN2D2 cell; a CKAN2D2P5 cell; a CKAN2D3 cell; a CKAN2D3P5 cell; a CKAN2D4 cell; a CKAN2D4P5 cell; a CKAN2D5 cell; a CKAN2D5P5 cell; a CKAN2D6 cell; a CKAN2D7 cell; a CKAN2D8 cell; a CKAN2D9 cell; a CKAN2D10 cell; a CKBD0P5 cell; a CKBD1 cell; a CKBD1P5 cell; a CKBD2 cell; a CKBD2P5 cell; a CKBD3 cell; a CKBD3P5 cell; a CKBD4 cell; a CKBD4P5 cell; a CKBD5 cell; a CKBD5P5 cell; a CKBD6 cell; a CKBD7 cell; a CKBD8 cell; a CKBD9 cell; a CKBD10 cell; a CKBD11 cell; a CKBD12 cell; a CKBD14 cell; a CKBD16 cell; a CKBD20 cell; a CKBD24 cell; a CKBD32 cell; a CKLNQD1 cell; a CKLNQD2 cell; a CKLNQD4 cell; a CKLNQD6 cell; a CKLNQD8 cell; a CKLNQD12 cell; a CKLNQD16 cell; a CKMUX2D1 cell; a CKMUX2D2 cell; a CKMUX2D4 cell; a CKND0P5 cell; a CKND1 cell; a CKND1P5 cell; a CKND2 cell; a CKND2D0P5 cell; a CKND2D1 cell; a CKND2D1P5 cell; a CKND2D2 cell; a CKND2D2P5 cell; a CKND2D3 cell; a CKND2D3P5 cell; a CKND2D4 cell; a CKND2D4P5 cell; a CKND2D5 cell; a CKND2D5P5 cell; a CKND2D6 cell; a CKND2D7 cell; a CKND2D8 cell; a CKND2D9 cell; a CKND2D10 cell; a CKND2P5 cell; a CKND3 cell; a CKND3P5 cell; a CKND4 cell; a CKND4P5 cell; a CKND5 cell; a CKND5P5 cell; a CKND6 cell; a CKND7 cell; a CKND8 cell; a CKND9 cell; a CKND10 cell; a CKND11 cell; a CKND12 cell; a CKND14 cell; a CKND16 cell; a CKND20 cell; a CKND24 cell; a CKNR2D1 cell; a CKNR2D2 cell; a CKNR2D3 cell; a CKNR2D4 cell; a CKNR2D6 cell; a CKNR2D8 cell; a CKNR2D10 cell; a CKOR2D1 cell; a CKOR2D2 cell; a CKOR2D3 cell; a CKOR2D4 cell; a CKOR2D6 cell; a CKOR2D8 cell; a CKOR2D10 cell; a DEL010D1 cell; a DEL020D1 cell; a DEL030D1 cell; a DEL040D1 cell; a DEL060D1 cell; a DEL100D1 cell; a DEL200D1 cell; a DFCSND1 cell; a DFCSND2 cell; a DFCSND4 cell; a DFD1 cell; a DFD2 cell; a DFD4 cell; a DFNCSND1 cell; a DFNCSND2 cell; a DFNCSND4 cell; a DFQD1 cell; a DFQD2 cell; a DFQD4 cell; an EDFCND1 cell; a FA1D1 cell; a FA1D2 cell; a FA1HDD1 cell; a FA1HSD1 cell; a FICOND1 cell; FILL1 cell; a HA1D1 cell; a HA1D2 cell; an IAO21D1 cell; an IAO21D2 cell; an IAO21D4 cell; an IAO21D6 cell; an IAO22D1 cell; an IAO22D2 cell; an IAO22D4 cell; an IAO22D6; an IAOI21D1 cell; an IAOI21D2 cell; an IAOI21D4 cell; an IAOI21D6 cell; an IAOI211D1 cell; an IAOI211D2 cell; an IAOI211D4 cell; an IAOI211D6 cell; an IIAOI21D1 cell; an IIAOI21D2 cell; an IIAOI21D4 cell; an IIAOI21D6 cell; an IIND3D1 cell; an IIND3D2 cell; an IIND3D4 cell; an IIND3D6 cell; an IIND4D1 cell; an IIND4D2 cell; an IIND4D4 cell; an IIND4D6 cell; an IIOAI21D1 cell; an IIOAI21D2 cell; an IIOAI21D4 cell; an IIOAI21D6 cell; an IIOAI22D1 cell; an IIOAI22D2 cell; an IIOAI22D4 cell; an IIOAI22D6 cell; an IND2D1 cell; an IND2D2 cell; an IND2D4 cell; an IND2D6 cell; an IND2XD1 cell; an IND2XD2 cell; an IND2XD4 cell; an IND3D1 cell; an IND3D2 cell; an IND3D4 cell; an IND3D6 cell; an IND4D1 cell; an IND4D2 cell; an IND4D4 cell; an IND4D6 cell; an INR2D1 cell; an INR2D2 cell; an INR2D4 cell; an INR2D6 cell; an INR2XD1 cell; an INR2XD2 cell; an INR2XD4 cell; an INR3D1 cell; an INR3D2 cell; an INR3D4 cell; an INR3D6 cell; an INR4D1 cell; an INR4D2 cell; an INR4D4 cell; an INR4D6 cell; an INVD1 cell; an INVD2 cell; an INVD3 cell; an INVD4 cell; an INVD5 cell; an INVD6 cell; an INVD7 cell; an INVD8 cell; an INVD10 cell; an INVD12 cell; an INVD14 cell; an INVD16 cell; an IOA21D1 cell; an IOA21D2 cell; an IOA21D4 cell; an IOA21D6 cell; an IOA22D1 cell; an IOA22D2 cell; an IOA22D4 cell; an IOA22D6 cell; an IOAI21D1 cell; an IOAI21D2 cell; an IOAI21D4 cell; an IOAI21D6 cell; an IOAI211D1 cell; an IOAI211D2 cell; an IOAI211D4 cell; an IOAI211D6 cell; an LHD1 cell; an LHD2 cell; an LND1 cell; an LND2 cell; an MAOI22D1 cell; an MAOI22D2 cell; MAOI22D4 cell; MAOI22D6 cell; an MAOI222D1 cell; an MAOI222D2 cell; an MAOI222D3 cell; an MAOI222D4 cell; an MAOI222D6 cell; an MOAI22D1 cell; an MOAI22D2 cell; an MOAI22D4 cell; an MOAI22D6 cell; a MUX2D1 cell; a MUX2D2 cell; a MUX2D4 cell; a MUX2HDD1 cell; a MUX2HDD2 cell; a MUX2ND1 cell; a MUX2ND2 cell; a MUX2ND4 cell; a MUX2NHDD1 cell; a MUX2NHDD2 cell; a MUX3D1 cell; a MUX3D2 cell; a MUX3D4 cell; a MUX4D1 cell; a MUX4D2 cell; a MUX4D4 cell; a MUX4ND1 cell; a MUX4ND2 cell; a MUX4ND4 cell; an ND2D1 cell; an ND2D2 cell; an ND2D3 cell; an ND2D4 cell; an ND2D8 cell; an ND3D1 cell; an ND3D2 cell; an ND3D3 cell; an ND3D4 cell; an ND3D8 cell; an ND4D1 cell; an ND4D2 cell; an ND4D3 cell; an ND4D4 cell; an ND4D8 cell; an NR2D1 cell; an NR2D2 cell; an NR2D3 cell; an NR2D4 cell; an NR2D8 cell; an NR3D1 cell; an NR3D2 cell; an NR3D3 cell; an NR3D4 cell; an NR3D8 cell; an NR4D1 cell; an NR4D2 cell; an NR4D3 cell; an NR4D4 cell; an NR4D8 cell; an OA21D1 cell; an OA21D2 cell; an OA21D4 cell; an OA22D1 cell; an OA22D2 cell; an OA22D4 cell; an OA211D1 cell; an OA211 D2 cell; an OA211 D4 cell; an OAI21D1 cell; an OAI21D2 cell; an OAI21D3 cell; an OAI21D4 cell; an OAI21D6 cell; an OAI21XD1 cell; an OAI21XD2 cell; an OAI21XD4 cell; an OAI22D1 cell; an OAI22D2 cell; an OAI22D3 cell; an OAI22D4 cell; an OAI22D6 cell; an OAI31D1 cell; an OAI31D2 cell; an OAI31D3 cell; an OAI31D4 cell; an OAI31D6 cell; an OAI32D1 cell; an OAI32D2 cell; an OAI32D3 cell; an OAI32D4 cell; an OAI32D6 cell; an OAI211D1 cell; an OAI211D2 cell; an OAI211D3 cell; an OAI211D4 cell; an OAI211D6 cell; an OAI221D1 cell; an OAI221D2 cell; an OAI221D3 cell; an OAI221D4 cell; an OAI221D6 cell; an OAI222D1 cell; an OAI222D2 cell; an OAI222D3 cell; an OAI222D4 cell; an OAI222D6 cell; an OAOI211D1 cell; an OAOI211D2 cell; an OAOI211D3 cell; an OAOI211D4 cell; an OAOI211D6 cell; an OR2D1 cell; an OR2D2 cell; an OR2D3 cell; an OR2D4 cell; an OR2D8 cell; an OR2D10 cell; an OR2XD2 cell; an OR3D1 cell; an OR3D2 cell; an OR3D4 cell; an OR3D8 cell; an OR3XD2 cell; an OR4D1 cell; an OR4D2 cell; an OR4D4 cell; an OR4D8 cell; an OR4XD2 cell; a SDFCSND1 cell; a SDFCSND2 cell; a SDFCSND4 cell; a SDFD1 cell; a SDFD2 cell; a SDFD4 cell; a SDFQD1 cell; a SDFQD2 cell; a SDFQD4 cell; a SEDFCND1 cell; a SEDFCND2 cell; a SEDFQD1 cell; a SEDFQD2 cell; a SEDFQD4 cell; an XNR2D1 cell; an XNR2D2 cell; an XNR2D4 cell; an XNR2HDD1 cell; an XNR2HDD2 cell; an XNR3D1 cell; an XNR3D2 cell; an XOR2D1 cell; an XOR2D2 cell; an XOR2D4 cell; an XOR2HDD1 cell; an XOR2HDD2 cell; an XOR3D1 cell; and, an XOR3D2 cell. Another aspect of the invention relates to methods for making such ICs by, for example, instantiating and fabricating at least a select number (e.g., 20, 40, 60, 80, 100) distinct cells selected from the aforesaid set.

In certain embodiments of the invention, such product ICs will include at least a select number (e.g., ten, fifteen, twenty) of distinct cells selected from the set consisting of: an AN2D1 cell; an AN2D2 cell; an AN2D3 cell; an AN2D4 cell; an AN2D8 cell; an AN2D10 cell; an AN2XD2 cell; an AN3D1 cell; an AN3D2 cell; an AN3D4 cell; an AN3D8 cell; an AN3XD2 cell; an AN4D1 cell; an AN4D2 cell; an AN4D4 cell; an AN4D8 cell; an AN4XD2 cell; an ND2D1 cell; an ND2D2 cell; an ND2D3 cell; an ND2D4 cell; an ND2D8 cell; an ND3D1 cell; an ND3D2 cell; an ND3D3 cell; an ND3D4 cell; an ND3D8 cell; an ND4D1 cell; an ND4D2 cell; an ND4D3 cell; an ND4D4 cell; an ND4D8 cell; an NR2D1 cell; an NR2D2 cell; an NR2D3 cell; an NR2D4 cell; an NR2D8 cell; an NR3D1 cell; an NR3D2 cell; an NR3D3 cell; an NR3D4 cell; an NR3D8 cell; an NR4D1 cell; an NR4D2 cell; an NR4D3 cell; an NR4D4 cell; an NR4D8 cell; an OR2D1 cell; an OR2D2 cell; an OR2D3 cell; an OR2D4 cell; an OR2D8 cell; an OR2D10 cell; an OR2XD2 cell; an OR3D1 cell; an OR3D2 cell; an OR3D4 cell; an OR3D8 cell; an OR3XD2 cell; an OR4D1 cell; an OR4D2 cell; an OR4D4 cell; an OR4D8 cell; an OR4XD2 cell; an XNR2D1 cell; an XNR2D2 cell; an XNR2D4 cell; an XNR2HDD1 cell; an XNR2HDD2 cell; an XNR3D1 cell; an XNR3D2 cell; an XOR2D1 cell; an XOR2D2 cell; an XOR2D4 cell; an XOR2HDD1 cell; an XOR2HDD2 cell; an XOR3D1 cell; and, an XOR3D2 cell.

In certain embodiments of the invention, such product ICs will include at least a select number (e.g., six, eight, ten, fifteen, twenty) of distinct cells selected from the set consisting of: an AO21D1 cell; an AO21D2 cell; an AO21D4 cell; an AO22D1 cell; an AO22D2 cell; an AO22D4 cell; an AO31D1 cell; an AO31D2 cell; an AO31D4 cell; an AO211D1 cell; an AO211D2 cell; an AO211D4 cell; an AO222D1 cell; an AO222D2 cell; an AO222D4 cell; an AOAI211D1 cell; an AOAI211D2 cell; an AOAI211D3 cell; an AOAI211D4 cell; an AOAI211D6 cell; an AOI21D1 cell; an AOI21D2 cell; an AOI21D3 cell; an AOI21D4 cell; an AOI21D6 cell; an AOI21XD2 cell; an AOI21XD4 cell; an AOI22D1 cell; an AOI22D2 cell; an AOI22D3 cell; an AOI22D4 cell; an AOI22D6 cell; an AOI22XD1 cell; an AOI22XD2 cell; an AOI22XD4 cell; an AOI31D1 cell; an AOI31D2 cell; an AOI31D3 cell; an AOI31D4 cell; an AOI31D6 cell; an AOI32D1 cell; an AOI32D2 cell; an AOI32D3 cell; an AOI32D4 cell; an AOI32D6 cell; an AOI211D1 cell; an AOI211D2 cell; an AOI211D3 cell; an AOI211D4 cell; an AOI211D6 cell; an AOI211XD1 cell; an AOI211XD2 cell; an AOI211XD4 cell; an AOI221D1 cell; an AOI221D2 cell; an AOI221D3 cell; an AOI221D4 cell; an AOI221D6 cell; an AOI222D1 cell; an AOI222D2 cell; an AOI222D3 cell; an AOI222D4 cell; an AOI222D6 cell; an AOI222XD1 cell; an AOI222XD2 cell; an AOI222XD4 cell; a FA1D1 cell; a FA1D2 cell; a FA1HDD1 cell; a FA1HSD1 cell; a FICOND1 cell; FILL1 cell; a HA1D1 cell; a HA1D2 cell; an IAO21D1 cell; an IAO21D2 cell; an IAO21D4 cell; an IAO21D6 cell; an IAO22D1 cell; an IAO22D2 cell; an IAO22D4 cell; an IAO22D6; an IAOI21D1 cell; an IAOI21D2 cell; an IAOI21D4 cell; an IAOI21D6 cell; an IAOI211D1 cell; an IAOI211D2 cell; an IAOI211D4 cell; an IAOI211D6 cell; an IIAOI21D1 cell; an IIAOI21D2 cell; an IIAOI21D4 cell; an IIAOI21D6 cell; an IIND3D1 cell; an IIND3D2 cell; an IIND3D4 cell; an IIND3D6 cell; an IIND4D1 cell; an IIND4D2 cell; an IIND4D4 cell; an IIND4D6 cell; an IIOAI21D1 cell; an IIOAI21D2 cell; an IIOAI21D4 cell; an IIOAI21D6 cell; an IIOAI22D1 cell; an IIOAI22D2 cell; an IIOAI22D4 cell; an IIOAI22D6 cell; an IND2D1 cell; an IND2D2 cell; an IND2D4 cell; an IND2D6 cell; an IND2XD1 cell; an IND2XD2 cell; an IND2XD4 cell; an IND3D1 cell; an IND3D2 cell; an IND3D4 cell; an IND3D6 cell; an IND4D1 cell; an IND4D2 cell; an IND4D4 cell; an IND4D6 cell; an INR2D1 cell; an INR2D2 cell; an INR2D4 cell; an INR2D6 cell; an INR2XD1 cell; an INR2XD2 cell; an INR2XD4 cell; an INR3D1 cell; an INR3D2 cell; an INR3D4 cell; an INR3D6 cell; an INR4D1 cell; an INR4D2 cell; an INR4D4 cell; an INR4D6 cell; an OA21D1 cell; an OA21D2 cell; an OA21D4 cell; an OA22D1 cell; an OA22D2 cell; an OA22D4 cell; an OA211D1 cell; an OA211 D2 cell; an OA211D4 cell; an OAI21D1 cell; an OAI21D2 cell; an OAI21D3 cell; an OAI21D4 cell; an OAI21D6 cell; an OAI21XD1 cell; an OAI21XD2 cell; an OAI21XD4 cell; an OAI22D1 cell; an OAI22D2 cell; an OAI22D3 cell; an OAI22D4 cell; an OAI22D6 cell; an OAI31D1 cell; an OAI31D2 cell; an OAI31D3 cell; an OAI31D4 cell; an OAI31D6 cell; an OAI32D1 cell; an OAI32D2 cell; an OAI32D3 cell; an OAI32D4 cell; an OAI32D6 cell; an OAI211D1 cell; an OAI211D2 cell; an OAI211D3 cell; an OAI211D4 cell; an OAI211D6 cell; an OAI221D1 cell; an OAI221D2 cell; an OAI221D3 cell; an OAI221D4 cell; an OAI221D6 cell; an OAI222D1 cell; an OAI222D2 cell; an OAI222D3 cell; an OAI222D4 cell; an OAI222D6 cell; an OAOI211D1 cell; an OAOI211D2 cell; an OAOI211D3 cell; an OAOI211D4 cell; an OAOI211D6 cell; an IOA21D1 cell; an IOA21D2 cell; an IOA21D4 cell; an IOA21D6 cell; an IOA22D1 cell; an IOA22D2 cell; an IOA22D4 cell; an IOA22D6 cell; an IOAI21D1 cell; an IOAI21D2 cell; an IOAI21D4 cell; an IOAI21D6 cell; an IOAI211D1 cell; an IOAI211D2 cell; an IOAI211D4 cell; an IOAI211D6 cell; an LHD1 cell; an LHD2 cell; an LND1 cell; an LND2 cell; an MAOI22D1 cell; an MAOI22D2 cell; MAOI22D4 cell; MAOI22D6 cell; an MAOI222D1 cell; an MAOI222D2 cell; an MAOI222D3 cell; an MAOI222D4 cell; an MAOI222D6 cell; an MOAI22D1 cell; an MOAI22D2 cell; an MOAI22D4 cell; and, an MOAI22D6 cell.

In certain embodiments of the invention, such product ICs will include at least a select number (e.g., five, eight, twelve) of distinct cells selected from the group consisting of: a BUFFD1 cell; a BUFFD2 cell; a BUFFD3 cell; a BUFFD4 cell; a BUFFD5 cell; a BUFFD6 cell; a BUFFD7 cell; a BUFFD8 cell; a BUFFD9 cell; a BUFFD10 cell; a BUFFD12 cell; a BUFFD14 cell; a BUFFD16 cell; a BUFFD20 cell; a BUFFD24 cell; a BUFFXD3 cell; a BUFFXD6 cell; a BUFFXD9 cell; a BUFFXXD2 cell; a BUFFXXD4 cell; a BUFFXXD6 cell; an INVD1 cell; an INVD2 cell; an INVD3 cell; an INVD4 cell; an INVD5 cell; an INVD6 cell; an INVD7 cell; an INVD8 cell; an INVD10 cell; an INVD12 cell; an INVD14 cell; and, an INVD16 cell.

In certain embodiments of the invention, such product ICs will include at least a select number (e.g., five, eight, twelve, fifteen, twenty) of distinct cells selected from the group consisting of: a CKAN2D0P5 cell; a CKAN2D1 cell; a CKAN2D1P5 cell; a CKAN2D2 cell; a CKAN2D2P5 cell; a CKAN2D3 cell; a CKAN2D3P5 cell; a CKAN2D4 cell; a CKAN2D4P5 cell; a CKAN2D5 cell; a CKAN2D5P5 cell; a CKAN2D6 cell; a CKAN2D7 cell; a CKAN2D8 cell; a CKAN2D9 cell; a CKAN2D10 cell; a CKBD0P5 cell; a CKBD1 cell; a CKBD1P5 cell; a CKBD2 cell; a CKBD2P5 cell; a CKBD3 cell; a CKBD3P5 cell; a CKBD4 cell; a CKBD4P5 cell; a CKBD5 cell; a CKBD5P5 cell; a CKBD6 cell; a CKBD7 cell; a CKBD8 cell; a CKBD9 cell; a CKBD10 cell; a CKBD11 cell; a CKBD12 cell; a CKBD14 cell; a CKBD16 cell; a CKBD20 cell; a CKBD24 cell; a CKBD32 cell; a CKLNQD1 cell; a CKLNQD2 cell; a CKLNQD4 cell; a CKLNQD6 cell; a CKLNQD8 cell; a CKLNQD12 cell; a CKLNQD16 cell; a CKMUX2D1 cell;

a CKMUX2D2 cell; a CKMUX2D4 cell; a CKND0P5 cell; a CKND1 cell; a CKND1P5 cell; a CKND2 cell; a CKND2D0P5 cell; a CKND2D1 cell; a CKND2D1P5 cell; a CKND2D2 cell; a CKND2D2P5 cell; a CKND2D3 cell; a CKND2D3P5 cell; a CKND2D4 cell; a CKND2D4P5 cell; a CKND2D5 cell; a CKND2D5P5 cell; a CKND2D6 cell; a CKND2D7 cell; a CKND2D8 cell; a CKND2D9 cell; a CKND2D10 cell; a CKND2P5 cell; a CKND3 cell; a CKND3P5 cell; a CKND4 cell; a CKND4P5 cell; a CKND5 cell; a CKND5P5 cell; a CKND6 cell; a CKND7 cell; a CKND8 cell; a CKND9 cell; a CKND10 cell; a CKND11 cell; a CKND12 cell; a CKND14 cell; a CKND16 cell; a CKND20 cell; a CKND24 cell; a CKNR2D1 cell; a CKNR2D2 cell; a CKNR2D3 cell; a CKNR2D4 cell; a CKNR2D6 cell; a CKNR2D8 cell; a CKNR2D10 cell; a CKOR2D1 cell; a CKOR2D2 cell; a CKOR2D3 cell; a CKOR2D4 cell; a CKOR2D6 cell; a CKOR2D8 cell; and, a CKOR2D10 cell.

In certain embodiments of the invention, such product ICs will include at least a select number (e.g., three, five, eight, ten) of distinct cells selected from the set consisting of: a DEL010D1 cell; a DEL020D1 cell; a DEL030D1 cell; a DEL040D1 cell; a DEL060D1 cell; a DEL100D1 cell; a DEL200D1 cell; a DFCSND1 cell; a DFCSND2 cell; a DFCSND4 cell; a DFD1 cell; a DFD2 cell; a DFD4 cell; a DFNCSND1 cell; a DFNCSND2 cell; a DFNCSND4 cell; a DFQD1 cell; a DFQD2 cell; a DFQD4 cell; an EDFCND1 cell; a SDFCSND1 cell; a SDFCSND2 cell; a SDFCSND4 cell; a SDFD1 cell; a SDFD2 cell; a SDFD4 cell; a SDFQD1 cell; a SDFQD2 cell; a SDFQD4 cell; a SEDFCND1 cell; a SEDFCND2 cell; a SEDFQD1 cell; a SEDFQD2 cell; and, a SEDFQD4 cell.

In certain embodiments of the invention, such product ICs will include at least a select number (e.g., one, two, three, five) of distinct cells selected from the set consisting of: a MUX2D1 cell; a MUX2D2 cell; a MUX2D4 cell; a MUX2HDD1 cell; a MUX2HDD2 cell; a MUX2ND1 cell; a MUX2ND2 cell; a MUX2ND4 cell; a MUX2NHDD1 cell; a MUX2NHDD2 cell; a MUX3D1 cell; a MUX3D2 cell; a MUX3D4 cell; a MUX4D1 cell; a MUX4D2 cell; a MUX4D4 cell; a MUX4ND1 cell; a MUX4ND2 cell; and, a MUX4ND4 cell.

Again, generally speaking, and without intending to be limiting, another aspect of the invention relates to product integrated circuits that contain at least a select number (e.g., twenty-five, fifty, seventy-five, one hundred) distinct "means" (i.e., the corresponding cell or the §112 ¶6 "equivalents thereof") selected from the set consisting of: an AN2D1 means; an AN2D2 means; an AN2D3 means; an AN2D4 means; an AN2D8 means; an AN2D10 means; an AN2XD2 means; an AN3D1 means; an AN3D2 means; an AN3D4 means; an AN3D8 means; an AN3XD2 means; an AN4D1 means; an AN4D2 means; an AN4D4 means; an AN4D8 means; an AN4XD2 means; an AO21D1 means; an AO21D2 means; an AO21D4 means; an AO22D1 means; an AO22D2 means; an AO22D4 means; an AO31D1 means; an AO31D2 means; an AO31D4 means; an AO211D1 means; an AO211D2 means; an AO211D4 means; an AO222D1 means; an AO222D2 means; an AO222D4 means; an AOAI211D1 means; an AOAI211D2 means; an AOAI211D3 means; an AOAI211D4 means; an AOAI211D6 means; an AOI21D1 means; an AOI21D2 means; an AOI21D3 means; an AOI21D4 means; an AOI21D6 means; an AOI21XD2 means; an AOI21XD4 means; an AO122D1 means; an AO122D2 means; an AO122D3 means; an AO122D4 means; an AO122D6 means; an AOI22XD1 means; an AO122XD2 means; an AOI22XD4 means; an AOI31D1 means; an AOI31D2 means; an AOI31D3 means; an AOI31D4 means; an AOI31D6 means; an AOI32D1 means; an AOI32D2 means; an AOI32D3 means; an AOI32D4 means; an AOI32D6 means; an AOI211D1 means; an AOI211D2 means; an AOI211D3 means; an AOI211D4 means; an AOI211D6 means; an AOI211XD1 means; an AOI211XD2 means; an AOI211XD4 means; an AOI221D1 means; an AOI221D2 means; an AOI221D3 means; an AOI221D4 means; an AOI221 D6 means; an AOI222D1 means; an AOI222D2 means; an AOI222D3 means; an AOI222D4 means; an AOI222D6 means; an AOI222XD1 means; an AOI222XD2 means; an AOI222XD4 means; a BUFFD1 means; a BUFFD2 means; a BUFFD3 means; a BUFFD4 means; a BUFFD5 means; a BUFFD6 means; a BUFFD7 means; a BUFFD8 means; a BUFFD9 means; a BUFFD10 means; a BUFFD12 means; a BUFFD14 means; a BUFFD16 means; a BUFFD20 means; a BUFFD24 means; a BUFFXD3 means; a BUFFXD6 means; a BUFFXD9 means; a BUFFXXD2 means; a BUFFXXD4 means; a BUFFXXD6 means; a CKAN2D0P5 means; a CKAN2D1 means; a CKAN2D1P5 means; a CKAN2D2 means; a CKAN2D2P5 means; a CKAN2D3 means; a CKAN2D3P5 means; a CKAN2D4 means; a CKAN2D4P5 means; a CKAN2D5 means; a CKAN2D5P5 means; a CKAN2D6 means; a CKAN2D7 means; a CKAN2D8 means; a CKAN2D9 means; a CKAN2D10 means; a CKBD0P5 means; a CKBD1 means; a CKBD1P5 means; a CKBD2 means; a CKBD2P5 means; a CKBD3 means; a CKBD3P5 means; a CKBD4 means; a CKBD4P5 means; a CKBD5 means; a CKBD5P5 means; a CKBD6 means; a CKBD7 means; a CKBD8 means; a CKBD9 means; a CKBD10 means; a CKBD11 means; a CKBD12 means; a CKBD14 means; a CKBD16 means; a CKBD20 means; a CKBD24 means; a CKBD32 means; a CKLNQD1 means; a CKLNQD2 means; a CKLNQD4 means; a CKLNQD6 means; a CKLNQD8 means; a CKLNQD12 means; a CKLNQD16 means; a CKMUX2D1 means; a CKMUX2D2 means; a CKMUX2D4 means; a CKND0P5 means; a CKND1 means; a CKND1P5 means; a CKND2 means; a CKND2D0P5 means; a CKND2D1 means; a CKND2D1P5 means; a CKND2D2 means; a CKND2D2P5 means; a CKND2D3 means; a CKND2D3P5 means; a CKND2D4 means; a CKND2D4P5 means; a CKND2D5 means; a CKND2D5P5 means; a CKND2D6 means; a CKND2D7 means; a CKND2D8 means; a CKND2D9 means; a CKND2D10 means; a CKND2P5 means; a CKND3 means; a CKND3P5 means; a CKND4 means; a CKND4P5 means; a CKND5 means; a CKND5P5 means; a CKND6 means; a CKND7 means; a CKND8 means; a CKND9 means; a CKND10 means; a CKND11 means; a CKND12 means; a CKND14 means; a CKND16 means; a CKND20 means; a CKND24 means; a CKNR2D1 means; a CKNR2D2 means; a CKNR2D3 means; a CKNR2D4 means; a CKNR2D6 means; a CKNR2D8 means; a CKNR2D10 means; a CKOR2D1 means; a CKOR2D2 means; a CKOR2D3 means; a CKOR2D4 means; a CKOR2D6 means; a CKOR2D8 means; a CKOR2D10 means; a DEL010D1 means; a DEL020D1 means; a DEL030D1 means; a DEL040D1 means; a DEL060D1 means; a DEL100D1 means; a DEL200D1 means; a DFCSND1 means; a DFCSND2 means; a DFCSND4 means; a DFD1 means; a DFD2 means; a DFD4 means; a DFNCSND1 means; a DFNCSND2 means; a DFNCSND4 means; a DFQD1 means; a DFQD2 means; a DFQD4 means; an EDFCND1 means; a FA1D1 means; a FA1D2 means; a FA1HDD1 means; a FA1HSD1 means; a FICOND1 means; FILL1 means; a HA1D1 means; a HA1D2 means; an IAO21D1 means; an IAO21D2 means; an IAO21D4 means; an IAO21D6 means; an IAO22D1 means; an IAO22D2 means; an IAO22D4 means; an IAO22D6; an IAOI21D1 means; an IAOI21D2 means; an IAOI21D4 means; an IAOI21D6 means; an IAOI211D1 means; an IAOI211D2 means; an IAOI211D4 means; an IAOI211D6 means; an IIAOI21D1 means; an IIAOI21D2 means; an IIAOI21D4 means; an IIAOI21D6 means; an IIND3D1 means; an IIND3D2 means; an IIND3D4 means; an IIND3D6 means; an IIND4D1 means; an IIND4D2 means; an IIND4D4 means; an IIND4D6 means; an IIOAI21D1 means; an IIOAI21D2 means; an IIOAI21D4 means; an IIOAI21D6 means; an IIOAI22D1 means; an IIOAI22D2 means; an IIOAI22D4 means; an IIOAI22D6 means; an IND2D1 means; an IND2D2 means; an IND2D4 means; an IND2D6 means; an IND2XD1 means; an IND2XD2 means; an IND2XD4 means; an IND3D1 means; an IND3D2 means; an IND3D4 means; an IND3D6 means; an IND4D1 means; an IND4D2 means; an IND4D4 means; an IND4D6 means; an INR2D1 means; an INR2D2 means; an INR2D4 means; an INR2D6 means; an INR2XD1 means; an INR2XD2 means; an INR2XD4 means; an INR3D1 means; an INR3D2 means; an INR3D4 means; an INR3D6 means; an INR4D1 means; an INR4D2 means; an INR4D4 means; an INR4D6 means; an INVD1 means; an INVD2 means; an INVD3 means; an INVD4 means; an INVD5 means; an INVD6 means; an INVD7 means; an INVD8 means; an INVD10 means; an INVD12 means; an INVD14 means; an INVD16 means; an IOA21D1 means; an IOA21D2 means; an IOA21D4 means; an IOA21D6 means; an IOA22D1 means; an IOA22D2 means; an IOA22D4 means; an IOA22D6 means; an IOAI21D1 means; an IOAI21D2 means; an IOAI21D4 means; an IOAI21D6 means; an IOAI211D1 means; an IOAI211D2 means; an IOAI211D4 means; an IOAI211D6 means; an LHD1 means; an LHD2 means; an LND1 means; an LND2 means; an MAOI22D1 means; an MAOI22D2 means; MAOI22D4 means; MAOI22D6 means; an MAOI222D1 means; an MAOI222D2 means; an MAOI222D3 means; an MAOI222D4 means; an MAOI222D6 means; an MOAI22D1 means; an MOAI22D2 means; an MOAI22D4 means; an MOAI22D6 means; a MUX2D1 means; a MUX2D2 means; a MUX2D4 means; a MUX2HDD1 means; a MUX2HDD2 means; a MUX2ND1 means; a MUX2ND2 means; a MUX2ND4 means; a MUX2NHDD1 means; a MUX2NHDD2 means; a MUX3D1 means; a MUX3D2 means; a MUX3D4 means; a MUX4D1 means; a MUX4D2 means; a MUX4D4 means; a MUX4ND1 means; a MUX4ND2 means; a MUX4ND4 means; an ND2D1 means; an ND2D2 means; an ND2D3 means; an ND2D4 means; an ND2D8 means; an ND3D1 means; an ND3D2 means; an ND3D3 means; an ND3D4 means; an ND3D8 means; an ND4D1 means; an ND4D2 means; an ND4D3 means; an ND4D4 means; an ND4D8 means; an NR2D1 means; an NR2D2 means; an NR2D3 means; an NR2D4 means; an NR2D8 means; an NR3D1 means; an NR3D2 means; an NR3D3 means; an NR3D4 means; an NR3D8 means; an NR4D1 means; an NR4D2 means; an NR4D3 means; an NR4D4 means; an NR4D8 means; an OA21D1 means; an OA21D2 means; an OA21D4 means; an OA22D1 means; an OA22D2 means; an OA22D4 means; an OA211D1 means; an OA211 D2 means; an OA211 D4 means; an OAI21D1 means; an OAI21D2 means; an OAI21D3 means; an OAI21D4 means; an OAI21D6 means; an OAI21XD1 means; an OAI21XD2 means; an OAI21XD4 means; an OAI22D1 means; an OAI22D2 means; an OAI22D3 means; an OAI22D4 means; an OAI22D6 means; an OAI31D1 means; an OAI31D2 means; an OAI31D3 means; an OAI31D4 means; an OAI31D6 means; an OAI32D1 means; an OAI32D2 means; an OAI32D3 means; an OAI32D4 means; an OAI32D6 means; an OAI211D1 means; an OAI211D2 means; an OAI211D3 means; an OAI211D4 means; an OAI211D6 means; an OAI221D1 means; an OAI221D2 means; an OAI221D3 means; an OAI221D4 means; an OAI221D6 means; an OAI222D1 means; an OAI222D2 means; an OAI222D3 means; an OAI222D4 means; an OAI222D6 means; an OAOI211D1 means; an OAOI211D2 means; an OAOI211D3 means; an OAOI211D4 means; an OAOI211D6 means; an OR2D1 means; an OR2D2 means; an OR2D3 means; an OR2D4 means; an OR2D8 means; an OR2D10 means; an OR2XD2 means; an OR3D1 means; an OR3D2 means; an OR3D4 means; an OR3D8 means; an OR3XD2 means; an OR4D1 means; an OR4D2 means; an OR4D4 means; an OR4D8 means; an OR4XD2 means; a SDFCSND1 means; a SDFCSND2 means; a SDFCSND4 means; a SDFD1 means; a SDFD2 means; a SDFD4 means; a SDFQD1 means; a SDFQD2 means; a SDFQD4 means; a SEDFCND1 means; a SEDFCND2 means; a SEDFQD1 means; a SEDFQD2 means; a SEDFQD4 means; an XNR2D1 means; an XNR2D2 means; an XNR2D4 means; an XNR2HDD1 means; an XNR2HDD2 means; an XNR3D1 means; an XNR3D2 means; an XOR2D1 means; an XOR2D2 means; an XOR2D4 means; an XOR2HDD1 means; an XOR2HDD2 means; an XOR3D1 means; and, an XOR3D2 means.

In certain embodiments of the invention, such product ICs will include at least a select number (e.g., ten, fifteen, twenty) of distinct "means" selected from the set consisting of: an AN2D1 means; an AN2D2 means; an AN2D3 means; an AN2D4 means; an AN2D8 means; an AN2D10 means; an AN2XD2 means; an AN3D1 means; an AN3D2 means; an AN3D4 means; an AN3D8 means; an AN3XD2 means; an AN4D1 means; an AN4D2 means; an AN4D4 means; an AN4D8 means; an AN4XD2 means; an ND2D1 means; an ND2D2 means; an ND2D3 means; an ND2D4 means; an ND2D8 means; an ND3D1 means; an ND3D2 means; an ND3D3 means; an ND3D4 means; an ND3D8 means; an ND4D1 means; an ND4D2 means; an ND4D3 means; an ND4D4 means; an ND4D8 means; an NR2D1 means; an NR2D2 means; an NR2D3 means; an NR2D4 means; an NR2D8 means; an NR3D1 means; an NR3D2 means; an NR3D3 means; an NR3D4 means; an NR3D8 means; an NR4D1 means; an NR4D2 means; an NR4D3 means; an NR4D4 means; an NR4D8 means; an OR2D1 means; an OR2D2 means; an OR2D3 means; an OR2D4 means; an OR2D8 means; an OR2D10 means; an OR2XD2 means; an OR3D1 means; an OR3D2 means; an OR3D4 means; an OR3D8 means; an OR3XD2 means; an OR4D1 means; an OR4D2 means; an OR4D4 means; an OR4D8 means; an OR4XD2 means; an XNR2D1 means; an XNR2D2 means; an XNR2D4 means; an XNR2HDD1 means; an XNR2HDD2 means; an XNR3D1 means; an XNR3D2 means; an XOR2D1 means; an XOR2D2 means; an XOR2D4 means; an XOR2HDD1 means; an XOR2HDD2 means; an XOR3D1 means; and, an XOR3D2 means.

In certain embodiments of the invention, such product ICs will include at least a select number (e.g., six, eight, ten, fifteen, twenty) of distinct "means" selected from the set consisting of: an AO21D1 means; an AO21D2 means; an AO21D4 means; an AO22D1 means; an AO22D2 means; an AO22D4 means; an AO31D1 means; an AO31D2 means; an AO31D4 means; an AO211D1 means; an AO211D2 means; an AO211D4 means; an AO222D1 means; an AO222D2 means; an AO222D4 means; an AOAI211D1 means; an AOAI211D2 means; an AOAI211D3 means; an AOAI211D4 means; an AOAI211D6 means; an AOI21D1 means; an AOI21D2 means; an AOI21D3 means; an AOI21D4 means; an AOI21D6 means; an AOI21XD2 means; an AOI21XD4 means; an AOI22D1 means; an AOI22D2 means; an AOI22D3 means; an AOI22D4 means; an AOI22D6 means; an AOI22XD1 means; an AO122XD2 means; an AO122XD4 means; an AOI31D1 means; an AOI31D2 means; an AOI31D3 means; an AOI31D4 means; an AOI31D6 means; an AOI32D1 means; an AOI32D2 means; an AOI32D3 means; an AOI32D4 means; an AOI32D6 means; an AOI211D1 means; an AOI211D2 means; an AOI211D3 means; an AOI211D4 means; an AOI211D6 means; an AOI211XD1 means; an AOI211XD2 means; an AOI211XD4 means; an AOI221D1 means; an AOI221D2 means; an AOI221D3 means; an AOI221D4 means; an AOI221D6 means; an AOI222D1 means; an AOI222D2 means; an AOI222D3 means; an AOI222D4 means; an AOI222D6 means; an AOI222XD1 means; an AOI222XD2 means; an AOI222XD4 means; a FA1D1 means; a FA1D2 means; a FA1HDD1 means; a FA1HSD1 means; a FICOND1 means; FILL1 means; a HA1D1 means; a HA1D2 means; an IAO21D1 means; an IAO21D2 means; an IAO21D4 means; an IAO21D6 means; an IAO22D1 means; an IAO22D2 means; an IAO22D4 means; an IAO22D6; an IAOI21D1 means; an IAOI21D2 means; an IAOI21D4 means; an IAOI21D6 means; an IAOI211D1 means; an IAOI211D2 means; an IAOI211D4 means; an IAOI211D6 means; an IIAOI21D1 means; an IIAOI21D2 means; an IIAOI21D4 means; an IIAOI21D6 means; an IIND3D1 means; an IIND3D2 means; an IIND3D4 means; an IIND3D6 means; an IIND4D1 means; an IIND4D2 means; an IIND4D4 means; an IIND4D6 means; an IIOAI21D1 means; an IIOAI21D2 means; an IIOAI21D4 means; an IIOAI21D6 means; an IIOAI22D1 means; an IIOAI22D2 means; an IIOAI22D4 means; an IIOAI22D6 means; an IND2D1 means; an IND2D2 means; an IND2D4 means; an IND2D6 means; an IND2XD1 means; an IND2XD2 means; an IND2XD4 means; an IND3D1 means; an IND3D2 means; an IND3D4 means; an IND3D6 means; an IND4D1 means; an IND4D2 means; an IND4D4 means; an IND4D6 means; an INR2D1 means; an INR2D2 means; an INR2D4 means; an INR2D6 means; an INR2XD1 means; an INR2XD2 means; an INR2XD4 means; an INR3D1 means; an INR3D2 means; an INR3D4 means; an INR3D6 means; an INR4D1 means; an INR4D2 means; an INR4D4 means; an INR4D6 means; an OA21D1 means; an OA21D2 means; an OA21D4 means; an OA22D1 means; an OA22D2 means; an OA22D4 means; an OA211D1 means; an OA211 D2 means; an OA211 D4 means; an OAI21D1 means; an OAI21D2 means; an OAI21D3 means; an OAI21D4 means; an OAI21D6 means; an OAI21XD1 means; an OAI21XD2 means; an OAI21XD4 means; an OAI22D1 means; an OAI22D2 means; an OAI22D3 means; an OAI22D4 means; an OAI22D6 means; an OAI31D1 means; an OAI31D2 means; an OAI31D3 means; an OAI31D4 means; an OAI31D6 means; an OAI32D1 means; an OAI32D2 means; an OAI32D3 means; an OAI32D4 means; an OAI32D6 means; an OAI211D1 means; an OAI211D2 means; an OAI211D3 means; an OAI211D4 means; an OAI211D6 means; an OAI221D1 means; an OAI221D2 means; an OAI221D3 means; an OAI221D4 means; an OAI221D6 means; an OAI222D1 means; an OAI222D2 means; an OAI222D3 means; an OAI222D4 means; an OAI222D6 means; an OAOI211D1 means; an OAOI211D2 means; an OAOI211D3 means; an OAOI211D4 means; an OAOI211D6 means; an IOA21D1 means; an IOA21D2 means; an IOA21D4 means; an IOA21D6 means; an IOA22D1 means; an IOA22D2 means; an IOA22D4 means; an IOA22D6 means; an IOAI21D1 means; an IOAI21D2 means; an IOAI21D4 means; an IOAI21D6 means; an IOAI211D1 means; an IOAI211D2 means; an IOAI211D4 means; an IOAI211D6 means; an LHD1 means; an LHD2 means; an LND1 means; an LND2 means; an MAOI22D1 means; an MAOI22D2 means; MAOI22D4 means; MAOI22D6 means; an MAOI222D1 means; an MAOI222D2 means; an MAOI222D3 means; an MAOI222D4 means; an MAOI222D6 means; an MOAI22D1 means; an MOAI22D2 means; an MOAI22D4 means; and, an MOAI22D6 means.

In certain embodiments of the invention, such product ICs will include at least a select number (e.g., five, eight, twelve) of distinct "means" selected from the group consisting of: a BUFFD1 means; a BUFFD2 means; a BUFFD3 means; a BUFFD4 means; a BUFFD5 means; a BUFFD6 means; a BUFFD7 means; a BUFFD8 means; a BUFFD9 means; a BUFFD10 means; a BUFFD12 means; a BUFFD14 means; a BUFFD16 means; a BUFFD20 means; a BUFFD24 means; a BUFFXD3 means; a BUFFXD6 means; a BUFFXD9 means; a BUFFXXD2 means; a BUFFXXD4 means; a BUFFXXD6 means; an INVD1 means; an INVD2 means; an INVD3 means; an INVD4 means; an INVD5 means; an INVD6 means; an INVD7 means; an INVD8 means; an INVD10 means; an INVD12 means; an INVD14 means; and, an INVD16 means.

In certain embodiments of the invention, such product ICs will include at least a select number (e.g., five, eight, twelve, fifteen, twenty) of distinct cells selected from the group consisting of: a CKAN2D0P5 means; a CKAN2D1 means; a CKAN2D1P5 means; a CKAN2D2 means; a CKAN2D2P5 means; a CKAN2D3 means; a CKAN2D3P5 means; a CKAN2D4 means; a CKAN2D4P5 means; a CKAN2D5 means; a CKAN2D5P5 means; a CKAN2D6 means; a CKAN2D7 means; a CKAN2D8 means; a CKAN2D9 means; a CKAN2D10 means; a CKBD0P5 means; a CKBD1 means; a CKBD1P5 means; a CKBD2 means; a CKBD2P5 means; a CKBD3 means; a CKBD3P5 means; a CKBD4 means; a CKBD4P5 means; a CKBD5 means; a CKBD5P5 means; a CKBD6 means; a CKBD7 means; a CKBD8 means; a CKBD9 means; a CKBD10 means; a CKBD11 means; a CKBD12 means; a CKBD14 means; a CKBD16 means; a CKBD20 means; a CKBD24 means; a CKBD32 means; a CKLNQD1 means; a CKLNQD2 means; a CKLNQD4 means; a CKLNQD6 means; a CKLNQD8 means; a CKLNQD12 means; a CKLNQD16 means; a CKMUX2D1 means; a CKMUX2D2 means; a CKMUX2D4 means; a CKND0P5 means; a CKND1 means; a CKND1P5 means; a CKND2 means; a CKND2D0P5 means; a CKND2D1 means; a CKND2D1P5 means; a CKND2D2 means; a CKND2D2P5 means; a CKND2D3 means; a CKND2D3P5 means; a CKND2D4 means; a CKND2D4P5 means; a CKND2D5 means; a CKND2D5P5 means; a CKND2D6 means; a CKND2D7 means; a CKND2D8 means; a CKND2D9 means; a CKND2D10 means; a CKND2P5 means; a CKND3 means; a CKND3P5 means; a CKND4 means; a CKND4P5 means; a CKND5 means; a CKND5P5 means; a CKND6 means; a CKND7 means; a CKND8 means; a CKND9 means; a CKND10 means; a CKND11 means; a CKND12 means; a CKND14 means; a CKND16 means; a CKND20 means; a CKND24 means; a CKNR2D1 means; a CKNR2D2 means; a CKNR2D3 means; a CKNR2D4 means; a CKNR2D6 means; a CKNR2D8 means; a CKNR2D10 means; a CKOR2D1 means; a CKOR2D2 means; a CKOR2D3 means; a CKOR2D4 means; a CKOR2D6 means; a CKOR2D8 means; and, a CKOR2D10 means.

In certain embodiments of the invention, such product ICs will include at least a select number (e.g., three, five, eight, ten) of distinct cells selected from the set consisting of: a DEL010D1 means; a DEL020D1 means; a DEL030D1 means; a DEL040D1 means; a DEL060D1 means; a DEL100D1 means; a DEL200D1 means; a DFCSND1 means; a DFCSND2 means; a DFCSND4 means; a DFD1 means; a DFD2 means; a DFD4 means; a DFNCSND1 means; a DFNCSND2 means; a DFNCSND4 means; a DFQD1 means; a DFQD2 means; a DFQD4 means; an EDFCND1 means; a SDFCSND1 means; a SDFCSND2 means; a SDFCSND4 means; a SDFD1 means; a SDFD2 means; a SDFD4 means; a SDFQD1 means; a SDFQD2 means; a SDFQD4 means; a SEDFCND1 means; a SEDFCND2 means; a SEDFQD1 means; a SEDFQD2 means; and, a SEDFQD4 means.

In certain embodiments of the invention, such product ICs will include at least a select number (e.g., one, two, three, five) of distinct "means" selected from the set consisting of: a MUX2D1 means; a MUX2D2 means; a MUX2D4 means; a MUX2HDD1 means; a MUX2HDD2 means; a MUX2ND1 means; a MUX2ND2 means; a MUX2ND4 means; a MUX2NHDD1 means; a MUX2NHDD2 means; a MUX3D1 means; a MUX3D2 means; a MUX3D4 means; a MUX4D1 means; a MUX4D2 means; a MUX4D4 means; a MUX4ND1 means; a MUX4ND2 means; and, a MUX4ND4 cell.

Again, generally speaking, and without intending to be limiting, another aspect of the invention relates to product integrated circuits that contain, for example, at least the following: at least two (or three, or four) different means for performing a logical AND function; at least two (or three, four, five, six, or seven) different means for performing a logical AND-OR-INVERT function; at least two (or three or four) different means for performing a logical MUX function; at least two (or three, or four, or five) different means for performing a logical NAND function; at least two (or three, four, fix, six, or seven) different means for performing a logical OR-AND-INVERT function; and, at least two (or three or four) different means for performing a logical NOR function. In certain embodiments, such product ICs may further include: at least two (or three, or four) different means for performing a logical OR function; and at least two (or three or four) different means for performing a logical XOR function. In certain embodiments, such product ICs may further include: at least two (or three, or four) different means for performing a logical XNOR function. In certain embodiments, at least two of said means for performing a logical AND function support at least three inputs. In certain embodiments, at least two of said means for performing a logical NAND function support at least three inputs. In certain embodiments, at least two of said means for performing a logical NOR function support at least three inputs.

Further aspects of the invention relate to electronic systems (fixed or portable) that include at least a selected number (e.g., one, two, three, four) of the product ICs of the type defined above, as well as other optional components, such as rechargeable power source(s). And still further aspects of the invention relate to methods for making such product ICs by, for example, instantiating at least selected numbers (e.g., 50, 100, 150) of said above-referenced "cells" and/or "means."

BRIEF DESCRIPTION OF THE DRAWINGS

The present invention is best understood with reference to the accompanying set of drawings, in which.

DETAILED DESCRIPTION OF THE PREFERRED EMBODIMENT

Figure 1:
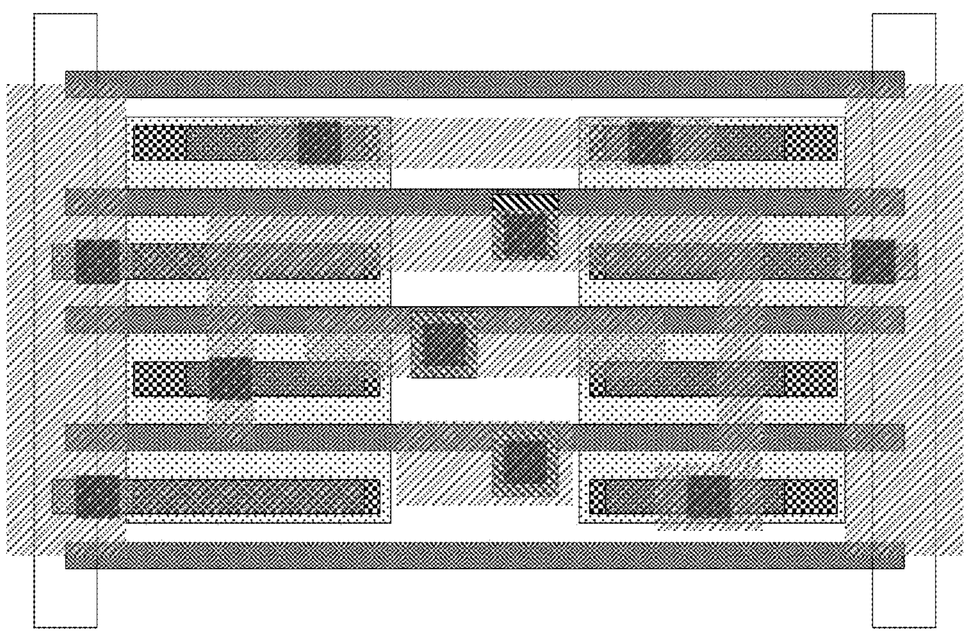
FIG. 1 depicts an AN2D1 cell.
Figure 106:
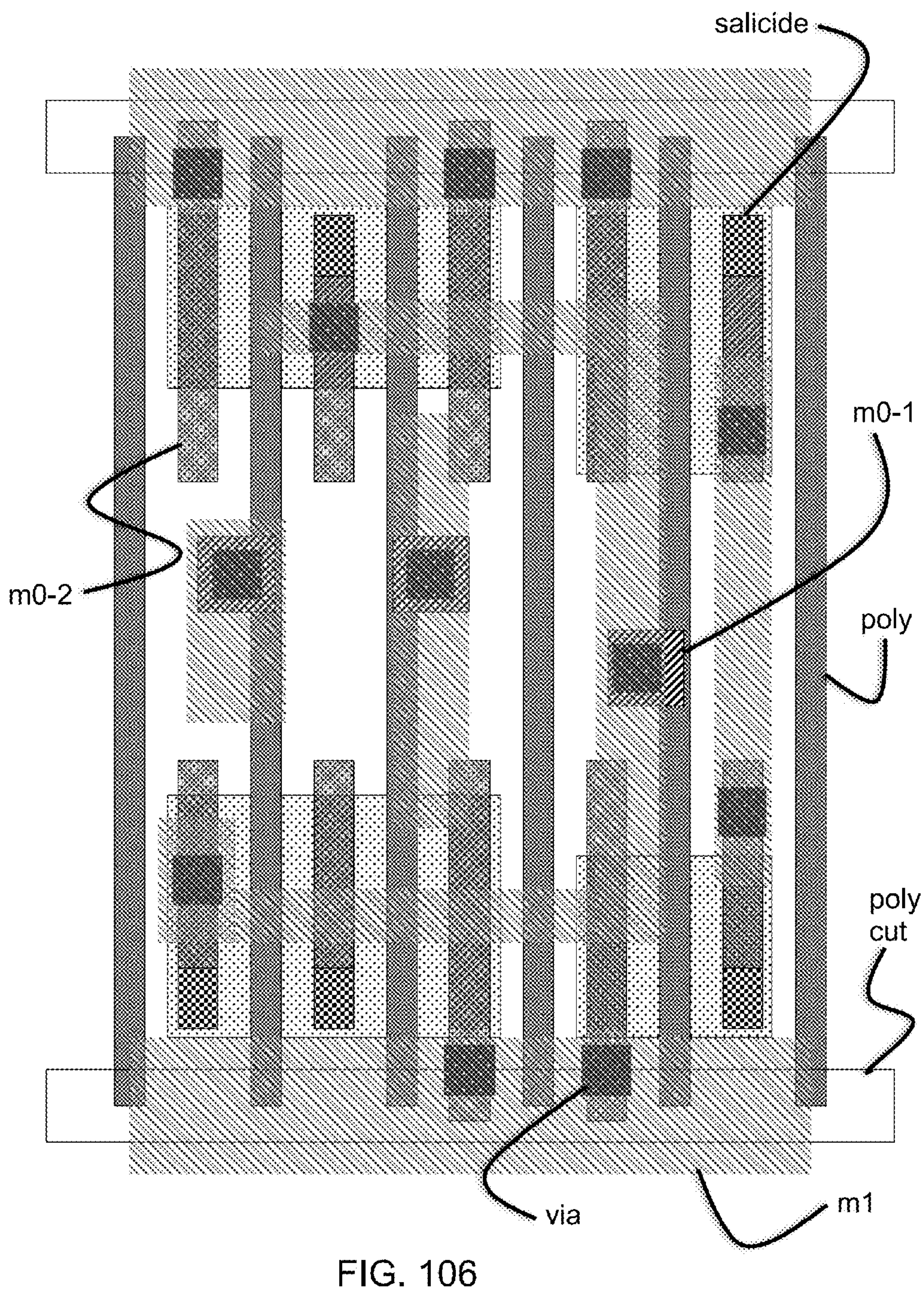
FIG. 106 depicts a CKAN2D0P5 cell.
Figure 463:
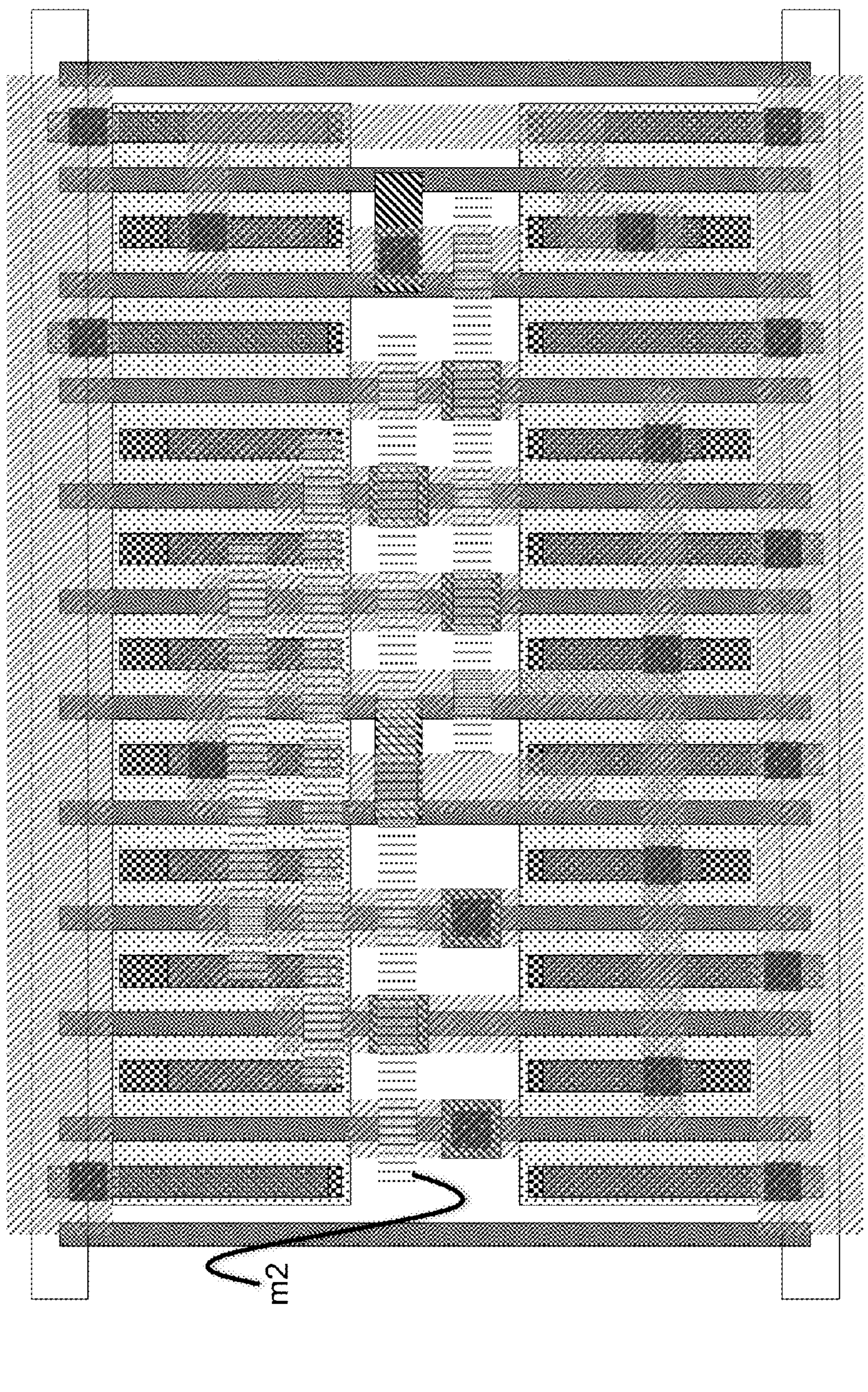
FIG. 463 depicts an OR4XD2 cell.
Figure 491:
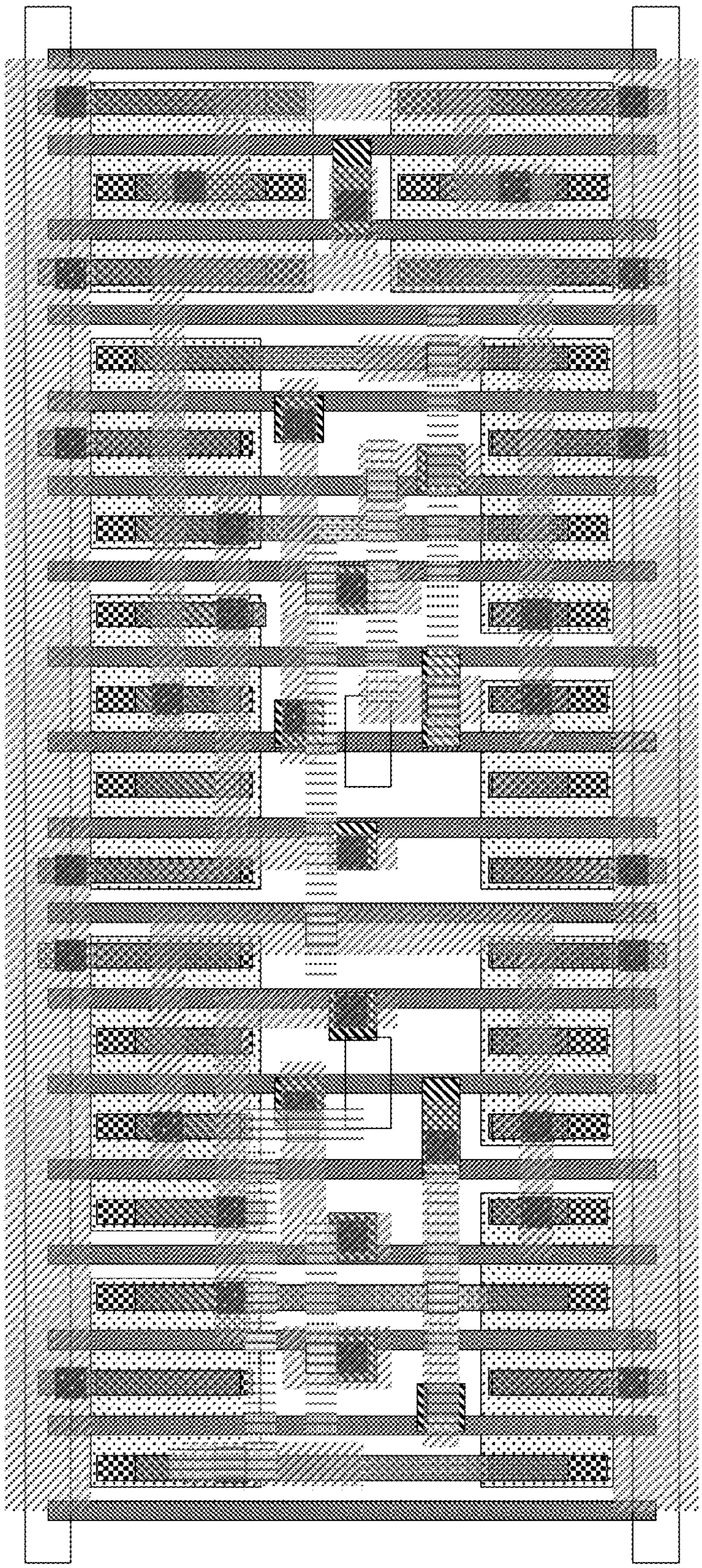

The inventive standard cell library is depicted, in detail, in the accompanying FIGS. 1-491. The function of each depicted cell is described below. FIGS. 106 and 463 provide a layer legend for the figures. As persons skilled in the art will appreciate, these cells are intended to be instantiated and used in ways and configurations well known in the art (as described, for example, in the incorporated standard cell references). Product ICs constructed using the inventive library are preferably fabricated using commercially available 22/20 nm fabrication processes.

Reference is made to FIG. 1, which depicts an AN2D1 cell. This cell implements the logic function and(A,B) in drive strength 1.

Figure 2:
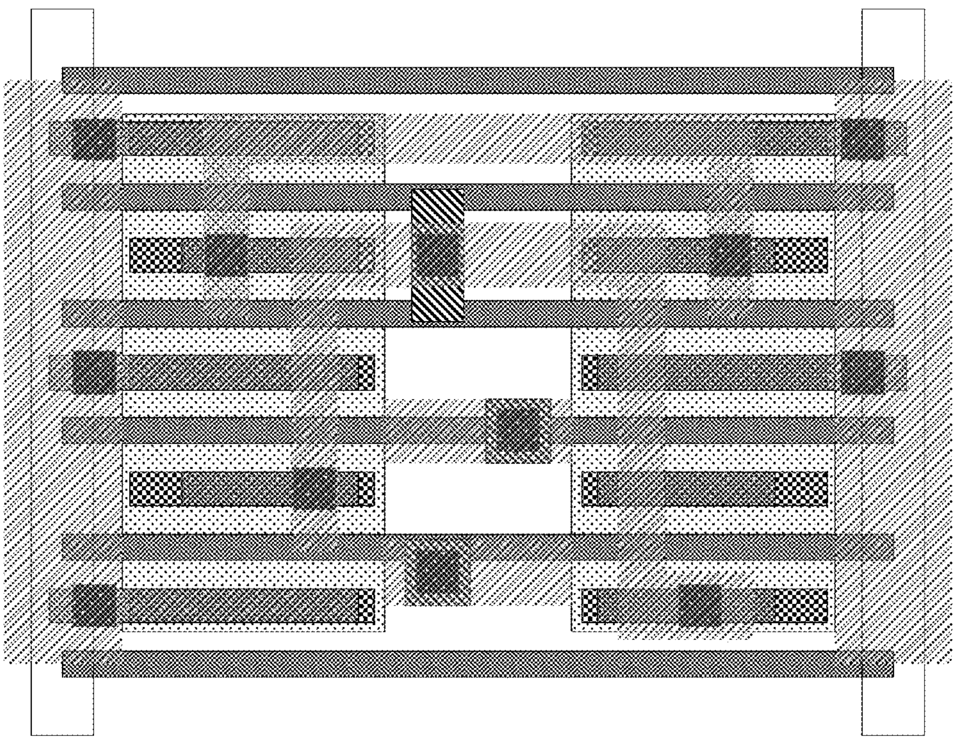
FIG. 2 depicts an AN2D2 cell.

Reference is made to FIG. 2, which depicts an AN2D2 cell. This cell implements the logic function and(A,B) in drive strength 2.

Figure 3:
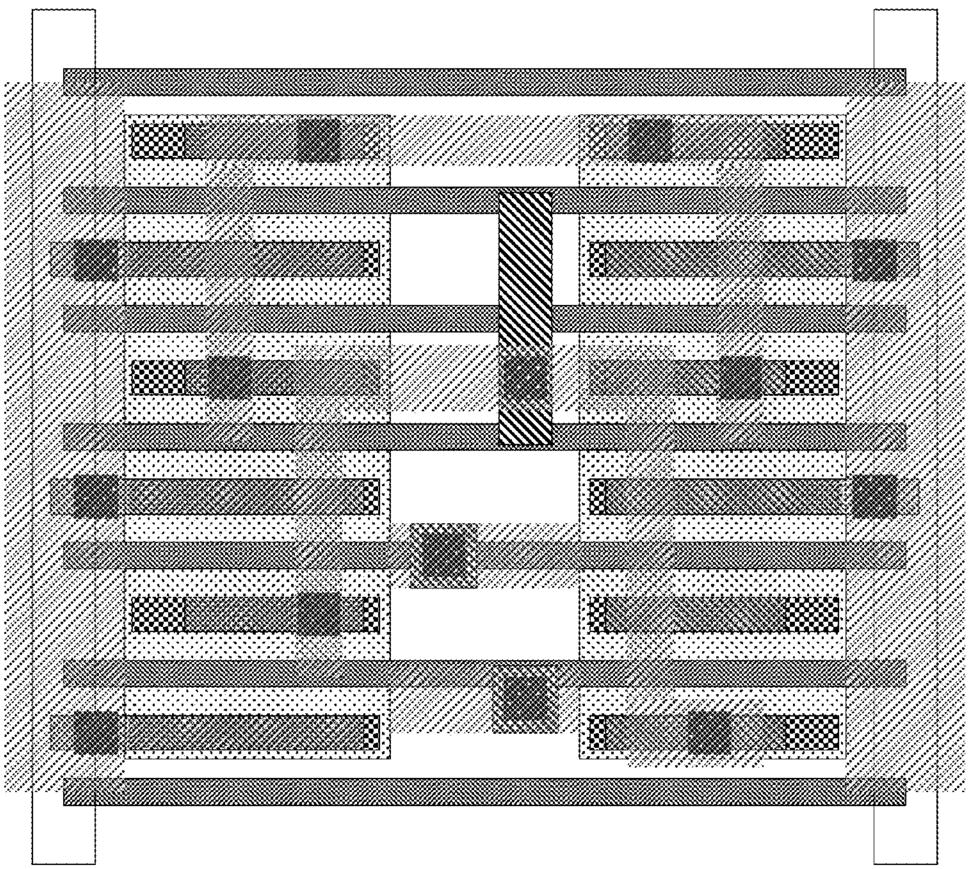
FIG. 3 depicts an AN2D3 cell.

Reference is made to FIG. 3, which depicts an AN2D3 cell. This cell implements the logic function and(A,B) in drive strength 2.

Figure 4:
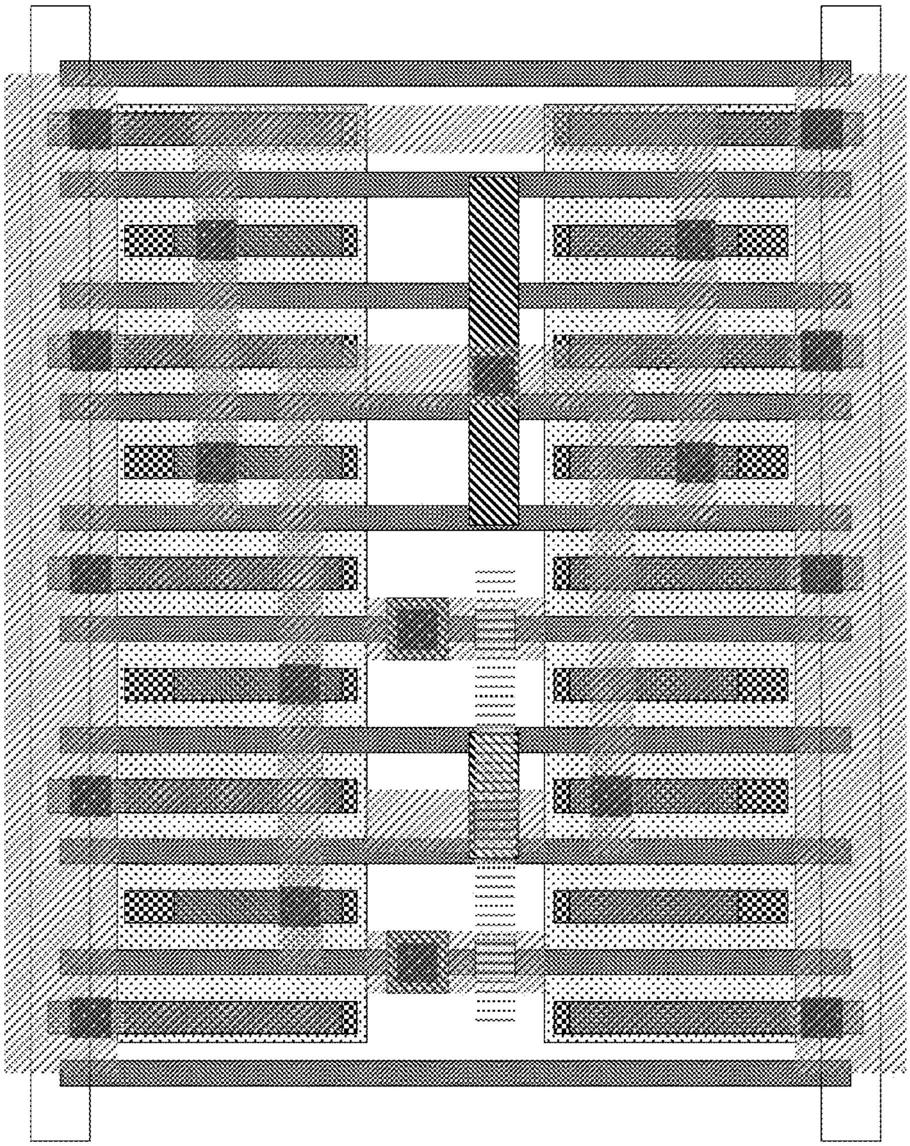
FIG. 4 depicts an AN2D4 cell.

Reference is made to FIG. 4, which depicts an AN2D4 cell. This cell implements the logic function and(A,B) in drive strength 4.

Figure 5:
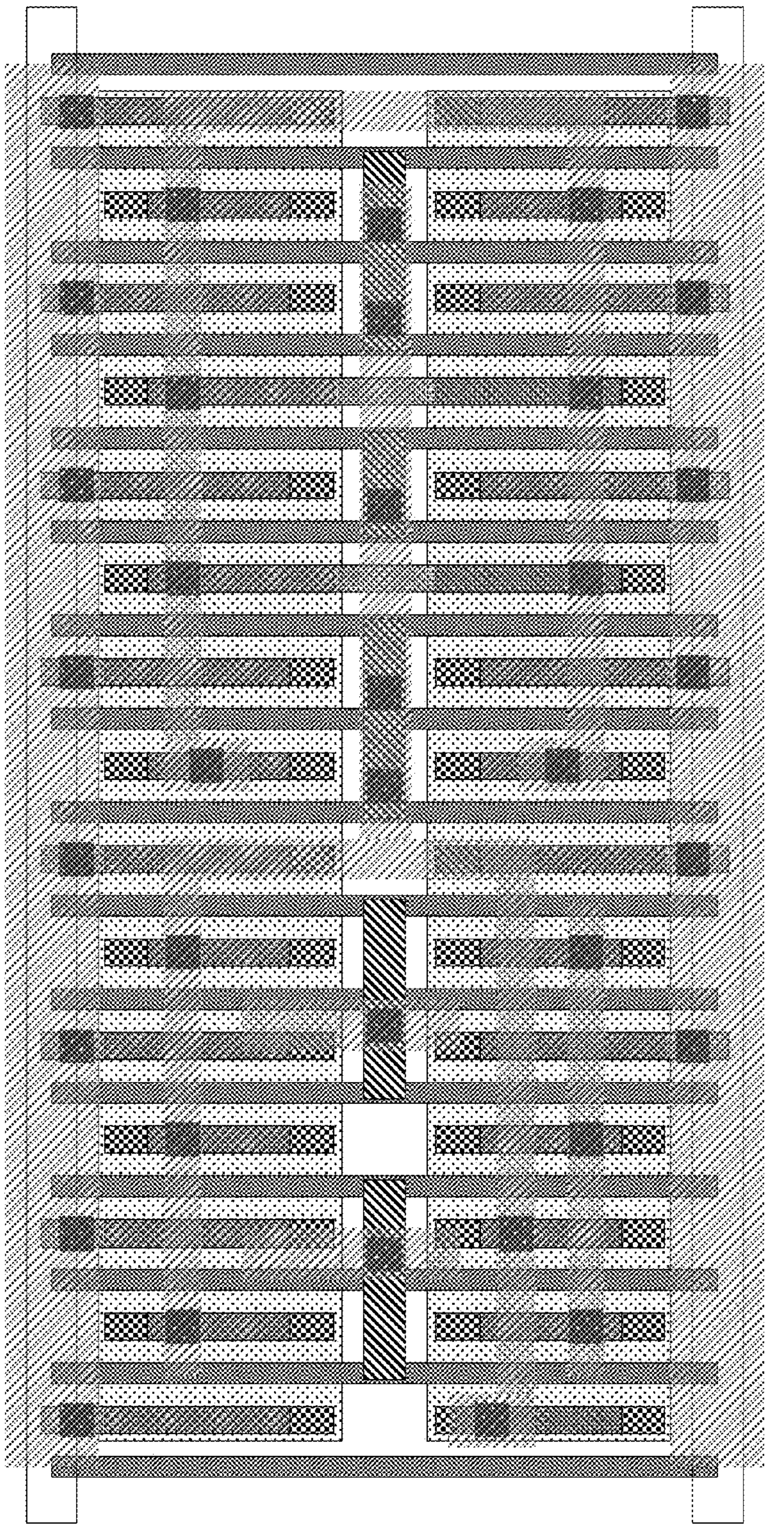
FIG. 5 depicts an AN2D8 cell.

Reference is made to FIG. 5, which depicts an AN2D8 cell. This cell implements the logic function and(A,B) in drive strength 4.

Figure 6:
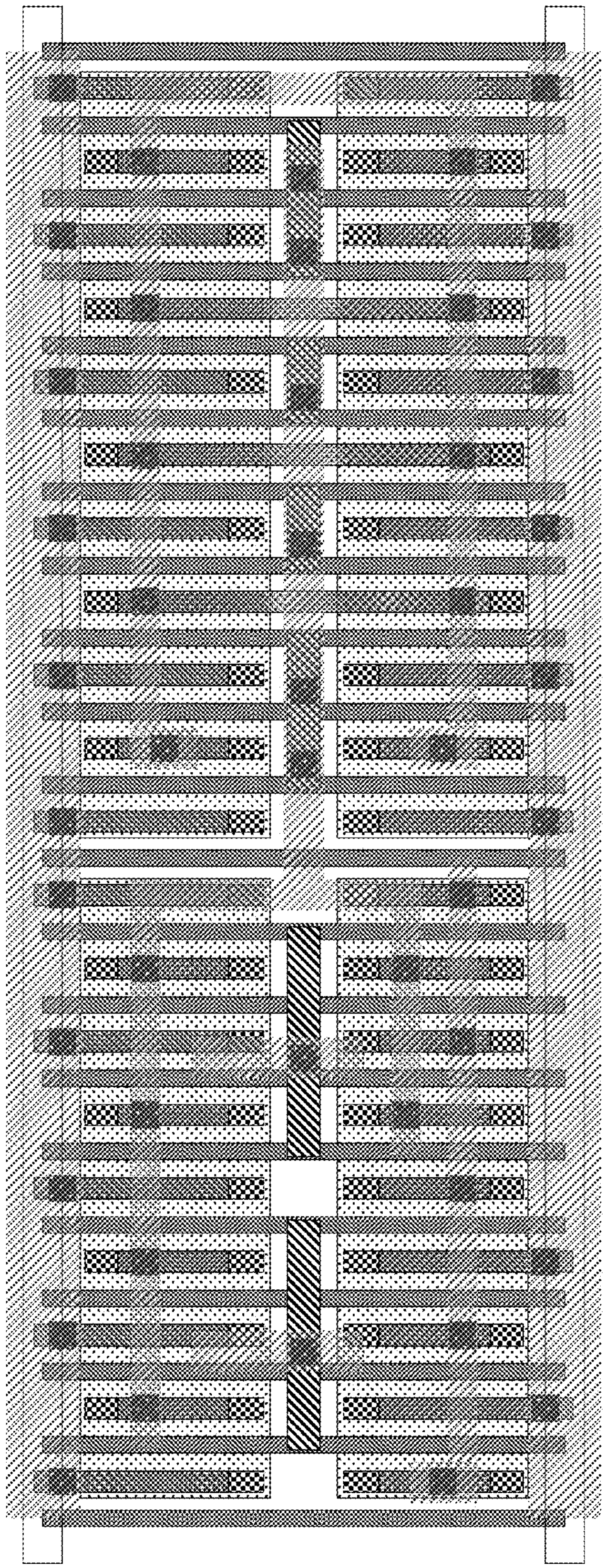
FIG. 6 depicts an AN2D10 cell.

Reference is made to FIG. 6, which depicts an AN2D10 cell. This cell implements the logic function and(A,B) in drive strength 10.

Figure 7:
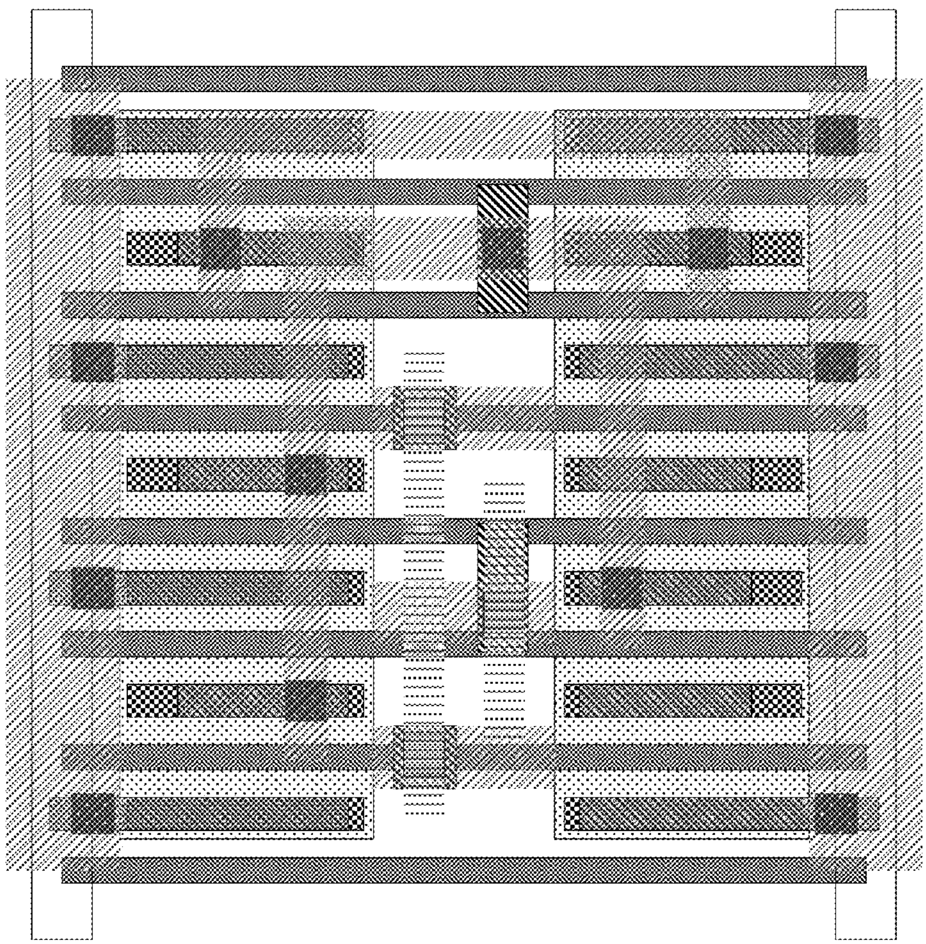
FIG. 7 depicts an AN2XD2 cell.

Reference is made to FIG. 7, which depicts an AN2XD2 cell. This is an alternative implementation of the AN2D2 cell.

Figure 8:
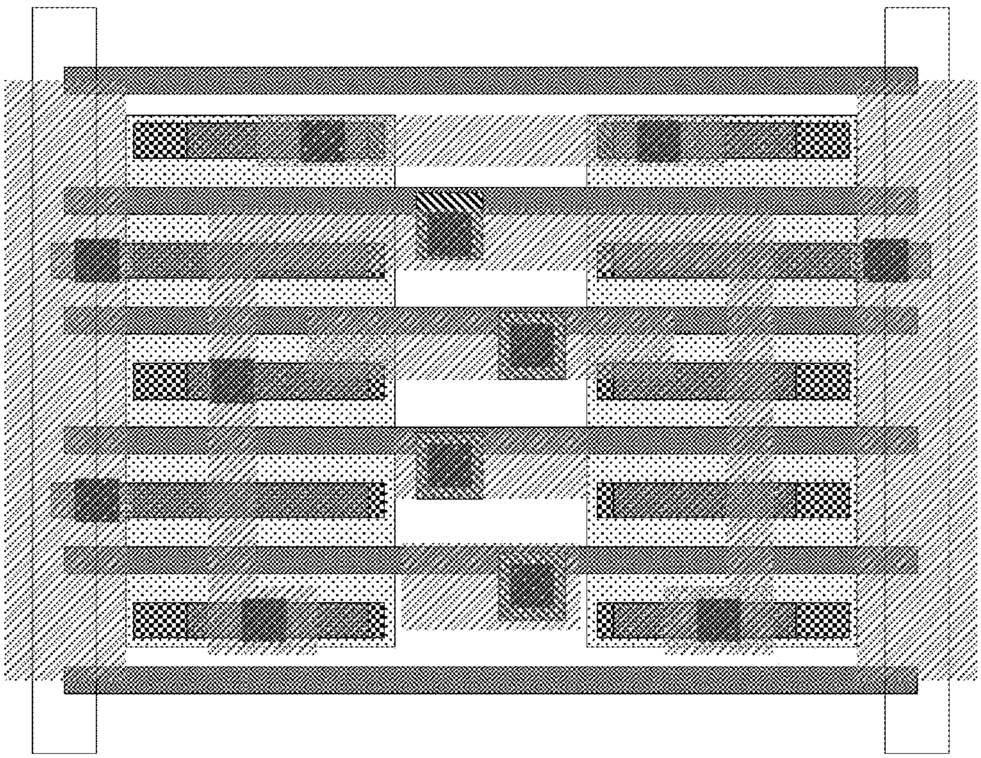
FIG. 8 depicts an AN3D1 cell.

Reference is made to FIG. 8, which depicts an AN3D1 cell. This cell implements the logic function and(A,B,C) in drive strength 1.

Figure 9:
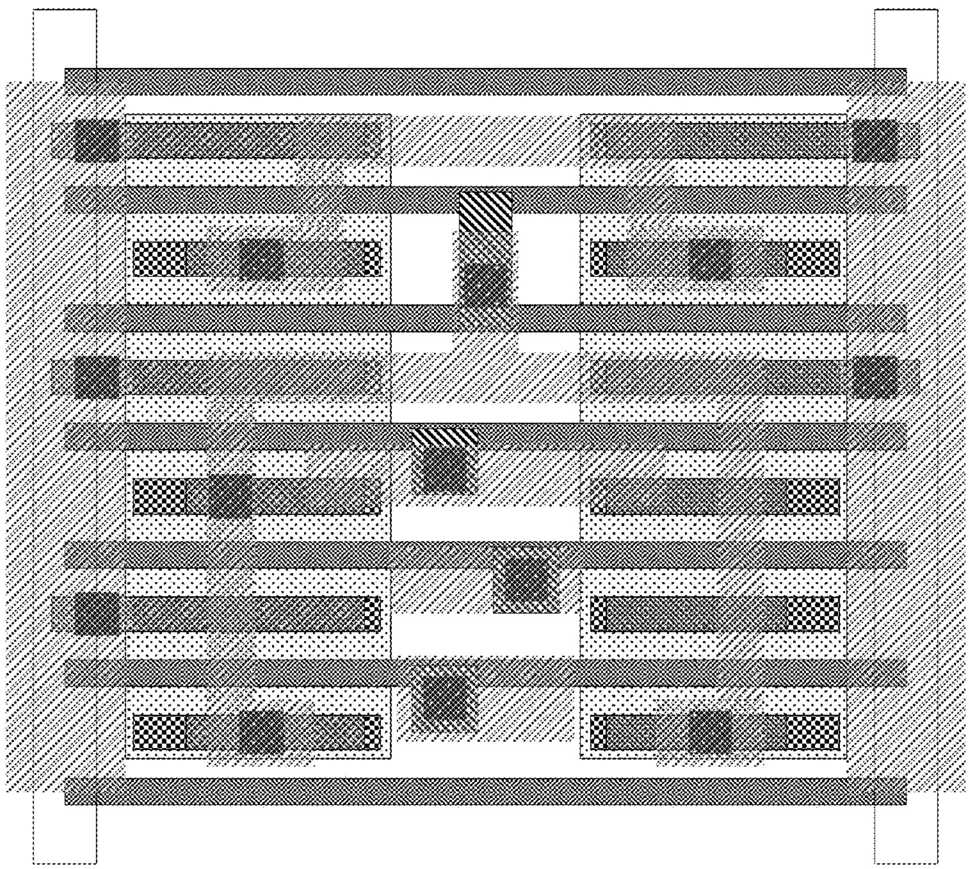
FIG. 9 depicts an AN3D2 cell.

Reference is made to FIG. 9, which depicts an AN3D2 cell. This cell implements the logic function and(A,B,C) in drive strength 2.

Figure 10:
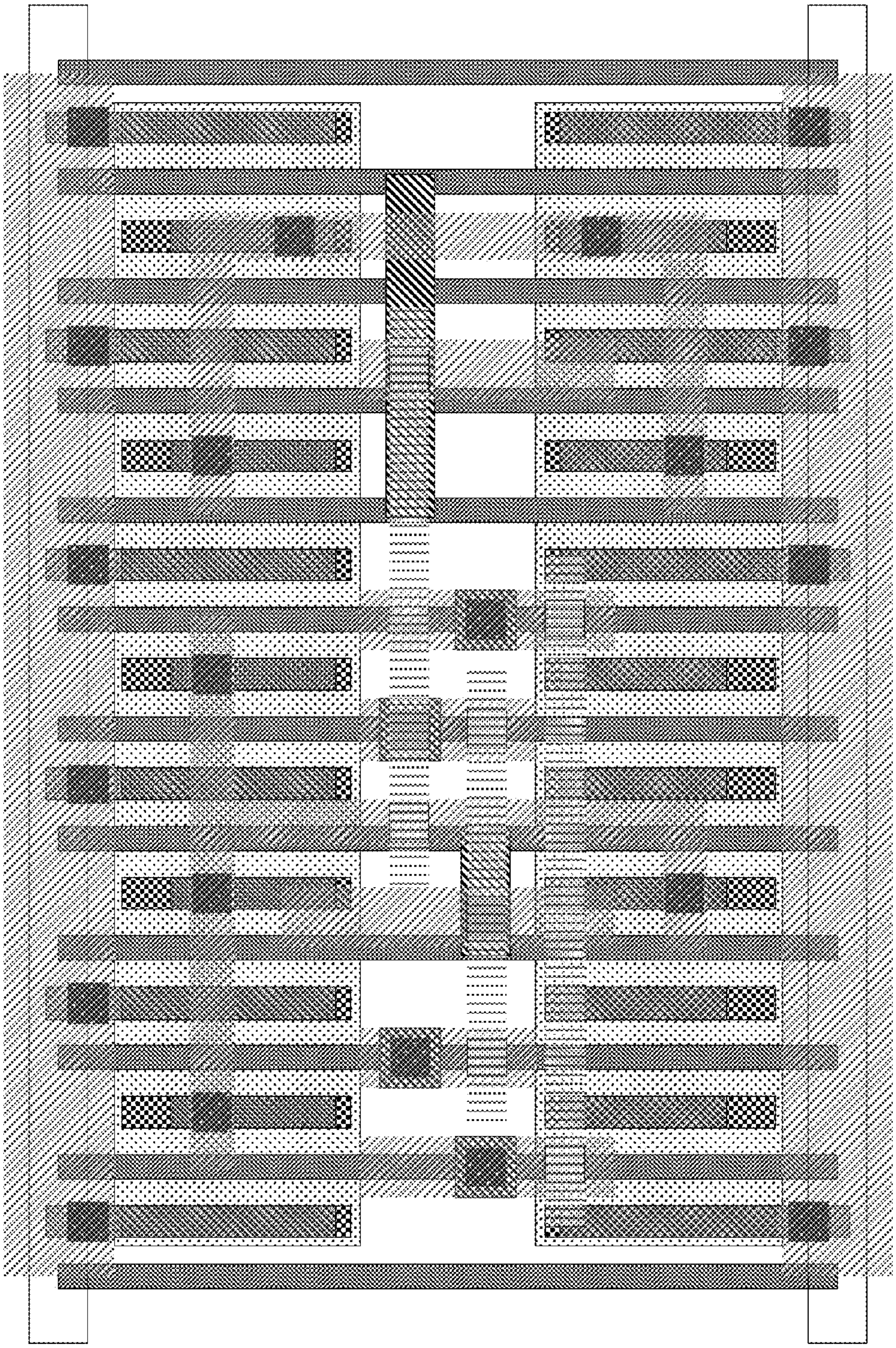
FIG. 10 depicts an AN3D4 cell.

Reference is made to FIG. 10, which depicts an AN3D4 cell. This cell implements the logic function and(A,B,C) in drive strength 4.

Figure 11:
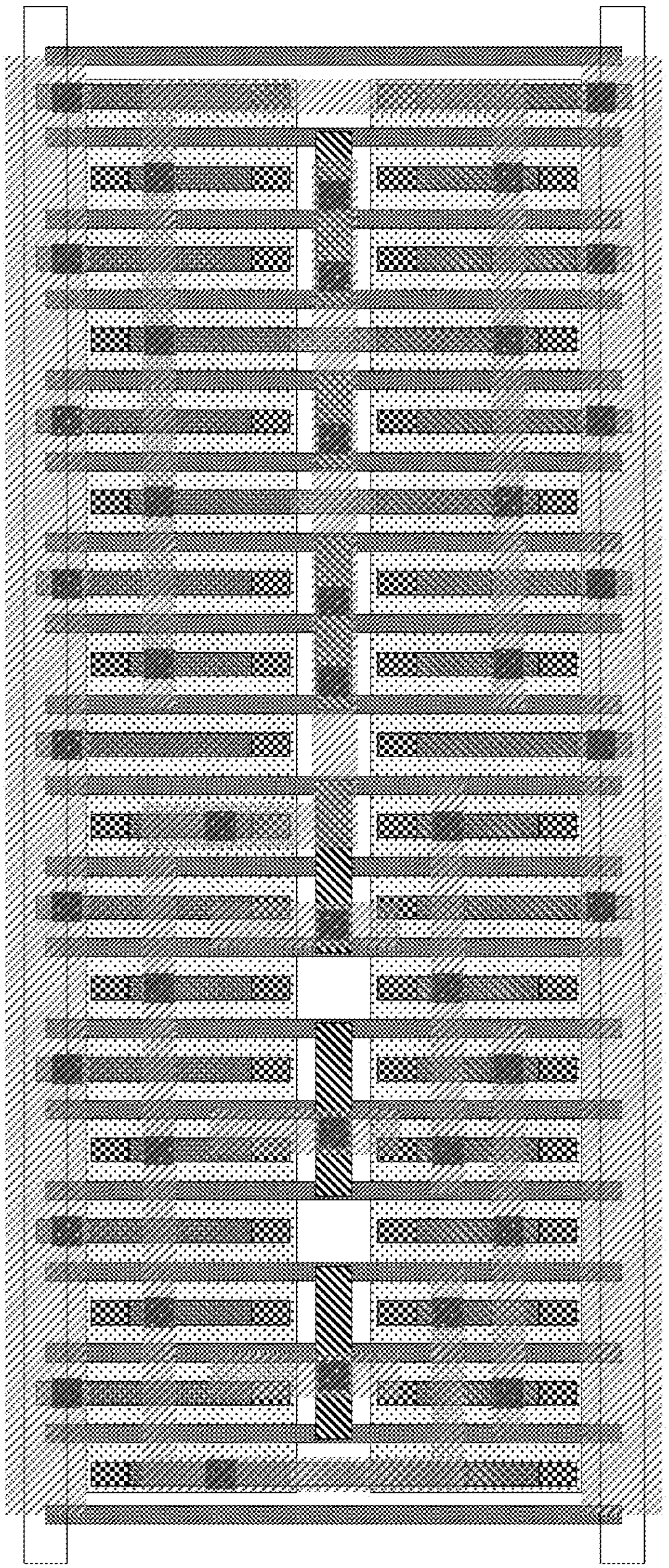
FIG. 11 depicts an AN3D8 cell.

Reference is made to FIG. 11, which depicts an AN3D8 cell. This cell implements the logic function and(A,B,C) in drive strength 8.

Figure 12:
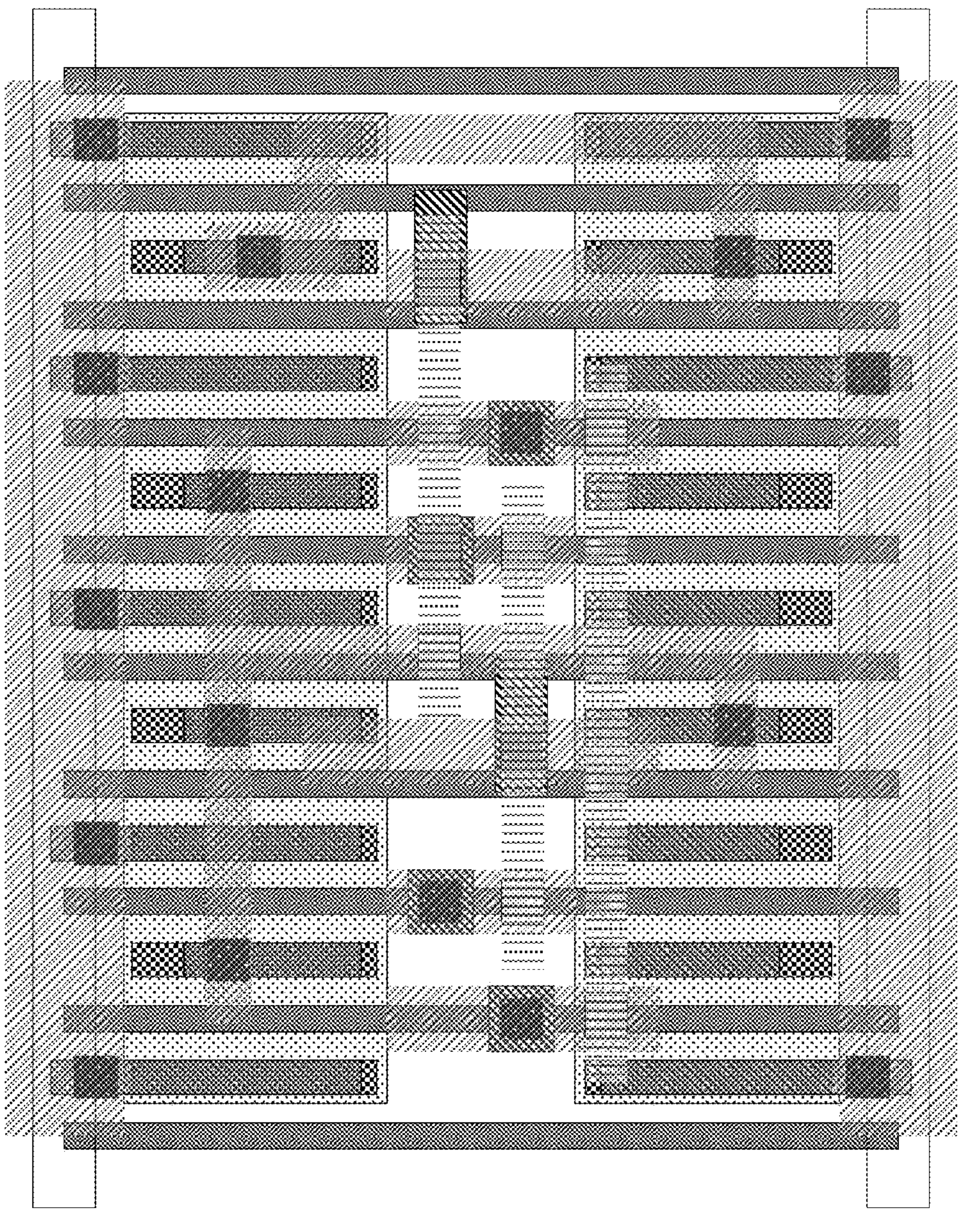
FIG. 12 depicts an AN3XD2 cell.

Reference is made to FIG. 12, which depicts an AN3XD2 cell. This is an alternative implementation of the AN3D2 cell.

Figure 13:
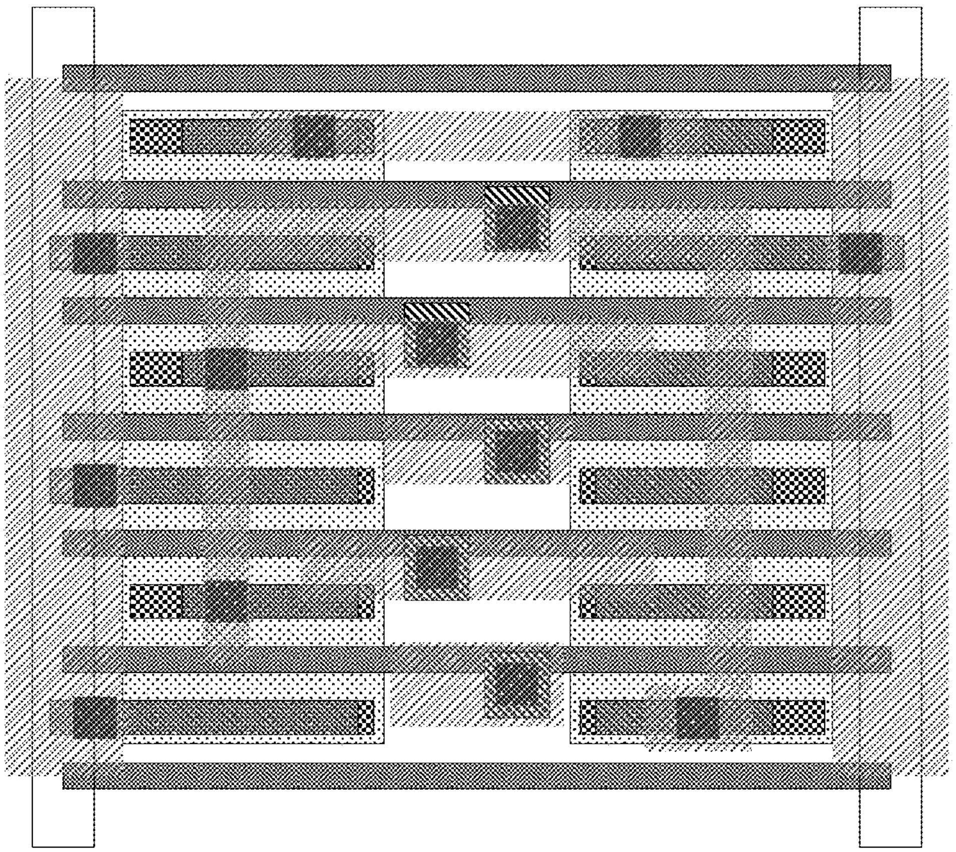
FIG. 13 depicts an AN4D1 cell.

Reference is made to FIG. 13, which depicts an AN4D1 cell. This cell implements the logic function and(A,B,C,D) in drive strength 1.

Figure 14:
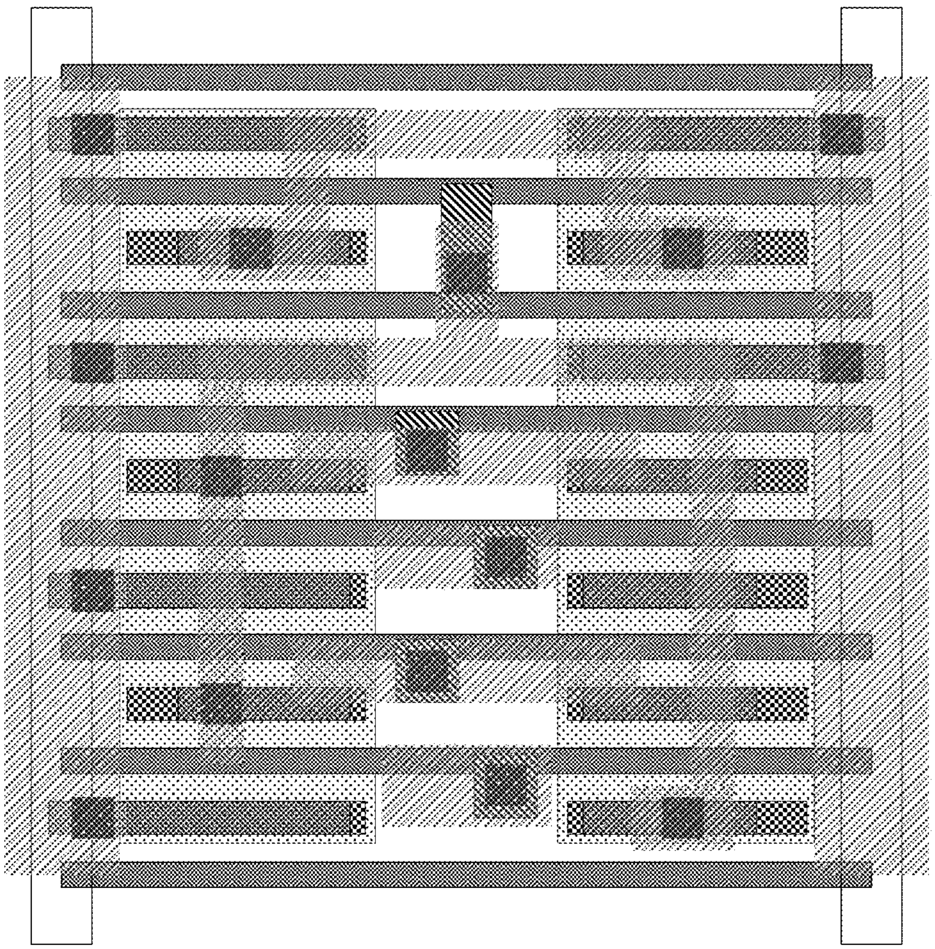
FIG. 14 depicts an AN4D2 cell.

Reference is made to FIG. 14, which depicts an AN4D2 cell. This cell implements the logic function and(A,B,C,D) in drive strength 2.

Figure 15:
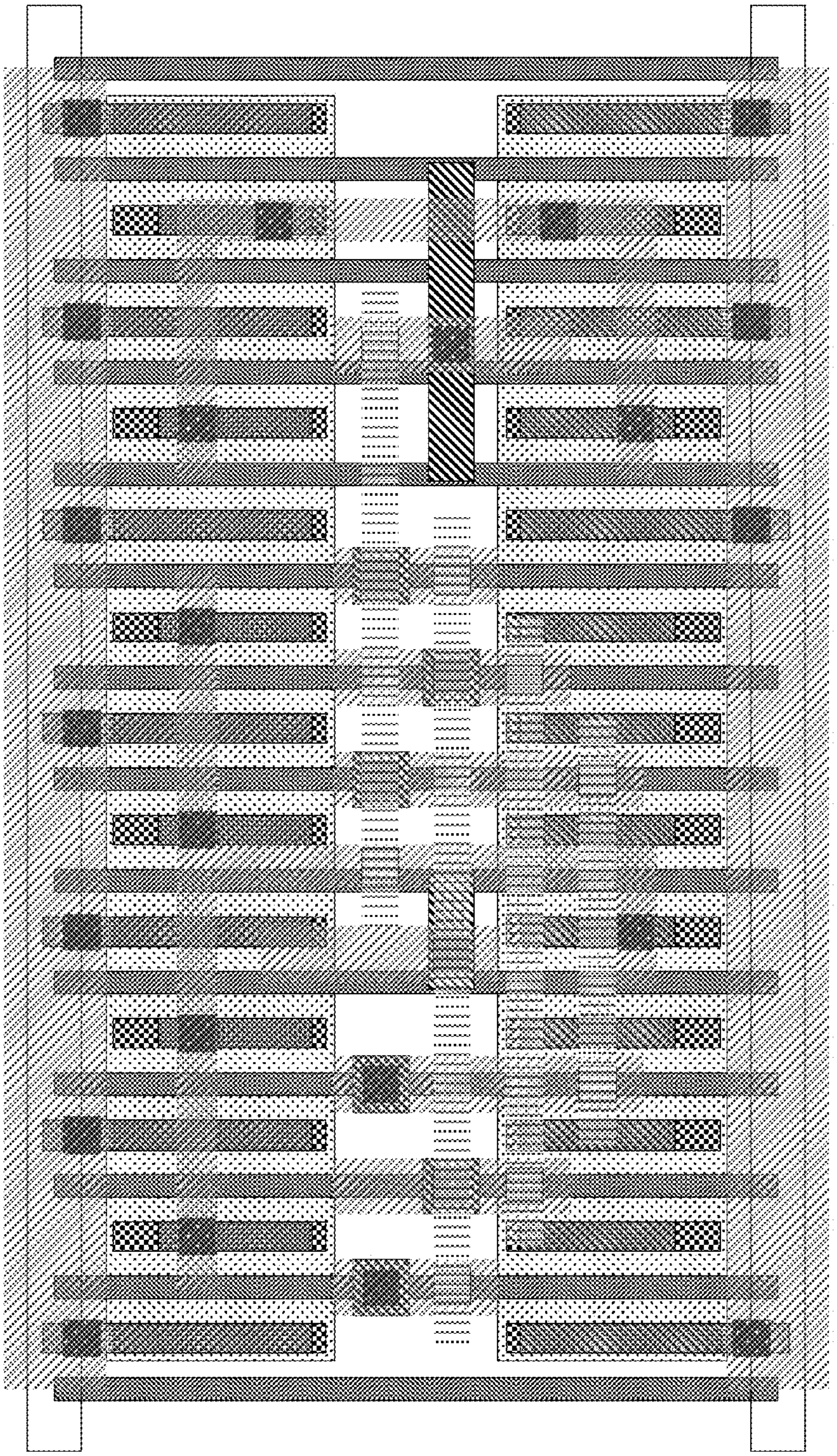
FIG. 15 depicts an AN4D4 cell.

Reference is made to FIG. 15, which depicts an AN4D4 cell. This cell implements the logic function and(A,B,C,D) in drive strength 4.

Figure 16:
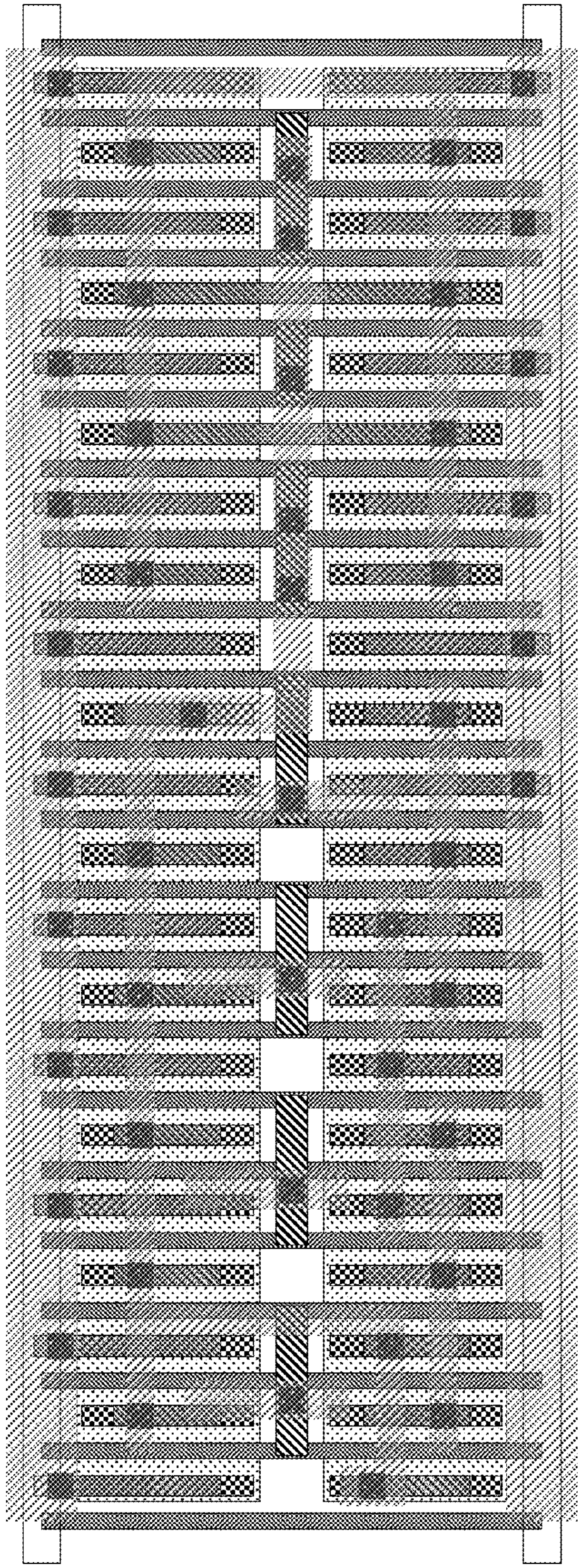
FIG. 16 depicts an AN4D8 cell.

Reference is made to FIG. 16, which depicts an AN4D8 cell. This cell implements the logic function and(A,B,C,D) in drive strength 8.

Figure 17:
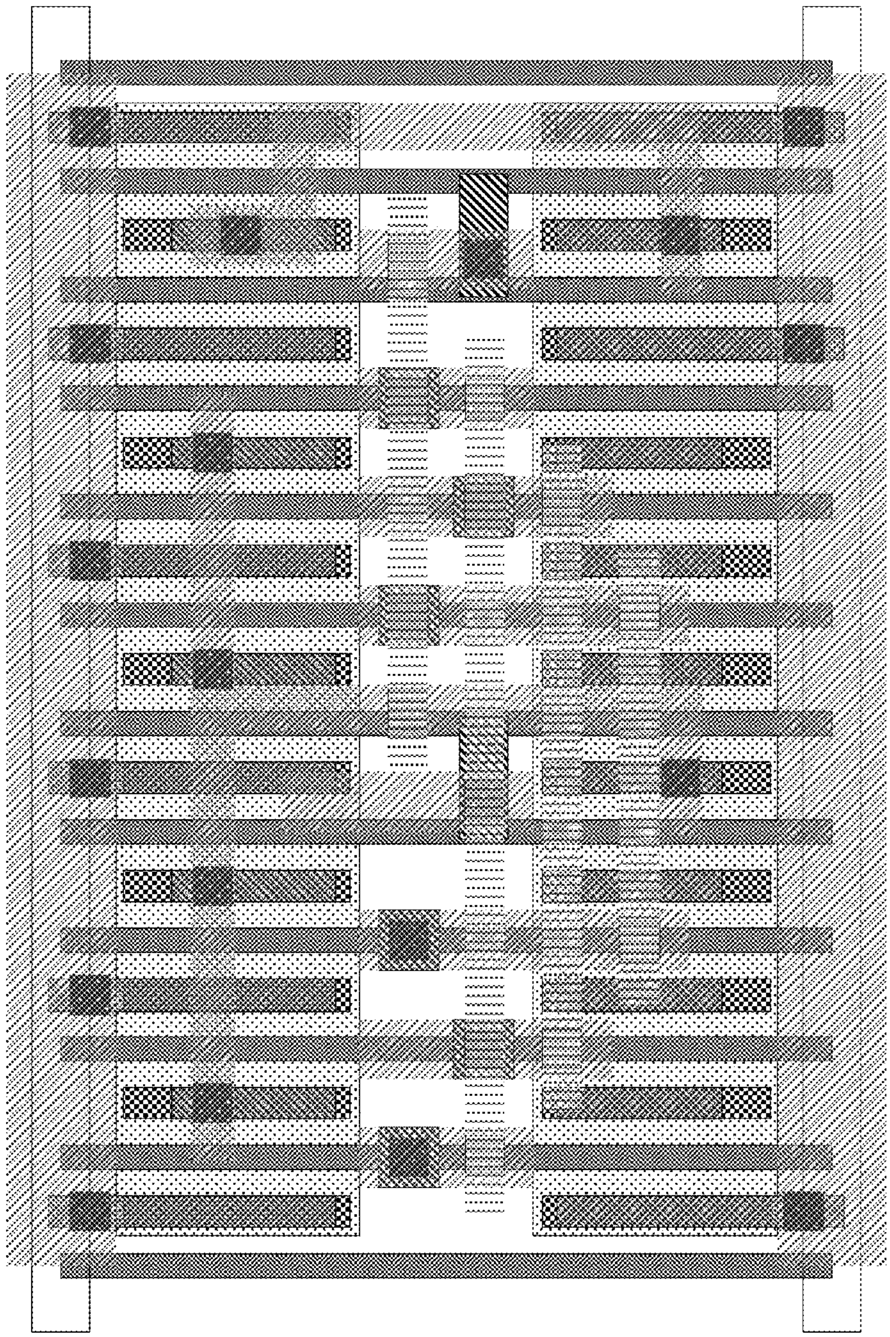
FIG. 17 depicts an AN4XD2 cell.

Reference is made to FIG. 17, which depicts an AN4XD2 cell. This is an alternative implementation of the AN4D2 cell.

Figure 18:
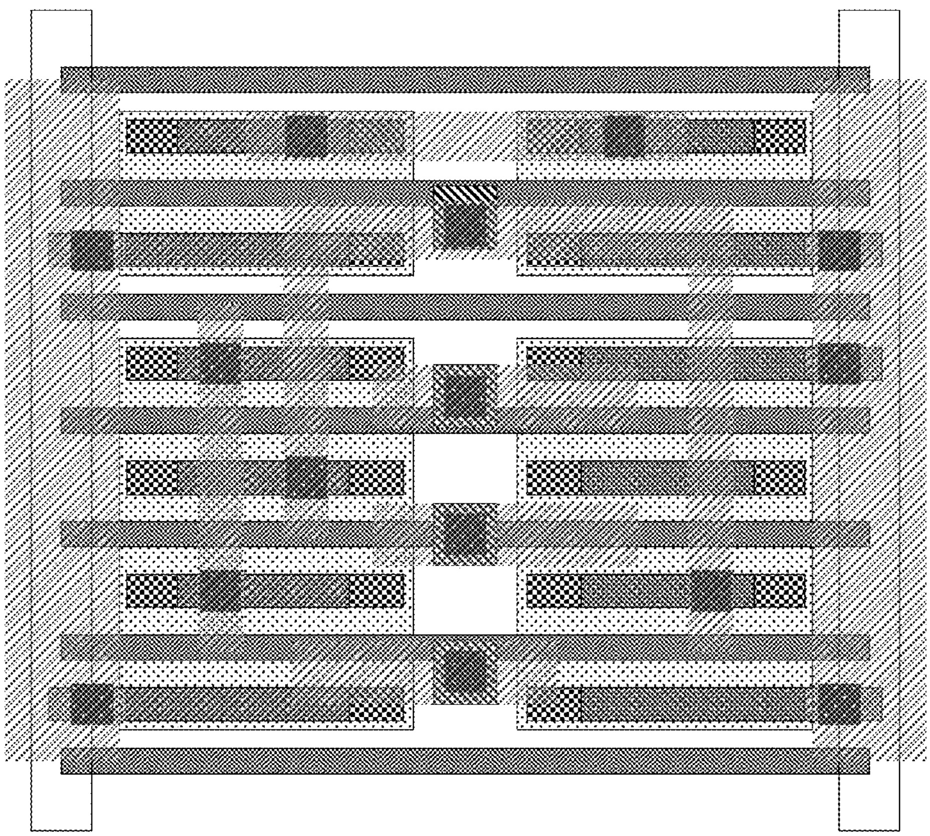
FIG. 18 depicts an AO21D1 cell.

Reference is made to FIG. 18, which depicts an AO21D1 cell. This cell implements the logic function or(and(A,B),C) in drive strength 1.

Figure 19:
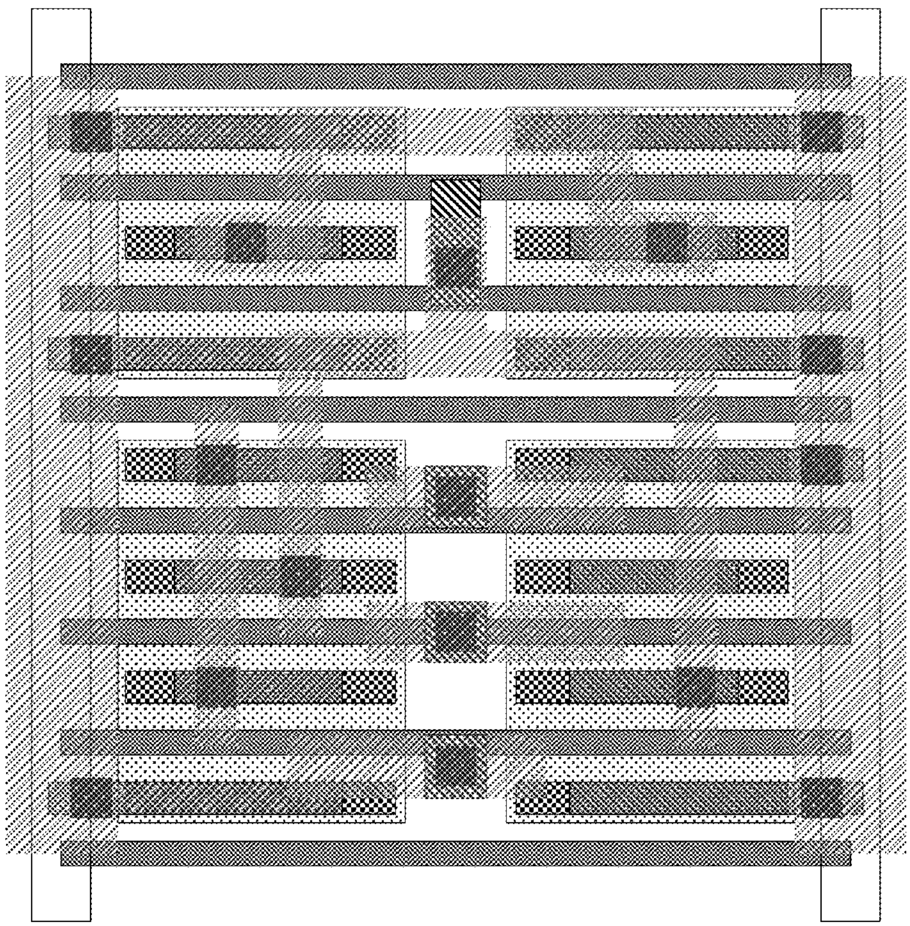
FIG. 19 depicts an AO21D2 cell.

Reference is made to FIG. 19, which depicts an AO21D2 cell. This cell implements the logic function or(and(A,B),C) in drive strength 2.

Figure 20:
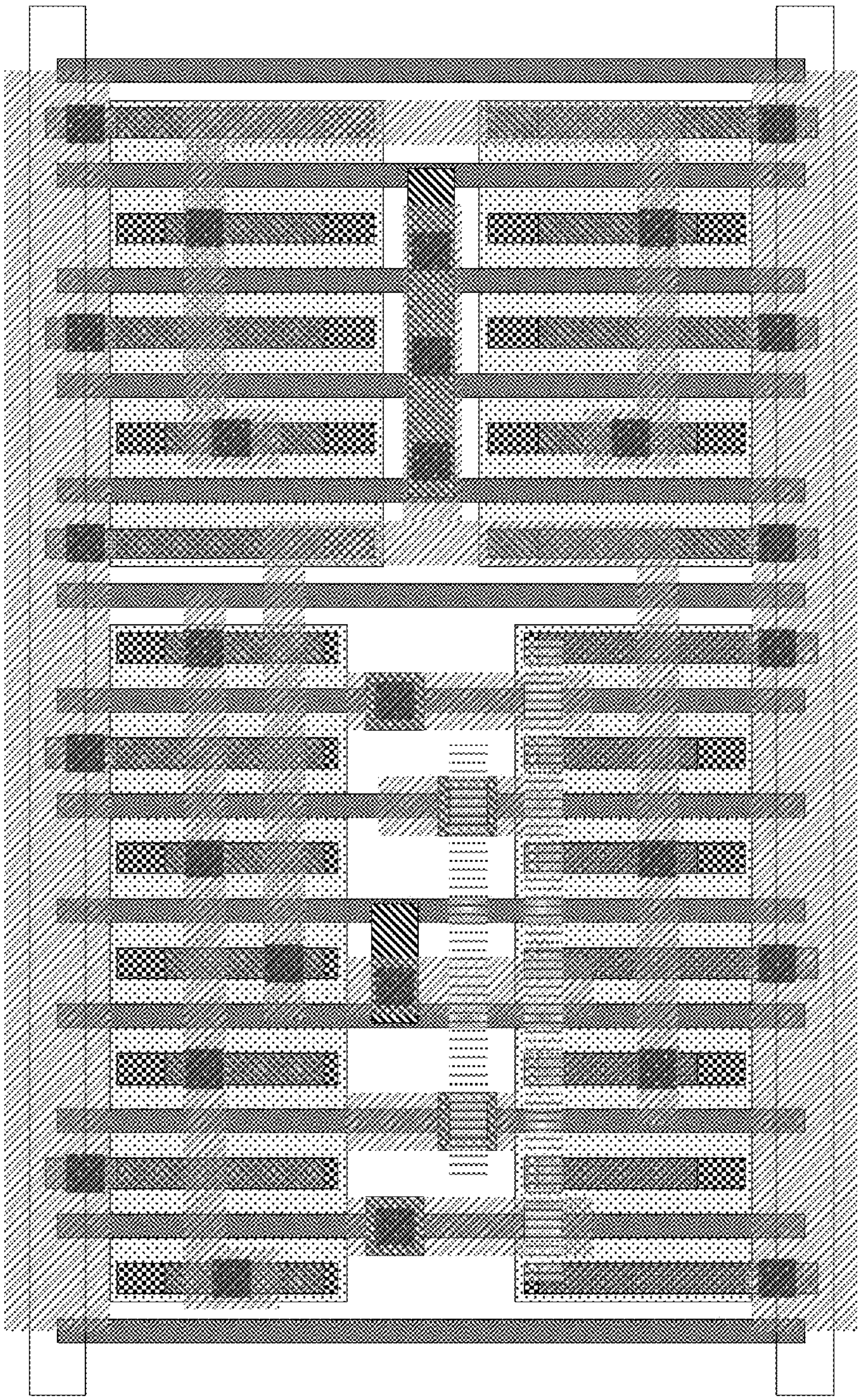
FIG. 20 depicts an AO21D4 cell.

Reference is made to FIG. 20, which depicts an AO21D4 cell. This cell implements the logic function or(and(A,B),C) in drive strength 4.

Figure 21:
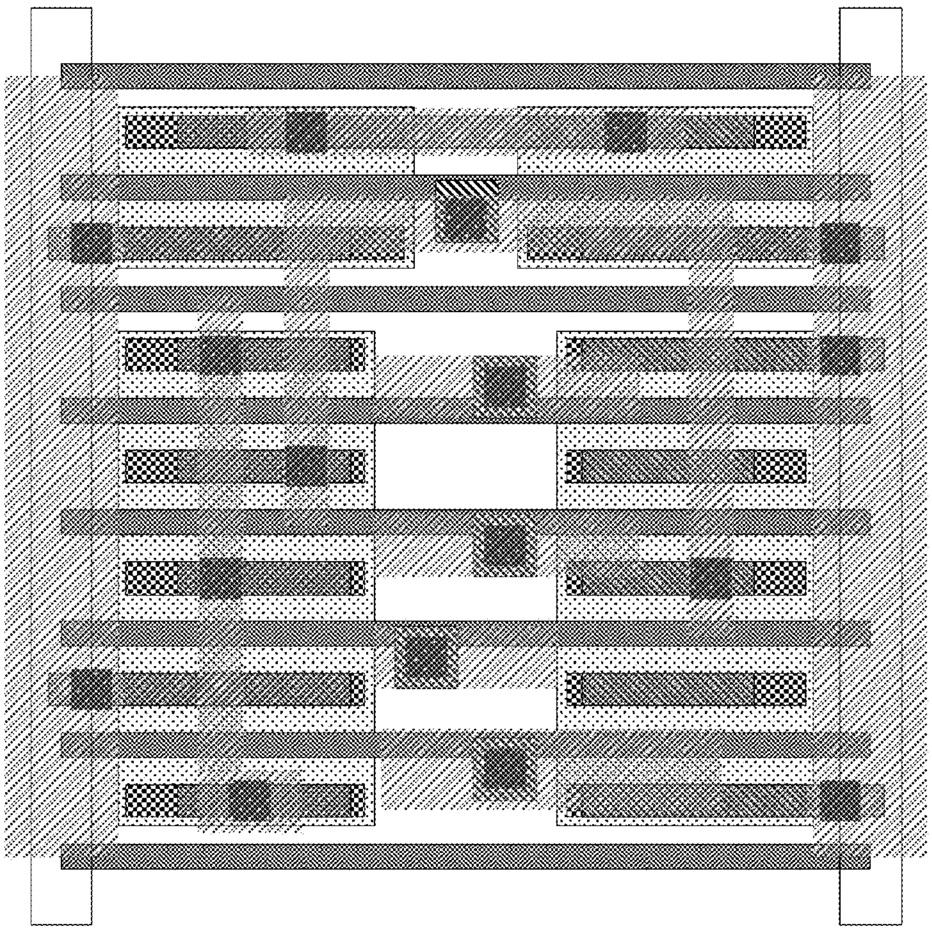
FIG. 21 depicts an AO22D1 cell.

Reference is made to FIG. 21, which depicts an AO22D1 cell. This cell implements the logic function or(and(A,B), and(C,D)) in drive strength 1.

Figure 22:
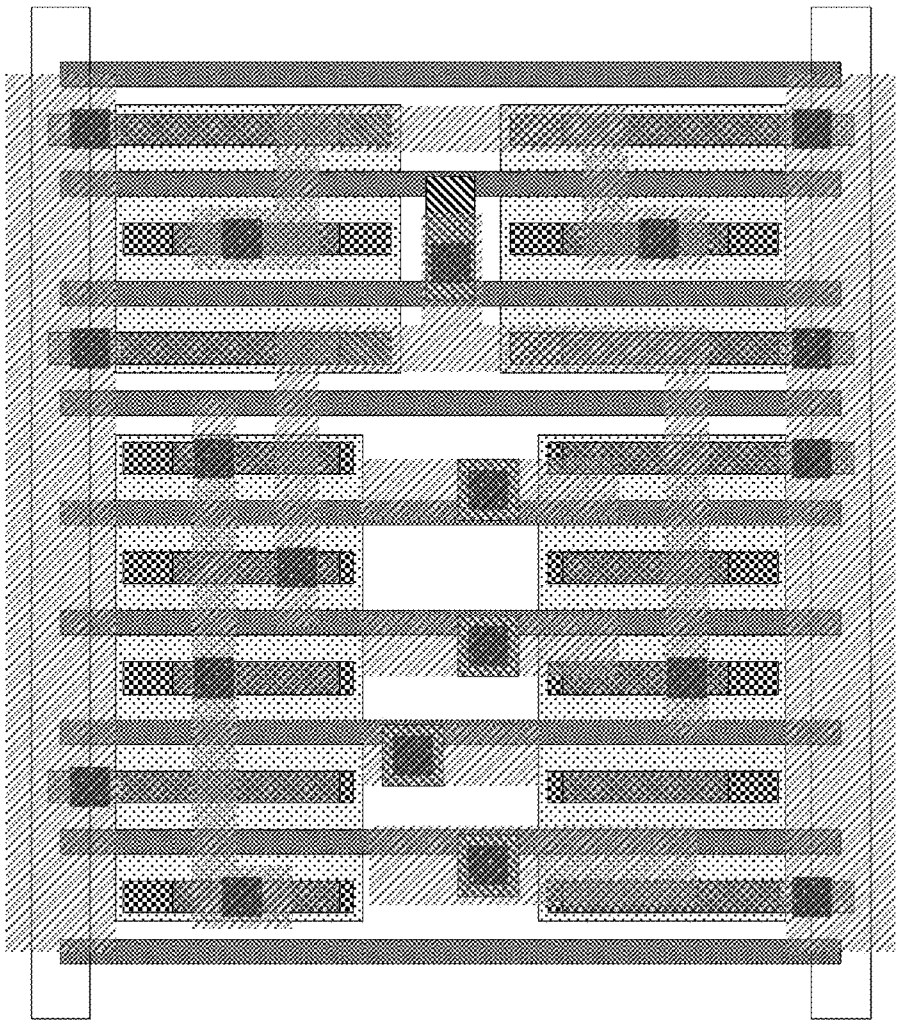
FIG. 22 depicts an AO22D2 cell.

Reference is made to FIG. 22, which depicts an AO22D2 cell. This cell implements the logic function or(and(A,B), and(C,D)) in drive strength 2.

Figure 23:
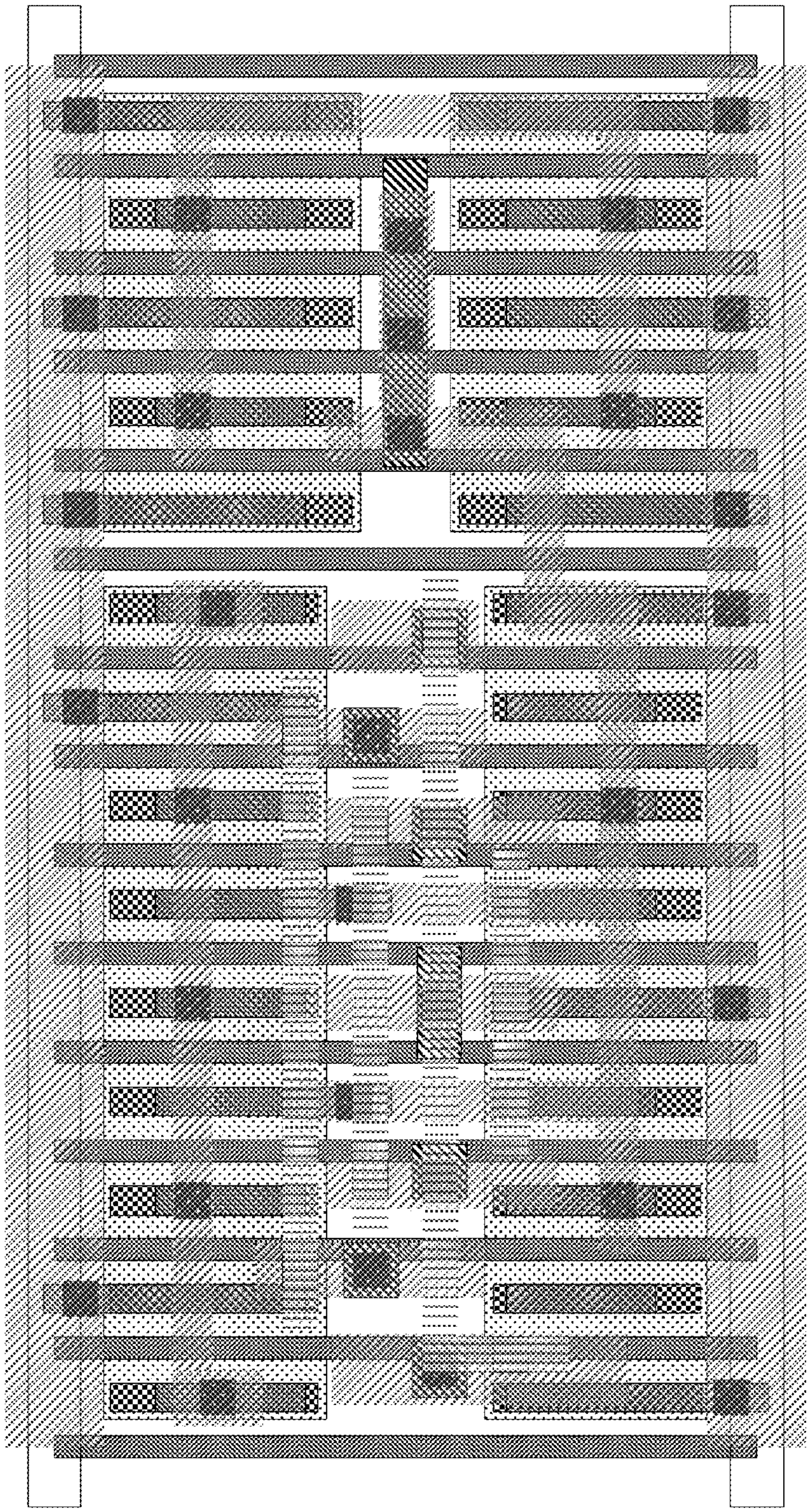
FIG. 23 depicts an AO22D4 cell.

Reference is made to FIG. 23, which depicts an AO22D4 cell. This cell implements the logic function or(and(A,B), and(C,D)) in drive strength 4.

Figure 24:
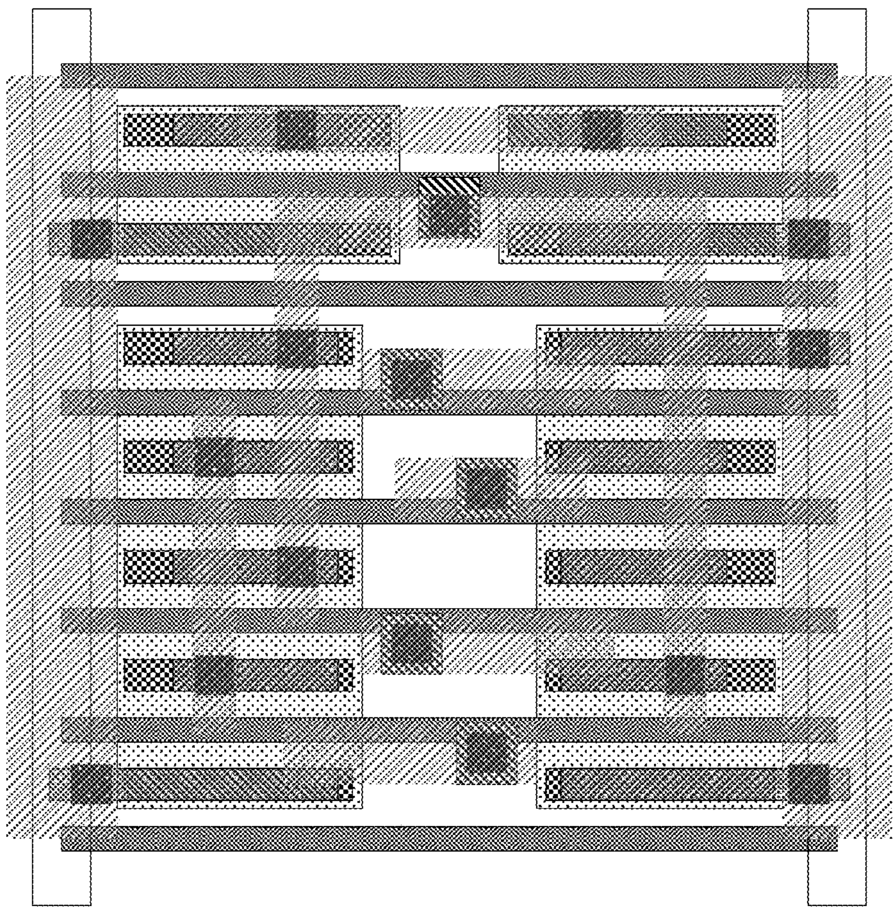
FIG. 24 depicts an AO31D1 cell.

Reference is made to FIG. 24, which depicts an AO31D1 cell. This cell implements the logic function or(and(A,B,C), D) in drive strength 1.

Figure 25:
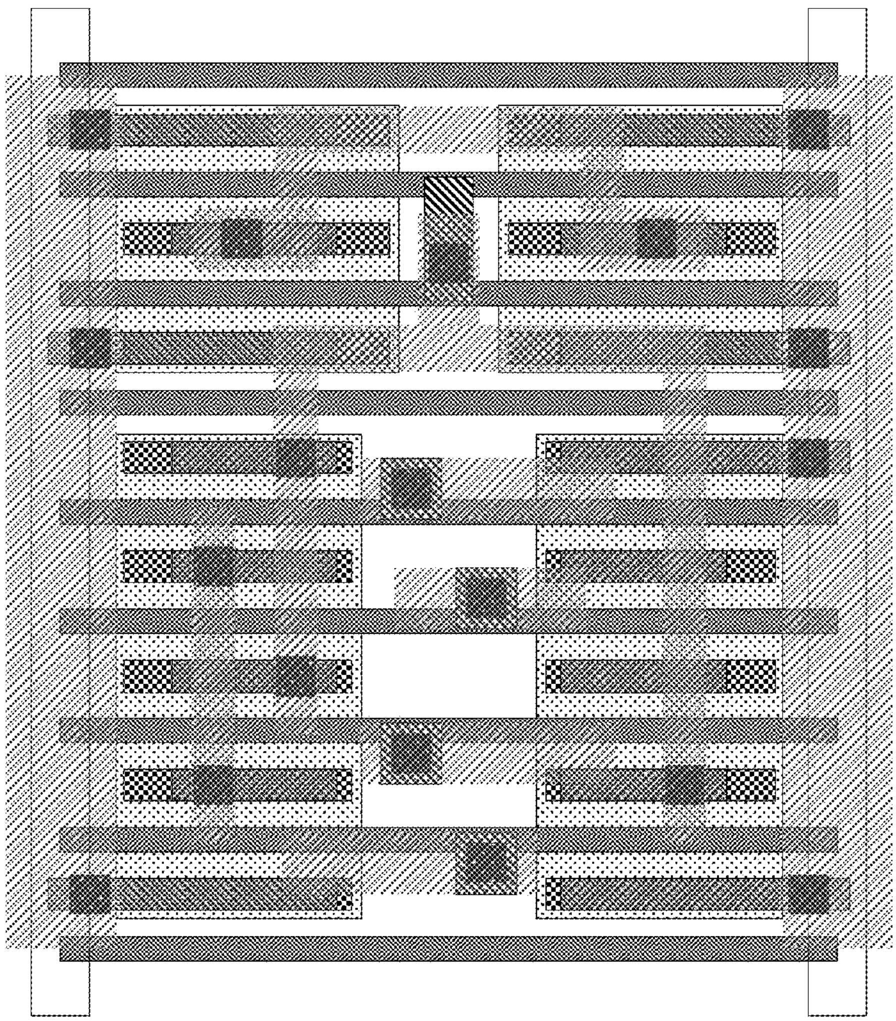
FIG. 25 depicts an AO31D2 cell.

Reference is made to FIG. 25, which depicts an AO31D2 cell. This cell implements the logic function or(and(A,B,C), D) in drive strength 2.

Figure 26:
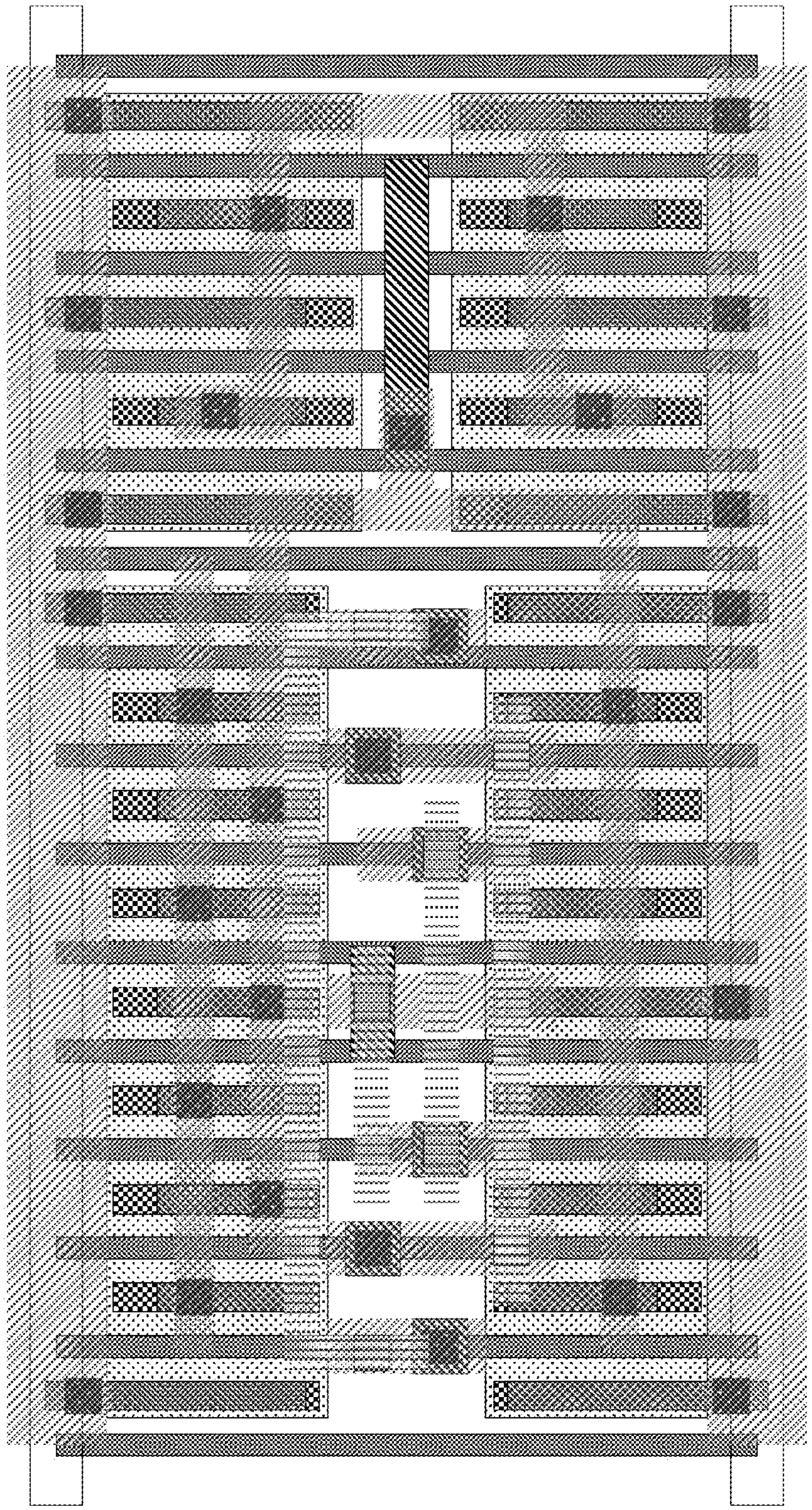
FIG. 26 depicts an AO31D4 cell.

Reference is made to FIG. 26, which depicts an AO31D4 cell. This cell implements the logic function or(and(A,B,C), D) in drive strength 4.

Figure 27:
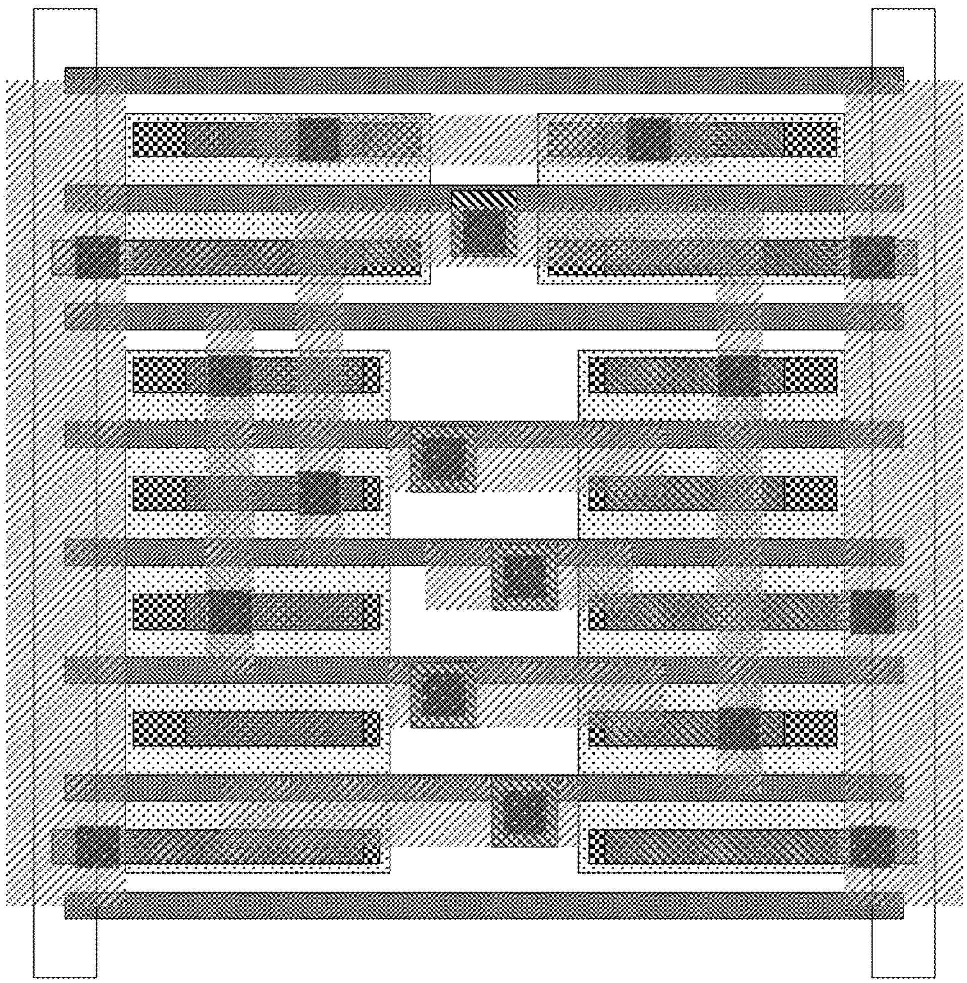
FIG. 27 depicts an AO211D1 cell.

Reference is made to FIG. 27, which depicts an AO211D1 cell. This cell implements the logic function or(and(A,B), C,D) in drive strength 1.

Figure 28:
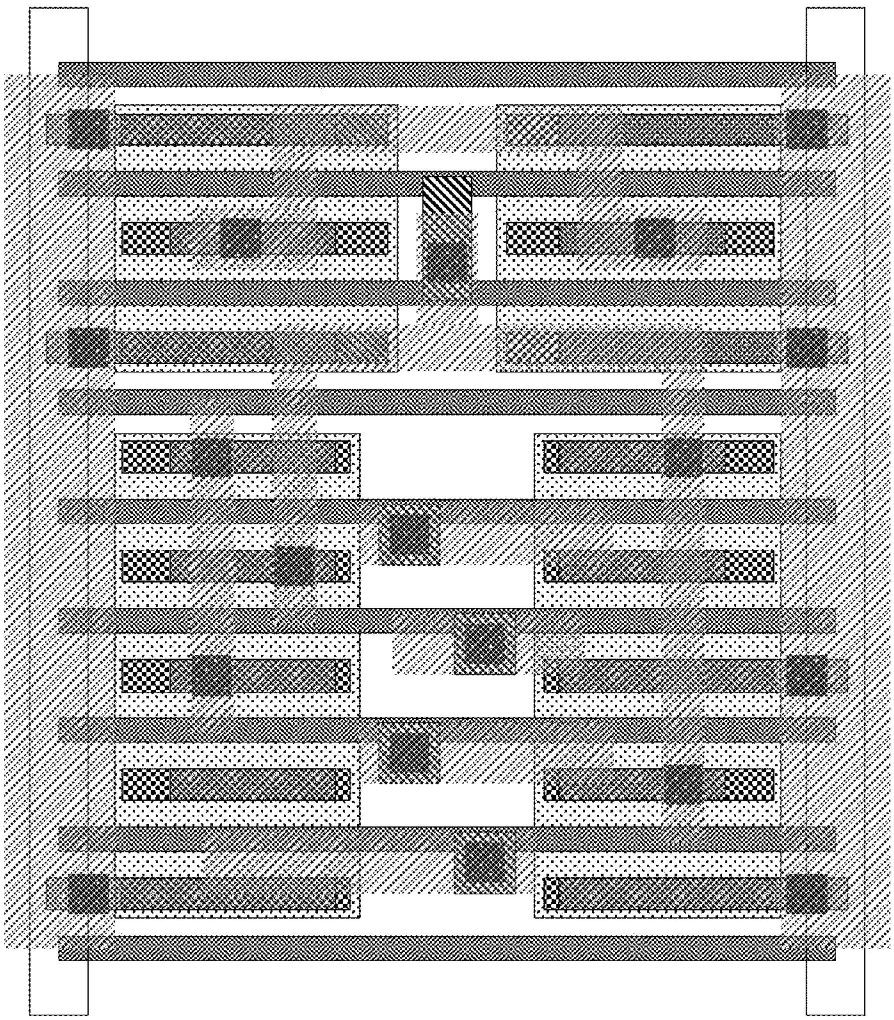
FIG. 28 depicts an AO211D2 cell.

Reference is made to FIG. 28, which depicts an AO211D2 cell. This cell implements the logic function or(and(A,B), C,D) in drive strength 2.

Figure 29:
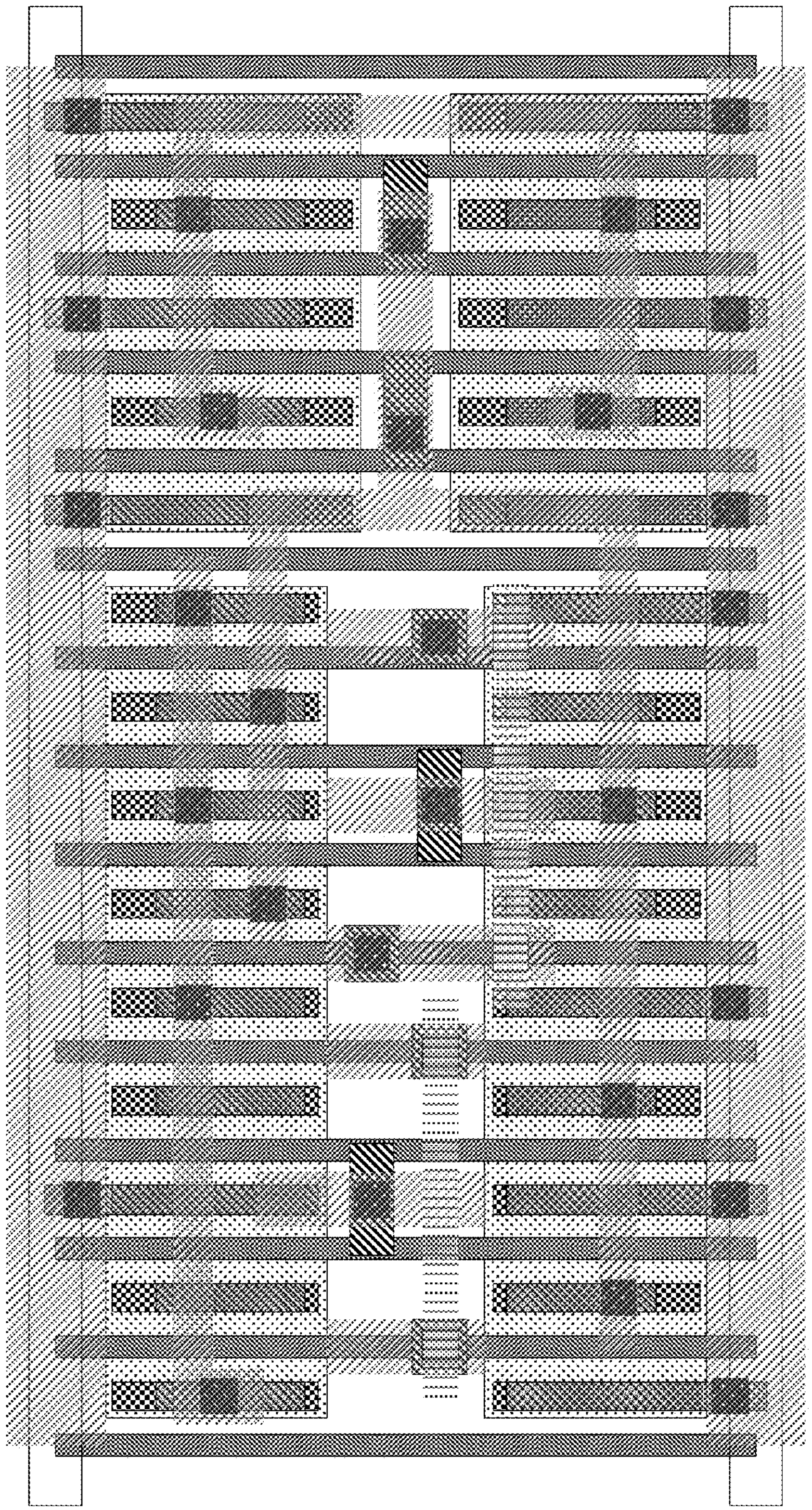
FIG. 29 depicts an AO211D4 cell.

Reference is made to FIG. 29, which depicts an AO211D4 cell. This cell implements the logic function or(and(A,B), C,D) in drive strength 4.

Figure 30:
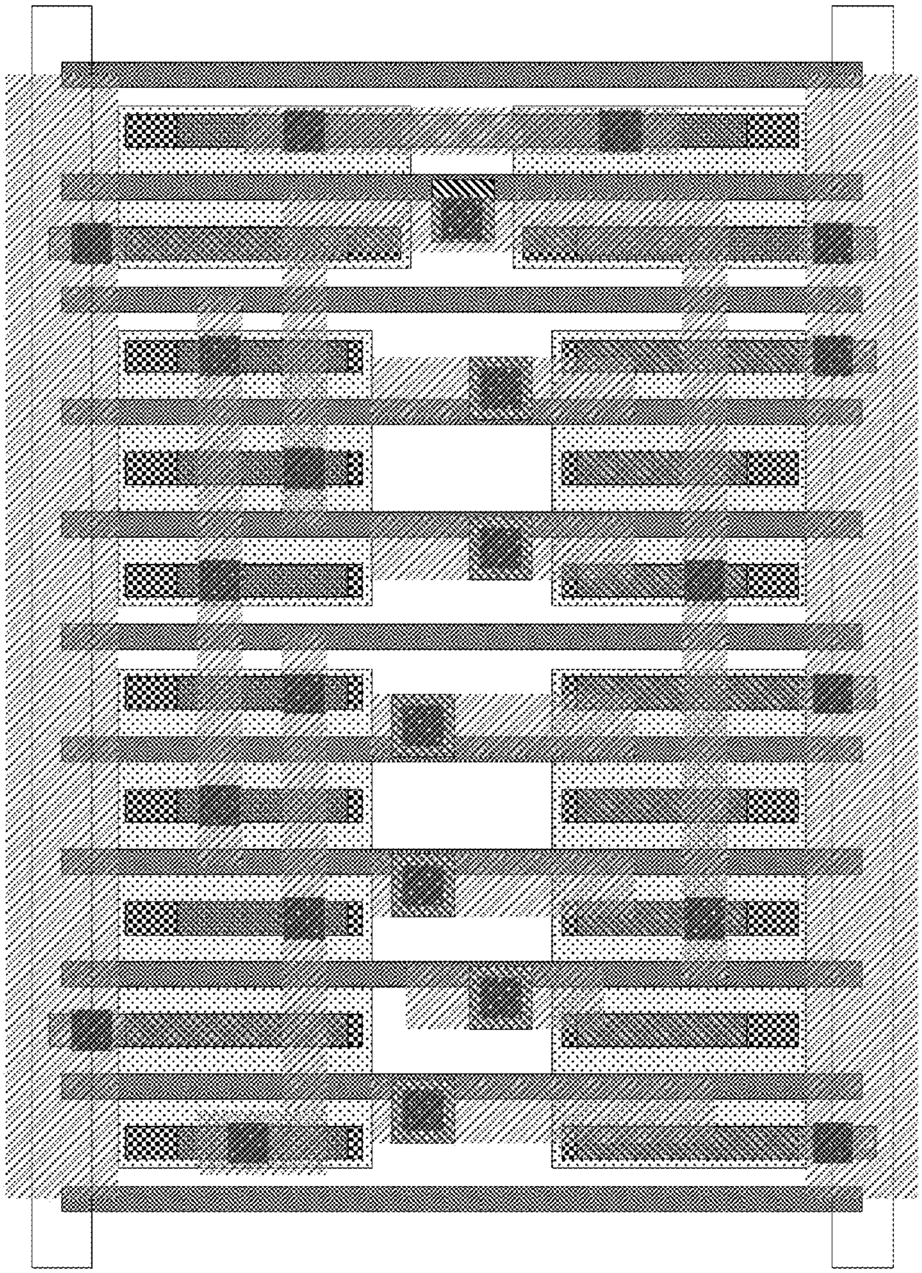
FIG. 30 depicts an AO222D1 cell.

Reference is made to FIG. 30, which depicts an AO222D1 cell. This cell implements the logic function or(and(A,B), and(C,D),and(E,F)) in drive strength 1.

Figure 31:
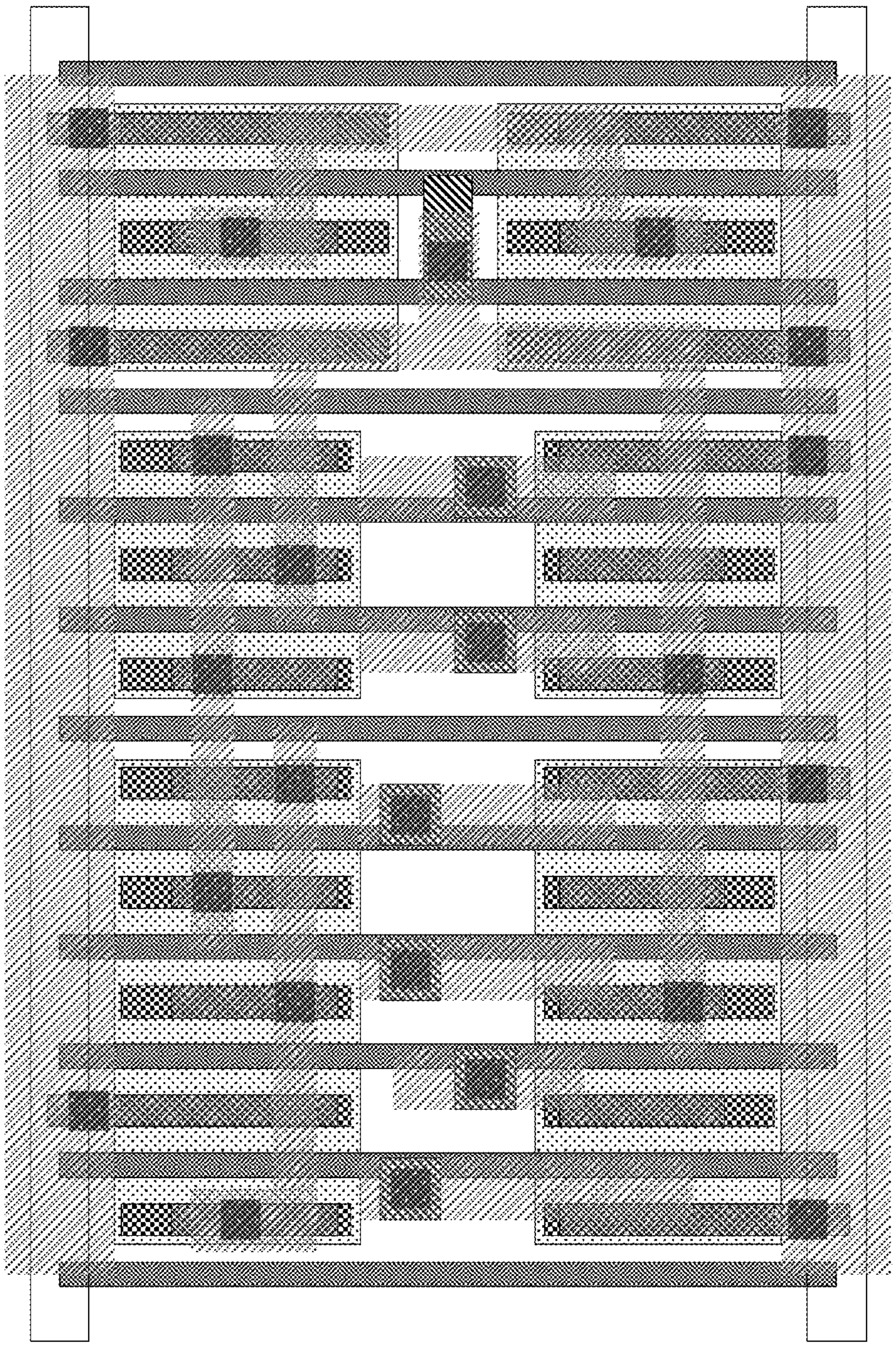
FIG. 31 depicts an AO222D2 cell.

Reference is made to FIG. 31, which depicts an AO222D2 cell. This cell implements the logic function or(and(A,B), and(C,D),and(E,F)) in drive strength 2.

Figure 32:
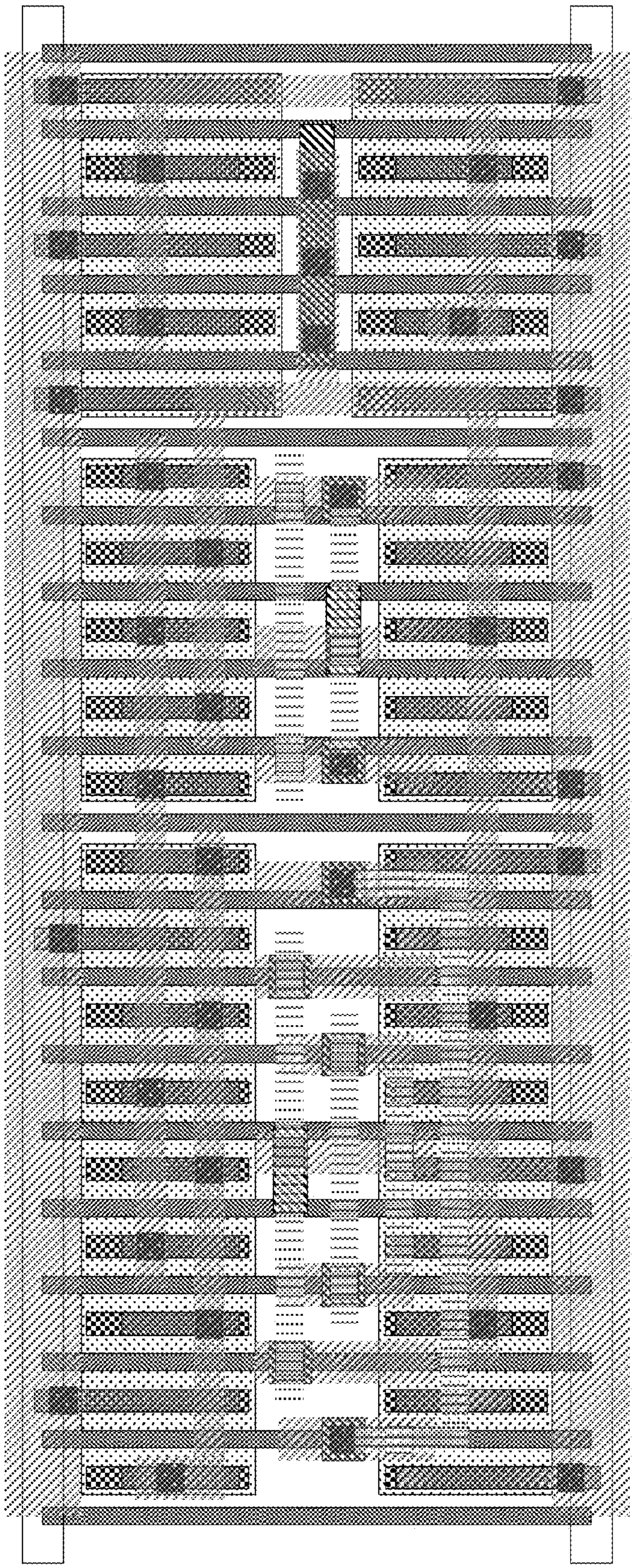
FIG. 32 depicts an AO222D4 cell.

Reference is made to FIG. 32, which depicts an AO222D4 cell. This cell implements the logic function or(and(A,B), and(C,D),and(E,F)) in drive strength 4.

Figure 33:
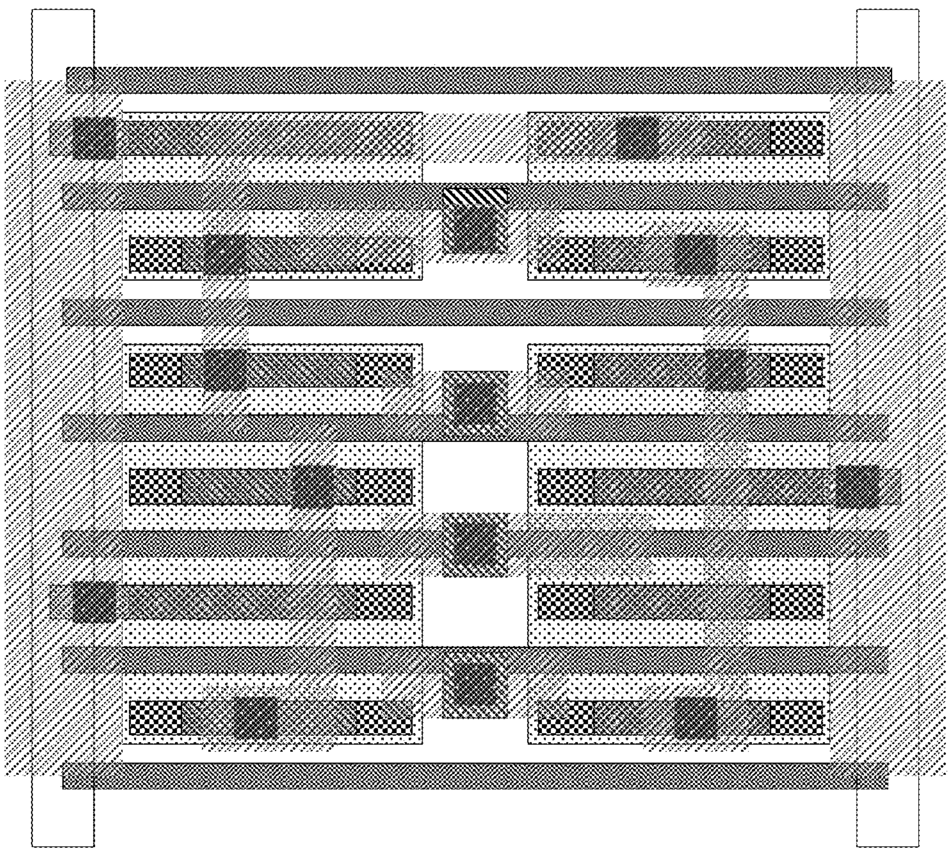
FIG. 33 depicts an AOAI211D1 cell.

Reference is made to FIG. 33, which depicts an AOAI211D1 cell. This cell implements the logic function nand(D,or(C,and(A,B))) in drive strength 1.

Figure 34:
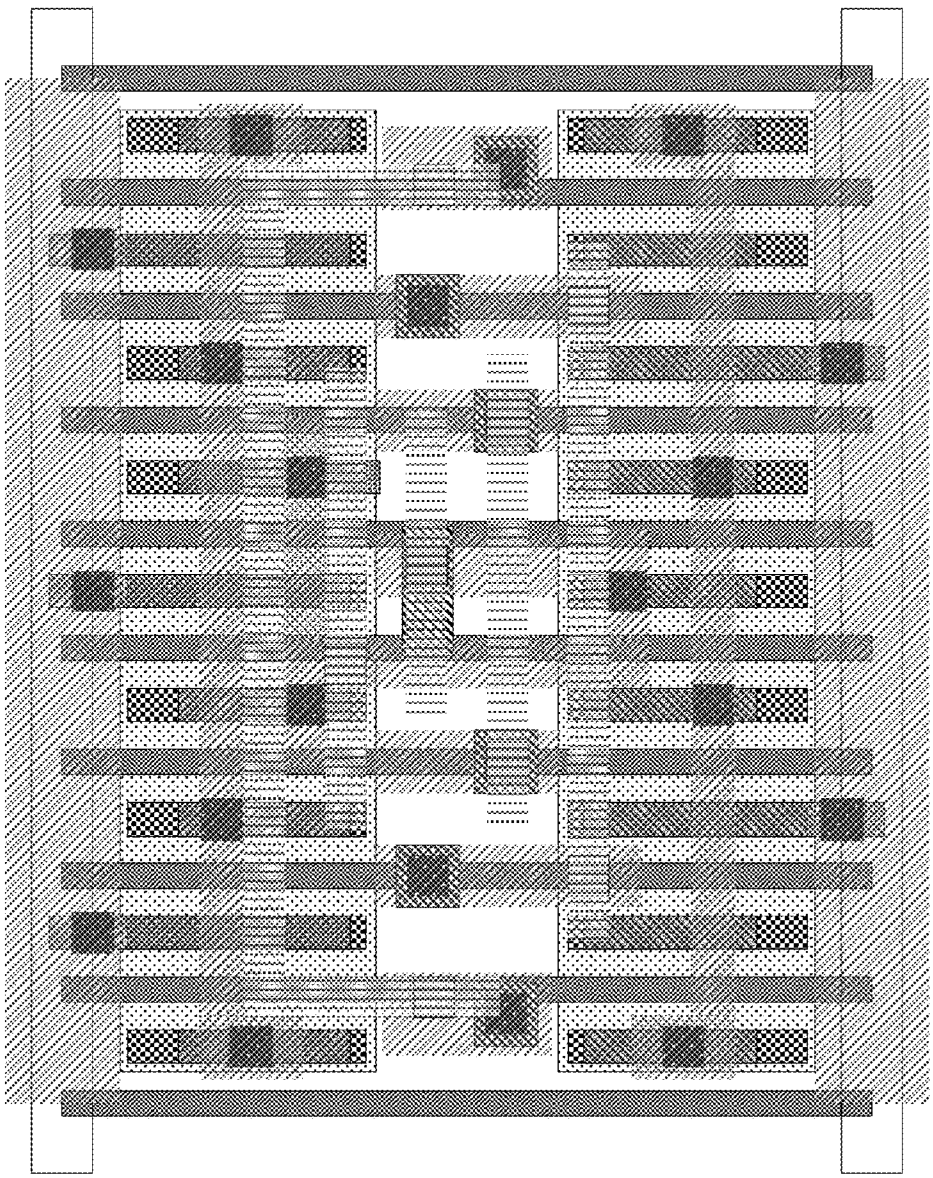
FIG. 34 depicts an AOAI211D2 cell.

Reference is made to FIG. 34, which depicts an AOAI211D2 cell. This cell implements the logic function nand(D,or(C,and(A,B))) in drive strength 2.

Figure 35:
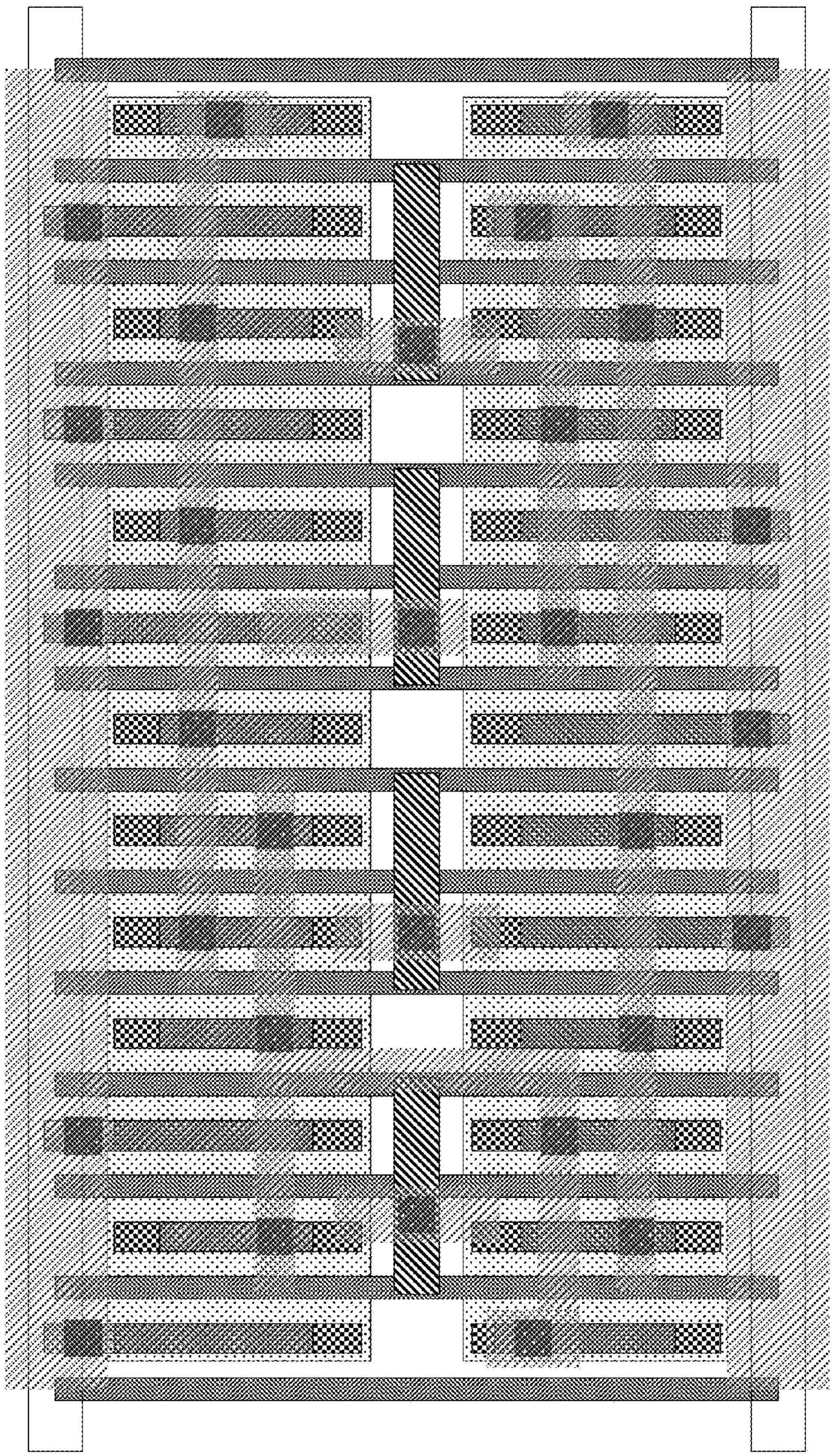
FIG. 35 depicts an AOAI211D3 cell.

Reference is made to FIG. 35, which depicts an AOAI211D3 cell. This cell implements the logic function nand(D,or(C,and(A,B))) in drive strength 3.

Figure 36:
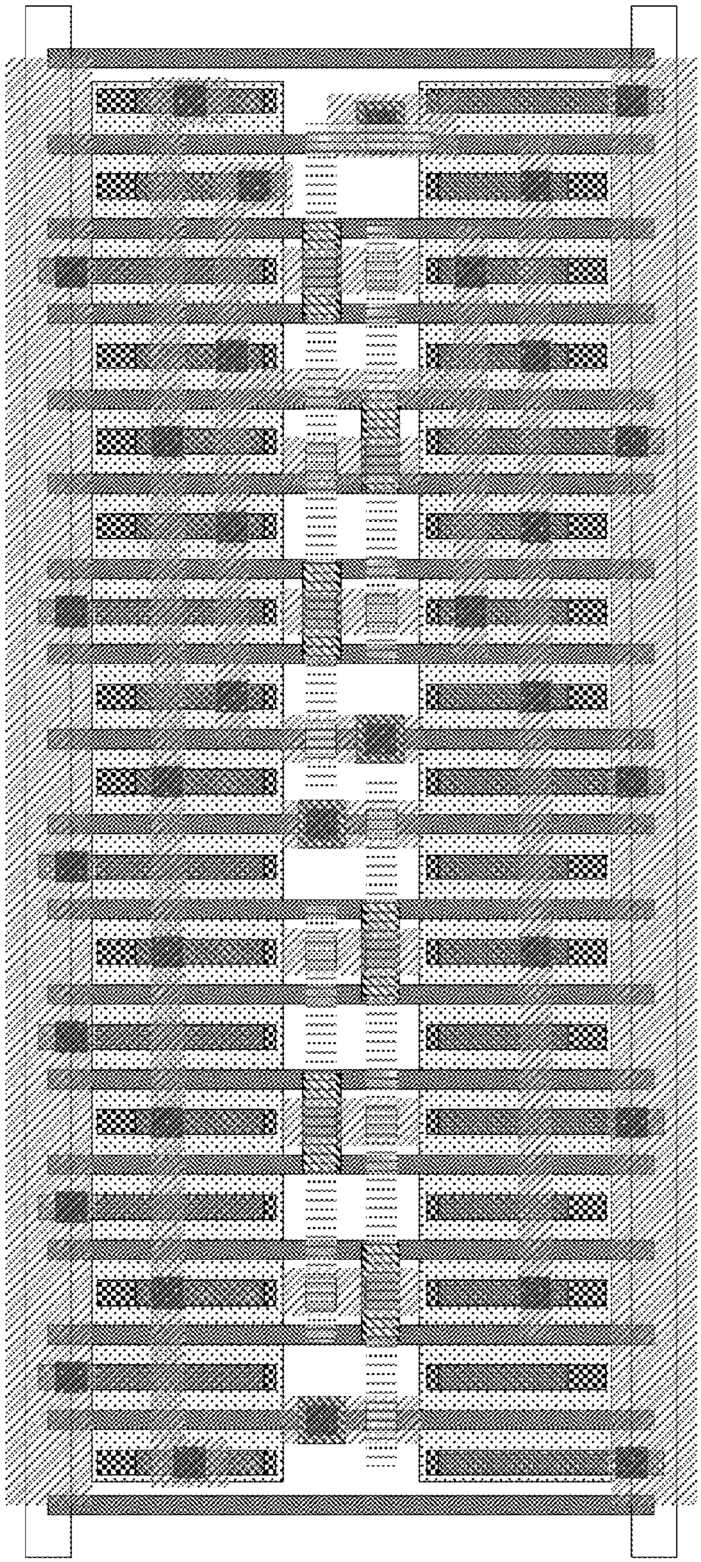
FIG. 36 depicts an AOAI211D4 cell.

Reference is made to FIG. 36, which depicts an AOAI211D4 cell. This cell implements the logic function nand(D,or(C,and(A,B))) in drive strength 4.

Figure 37:
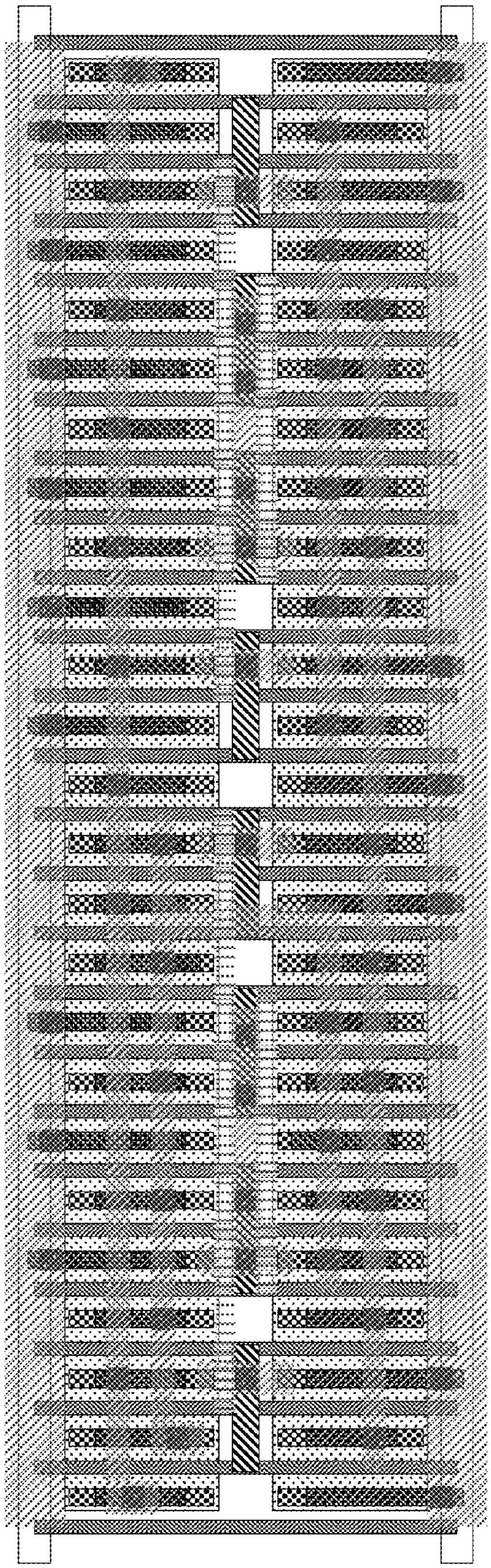
FIG. 37 depicts an AOAI211D6 cell.

Reference is made to FIG. 37, which depicts an AOAI211D6 cell. This cell implements the logic function nand(D,or(C,and(A,B))) in drive strength 6.

Figure 38:
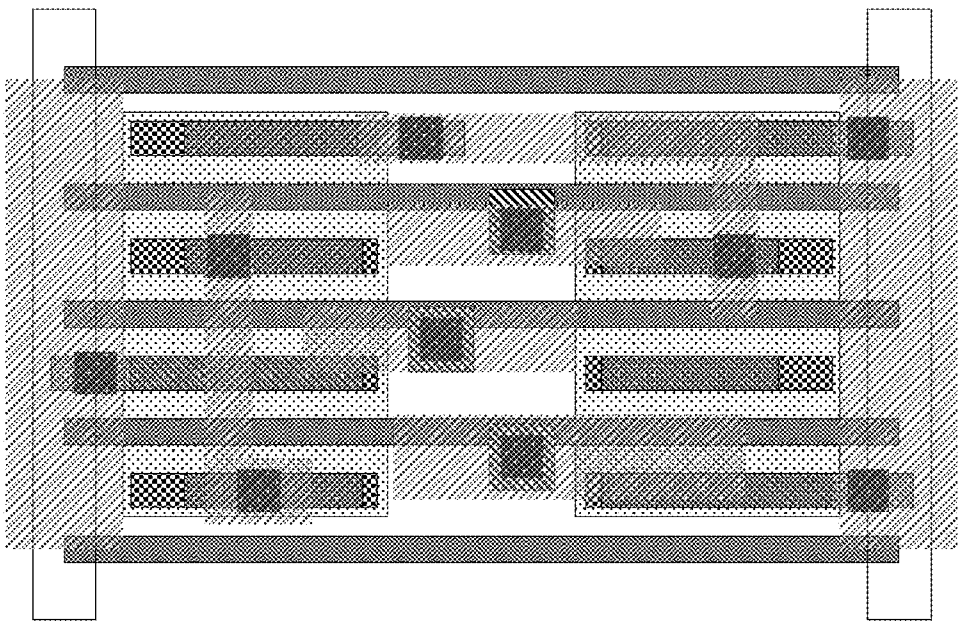
FIG. 38 depicts an AOI21D1 cell.

Reference is made to FIG. 38, which depicts an AOI21D1 cell. This cell implements the logic function nor(and(A,B), C) in drive strength 1.

Figure 39:
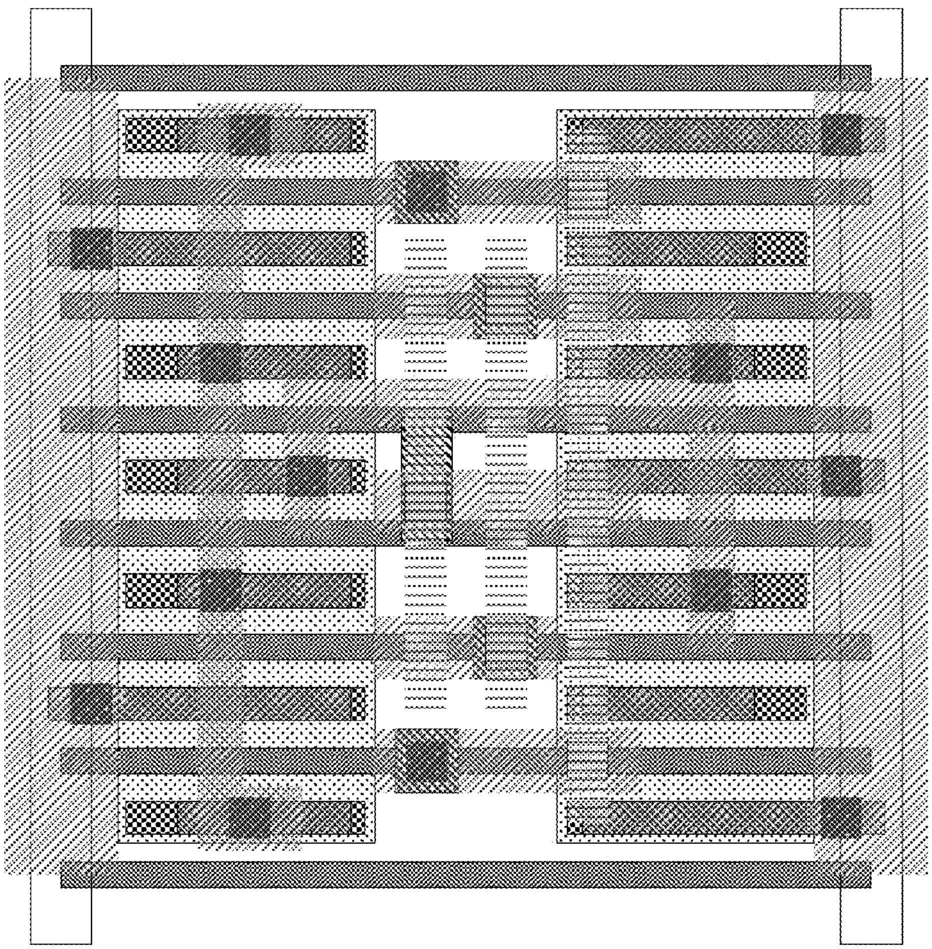
FIG. 39 depicts an AOI21D2 cell.

Reference is made to FIG. 39, which depicts an AOI21D2 cell. This cell implements the logic function nor(and(A,B), C) in drive strength 2.

Figure 40:
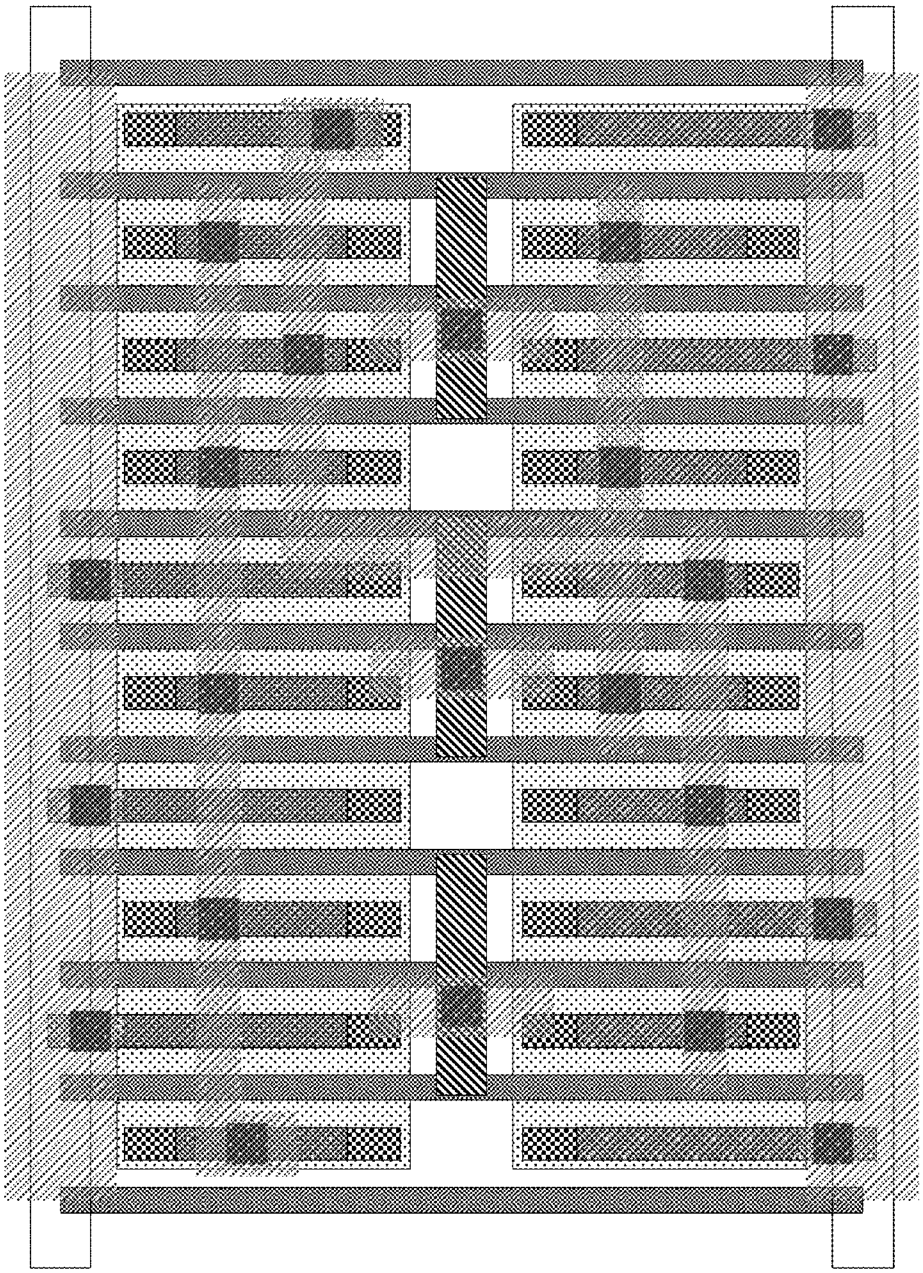
FIG. 40 depicts an AOI21D3 cell.

Reference is made to FIG. 40, which depicts an AOI21D3 cell. This cell implements the logic function nor(and(A,B), C) in drive strength 3.

Figure 41:
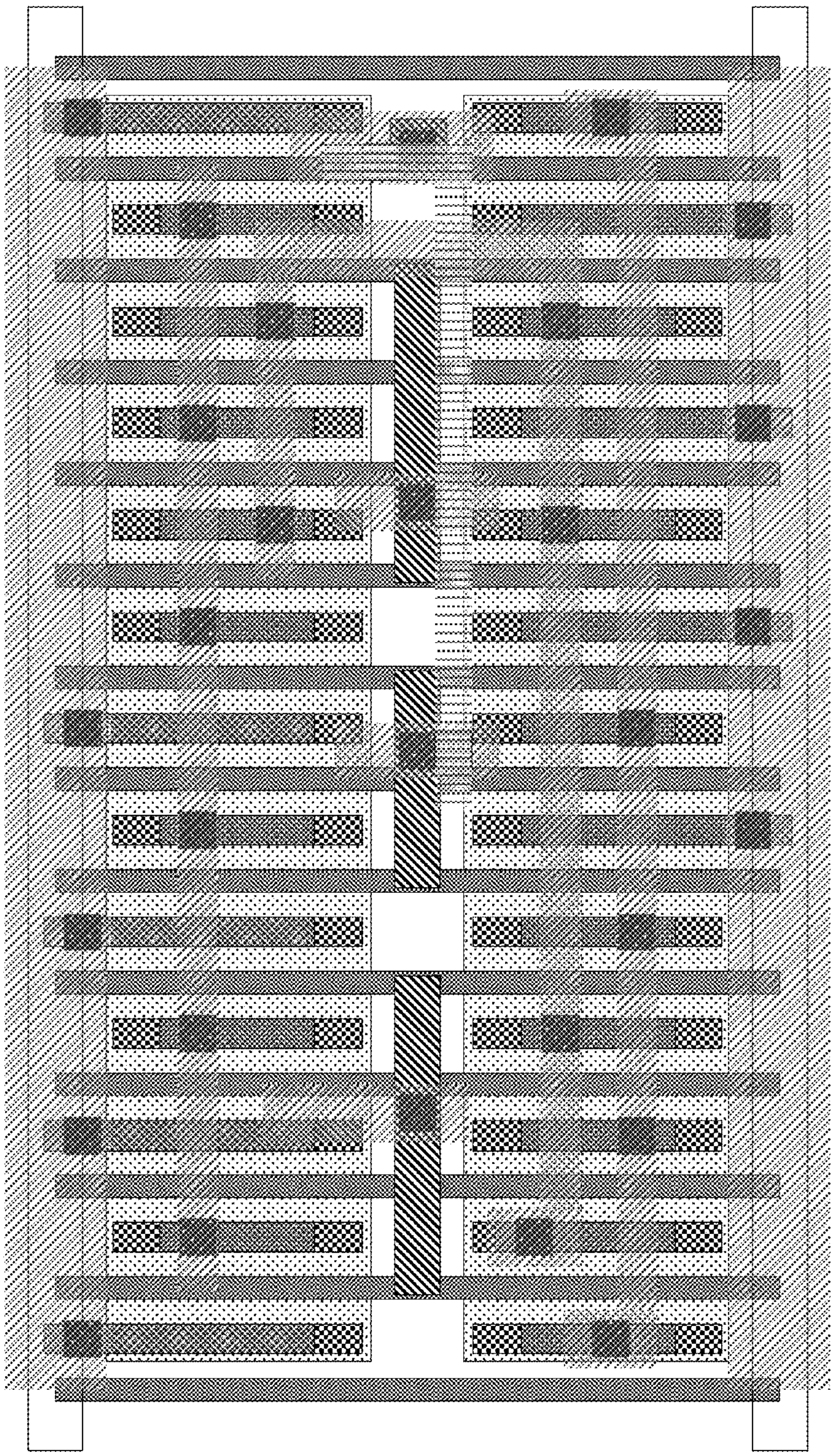
FIG. 41 depicts an AOI21D4 cell.

Reference is made to FIG. 41, which depicts an AOI21D4 cell. This cell implements the logic function nor(and(A,B), C) in drive strength 4.

Figure 42:
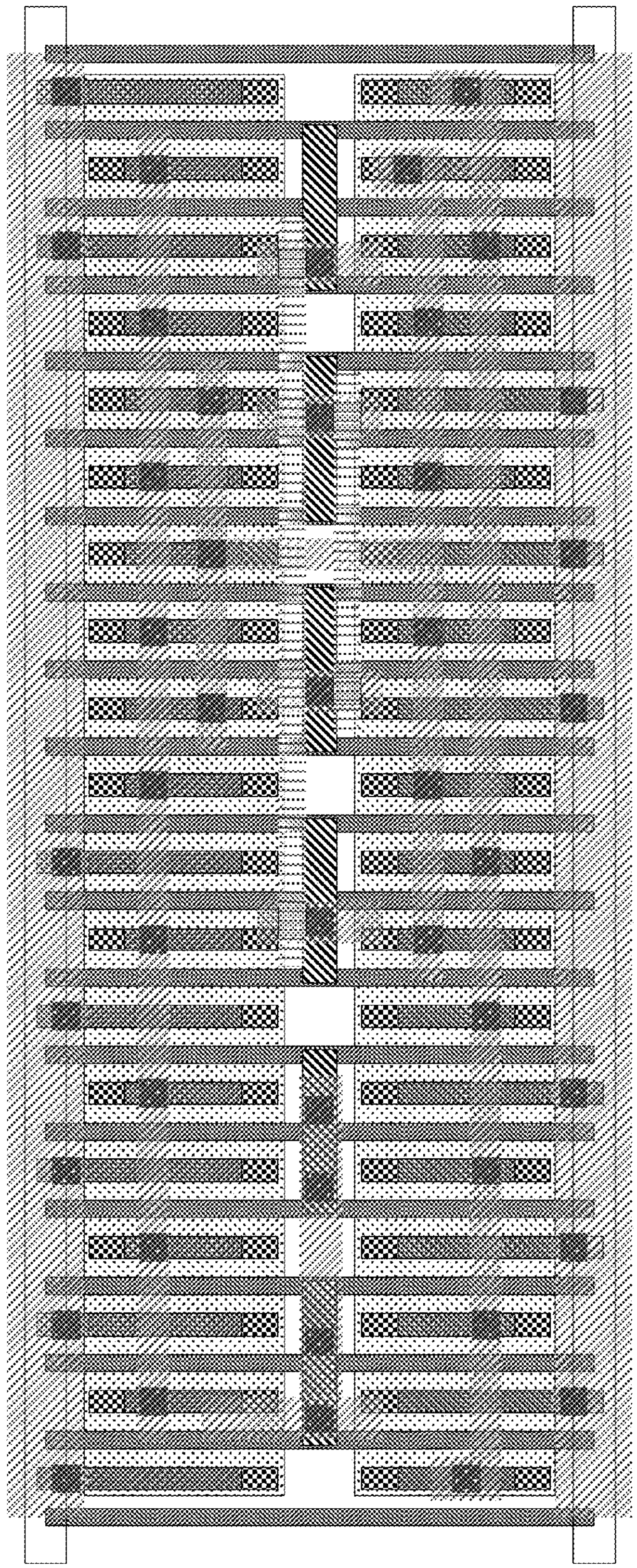
FIG. 42 depicts an AOI21D6 cell.

Reference is made to FIG. 42, which depicts an AOI21D6 cell. This cell implements the logic function nor(and(A,B), C) in drive strength 6.

Figure 43:
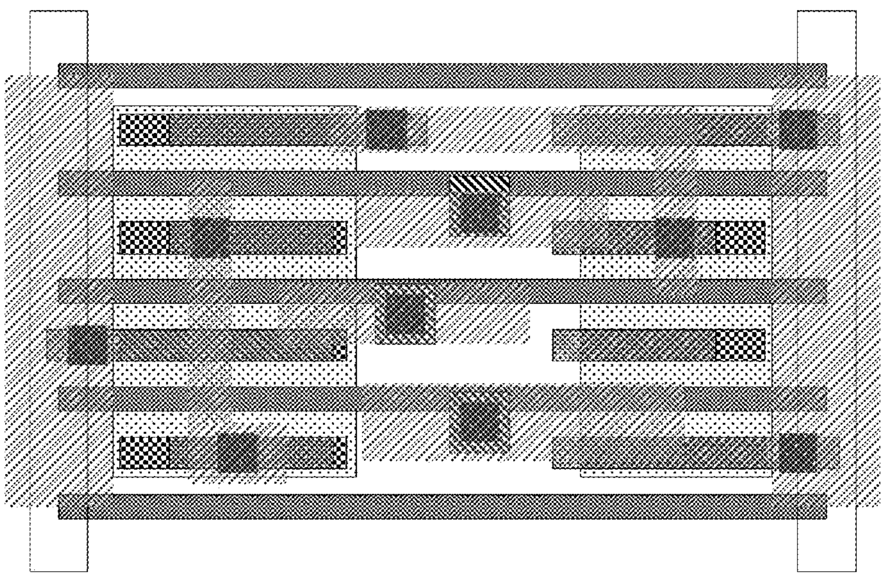

Reference is made to FIG. 43, which depicts an AOI21XD1 cell. This is an alternative implementation of the AOI21D1 cell.

Figure 44:
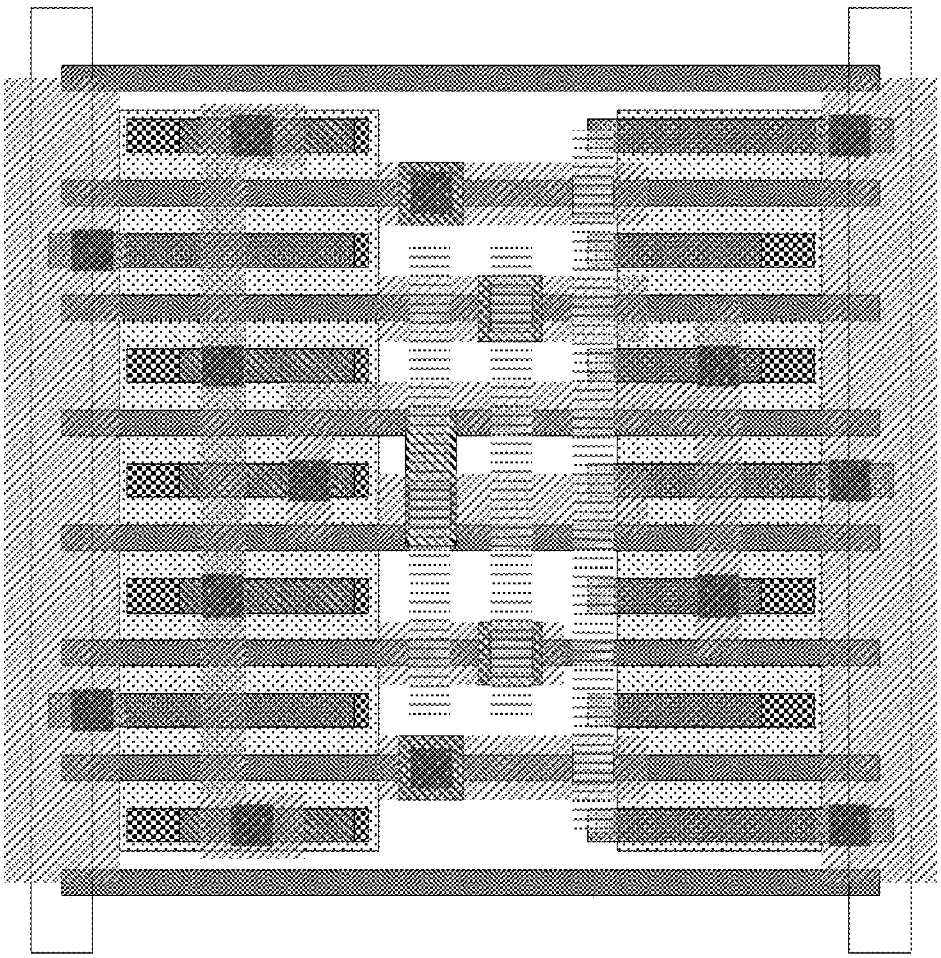
FIG. 44 depicts an AOI21XD2 cell.

Reference is made to FIG. 44, which depicts an AOI21XD2 cell. This is an alternative implementation of the AOI21D2 cell.

Figure 45:
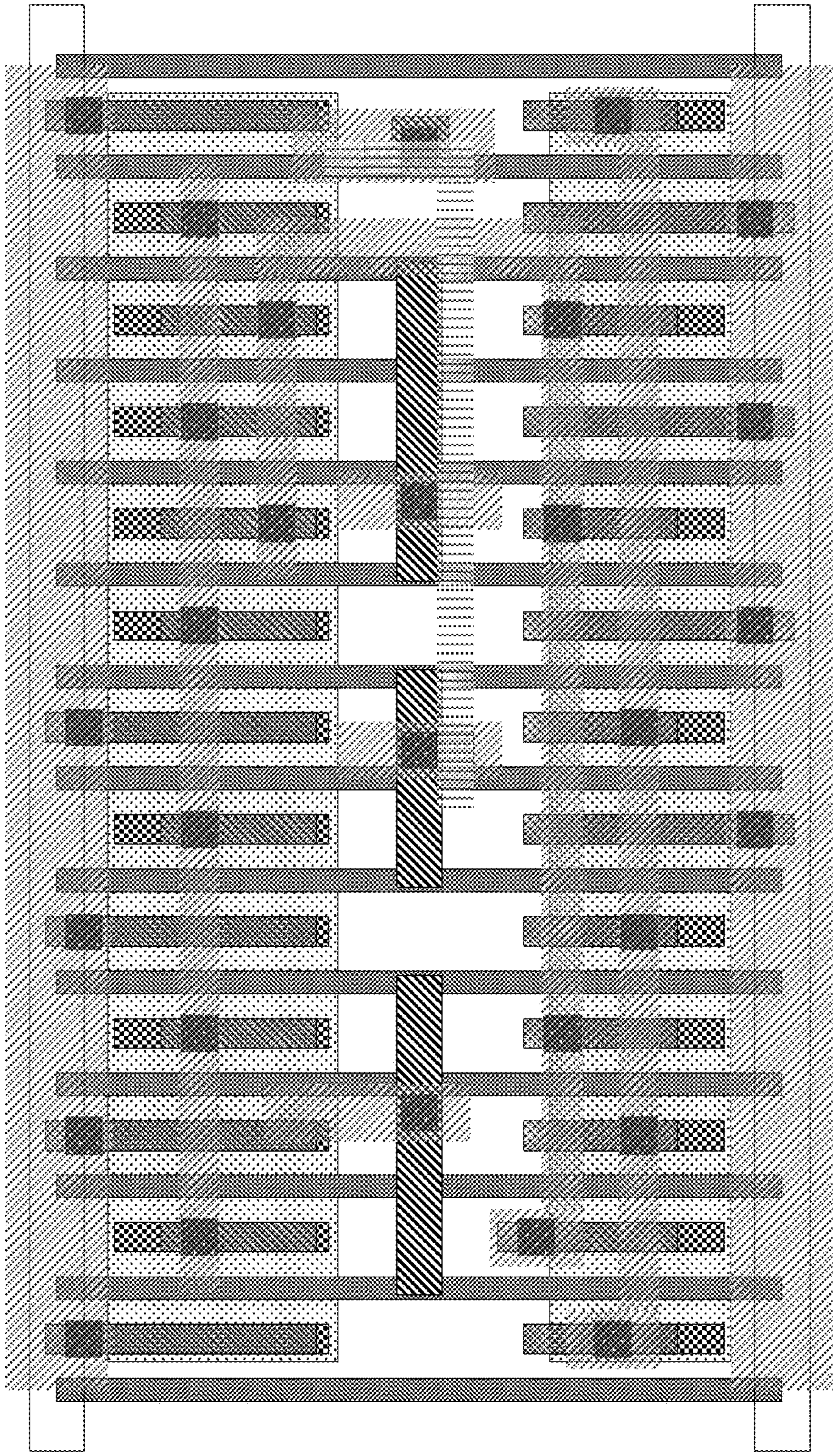
FIG. 45 depicts an AOI21XD4 cell.

Reference is made to FIG. 45, which depicts an AOI21XD4 cell. This is an alternative implementation of the AOI21D4 cell.

Figure 46:
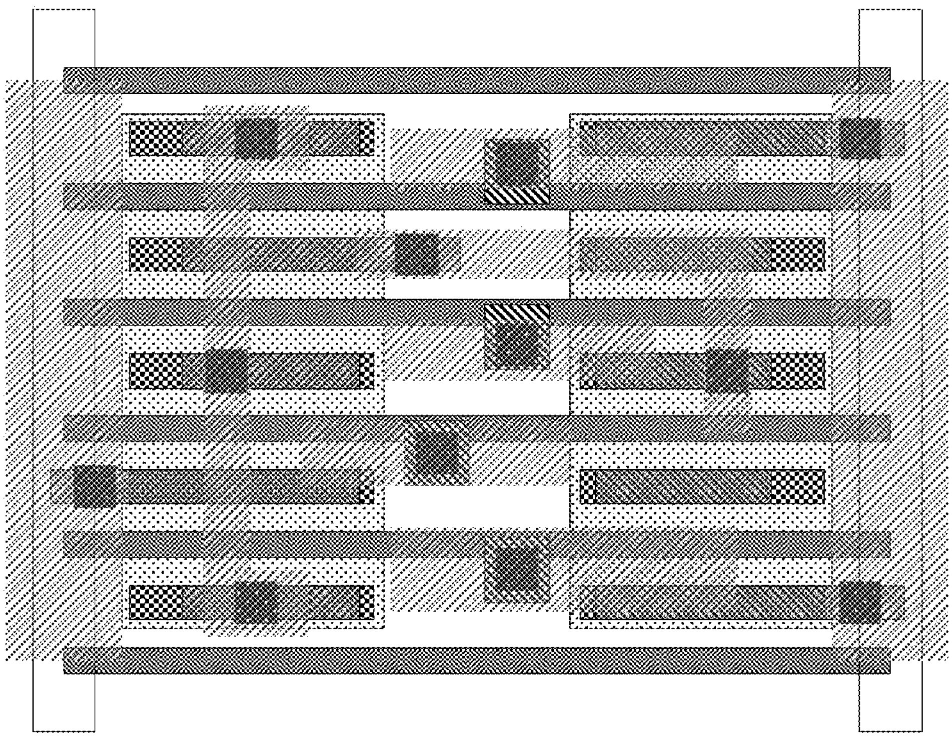
FIG. 46 depicts an AOI22D1 cell.

Reference is made to FIG. 46, which depicts an AOI22D1 cell. This cell implements the logic function nor(and(A,B), and(C,D)) in drive strength 1.

Figure 47:
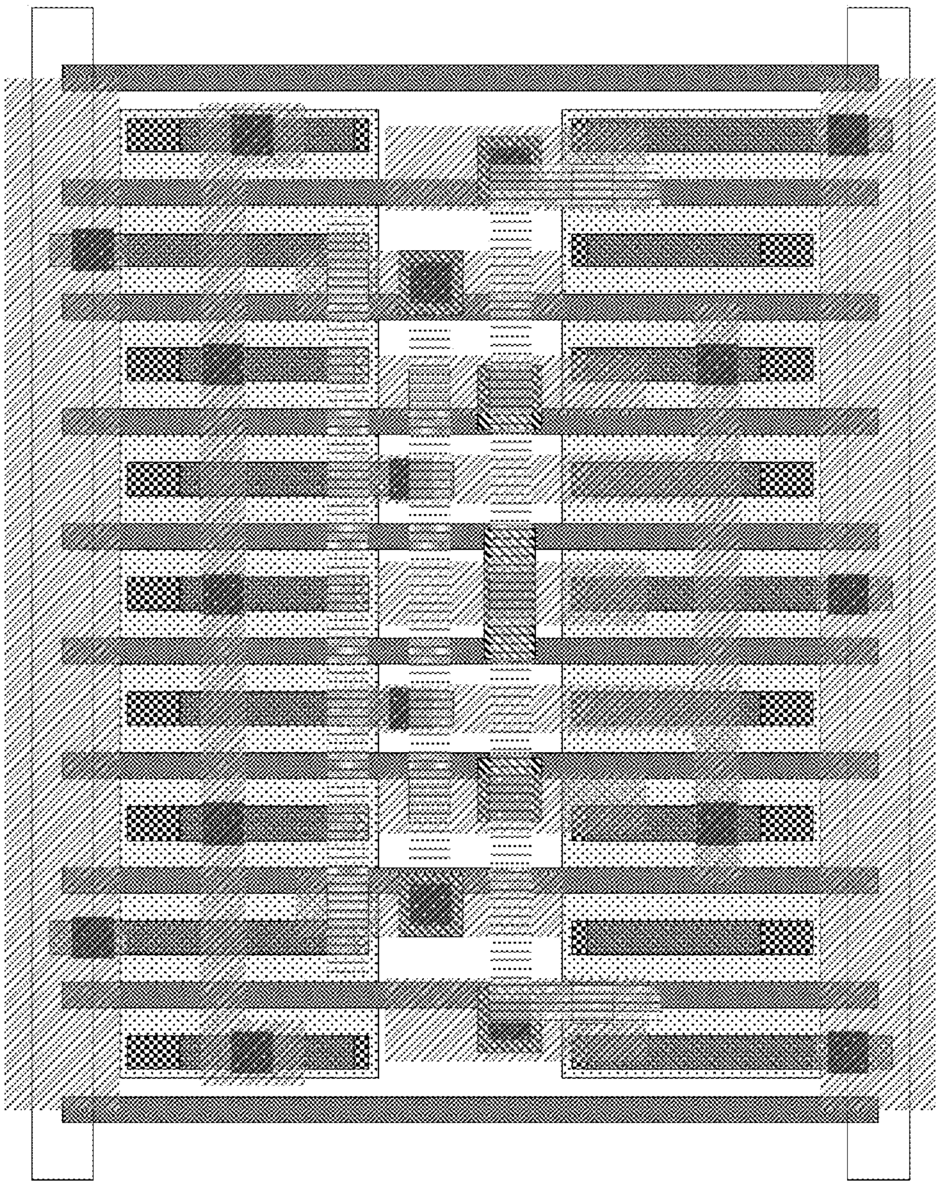
FIG. 47 depicts an AOI22D2 cell.

Reference is made to FIG. 47, which depicts an AOI22D2 cell. This cell implements the logic function nor(and(A,B), and(C,D)) in drive strength 2.

Figure 48:
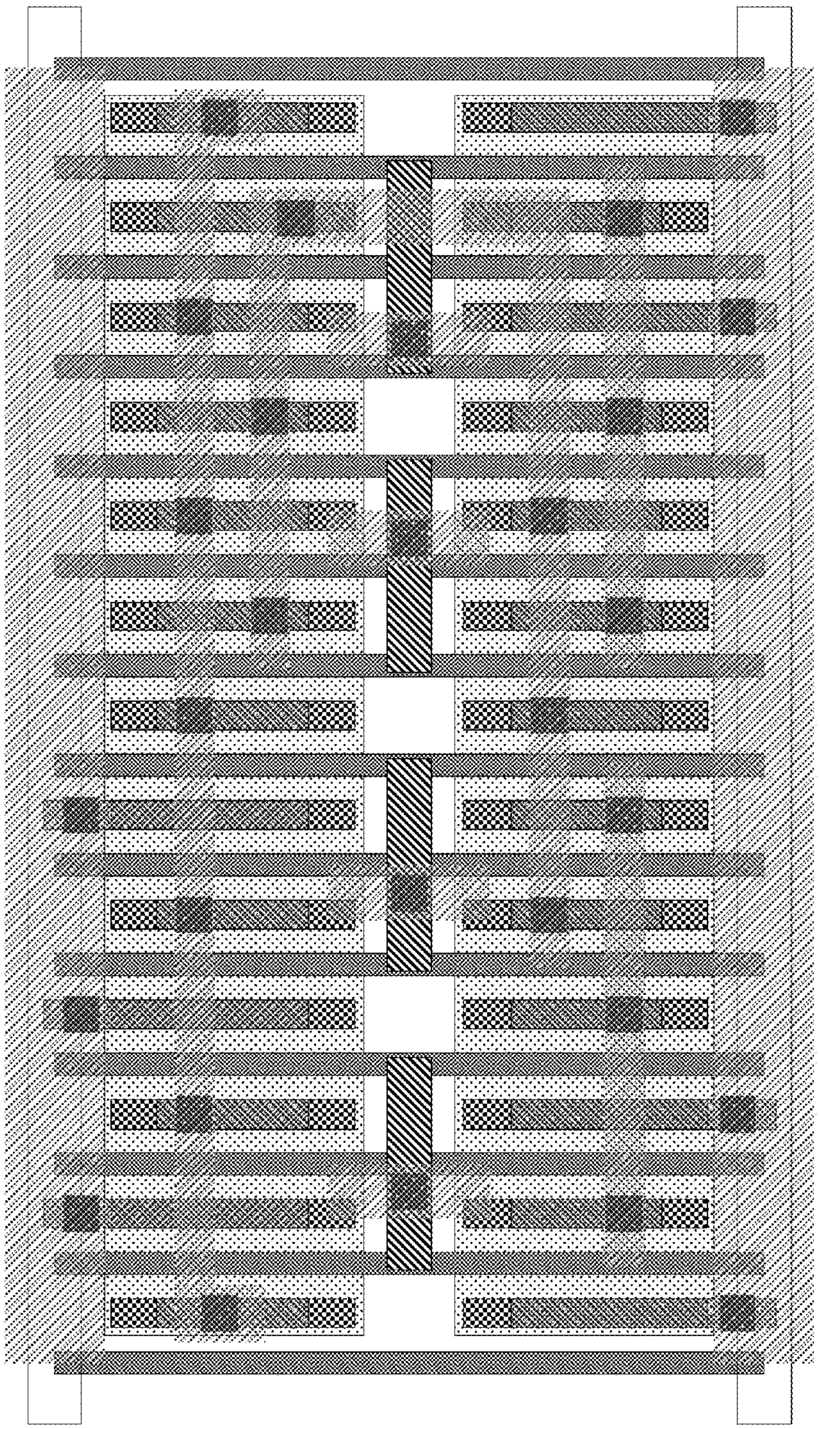
FIG. 48 depicts an AOI22D3 cell.

Reference is made to FIG. 48, which depicts an AOI22D3 cell. This cell implements the logic function nor(and(A,B), and(C,D)) in drive strength 3.

Figure 49:
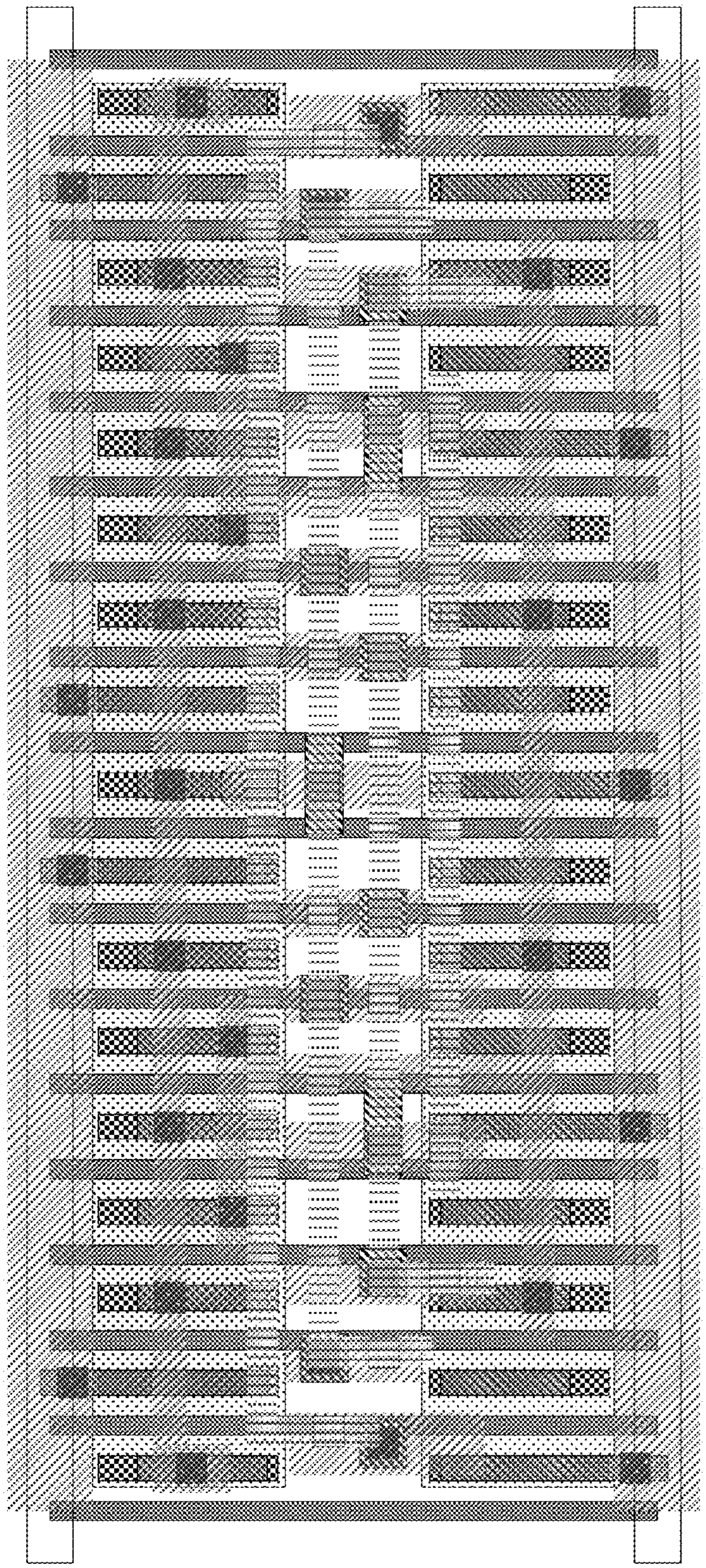
FIG. 49 depicts an AOI22D4 cell.

Reference is made to FIG. 49, which depicts an AOI22D4 cell. This cell implements the logic function nor(and(A,B), and(C,D)) in drive strength 4.

Figure 50:
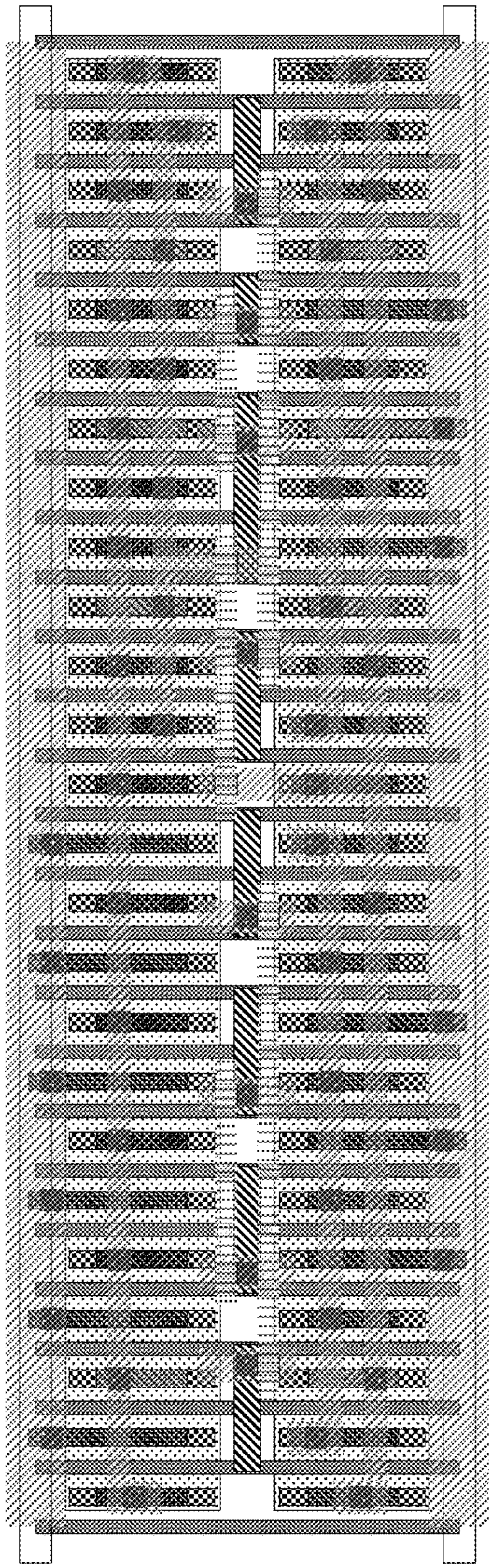
FIG. 50 depicts an AOI22D6 cell.

Reference is made to FIG. 50, which depicts an AOI22D6 cell. This cell implements the logic function nor(and(A,B), and(C,D)) in drive strength 6.

Figure 51:
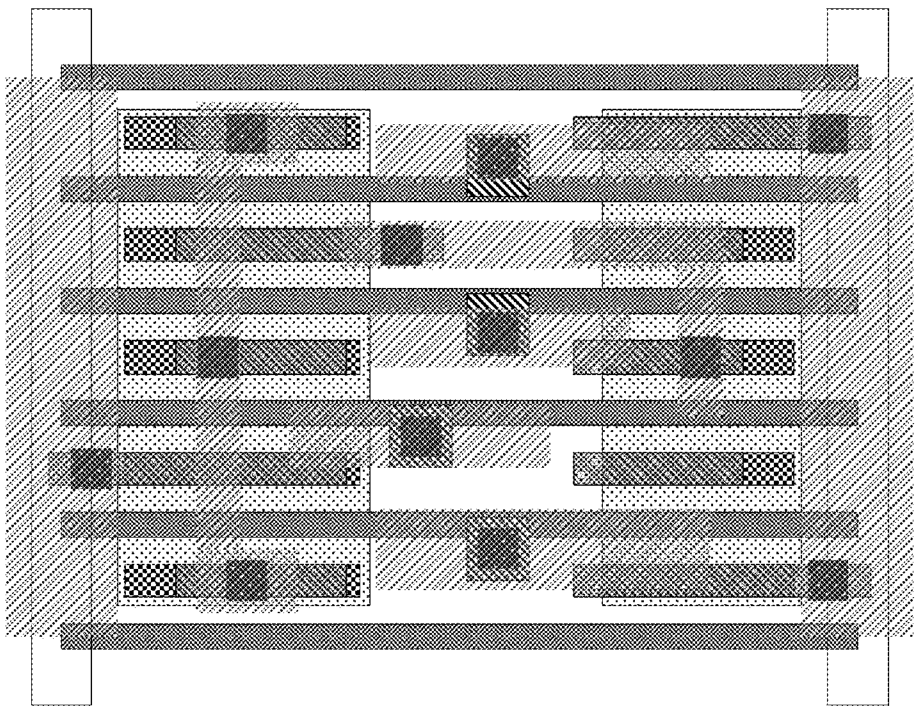
FIG. 51 depicts an AOI22XD1 cell.

Reference is made to FIG. 51, which depicts an AOI22XD1 cell. This is an alternative implementation of the AOI22D1 cell.

Figure 52:
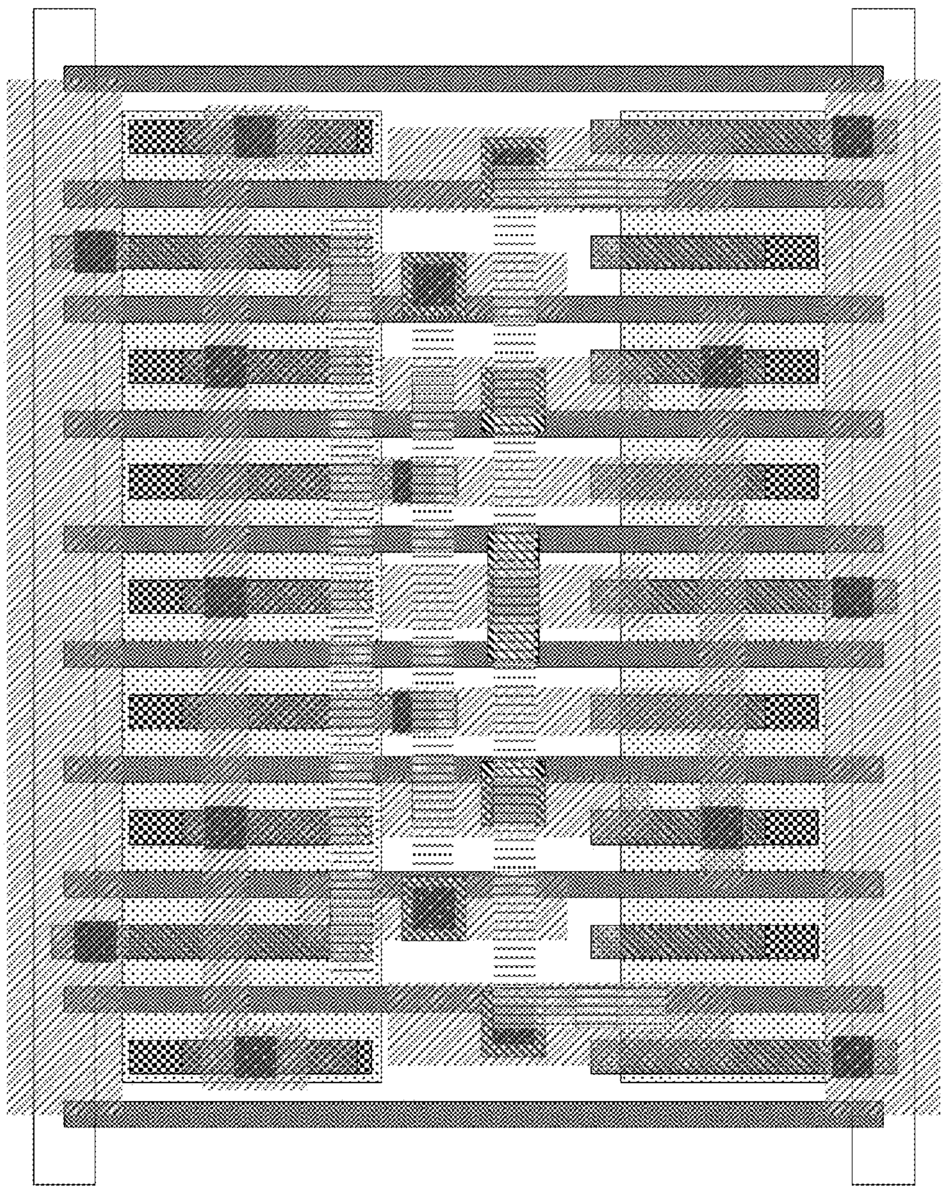
FIG. 52 depicts an AOI22XD2 cell.

Reference is made to FIG. 52, which depicts an AO122XD2 cell. This is an alternative implementation of the AOI22D2 cell.

Figure 53:
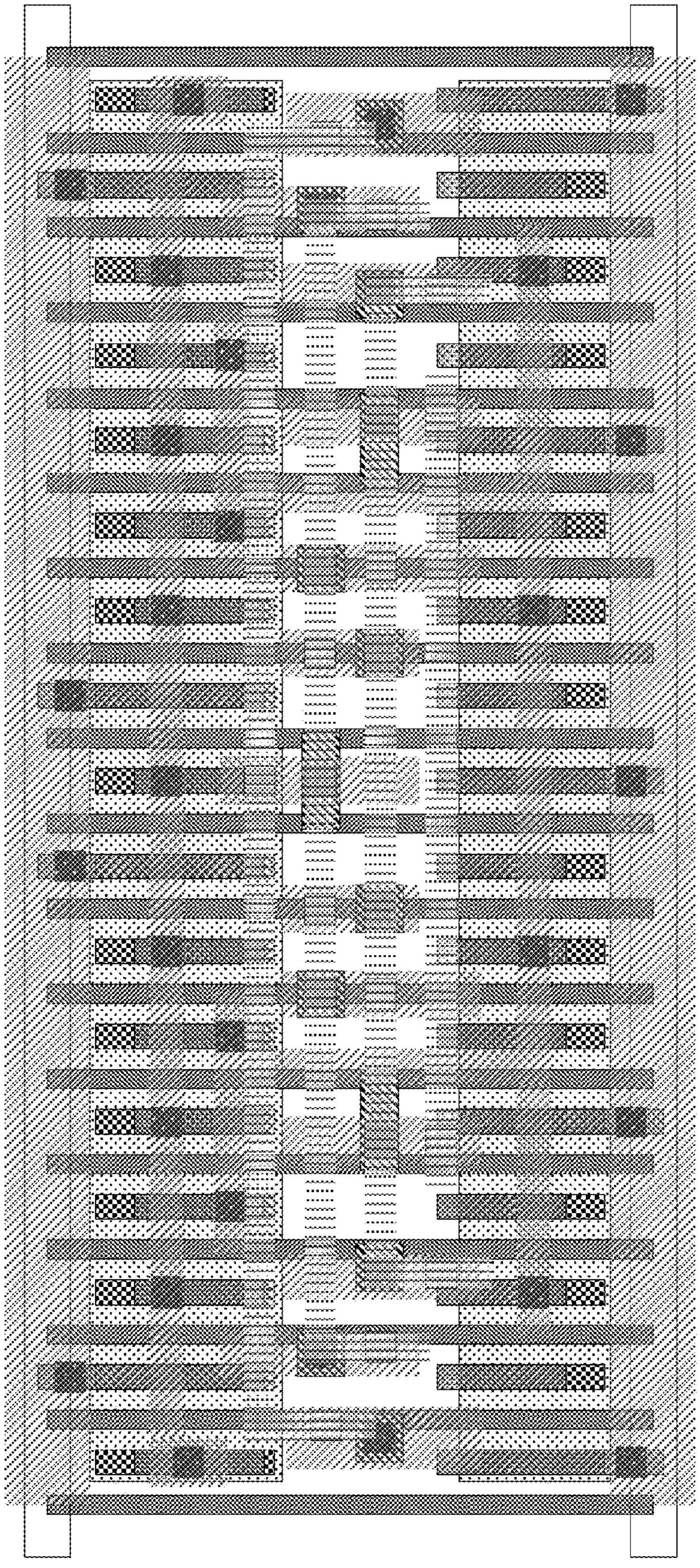
FIG. 53 depicts an AOI22XD4 cell.

Reference is made to FIG. 53, which depicts an AOI22XD4 cell. This is an alternative implementation of the AOI22D4 cell.

Figure 54:
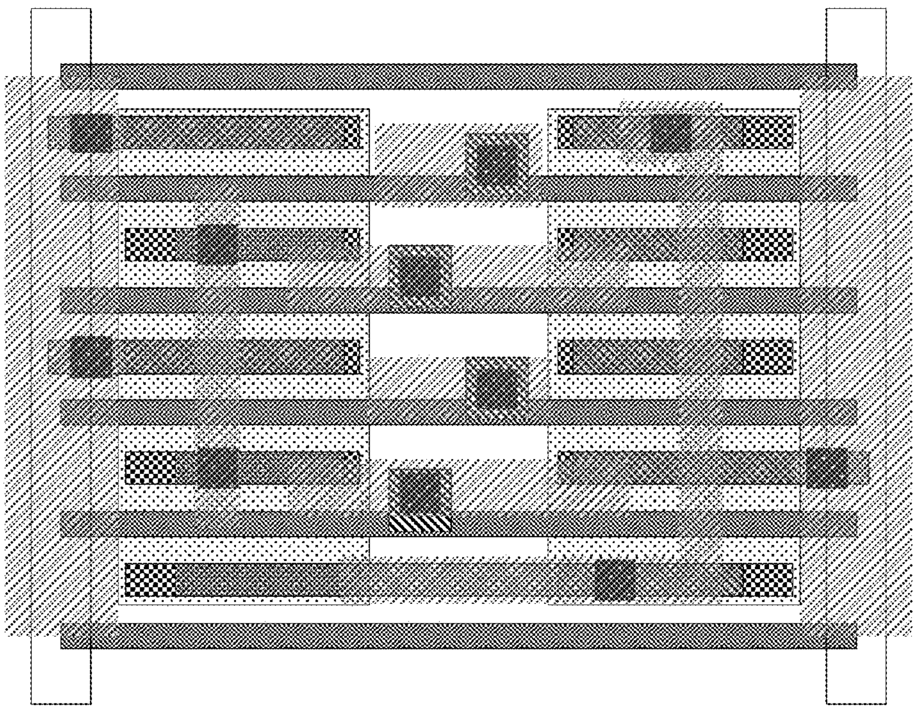
FIG. 54 depicts an AOI31D1 cell.

Reference is made to FIG. 54, which depicts an AOI31D1 cell. This cell implements the logic function nor(and(A,B, C),D) in drive strength 1.

Figure 55:
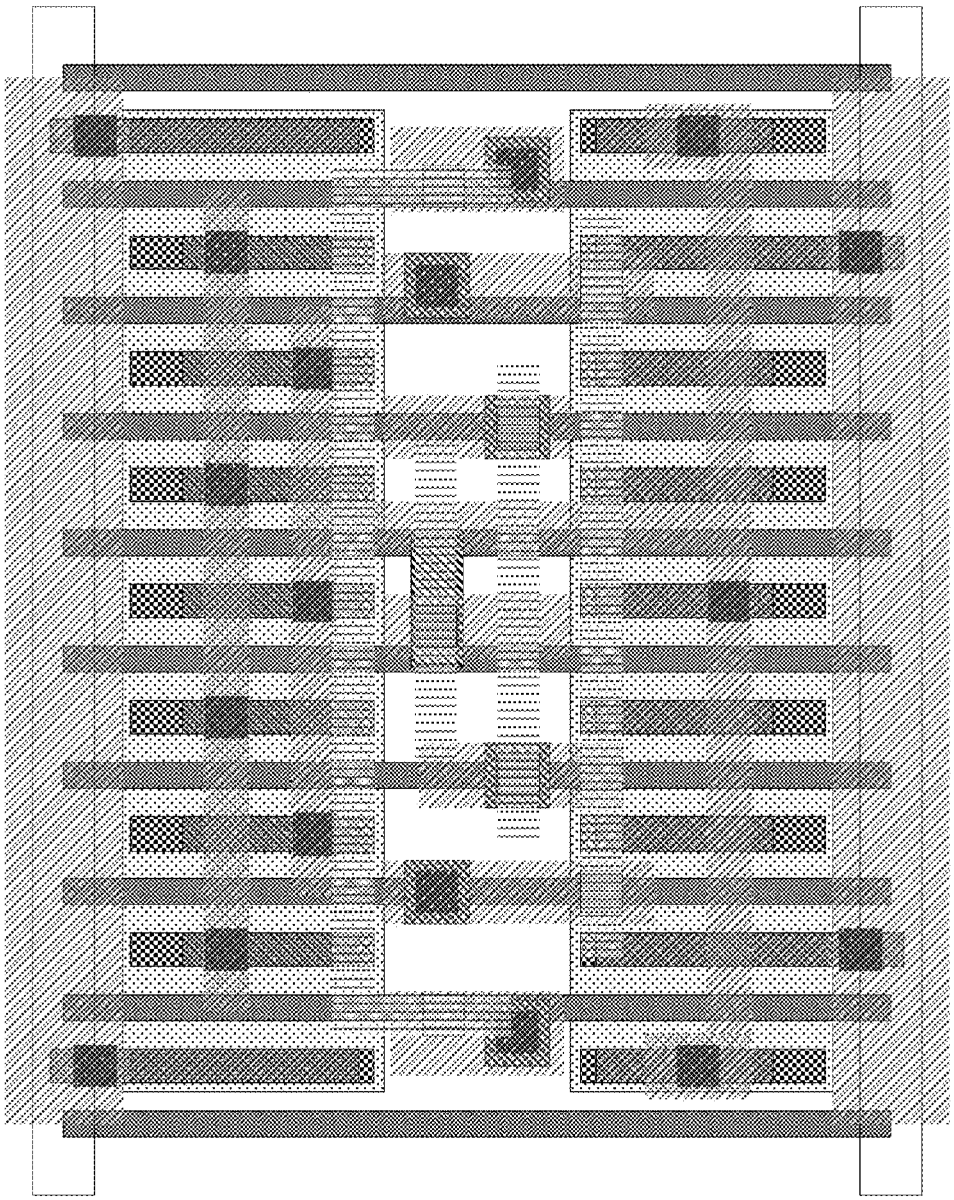
FIG. 55 depicts an AOI31D2 cell.

Reference is made to FIG. 55, which depicts an AOI31D2 cell. This cell implements the logic function nor(and(A,B, C),D) in drive strength 2.

Figure 56:
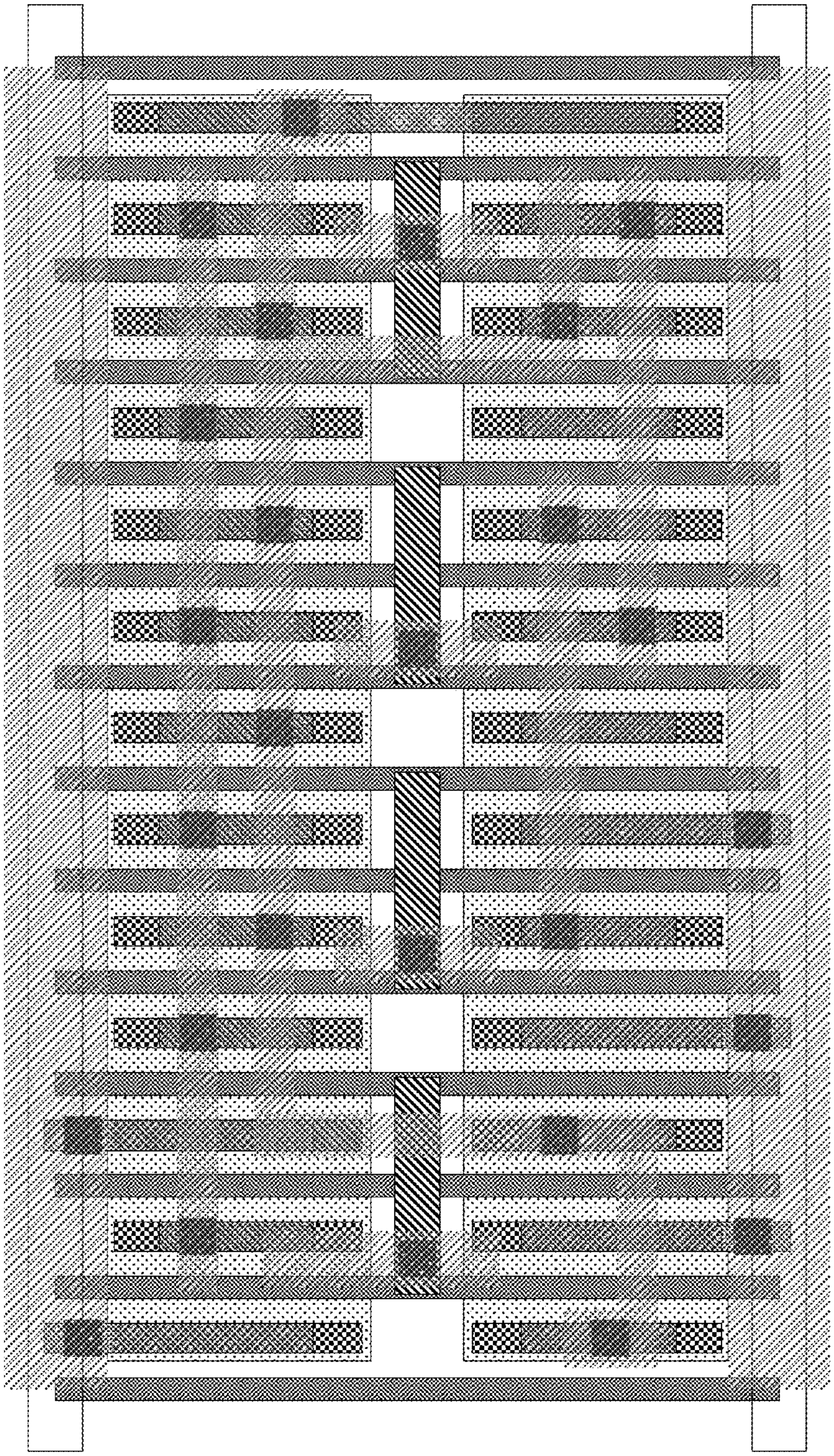
FIG. 56 depicts an AOI31D3 cell.

Reference is made to FIG. 56, which depicts an AOI31D3 cell. This cell implements the logic function nor(and(A,B, C),D) in drive strength 3.

Figure 57:
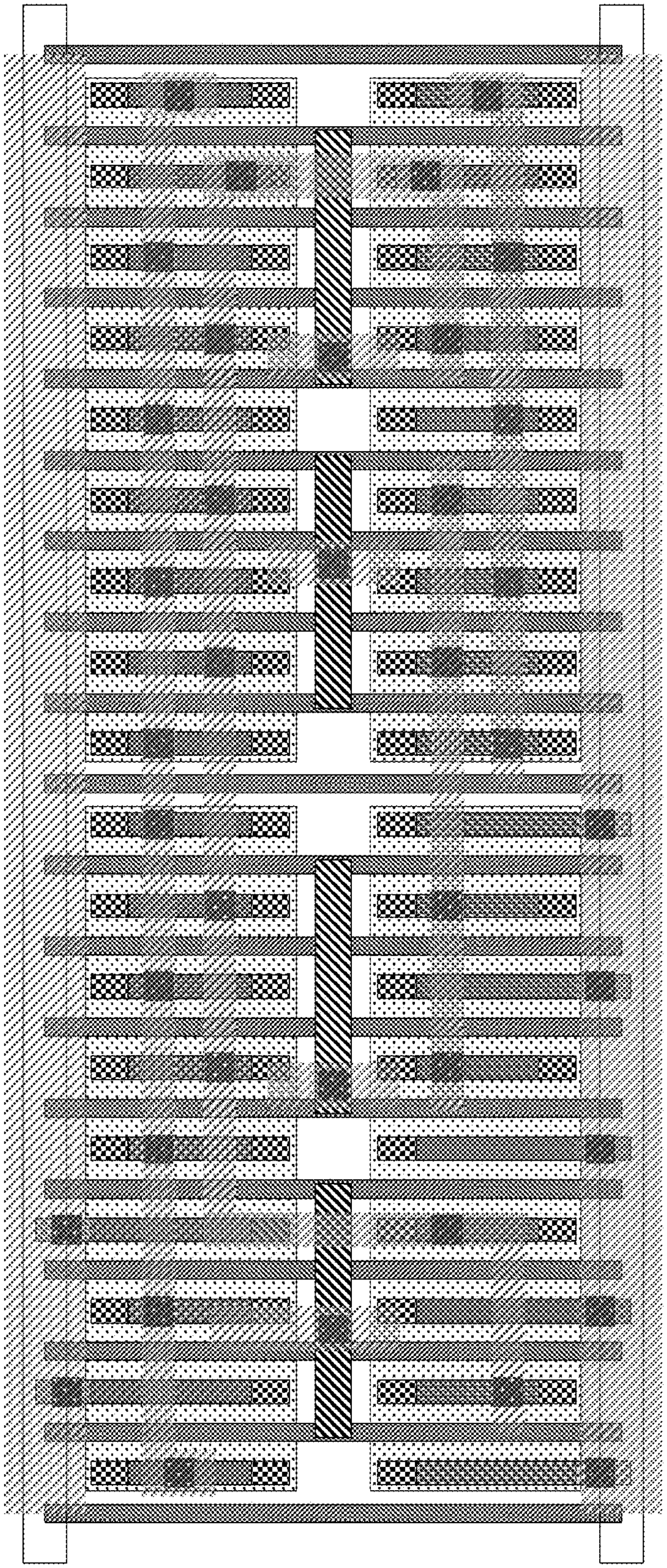
FIG. 57 depicts an AOI31D4 cell.

Reference is made to FIG. 57, which depicts an AOI31D4 cell. This cell implements the logic function nor(and(A,B, C),D) in drive strength 4.

Figure 58:
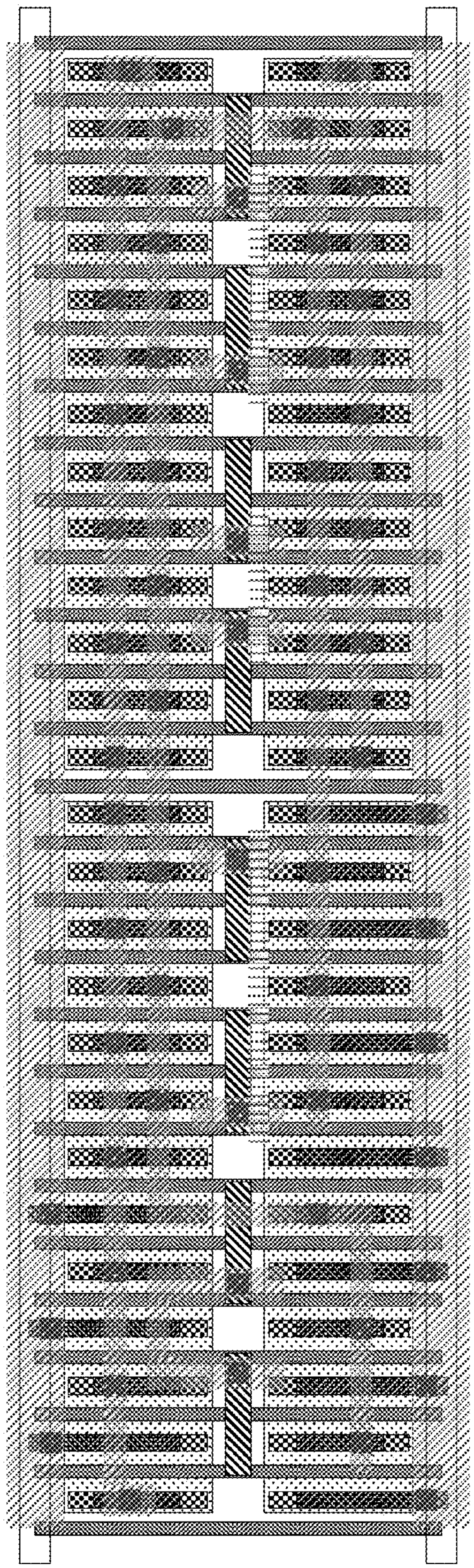
FIG. 58 depicts an AOI31D6 cell.

Reference is made to FIG. 58, which depicts an AOI31D6 cell. This cell implements the logic function nor(and(A,B, C),D) in drive strength 6.

Figure 59:
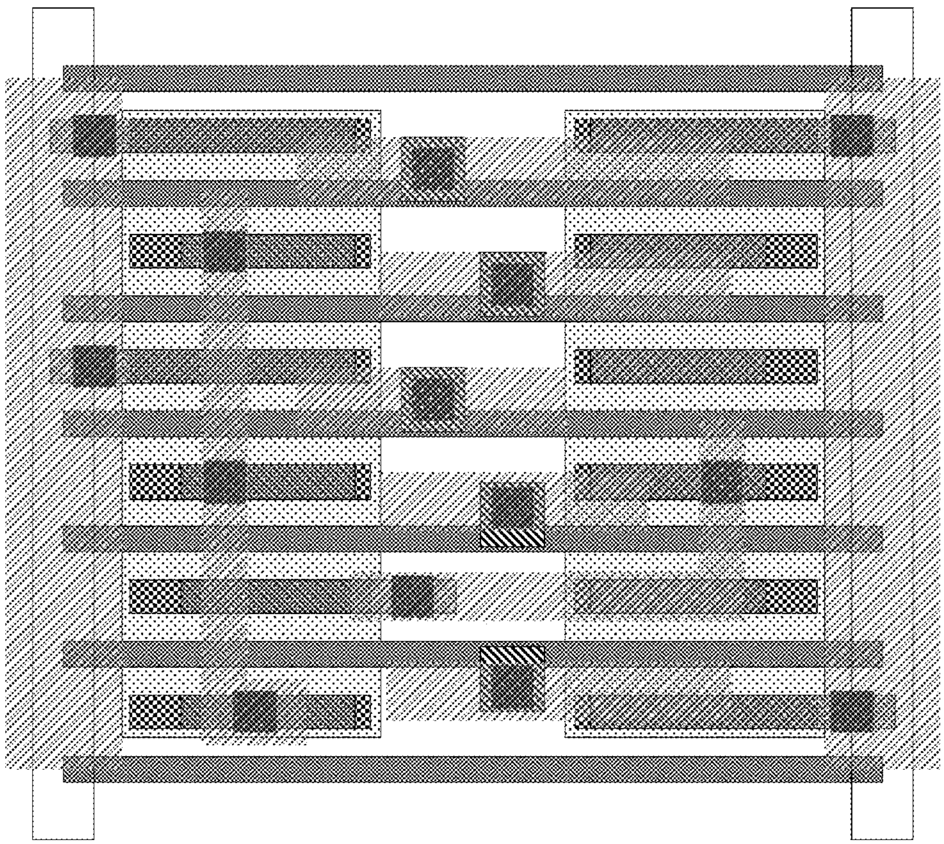
FIG. 59 depicts an AOI32D1 cell.

Reference is made to FIG. 59, which depicts an AOI32D1 cell. This cell implements the logic function nor(and(A,B, C),and(D,E)) in drive strength 1.

Figure 60:
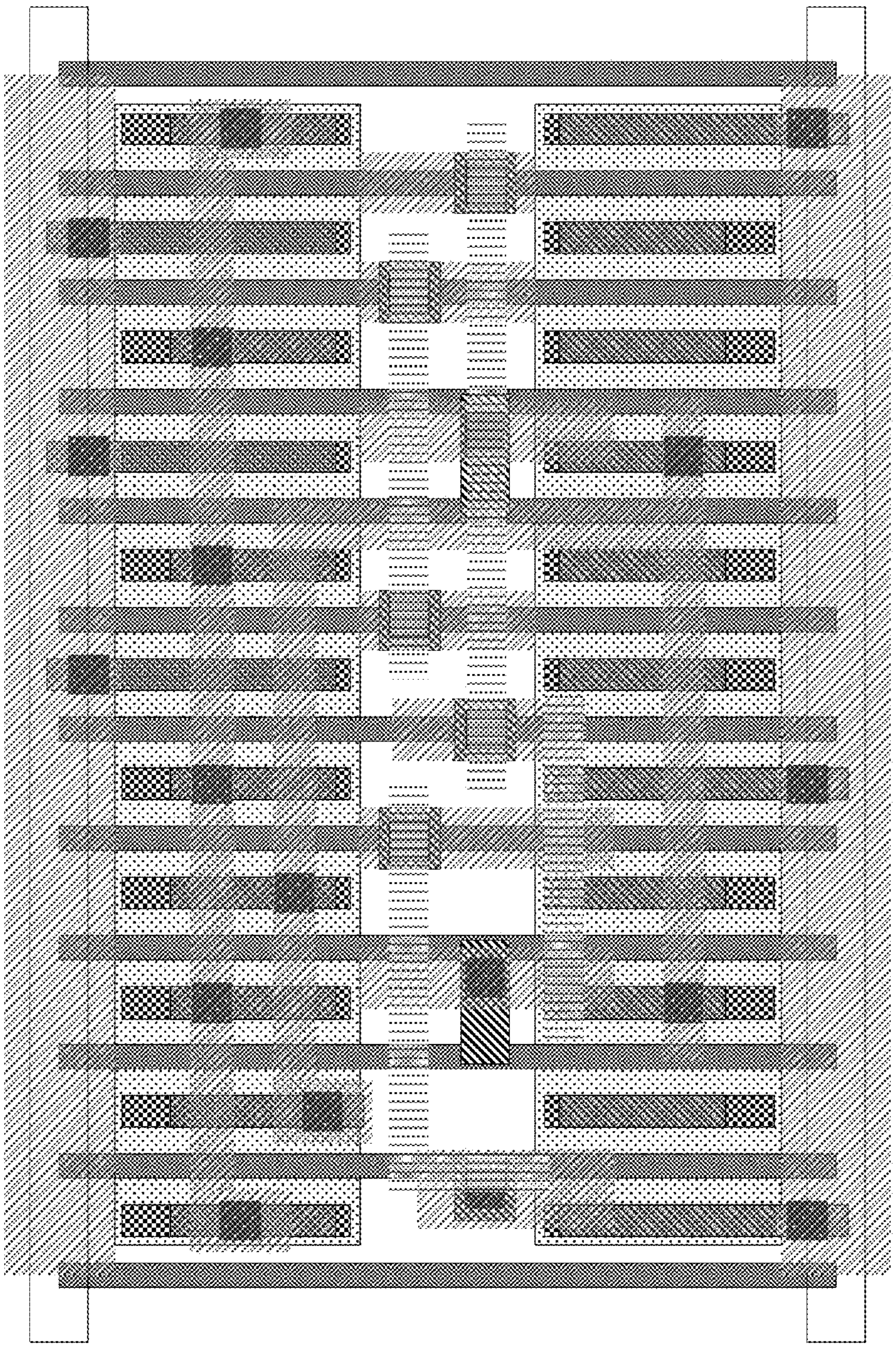
FIG. 60 depicts an AOI32D2 cell.

Reference is made to FIG. 60, which depicts an AOI32D2 cell. This cell implements the logic function nor(and(A,B, C),and(D,E)) in drive strength 2.

Figure 61:
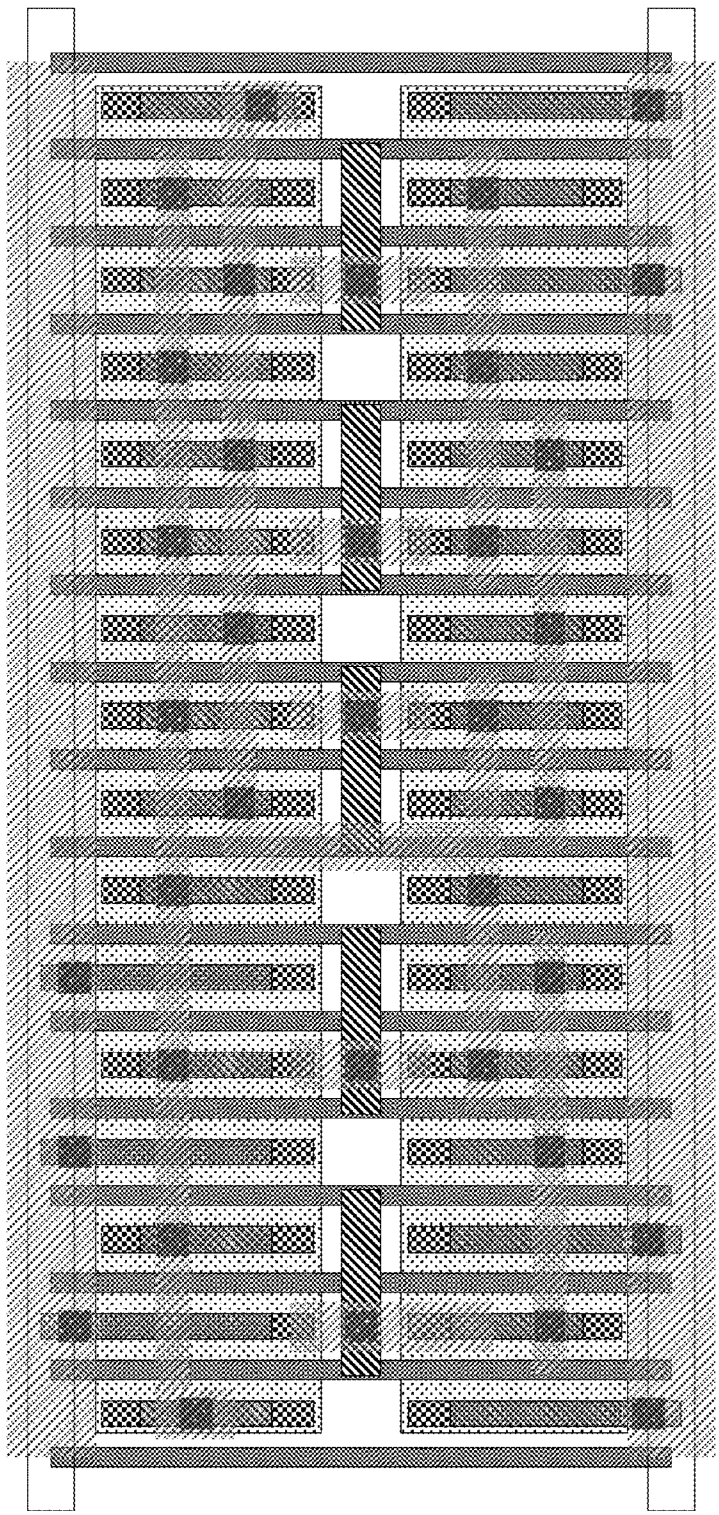
FIG. 61 depicts an AOI32D3 cell.

Reference is made to FIG. 61, which depicts an AOI32D3 cell. This cell implements the logic function nor(and(A,B, C),and(D,E)) in drive strength 3.

Figure 62:
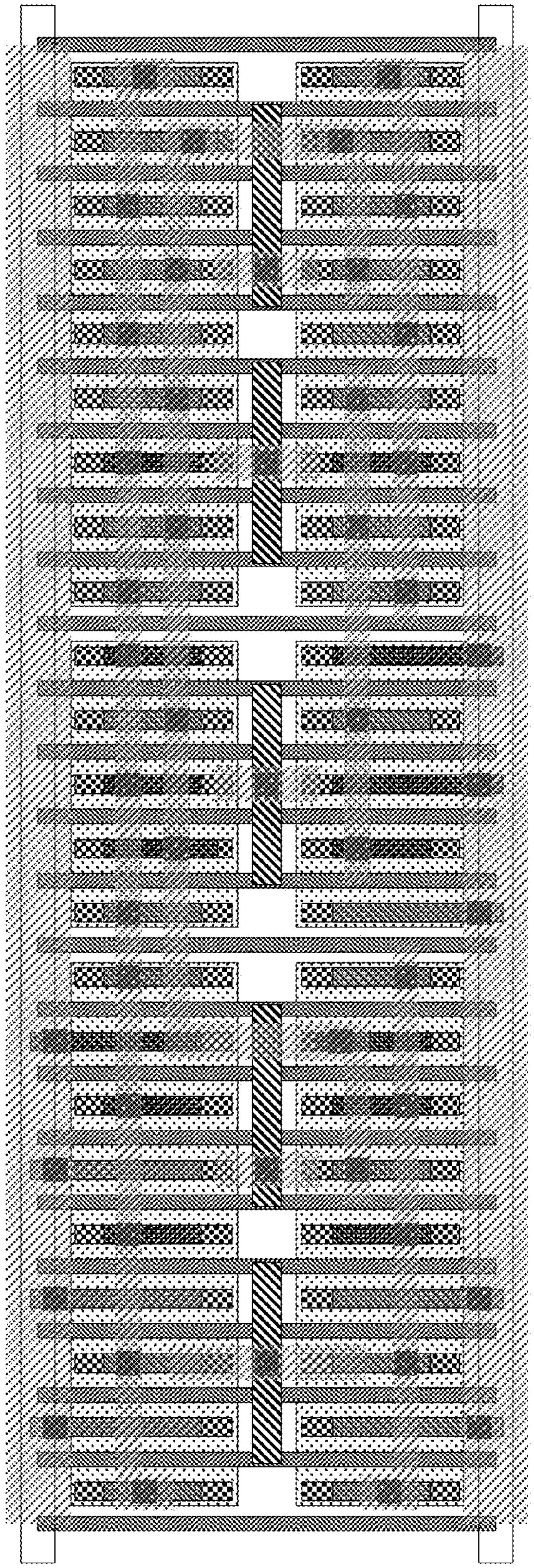
FIG. 62 depicts an AOI32D4 cell.

Reference is made to FIG. 62, which depicts an AOI32D4 cell. This cell implements the logic function nor(and(A,B, C),and(D,E)) in drive strength 4.

Figure 63:
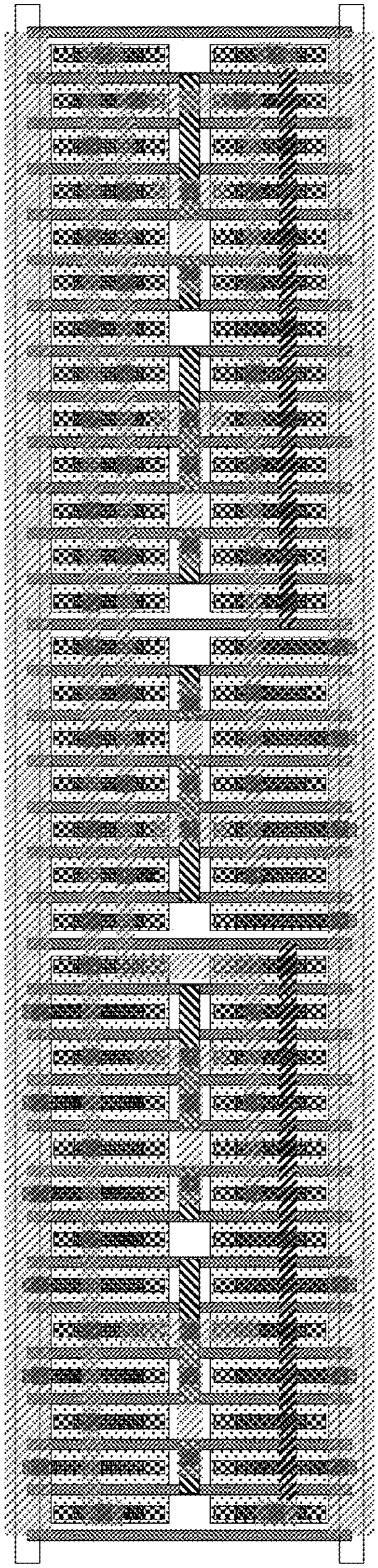
FIG. 63 depicts an AOI32D6 cell.

Reference is made to FIG. 63, which depicts an AOI32D6 cell. This cell implements the logic function nor(and(A,B, C),and(D,E)) in drive strength 6.

Figure 64:
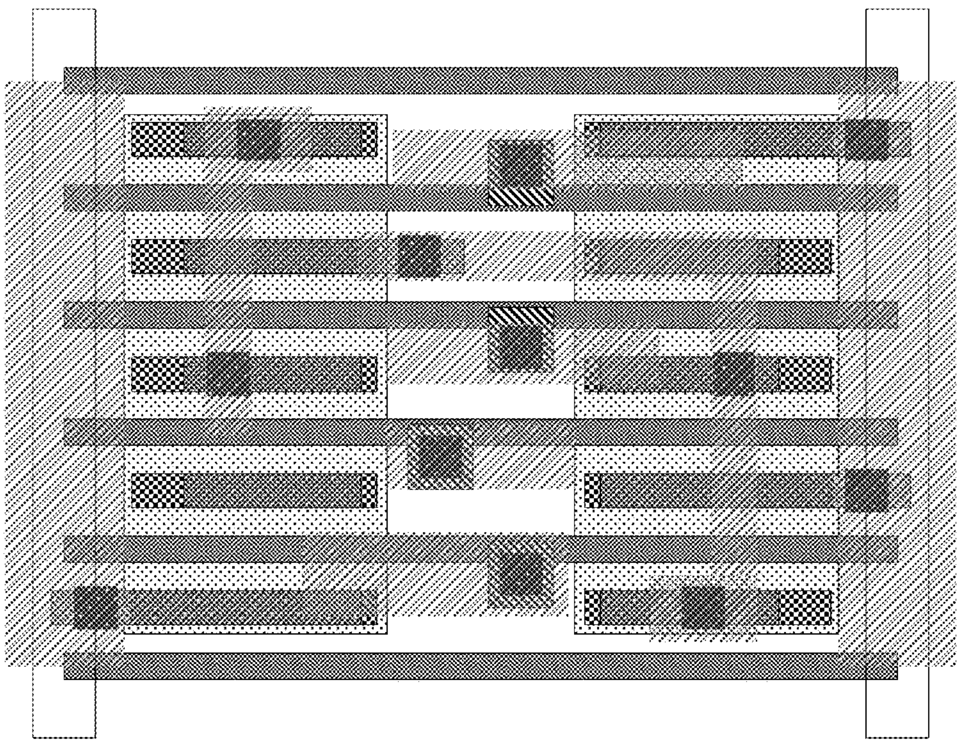
FIG. 64 depicts an AOI211D1 cell.

Reference is made to FIG. 64, which depicts an AOI211D1 cell. This cell implements the logic function nor(and(A,B),C,D) in drive strength 1.

Figure 65:
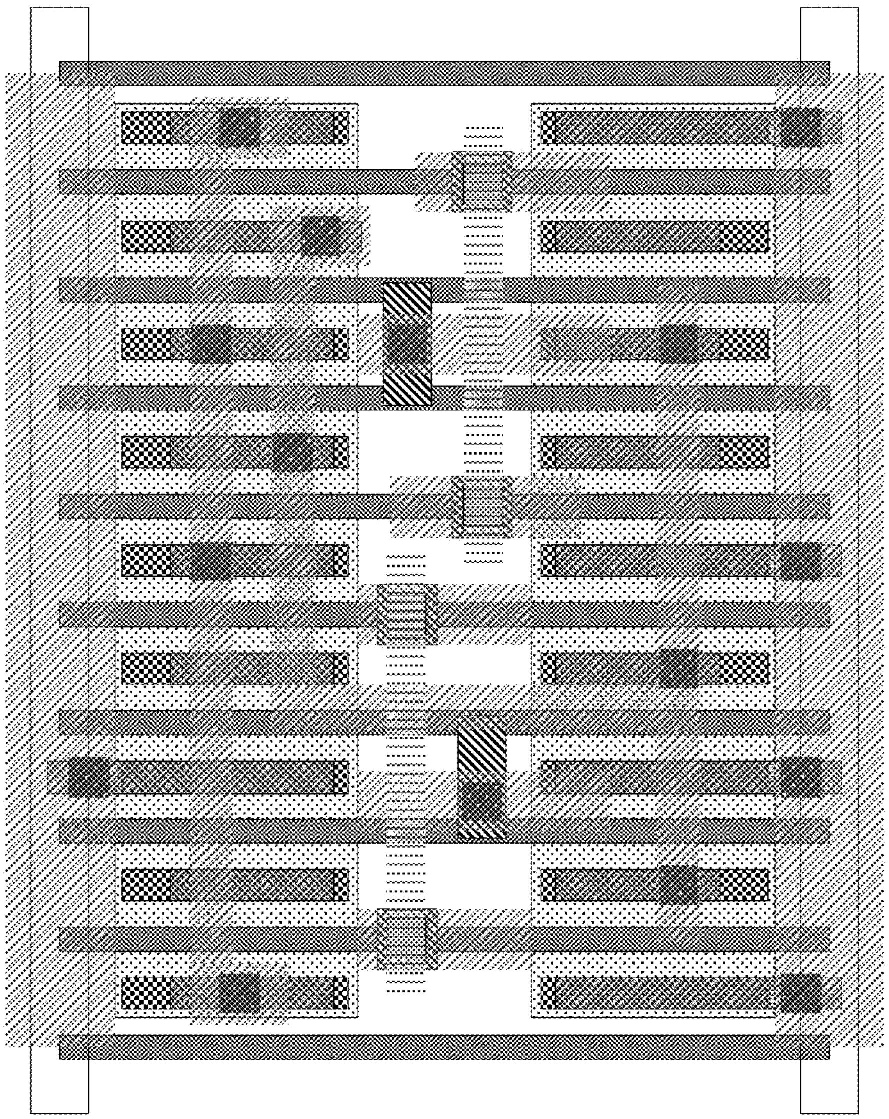
FIG. 65 depicts an AOI211D2 cell.

Reference is made to FIG. 65, which depicts an AOI211D2 cell. This cell implements the logic function nor(and(A,B),C,D) in drive strength 2.

Figure 66:
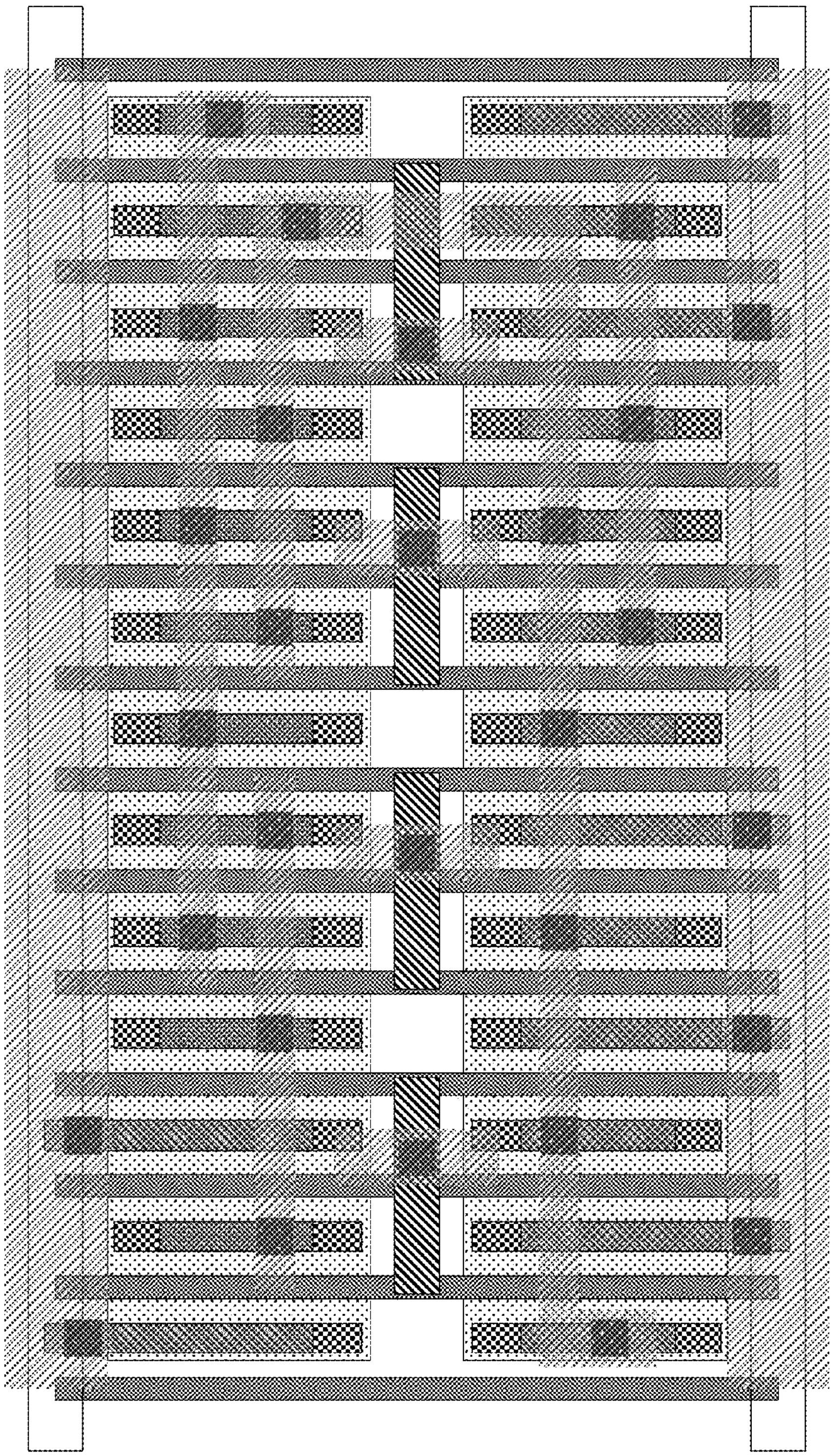
FIG. 66 depicts an AOI211D3 cell.

Reference is made to FIG. 66, which depicts an AOI211D3 cell. This cell implements the logic function nor(and(A,B),C,D) in drive strength 3.

Figure 67:
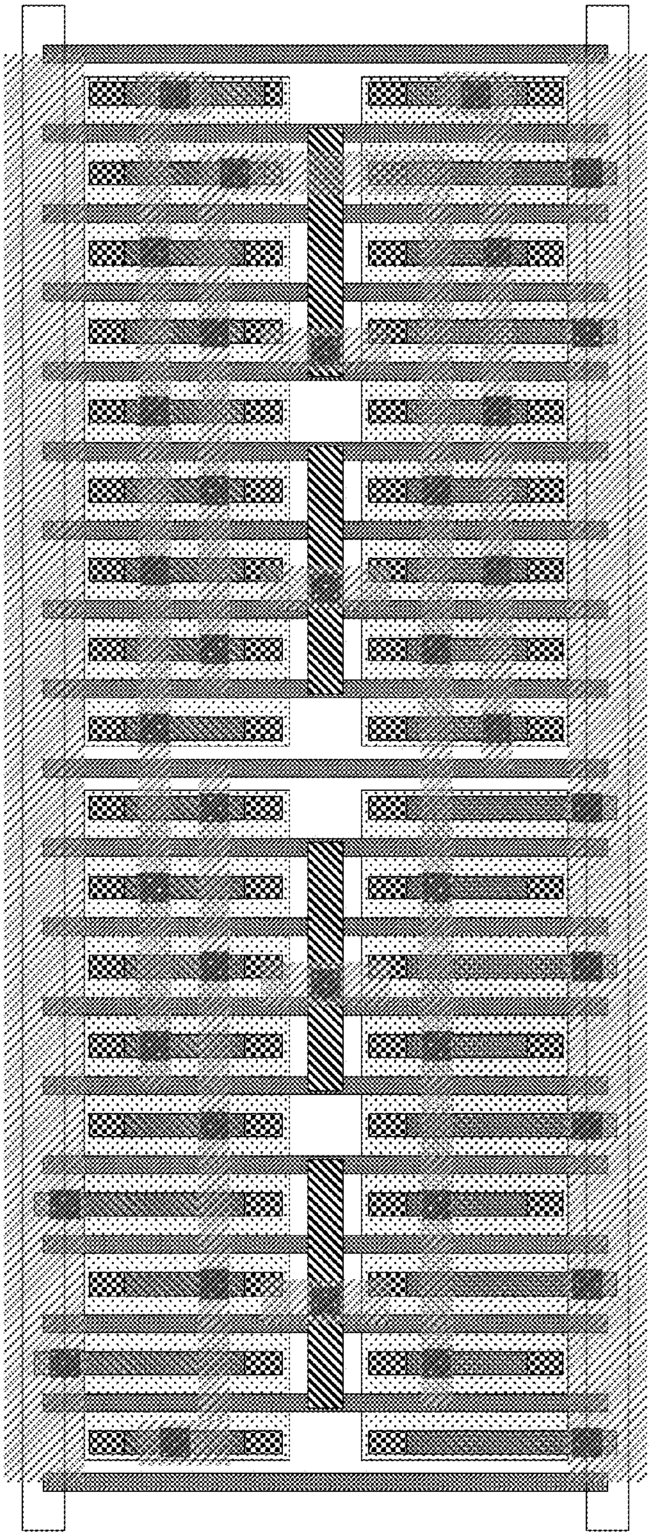
FIG. 67 depicts an AOI211D4 cell.

Reference is made to FIG. 67, which depicts an AOI211D4 cell. This cell implements the logic function nor(and(A,B),C,D) in drive strength 4.

Figure 68:
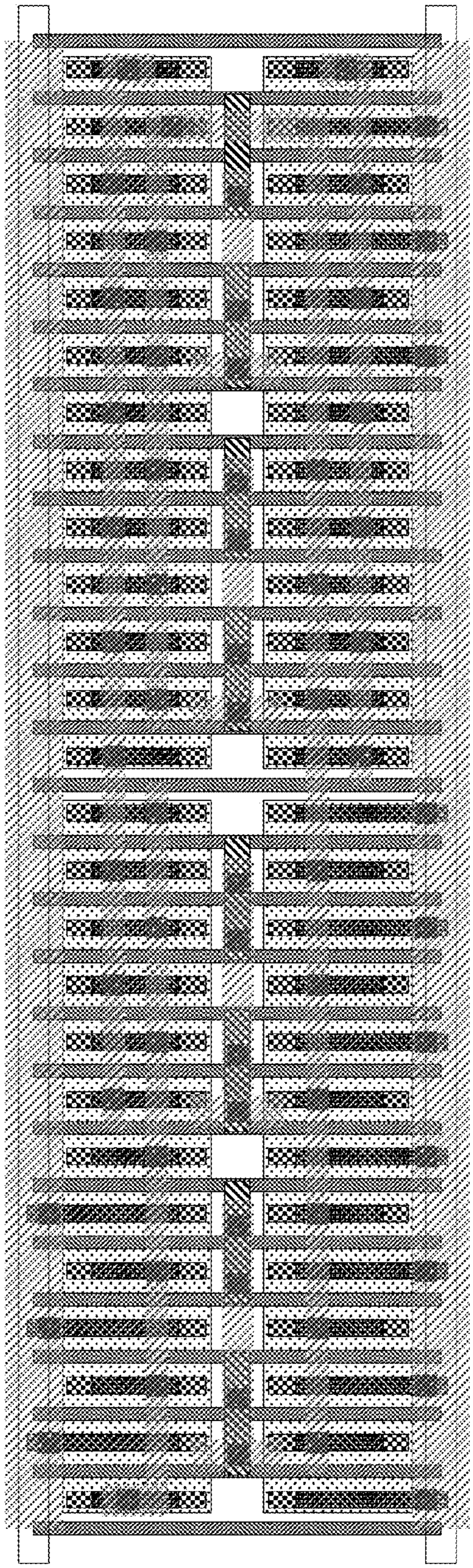
FIG. 68 depicts an AOI211D6 cell.

Reference is made to FIG. 68, which depicts an AOI211D6 cell. This cell implements the logic function nor(and(A,B),C,D) in drive strength 6.

Figure 69:
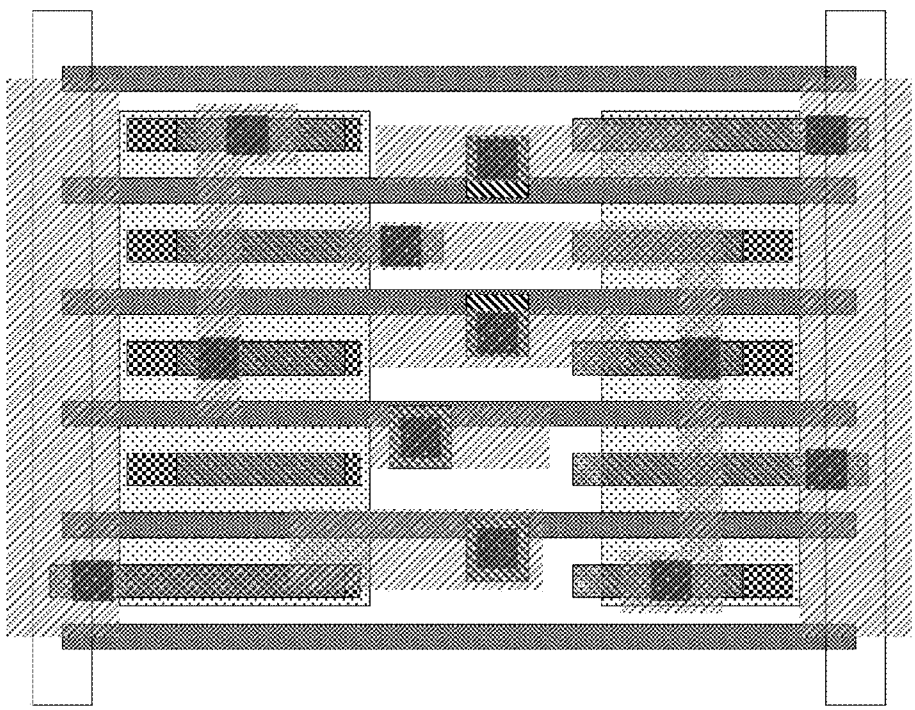
FIG. 69 depicts an AOI211XD1 cell.

Reference is made to FIG. 69, which depicts an AOI211XD1 cell. This is an alternative embodiment of the AOI211D1 cell.

Figure 70:
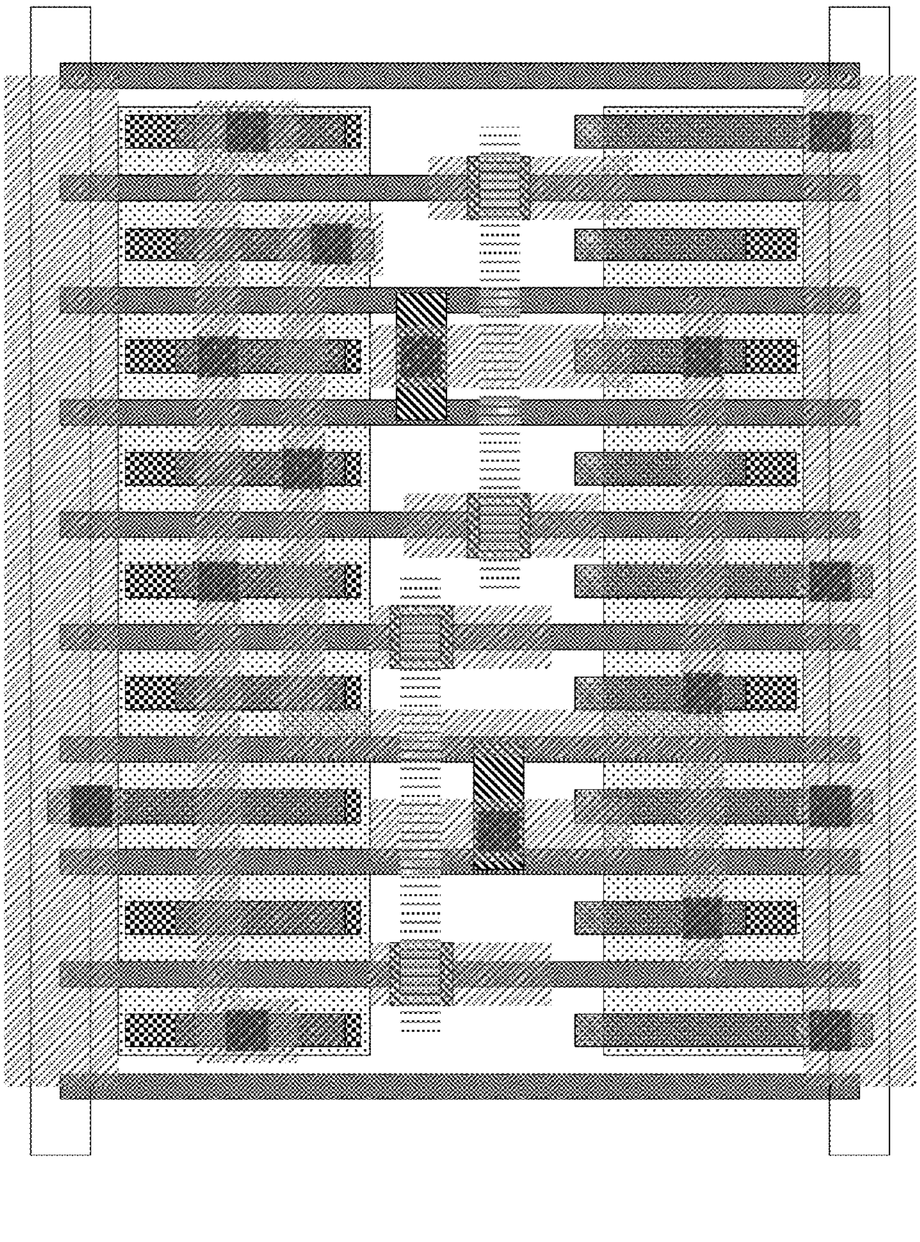
FIG. 70 depicts an AOI211XD2 cell.

Reference is made to FIG. 70, which depicts an AOI211XD2 cell. This is an alternative embodiment of the AOAI211D2 cell.

Figure 71:
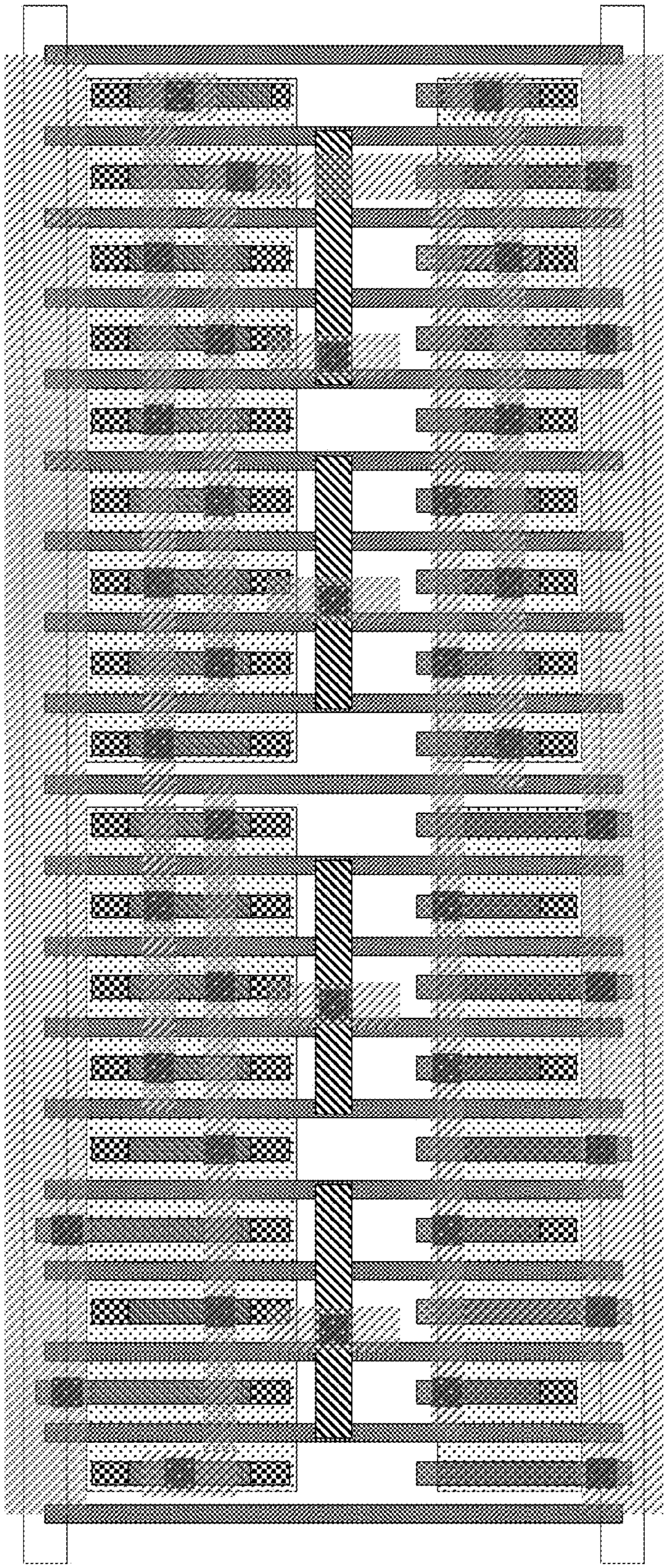
FIG. 71 depicts an AOI211XD4 cell.

Reference is made to FIG. 71, which depicts an AOI211XD4 cell. This is an alternative embodiment of the AOAI211D4 cell.

Figure 72:
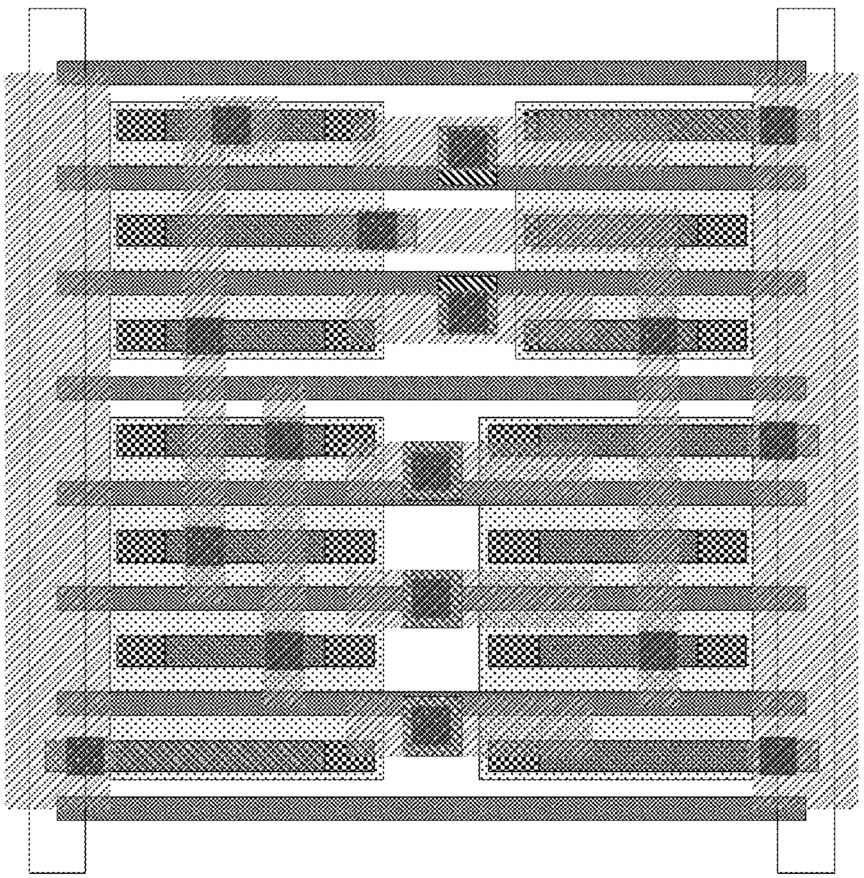
FIG. 72 depicts an AOI221D1 cell.

Reference is made to FIG. 72, which depicts an AOI221D1 cell. This cell implements the logic function nor(and(A,B),and(C,D),E) in drive strength 1.

Figure 73:
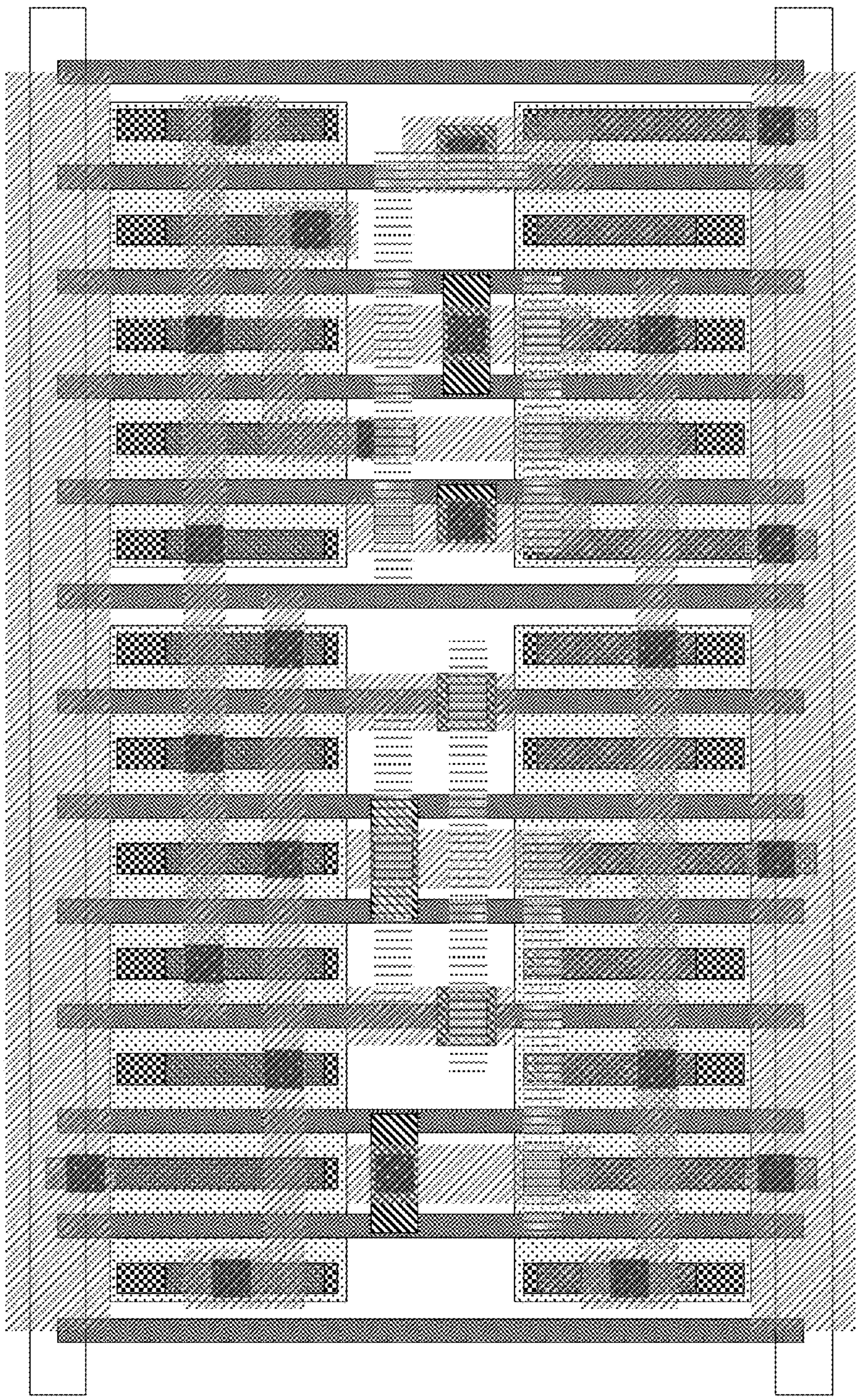
FIG. 73 depicts an AOI221D2 cell.

Reference is made to FIG. 73, which depicts an AOI221D2 cell. This cell implements the logic function nor(and(A,B),and(C,D),E) in drive strength 2.

Figure 74:
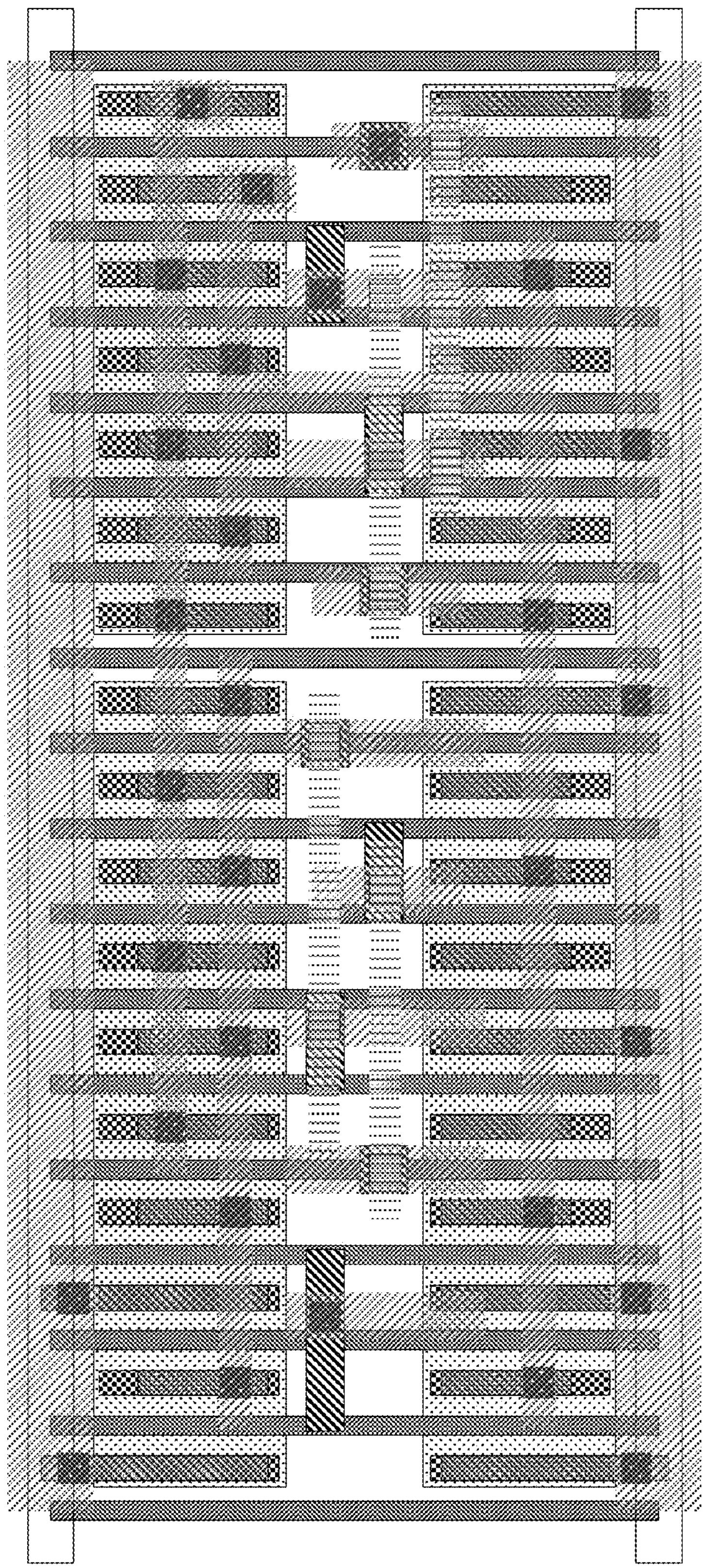
FIG. 74 depicts an AOI221D3 cell.

Reference is made to FIG. 74, which depicts an AOI221D3 cell. This cell implements the logic function nor(and(A,B),and(C,D),E) in drive strength 3.

Figure 75:
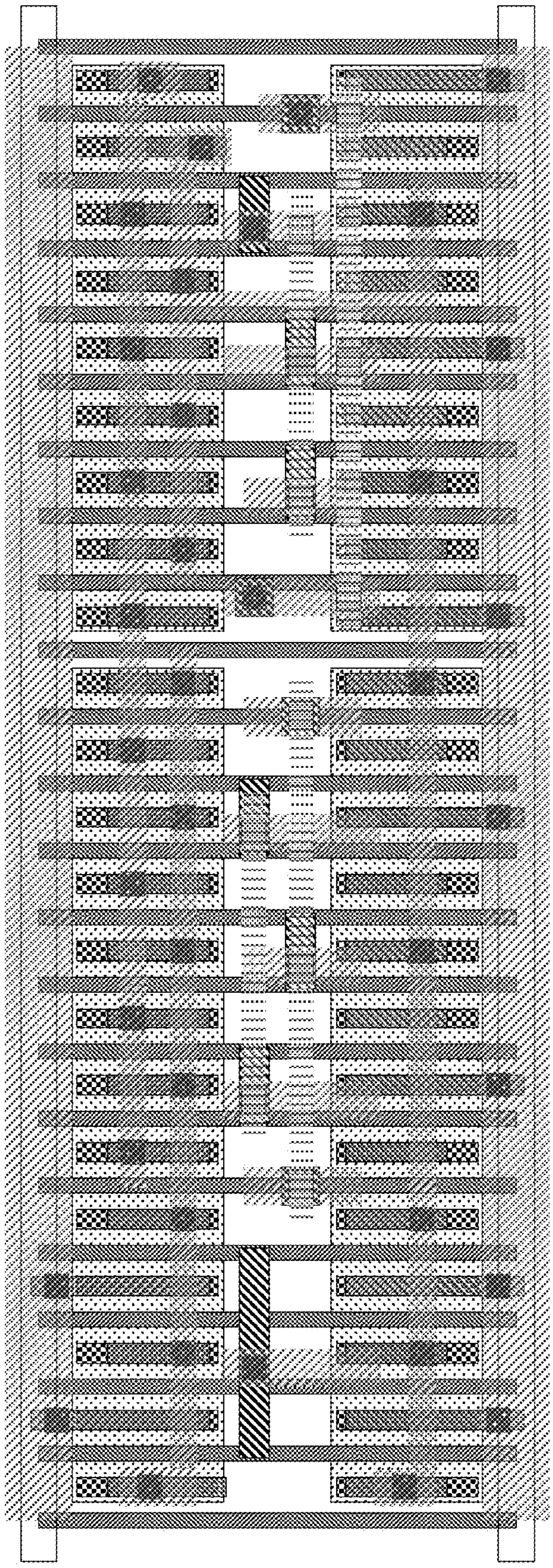
FIG. 75 depicts an AOI221D4 cell.

Reference is made to FIG. 75, which depicts an AOI221D4 cell. This cell implements the logic function nor(and(A,B),and(C,D),E) in drive strength 4.

Figure 76:
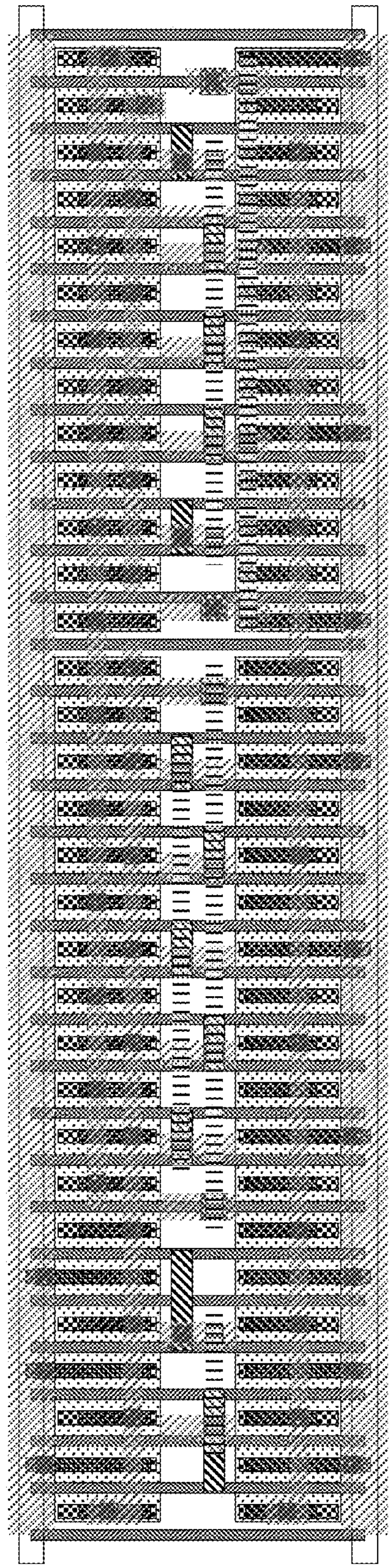
FIG. 76 depicts an AOI221D6 cell.

Reference is made to FIG. 76, which depicts an AOI221D6 cell. This cell implements the logic function nor(and(A,B),and(C,D),E) in drive strength 6.

Figure 77:
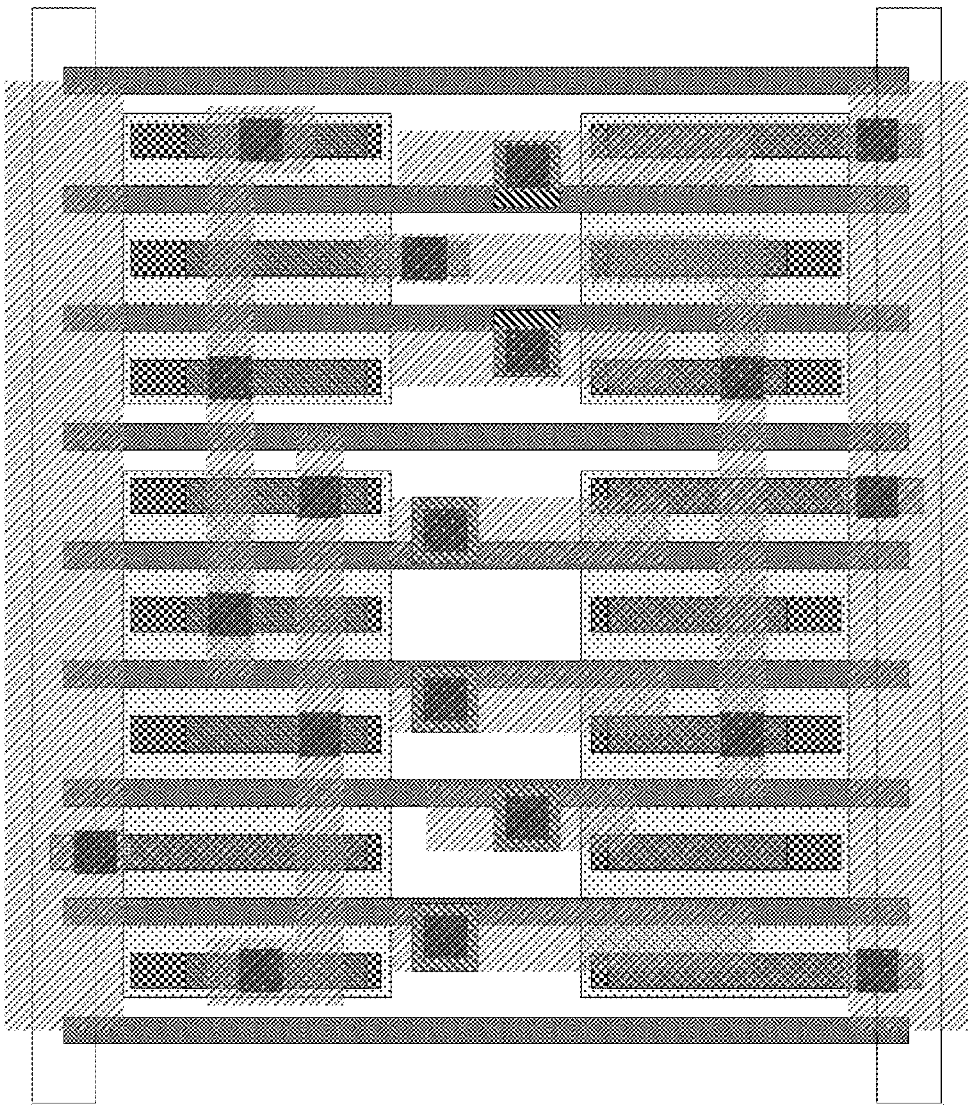
FIG. 77 depicts an AOI222D1 cell.

Reference is made to FIG. 77, which depicts an AOI222D1 cell. This cell implements the logic function nor(and(A,B),and(C,D),and(E,F)) in drive strength 1.

Figure 78:
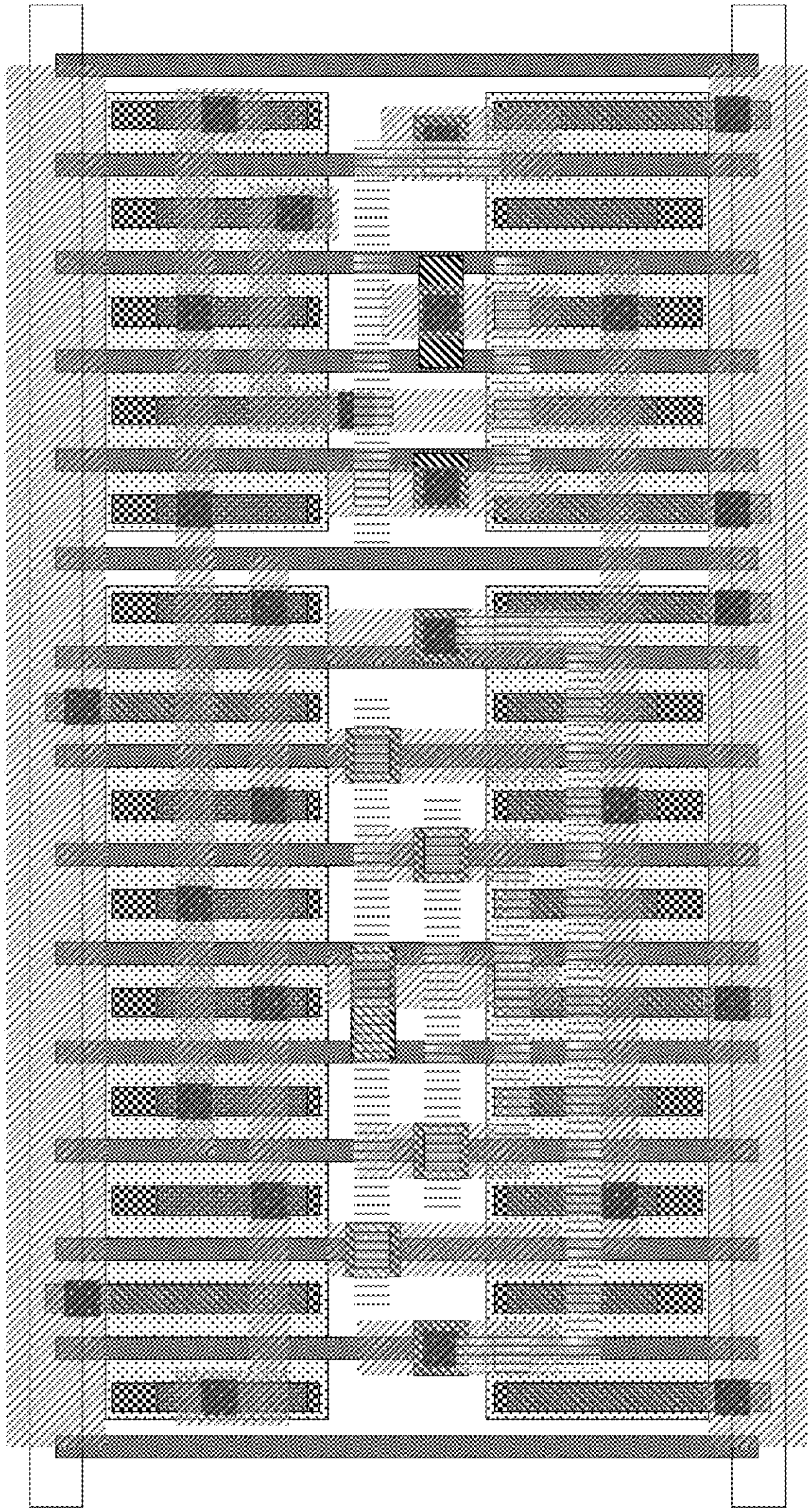
FIG. 78 depicts an AOI222D2 cell.

Reference is made to FIG. 78, which depicts an AOI222D2 cell. This cell implements the logic function nor(and(A,B),and(C,D),and(E,F)) in drive strength 2.

Figure 79:
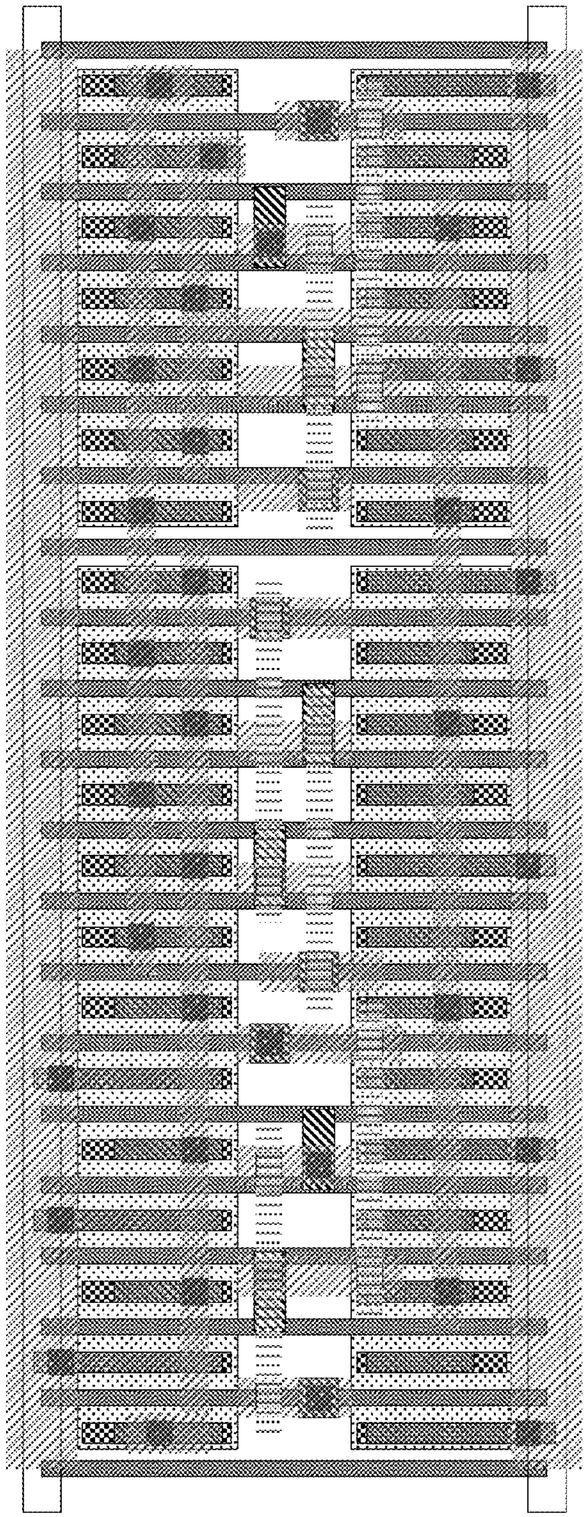
FIG. 79 depicts an AOI222D3 cell.

Reference is made to FIG. 79, which depicts an AOI222D3 cell. This cell implements the logic function nor(and(A,B),and(C,D),and(E,F)) in drive strength 3.

Figure 80:
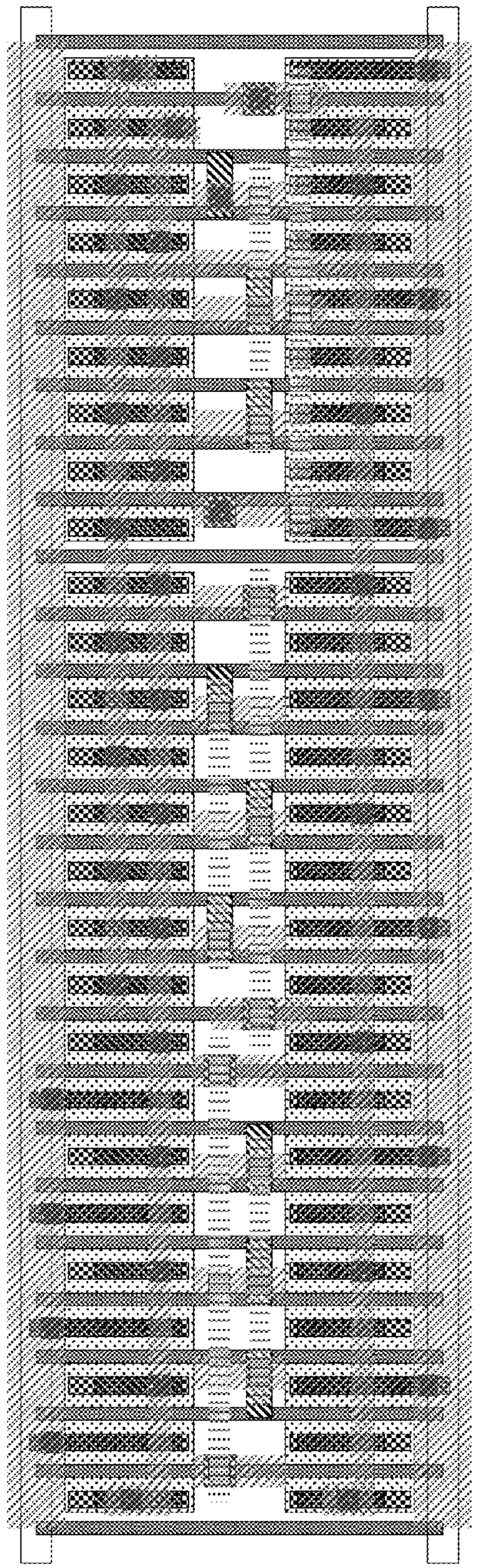
FIG. 80 depicts an AOI222D4 cell.

Reference is made to FIG. 80, which depicts an AOI222D4 cell. This cell implements the logic function nor(and(A,B),and(C,D),and(E,F)) in drive strength 4.

Figure 81:
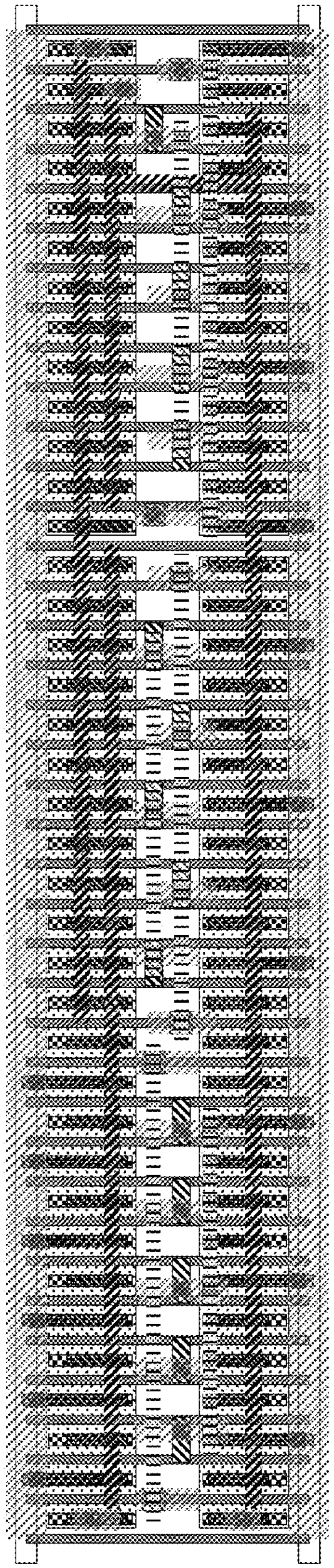
FIG. 81 depicts an AOI222D6 cell.

Reference is made to FIG. 81, which depicts an AOI222D6 cell. This cell implements the logic function nor(and(A,B),and(C,D),and(E,F)) in drive strength 6.

Figure 82:
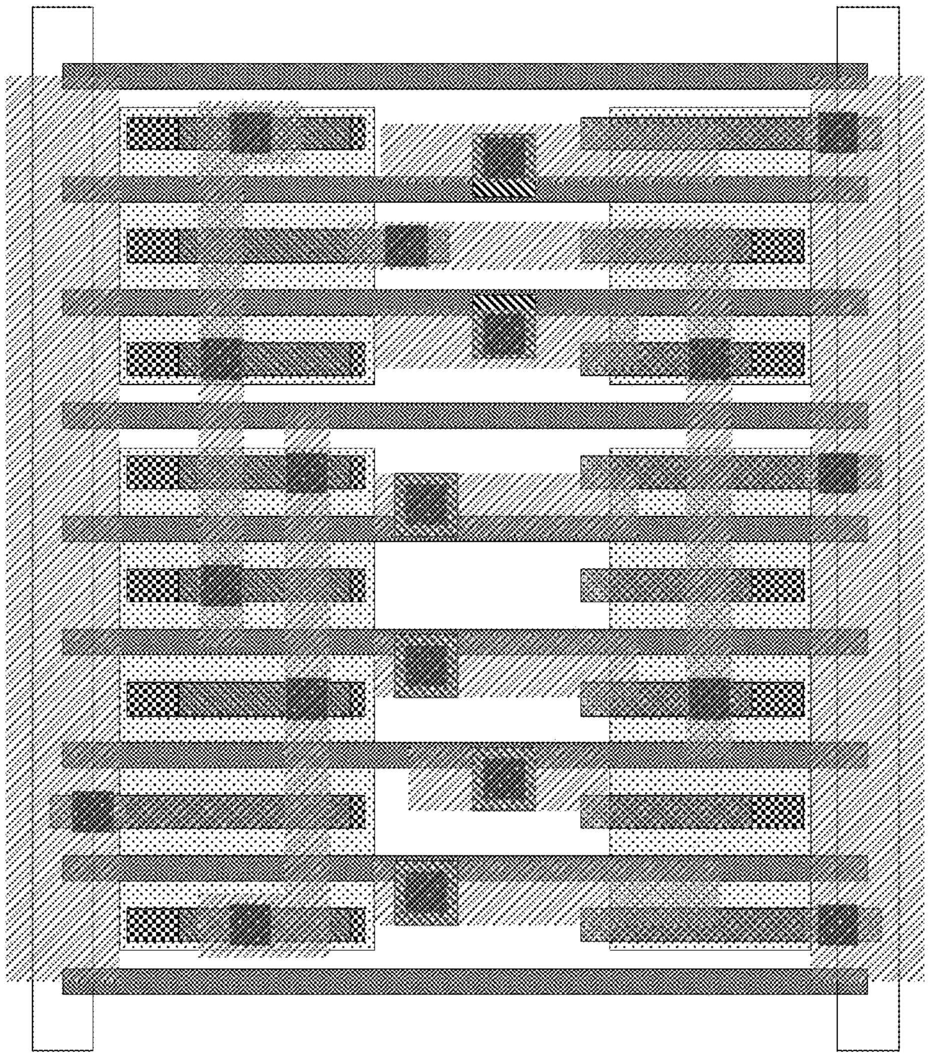
FIG. 82 depicts an AOI222XD1 cell.

Reference is made to FIG. 82, which depicts an AOI222XD1 cell. This is an alternative embodiment of the AOI222D1 cell.

Figure 83:
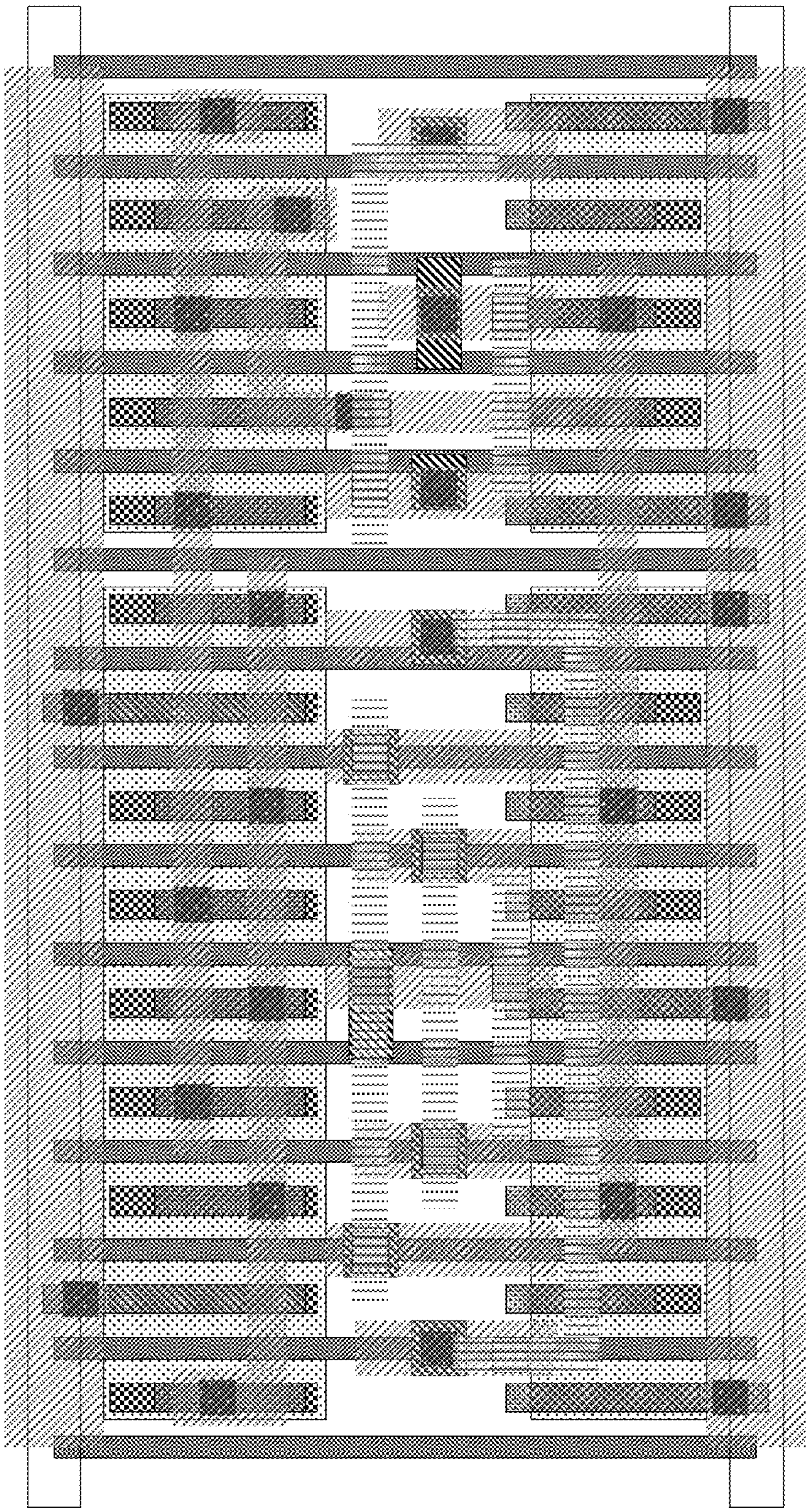
FIG. 83 depicts an AOI222XD2 cell.

Reference is made to FIG. 83, which depicts an AOI222XD2 cell. This is an alternative embodiment of the AOI222D2 cell.

Figure 84:
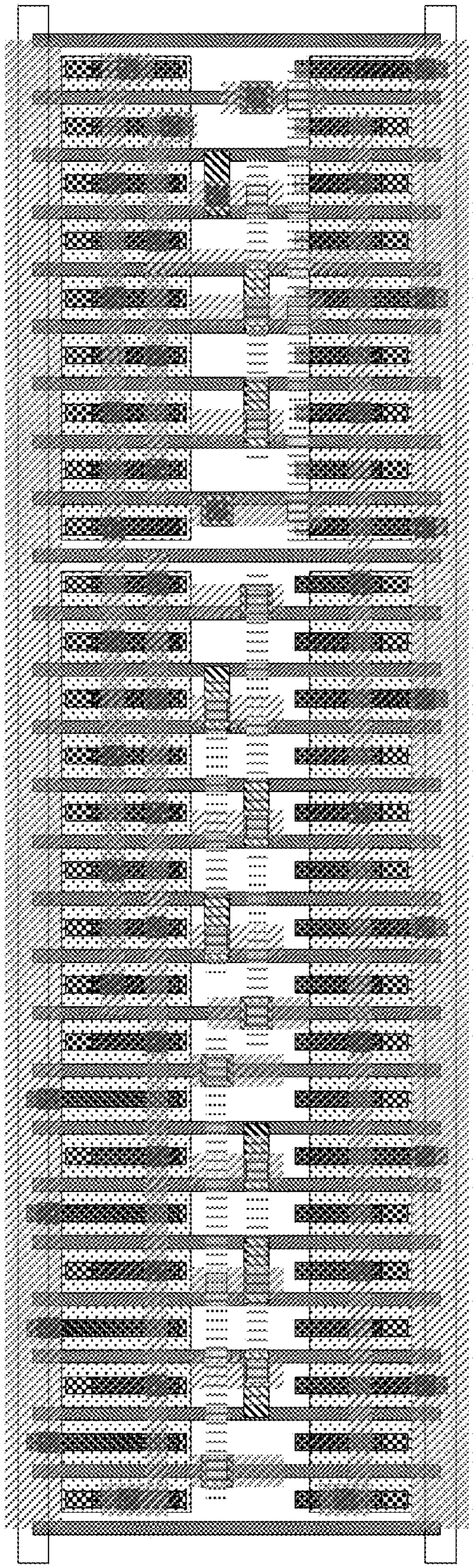
FIG. 84 depicts an AOI222XD4 cell.

Reference is made to FIG. 84, which depicts an AOI222XD4 cell. This is an alternative embodiment of the AOI222D4 cell.

Figure 85:
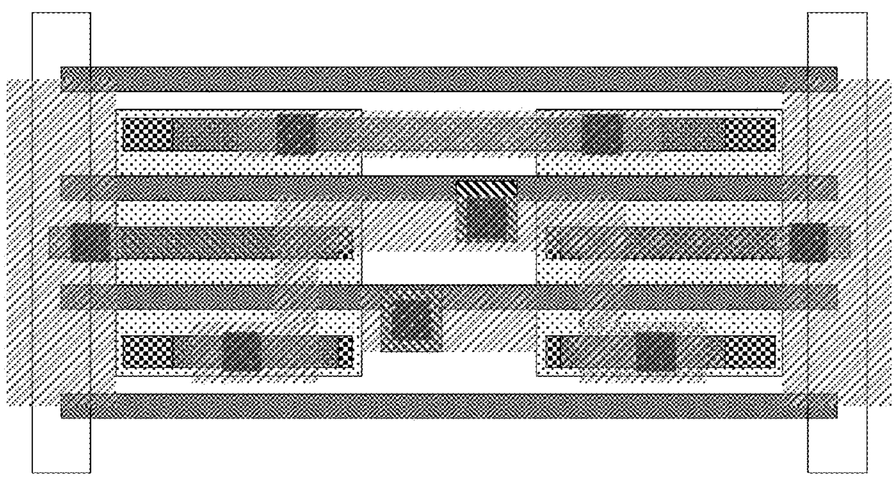
FIG. 85 depicts a BUFFD1 cell.

Reference is made to FIG. 85, which depicts a BUFFD1 cell. This cell implements the logical buffering function in drive strength 1.

Figure 86:
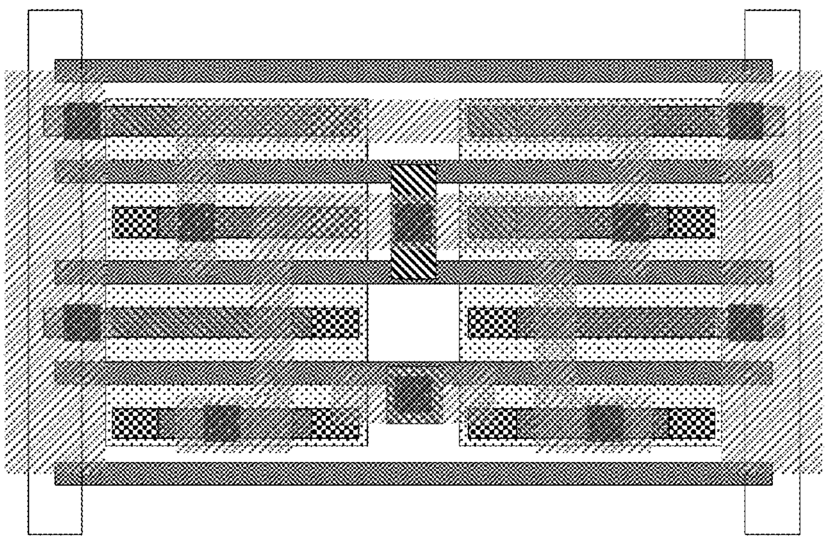
FIG. 86 depicts a BUFFD2 cell.

Reference is made to FIG. 86, which depicts a BUFFD2 cell. This cell implements the logical buffering function in drive strength 2.

Figure 87:
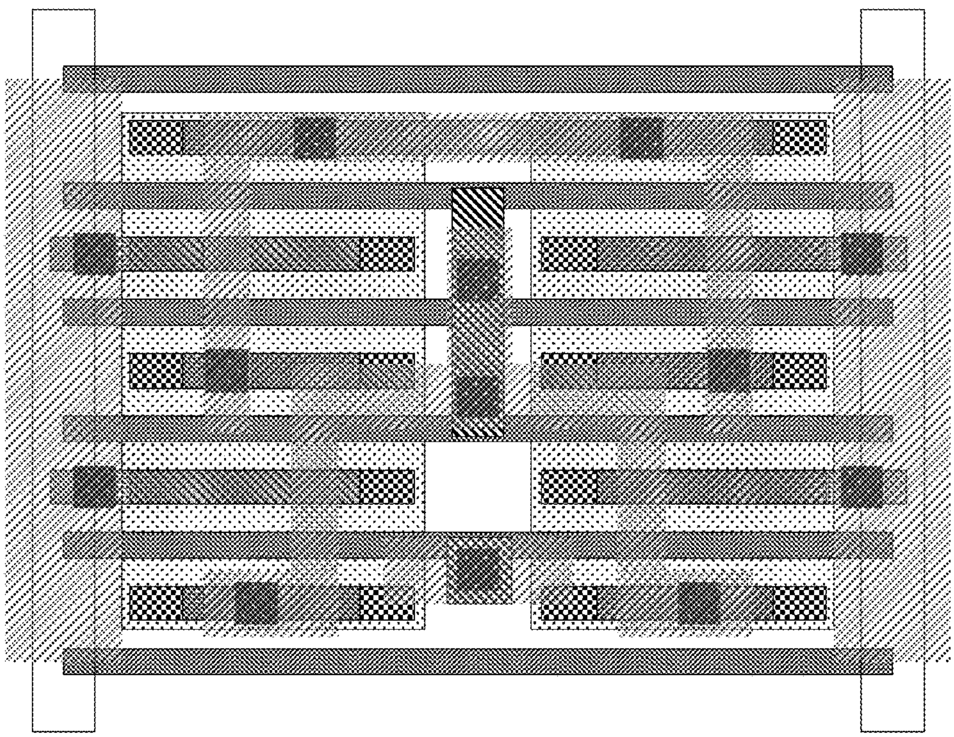
FIG. 87 depicts a BUFFD3 cell.

Reference is made to FIG. 87, which depicts a BUFFD3 cell. This cell implements the logical buffering function in drive strength 3.

Figure 88:
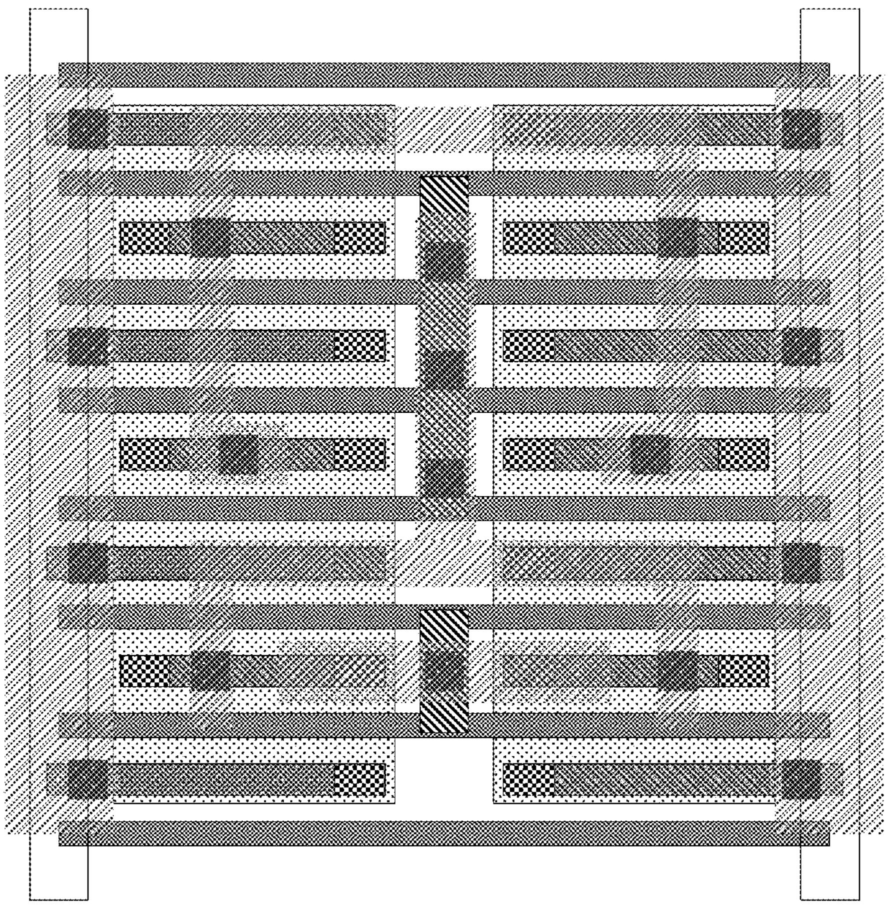
FIG. 88 depicts a BUFFD4 cell.

Reference is made to FIG. 88, which depicts a BUFFD4 cell. This cell implements the logical buffering function in drive strength 4.

Figure 89:
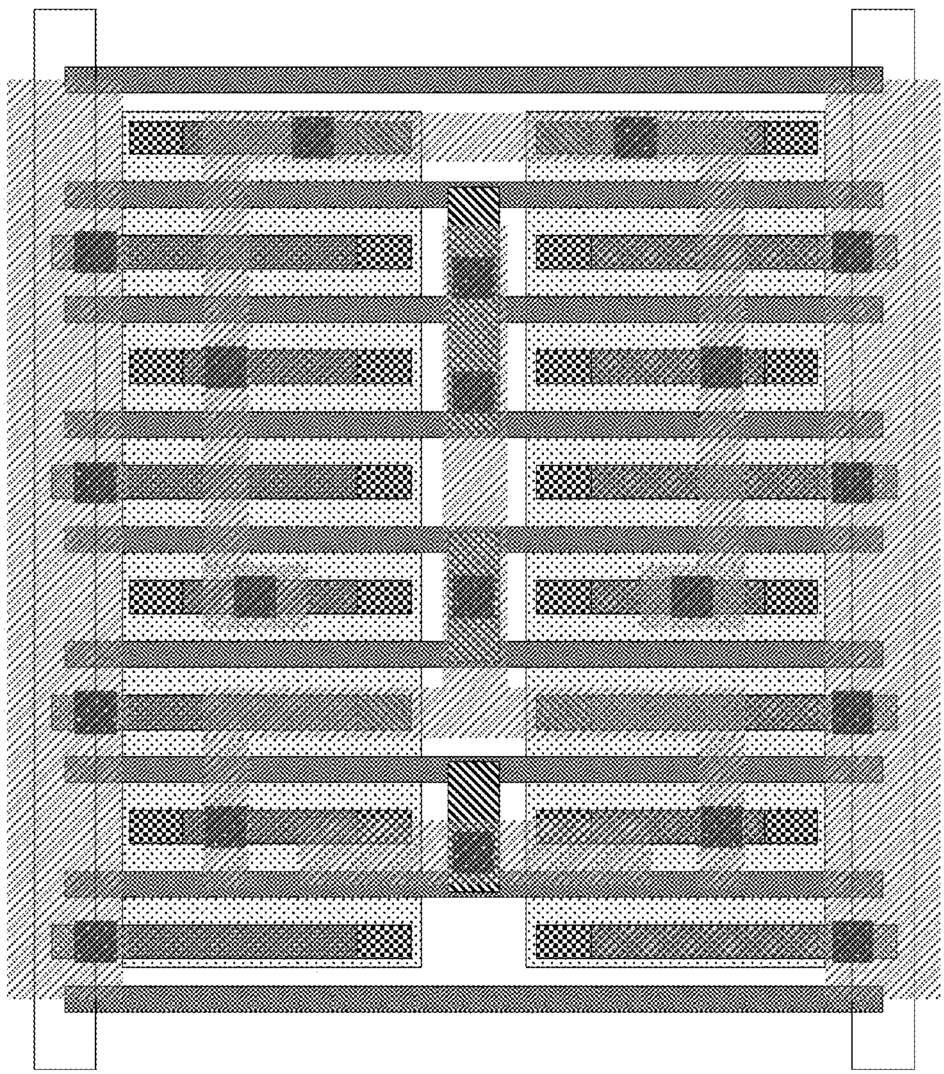
FIG. 89 depicts a BUFFD5 cell.

Reference is made to FIG. 89, which depicts a BUFFD5 cell. This cell implements the logical buffering function in drive strength 5.

Figure 90:
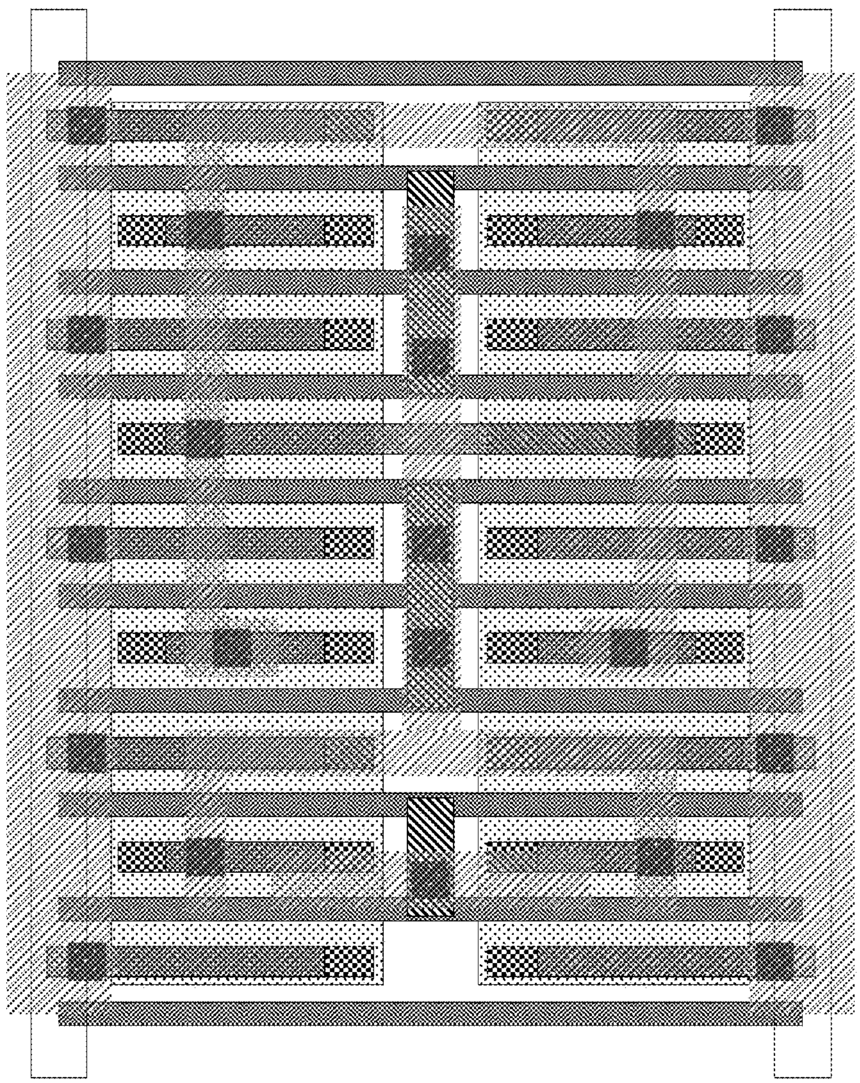
FIG. 90 depicts a BUFFD6 cell.

Reference is made to FIG. 90, which depicts a BUFFD6 cell. This cell implements the logical buffering function in drive strength 6.

Figure 91:
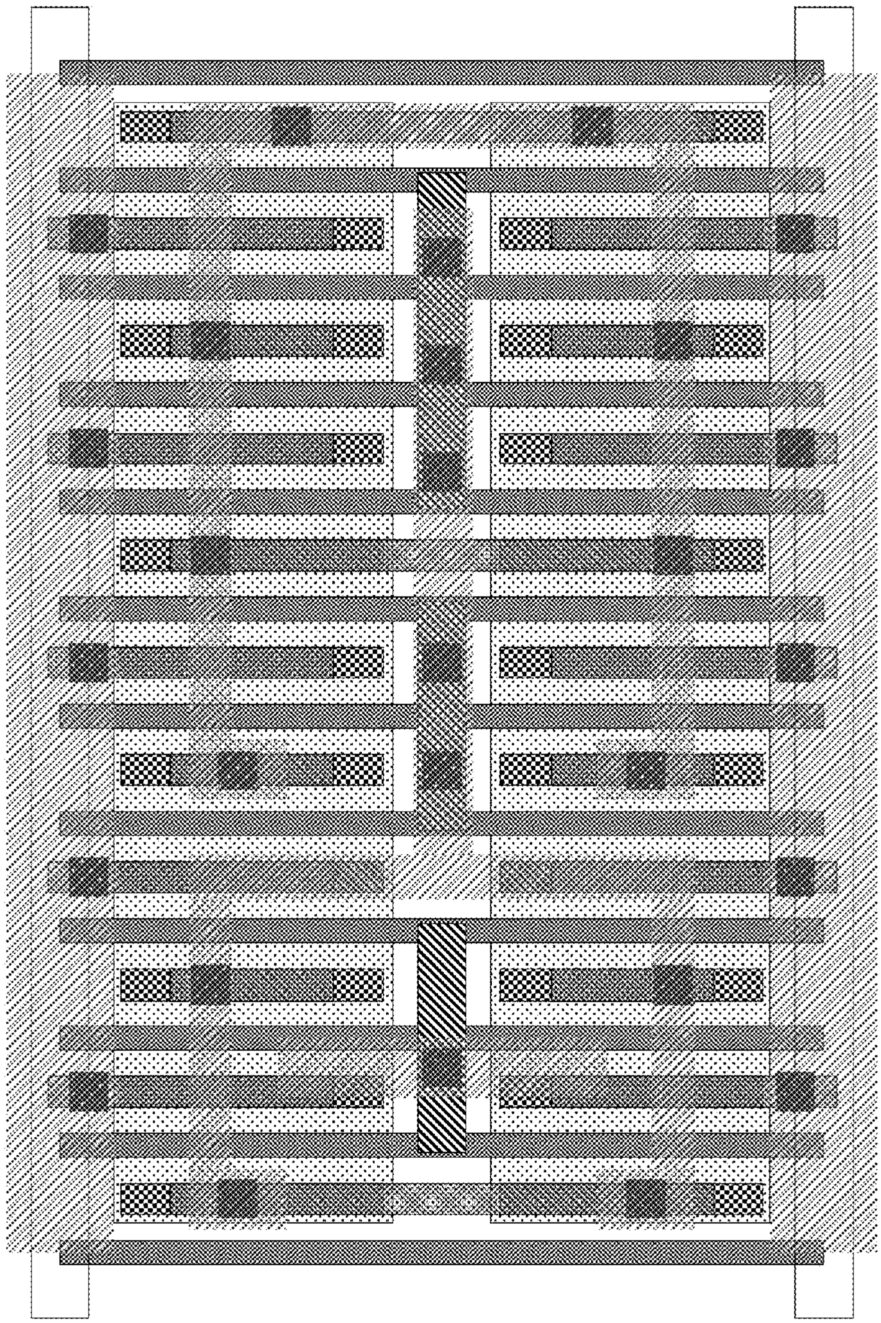
FIG. 91 depicts a BUFFD7 cell.

Reference is made to FIG. 91, which depicts a BUFFD7 cell. This cell implements the logical buffering function in drive strength 7.

Figure 92:
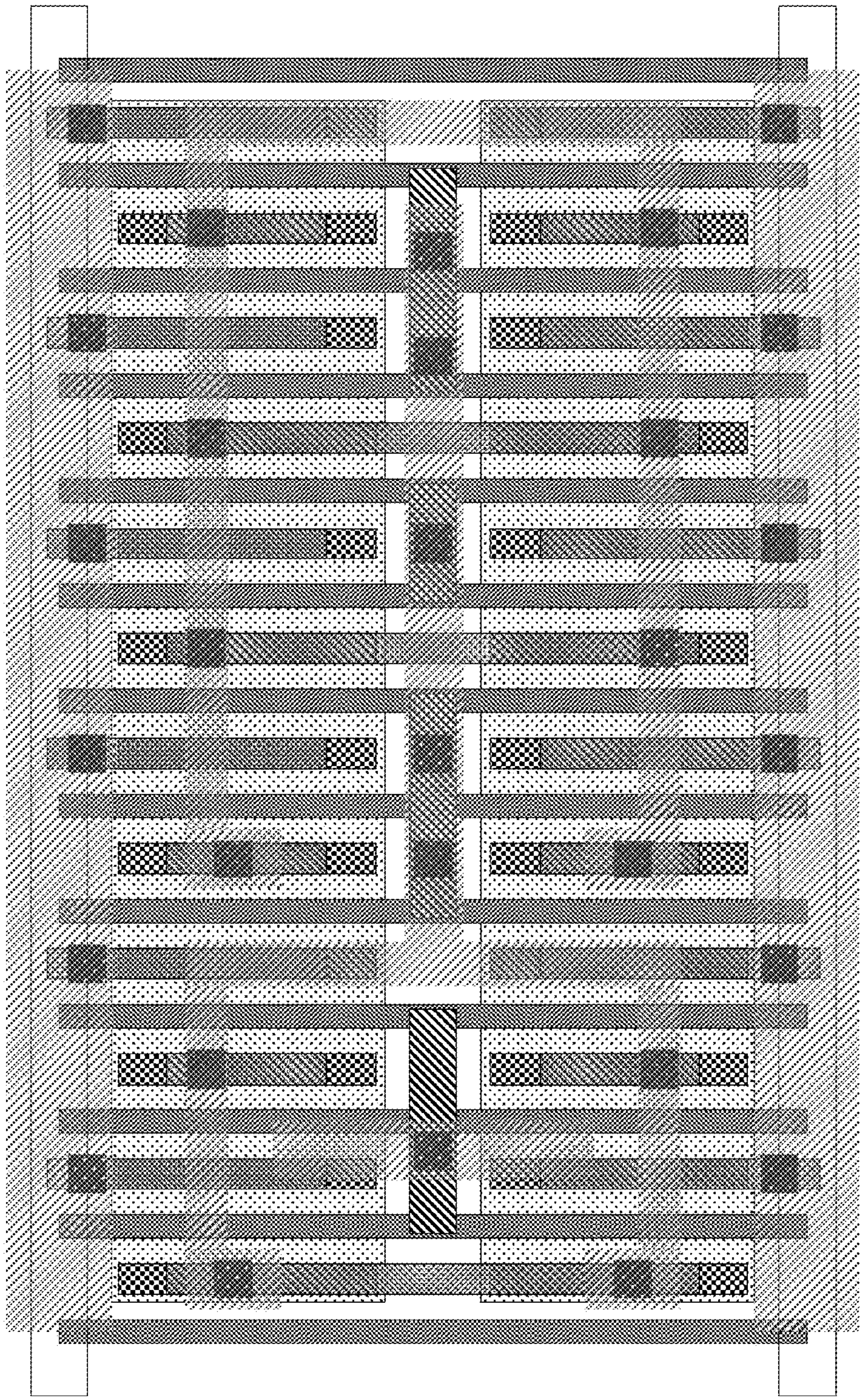
FIG. 92 depicts a BUFFD8 cell.

Reference is made to FIG. 92, which depicts a BUFFD8 cell. This cell implements the logical buffering function in drive strength 8.

Figure 93:
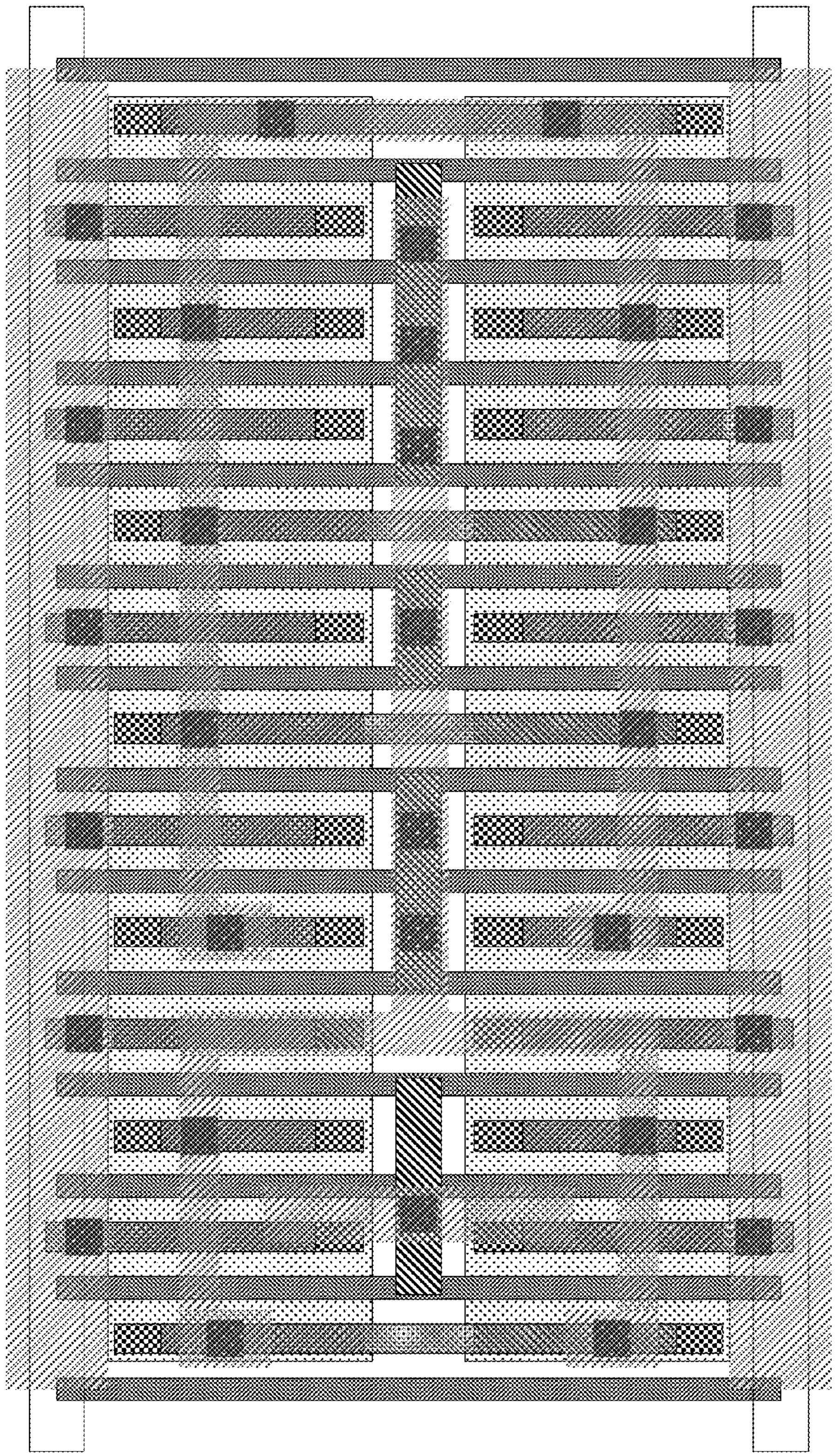
FIG. 93 depicts a BUFFD9 cell.

Reference is made to FIG. 93, which depicts a BUFFD9 cell. This cell implements the logical buffering function in drive strength 9.

Figure 94:
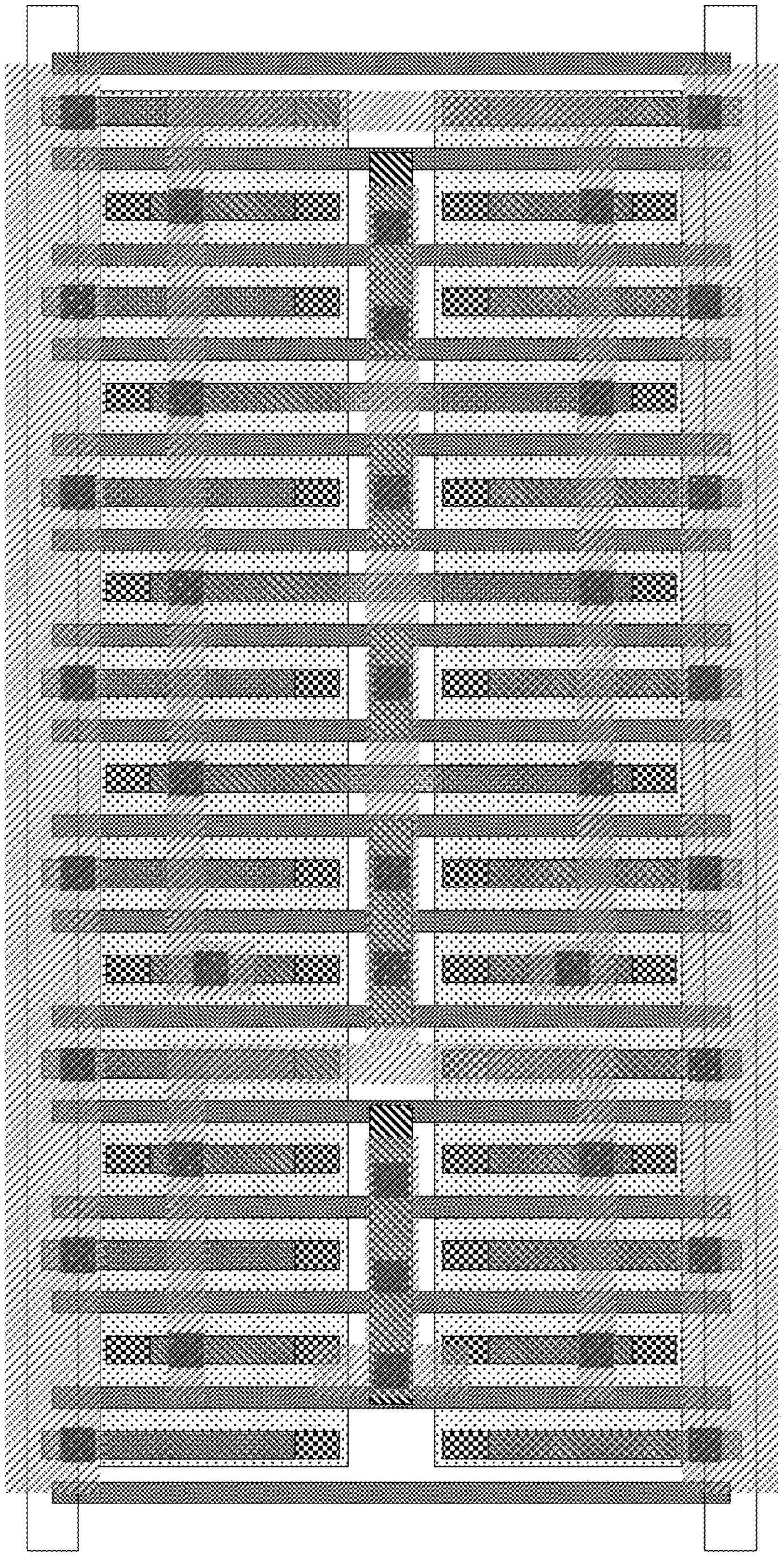
FIG. 94 depicts a BUFFD10 cell.

Reference is made to FIG. 94, which depicts a BUFFD10 cell. This cell implements the logical buffering function in drive strength 10.

Figure 95:
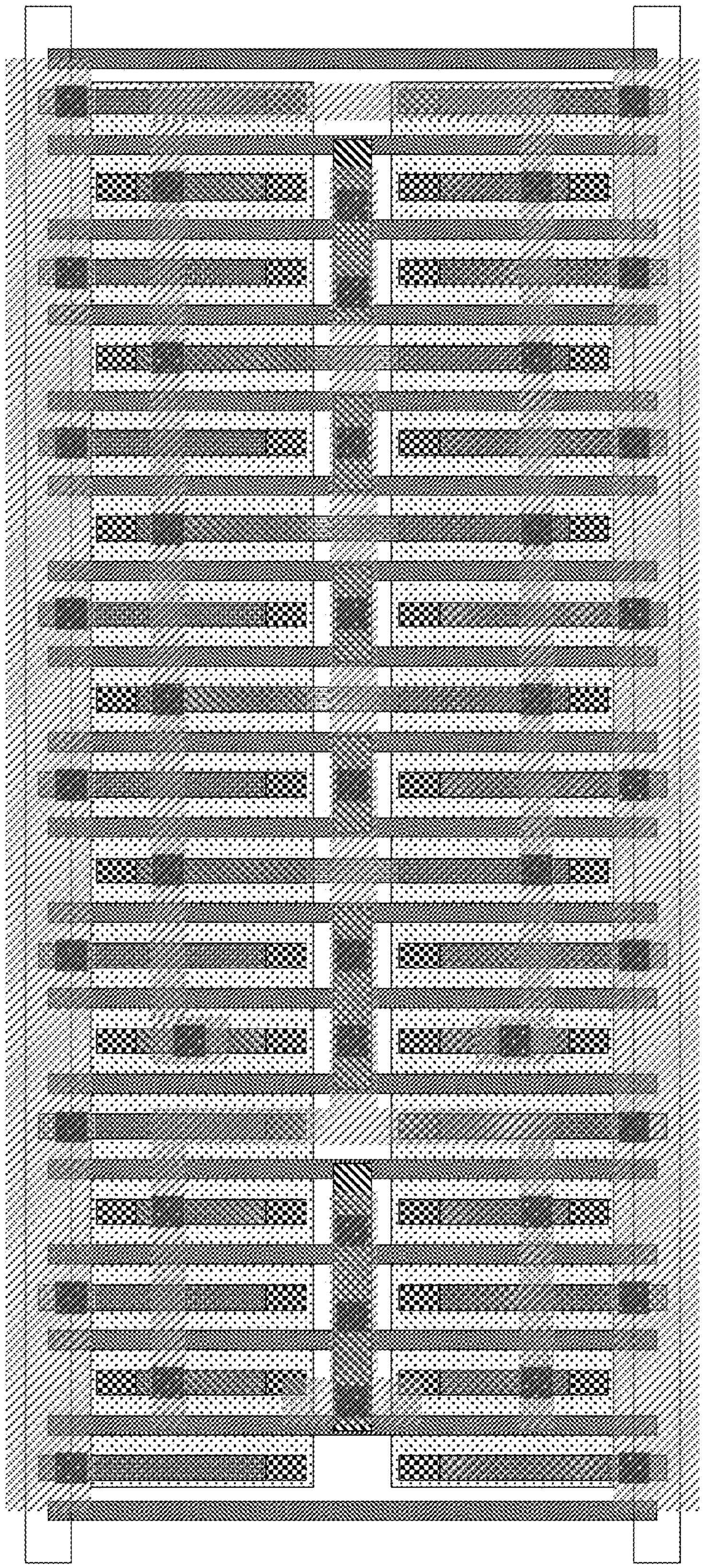
FIG. 95 depicts a BUFFD12 cell.

Reference is made to FIG. 95, which depicts a BUFFD12 cell. This cell implements the logical buffering function in drive strength 12.

Figure 96:
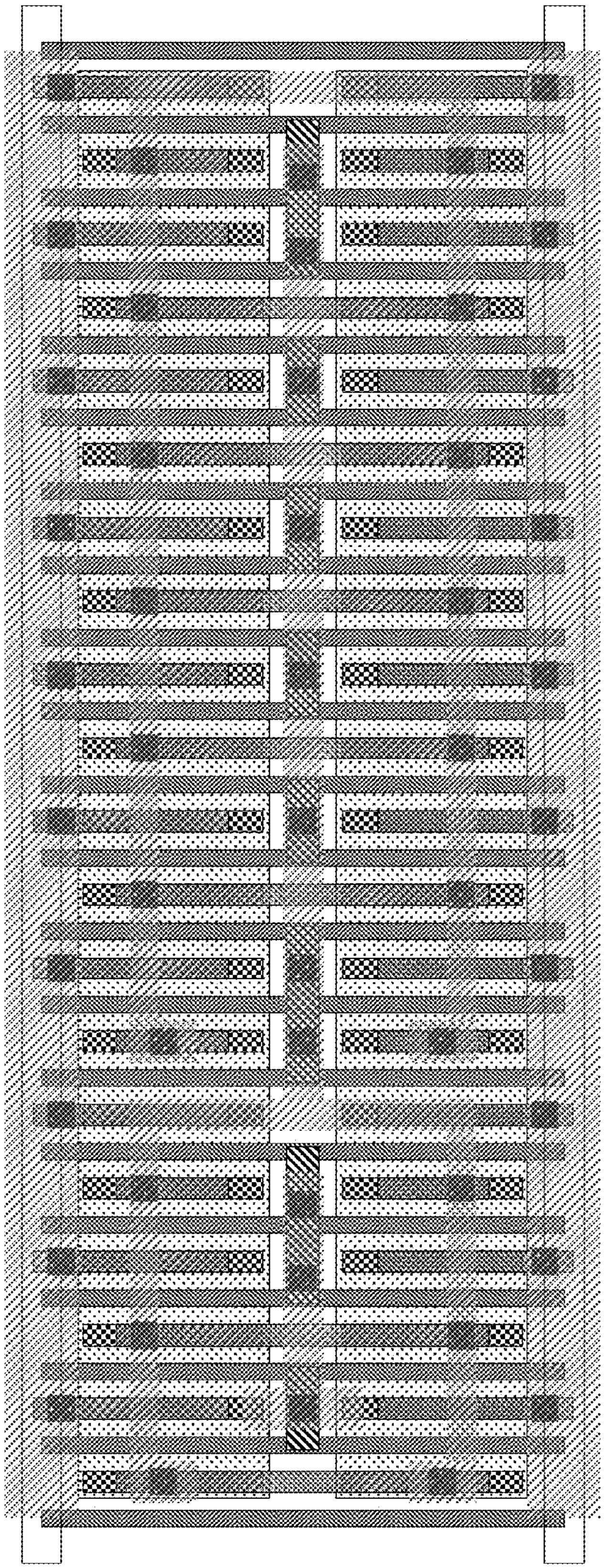
FIG. 96 depicts a BUFFD14 cell.

Reference is made to FIG. 96, which depicts a BUFFD14 cell. This cell implements the logical buffering function in drive strength 14.

Figure 97:
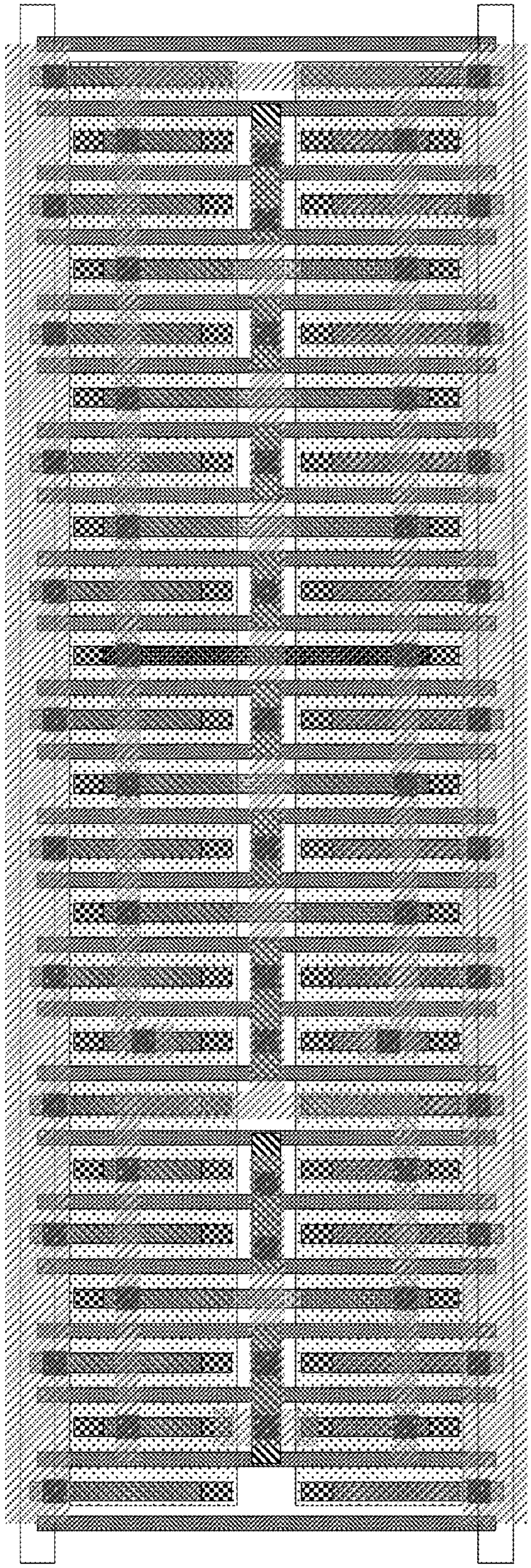
FIG. 97 depicts a BUFFD16 cell.

Reference is made to FIG. 97, which depicts a BUFFD16 cell. This cell implements the logical buffering function in drive strength 16.

Figure 98:
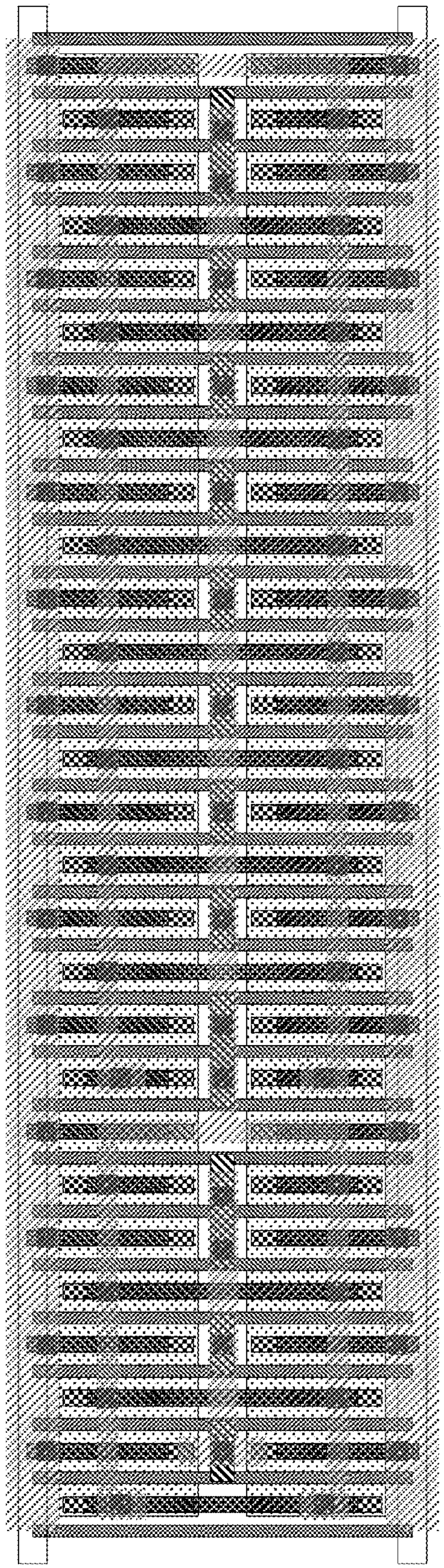
FIG. 98 depicts a BUFFD20 cell.

Reference is made to FIG. 98, which depicts a BUFFD20 cell. This cell implements the logical buffering function in drive strength 20.

Figure 99:
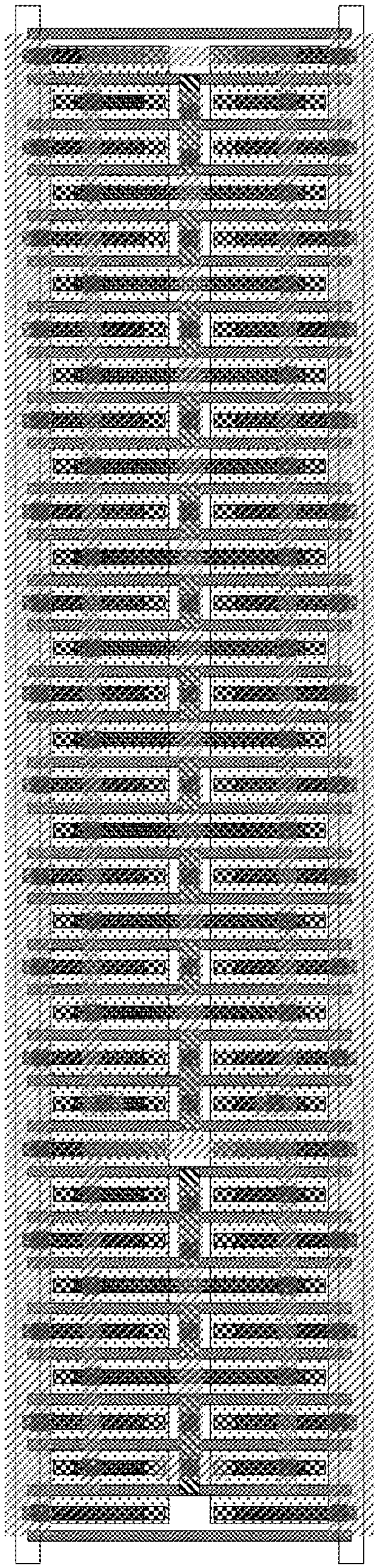
FIG. 99 depicts a BUFFD24 cell.

Reference is made to FIG. 99, which depicts a BUFFD24 cell. This cell implements the logical buffering function in drive strength 24.

Figure 100:
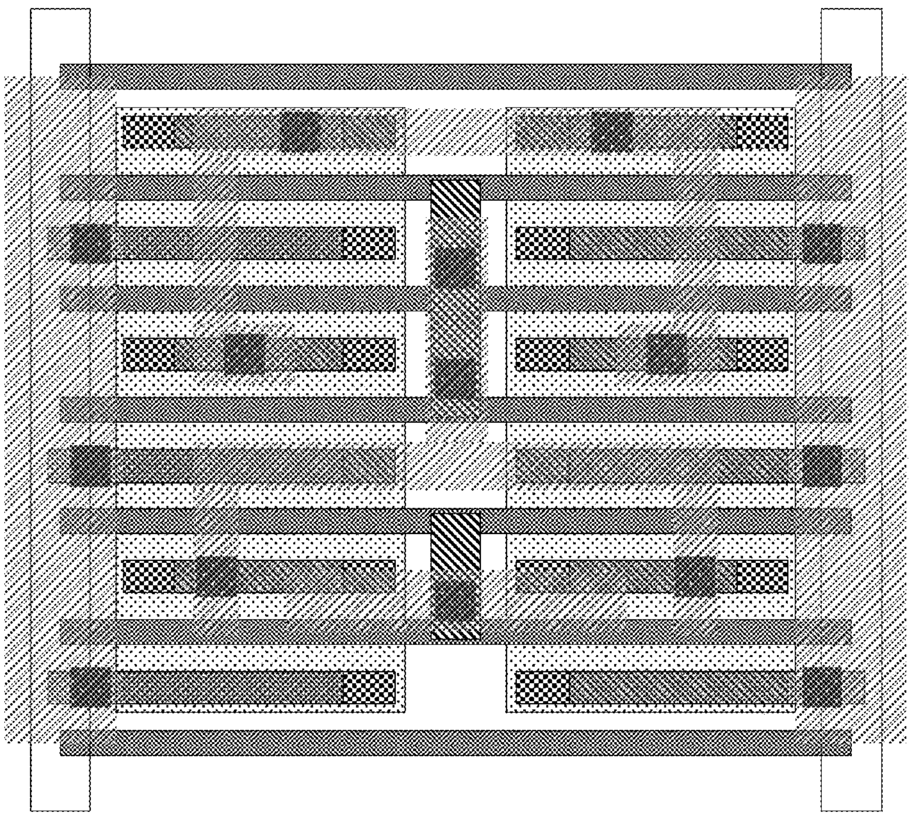
FIG. 100 depicts a BUFFXD3 cell.

Reference is made to FIG. 100, which depicts a BUFFXD3 cell. This is an alternative embodiment of the BUFFD3 cell.

Figure 101:
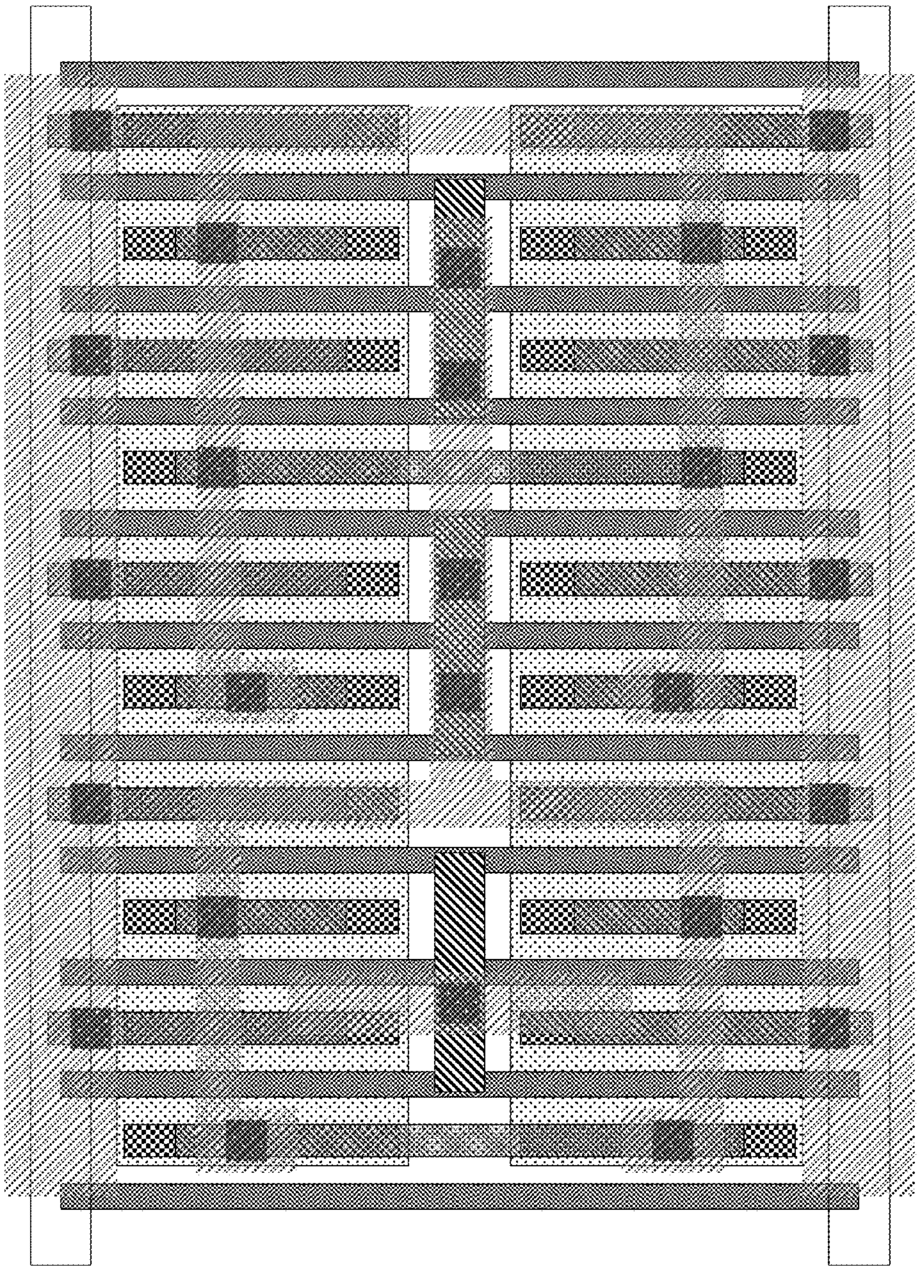
FIG. 101 depicts a BUFFXD6 cell.

Reference is made to FIG. 101, which depicts a BUFFXD6 cell. This is an alternative embodiment of the BUFFD6 cell.

Figure 102:
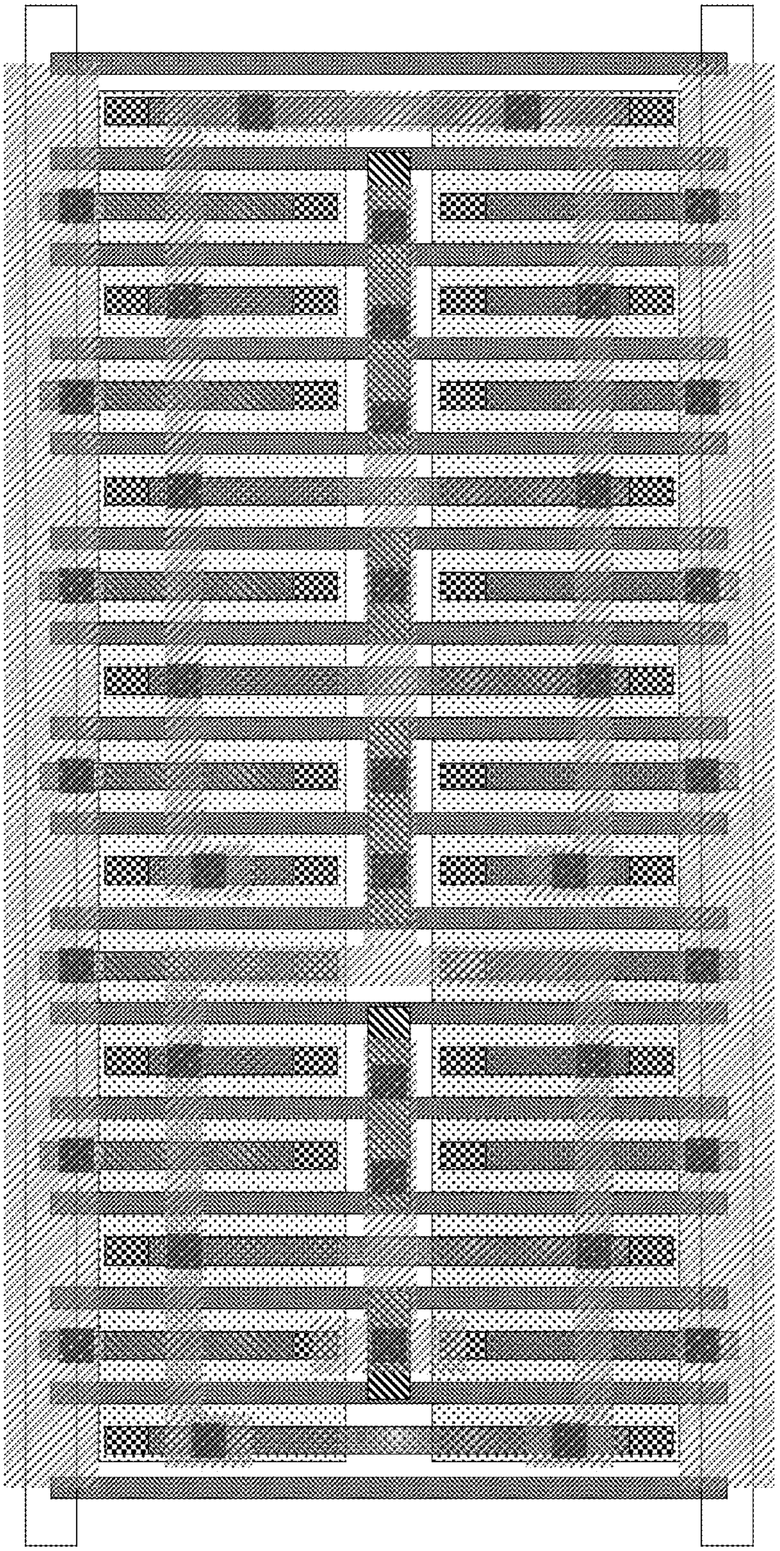
FIG. 102 depicts a BUFFXD9 cell.

Reference is made to FIG. 102, which depicts a BUFFXD9 cell. This is an alternative embodiment of the BUFFD9 cell.

Figure 103:
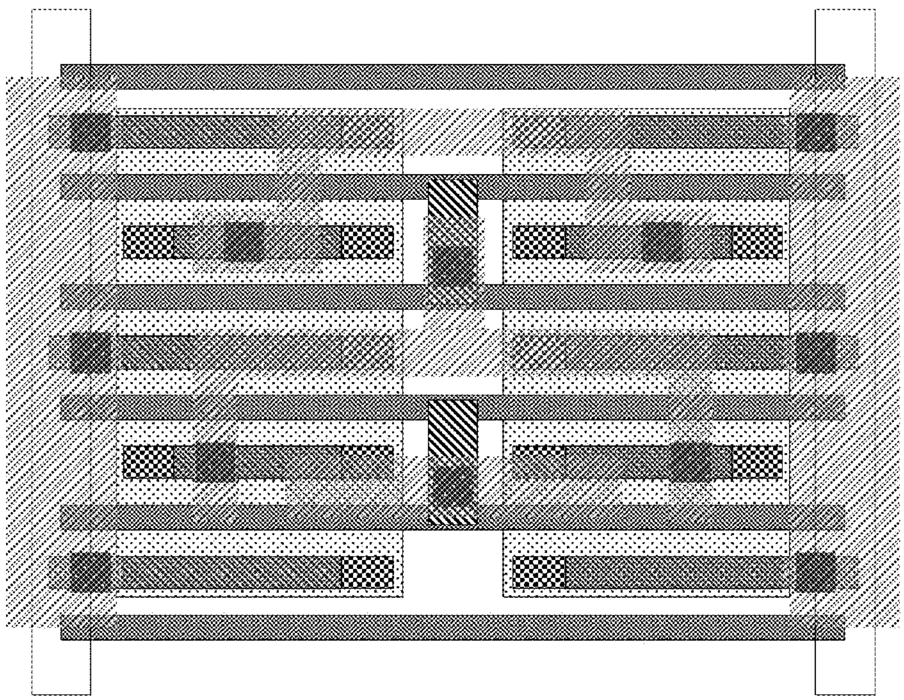
FIG. 103 depicts a BUFFXXD2 cell.

Reference is made to FIG. 103, which depicts a BUFFXXD2 cell. This is an alternative embodiment of the BUFFD2 cell.

Figure 104:
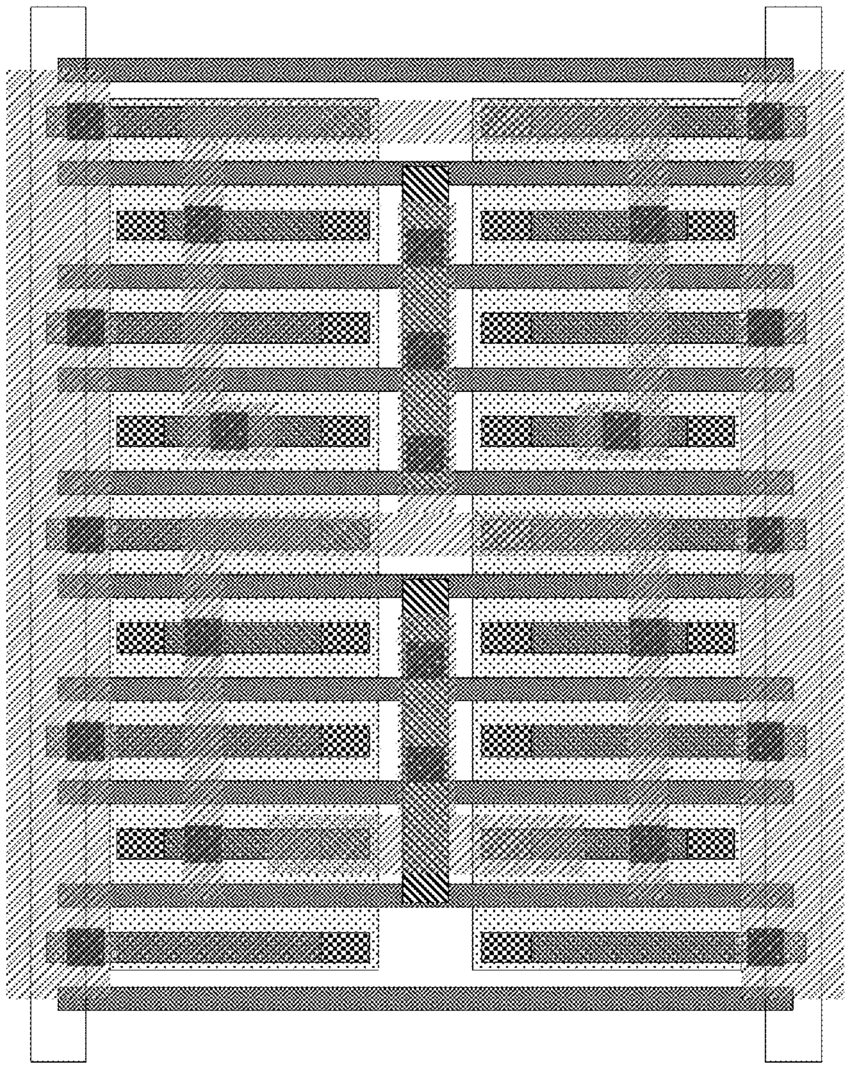
FIG. 104 depicts a BUFFXXD4 cell.

Reference is made to FIG. 104, which depicts a BUFFXXD4 cell. This is an alternative embodiment of the BUFFD4 cell.

Figure 105:
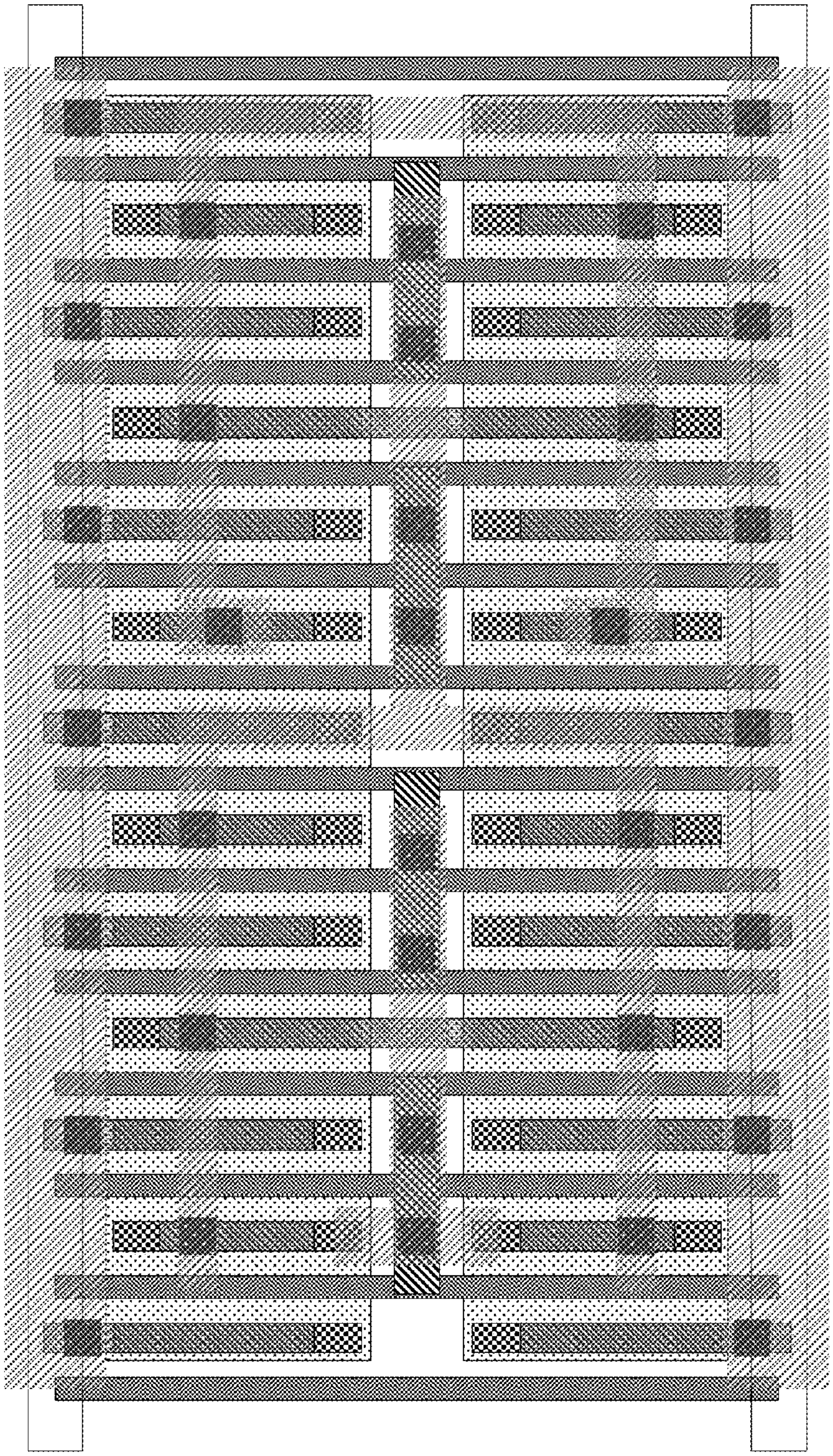
FIG. 105 depicts a BUFFXXD6 cell.

Reference is made to FIG. 105, which depicts a BUFFXXD6 cell. This is an alternative embodiment of the BUFFD6 cell.

Reference is made to FIG. 106, which depicts a CKAN2D0P5 cell. This clock cell implements the logic function and(A,B) in drive strength 0.5.

Figure 107:
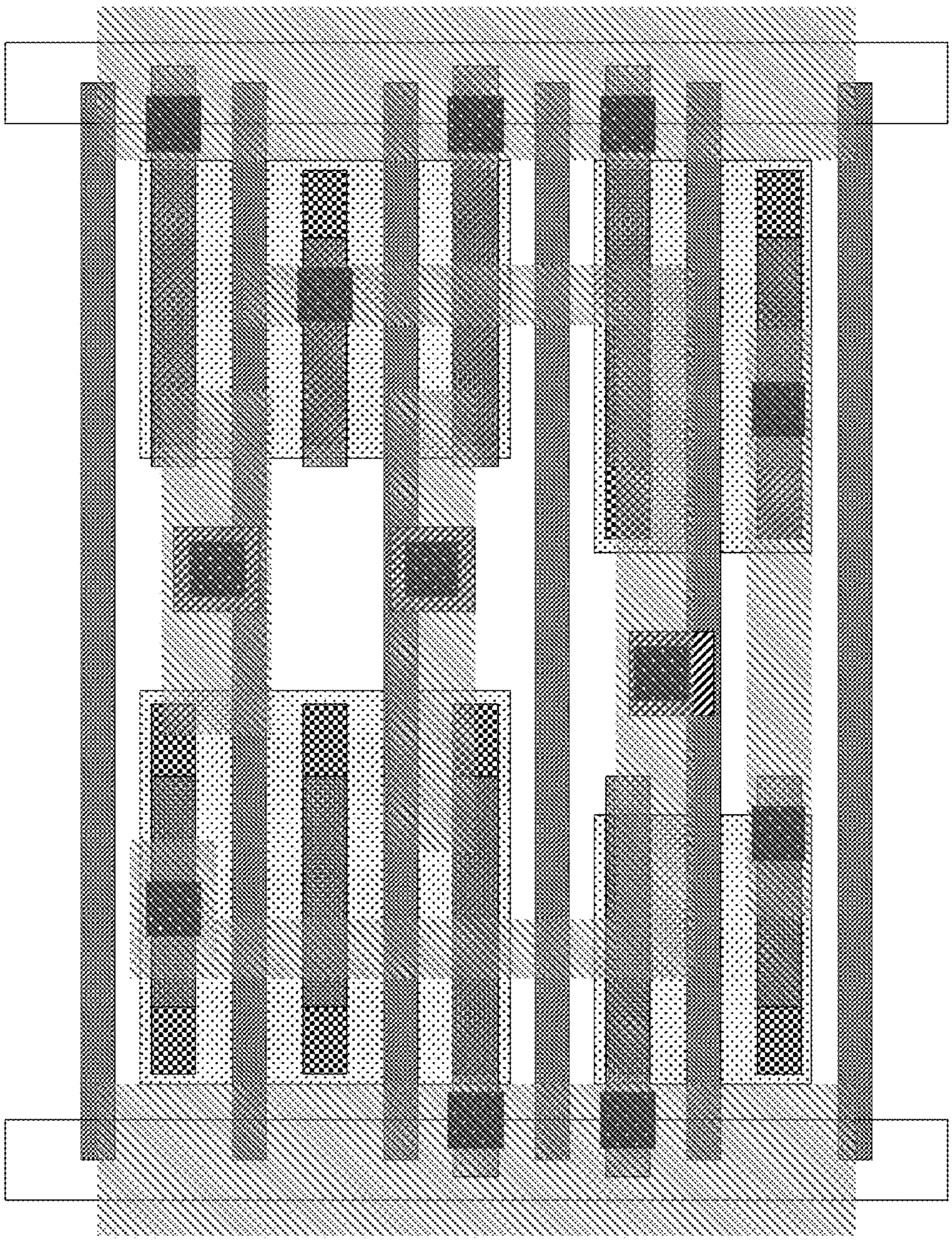
FIG. 107 depict a CKAN2D1 cell.

Reference is made to FIG. 107, which depict a CKAN2D1 cell. This clock cell implements the logic function and(A,B) in drive strength 1.

Figure 108:
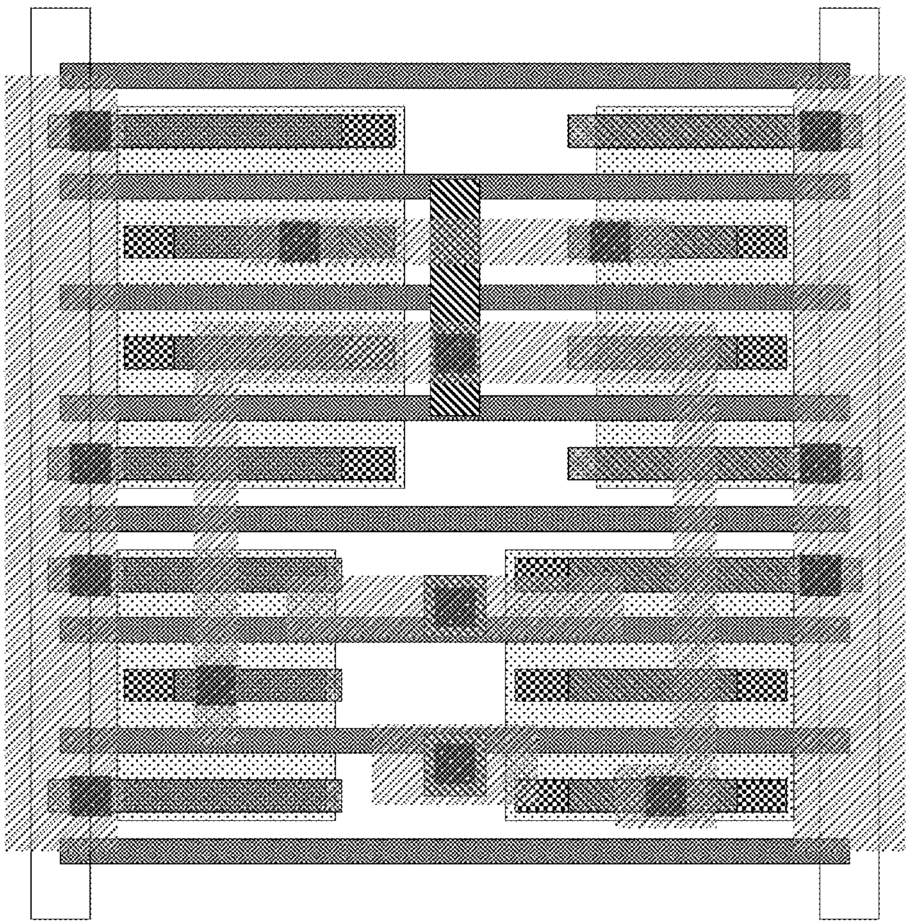
FIG. 108 depicts a CKAN2D1P5 cell.

Reference is made to FIG. 108, which depicts a CKAN2D1P5 cell. This clock cell implements the logic function and(A,B) in drive strength 1.5.

Figure 109:
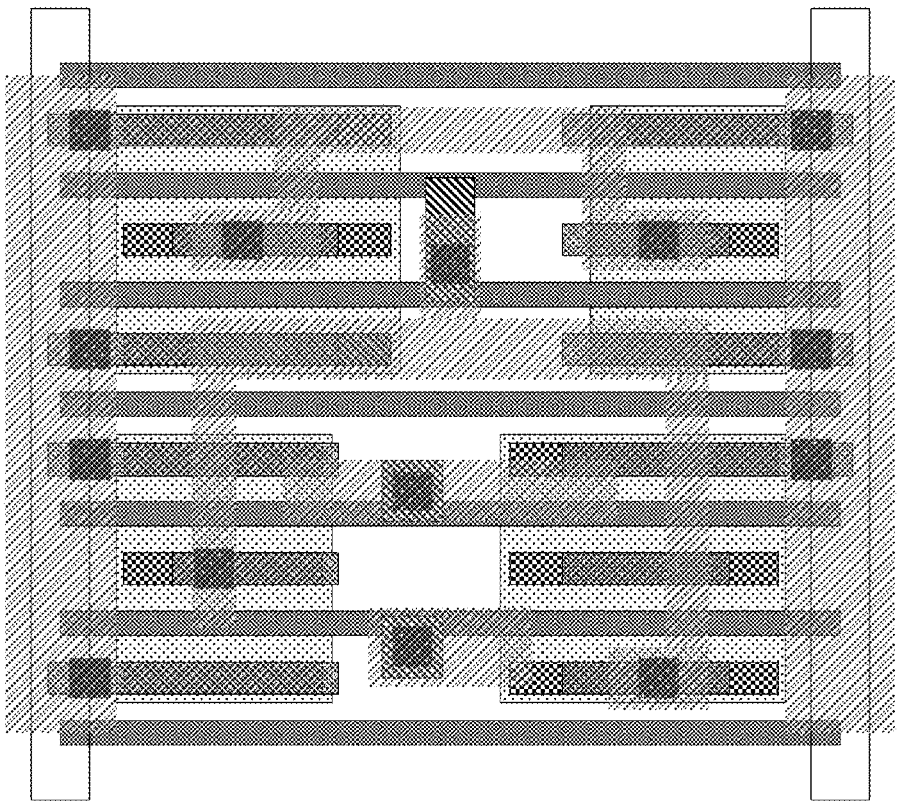
FIG. 109 depicts a CKAN2D2 cell.

Reference is made to FIG. 109, which depicts a CKAN2D2 cell. This clock cell implements the logic function and(A,B) in drive strength 2.

Figure 110:
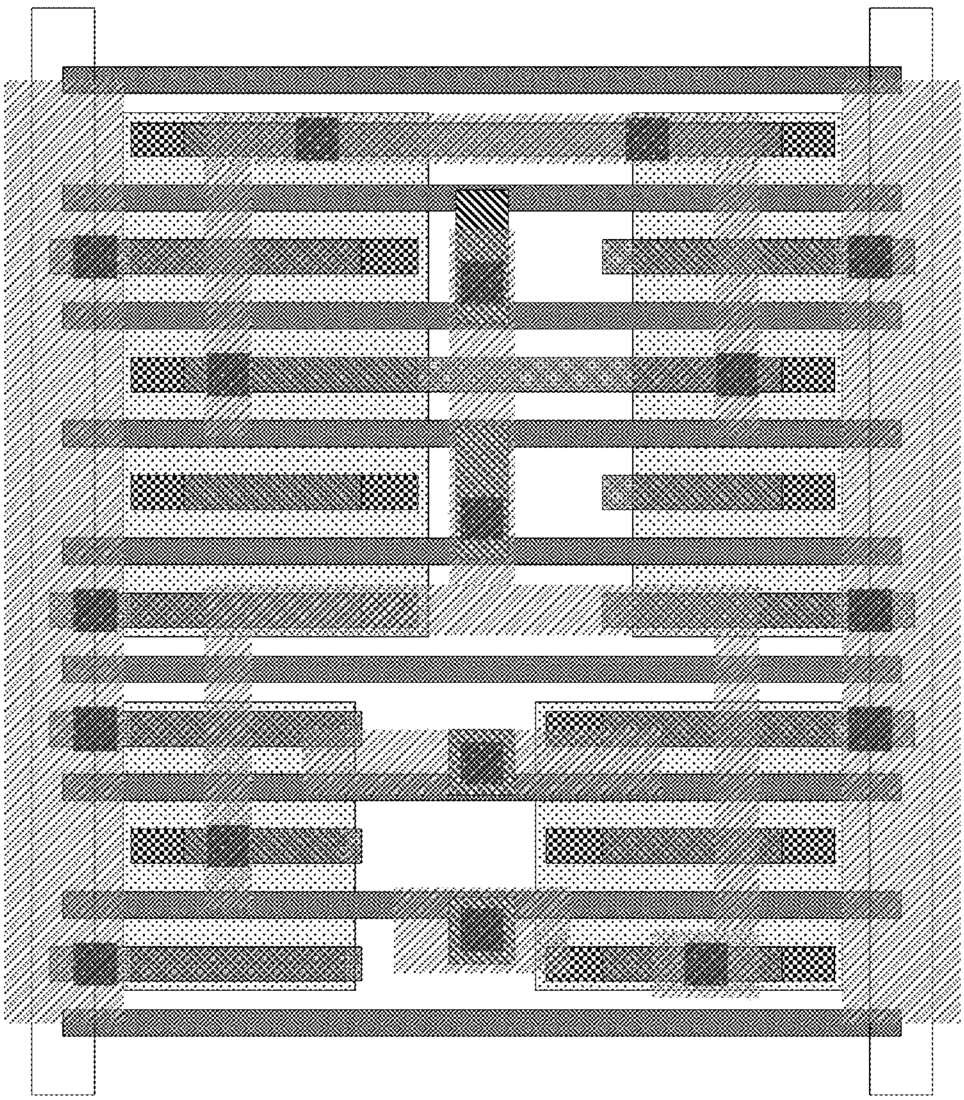
FIG. 110 depicts a CKAN2D2P5 cell.

Reference is made to FIG. 110, which depicts a CKAN2D2P5 cell. This clock cell implements the logic function and(A,B) in drive strength 2.5.

Figure 111:
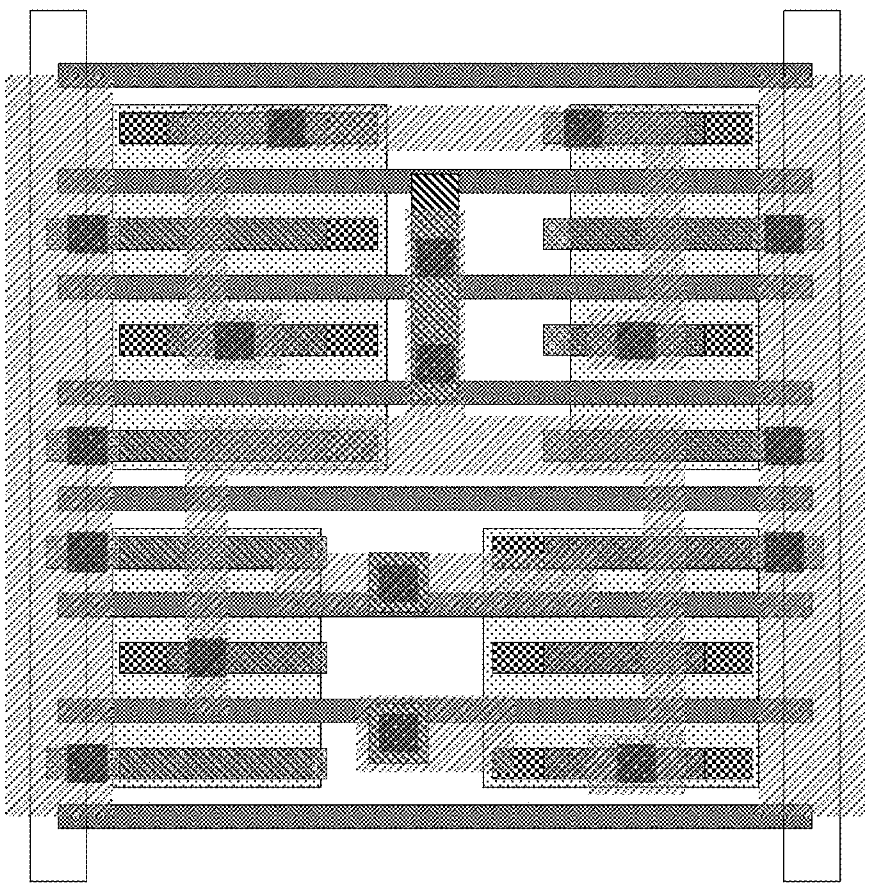
FIG. 111 depicts a CKAN2D3 cell.

Reference is made to FIG. 111, which depicts a CKAN2D3 cell. This clock cell implements the logic function and(A,B) in drive strength 3.

Figure 112:
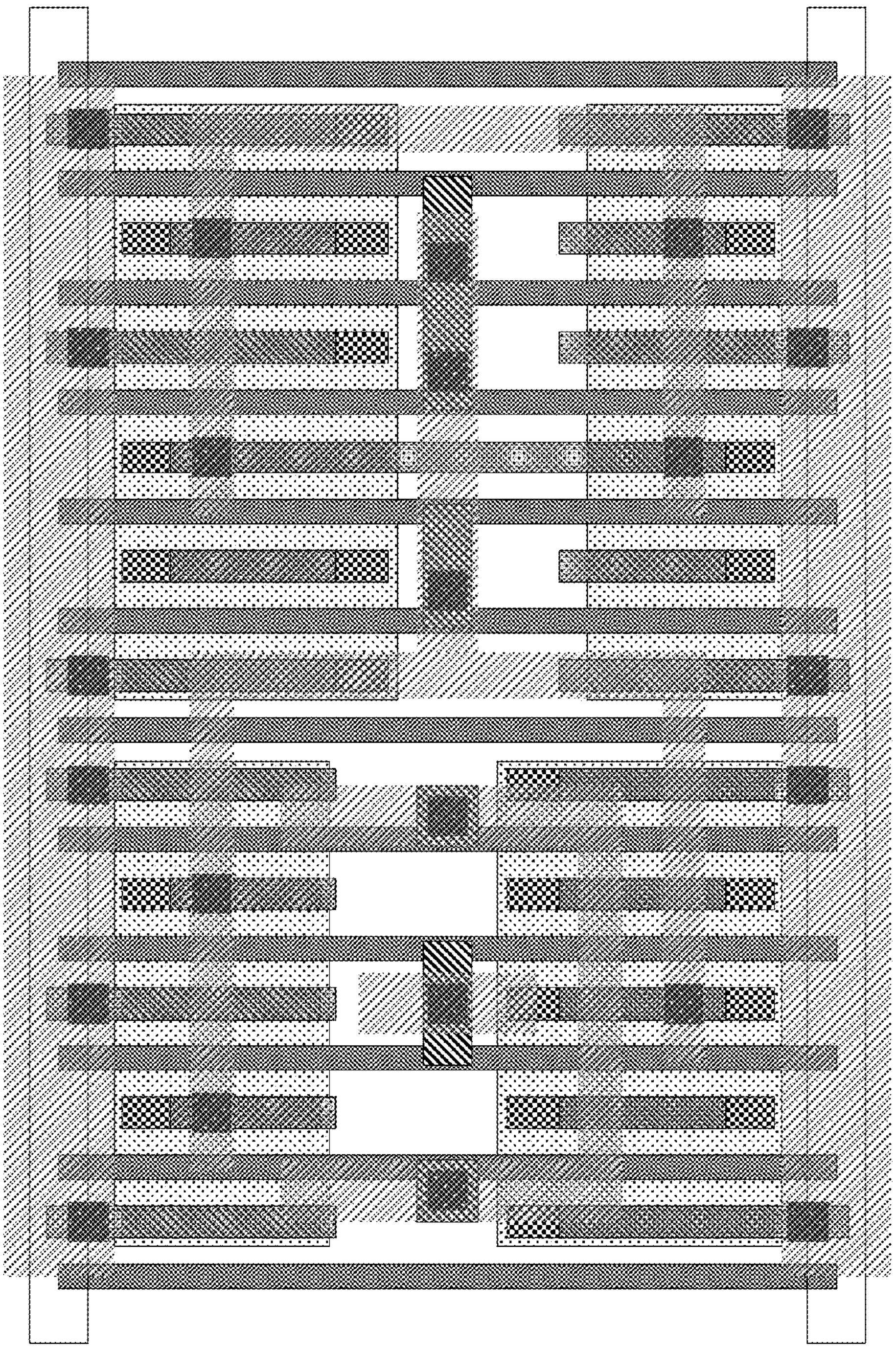
FIG. 112 depicts a CKAN2D3P5 cell.

Reference is made to FIG. 112, which depicts a CKAN2D3P5 cell. This clock cell implements the logic function and(A,B) in drive strength 3.5.

Figure 113:
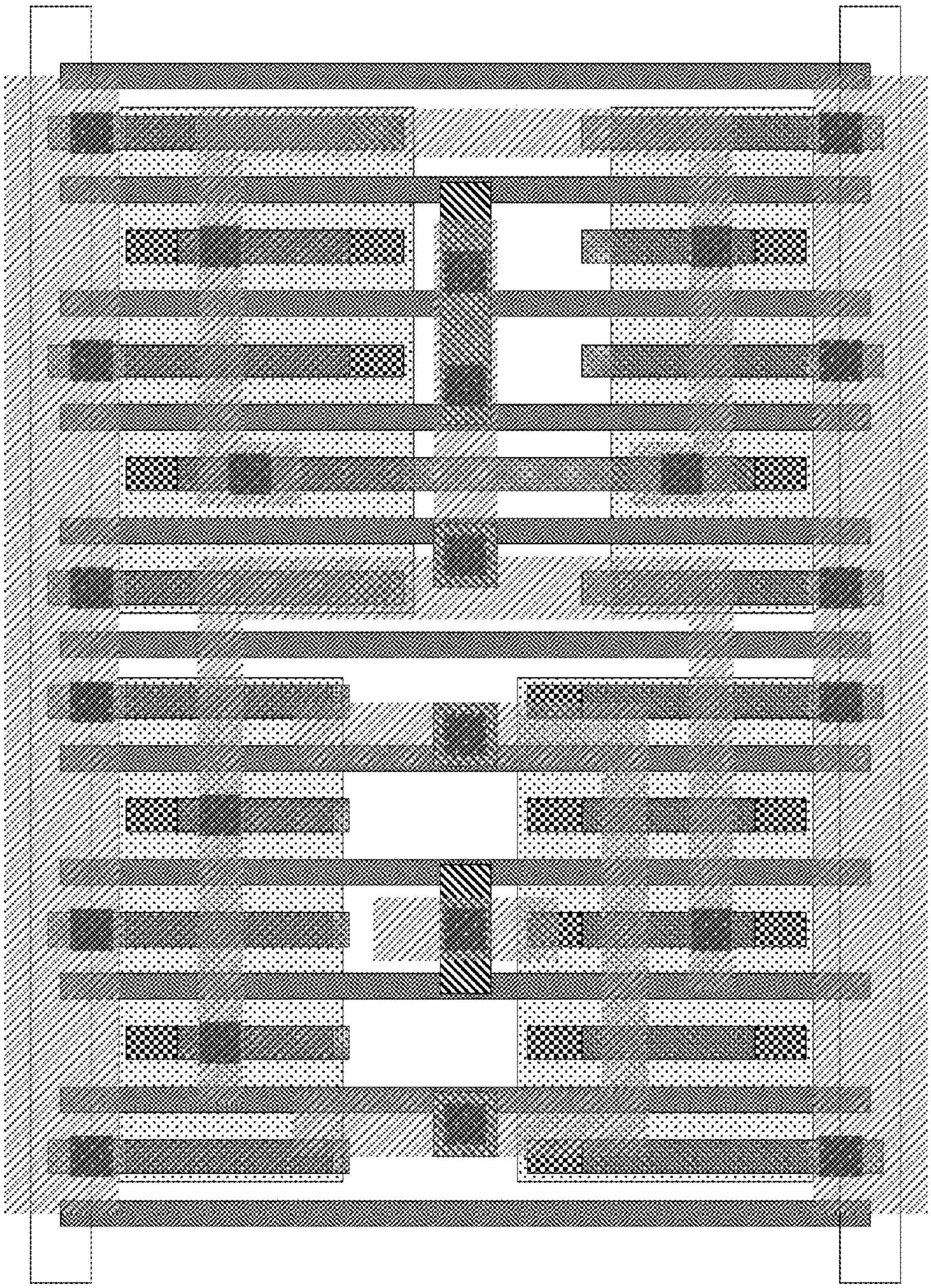
FIG. 113 depicts a CKAN2D4 cell.

Reference is made to FIG. 113, which depicts a CKAN2D4 cell. This clock cell implements the logic function and(A,B) in drive strength 4.

Figure 114:
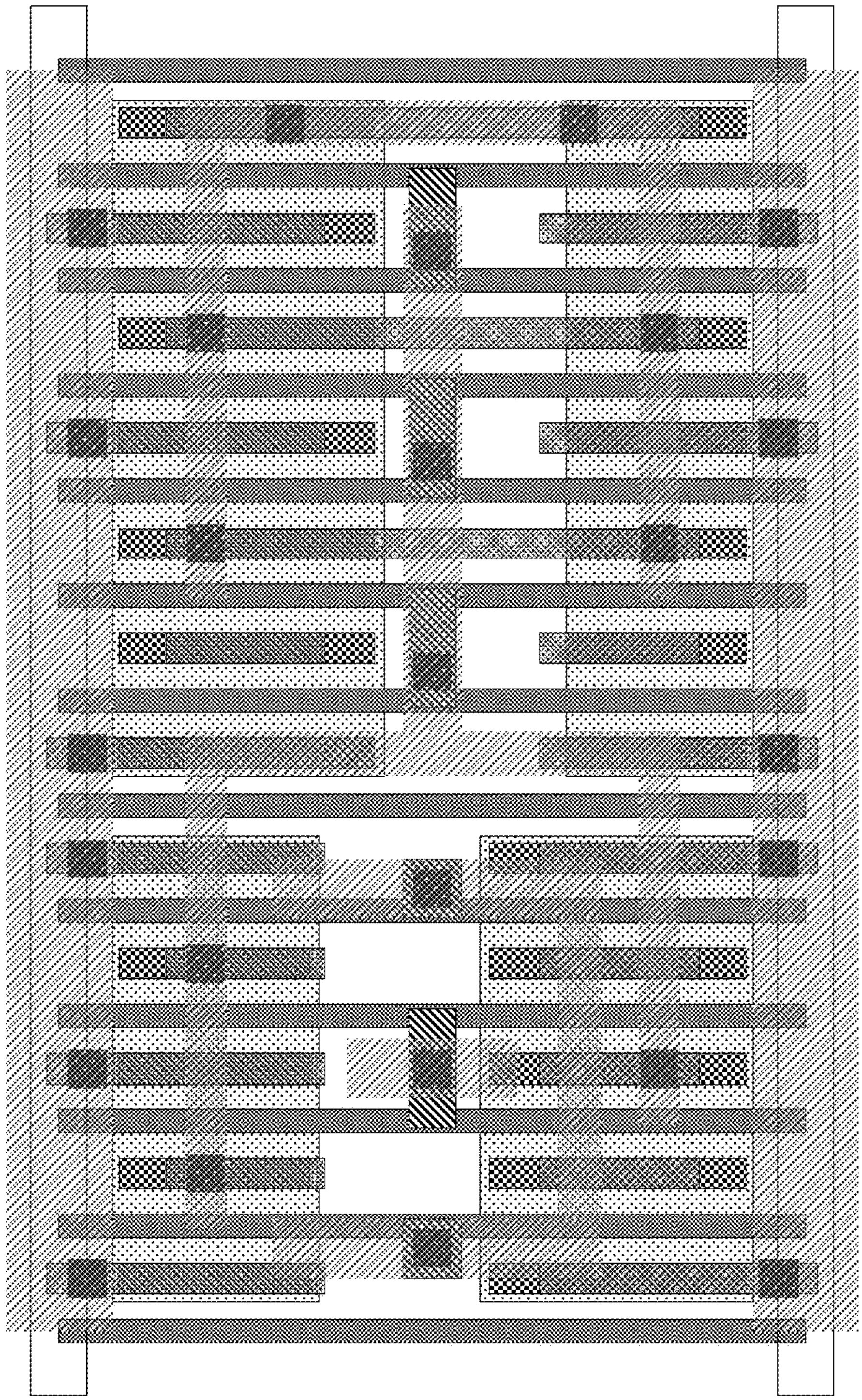
FIG. 114 depicts a CKAN2D4P5 cell.

Reference is made to FIG. 114, which depicts a CKAN2D4P5 cell. This clock cell implements the logic function and(A,B) in drive strength 4.5.

Figure 115:
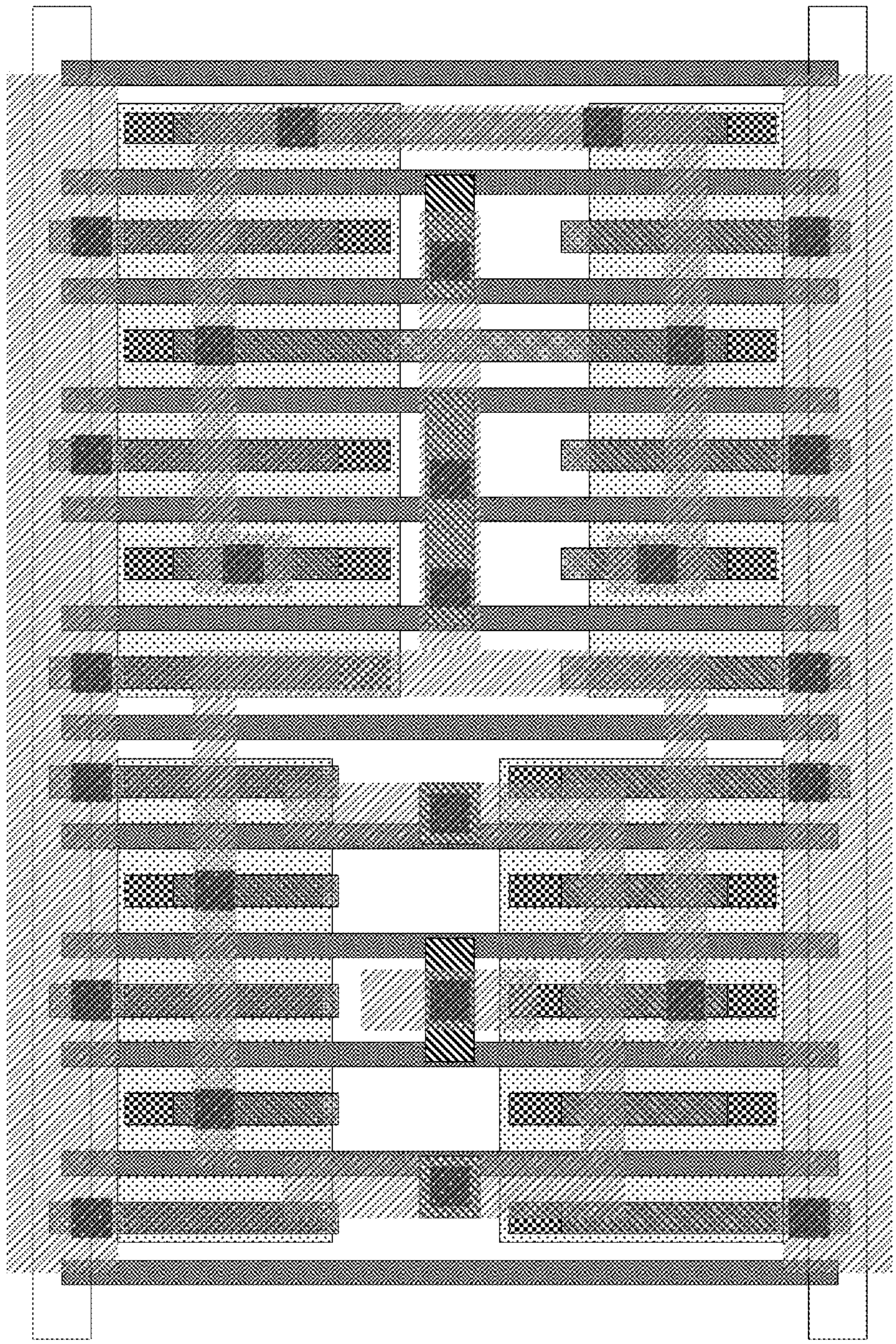
FIG. 115 depicts a CKAN2D5 cell.

Reference is made to FIG. 115, which depicts a CKAN2D5 cell. This clock cell implements the logic function and(A,B) in drive strength 5.

Figure 116:
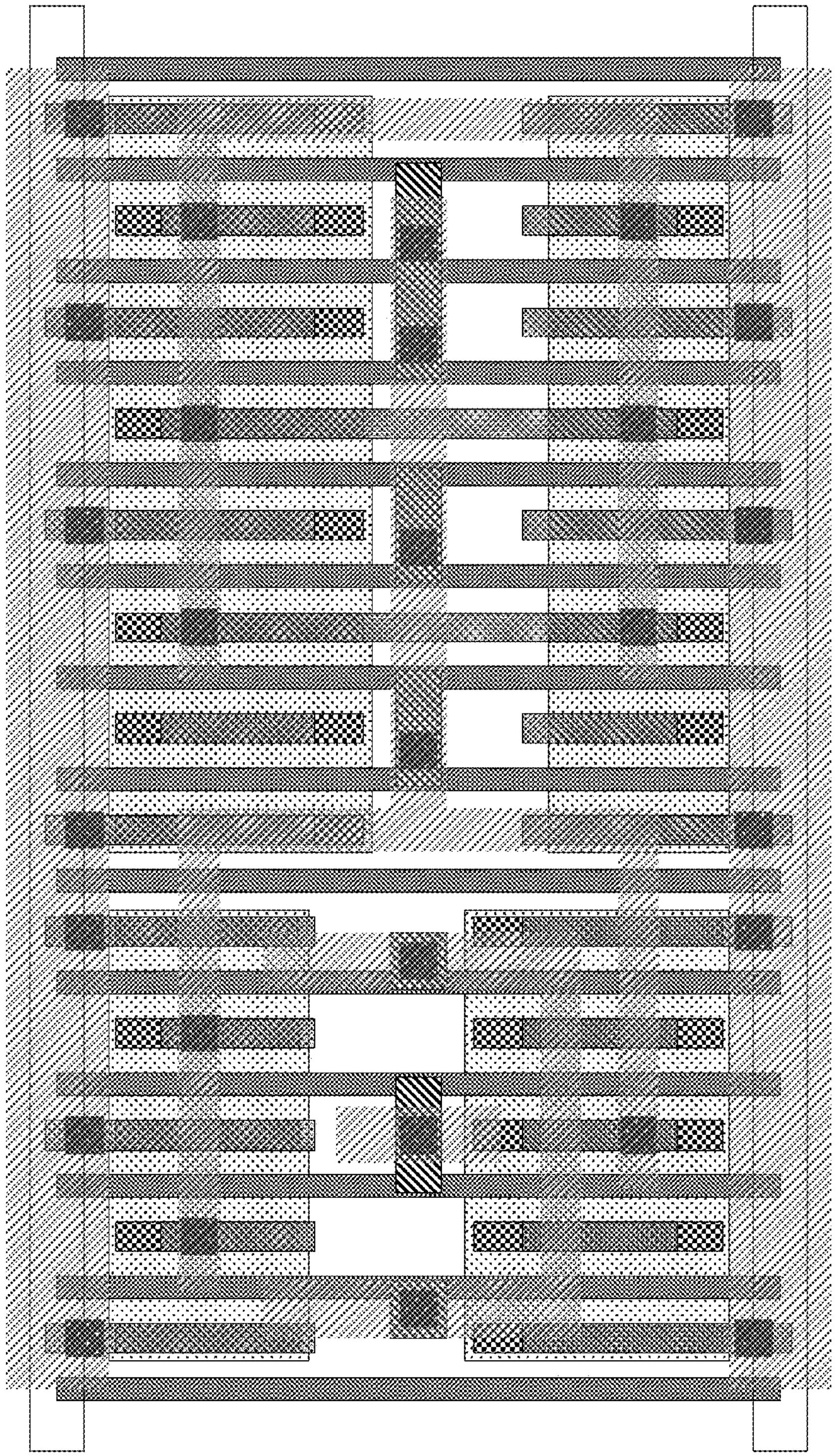
FIG. 116 depicts a CKAN2D5P5 cell.

Reference is made to FIG. 116, which depicts a CKAN2D5P5 cell. This clock cell implements the logic function and(A,B) in drive strength 5.5.

Figure 117:
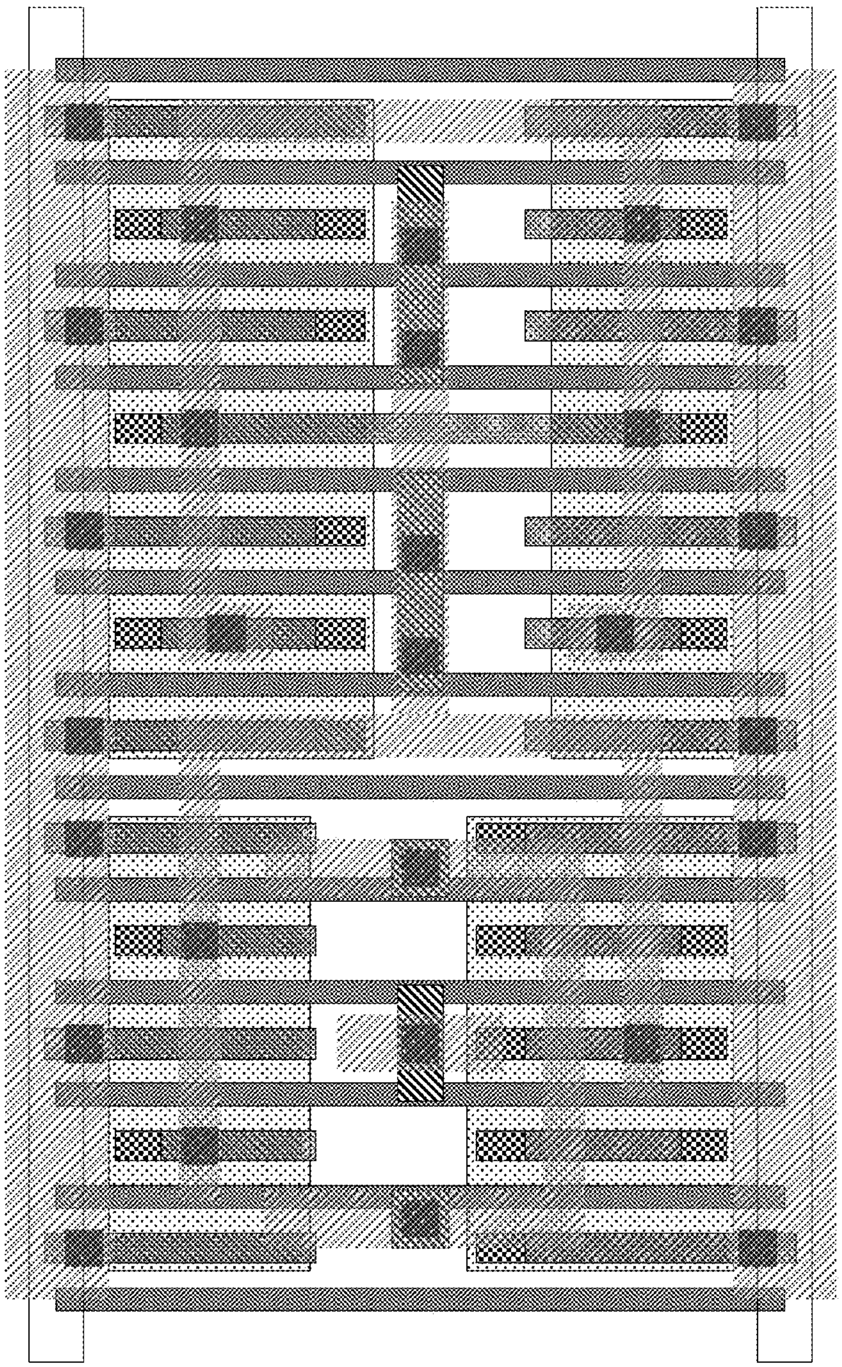
FIG. 117 depicts a CKAN2D6 cell.

Reference is made to FIG. 117, which depicts a CKAN2D6 cell. This clock cell implements the logic function and(A,B) in drive strength 6.

Figure 118:
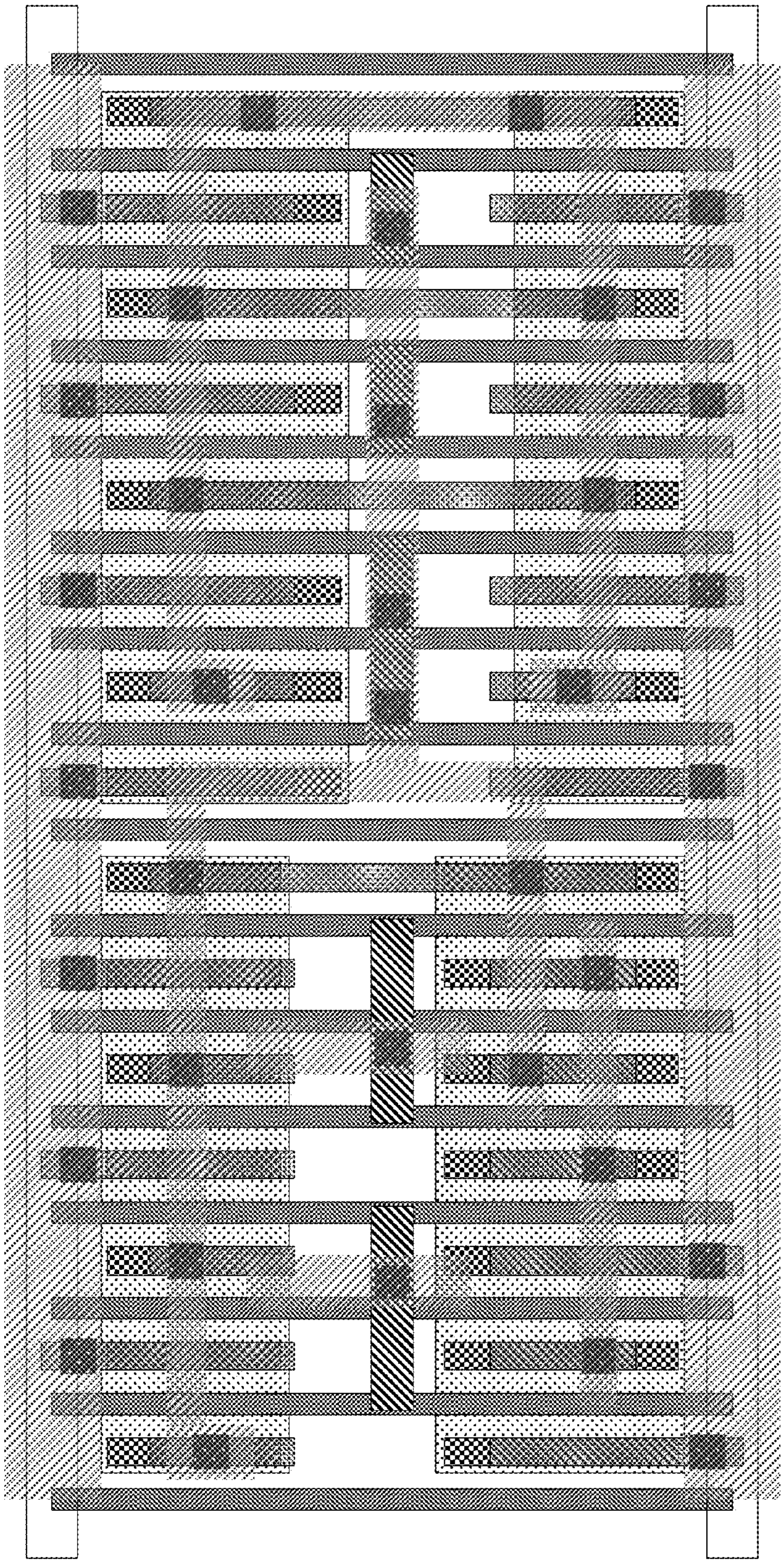
FIG. 118 depicts a CKAN2D7 cell.

Reference is made to FIG. 118, which depicts a CKAN2D7 cell. This clock cell implements the logic function and(A,B) in drive strength 7.

Figure 119:
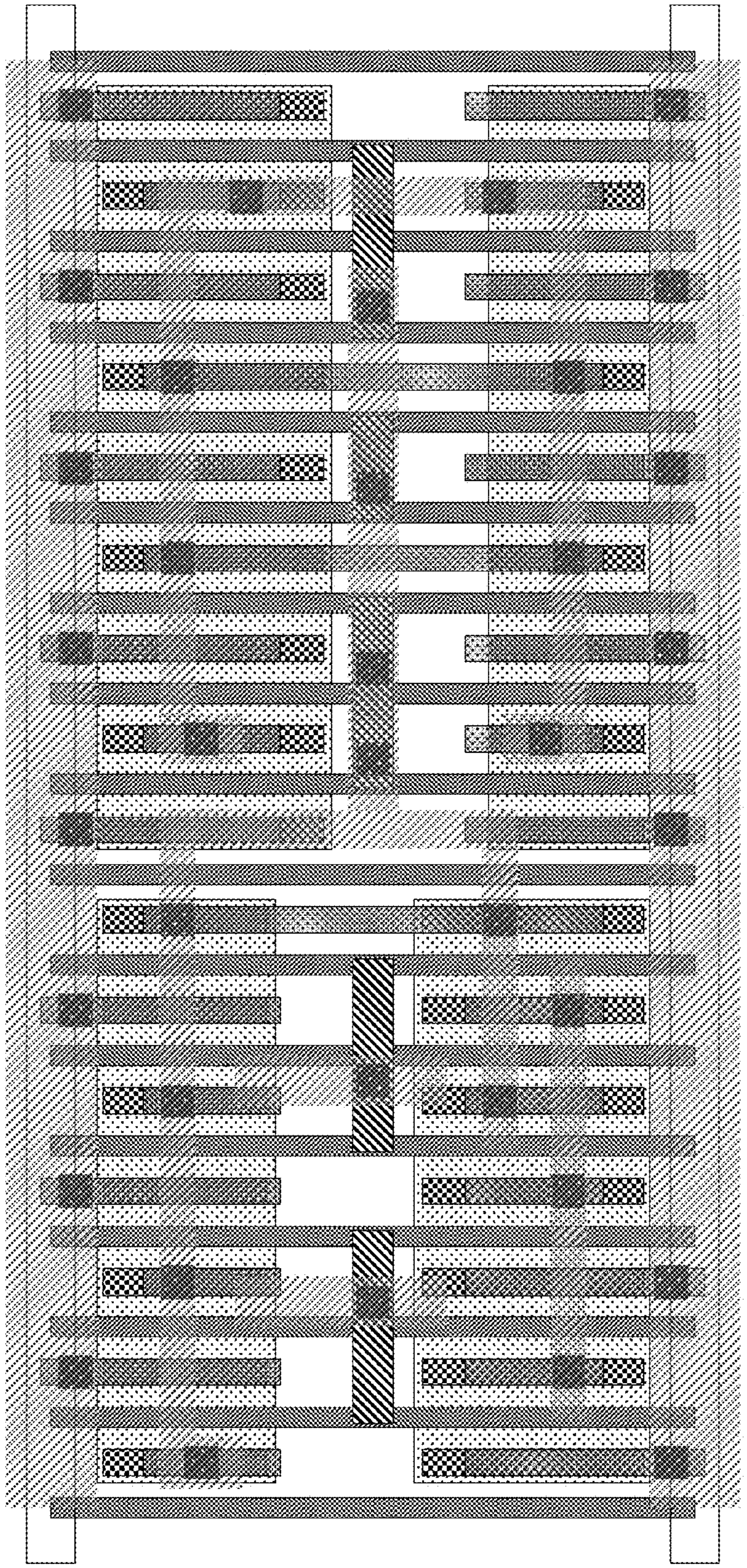
FIG. 119 depicts a CKAN2D8 cell.

Reference is made to FIG. 119, which depicts a CKAN2D8 cell. This clock cell implements the logic function and(A,B) in drive strength 8.

Figure 120:
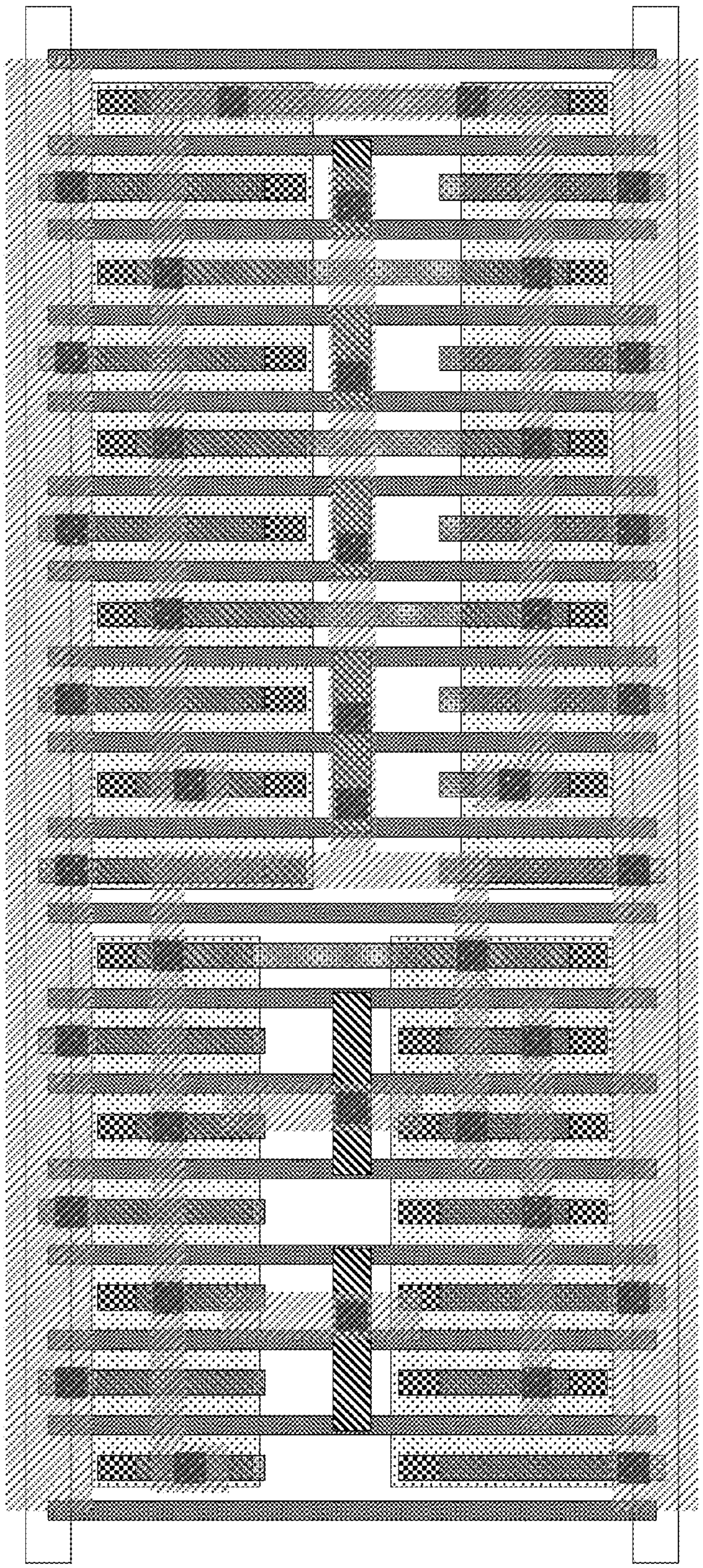
FIG. 120 depicts a CKAN2D9 cell.

Reference is made to FIG. 120, which depicts a CKAN2D9 cell. This clock cell implements the logic function and(A,B) in drive strength 9.

Figure 121:
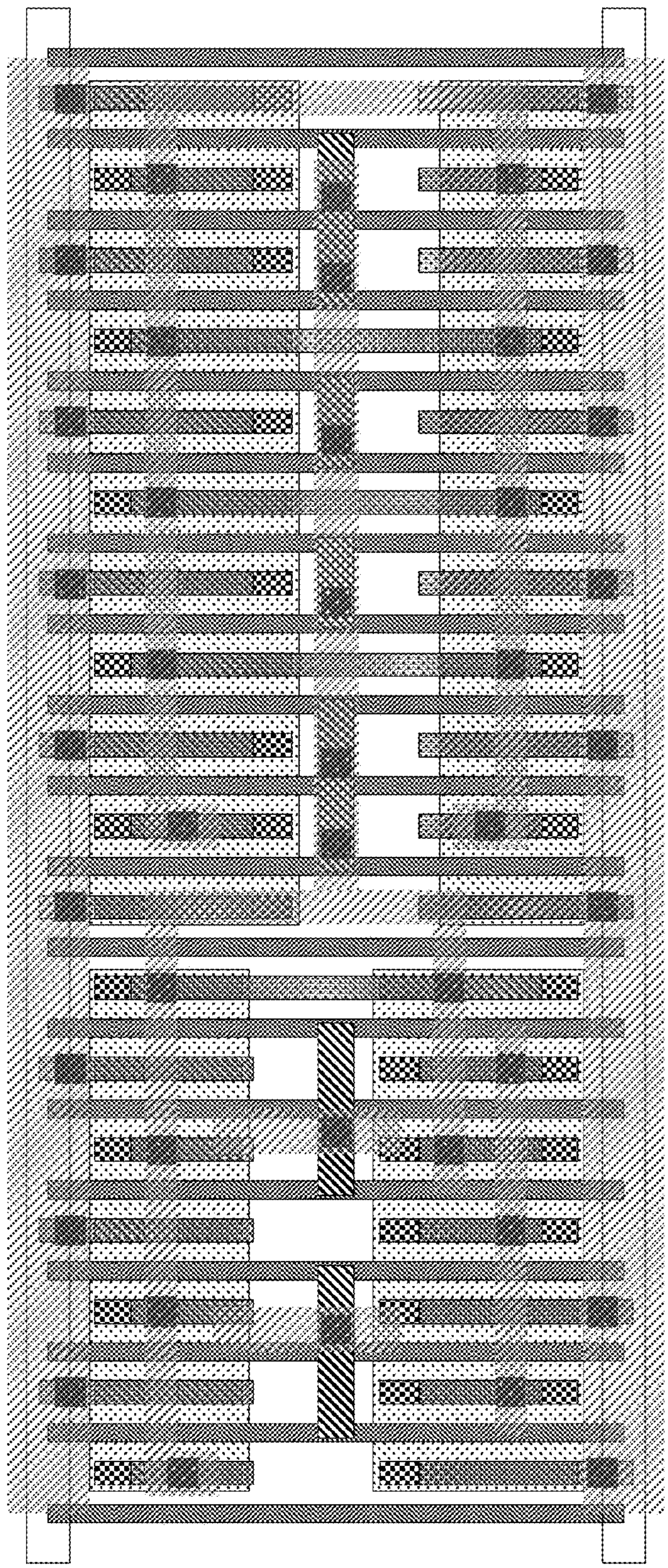
FIG. 121 depicts a CKAN2D10 cell.

Reference is made to FIG. 121, which depicts a CKAN2D10 cell. This clock cell implements the logic function and(A,B) in drive strength 10.

Figure 122:
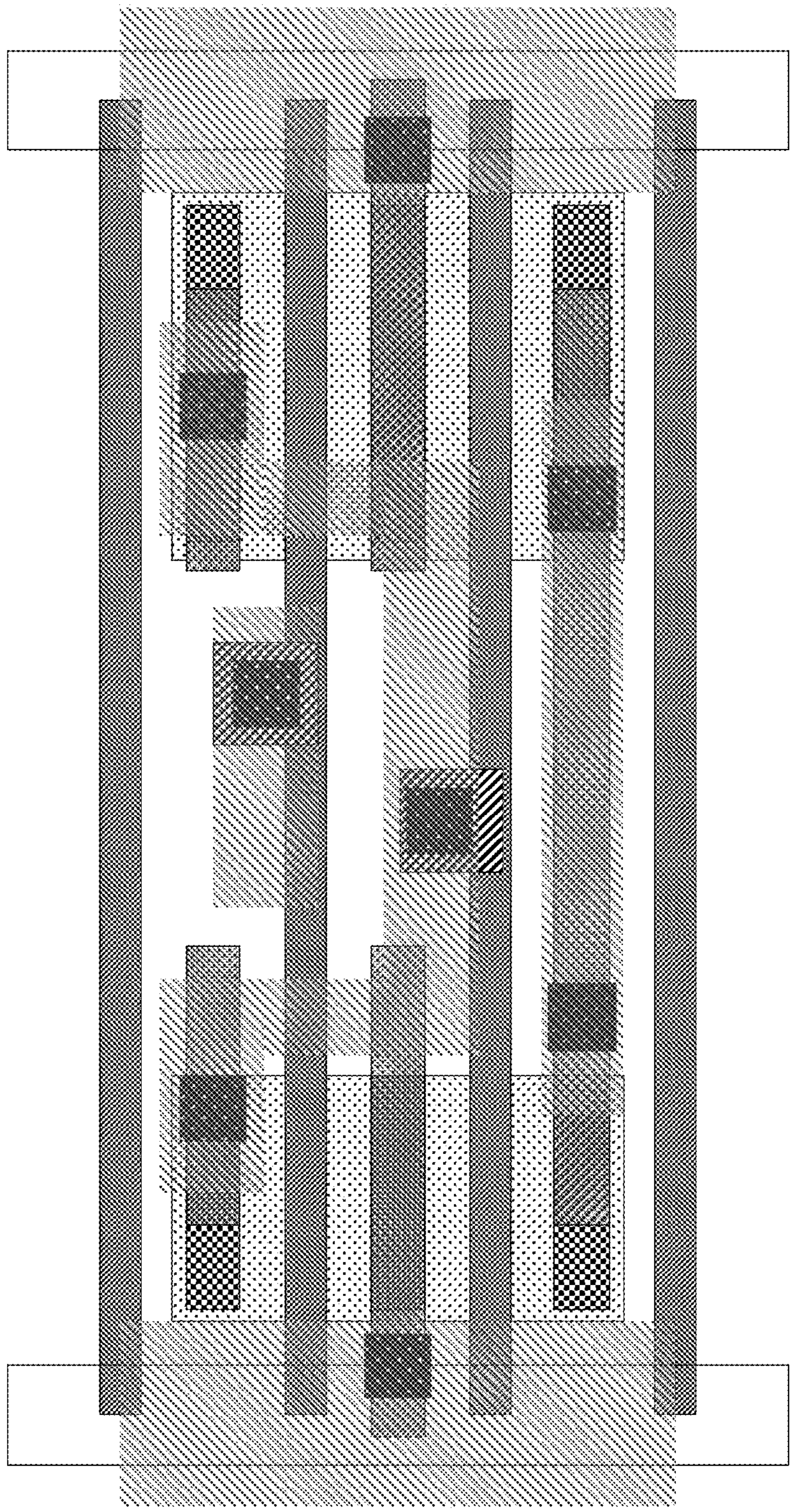
FIG. 122 depicts a CKBD0P5 cell.

Reference is made to FIG. 122, which depicts a CKBD0P5 cell. This clock cell implements the logical buffering function in drive strength 0.5.

Figure 123:
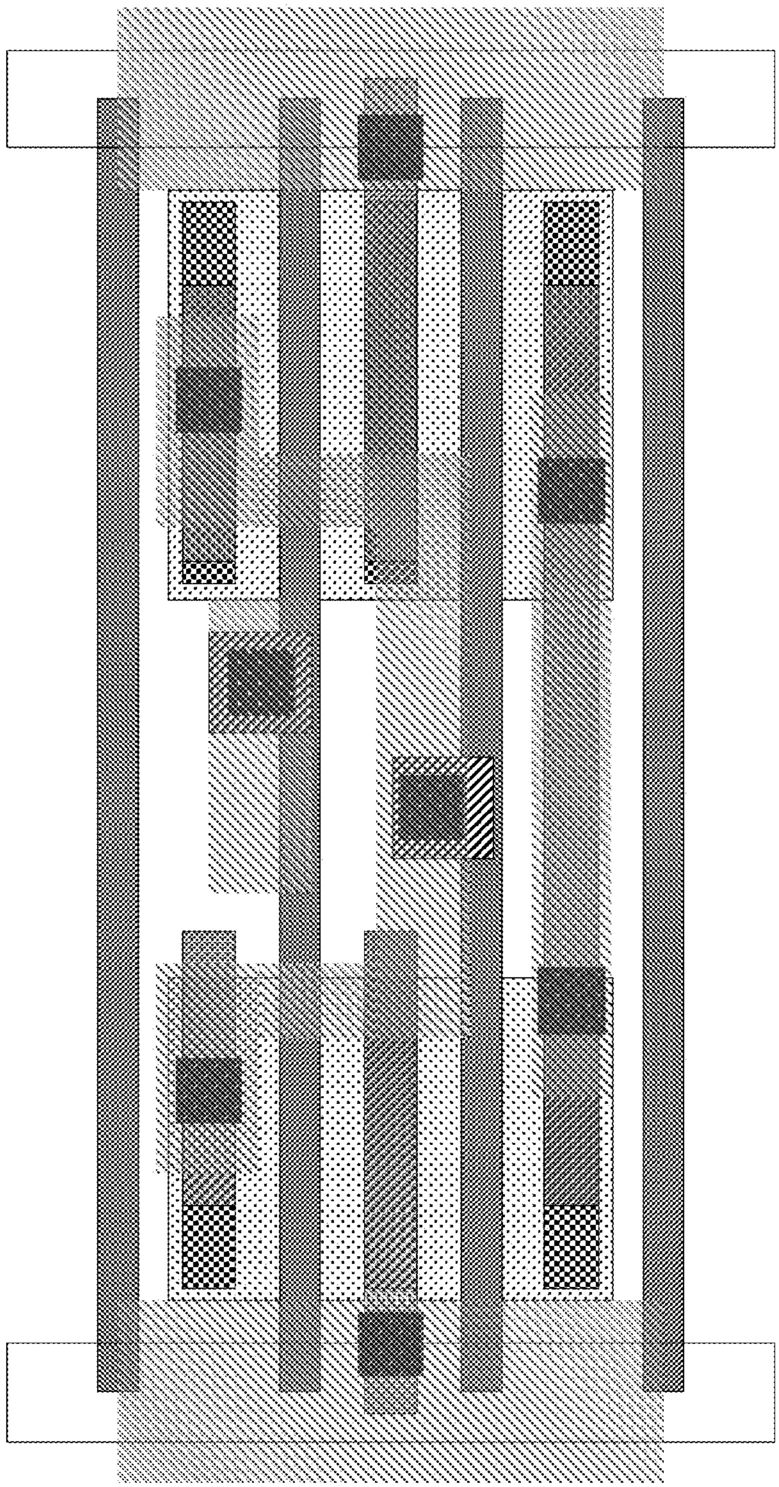
FIG. 123 depicts a CKBD1 cell.

Reference is made to FIG. 123, which depicts a CKBD1 cell. This clock cell implements the logical buffering function in drive strength 1.

Figure 124:
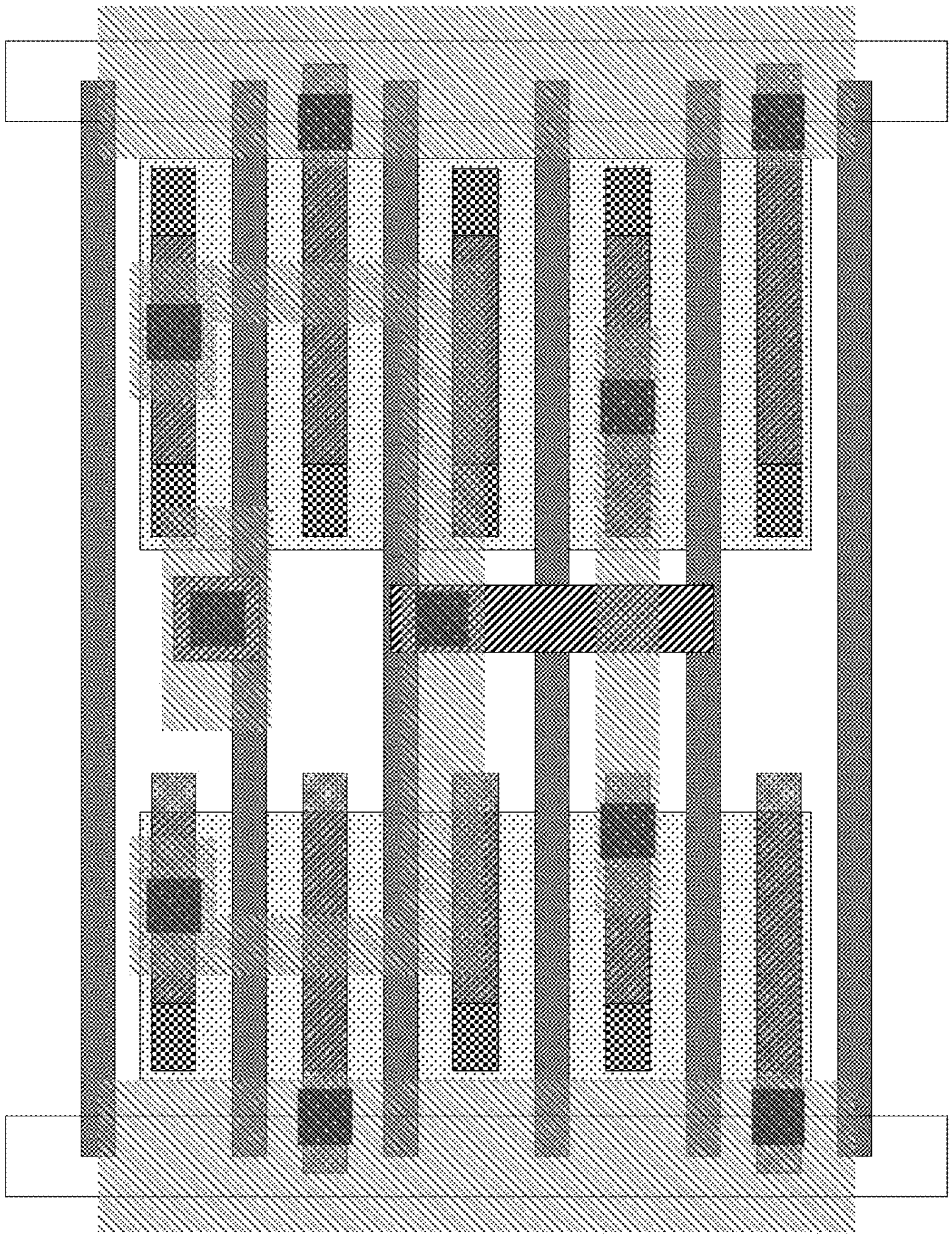
FIG. 124 depicts a CKBD1P5 cell.

Reference is made to FIG. 124, which depicts a CKBD1P5 cell. This clock cell implements the logical buffering function in drive strength 1.5.

Figure 125:
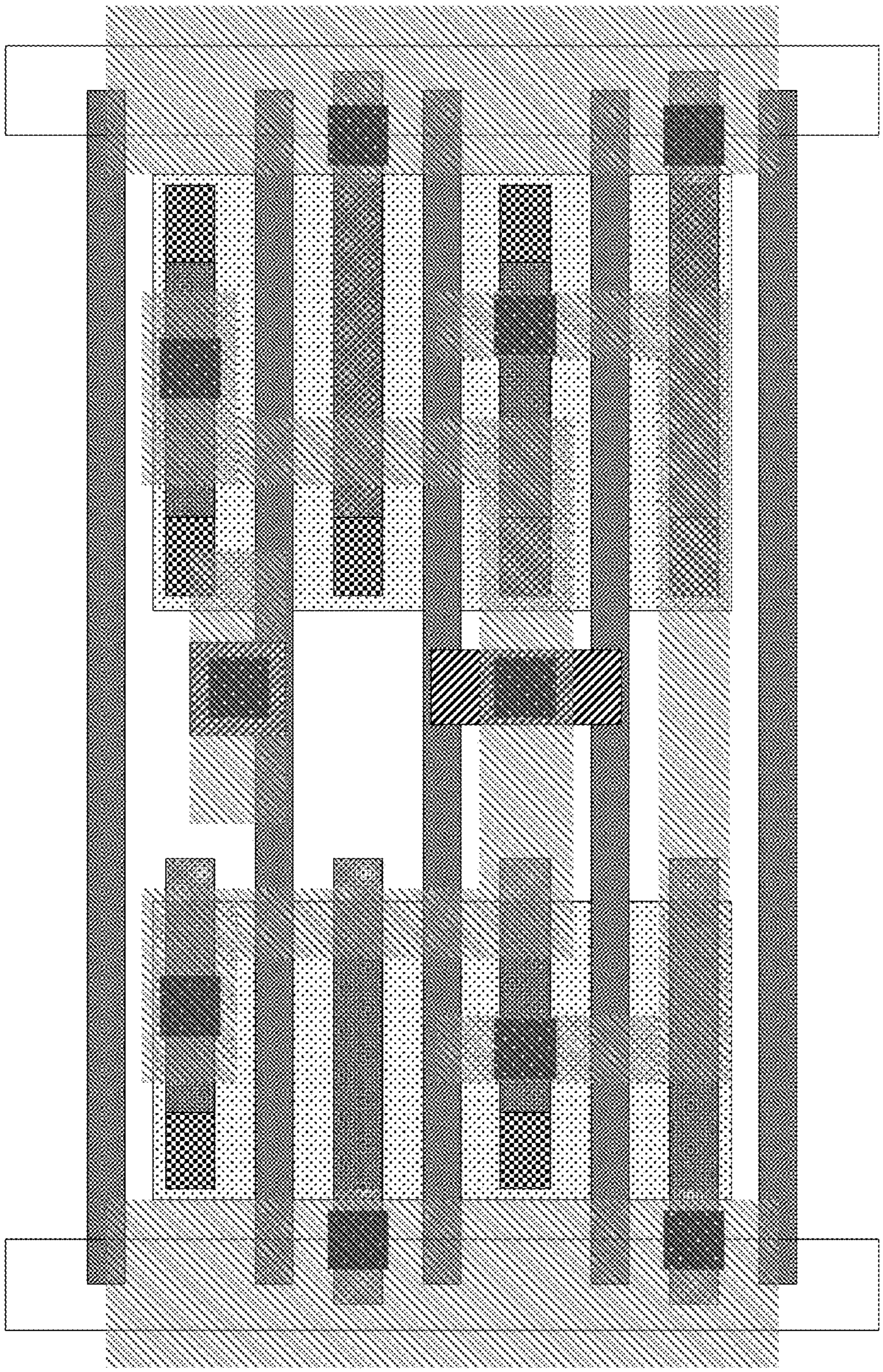
FIG. 125 depicts a CKBD2 cell.

Reference is made to FIG. 125, which depicts a CKBD2 cell. This clock cell implements the logical buffering function in drive strength 2.

Figure 126:
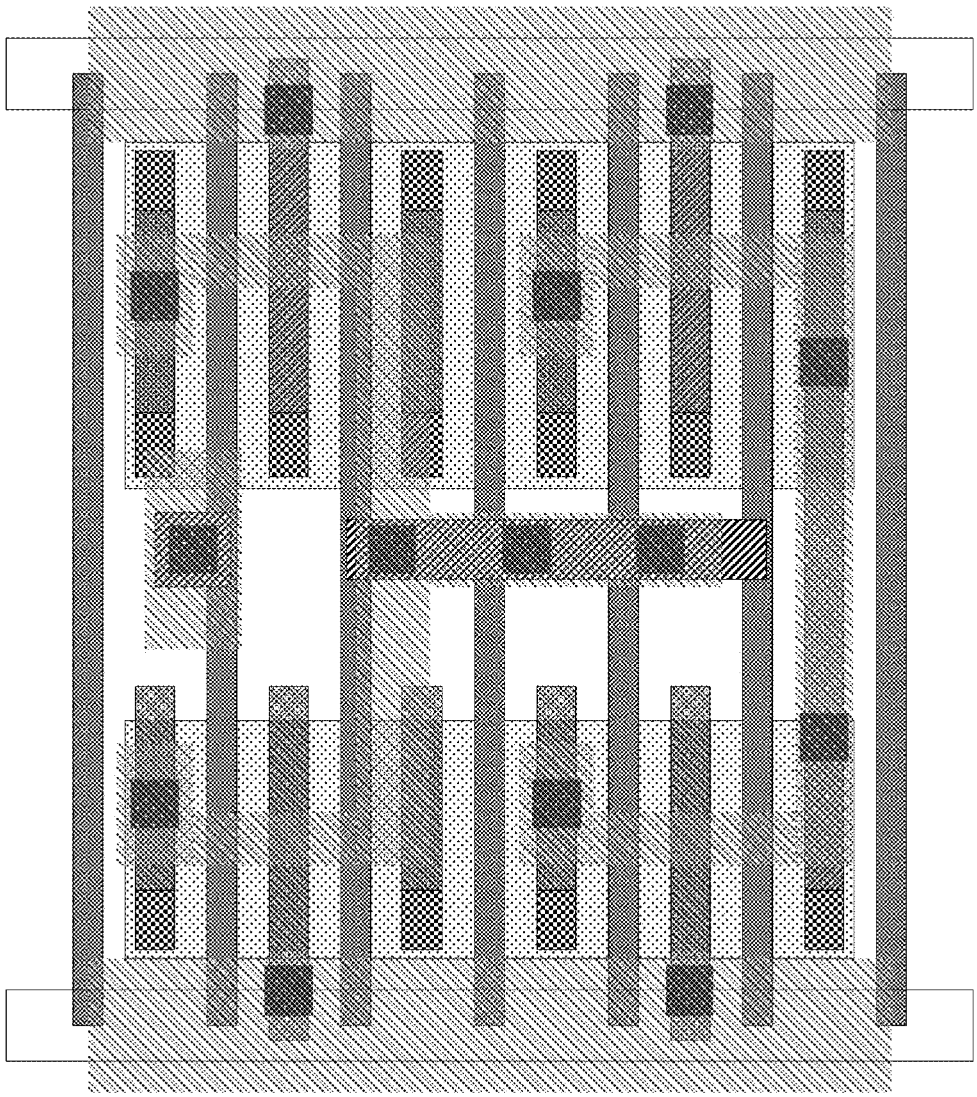
FIG. 126 depicts a CKBD2P5 cell.

Reference is made to FIG. 126, which depicts a CKBD2P5 cell. This clock cell implements the logical buffering function in drive strength 2.5.

Figure 127:
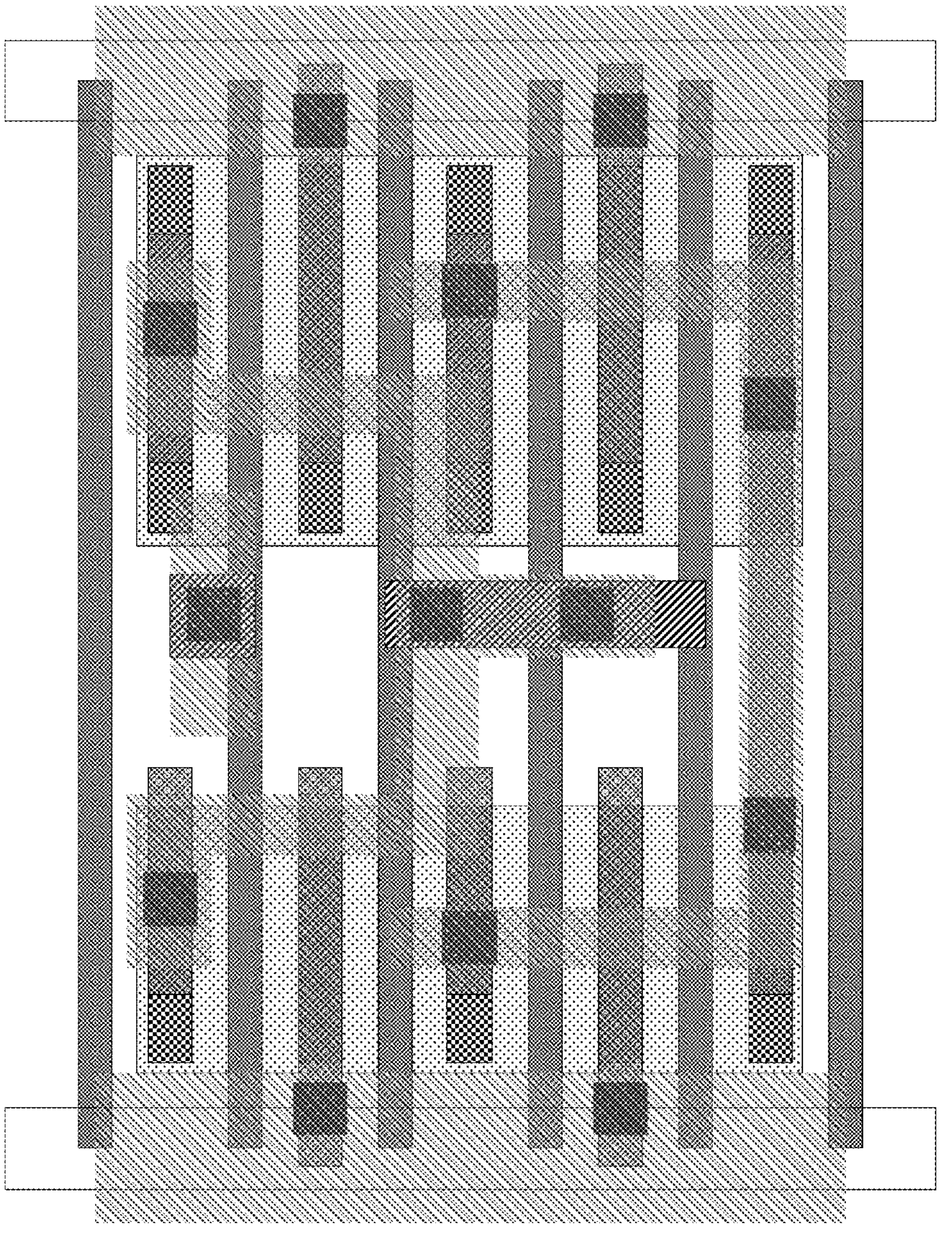
FIG. 127 depicts a CKBD3 cell.

Reference is made to FIG. 127, which depicts a CKBD3 cell. This clock cell implements the logical buffering function in drive strength 3.

Figure 128:
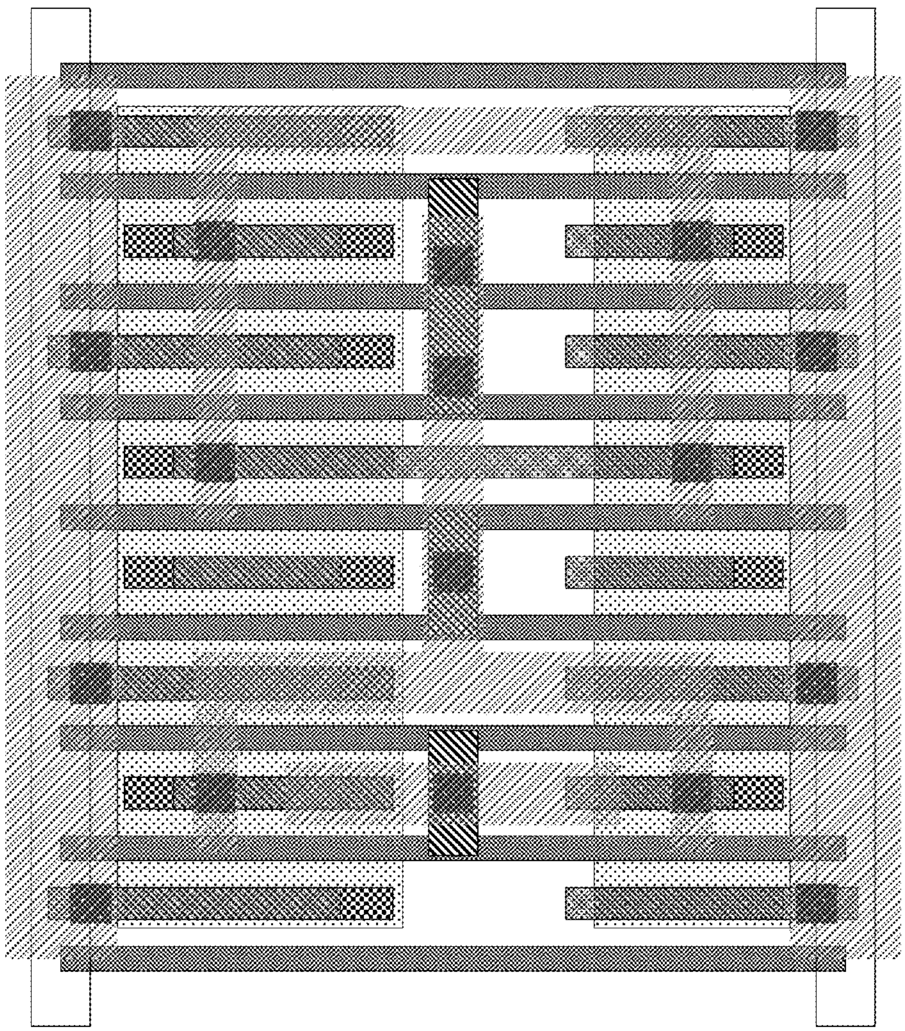
FIG. 128 depicts a CKBD3P5 cell.

Reference is made to FIG. 128, which depicts a CKBD3P5 cell. This clock cell implements the logical buffering function in drive strength 3.5.

Figure 129:
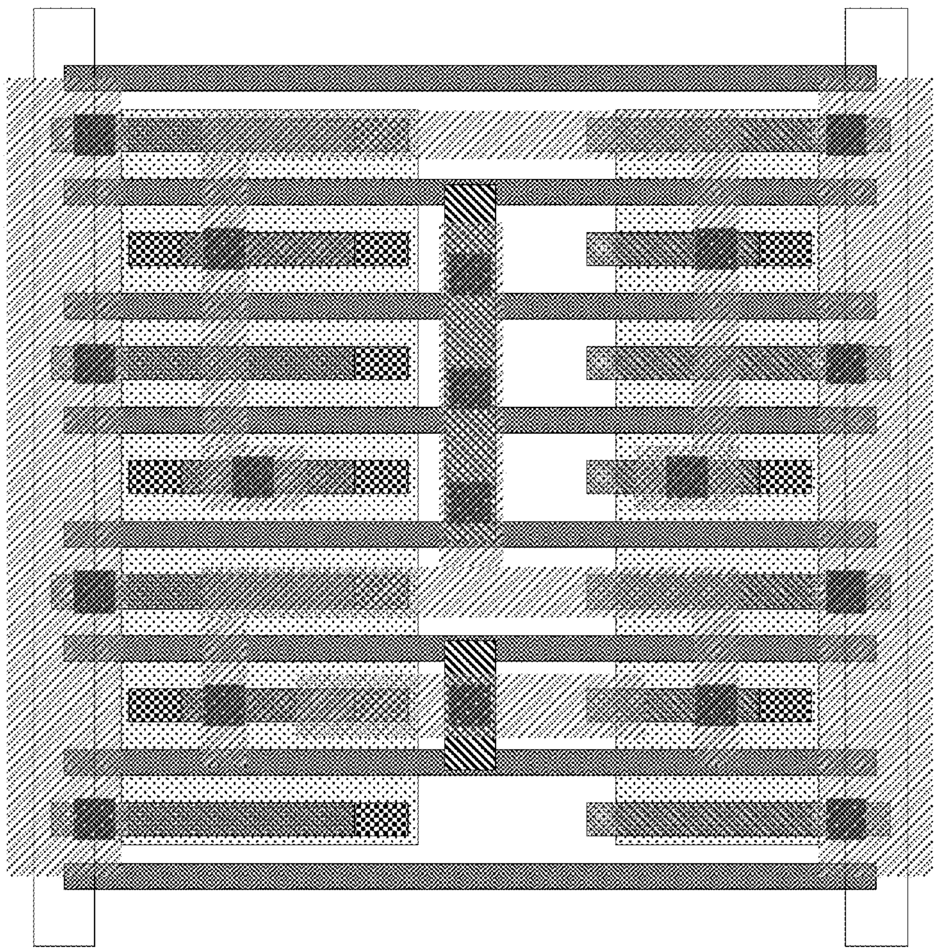
FIG. 129 depicts a CKBD4 cell.

Reference is made to FIG. 129, which depicts a CKBD4 cell. This clock cell implements the logical buffering function in drive strength 4.

Figure 130:
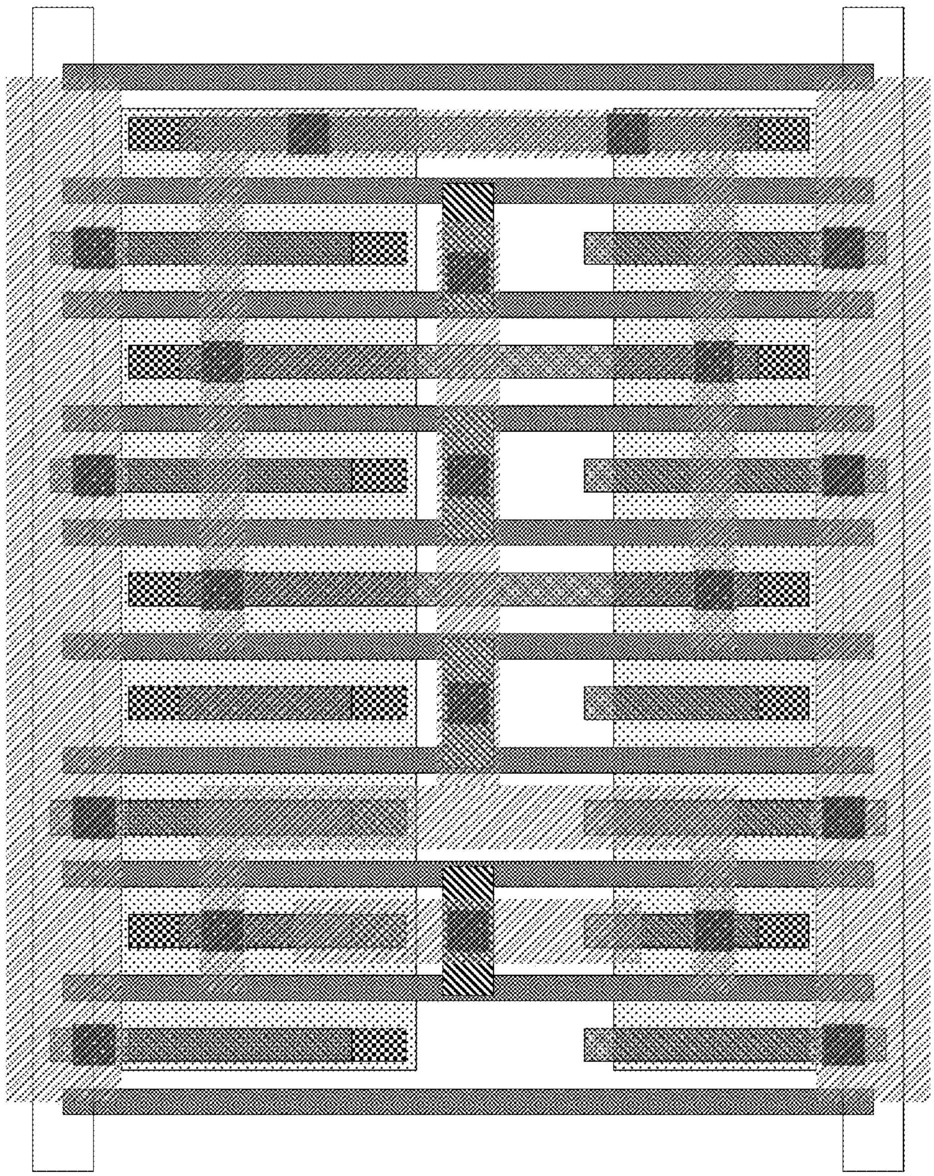
FIG. 130 depicts a CKBD4P5 cell.

Reference is made to FIG. 130, which depicts a CKBD4P5 cell. This clock cell implements the logical buffering function in drive strength 4.5.

Figure 131:
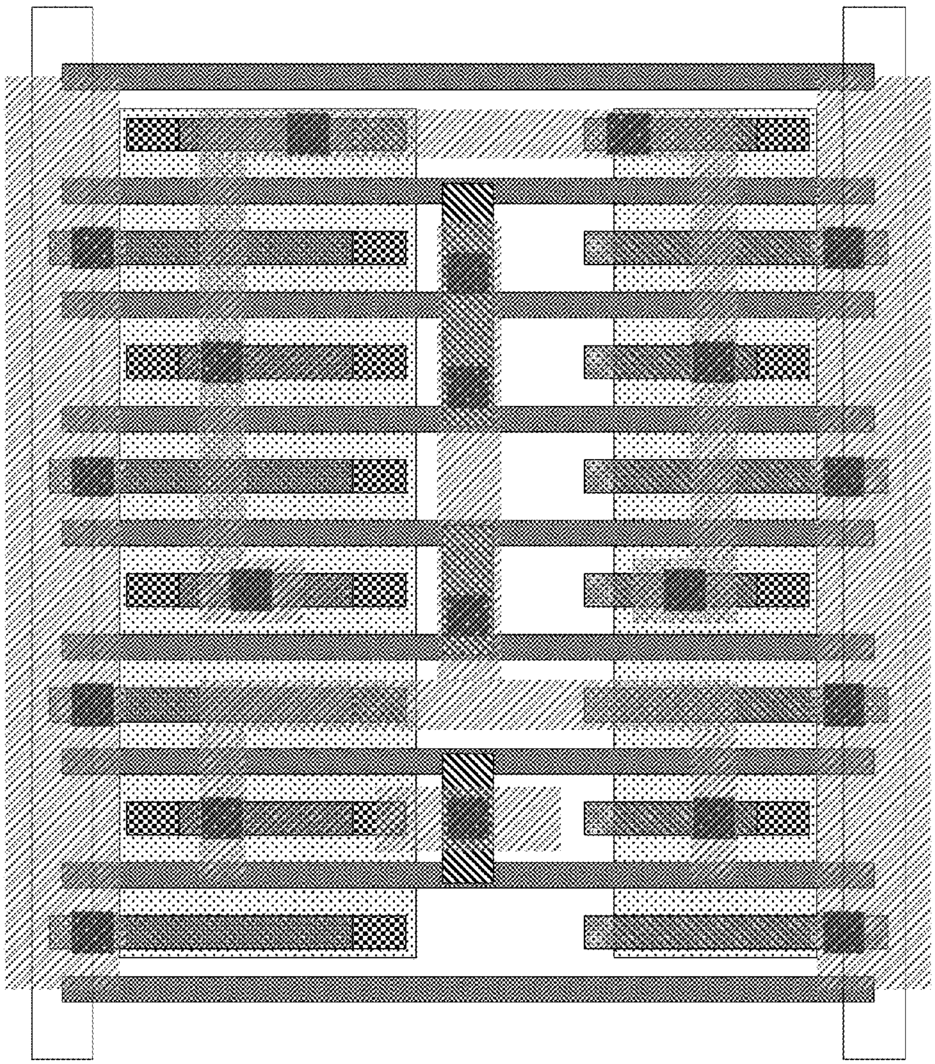
FIG. 131 depicts a CKBD5 cell.

Reference is made to FIG. 131, which depicts a CKBD5 cell. This clock cell implements the logical buffering function in drive strength 5.

Figure 132:
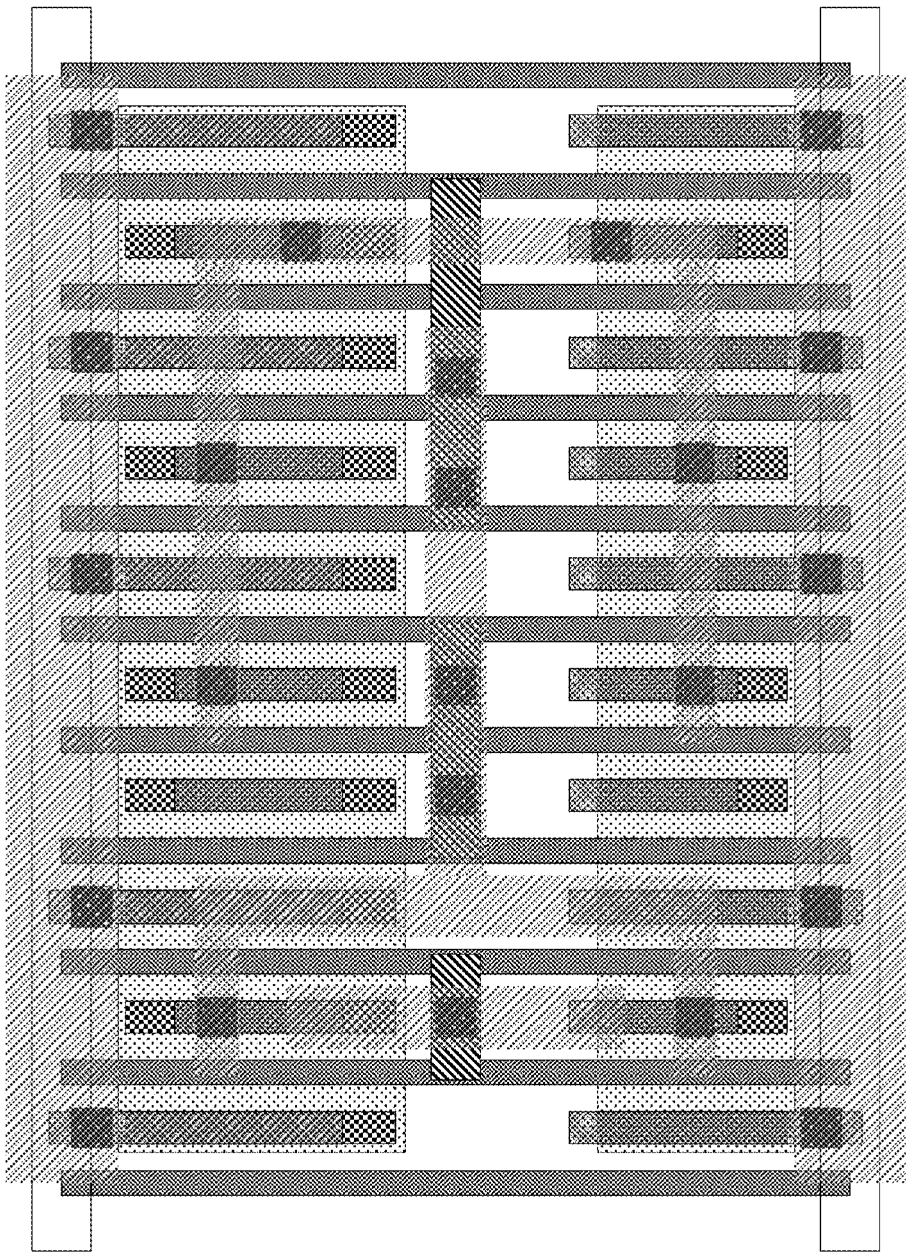
FIG. 132 depicts a CKBD5P5 cell.

Reference is made to FIG. 132, which depicts a CKBD5P5 cell. This clock cell implements the logical buffering function in drive strength 5.5.

Figure 133:
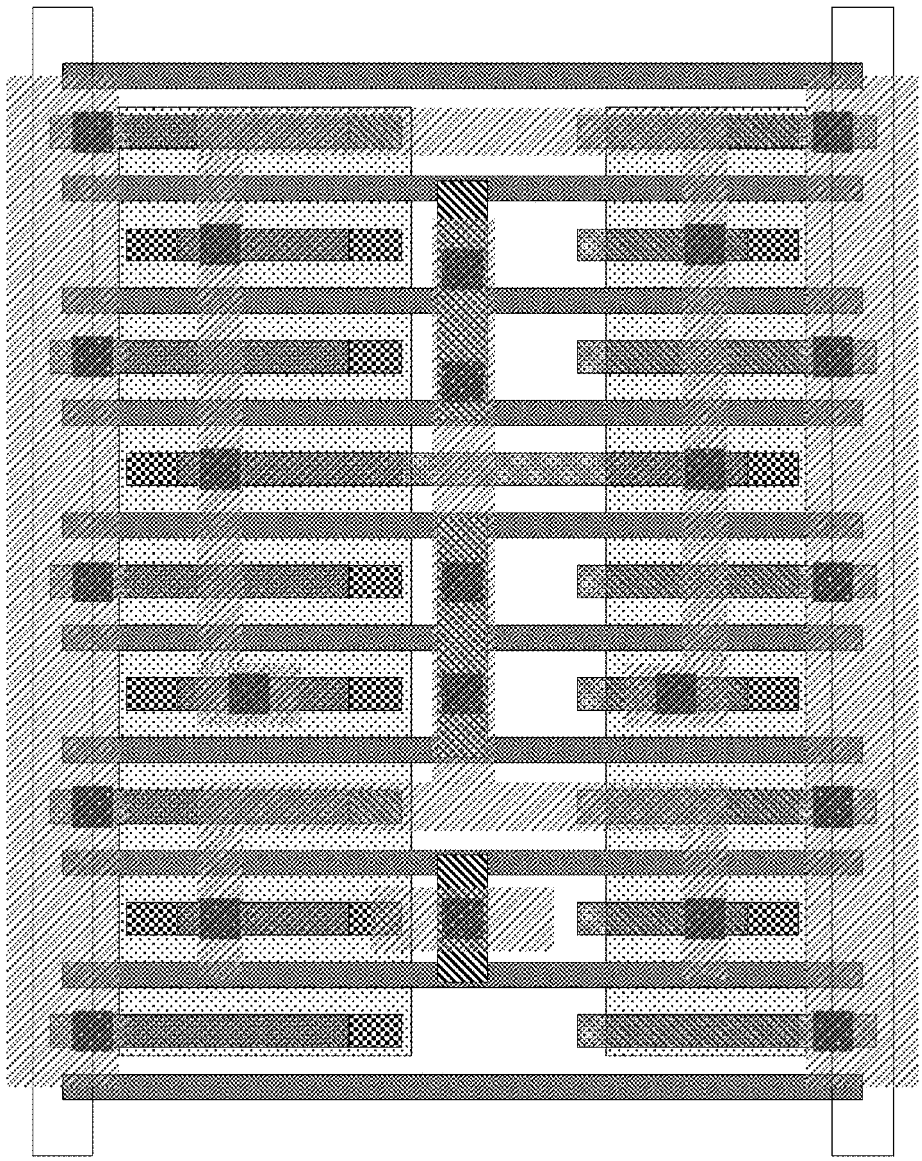
FIG. 133 depicts a CKBD6 cell.

Reference is made to FIG. 133, which depicts a CKBD6 cell. This clock cell implements the logical buffering function in drive strength 6.

Figure 134:
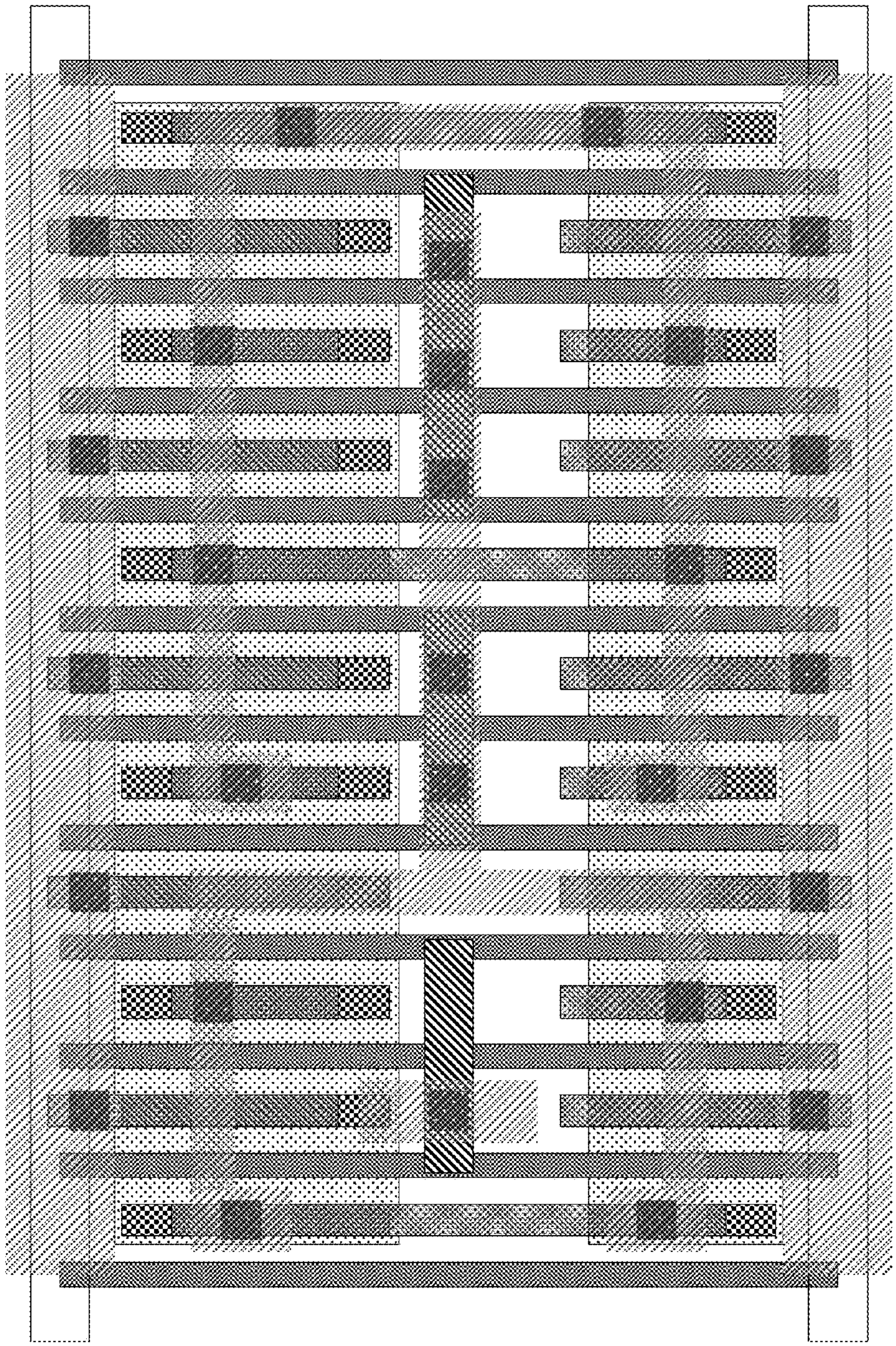
FIG. 134 depicts a CKBD7 cell.

Reference is made to FIG. 134, which depicts a CKBD7 cell. This clock cell implements the logical buffering function in drive strength 7.

Figure 135:
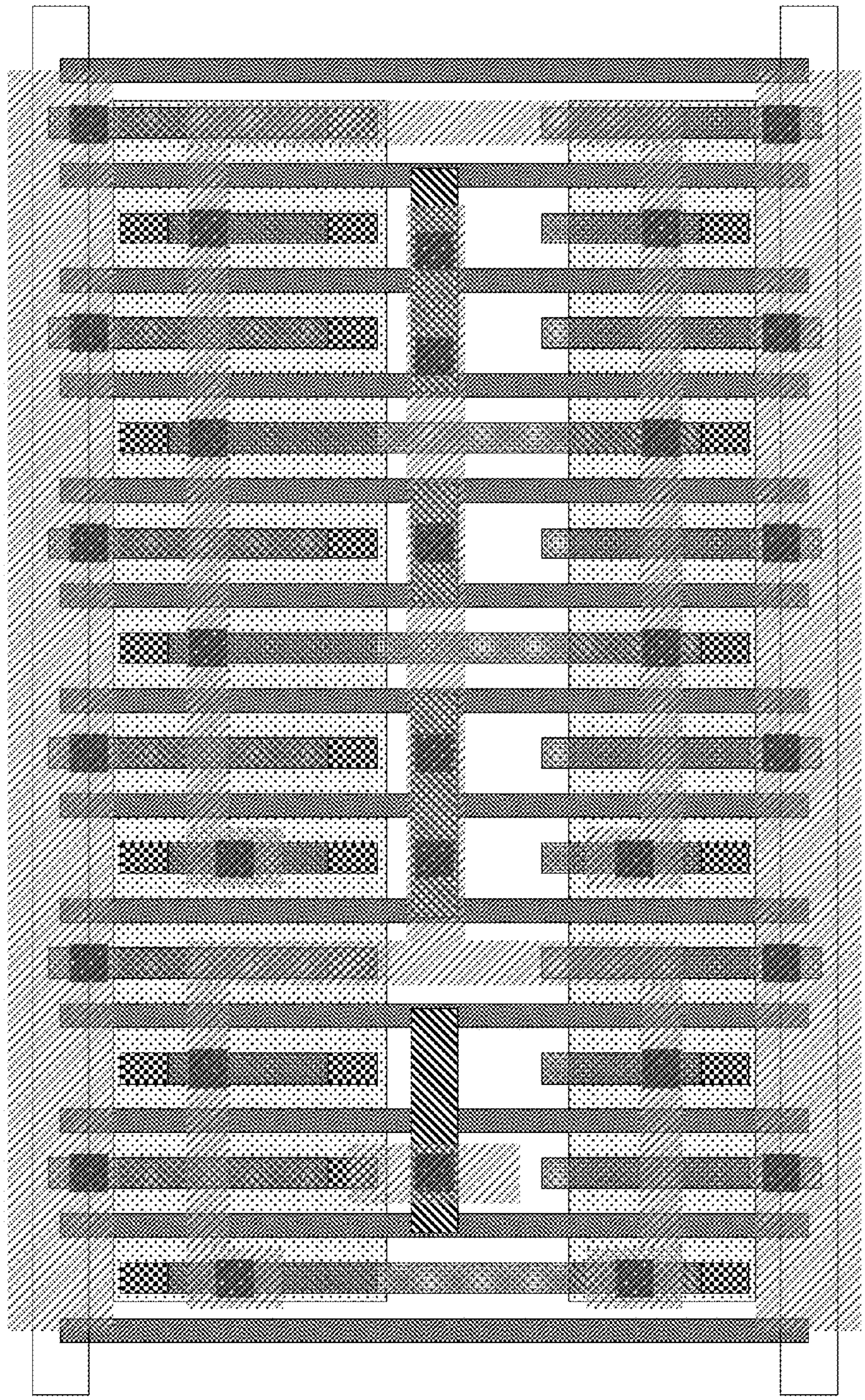
FIG. 135 depicts a CKBD8 cell.

Reference is made to FIG. 135, which depicts a CKBD8 cell. This clock cell implements the logical buffering function in drive strength 8.

Figure 136:
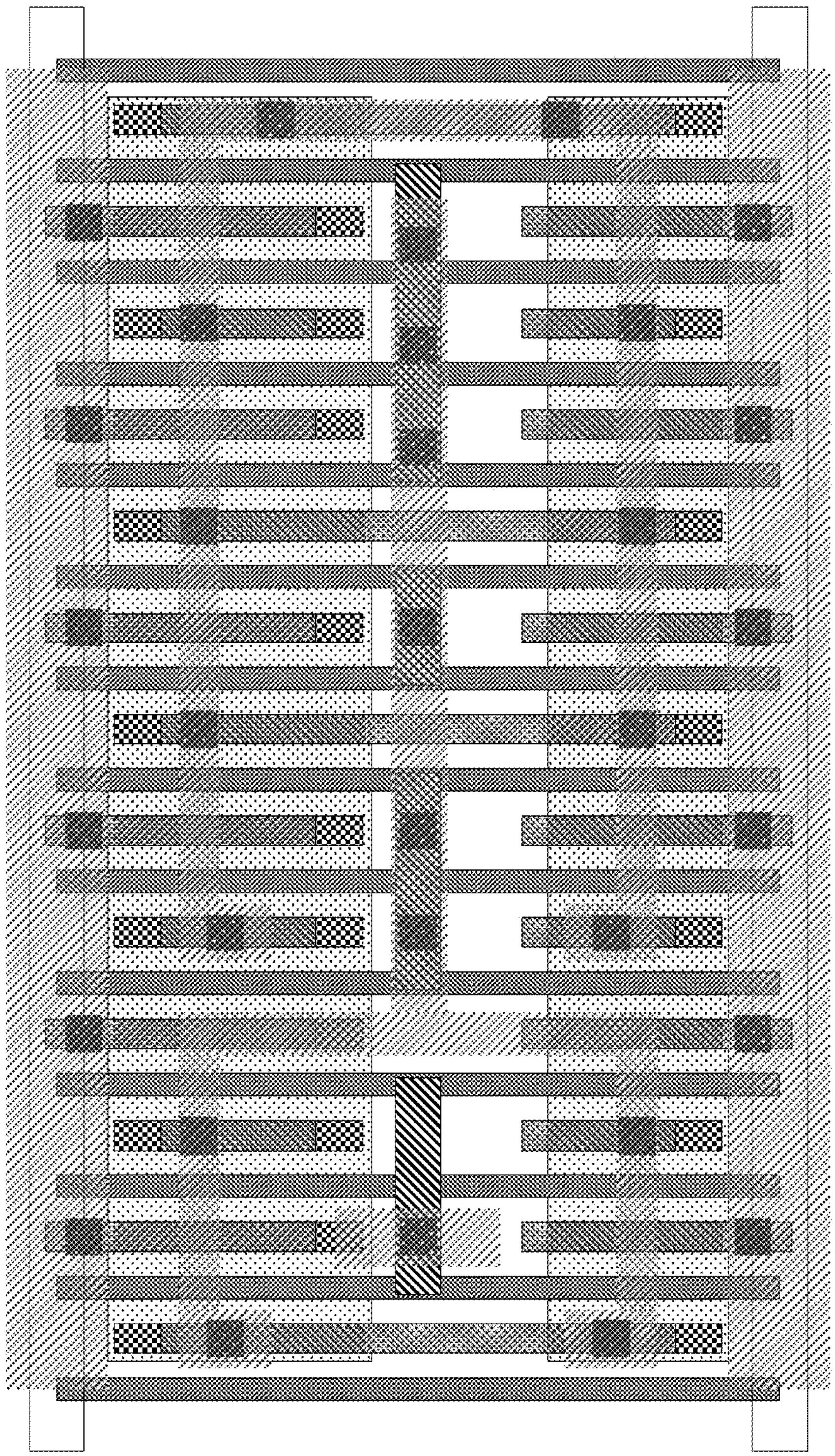
FIG. 136 depicts a CKBD9 cell.

Reference is made to FIG. 136, which depicts a CKBD9 cell. This clock cell implements the logical buffering function in drive strength 9.

Figure 137:
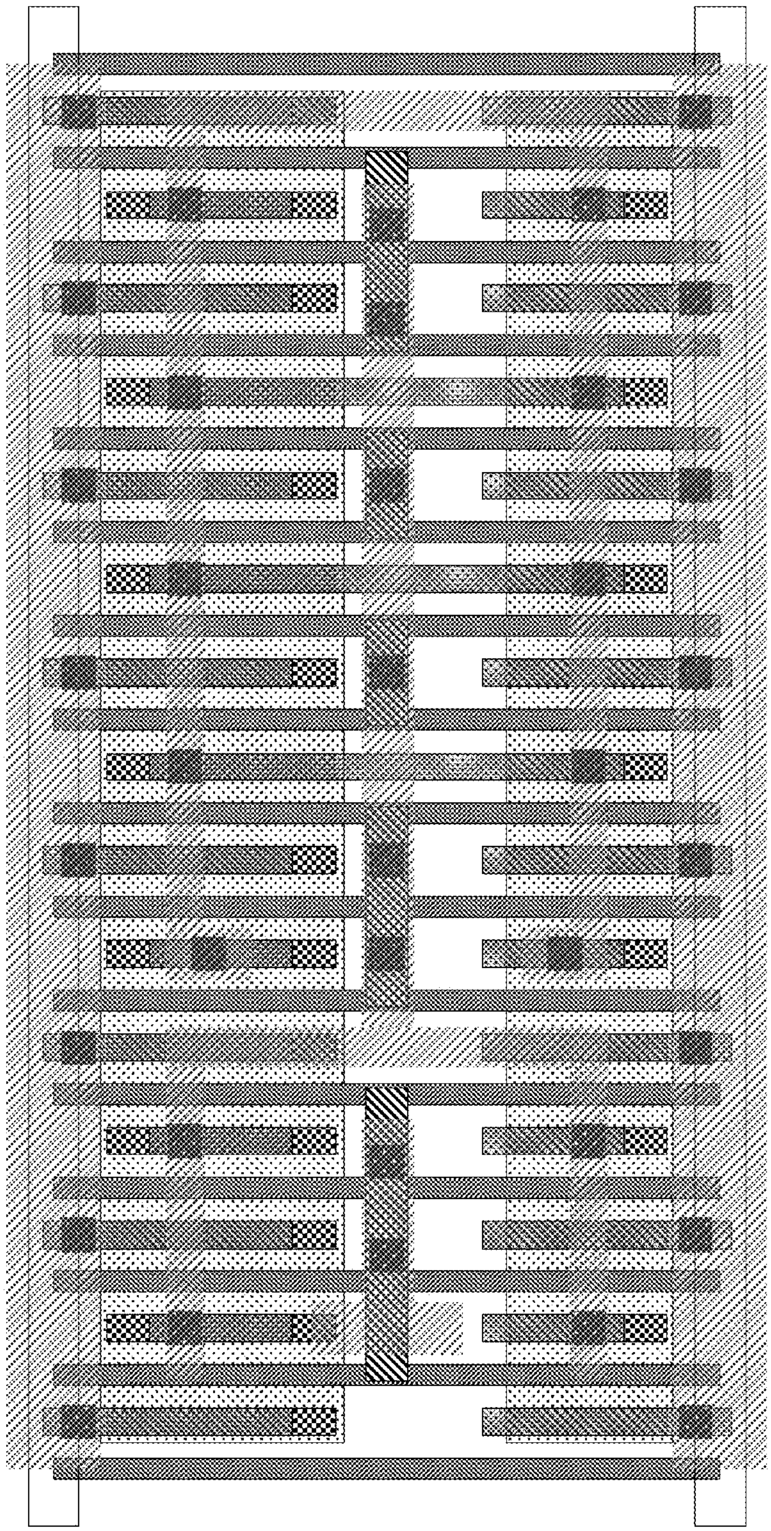
FIG. 137 depicts a CKBD10 cell.

Reference is made to FIG. 137, which depicts a CKBD10 cell. This clock cell implements the logical buffering function in drive strength 10.

Figure 138:
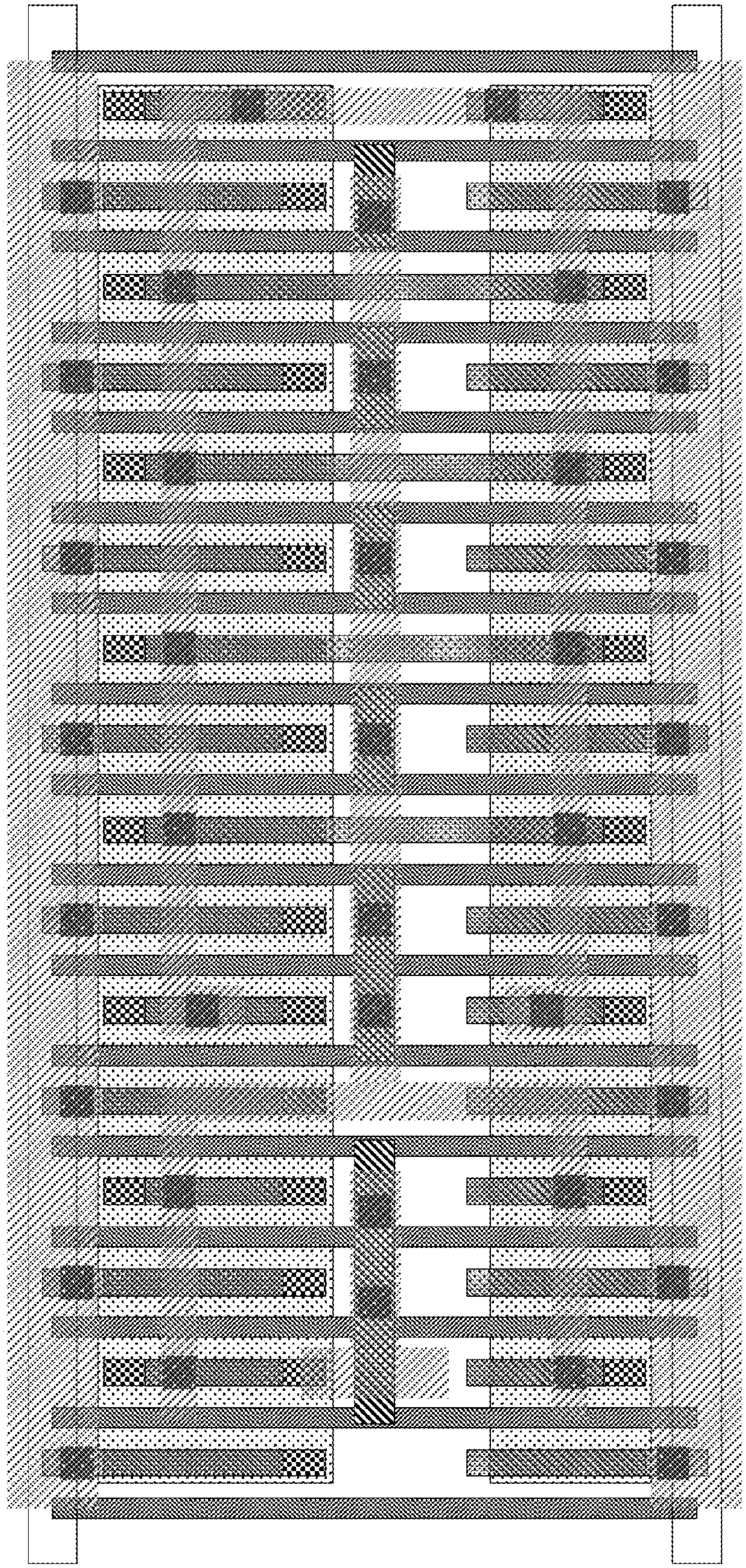
FIG. 138 depicts a CKBD11 cell.

Reference is made to FIG. 138, which depicts a CKBD11 cell. This clock cell implements the logical buffering function in drive strength 11.

Figure 139:
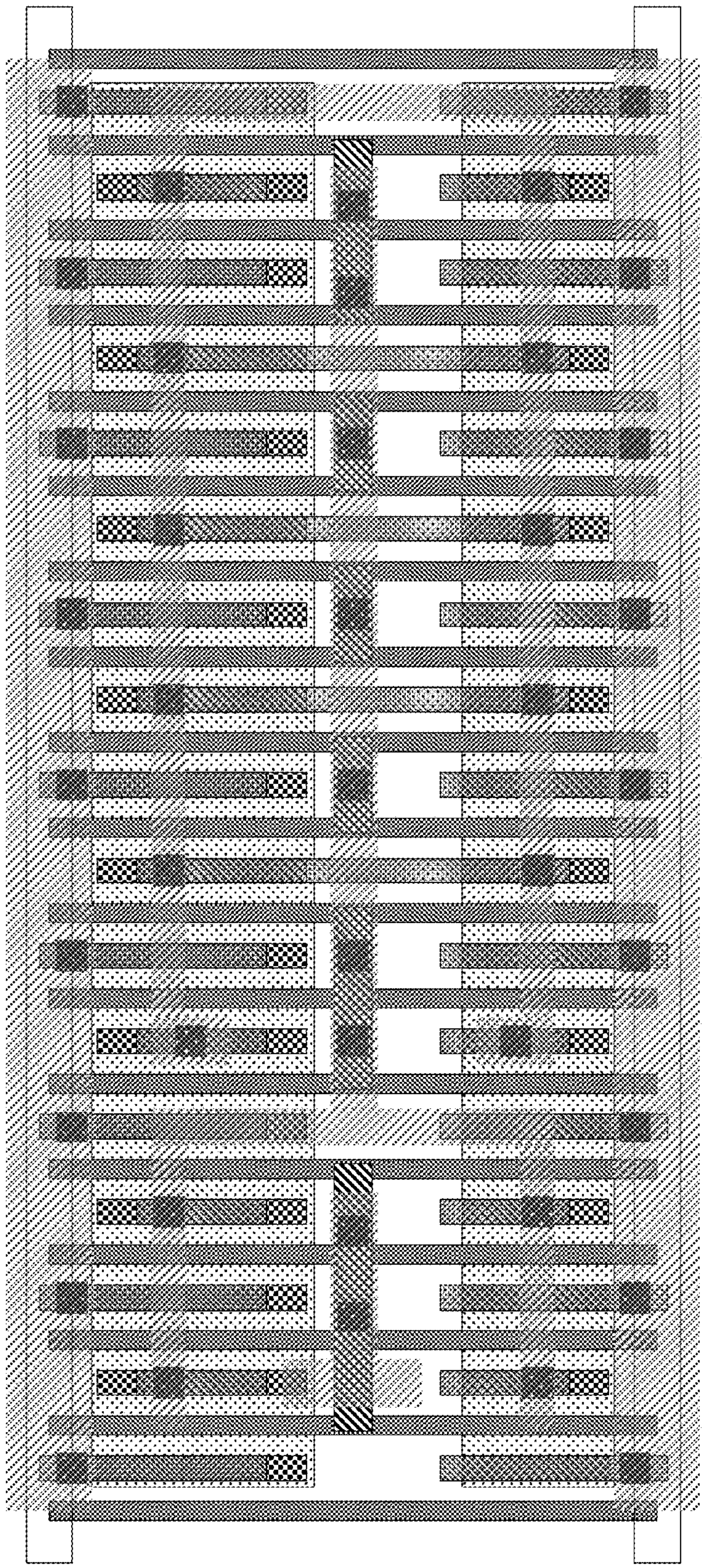
FIG. 139 depicts a CKBD12 cell.

Reference is made to FIG. 139, which depicts a CKBD12 cell. This clock cell implements the logical buffering function in drive strength 12.

Figure 140:
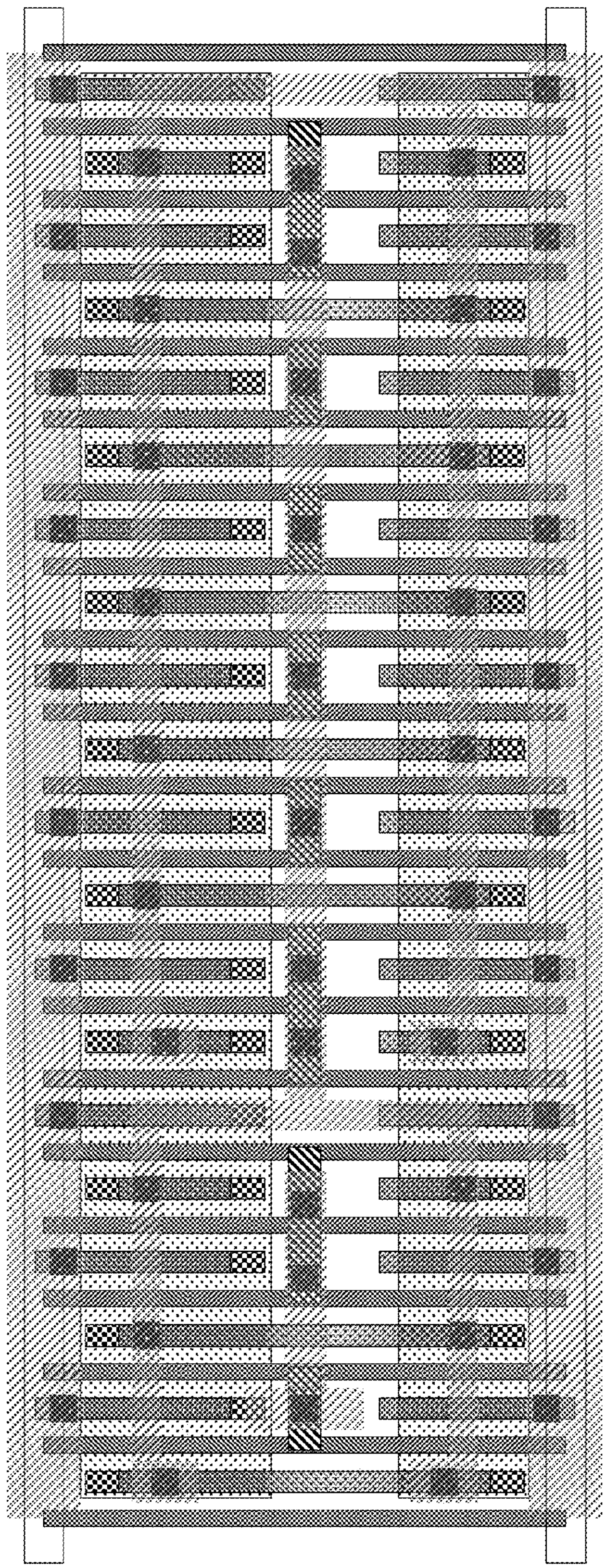
FIG. 140 depicts a CKBD14 cell.

Reference is made to FIG. 140, which depicts a CKBD14 cell. This clock cell implements the logical buffering function in drive strength 14.

Figure 141:
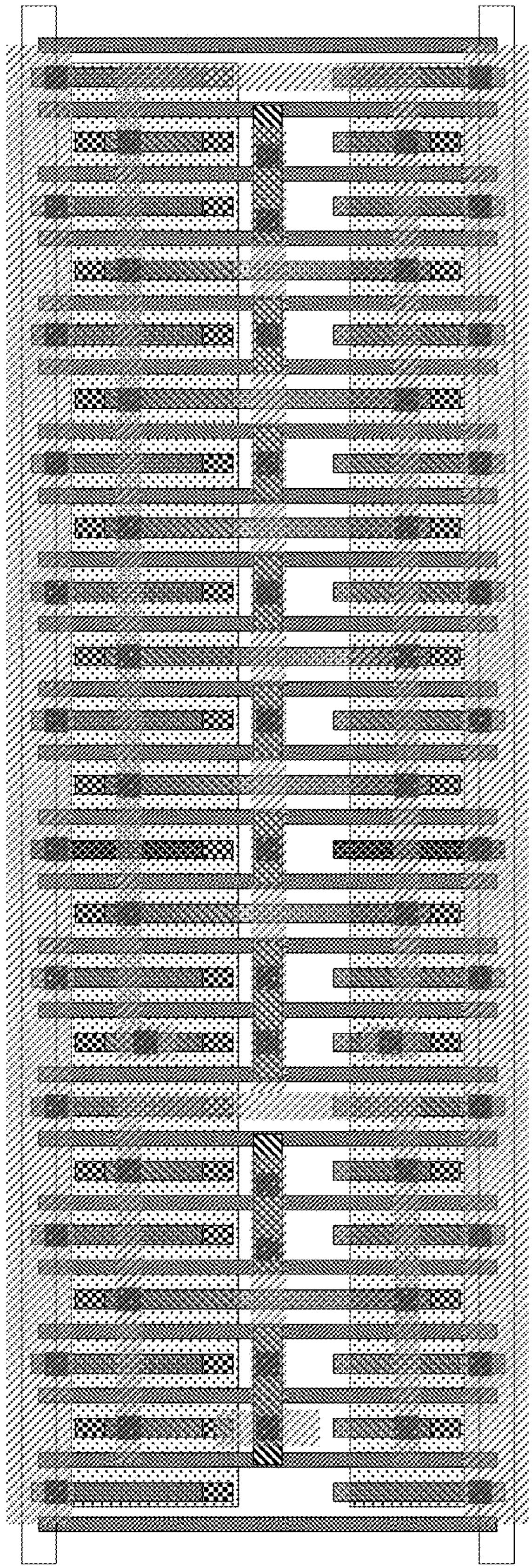
FIG. 141 depicts a CKBD16 cell.

Reference is made to FIG. 141, which depicts a CKBD16 cell. This clock cell implements the logical buffering function in drive strength 16.

Figure 142:
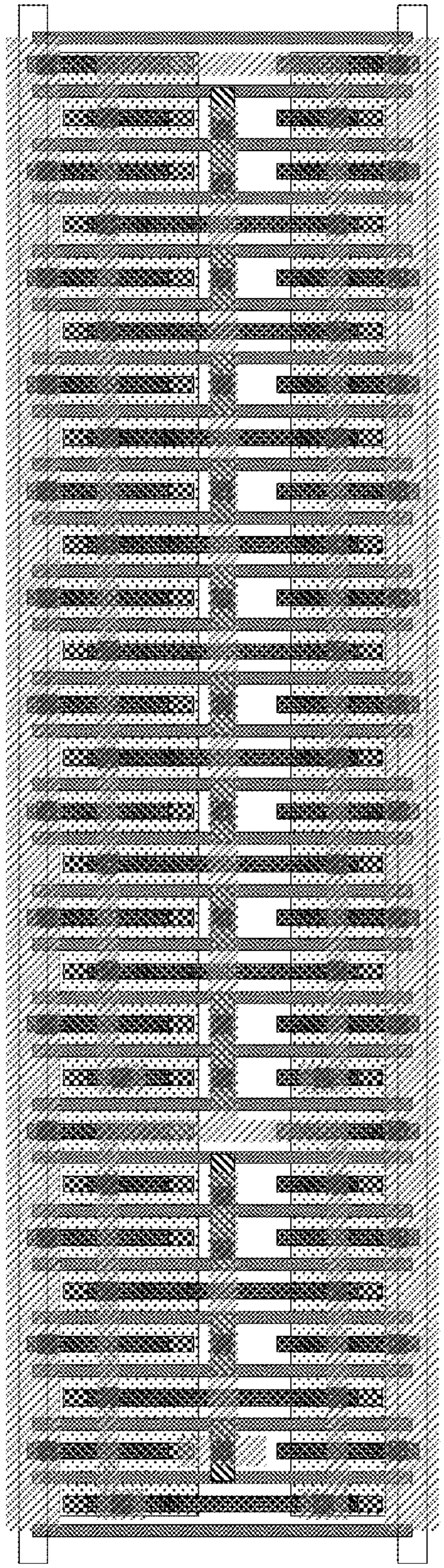
FIG. 142 depicts a CKBD20 cell.

Reference is made to FIG. 142, which depicts a CKBD20 cell. This clock cell implements the logical buffering function in drive strength 20.

Figure 143:
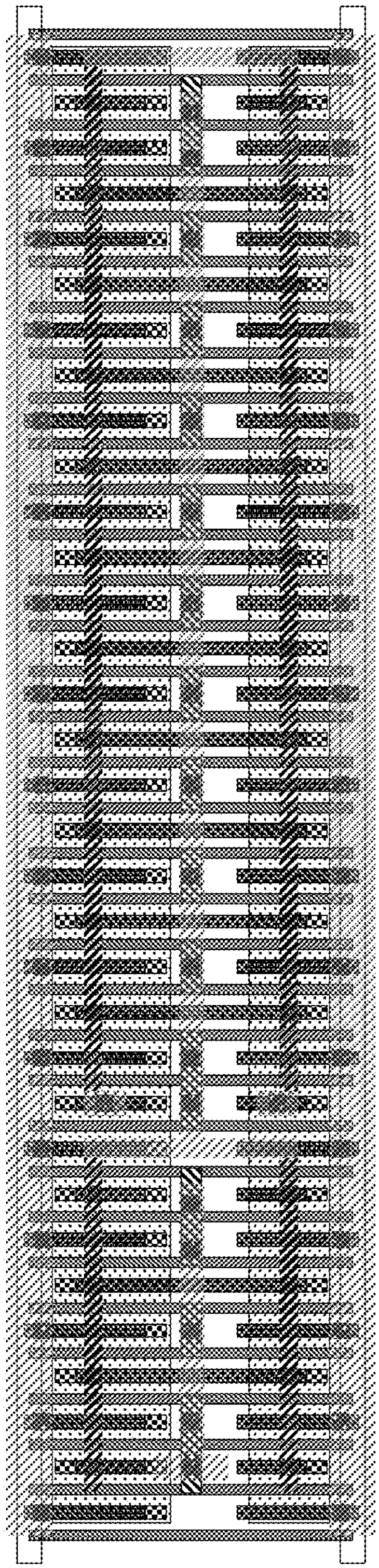
FIG. 143 depicts a CKBD24 cell.

Reference is made to FIG. 143, which depicts a CKBD24 cell. This clock cell implements the logical buffering function in drive strength 24.

Figure 144:
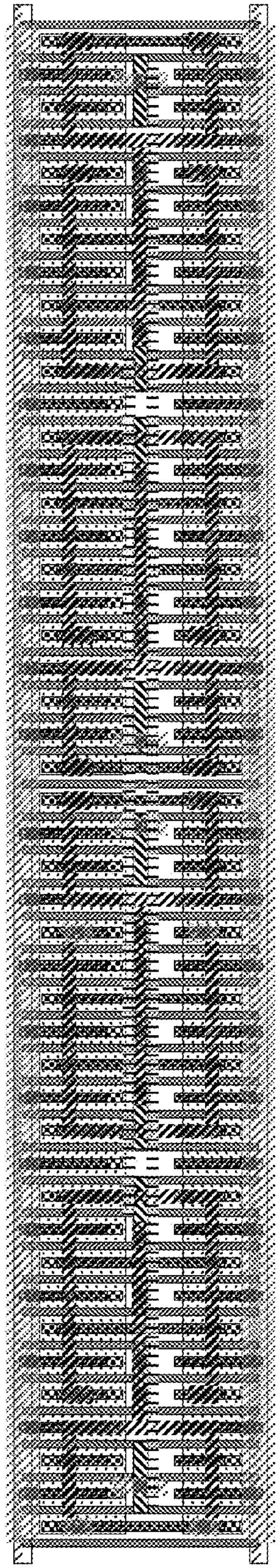
FIG. 144 depicts a CKBD32 cell.

Reference is made to FIG. 144, which depicts a CKBD32 cell. This clock cell implements the logical buffering function in drive strength 32.

Figure 145:
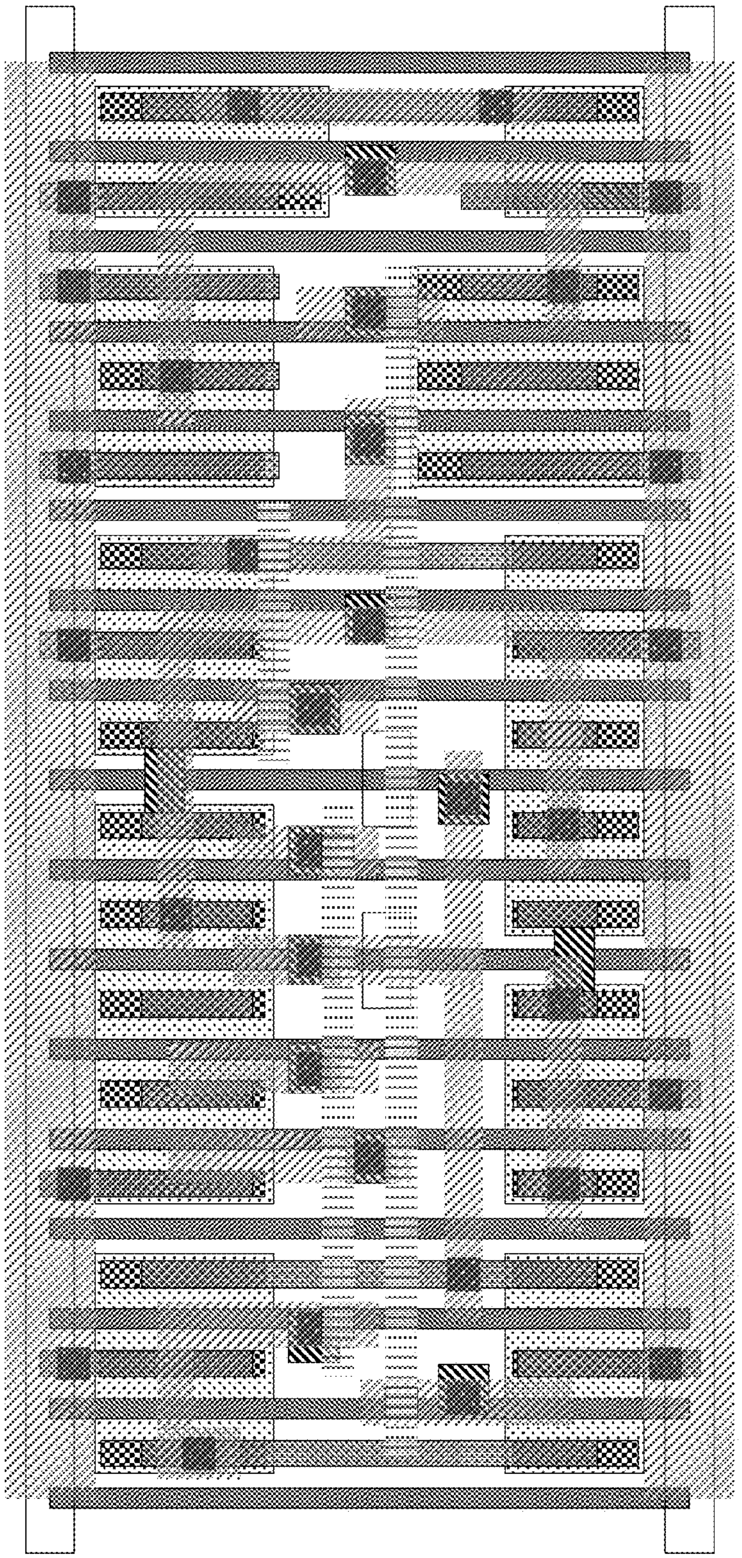
FIG. 145 depicts a CKLNQD1 cell.

Reference is made to FIG. 145, which depicts a CKLNQD1 cell. This cell implements the function of a clock driver with latched enable in drive strength 1.

Figure 146:
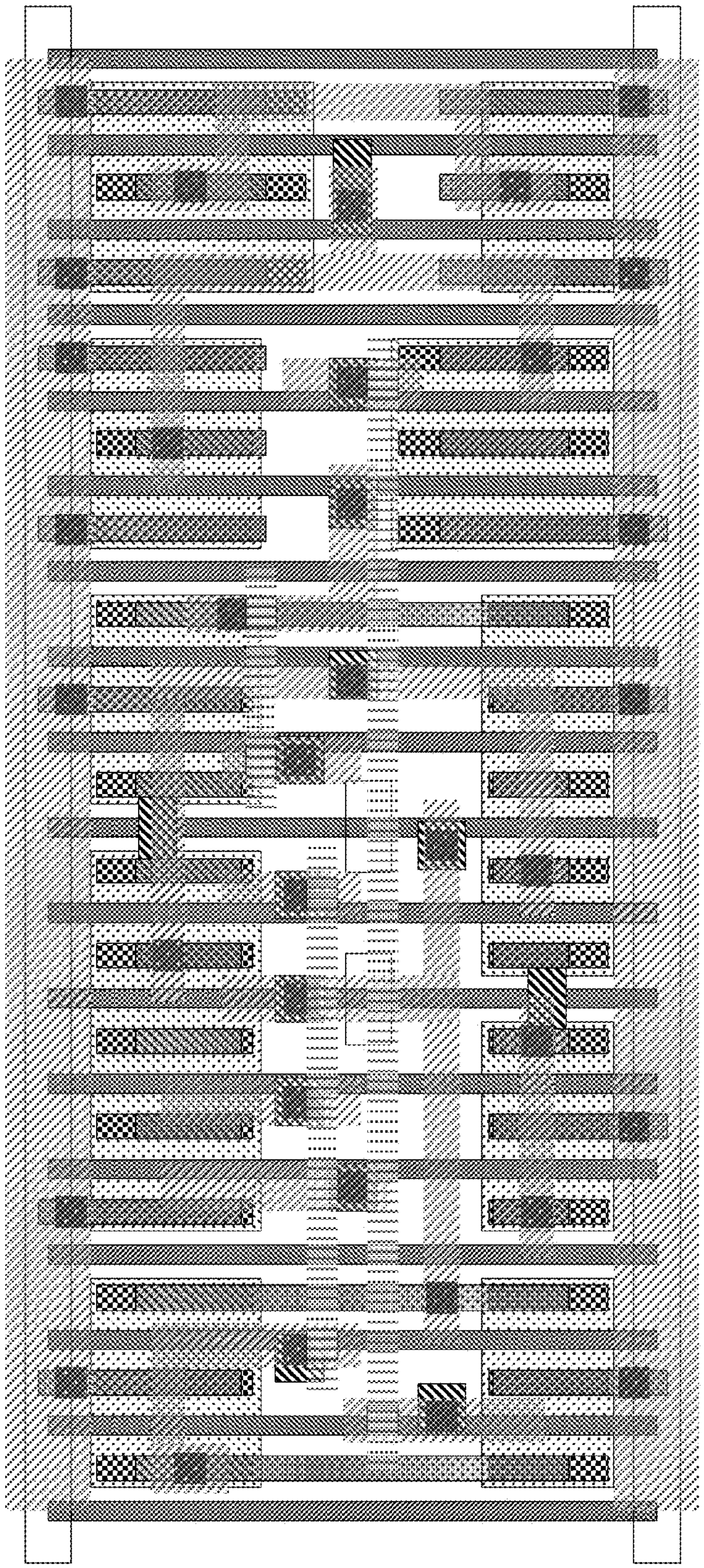
FIG. 146 depicts a CKLNQD2 cell.

Reference is made to FIG. 146, which depicts a CKLNQD2 cell. This cell implements the function of a clock driver with latched enable in drive strength 2.

Figure 147:
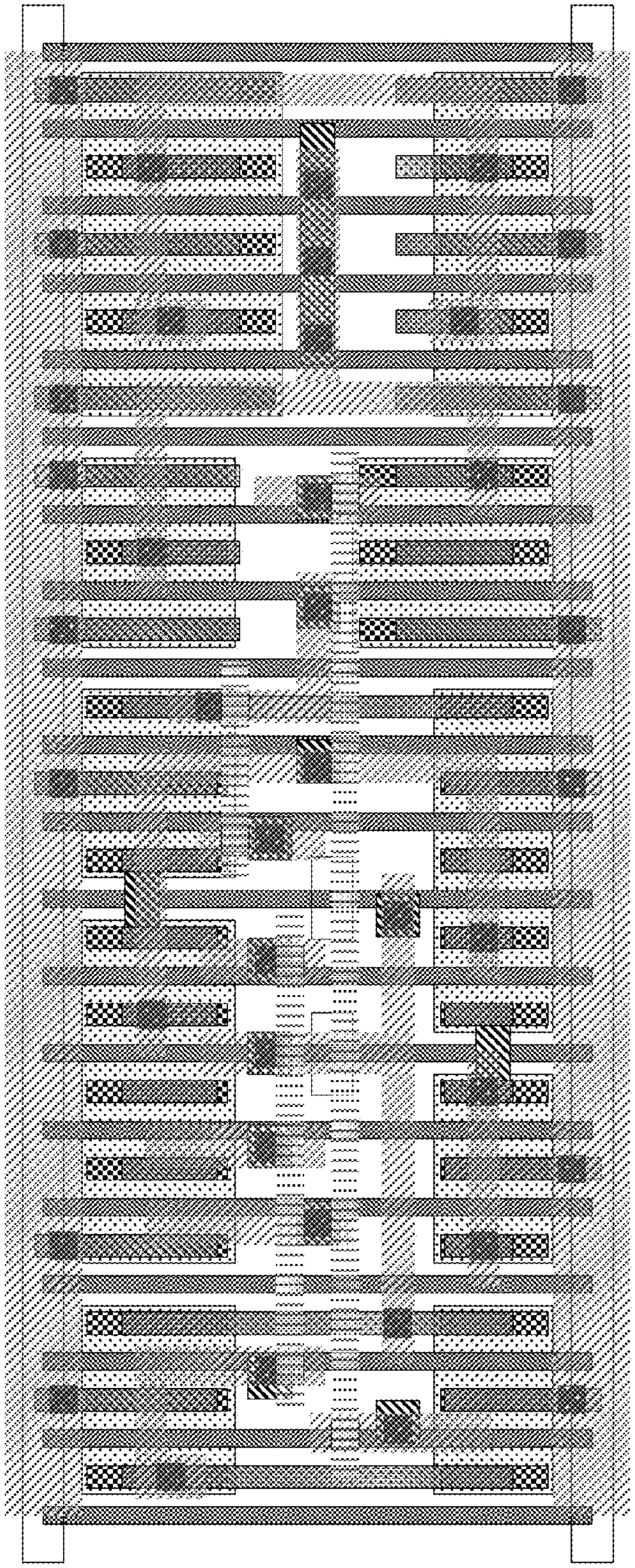
FIG. 147 depicts a CKLNQD4 cell.

Reference is made to FIG. 147, which depicts a CKLNQD4 cell. This cell implements the function of a clock driver with latched enable in drive strength 4.

Figure 148:
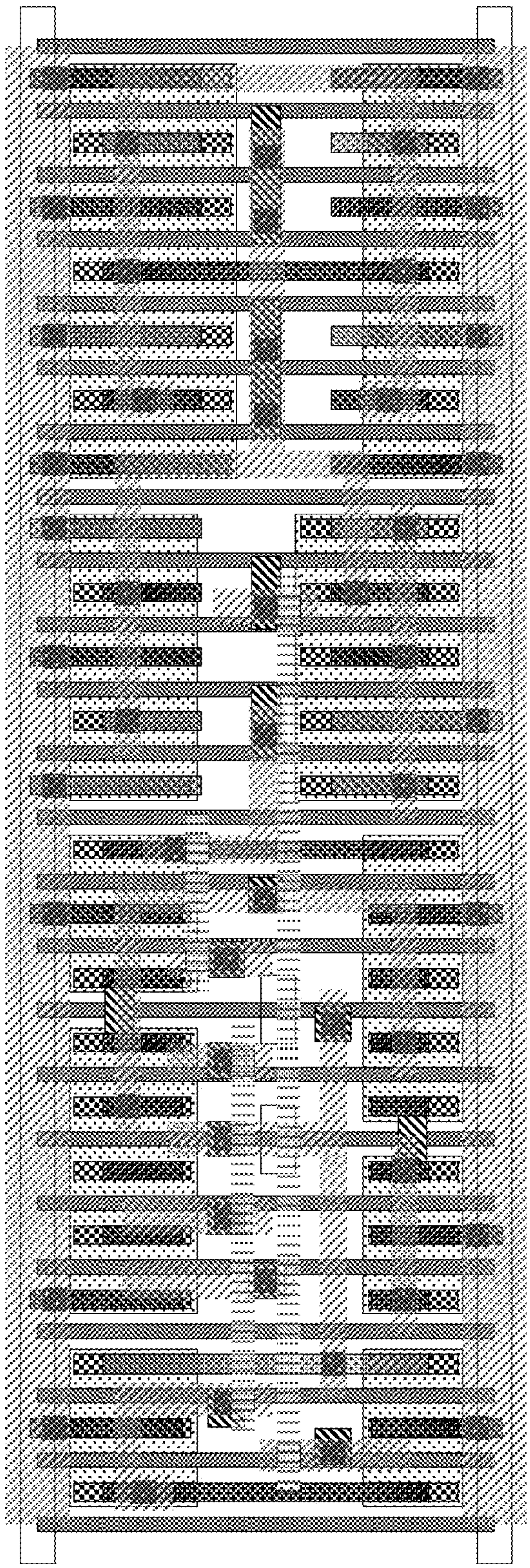
FIG. 148 depicts a CKLNQD6 cell.

Reference is made to FIG. 148, which depicts a CKLNQD6 cell. This cell implements the function of a clock driver with latched enable in drive strength 6.

Figure 149:
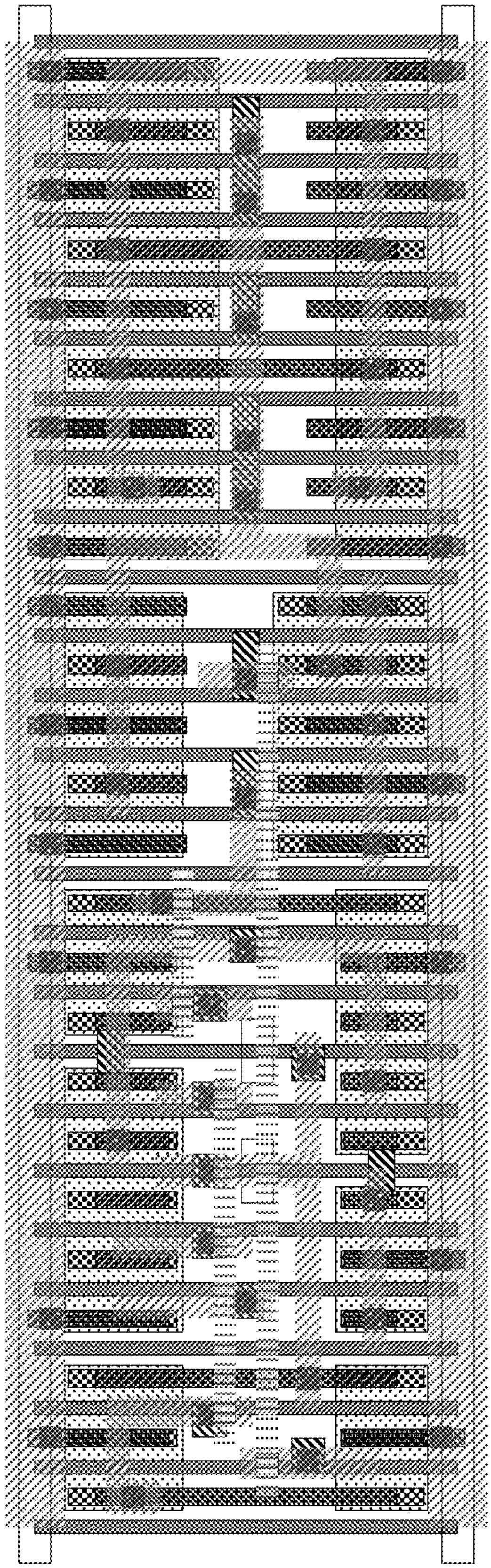
FIG. 149 depicts a CKLNQD8 cell.

Reference is made to FIG. 149, which depicts a CKLNQD8 cell. This cell implements the function of a clock driver with latched enable in drive strength 8.

Figure 150:
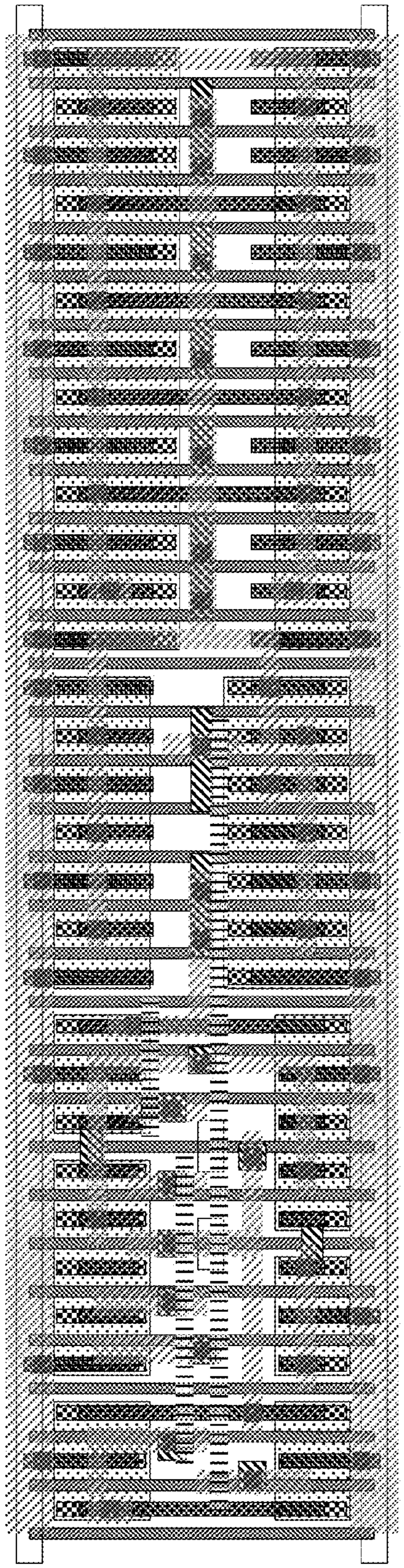
FIG. 150 depicts a CKLNQD12 cell.

Reference is made to FIG. 150, which depicts a CKLNQD12 cell. This cell implements the function of a clock driver with latched enable in drive strength 12.

Figure 151:
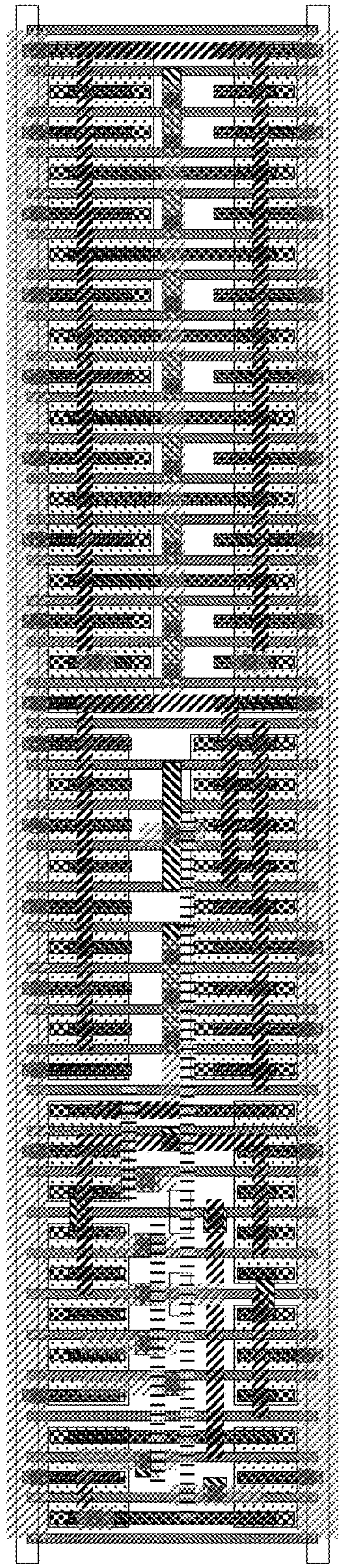
FIG. 151 depicts a CKLNQD16 cell.

Reference is made to FIG. 151, which depicts a CKLNQD16 cell. This cell implements the function of a clock driver with latched enable in drive strength 16.

Figure 152:
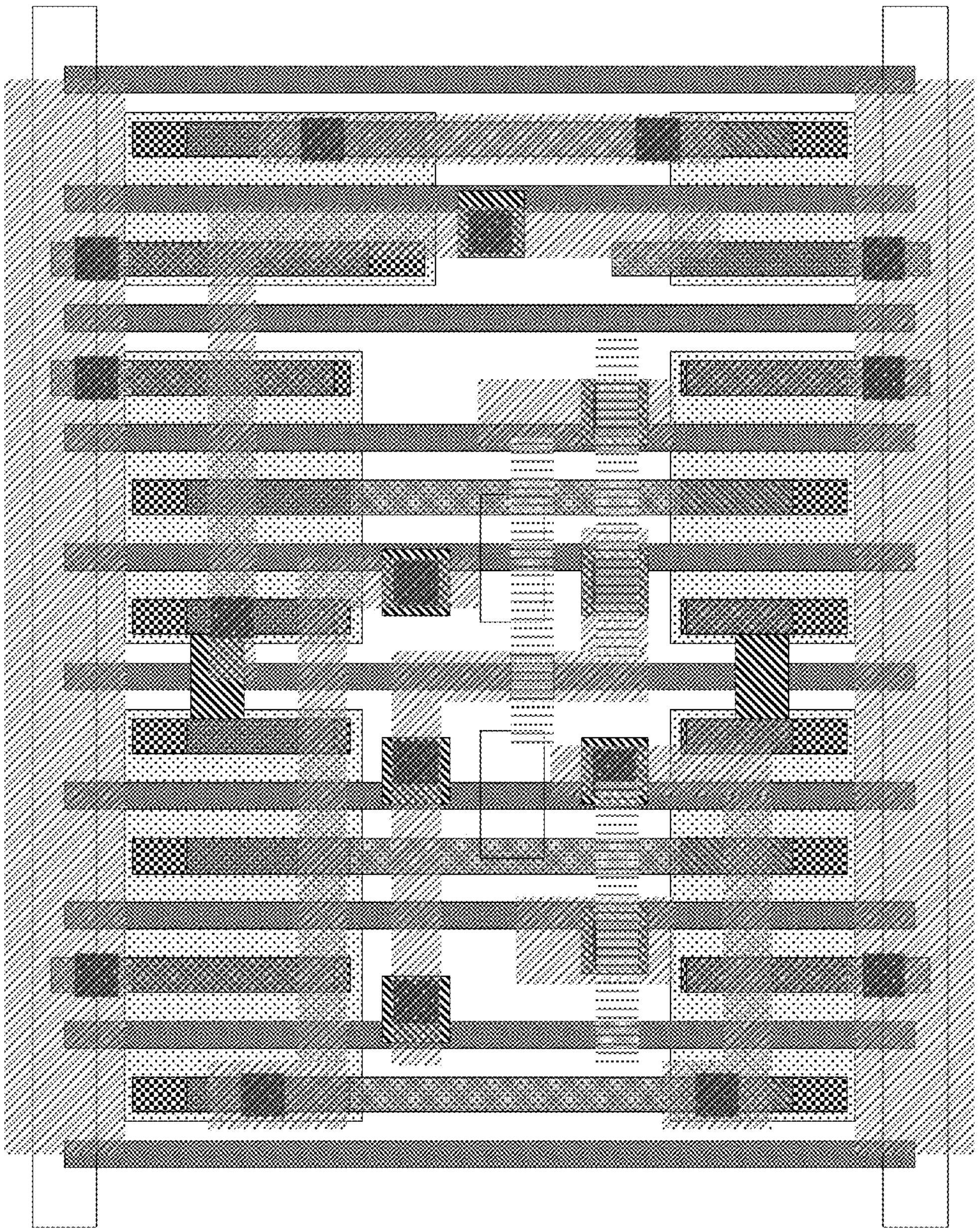
FIG. 152 depicts a CKMUX2D1 cell.

Reference is made to FIG. 152, which depicts a CKMUX2D1 cell. This clock cell implements a two-input multiplex function in drive strength 1.

Figure 153:
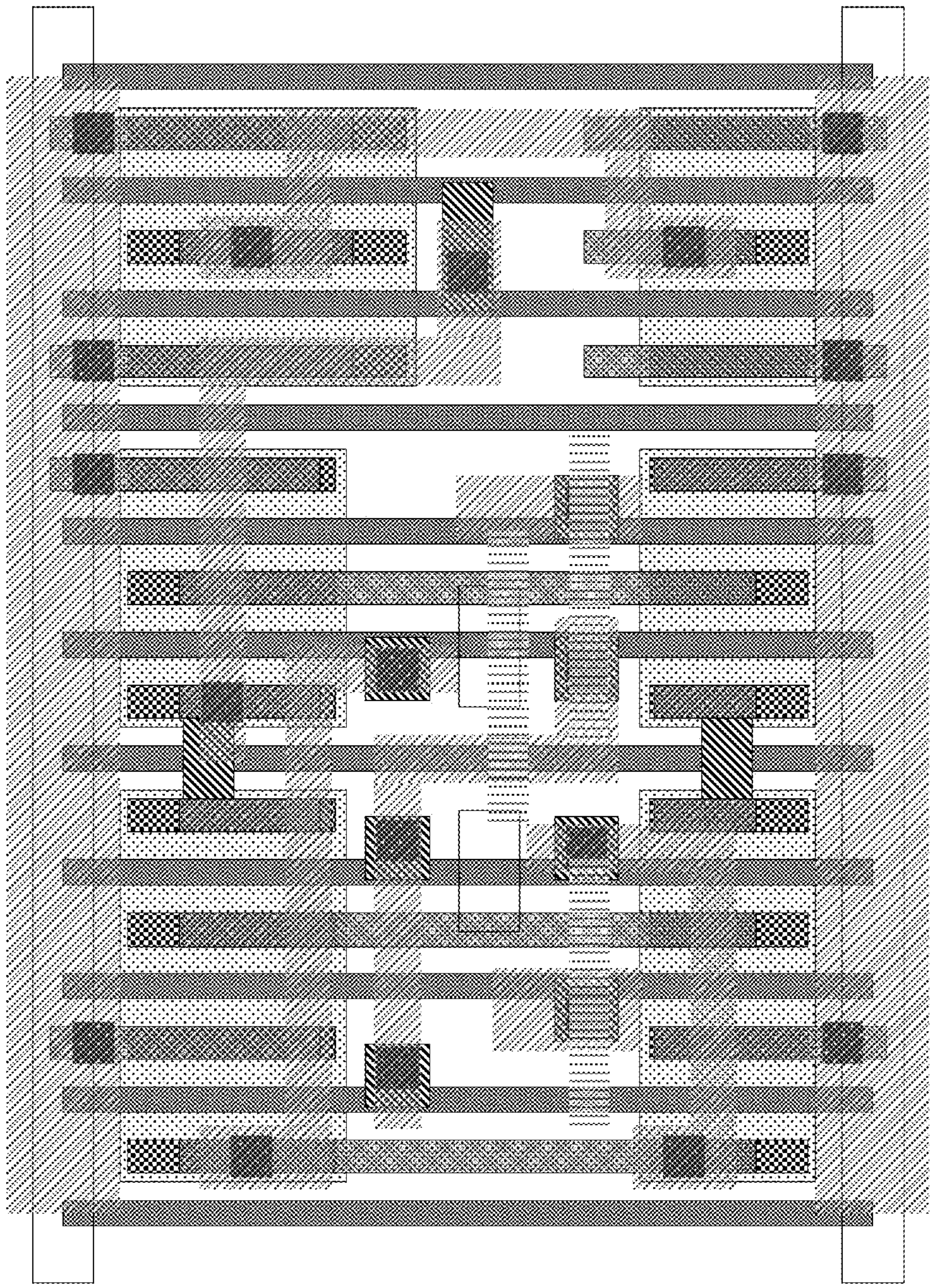
FIG. 153 depicts a CKMUX2D2 cell.

Reference is made to FIG. 153, which depicts a CKMUX2D2 cell. This clock cell implements a two-input multiplex function in drive strength 2.

Figure 154:
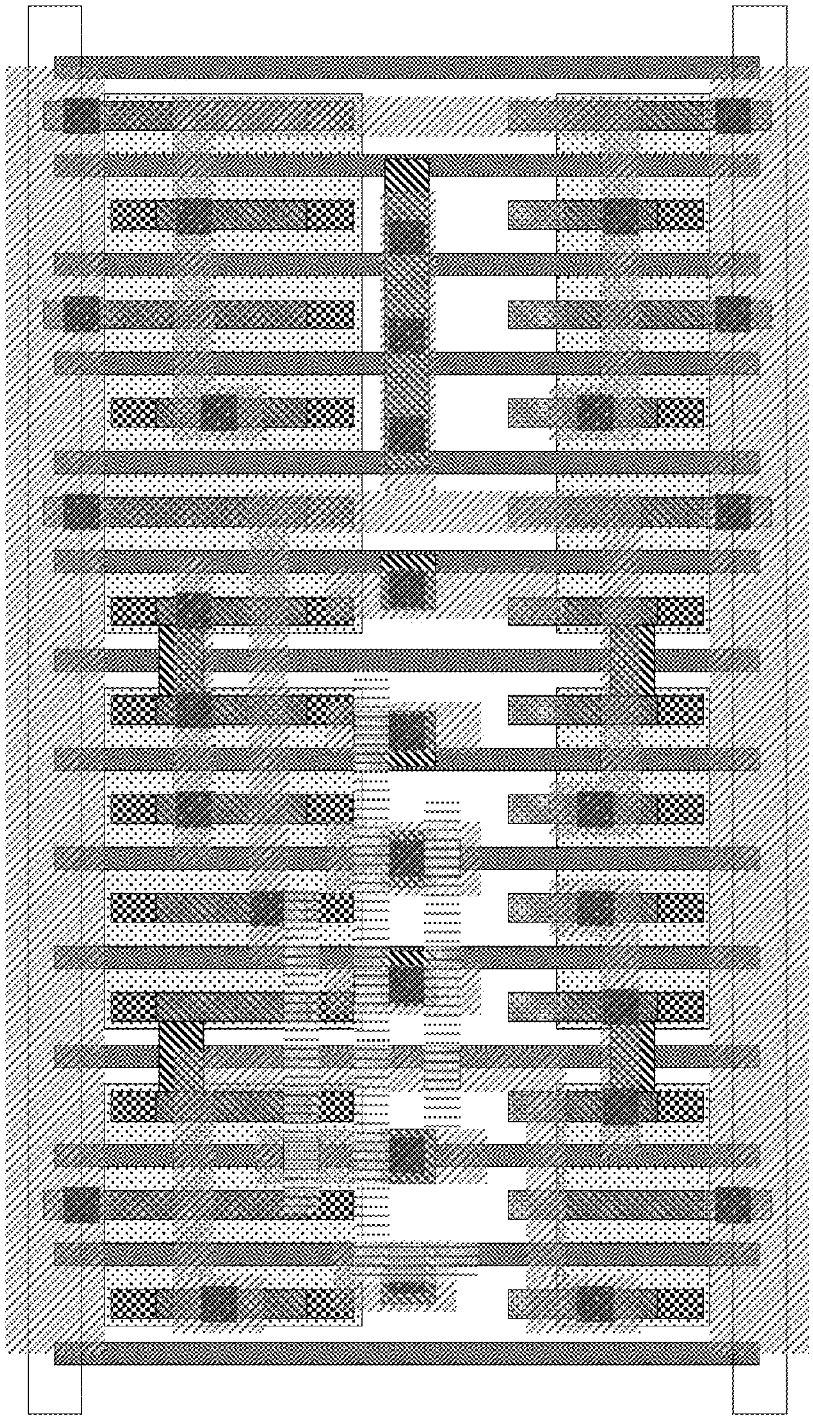
FIG. 154 depicts a CKMUX2D4 cell.

Reference is made to FIG. 154, which depicts a CKMUX2D4 cell. This clock cell implements a two-input multiplex function in drive strength 4.

Figure 155:
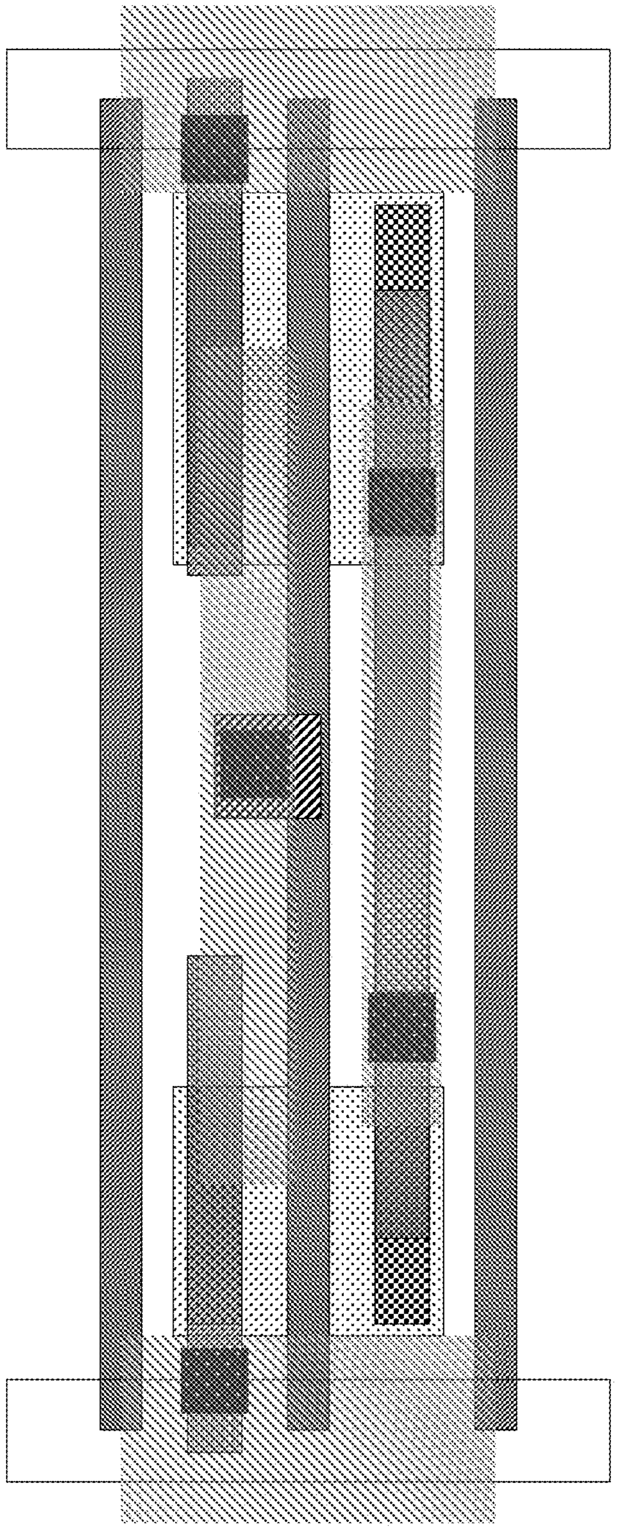
FIG. 155 depicts a CKND0P5 cell.

Reference is made to FIG. 155, which depicts a CKND0P5 cell. This cell implements the function of an inverting clock driver in drive strength 0.5.

Figure 156:
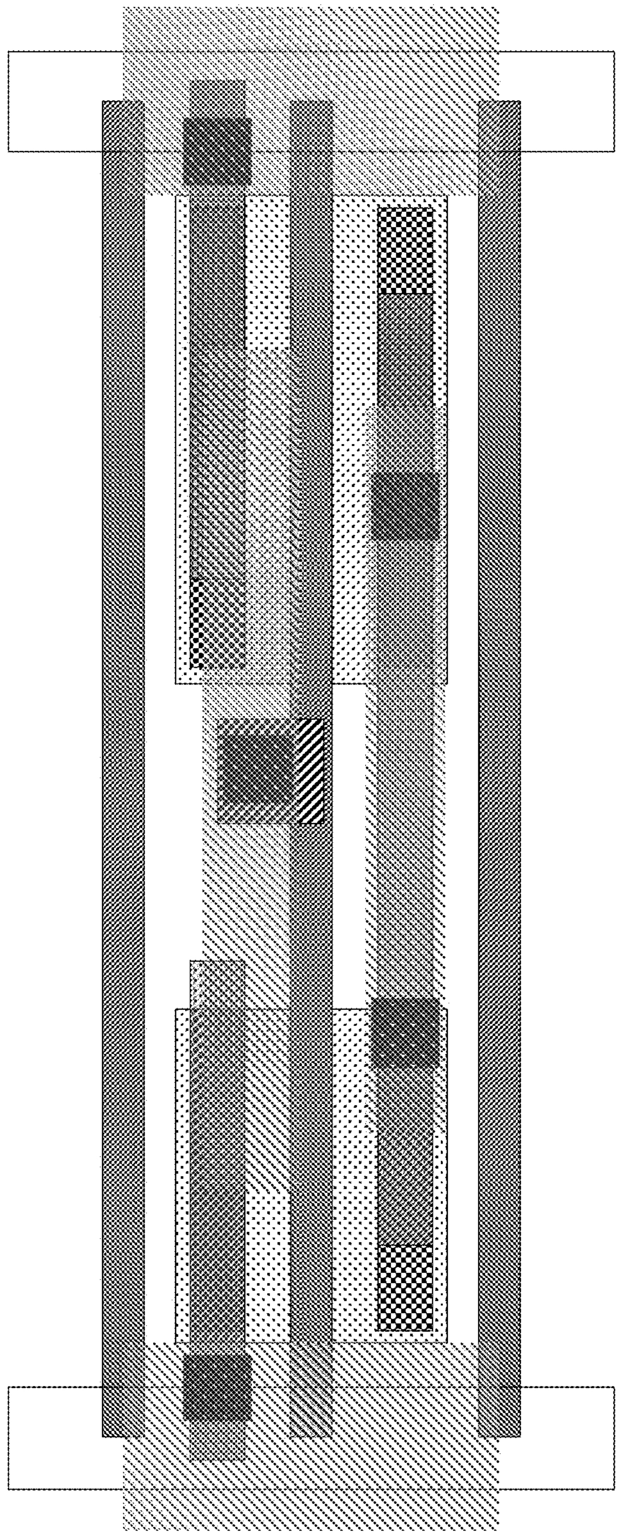
FIG. 156 depicts a CKND1 cell.

Reference is made to FIG. 156, which depicts a CKND1 cell. This cell implements the function of an inverting clock driver in drive strength 1.

Figure 157:
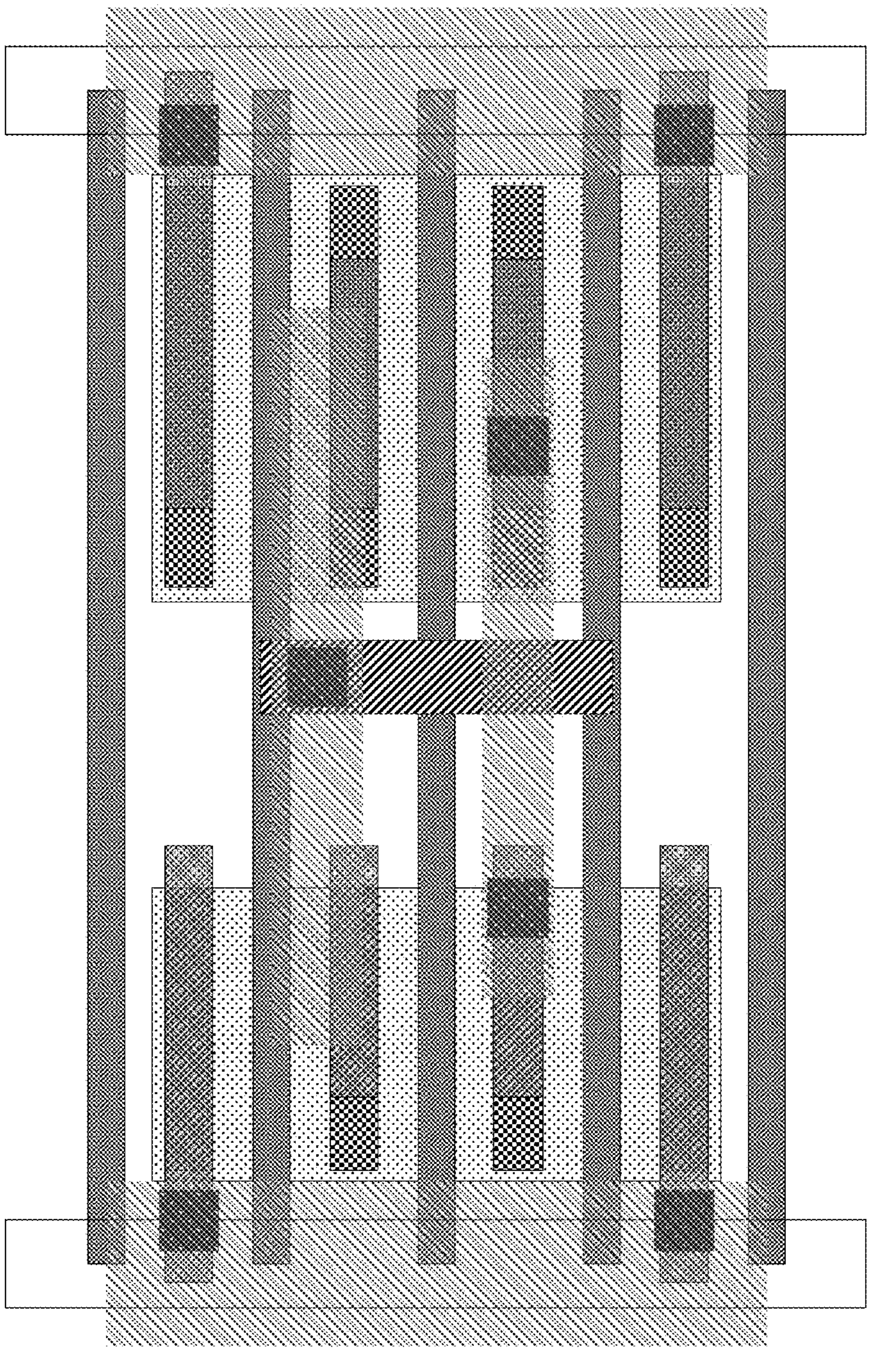
FIG. 157 depicts a CKND1P5 cell.

Reference is made to FIG. 157, which depicts a CKND1P5 cell. This cell implements the function of an inverting clock driver in drive strength 1.5.

Figure 158:
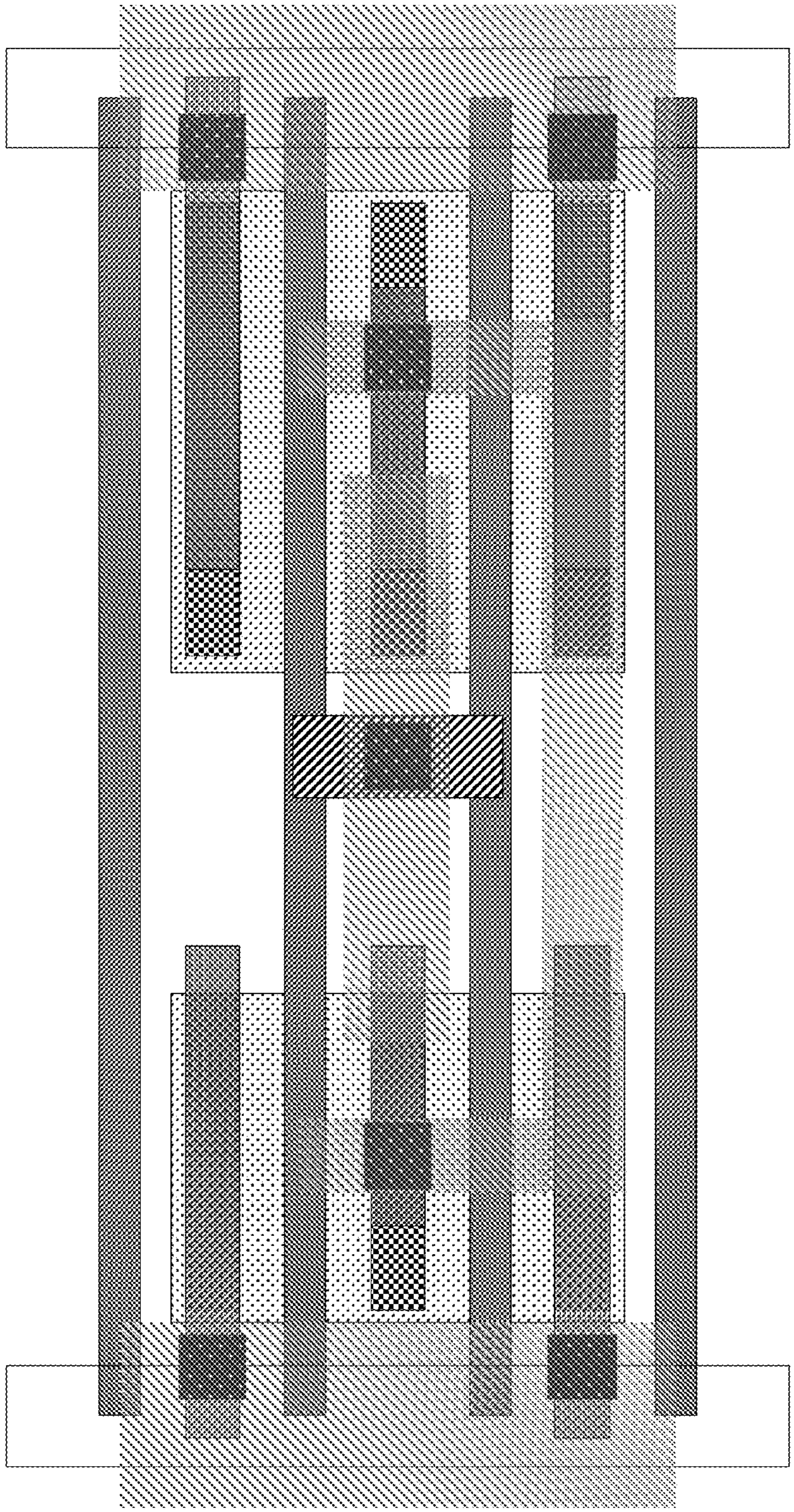
FIG. 158 depicts a CKND2 cell.

Reference is made to FIG. 158, which depicts a CKND2 cell. This cell implements the function of an inverting clock driver in drive strength 2.

Figure 159:
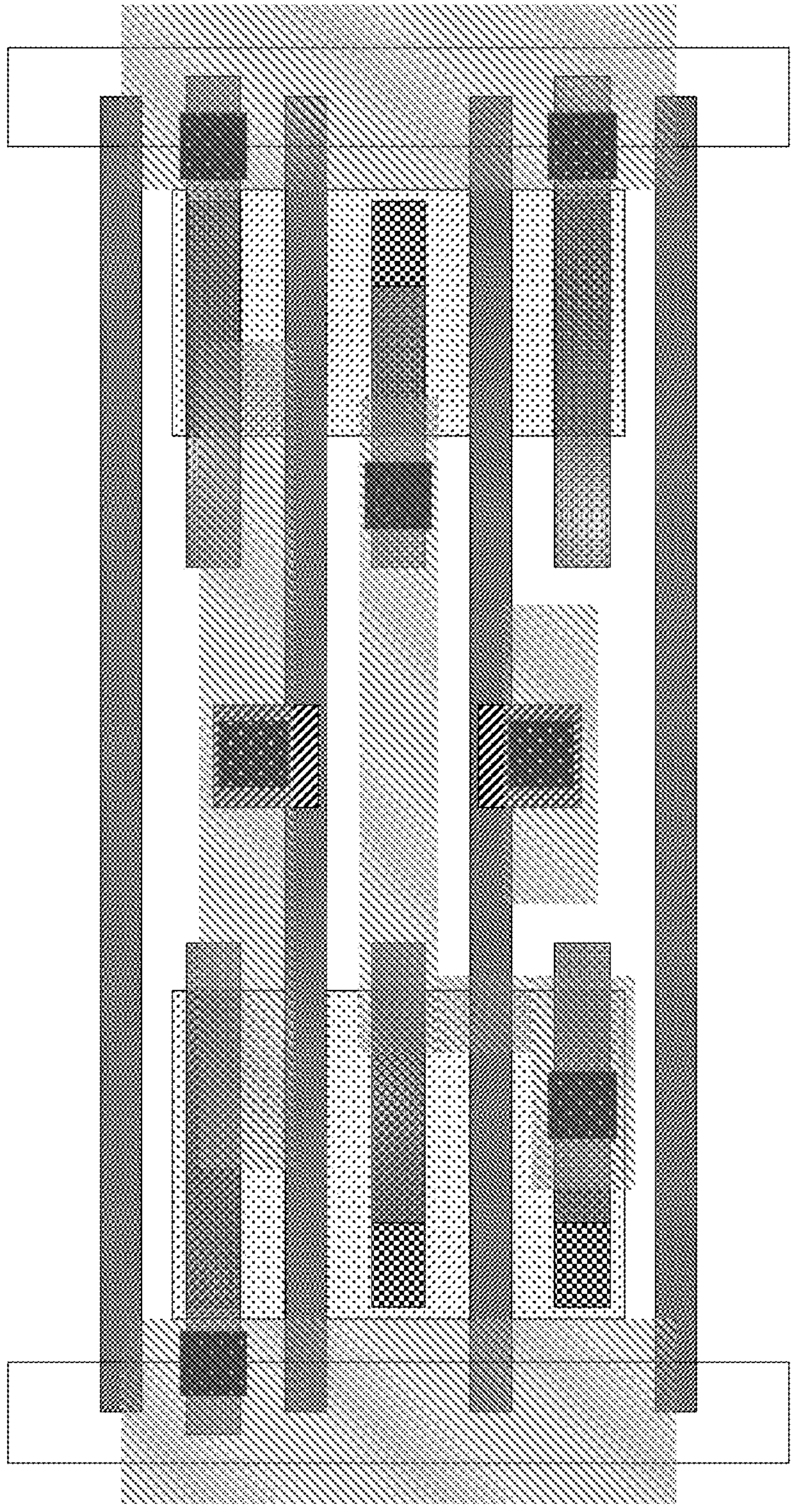
FIG. 159 depicts a CKND2D0P5 cell.

Reference is made to FIG. 159, which depicts a CKND2D0P5 cell. This cell implements the function of an inverting clock driver in drive strength 0.5.

Figure 160:
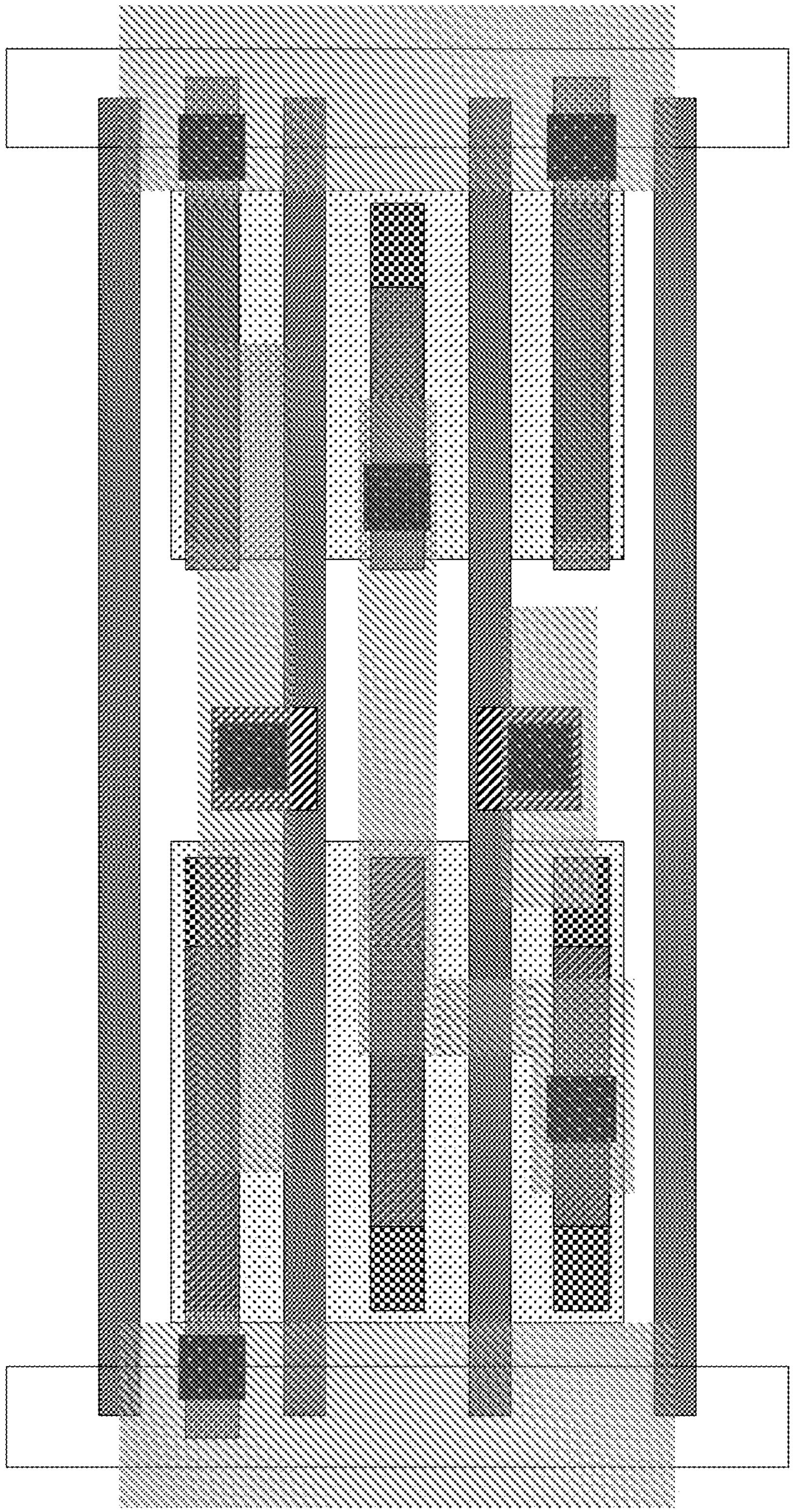
FIG. 160 depicts a CKND2D1 cell.

Reference is made to FIG. 160, which depicts a CKND2D1 cell. This cell implements the function of an inverting clock driver in drive strength 1.

Figure 161:
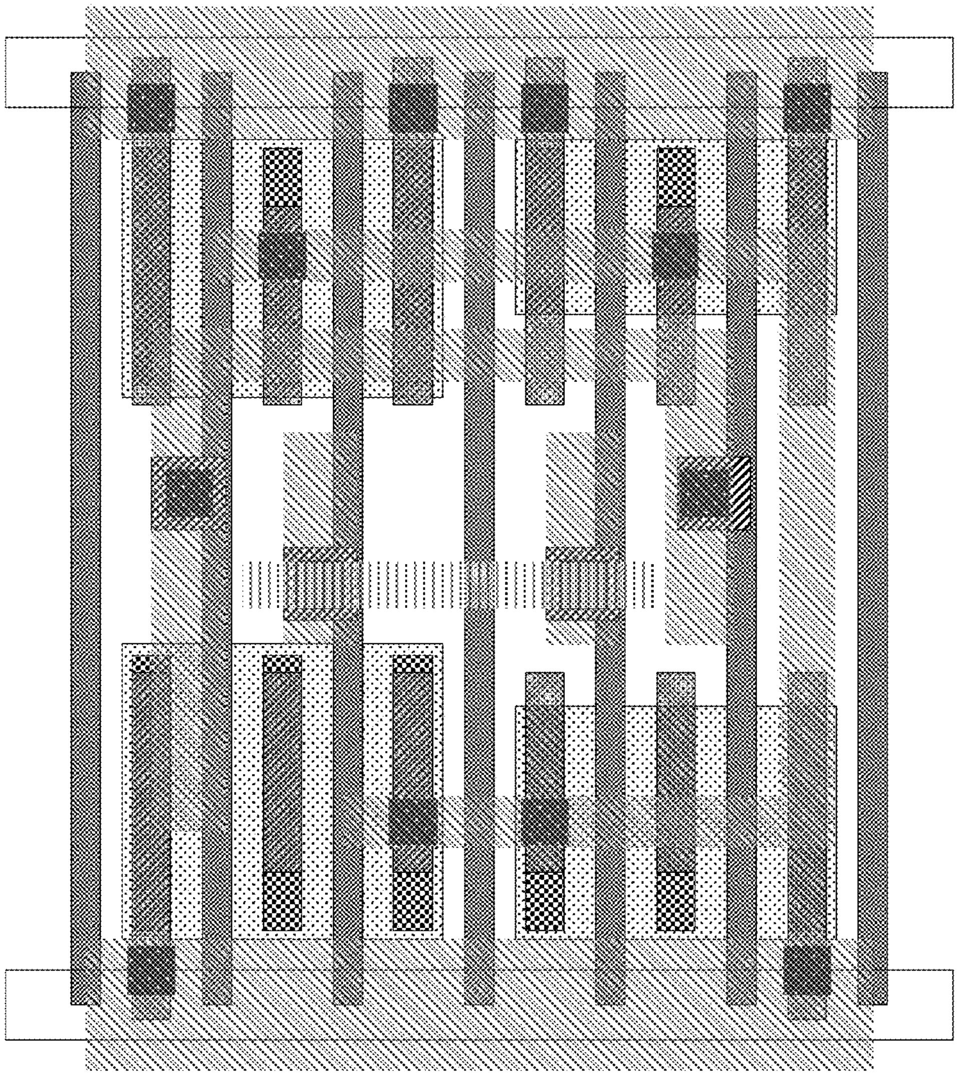
FIG. 161 depicts a CKND2D1P5 cell.

Reference is made to FIG. 161, which depicts a CKND2D1P5 cell. This cell implements the function of an inverting clock driver in drive strength 1.5.

Figure 162:
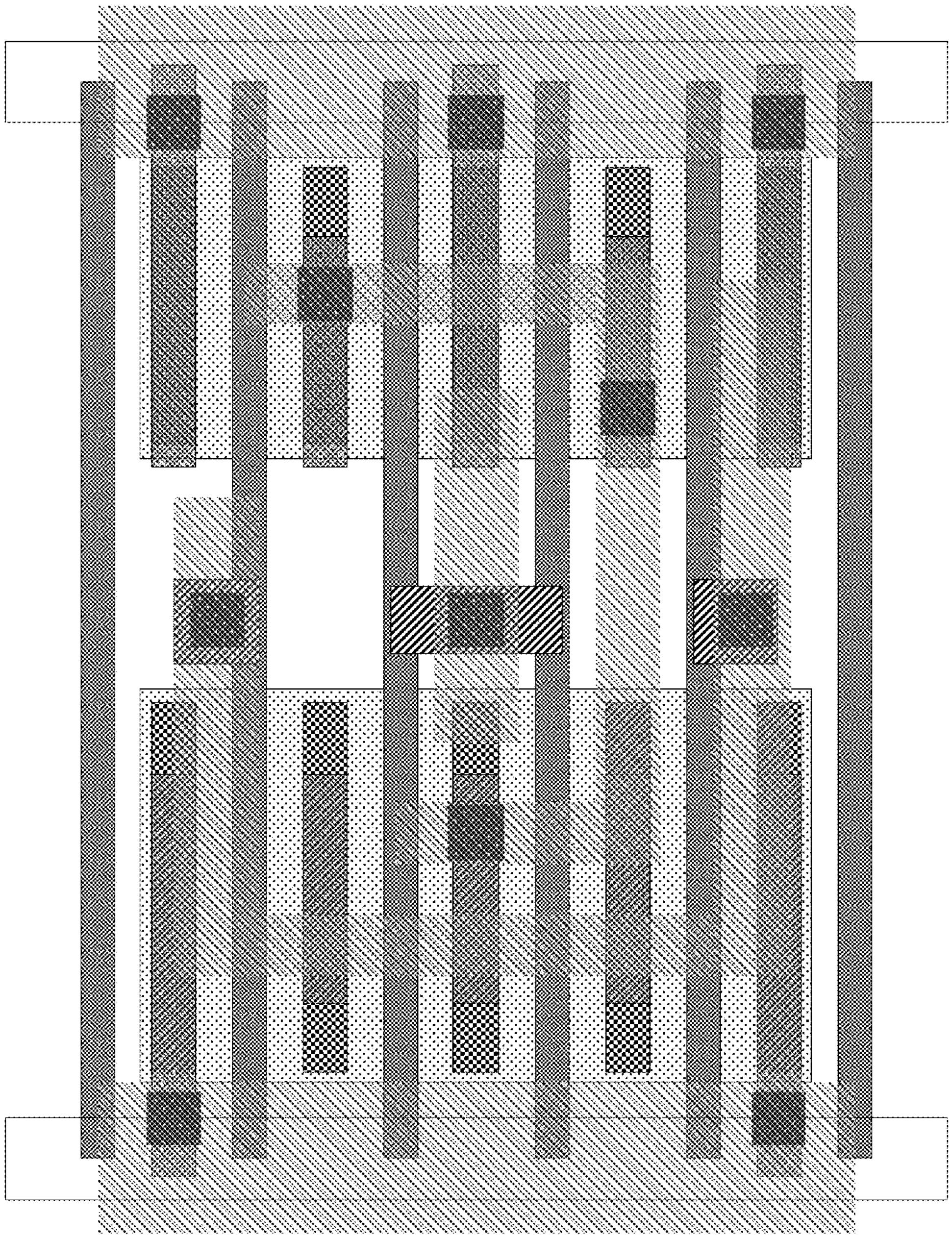
FIG. 162 depicts a CKND2D2 cell.

Reference is made to FIG. 162, which depicts a CKND2D2 cell. This cell implements the function of an inverting clock driver in drive strength 2.

Figure 163:
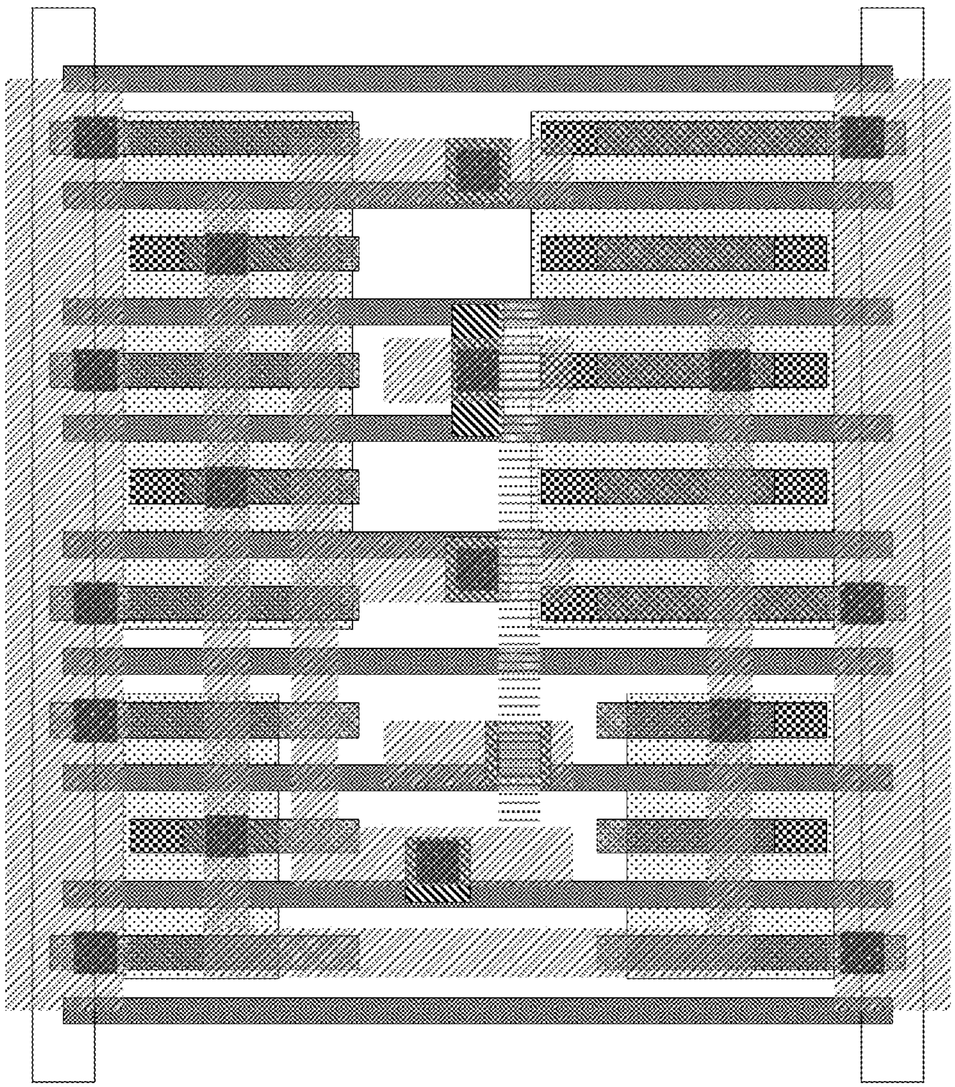
FIG. 163 depicts a CKND2D2P5 cell.

Reference is made to FIG. 163, which depicts a CKND2D2P5 cell. This cell implements the function of an inverting clock driver in drive strength 2.5.

Figure 164:
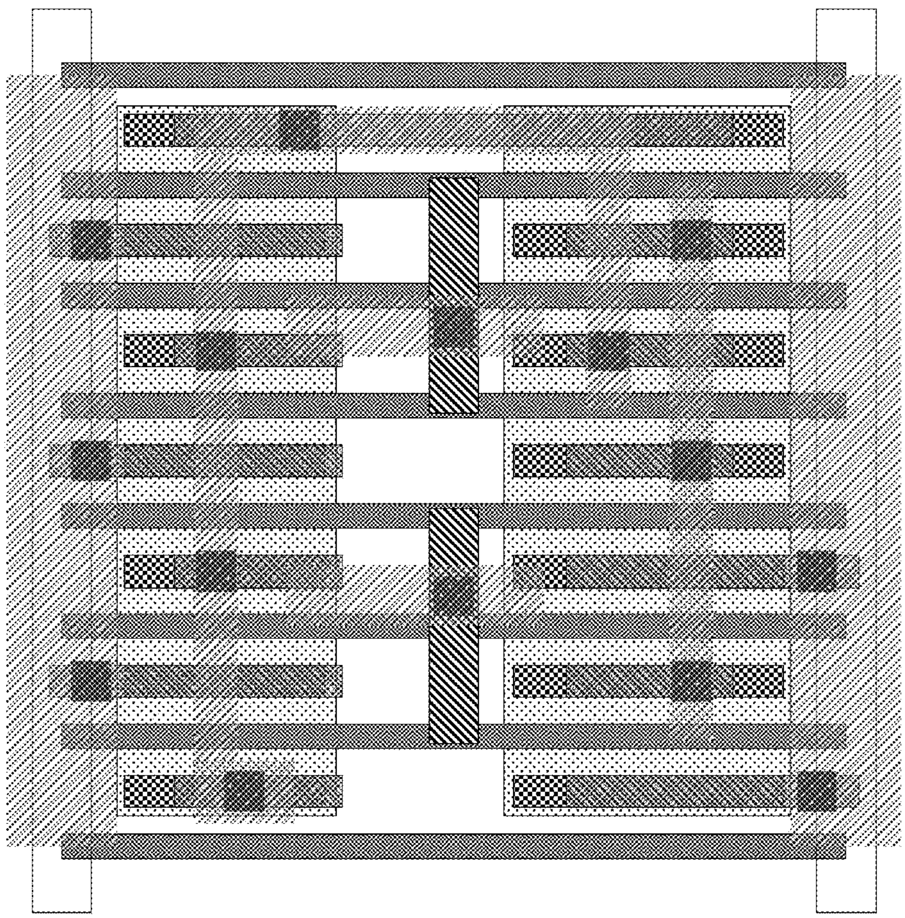
FIG. 164 depicts a CKND2D3 cell.

Reference is made to FIG. 164, which depicts a CKND2D3 cell. This cell implements the function of an inverting clock driver in drive strength 3.

Figure 165:
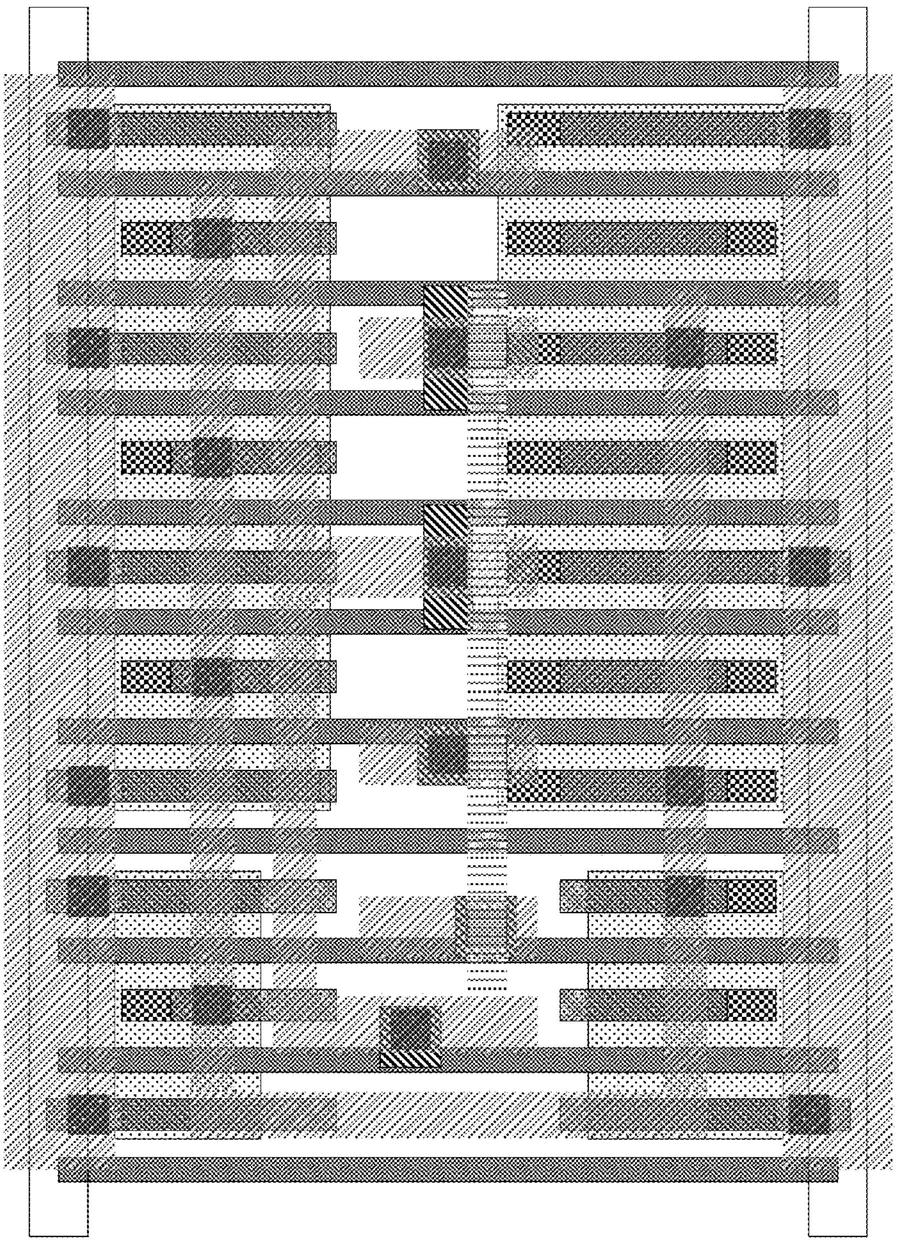
FIG. 165 depicts a CKND2D3P5 cell.

Reference is made to FIG. 165, which depicts a CKND2D3P5 cell. This cell implements the function of an inverting clock driver in drive strength 3.5.

Figure 166:
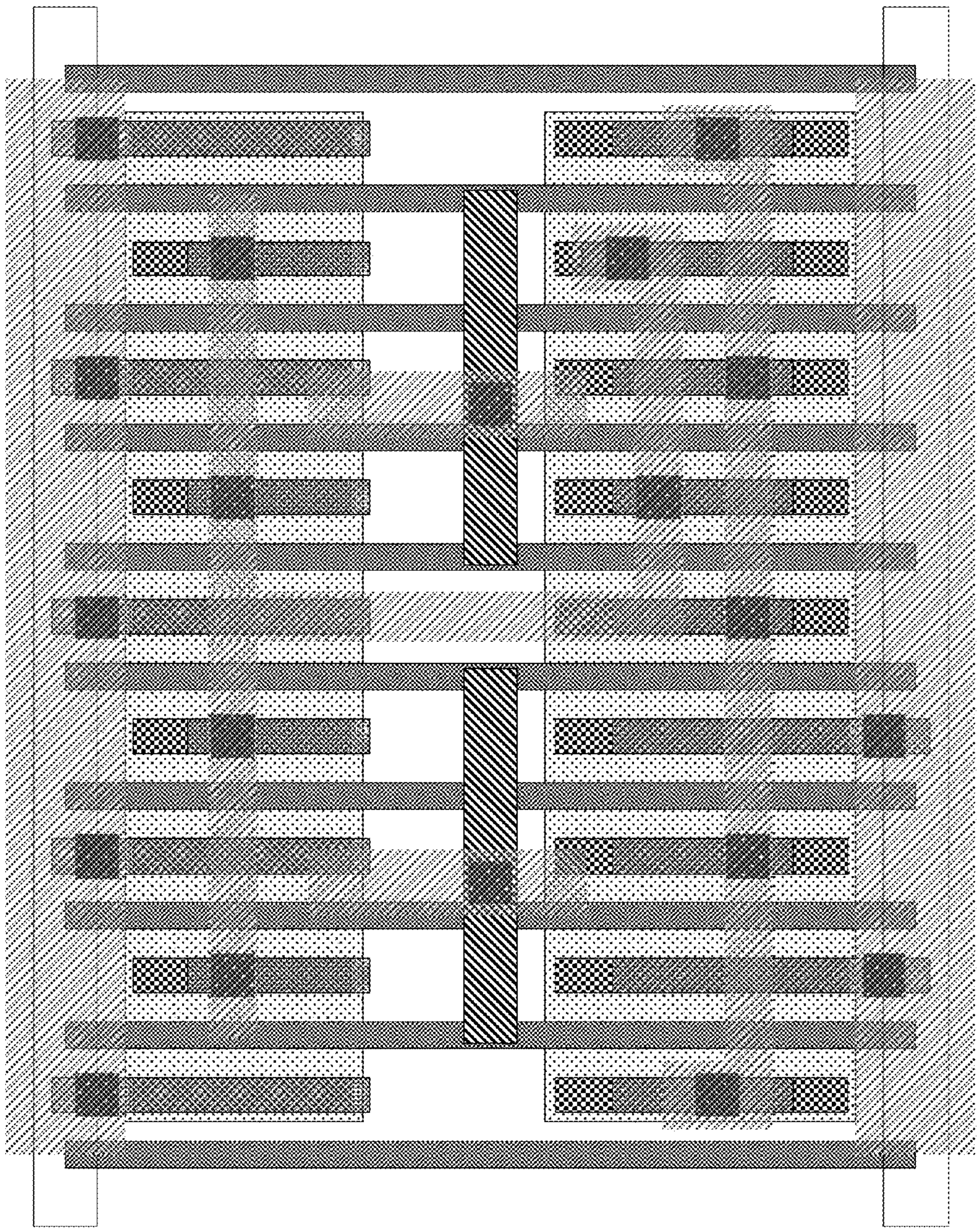
FIG. 166 depicts a CKND2D4 cell.

Reference is made to FIG. 166, which depicts a CKND2D4 cell. This cell implements the function of an inverting clock driver in drive strength 4.

Figure 167:
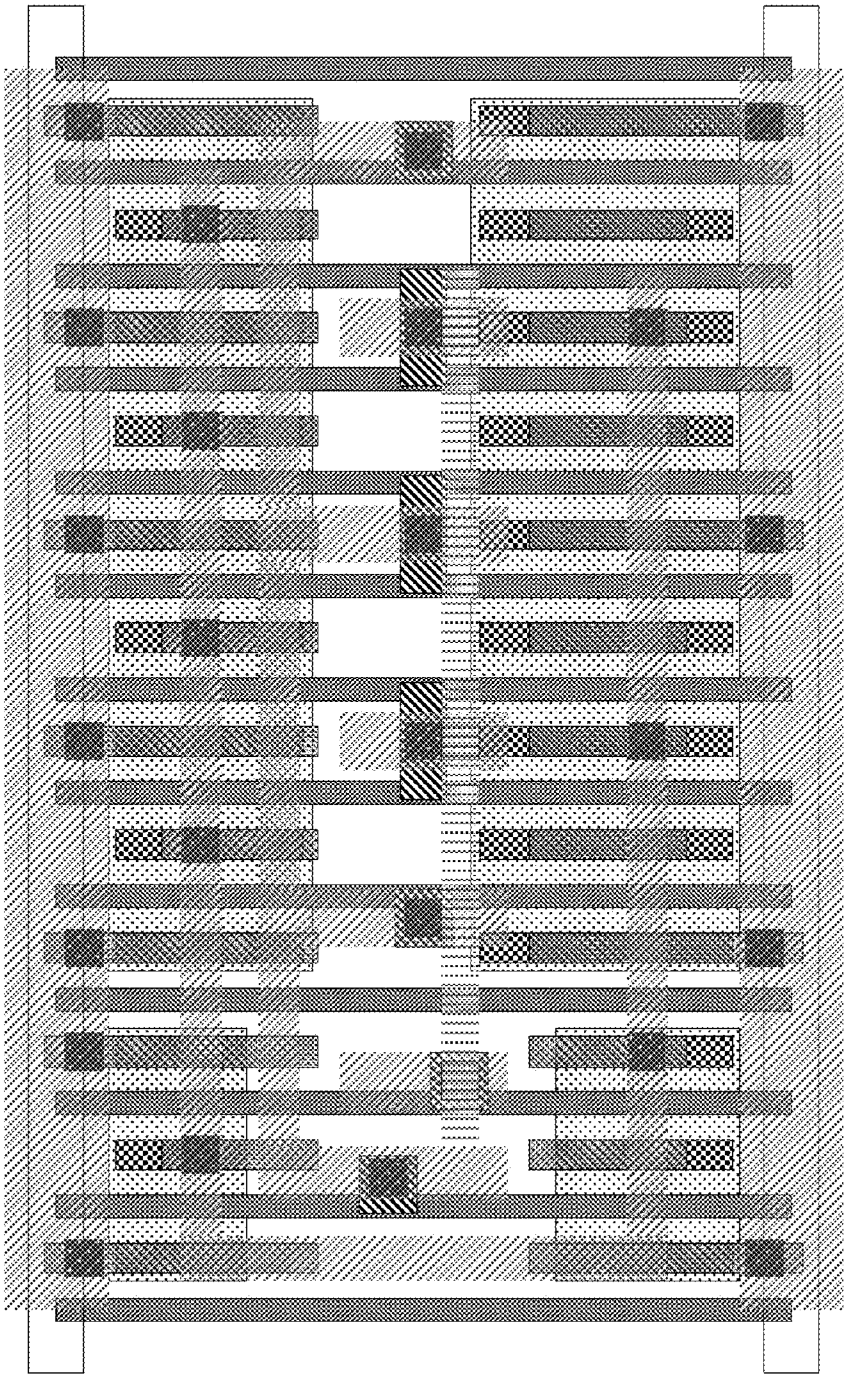
FIG. 167 depicts a CKND2D4P5 cell.

Reference is made to FIG. 167, which depicts a CKND2D4P5 cell. This cell implements the function of an inverting clock driver in drive strength 4.5.

Figure 168:
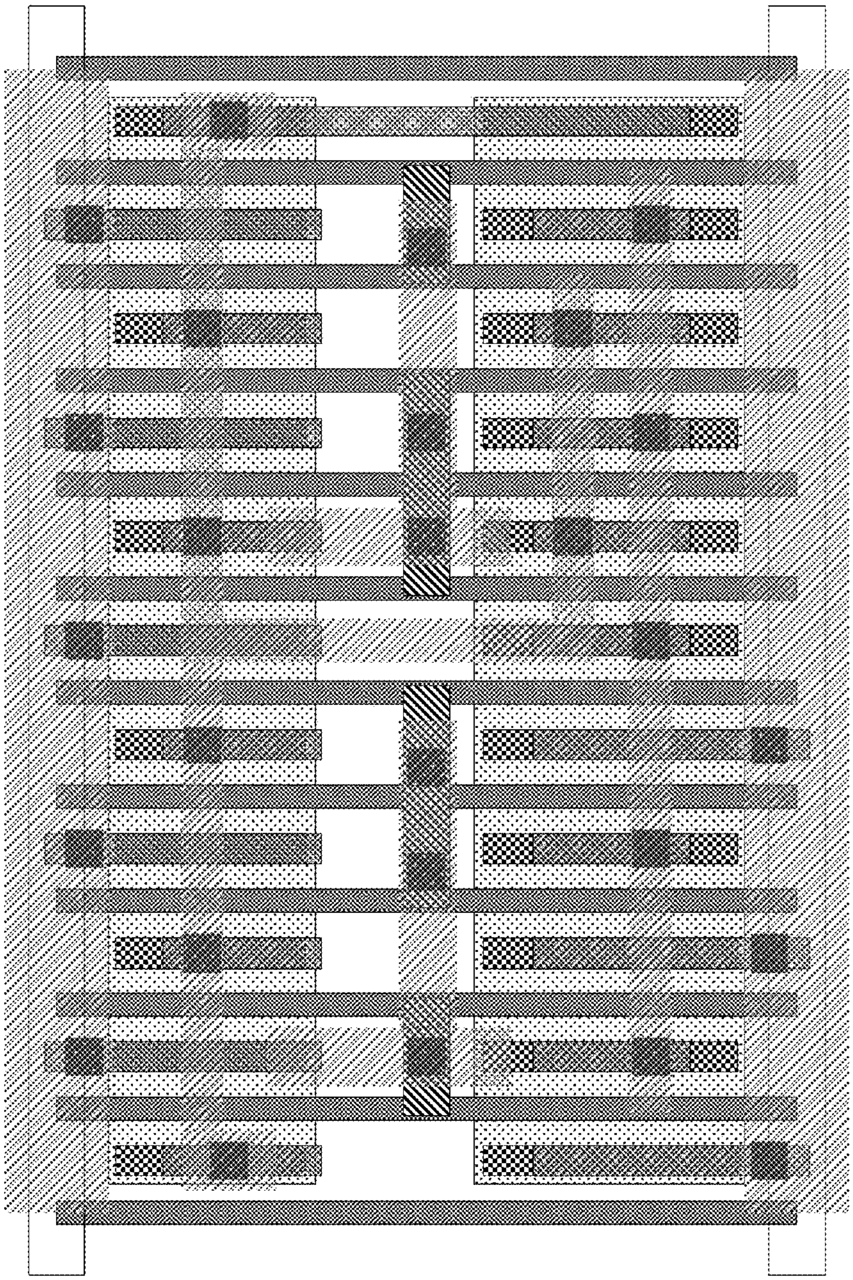
FIG. 168 depicts a CKND2D5 cell.

Reference is made to FIG. 168, which depicts a CKND2D5 cell. This cell implements the function of an inverting clock driver in drive strength 5.

Figure 169:
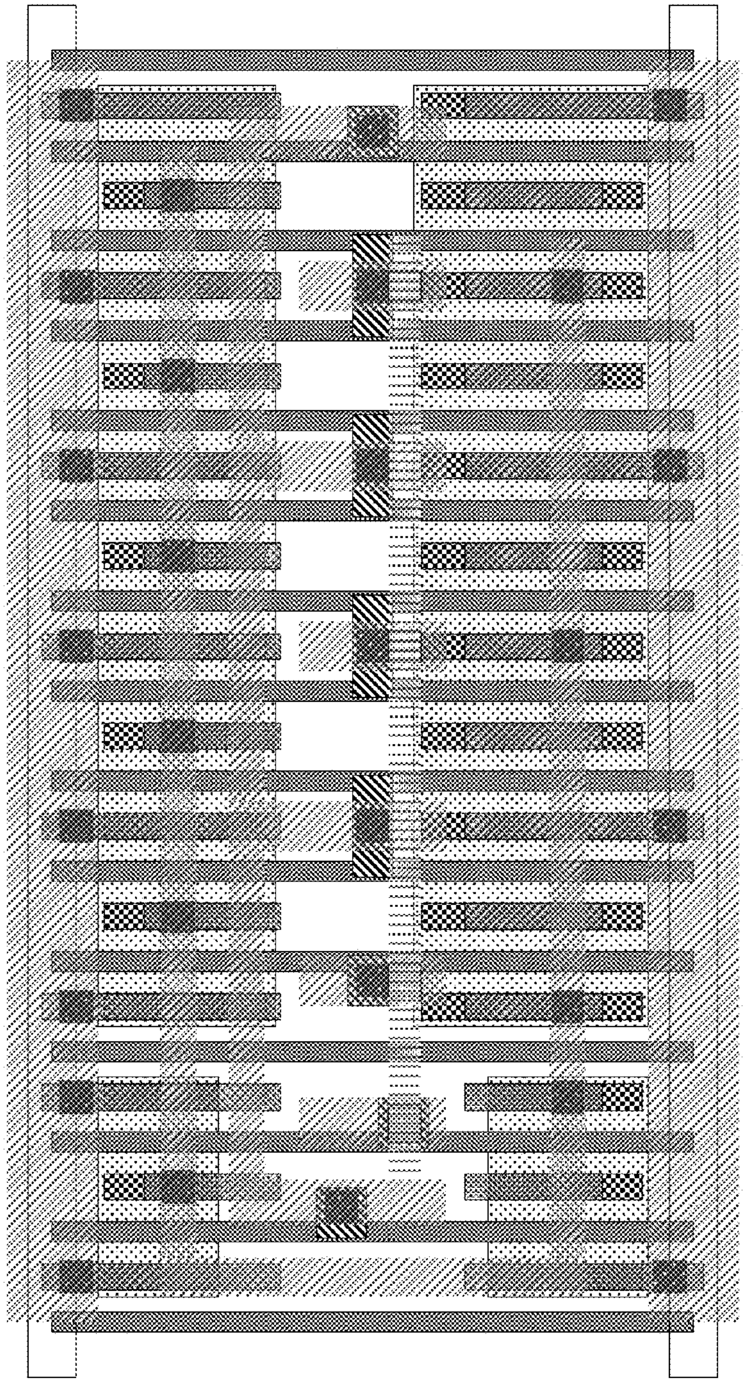
FIG. 169 depicts a CKND2D5P5 cell.

Reference is made to FIG. 169, which depicts a CKND2D5P5 cell. This cell implements the function of an inverting clock driver in drive strength 5.5.

Figure 170:
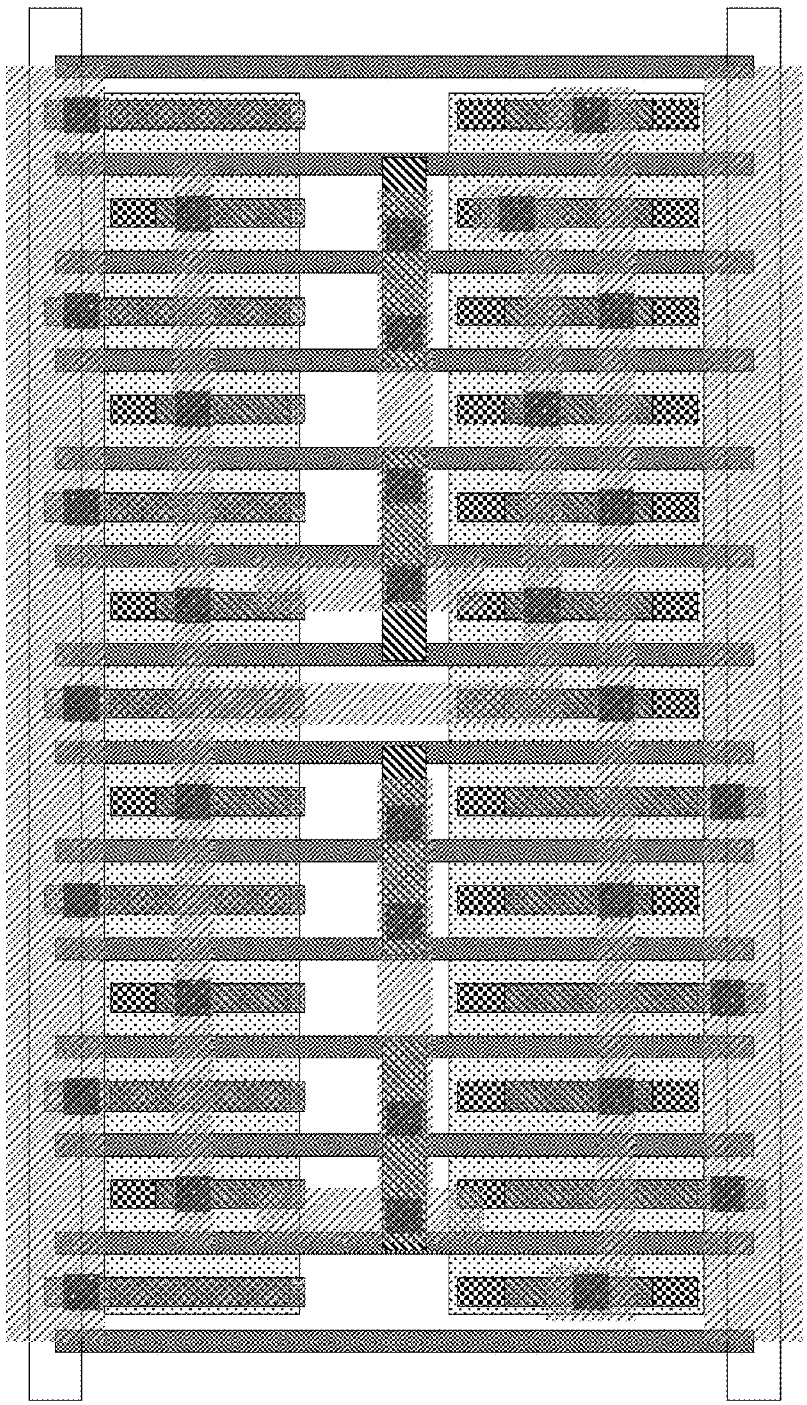
FIG. 170 depicts a CKND2D6 cell.

Reference is made to FIG. 170, which depicts a CKND2D6 cell. This cell implements the function of an inverting clock driver in drive strength 6.

Figure 171:
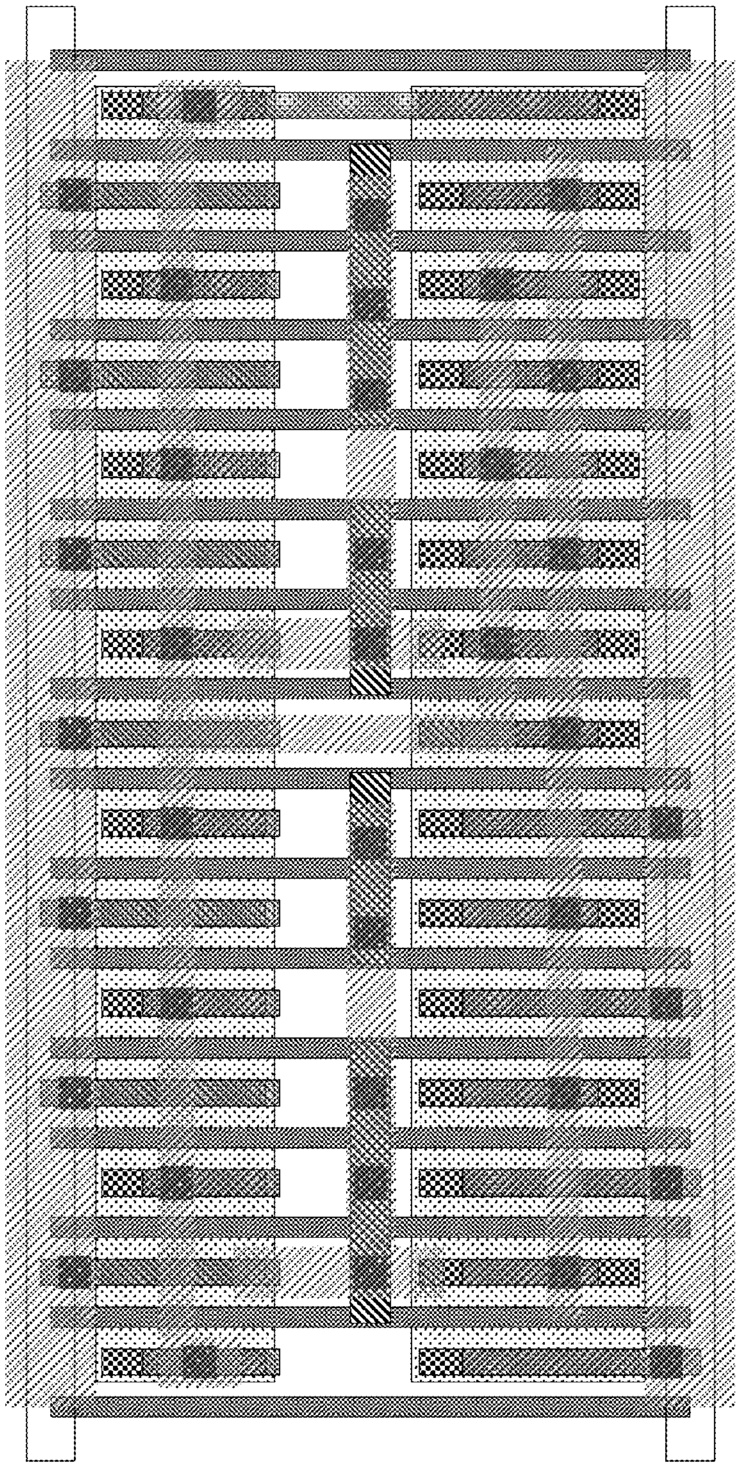
FIG. 171 depicts a CKND2D7 cell.

Reference is made to FIG. 171, which depicts a CKND2D7 cell. This cell implements the function of an inverting clock driver in drive strength 7.

Figure 172:
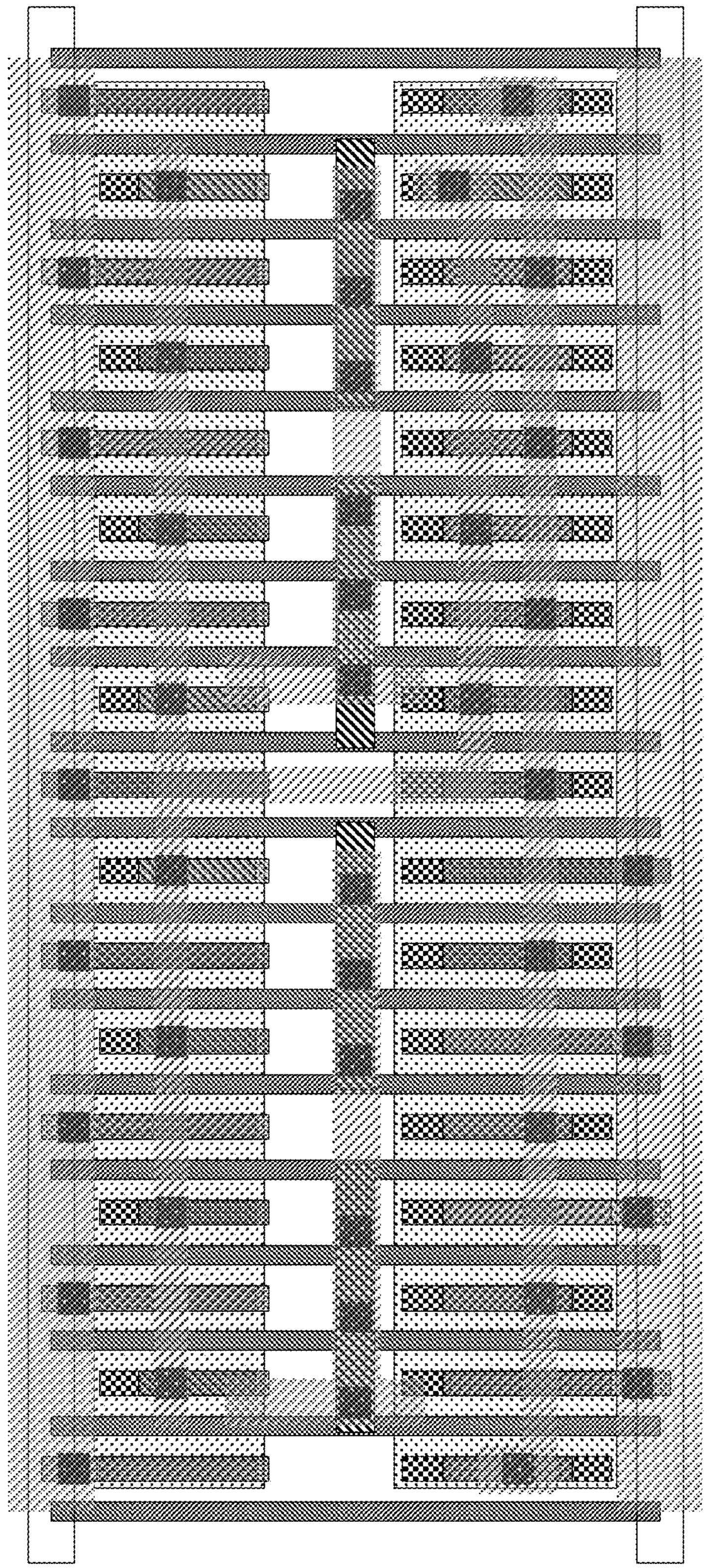
FIG. 172 depicts a CKND2D8 cell.

Reference is made to FIG. 172, which depicts a CKND2D8 cell. This cell implements the function of an inverting clock driver in drive strength 8.

Figure 173:
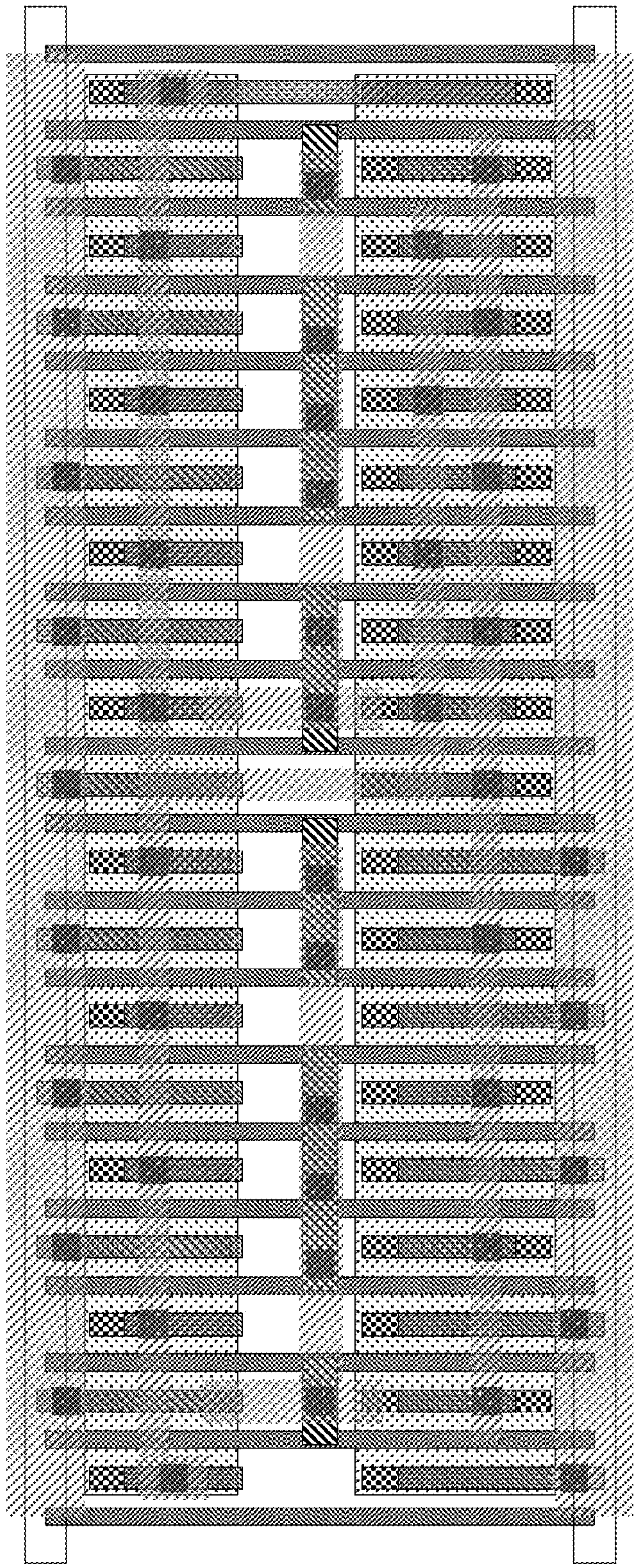
FIG. 173 depicts a CKND2D9 cell.

Reference is made to FIG. 173, which depicts a CKND2D9 cell. This cell implements the function of an inverting clock driver in drive strength 9.

Figure 174:
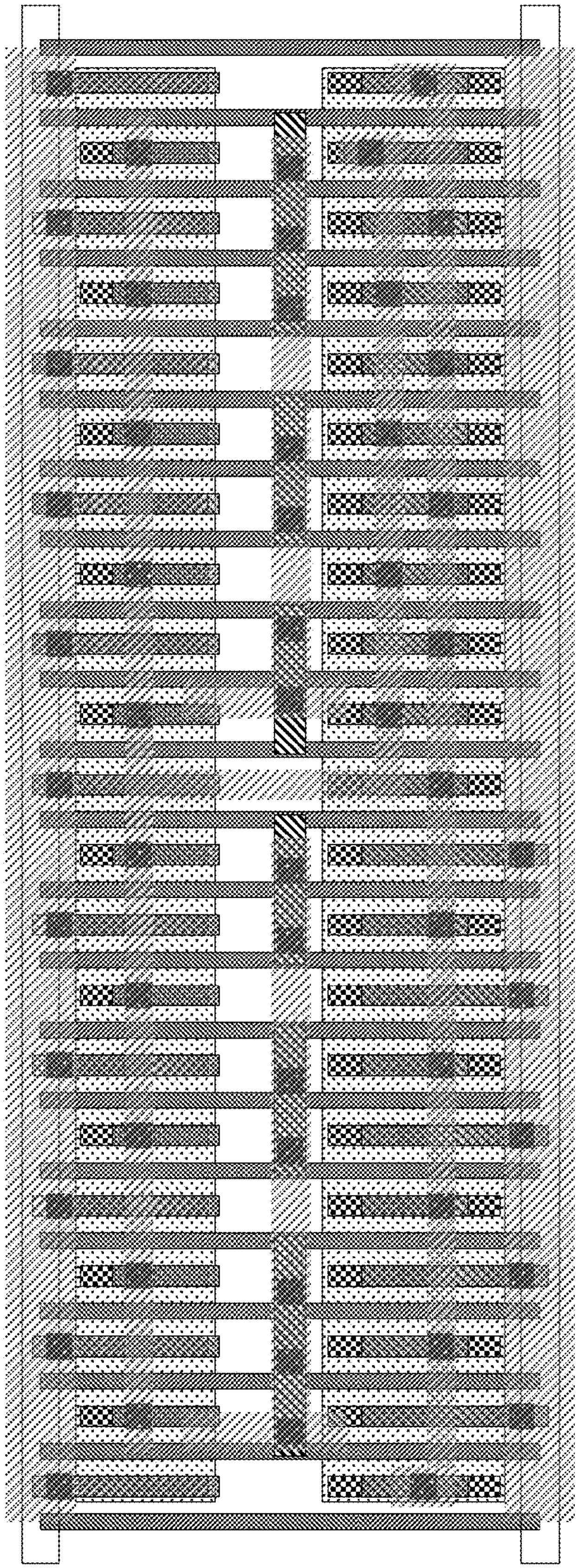
FIG. 174 depicts a CKND2D10 cell.

Reference is made to FIG. 174, which depicts a CKND2D10 cell. This cell implements the function of an inverting clock driver in drive strength 10.

Figure 175:
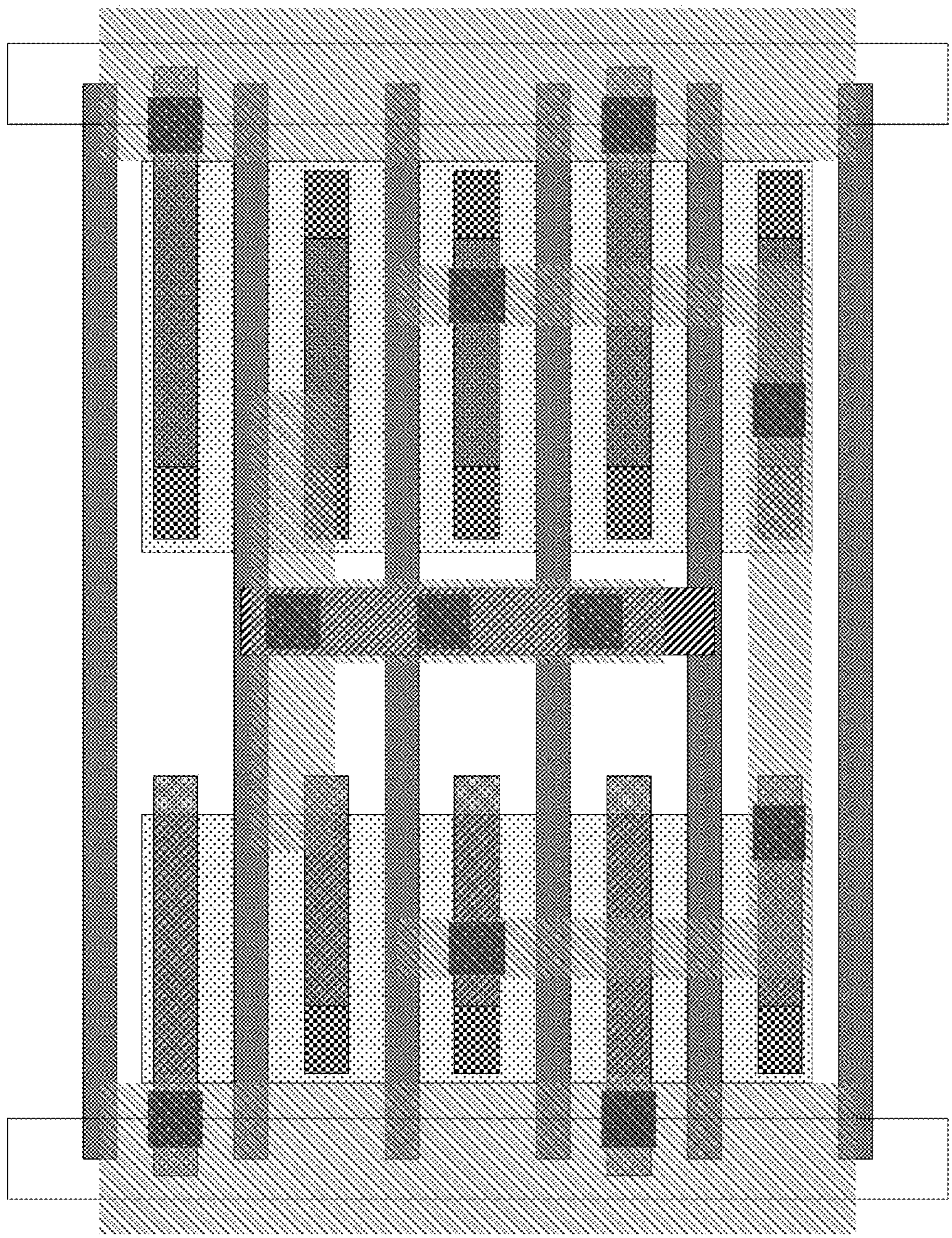
FIG. 175 depicts a CKND2P5 cell.

Reference is made to FIG. 175, which depicts a CKND2P5 cell. This cell implements the function of an inverting clock driver in drive strength 2.5.

Figure 176:
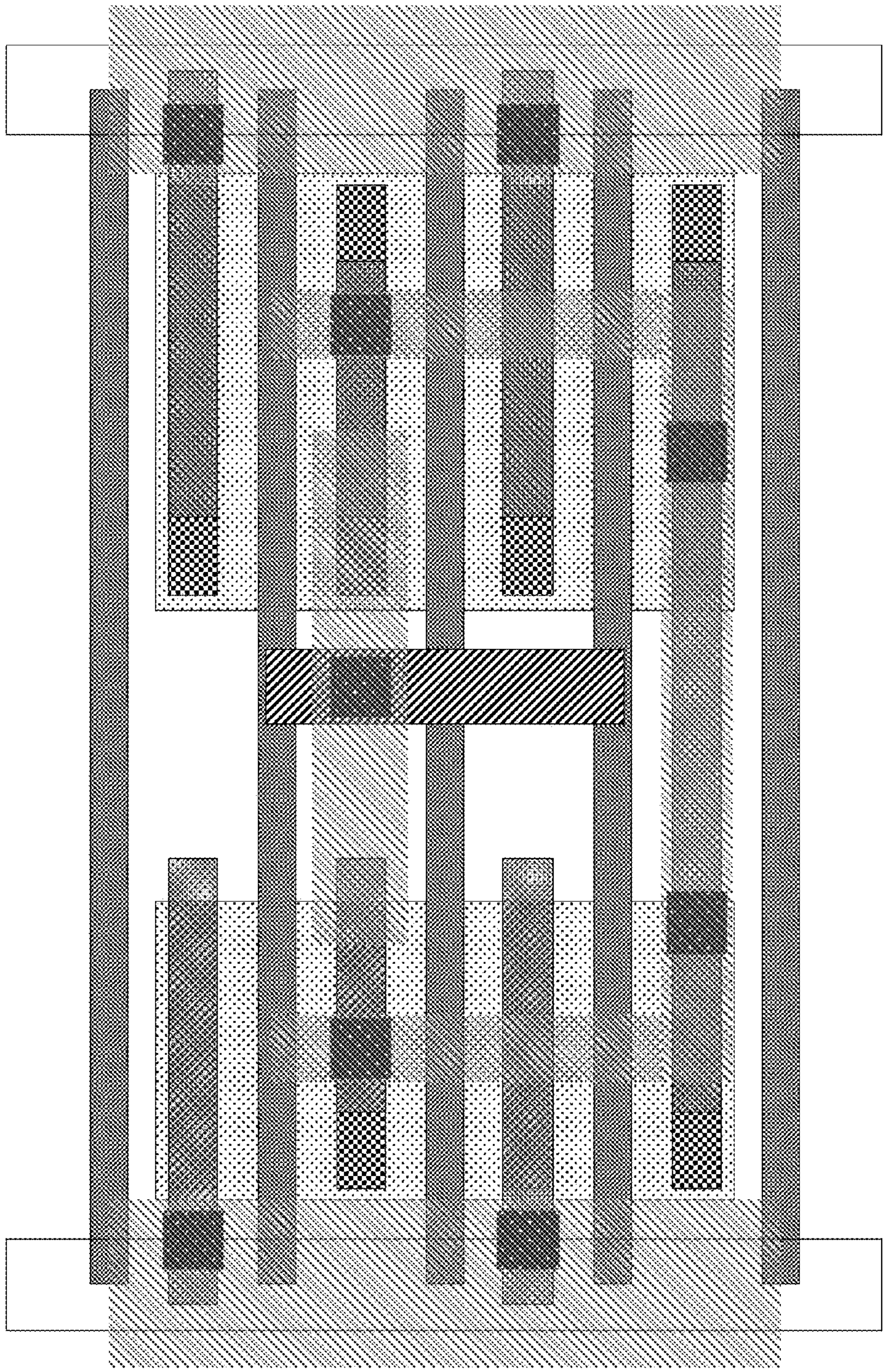
FIG. 176 depicts a CKND3 cell.

Reference is made to FIG. 176, which depicts a CKND3 cell. This cell implements the function of an inverting clock driver in drive strength 3.

Figure 177:
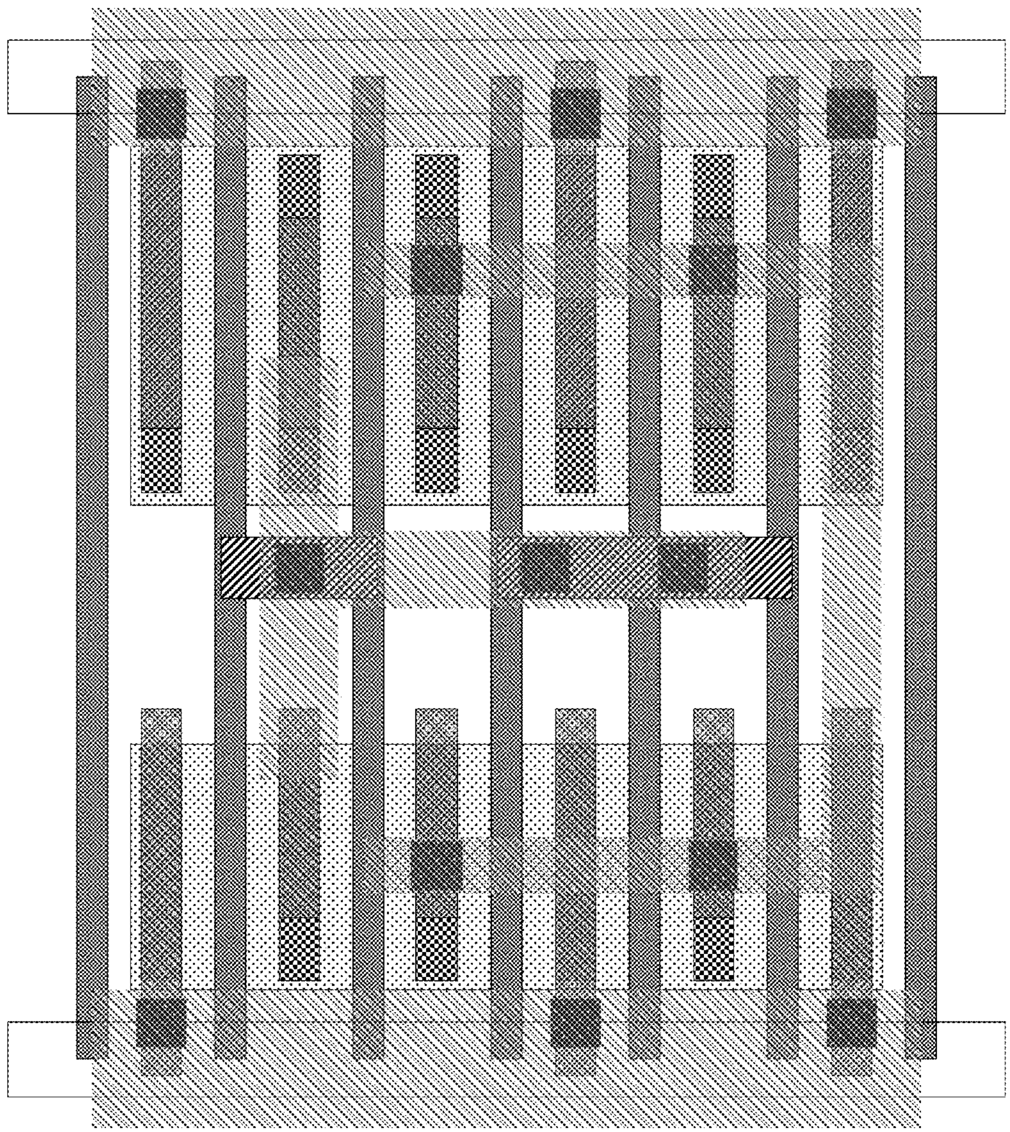
FIG. 177 depicts a CKND3P5 cell.

Reference is made to FIG. 177, which depicts a CKND3P5 cell. This cell implements the function of an inverting clock driver in drive strength 3.5.

Figure 178:
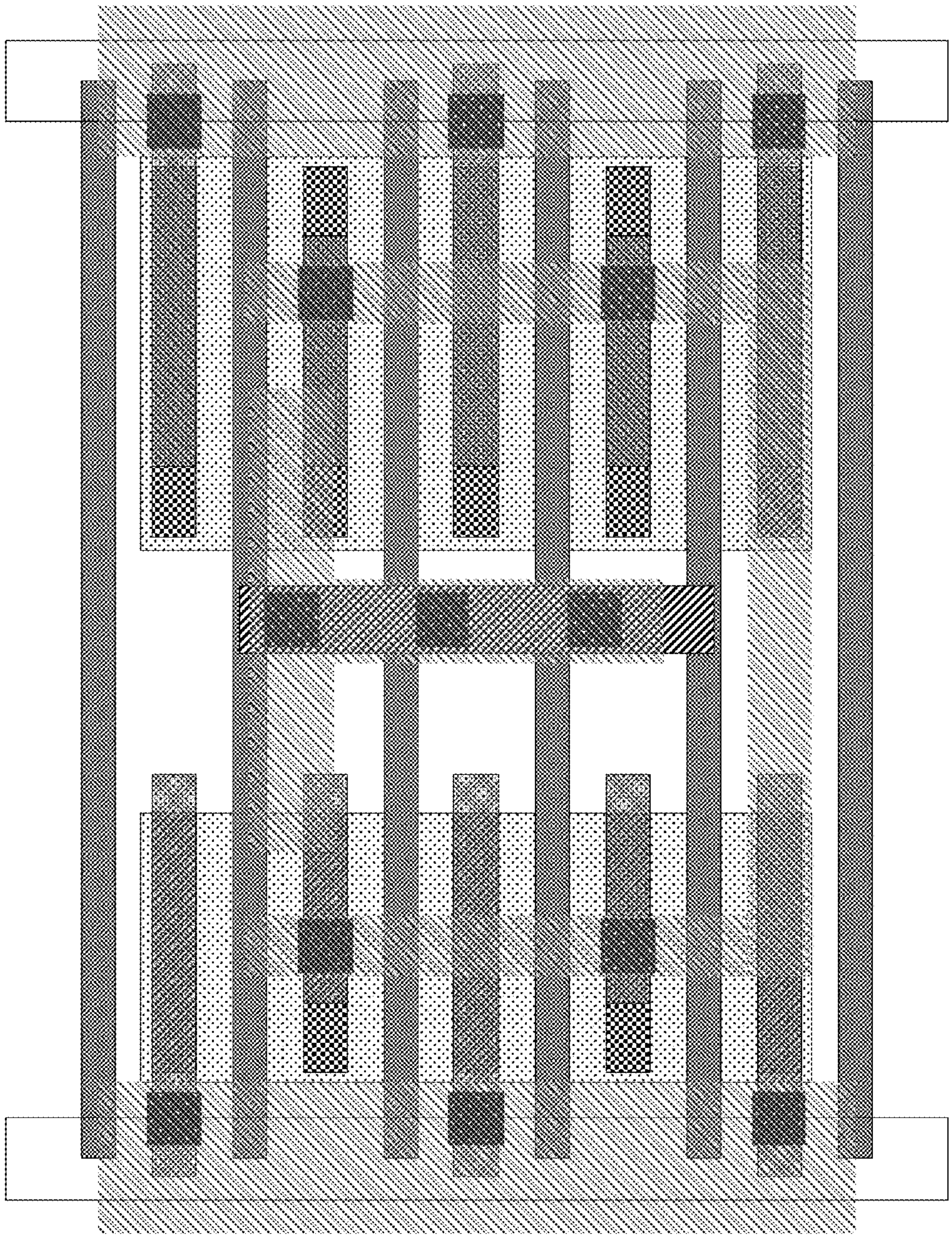
FIG. 178 depicts a CKND4 cell.

Reference is made to FIG. 178, which depicts a CKND4 cell. This cell implements the function of an inverting clock driver in drive strength 4.

Figure 179:
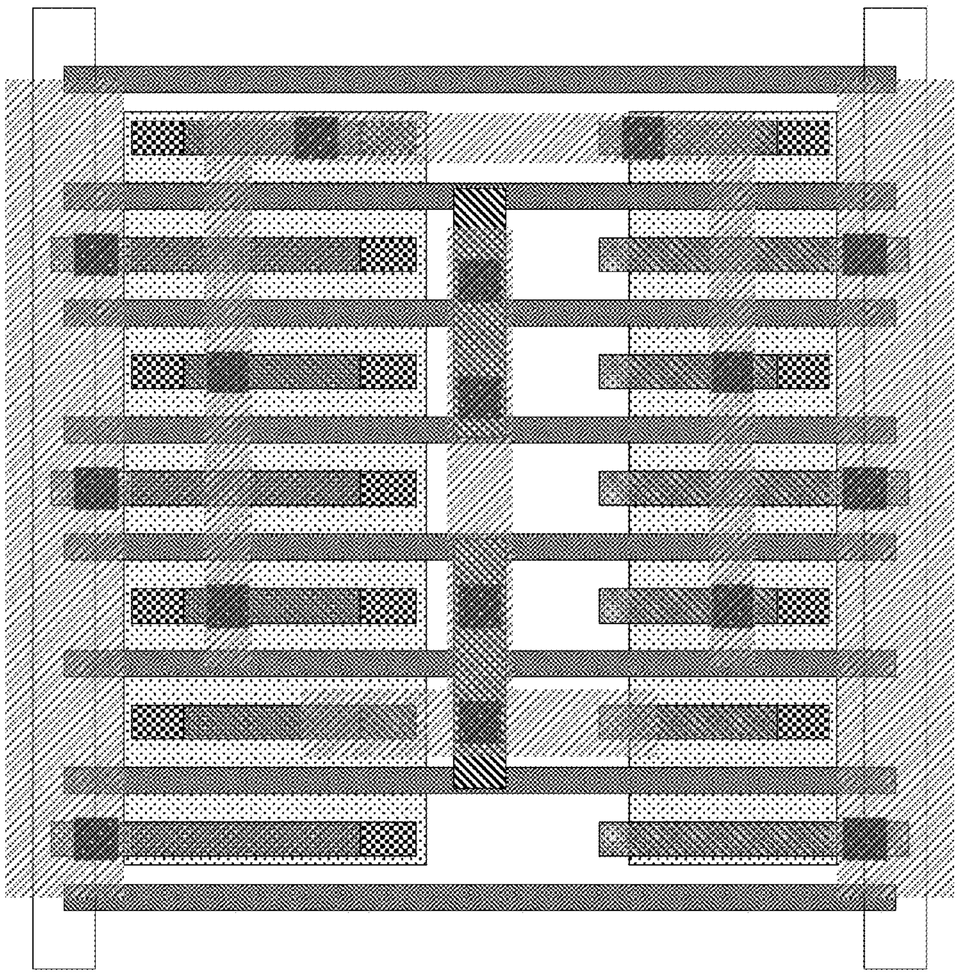
FIG. 179 depicts a CKND4P5 cell.

Reference is made to FIG. 179, which depicts a CKND4P5 cell. This cell implements the function of an inverting clock driver in drive strength 4.5.

Figure 180:
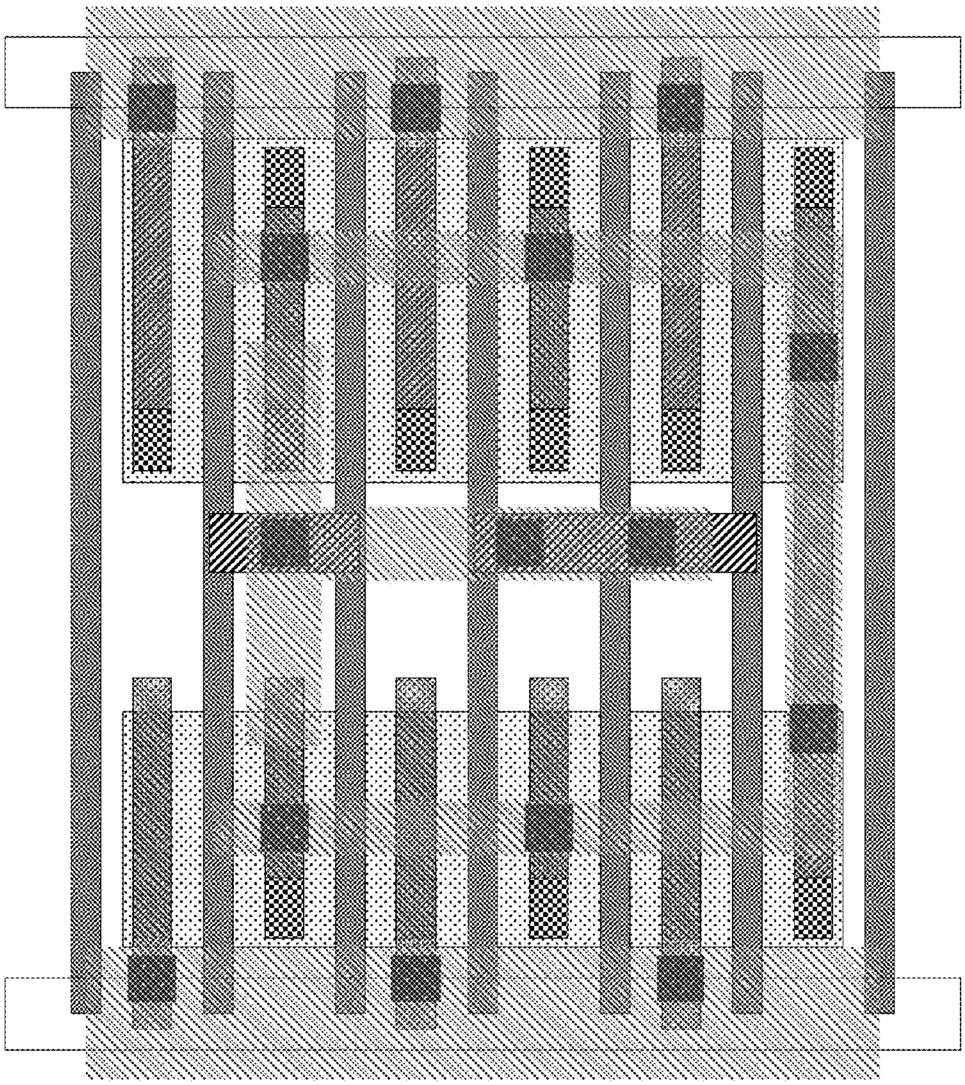
FIG. 180 depicts a CKND5 cell.

Reference is made to FIG. 180, which depicts a CKND5 cell. This cell implements the function of an inverting clock driver in drive strength 5.

Figure 181:
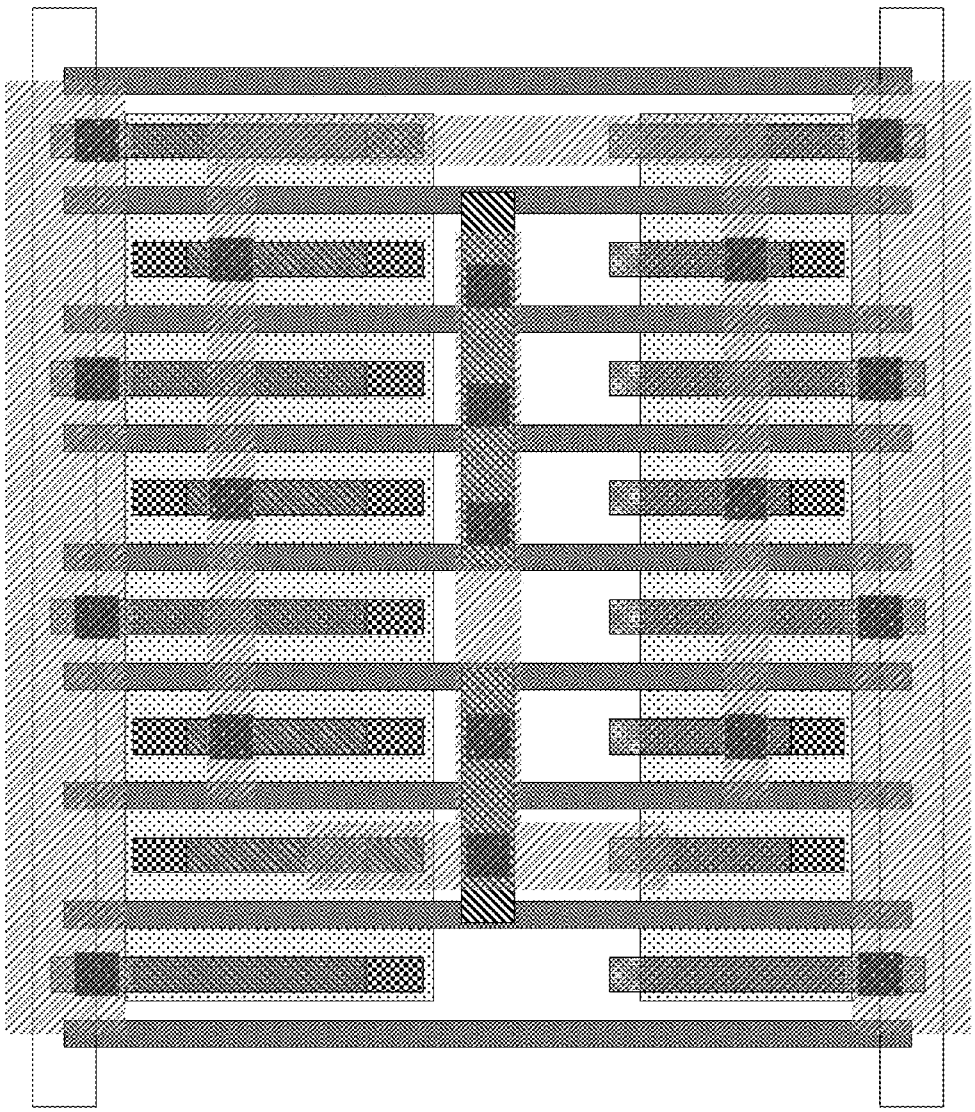
FIG. 181 depicts a CKND5P5 cell.

Reference is made to FIG. 181, which depicts a CKND5P5 cell. This cell implements the function of an inverting clock driver in drive strength 5.5.

Figure 182:
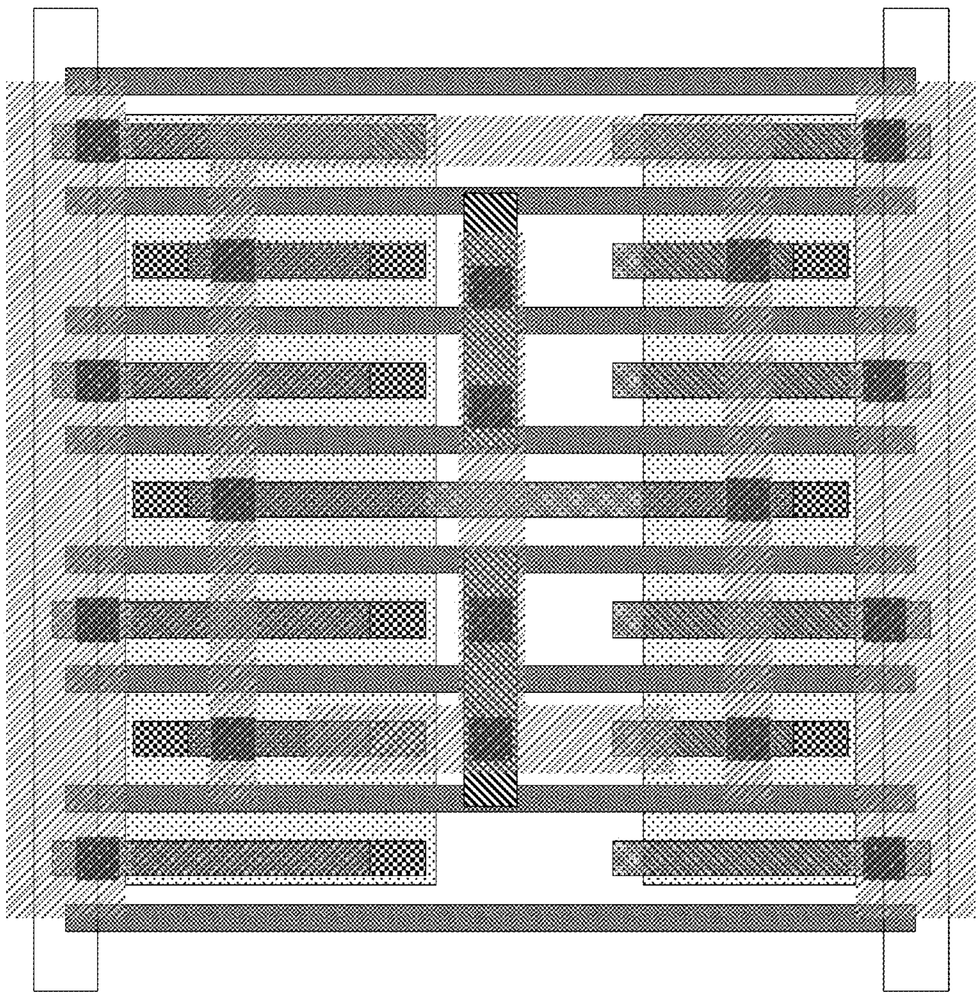
FIG. 182 depicts a CKND6 cell.

Reference is made to FIG. 182, which depicts a CKND6 cell. This cell implements the function of an inverting clock driver in drive strength 6.

Figure 183:
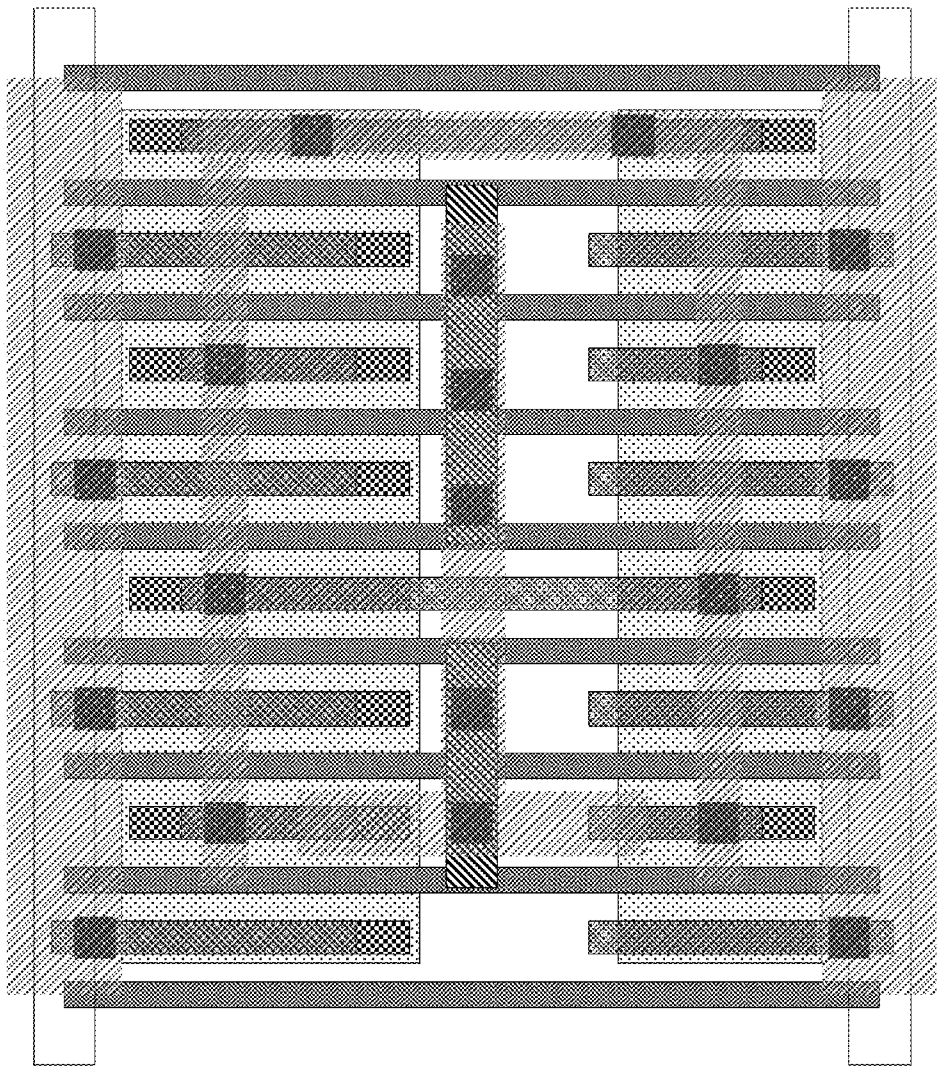
FIG. 183 depicts a CKND7 cell.

Reference is made to FIG. 183, which depicts a CKND7 cell. This cell implements the function of an inverting clock driver in drive strength 7.

Figure 184:
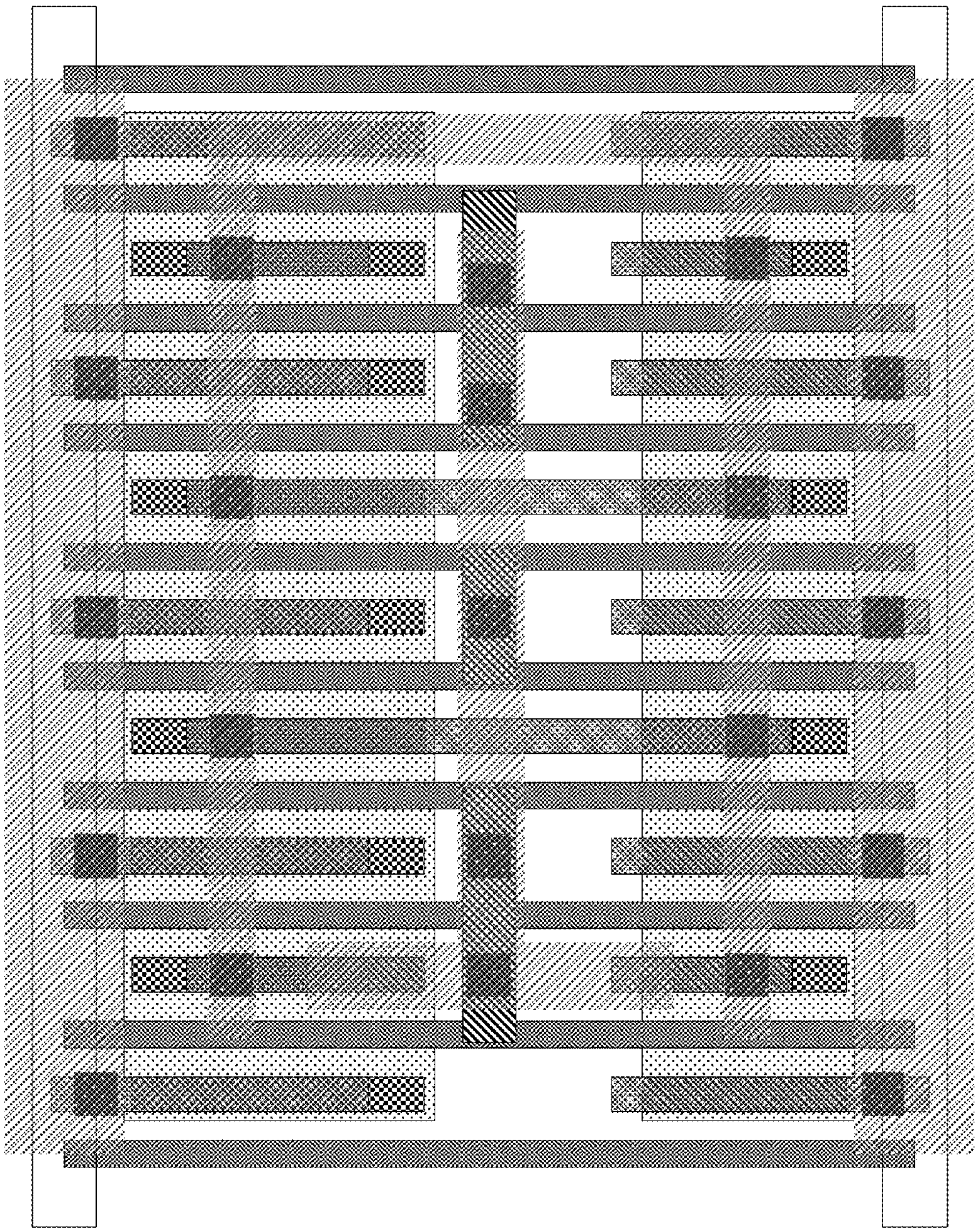
FIG. 184 depicts a CKND8 cell.

Reference is made to FIG. 184, which depicts a CKND8 cell. This cell implements the function of an inverting clock driver in drive strength 8.

Figure 185:
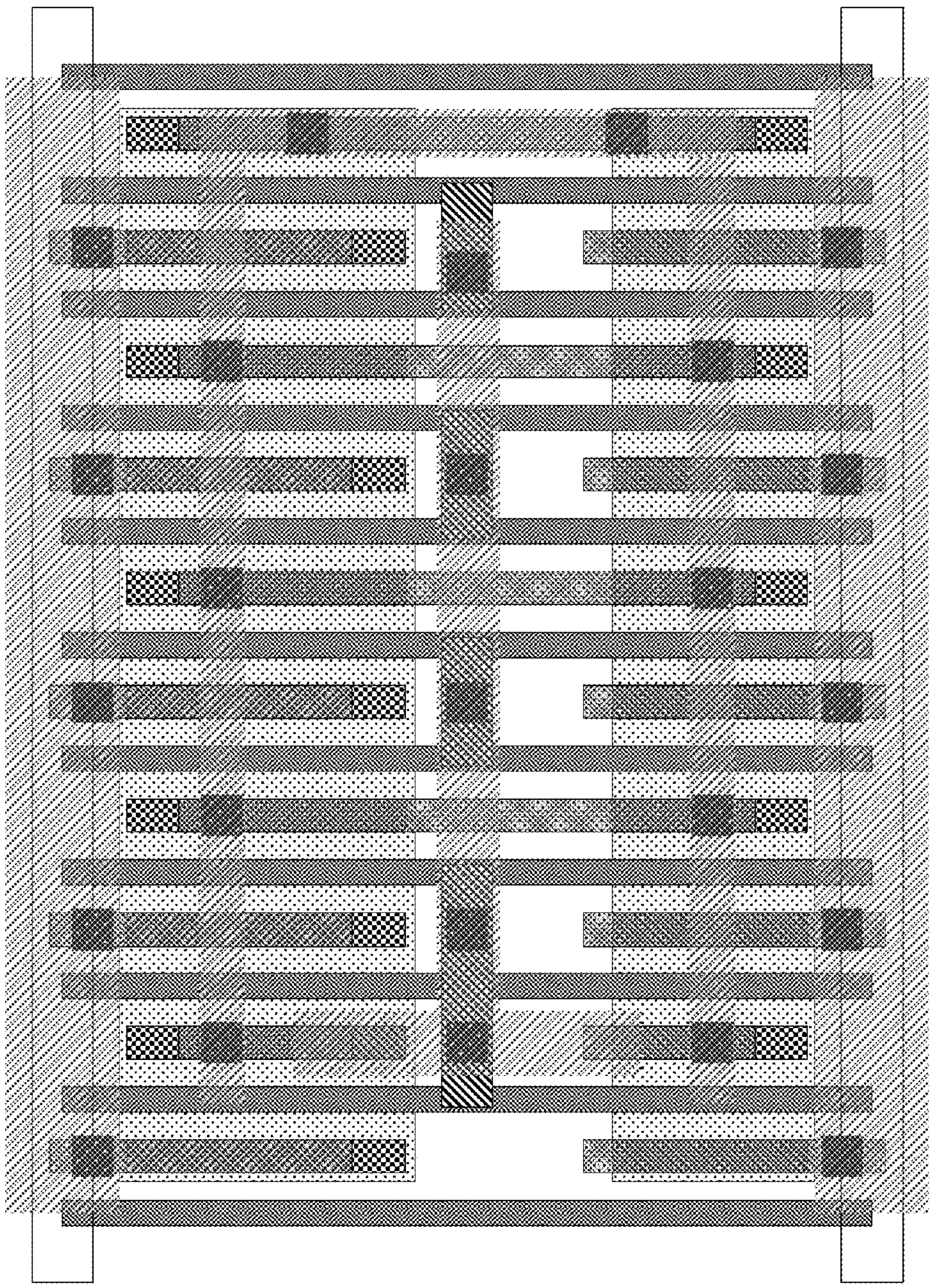
FIG. 185 depicts a CKND9 cell.

Reference is made to FIG. 185, which depicts a CKND9 cell. This cell implements the function of an inverting clock driver in drive strength 9.

Figure 186:
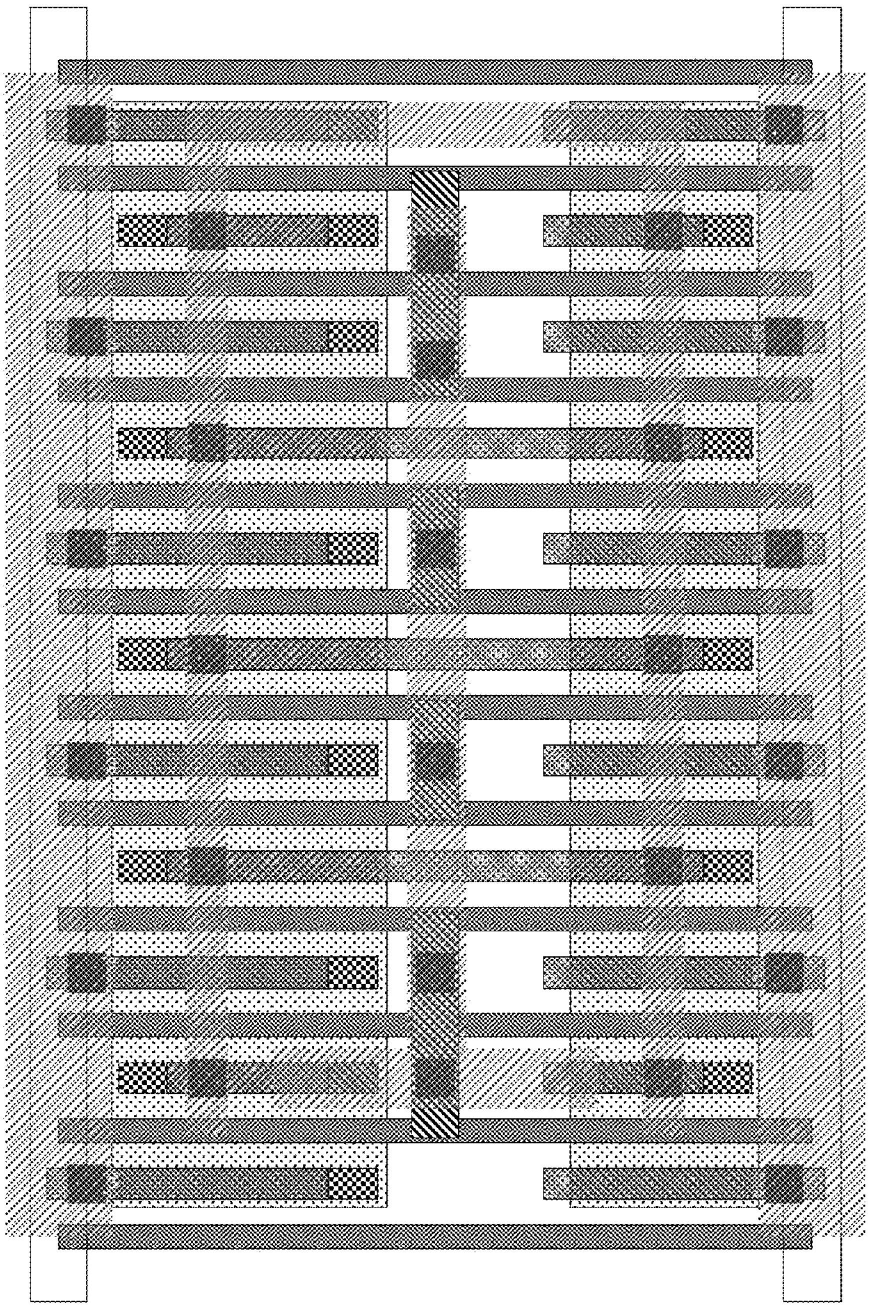
FIG. 186 depicts a CKND10 cell.

Reference is made to FIG. 186, which depicts a CKND10 cell. This cell implements the function of an inverting clock driver in drive strength 10.

Figure 187:
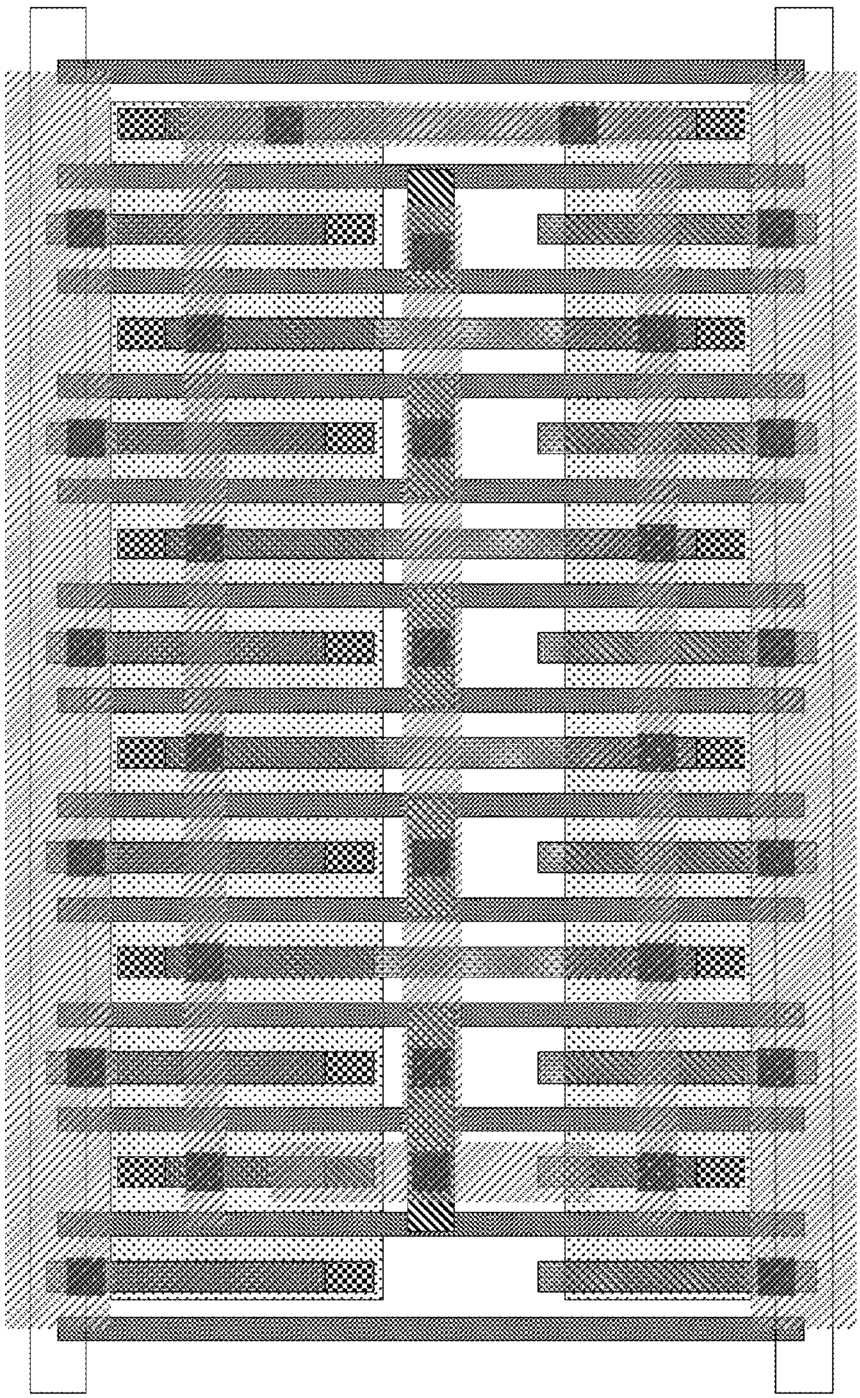
FIG. 187 depicts a CKND11 cell.

Reference is made to FIG. 187, which depicts a CKND11 cell. This cell implements the function of an inverting clock driver in drive strength 11.

Figure 188:
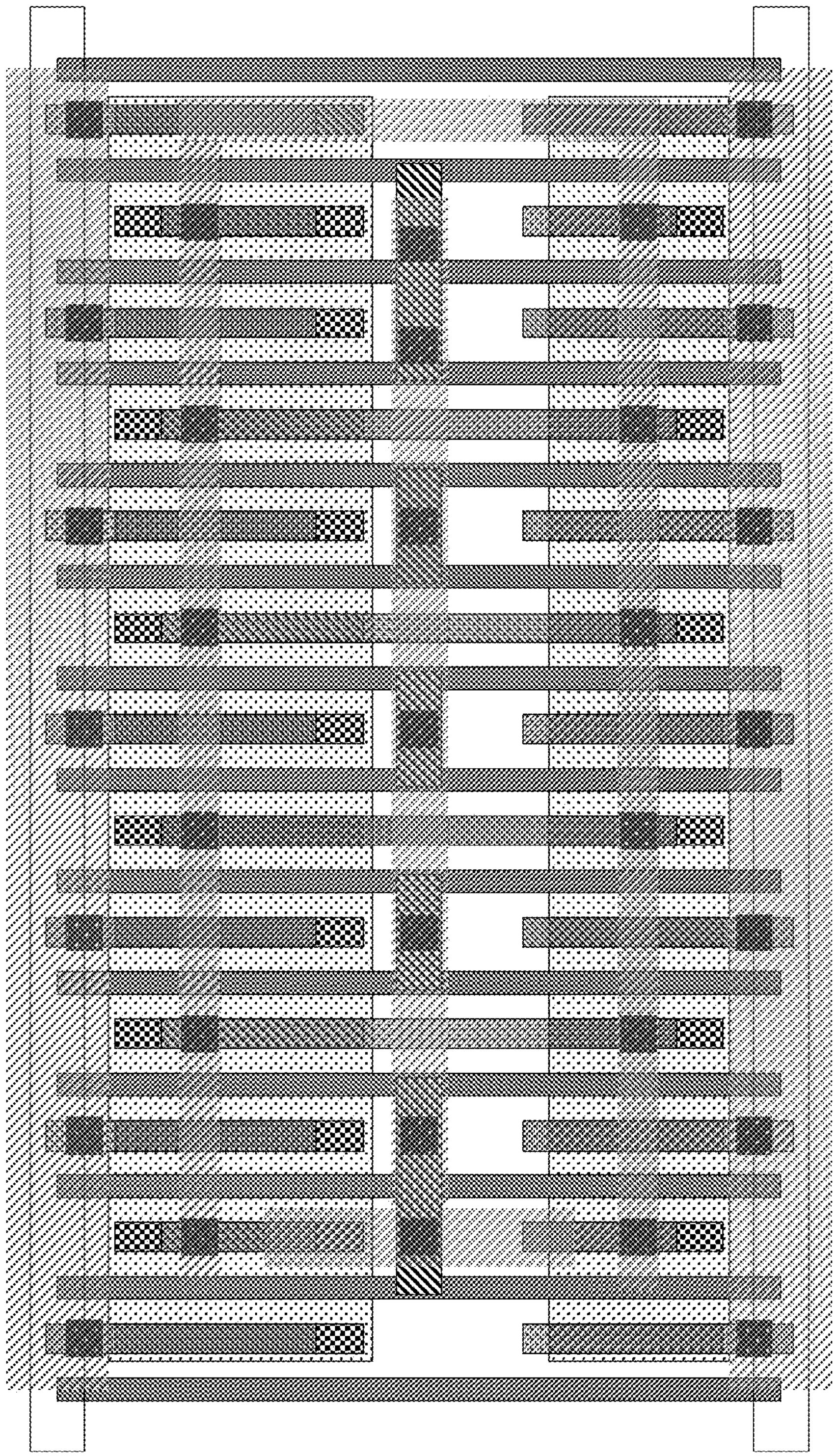
FIG. 188 depicts a CKND12 cell.

Reference is made to FIG. 188, which depicts a CKND12 cell. This cell implements the function of an inverting clock driver in drive strength 12.

Figure 189:
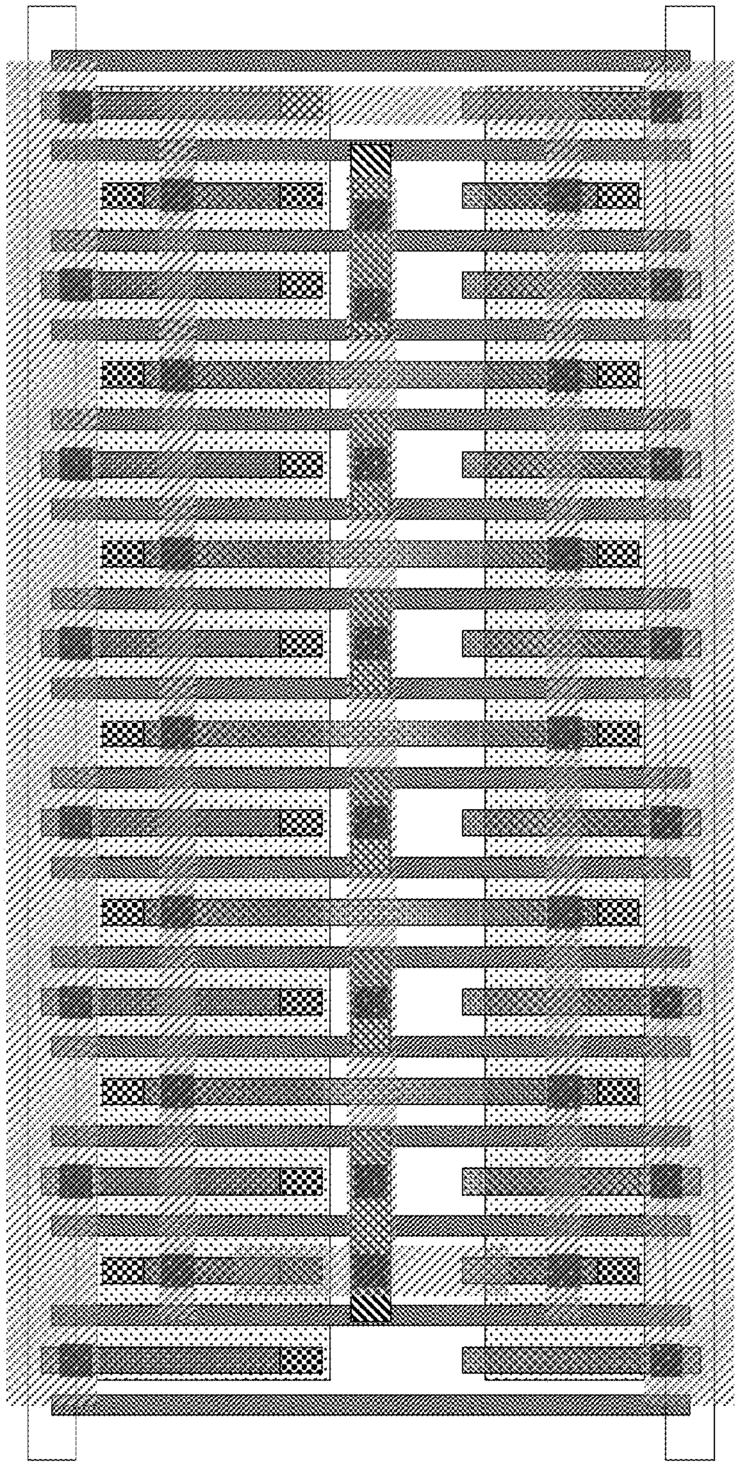
FIG. 189 depicts a CKND14 cell.

Reference is made to FIG. 189, which depicts a CKND14 cell. This cell implements the function of an inverting clock driver in drive strength 14.

Figure 190:
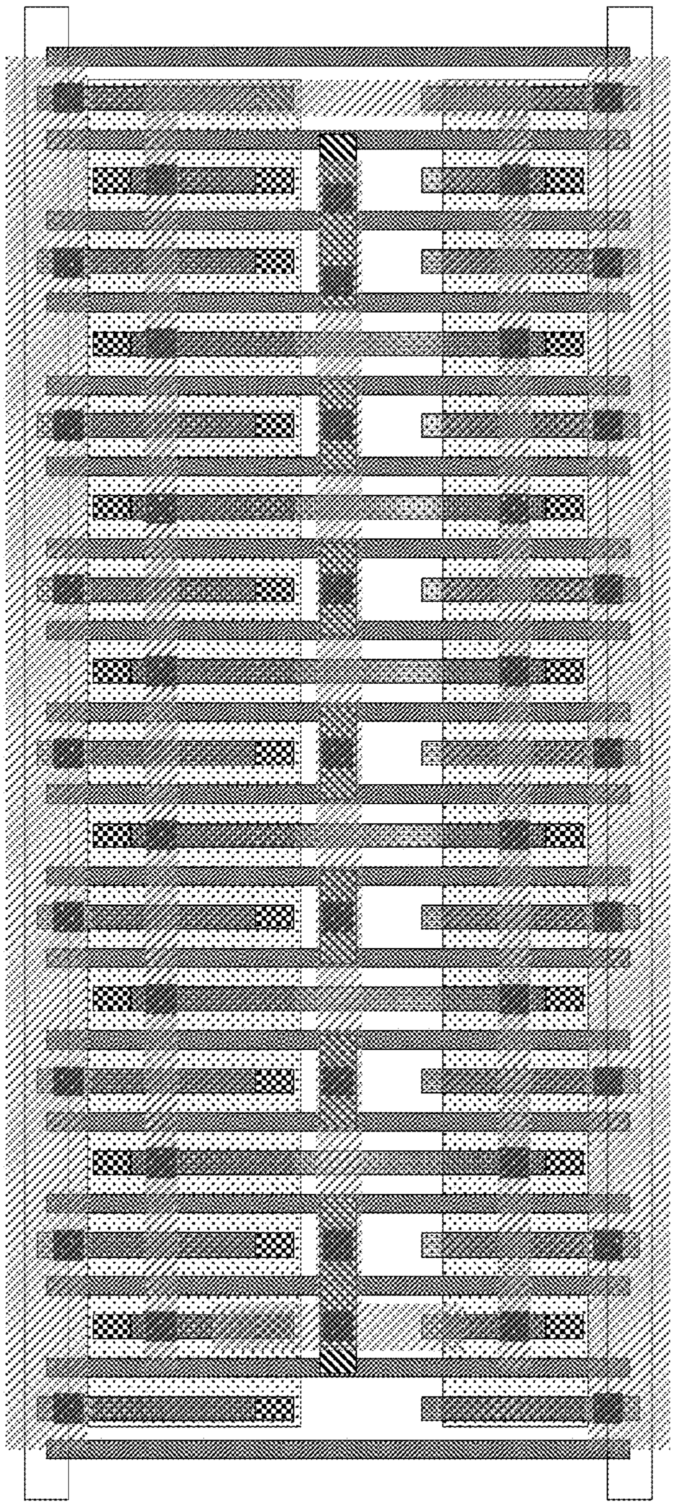
FIG. 190 depicts a CKND16 cell.

Reference is made to FIG. 190, which depicts a CKND16 cell. This cell implements the function of an inverting clock driver in drive strength 16.

Figure 191:
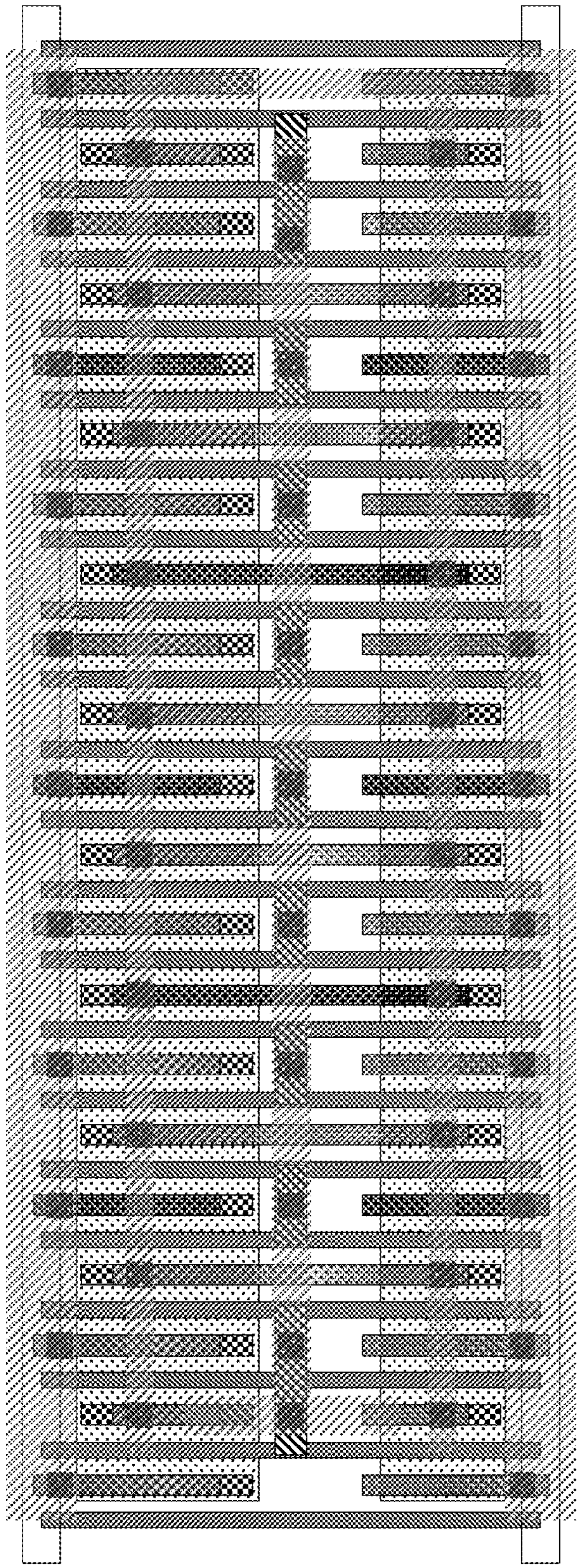
FIG. 191 depicts a CKND20 cell.

Reference is made to FIG. 191, which depicts a CKND20 cell. This cell implements the function of an inverting clock driver in drive strength 20.

Figure 192:
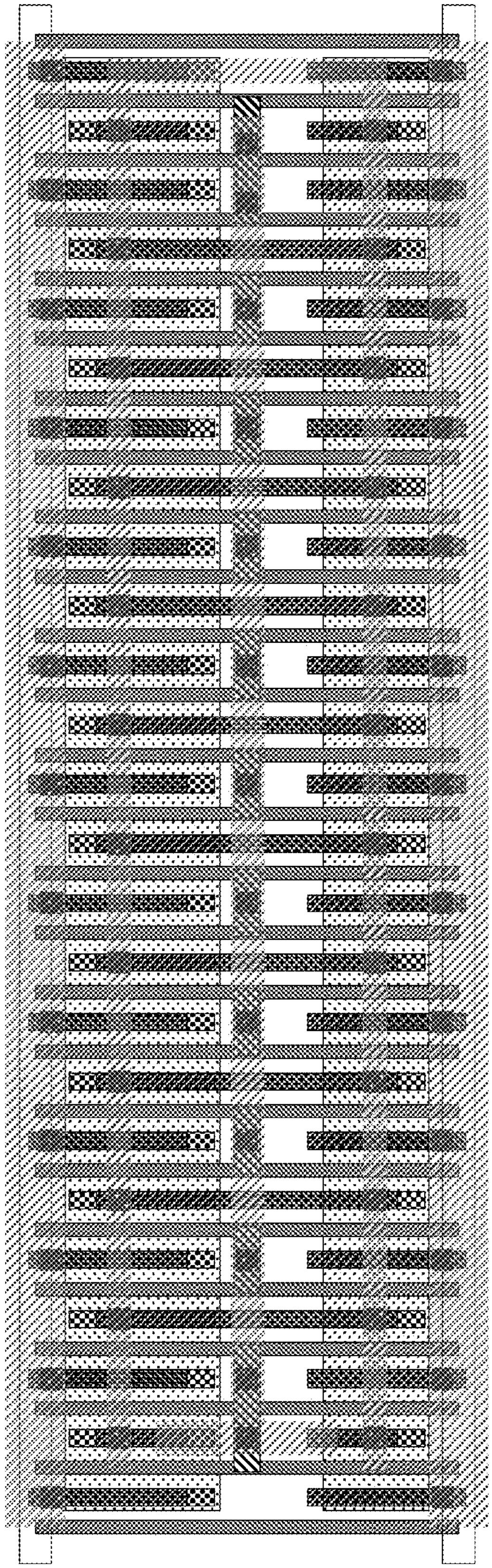
FIG. 192 depicts a CKND24 cell.

Reference is made to FIG. 192, which depicts a CKND24 cell. This cell implements the function of an inverting clock driver in drive strength 24.

Figure 193:
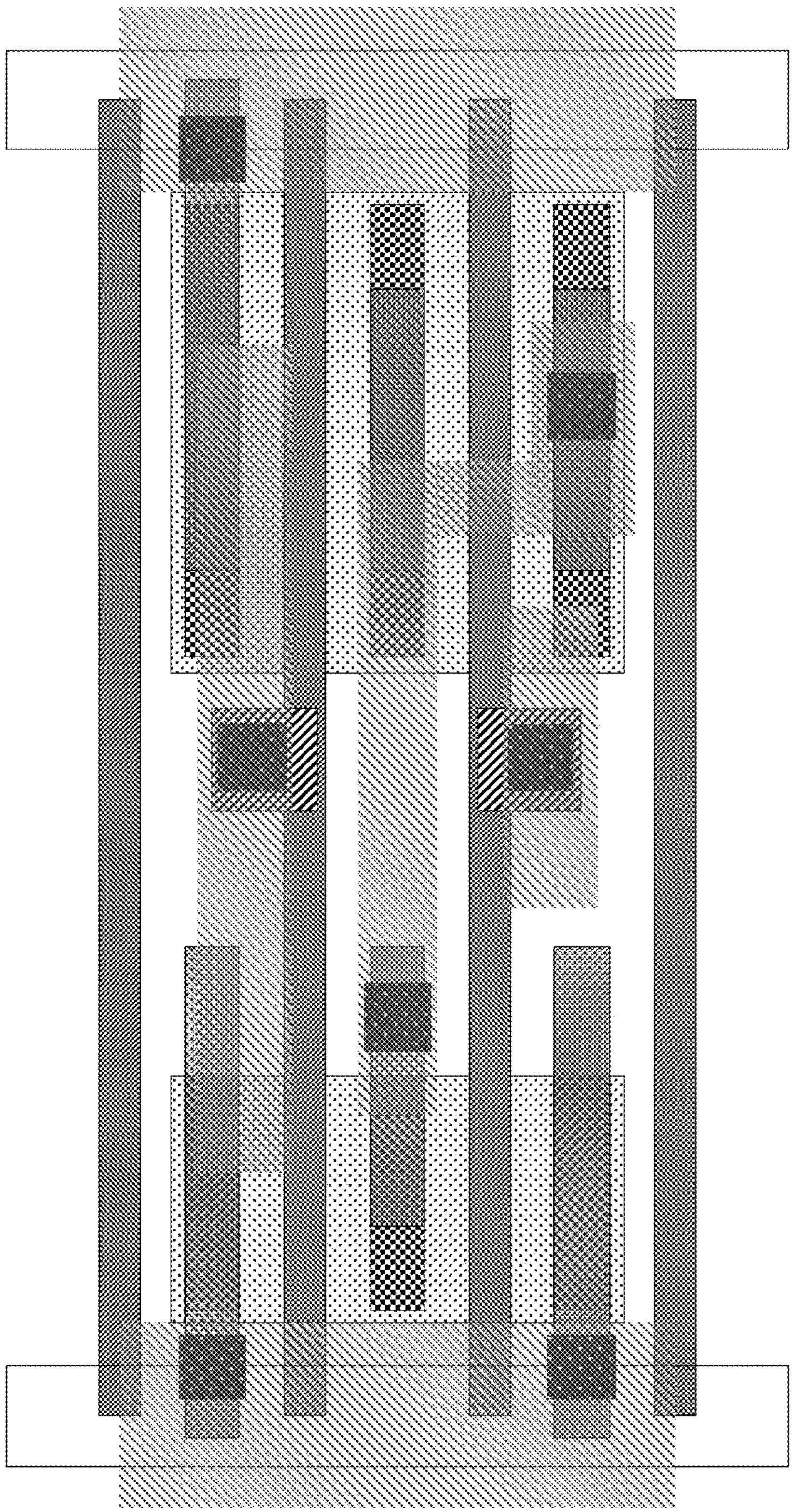
FIG. 193 depicts a CKNR2D1 cell.

Reference is made to FIG. 193, which depicts a CKNR2D1 cell. This clock cell implements the logic function nor(A,B) in drive strength 1.

Figure 194:
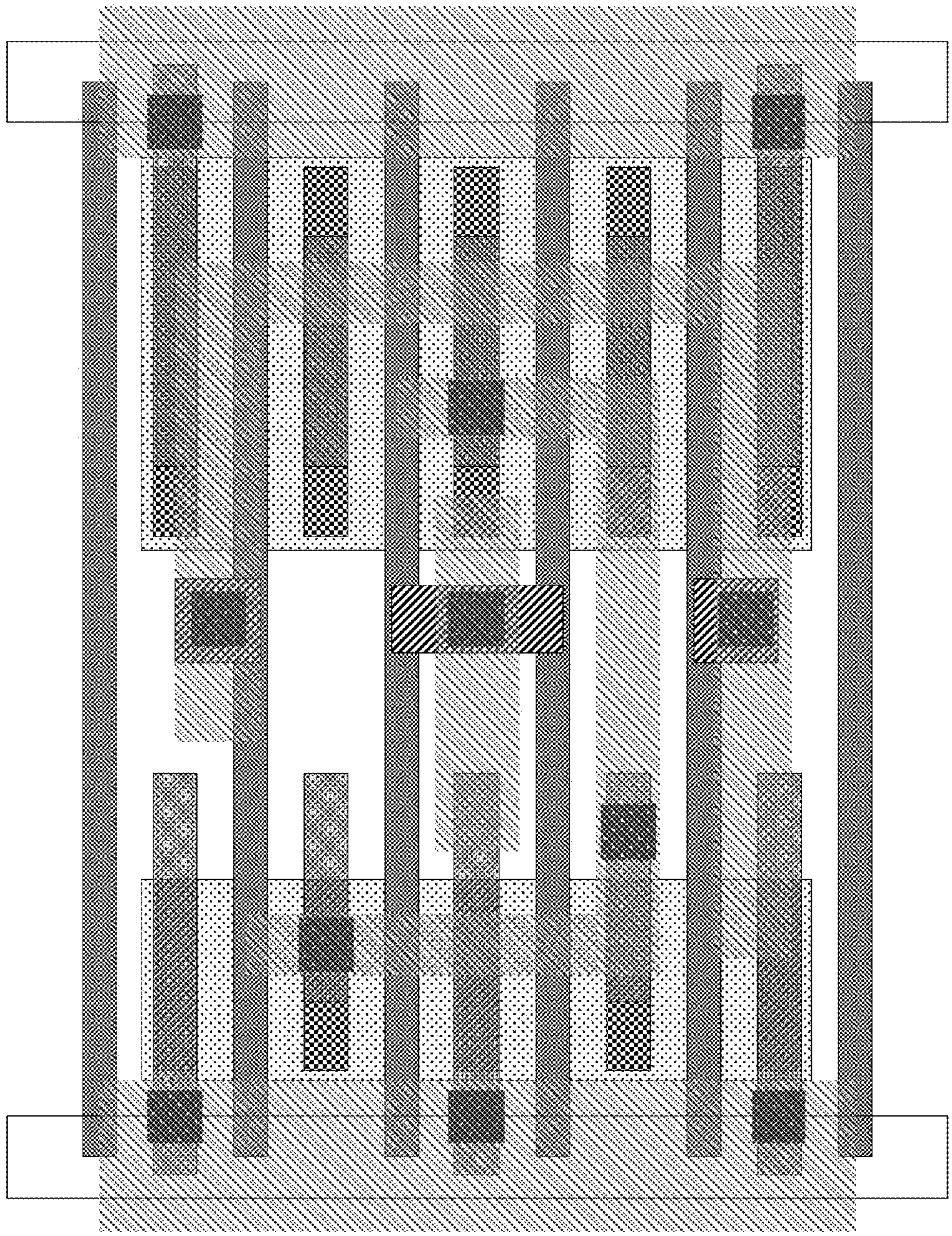
FIG. 194 depicts a CKNR2D2 cell.

Reference is made to FIG. 194, which depicts a CKNR2D2 cell. This clock cell implements the logic function nor(A,B) in drive strength 2.

Figure 195:
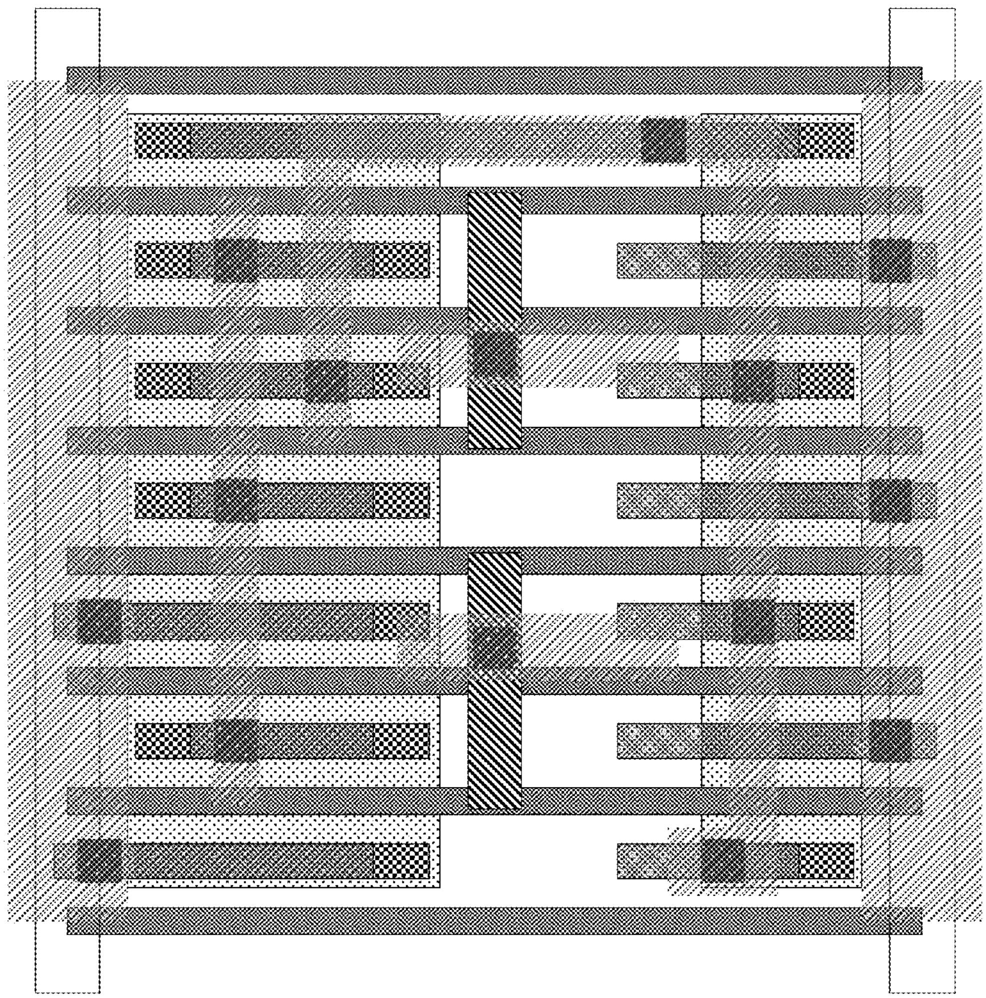
FIG. 195 depicts a CKNR2D3 cell.

Reference is made to FIG. 195, which depicts a CKNR2D3 cell. This clock cell implements the logic function nor(A,B) in drive strength 3.

Figure 196:
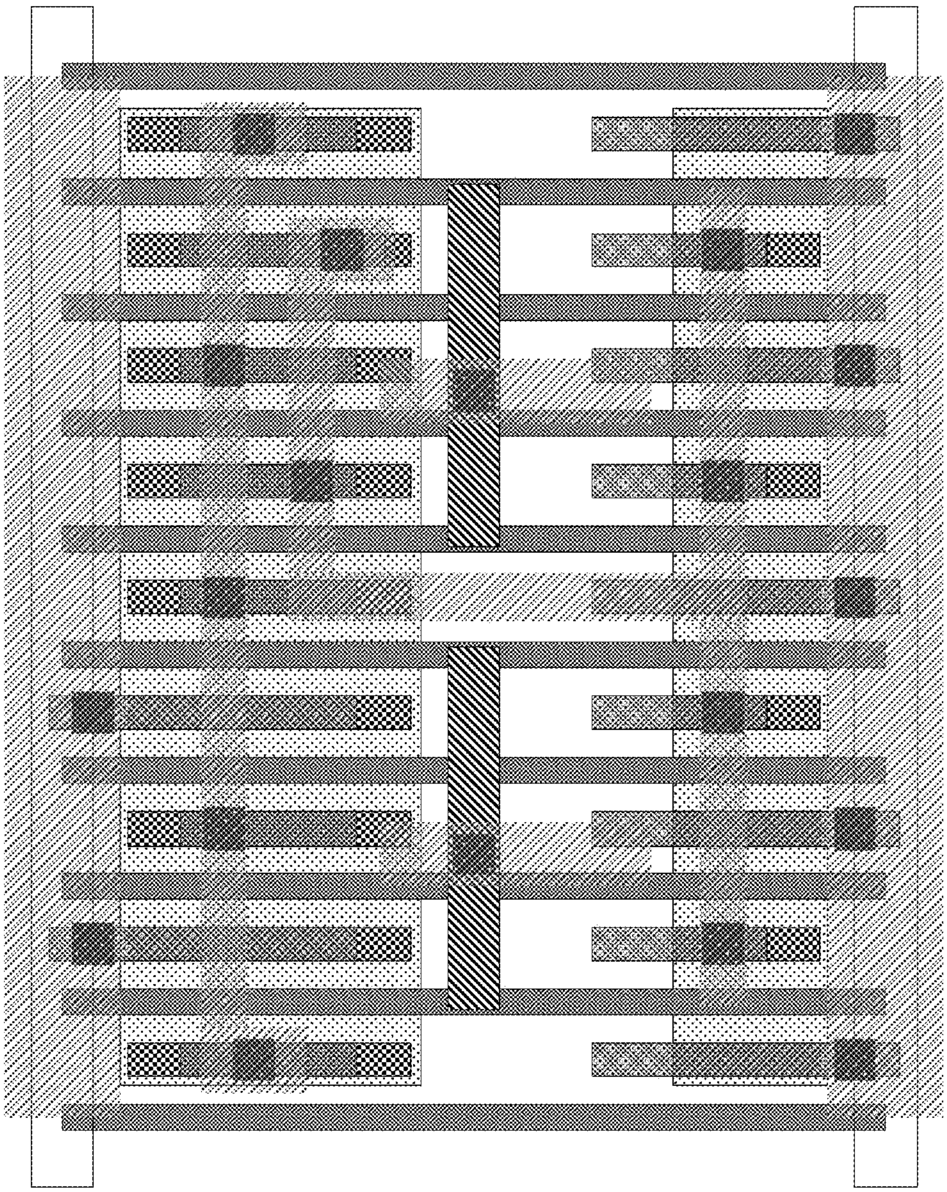
FIG. 196 depicts a CKNR2D4 cell.

Reference is made to FIG. 196, which depicts a CKNR2D4 cell. This clock cell implements the logic function nor(A,B) in drive strength 4.

Figure 197:
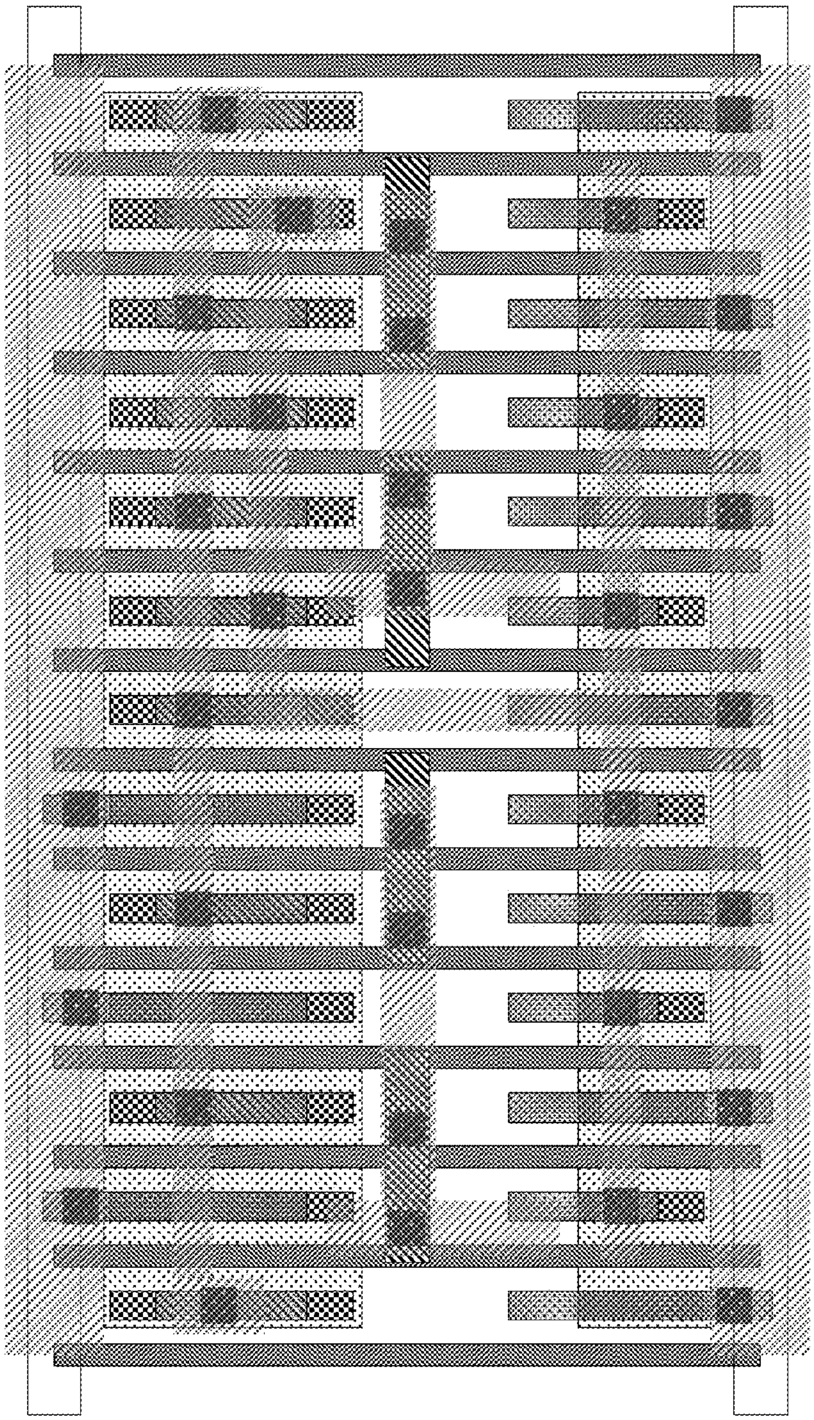
FIG. 197 depicts a CKNR2D6 cell.

Reference is made to FIG. 197, which depicts a CKNR2D6 cell. This clock cell implements the logic function nor(A,B) in drive strength 6.

Figure 198:
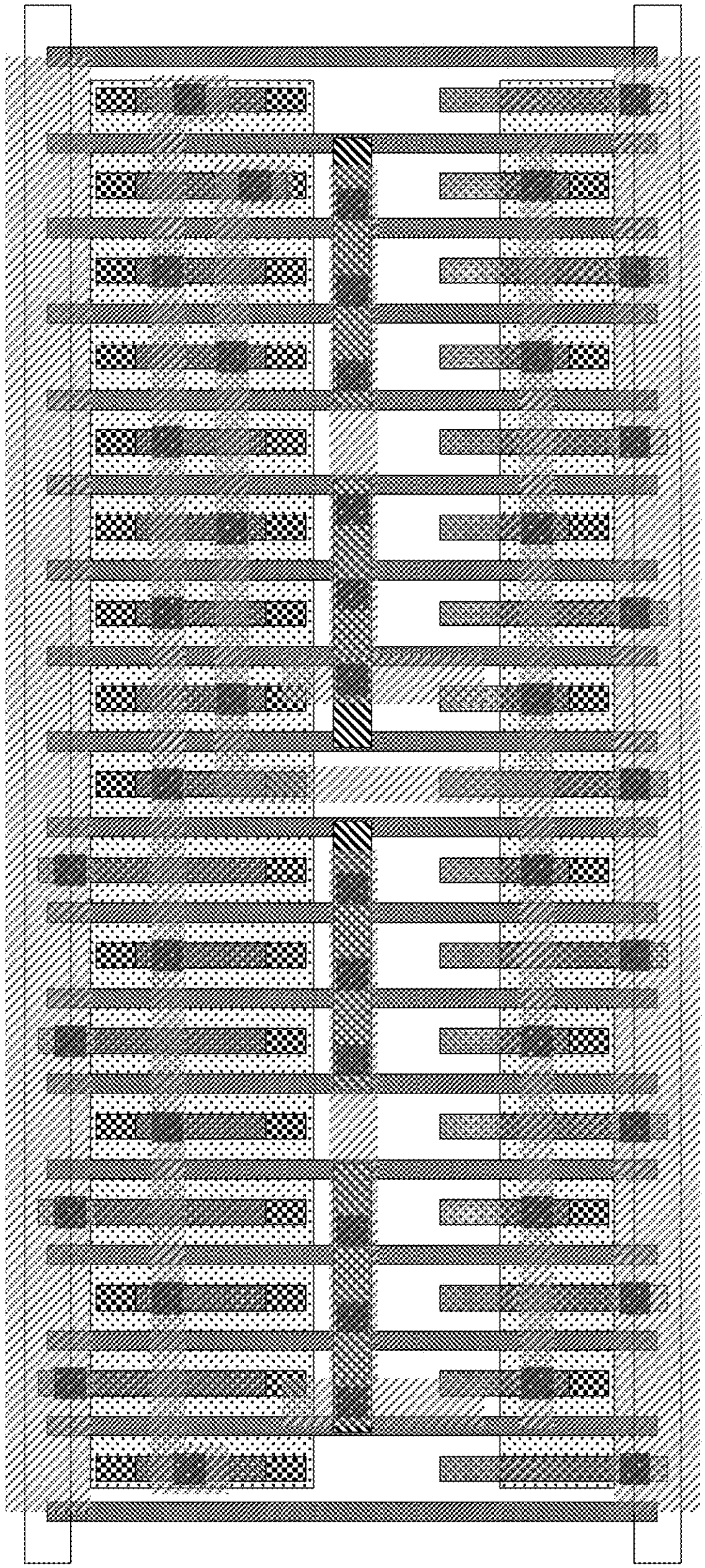
FIG. 198 depicts a CKNR2D8 cell.

Reference is made to FIG. 198, which depicts a CKNR2D8 cell. This clock cell implements the logic function nor(A,B) in drive strength 8.

Figure 199:
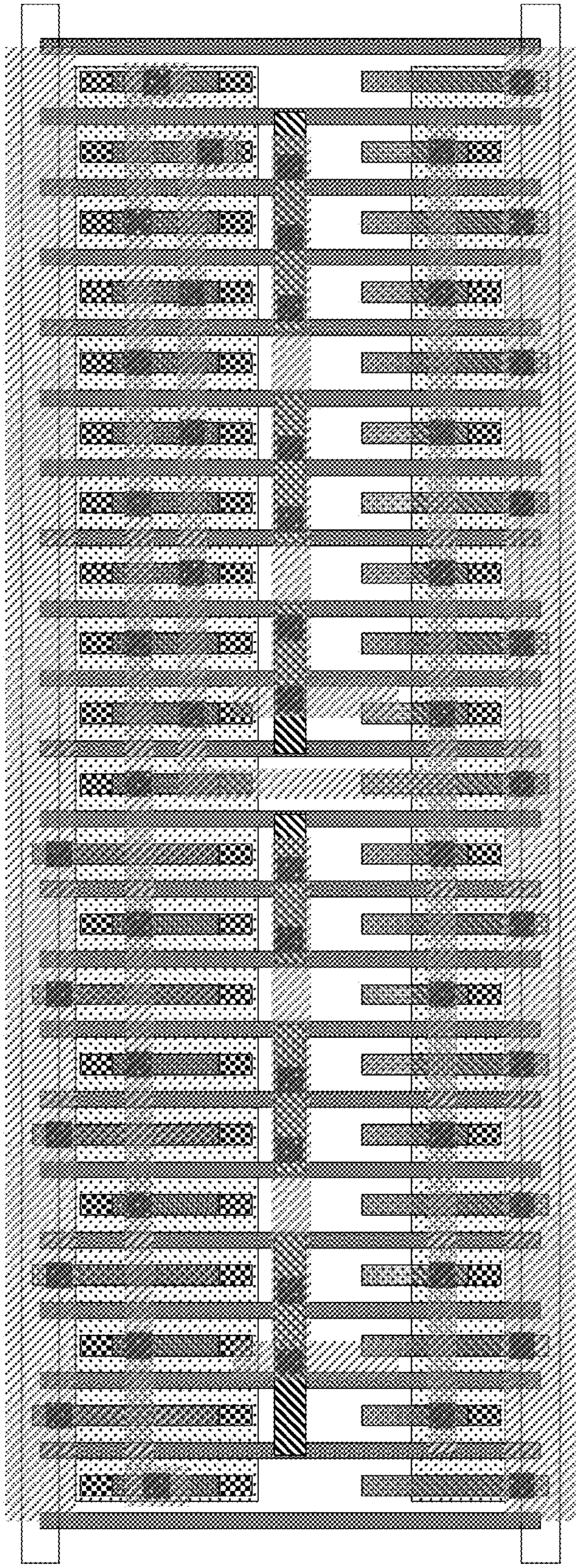
FIG. 199 depicts a CKNR2D10 cell.

Reference is made to FIG. 199, which depicts a CKNR2D10 cell. This clock cell implements the logic function nor(A,B) in drive strength 10.

Figure 200:
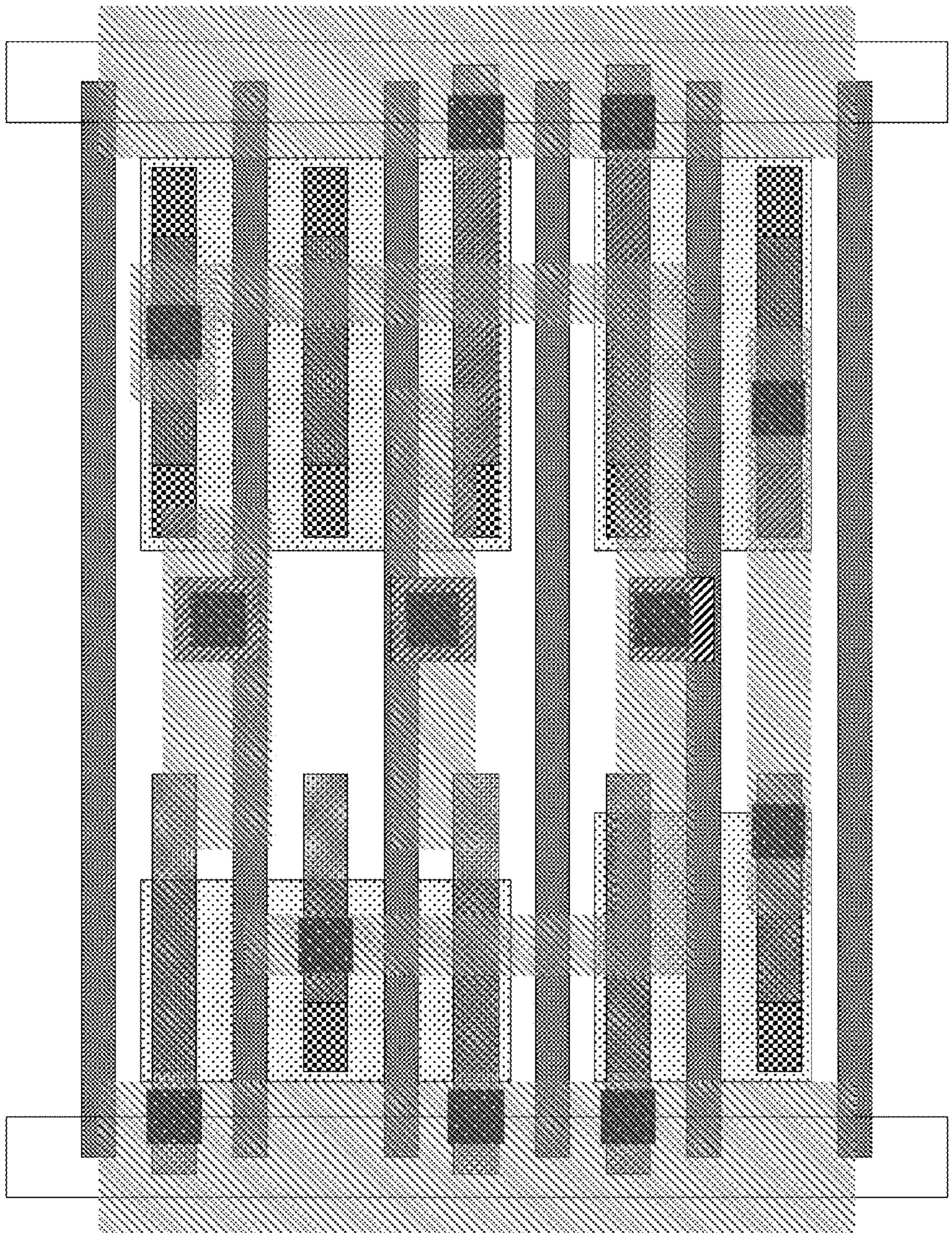
FIG. 200 depicts a CKOR2D1 cell.

Reference is made to FIG. 200, which depicts a CKOR2D1 cell. This clock cell implements the function or(A,B) in drive strength 1.

Figure 201:
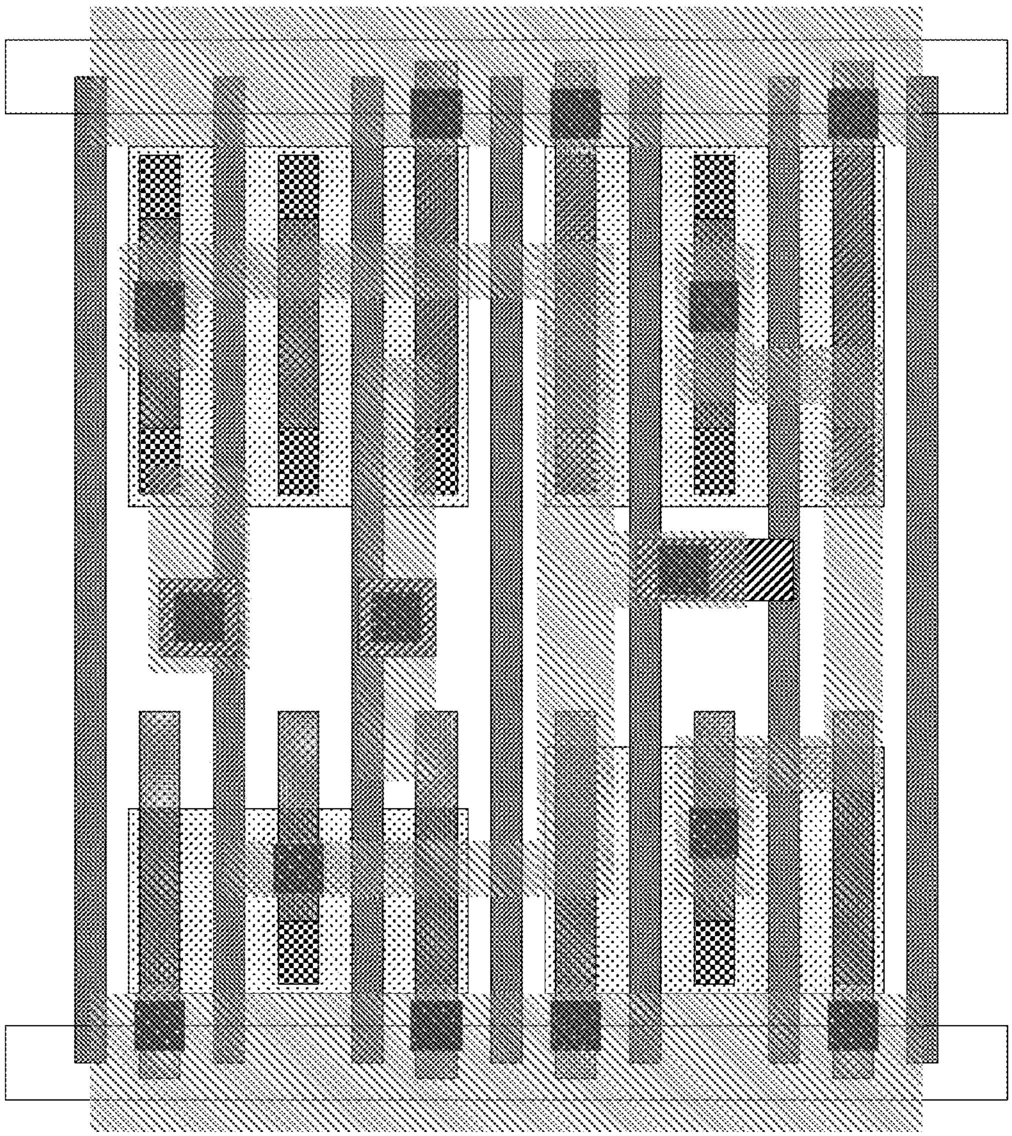
FIG. 201 depicts a CKOR2D2 cell.

Reference is made to FIG. 201, which depicts a CKOR2D2 cell. This clock cell implements the function or(A,B) in drive strength 2.

Figure 202:
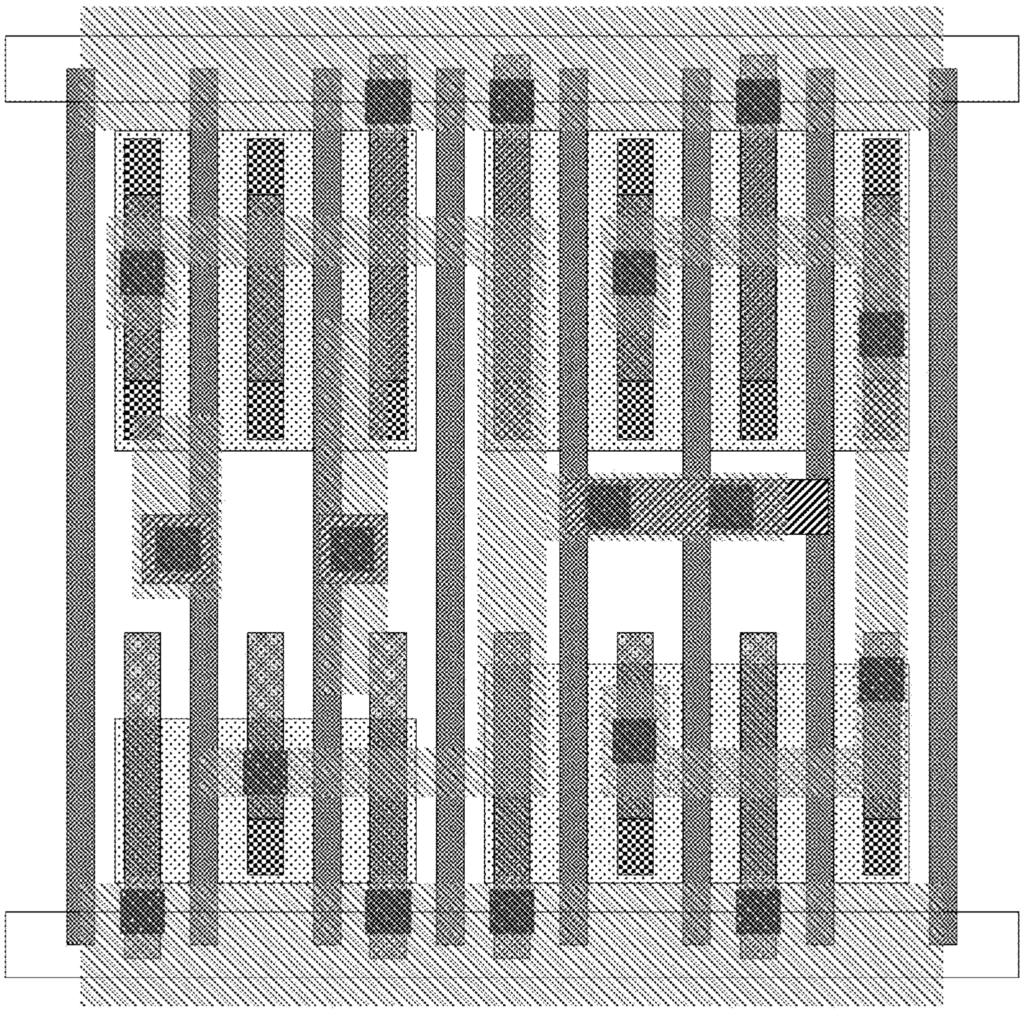
FIG. 202 depicts a CKOR2D3 cell.

Reference is made to FIG. 202, which depicts a CKOR2D3 cell. This clock cell implements the function or(A,B) in drive strength 3.

Figure 203:
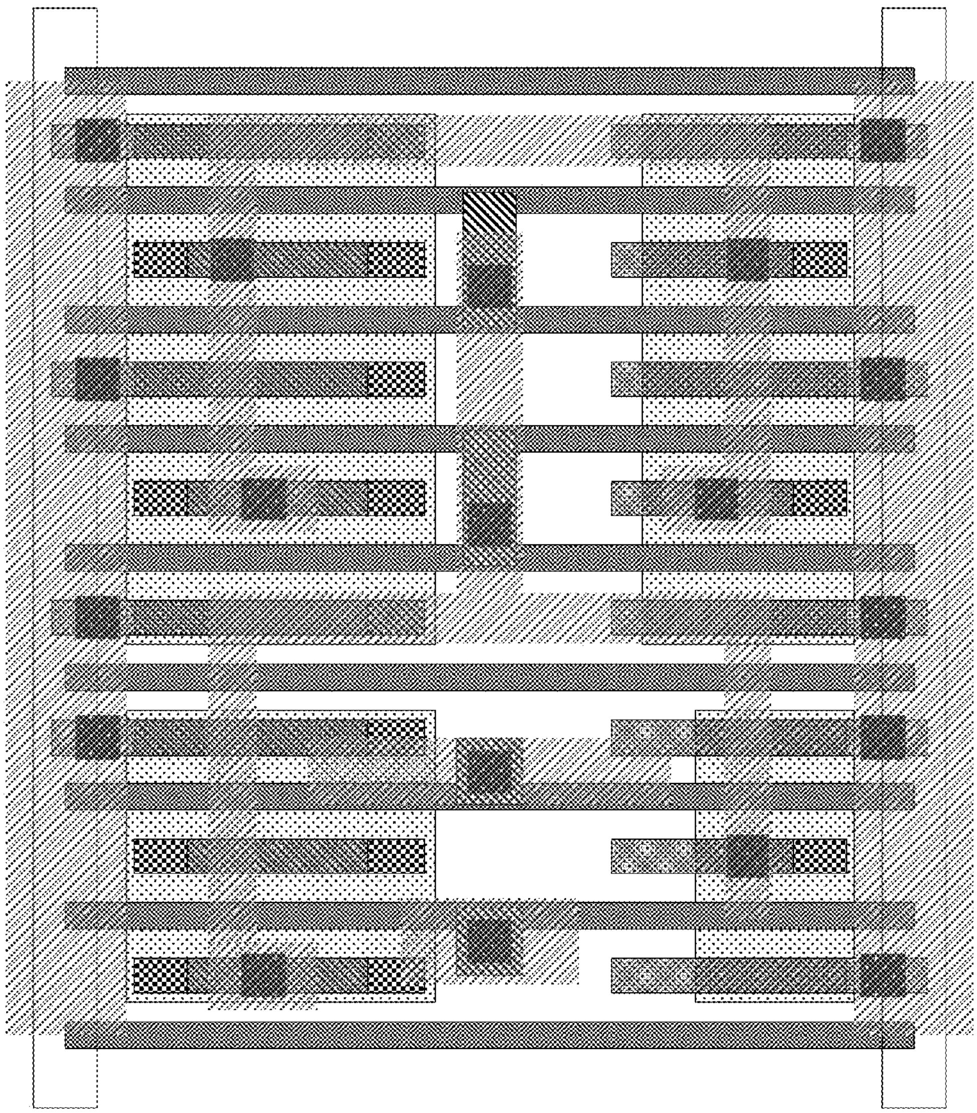
FIG. 203 depicts a CKOR2D4 cell.

Reference is made to FIG. 203, which depicts a CKOR2D4 cell. This clock cell implements the function or(A,B) in drive strength 4.

Figure 204:
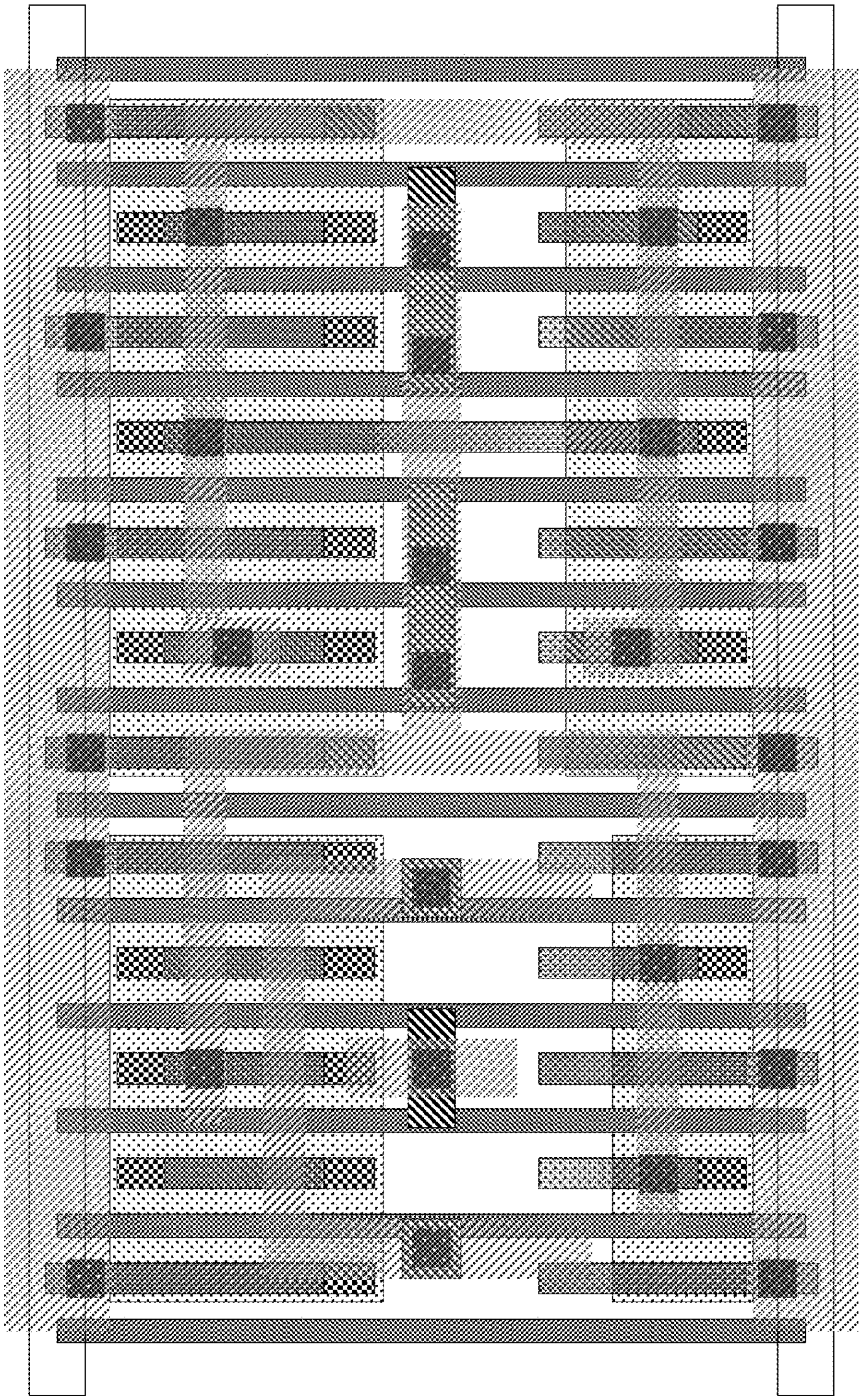
FIG. 204 depicts a CKOR2D6 cell.

Reference is made to FIG. 204, which depicts a CKOR2D6 cell. This clock cell implements the function or(A,B) in drive strength 6.

Figure 205:
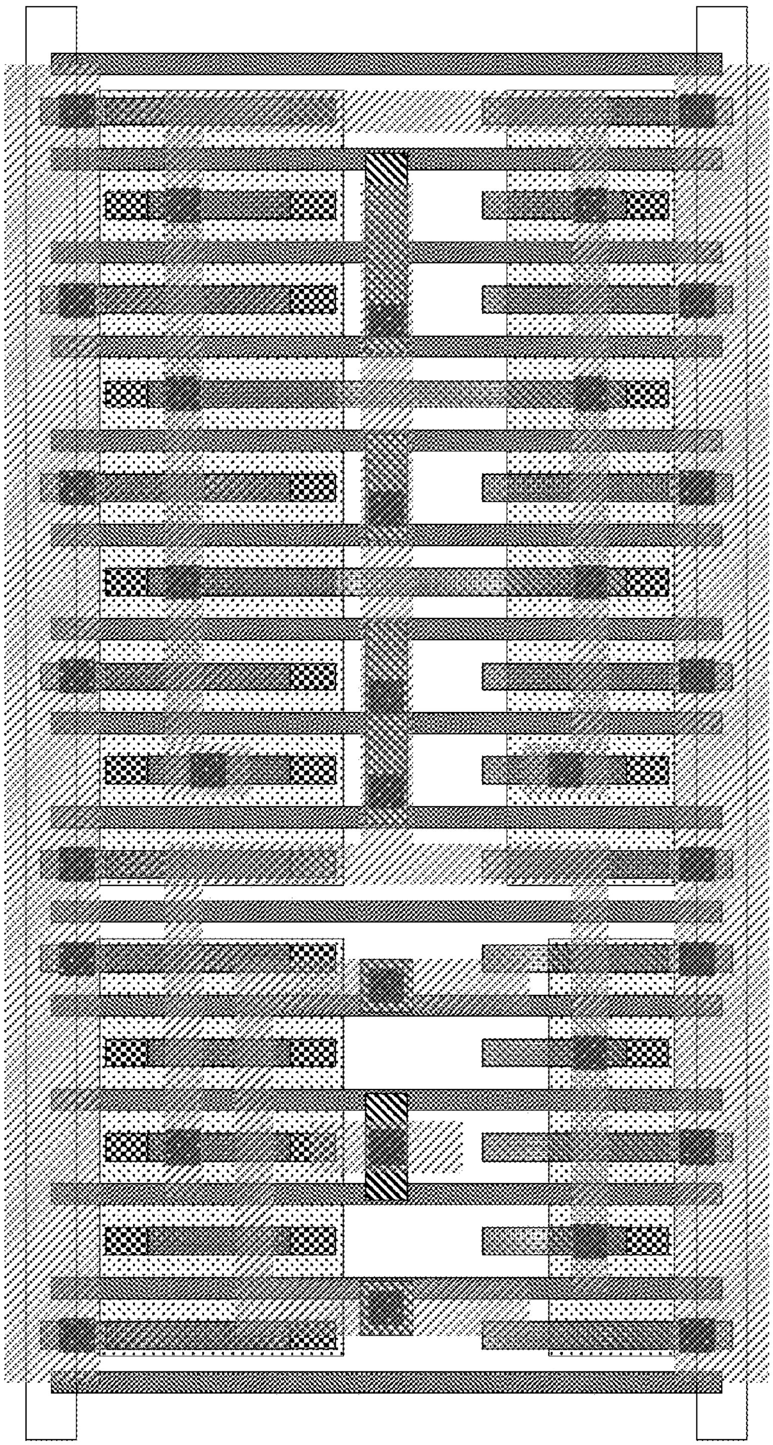
FIG. 205 depicts a CKOR2D8 cell.

Reference is made to FIG. 205, which depicts a CKOR2D8 cell. This clock cell implements the function or(A,B) in drive strength 8.

Figure 206:
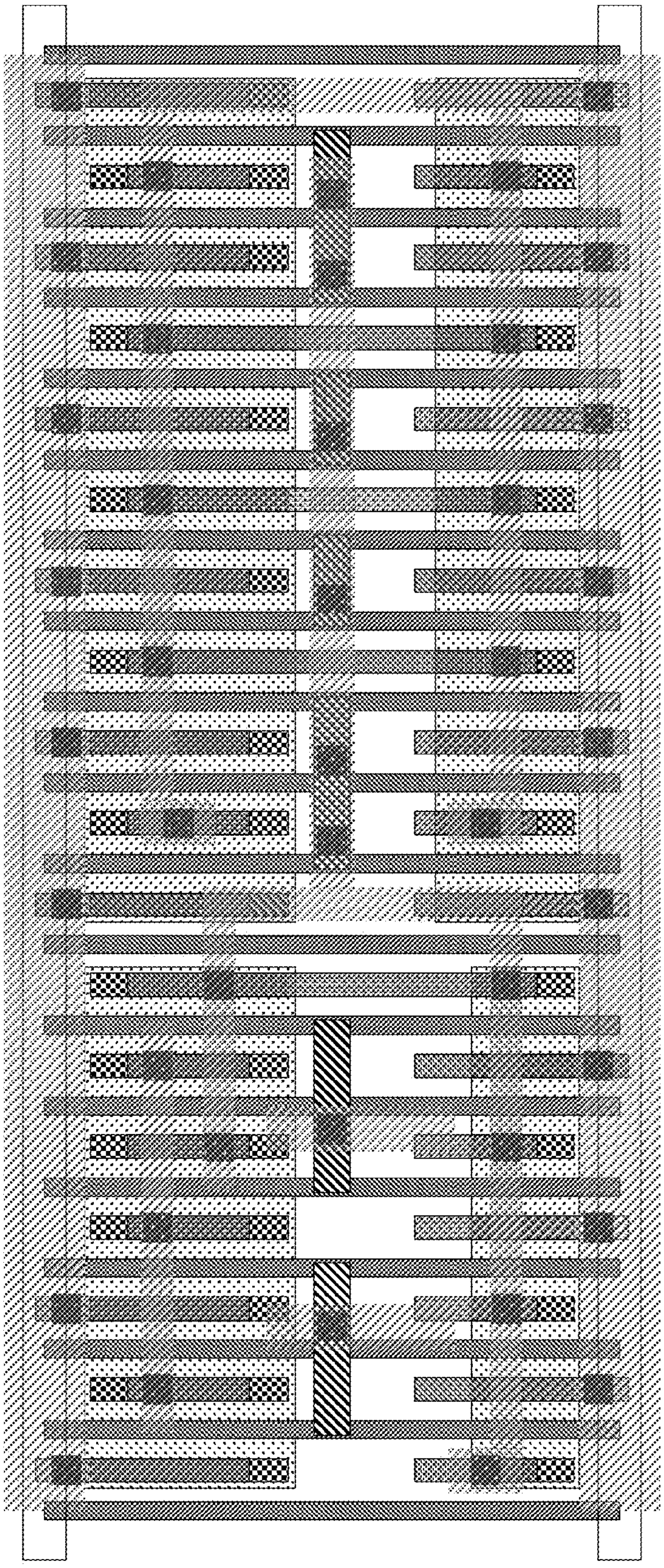
FIG. 206 depicts a CKOR2D10 cell.

Reference is made to FIG. 206, which depicts a CKOR2D10 cell. This clock cell implements the function or(A,B) in drive strength 10.

Figure 207:
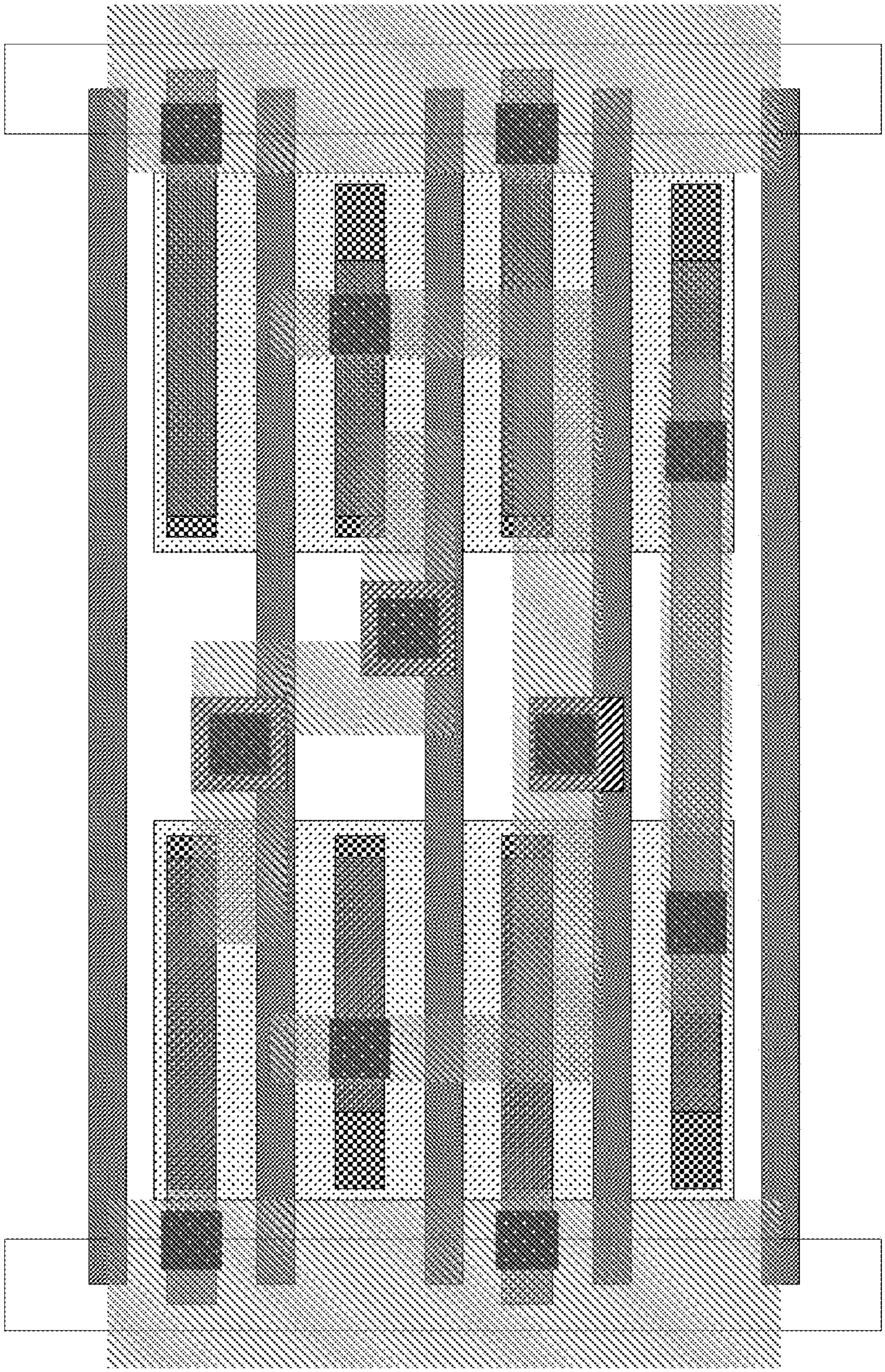
FIG. 207 depicts a DEL010D1 cell.

Reference is made to FIG. 207, which depicts a DEL010D1 cell.

Figure 208:
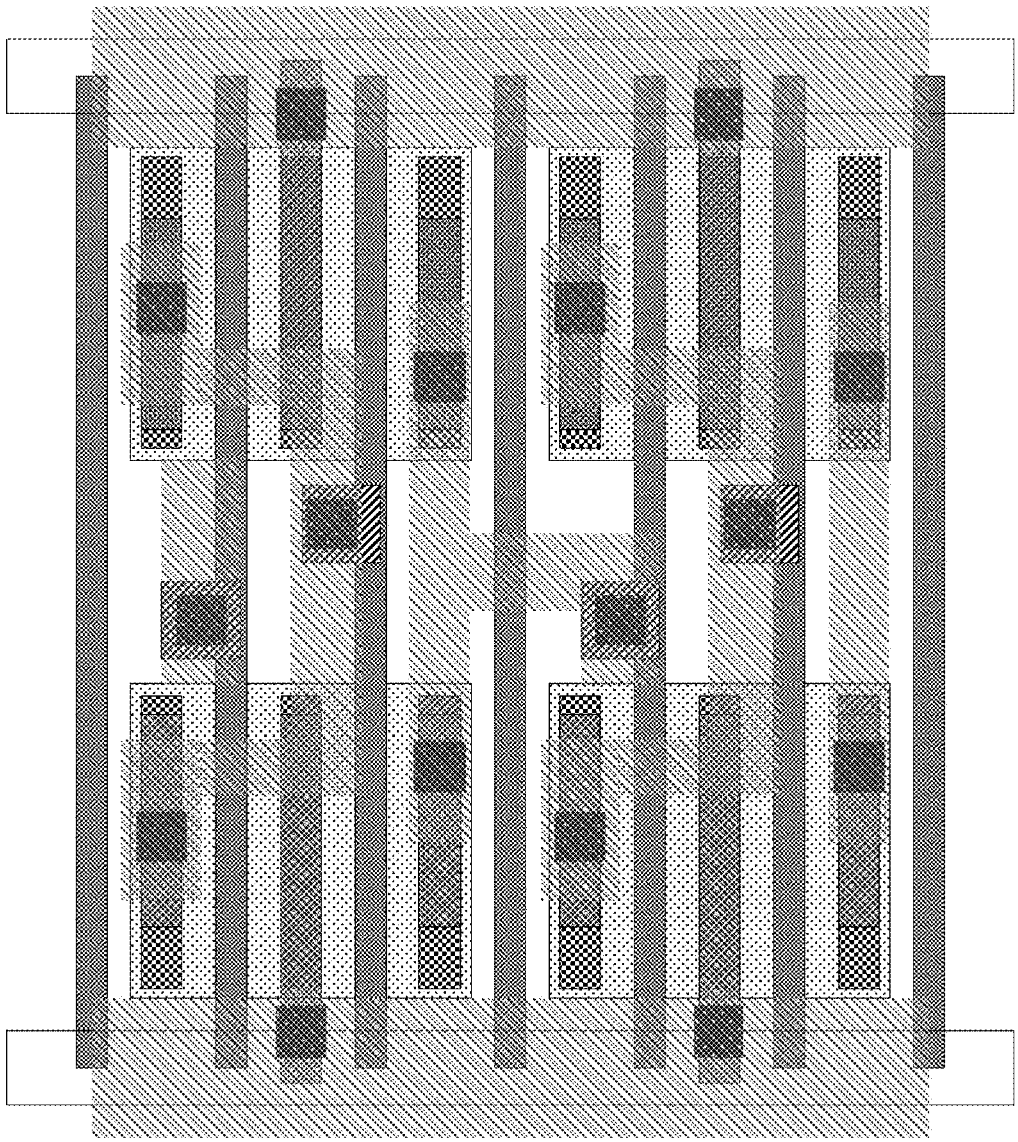
FIG. 208 depicts a DEL020D1 cell.

Reference is made to FIG. 208, which depicts a DEL020D1 cell.

Figure 209:
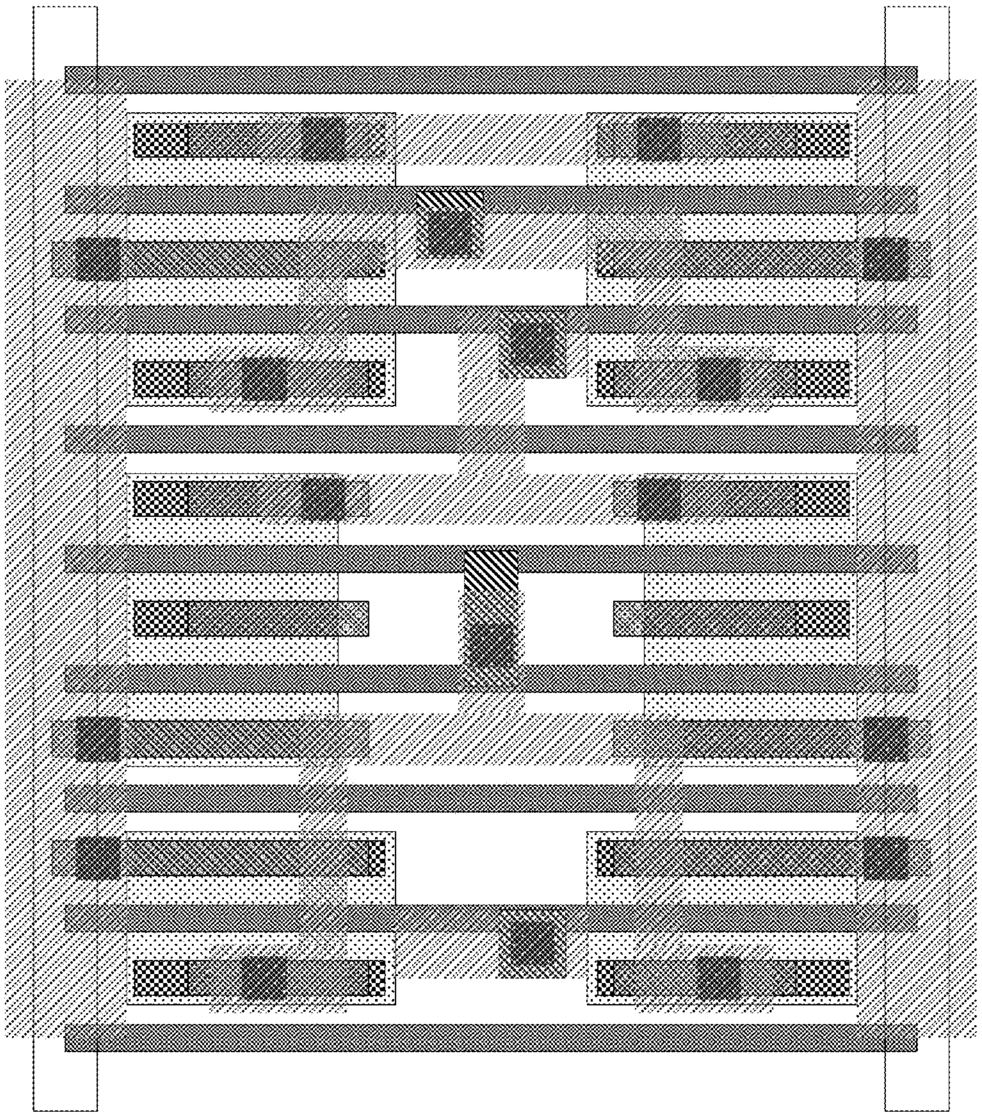
FIG. 209 depicts a DEL030D1 cell.

Reference is made to FIG. 209, which depicts a DEL030D1 cell.

Figure 210:
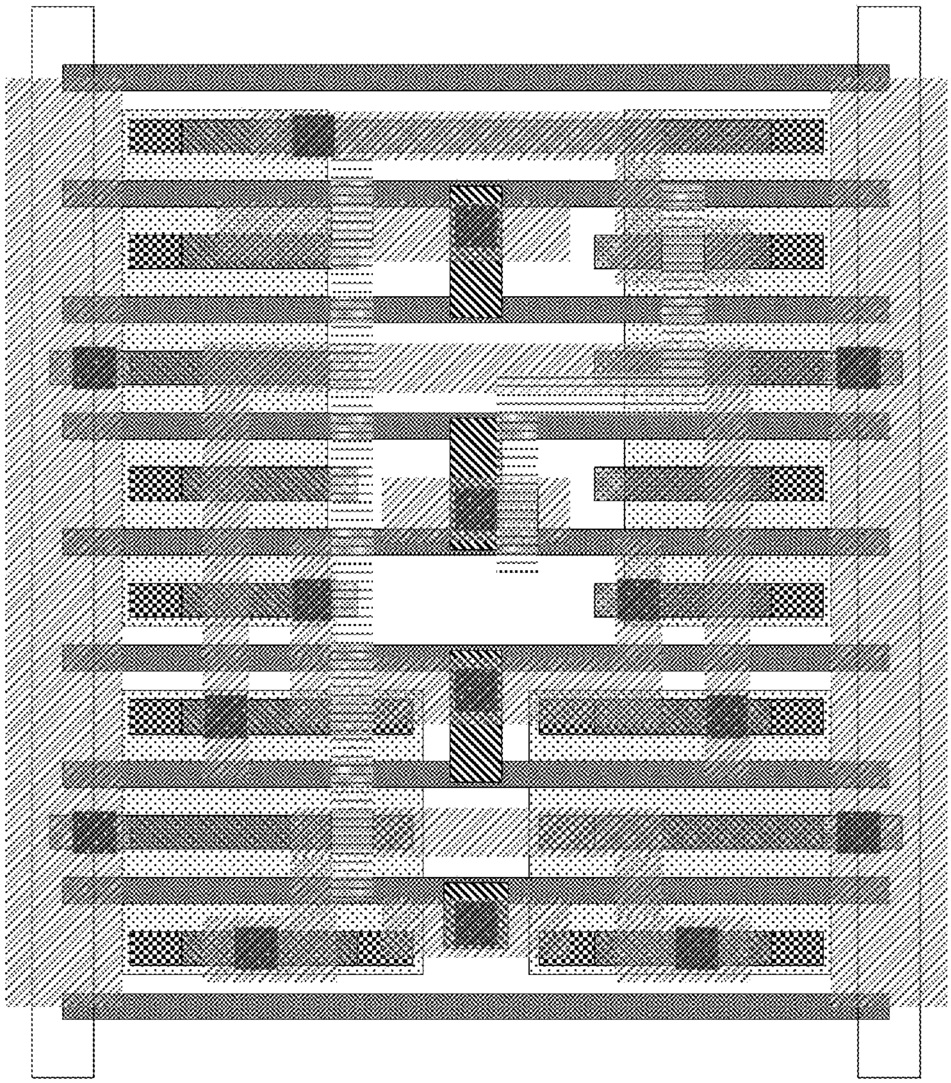
FIG. 210 depicts a DEL040D1 cell.

Reference is made to FIG. 210, which depicts a DEL040D1 cell.

Figure 211:
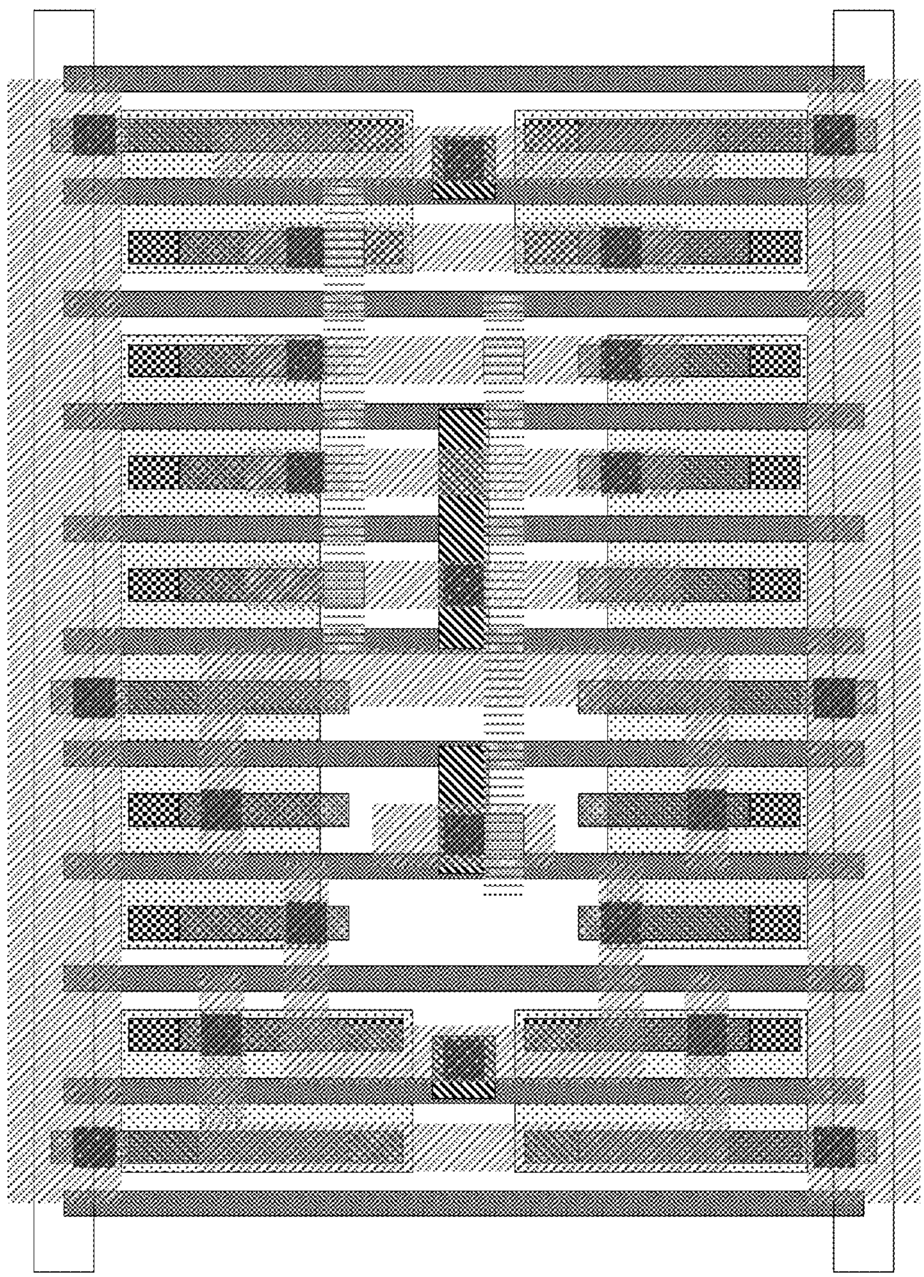
FIG. 211 depicts a DEL060D1 cell.

Reference is made to FIG. 211, which depicts a DEL060D1 cell.

Figure 212:
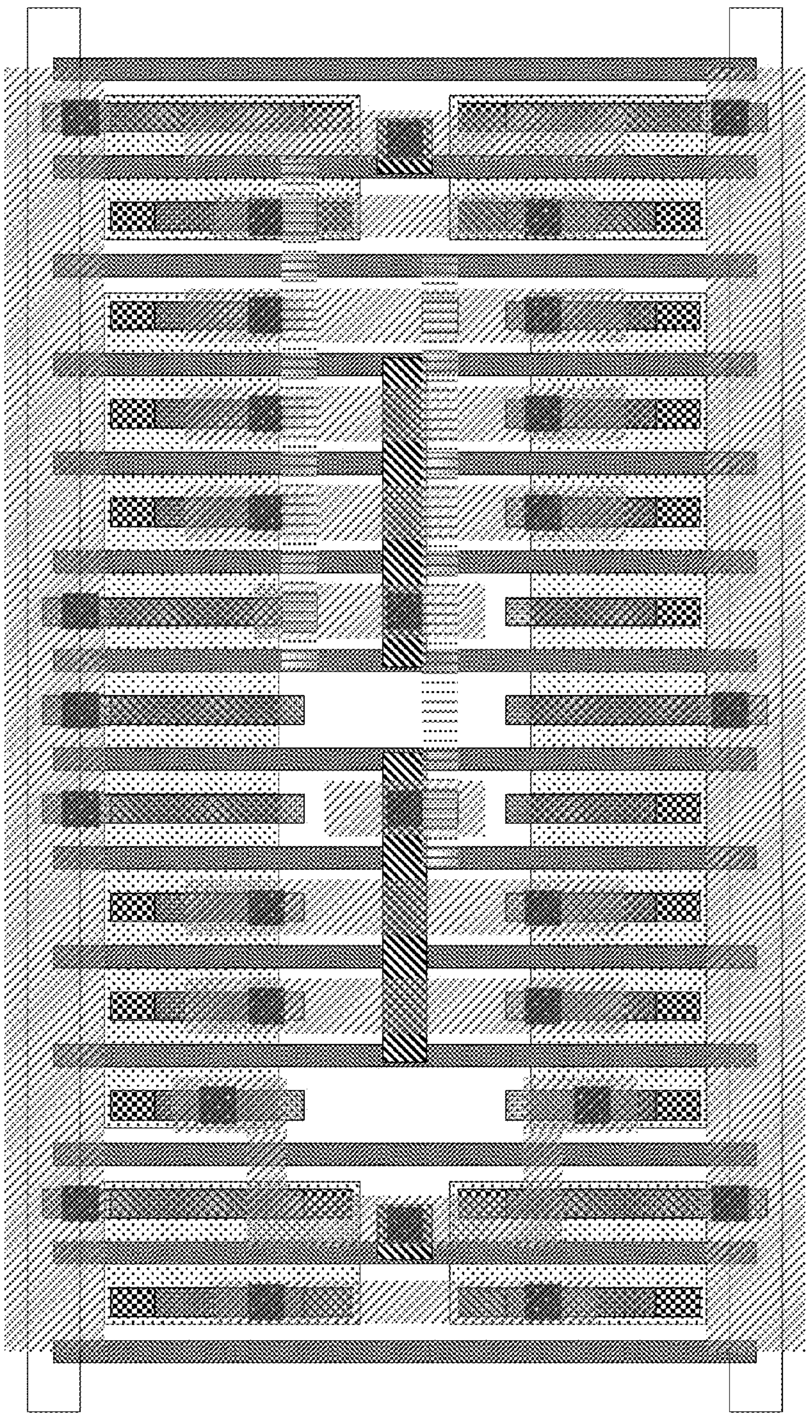
FIG. 212 depicts a DEL100D1 cell.

Reference is made to FIG. 212, which depicts a DEL100D1 cell.

Figure 213:
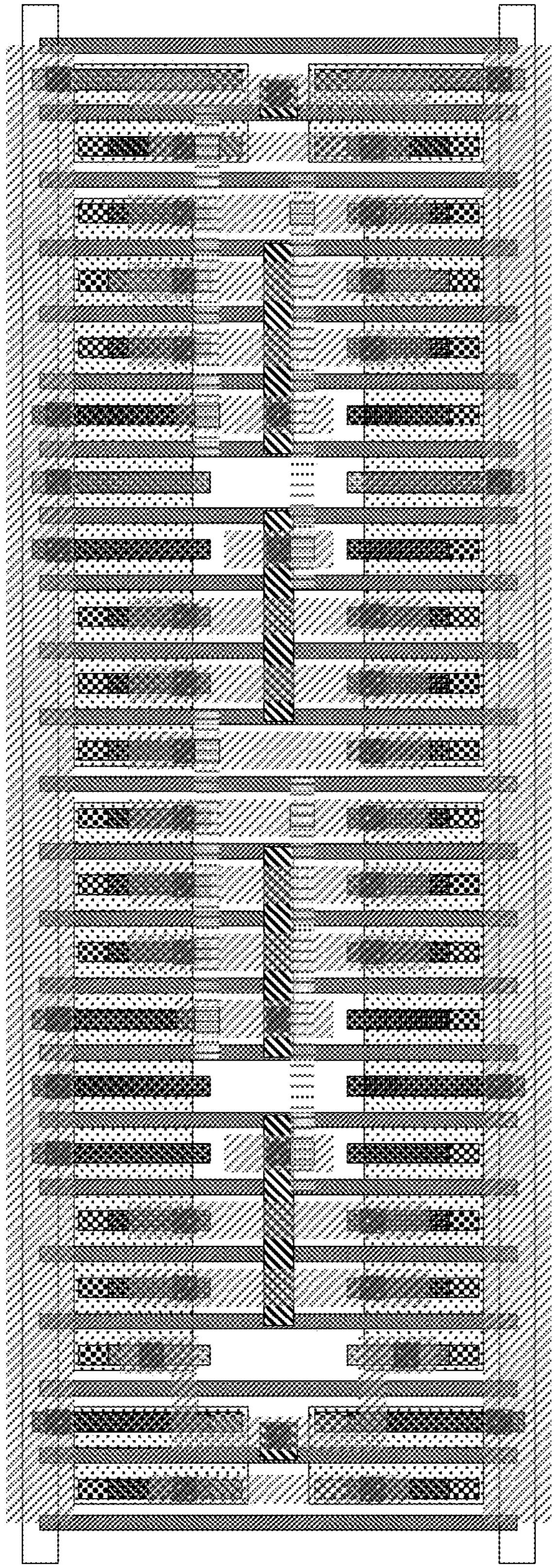
FIG. 213 depicts a DEL200D1 cell.

Reference is made to FIG. 213, which depicts a DEL200D1 cell.

Figure 214:
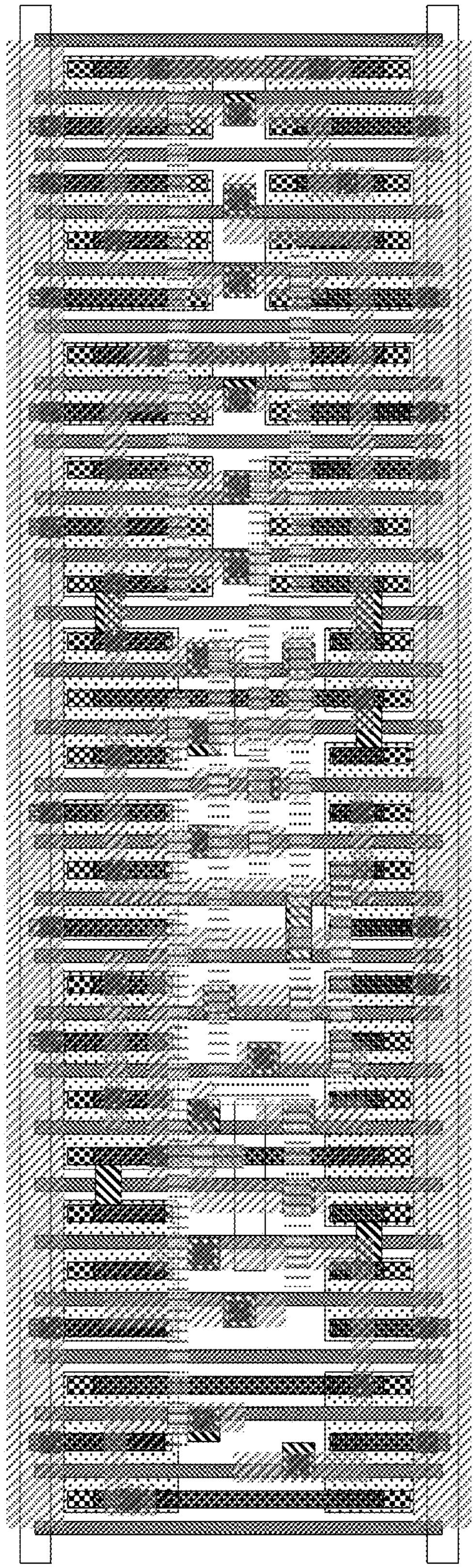
FIG. 214 depicts a DFCSND1 cell.

Reference is made to FIG. 214, which depicts a DFCSND1 cell.

Figure 215:
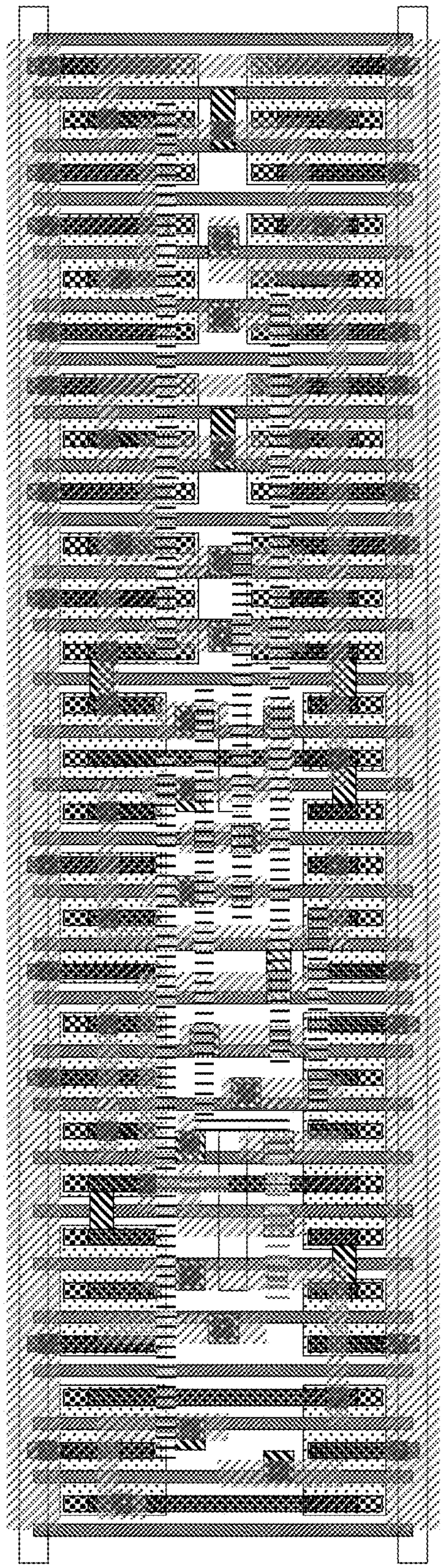
FIG. 215 depicts a DFCSND2 cell.

Reference is made to FIG. 215, which depicts a DFCSND2 cell.

Figure 216:
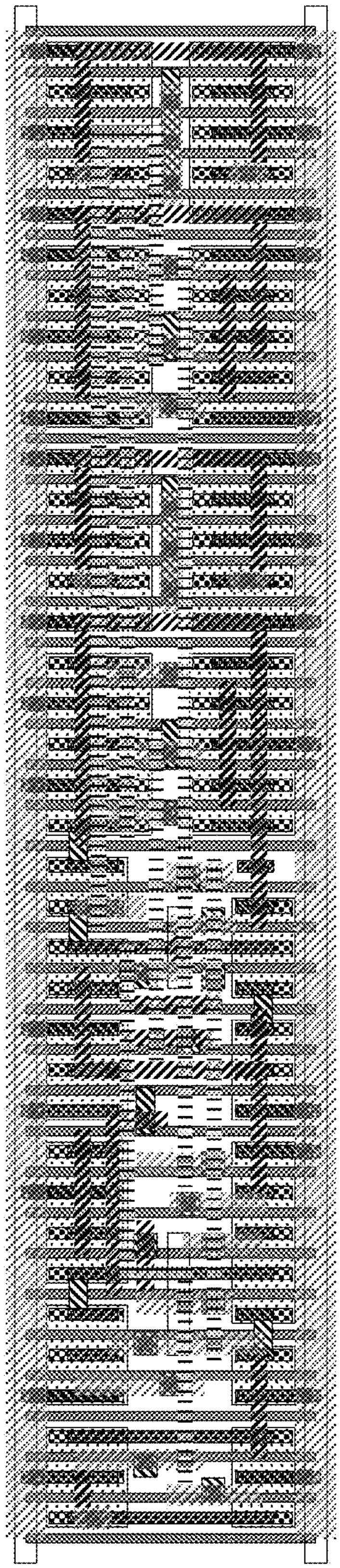
FIG. 216 depicts a DFCSND4 cell.

Reference is made to FIG. 216, which depicts a DFCSND4 cell.

Figure 217:
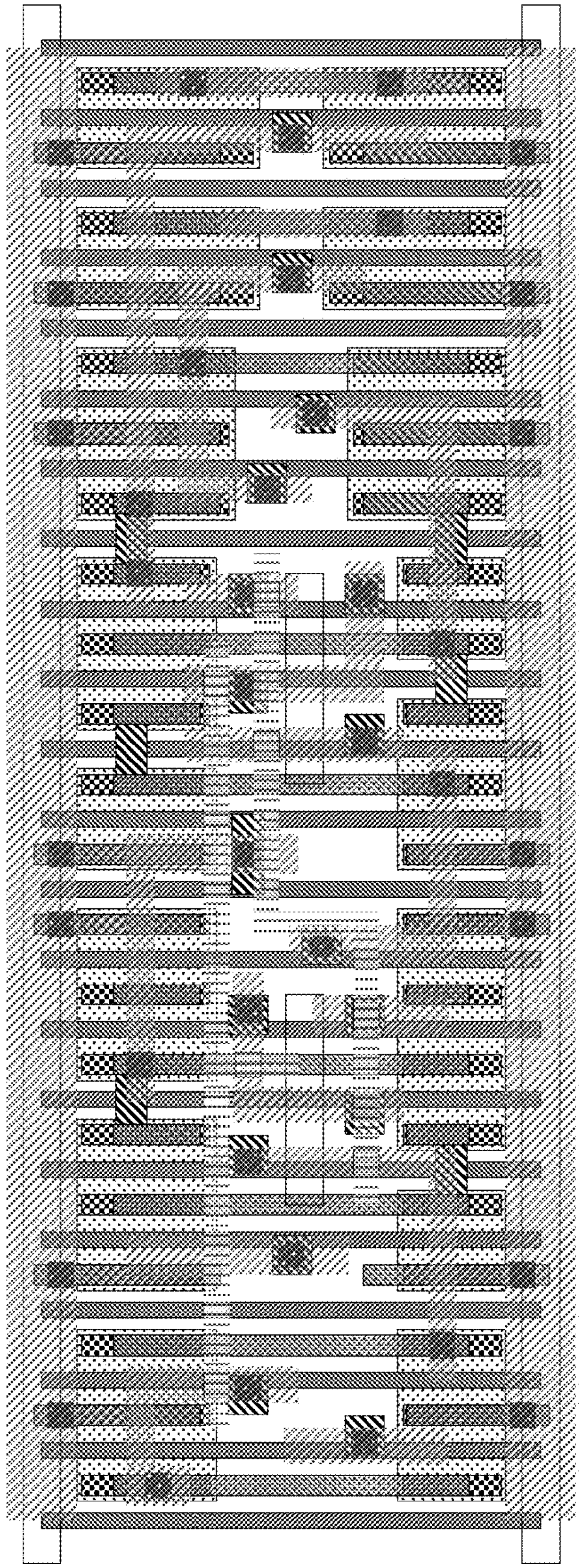
FIG. 217 depicts a DFD1 cell.

Reference is made to FIG. 217, which depicts a DFD1 cell. This cell implements the function of a D-flip-flop in drive strength 1.

Figure 218:
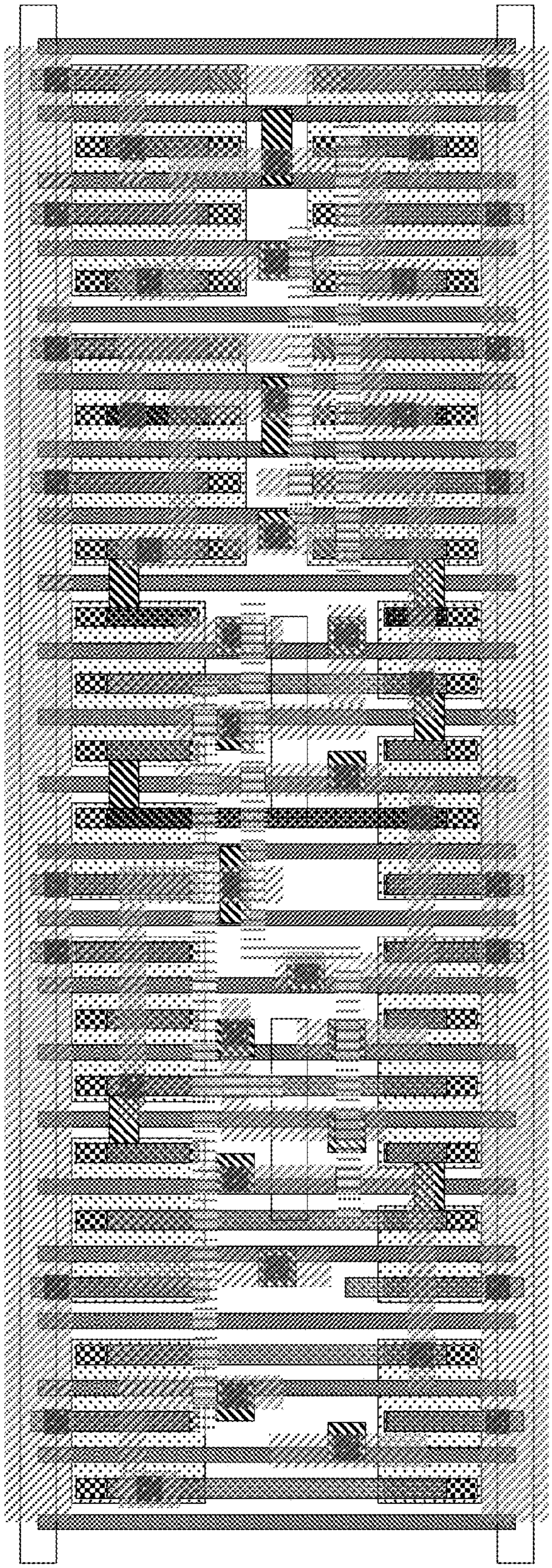
FIG. 218 depicts a DFD2 cell.

Reference is made to FIG. 218, which depicts a DFD2 cell. This cell implements the function of a D-flip-flop in drive strength 2.

Figure 219:
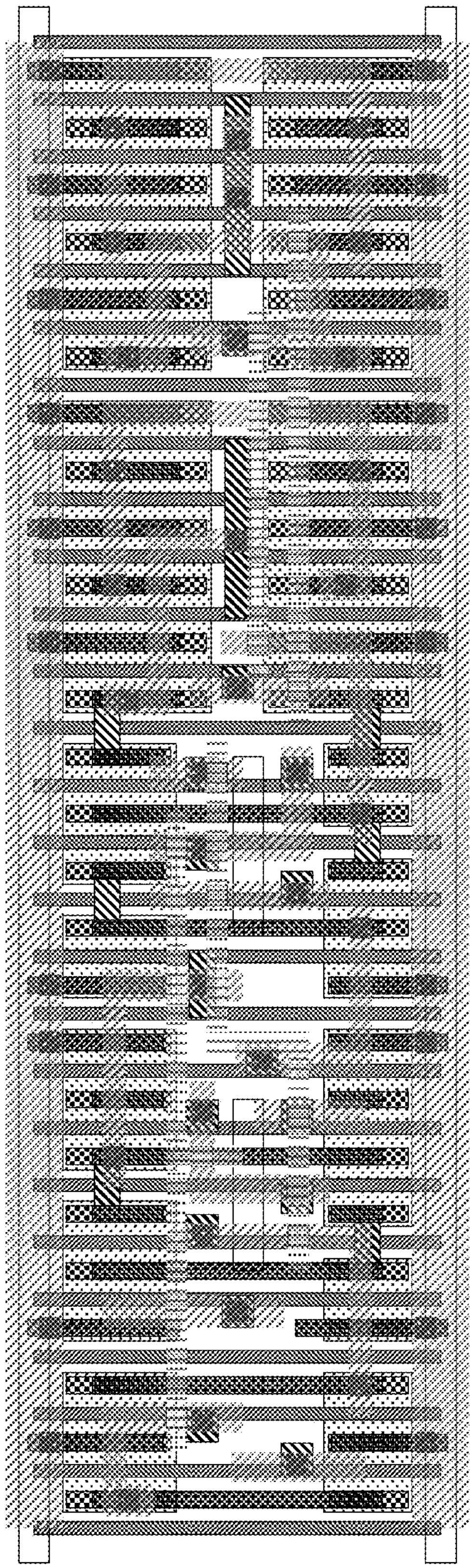
FIG. 219 depicts a DFD4 cell.

Reference is made to FIG. 219, which depicts a DFD4 cell. This cell implements the function of a D-flip-flop in drive strength 4.

Figure 220:
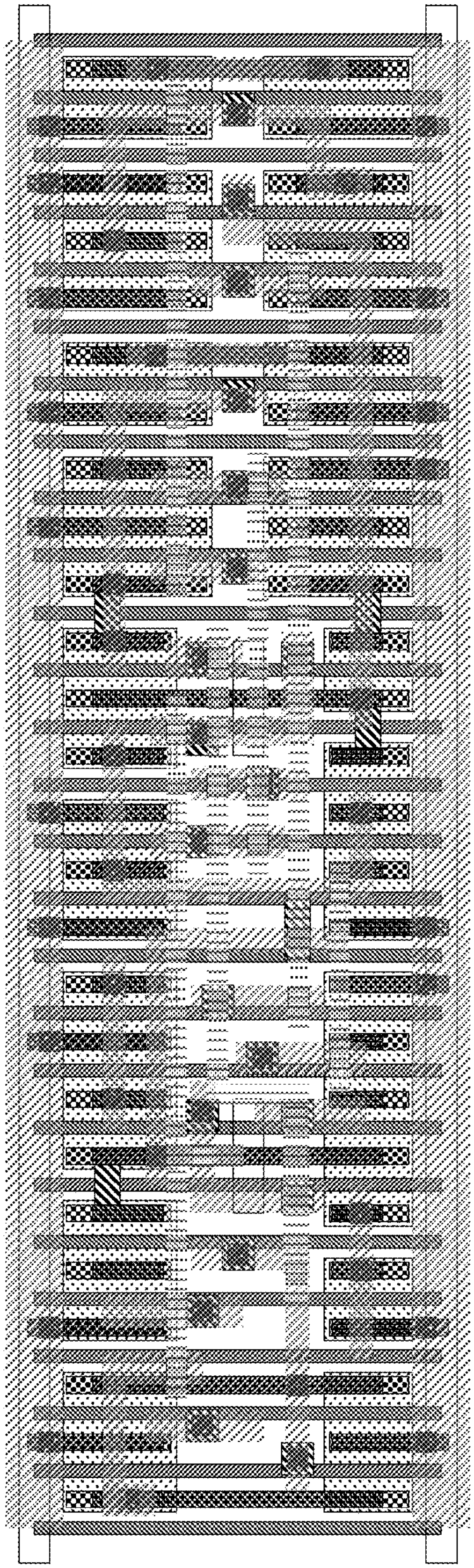
FIG. 220 depicts a DFNCSND1 cell.

Reference is made to FIG. 220, which depicts a DFNCSND1 cell. This cell implements the function of a D-flip-flop in drive strength 1.

Figure 221:
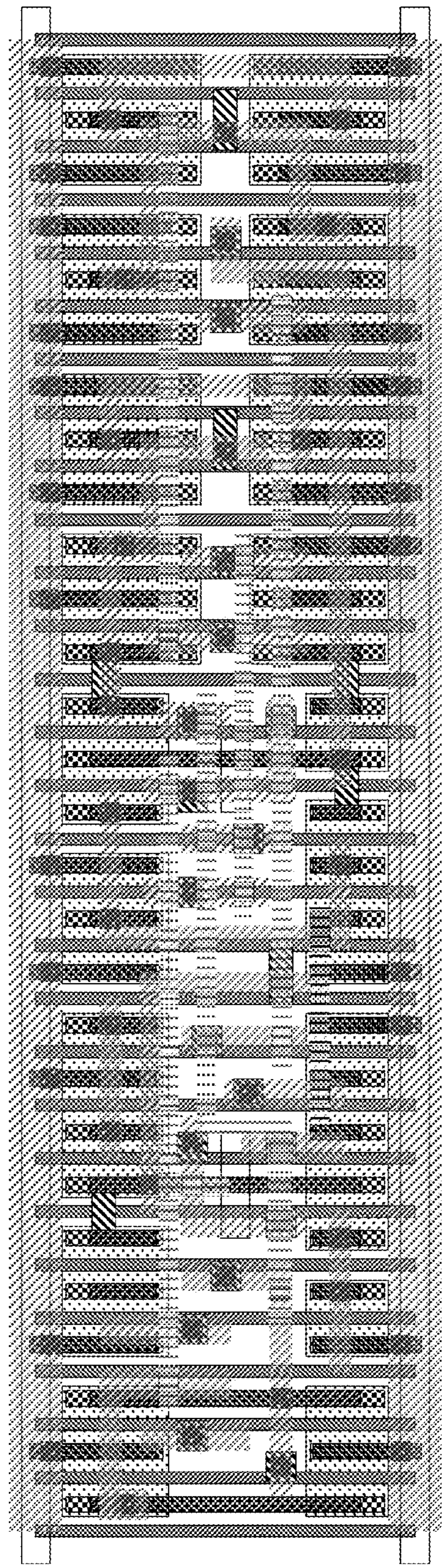
FIG. 221 depicts a DFNCSND2 cell.

Reference is made to FIG. 221, which depicts a DFNCSND2 cell. This cell implements the function of a D-flip-flop in drive strength 2.

Figure 222:
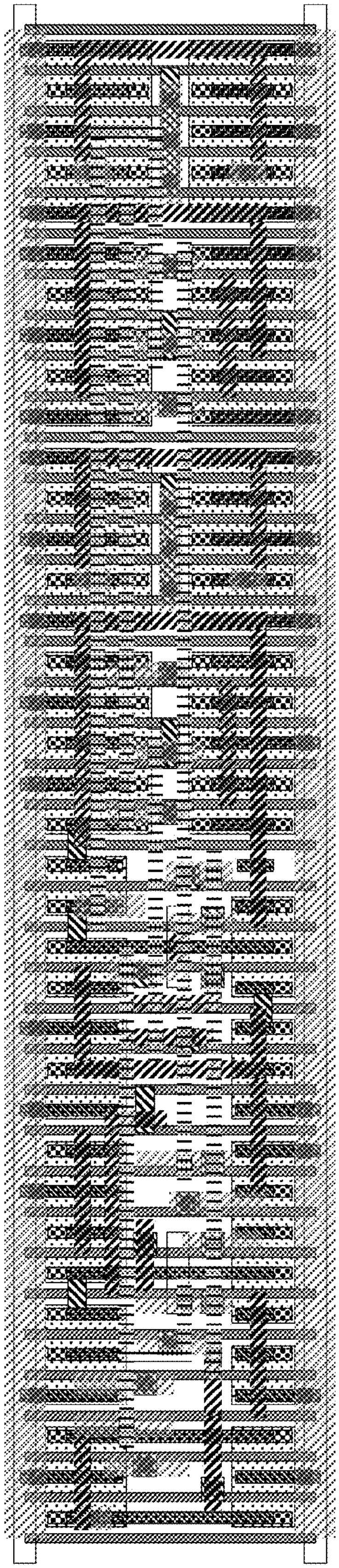
FIG. 222 depicts a DFNCSND4 cell.

Reference is made to FIG. 222, which depicts a DFNCSND4 cell. This cell implements the function of a D-flip-flop in drive strength 4.

Figure 223:
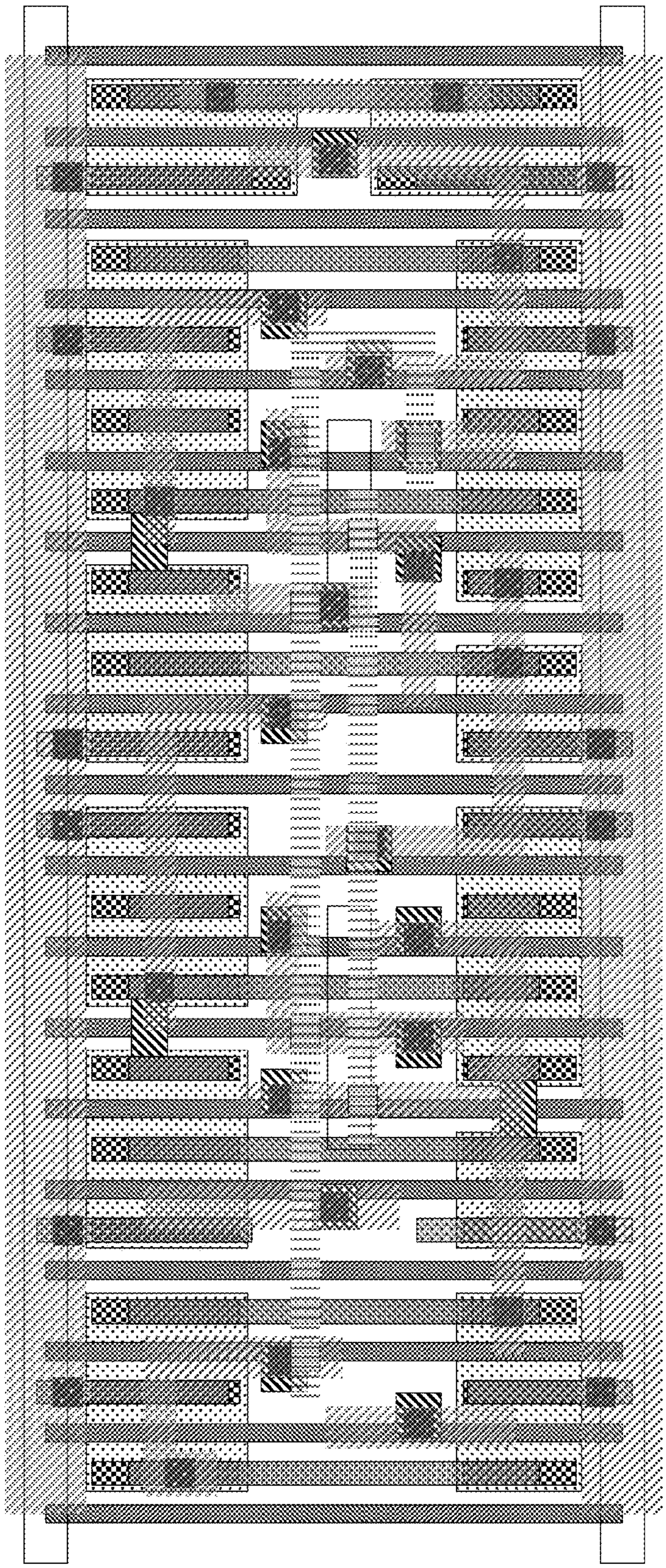
FIG. 223 depicts a DFQD1 cell.

Reference is made to FIG. 223, which depicts a DFQD1 cell. This cell implements the function of a D-flip-flop in drive strength 1.

Figure 224:
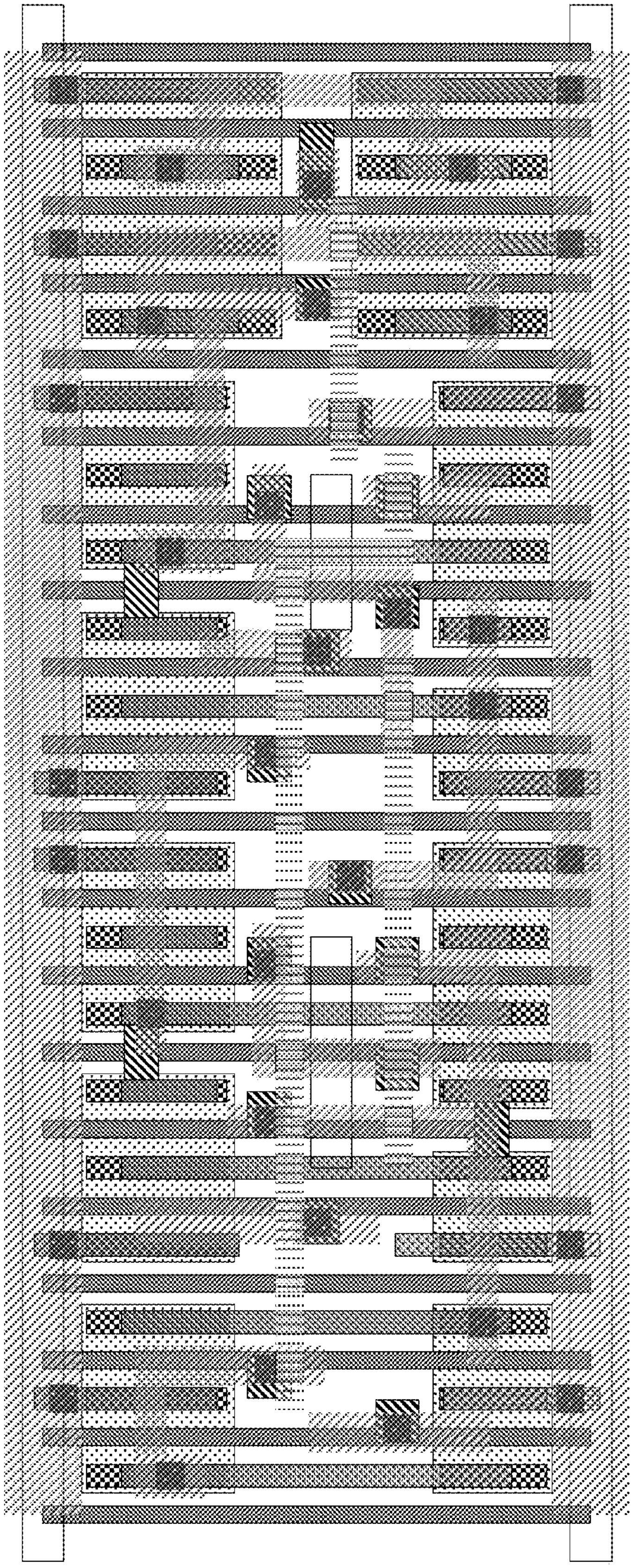
FIG. 224 depicts a DFQD2 cell.

Reference is made to FIG. 224, which depicts a DFQD2 cell. This cell implements the function of a D-flip-flop in drive strength 2.

Figure 225:
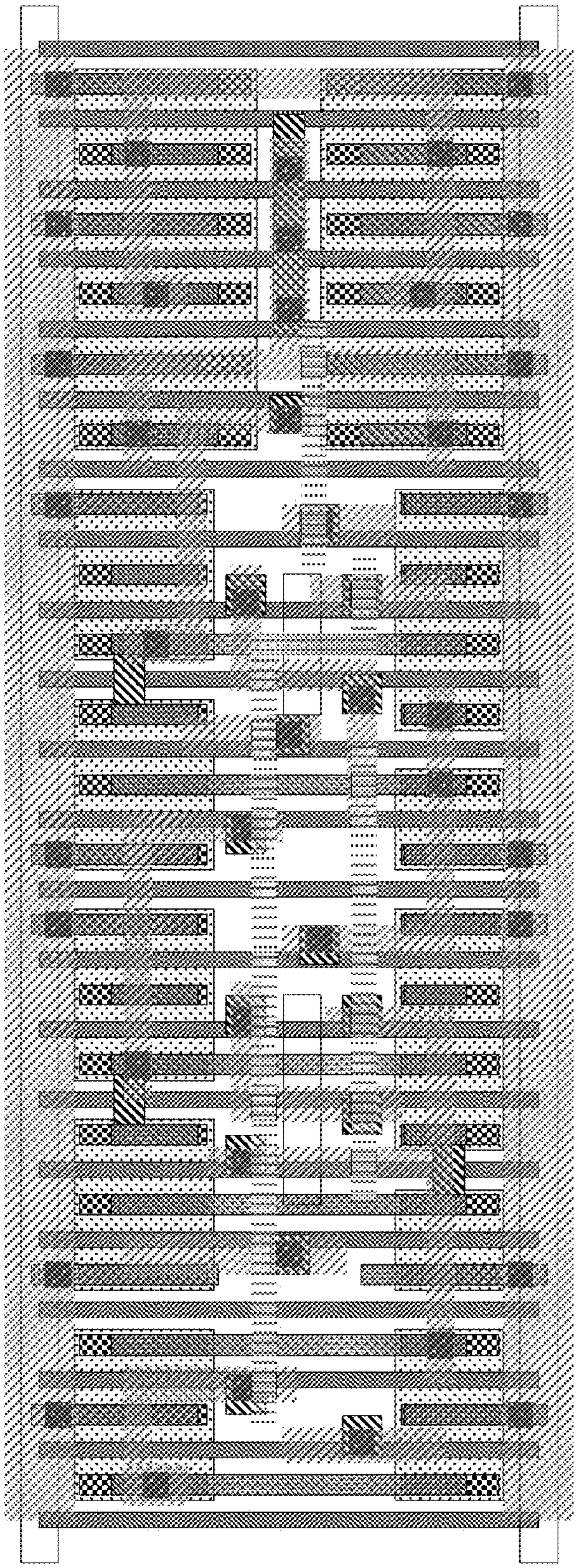
FIG. 225 depicts a DFQD4 cell.

Reference is made to FIG. 225, which depicts a DFQD4 cell. This cell implements the function of a D-flip-flop in drive strength 4.

Figure 226:
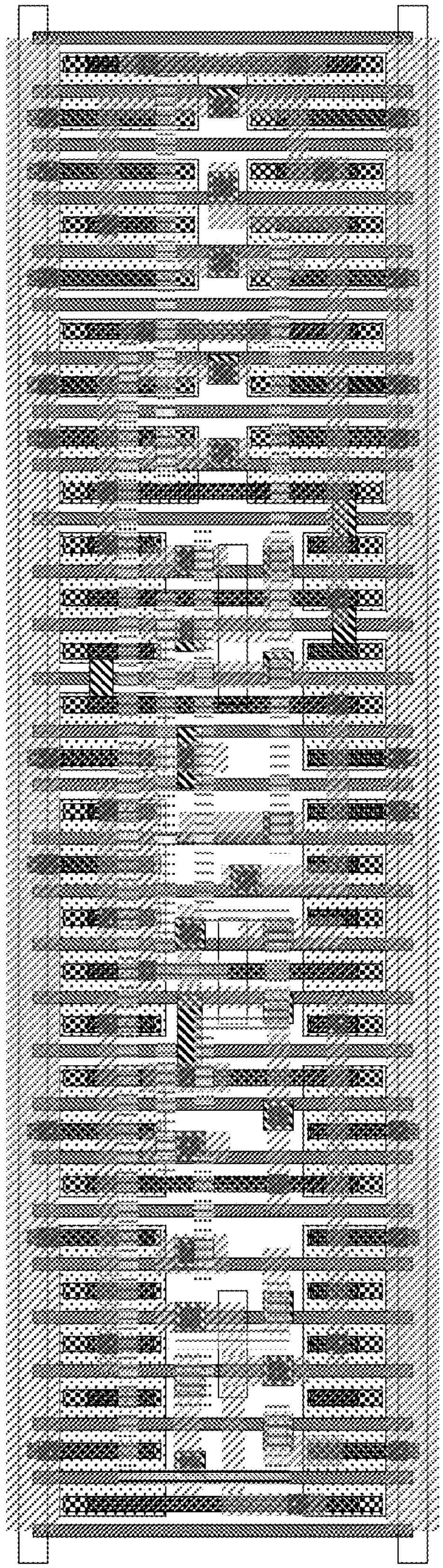
FIG. 226 depicts an EDFCND1 cell.

Reference is made to FIG. 226, which depicts an EDFCND1 cell. This cell implements the function of an E(enable)-flip-flop in drive strength 1.

Figure 227:
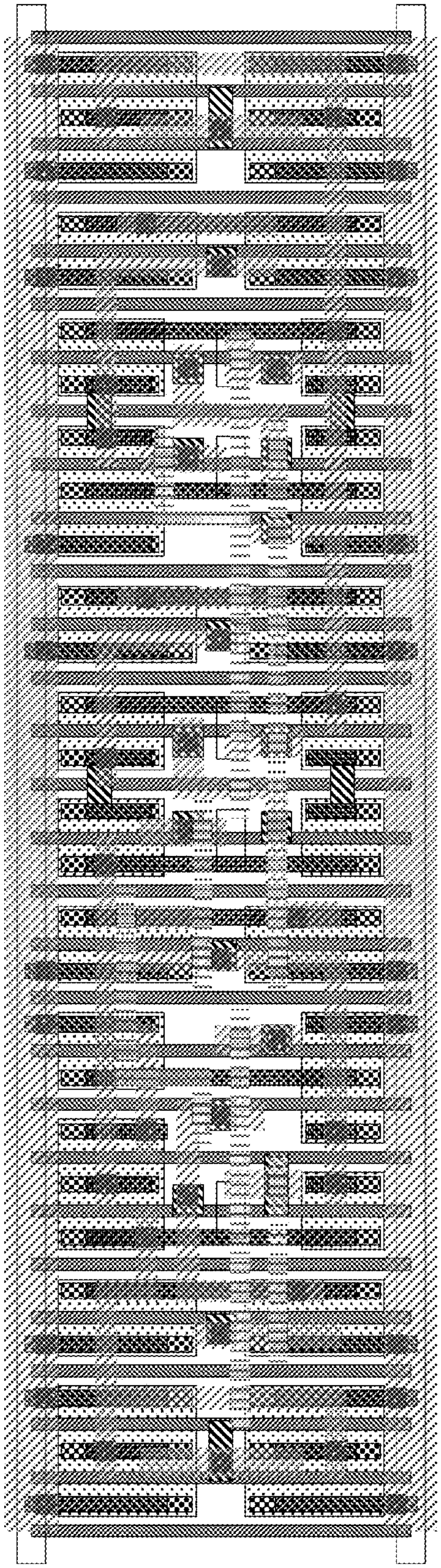
FIG. 227 depicts a FA1D1 cell.

Reference is made to FIG. 227, which depicts a FA1D1 cell. This cell implements the function of a full adder in drive strength 1.

Figure 228:
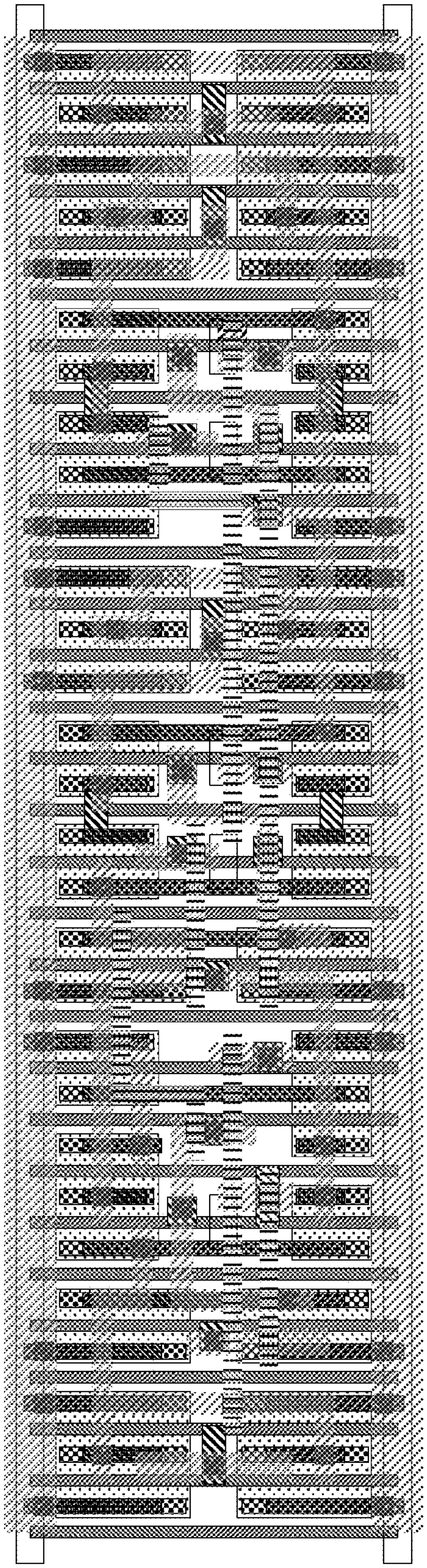
FIG. 228 depicts a FA1D2 cell.

Reference is made to FIG. 228, which depicts a FA1D2 cell. This cell implements the function of a full adder in drive strength 2.

Figure 229:
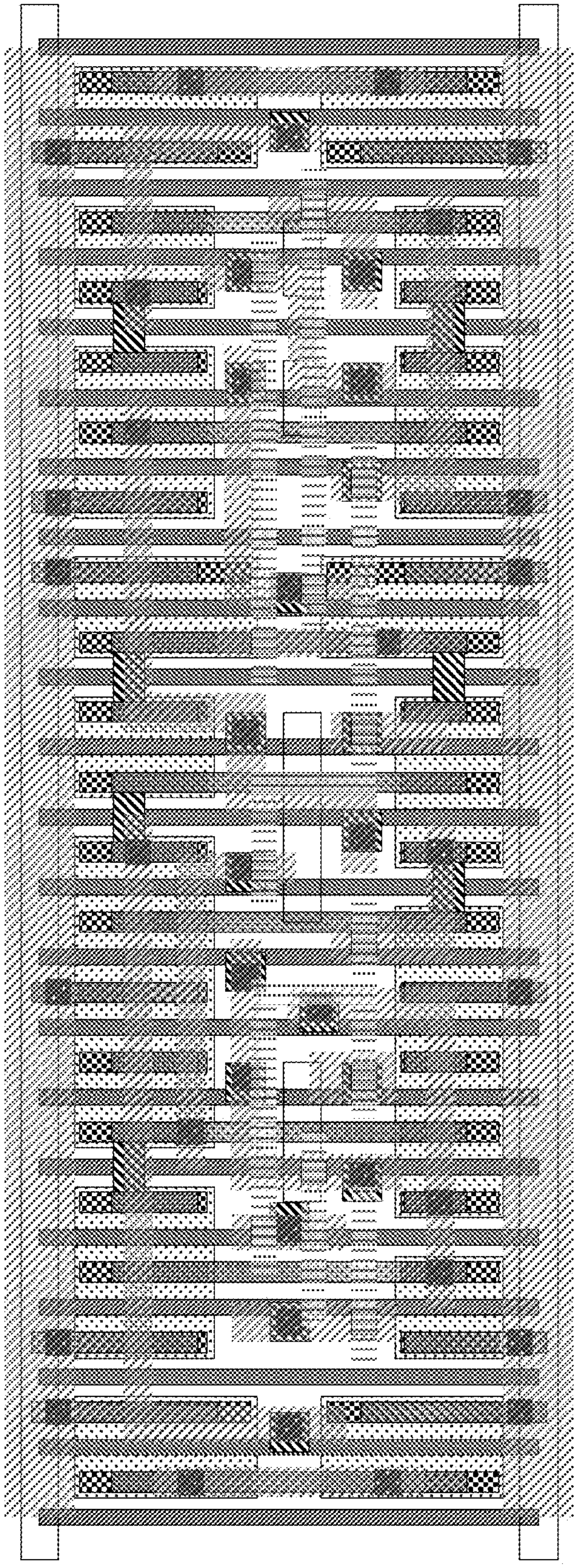
FIG. 229 depicts a FA1HDD1 cell.

Reference is made to FIG. 229, which depicts a FA1HDD1 cell. This cell implements the function of a full adder in drive strength 1.

Figure 230:
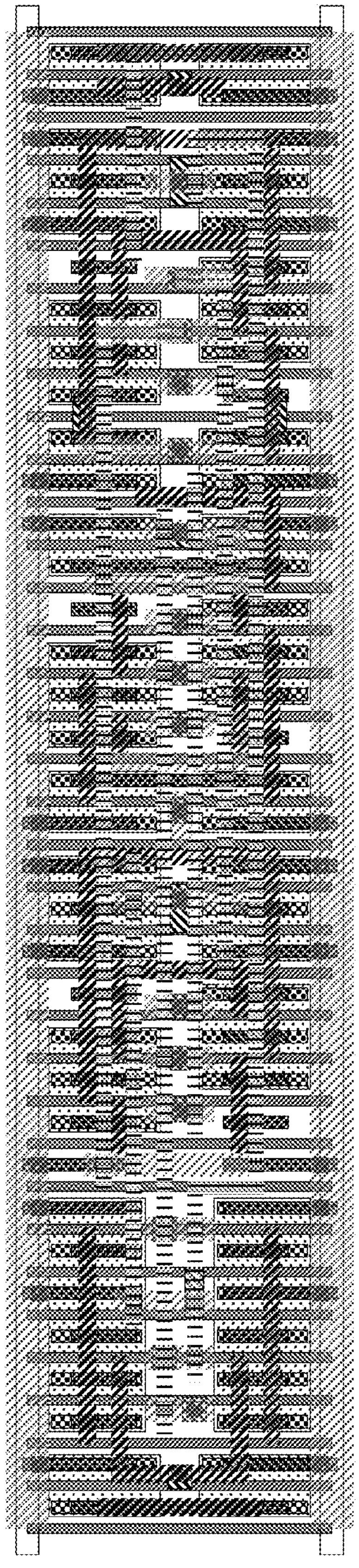
FIG. 230 depicts a FA1HSD1 cell.

Reference is made to FIG. 230, which depicts a FA1HSD1 cell. This cell implements the function of a full adder in drive strength 1.

Figure 231:
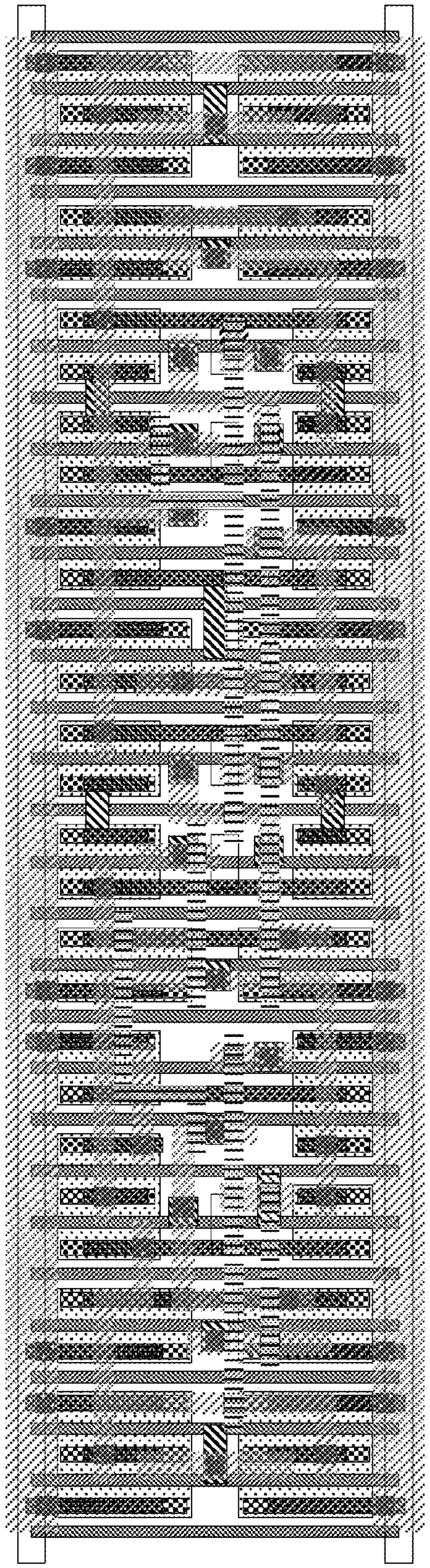
FIG. 231 depicts a FICOND1 cell.

Reference is made to FIG. 231, which depicts a FICOND1 cell. This cell implements the function of a full adder in drive strength 1.

Figure 232:
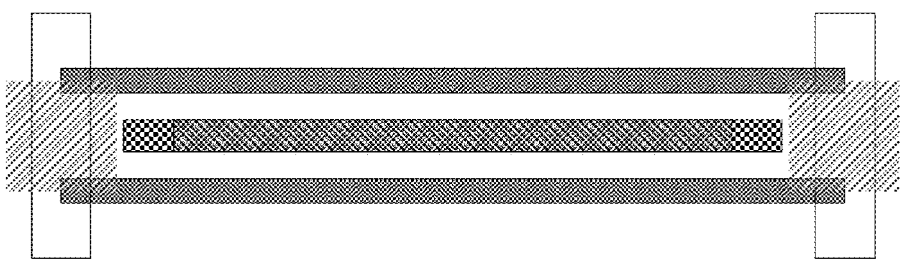
FIG. 232 depicts a FILL1 cell.

Reference is made to FIG. 232, which depicts a FILL1 cell. This cell implements the null function.

Figure 233:
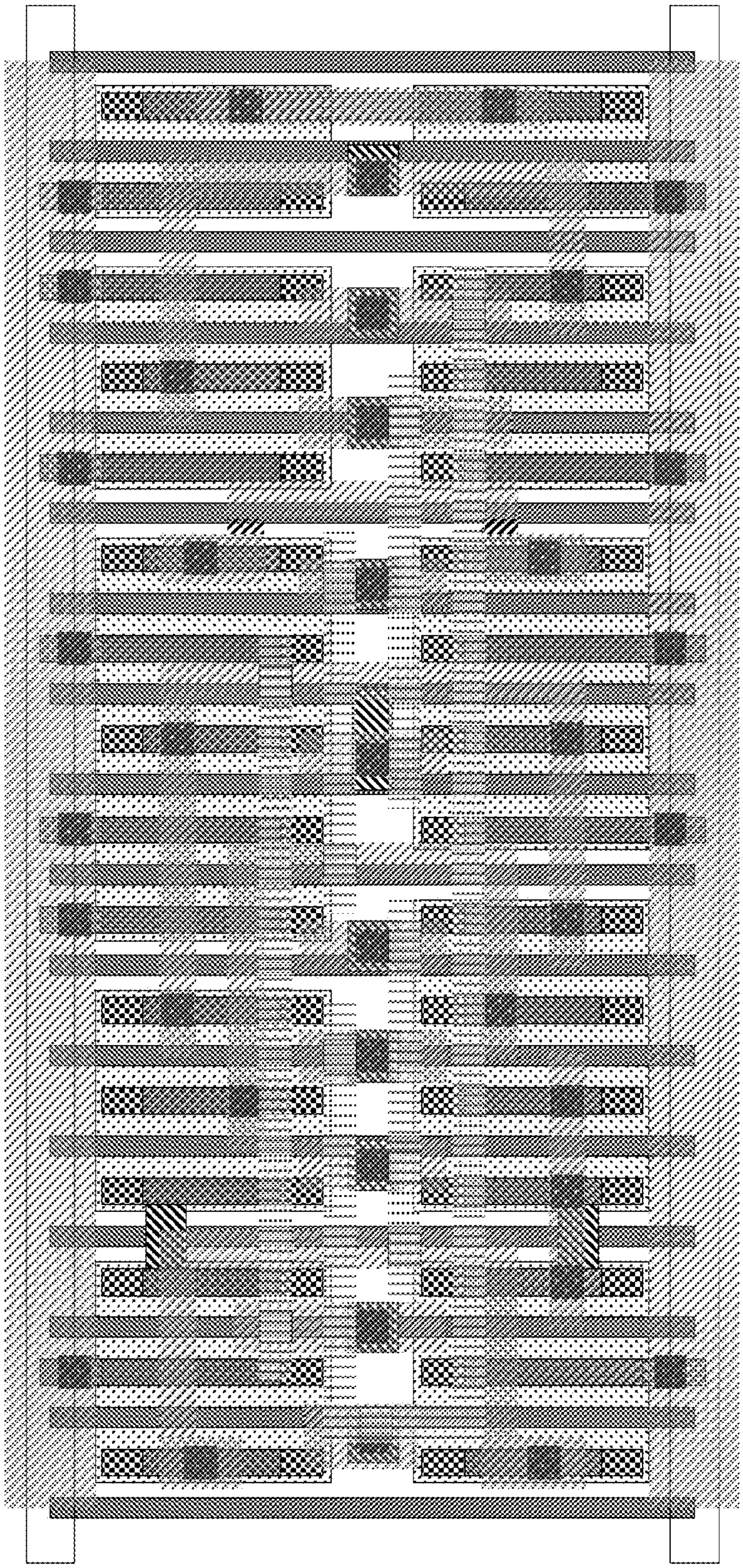
FIG. 233 depicts a HA1D1 cell.

Reference is made to FIG. 233, which depicts a HA1D1 cell. This cell implements the function of a half adder in drive strength 1.

Figure 234:
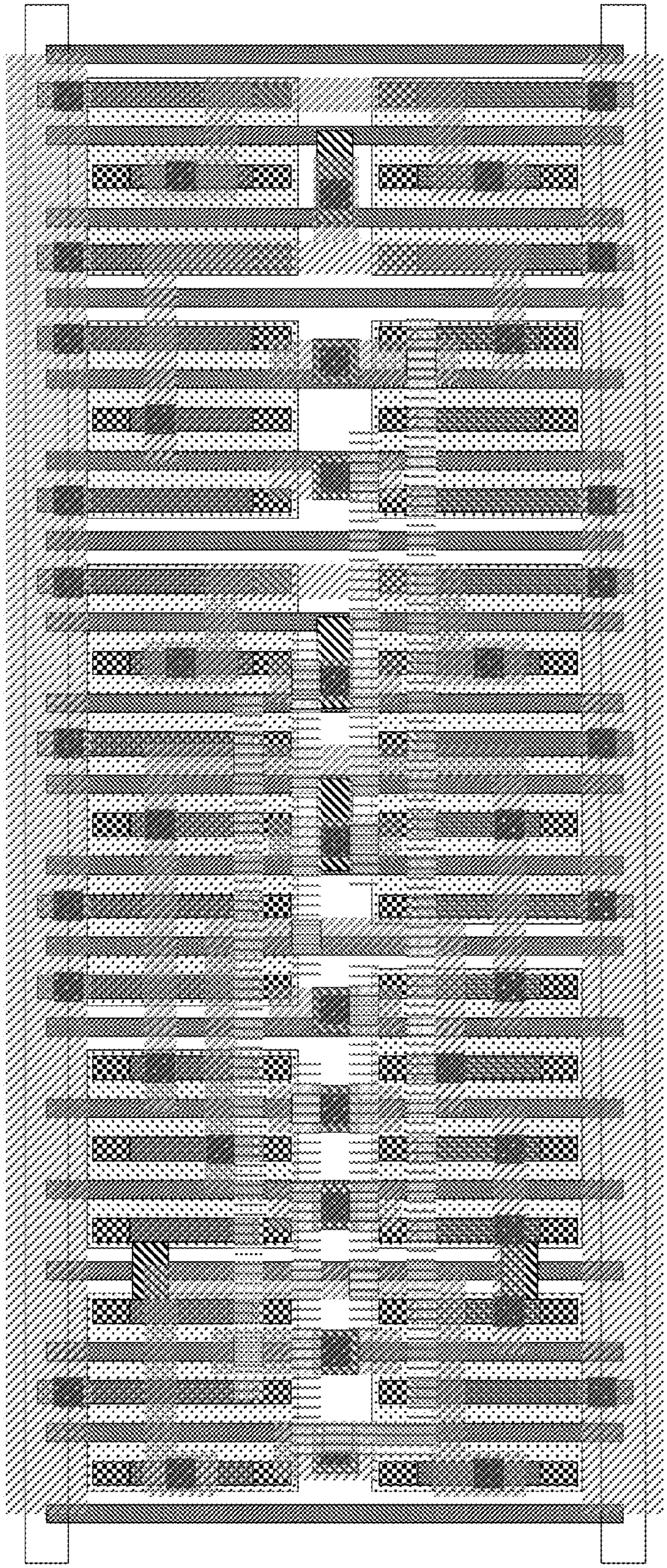
FIG. 234 depicts a HA1D2 cell.

Reference is made to FIG. 234, which depicts a HA1D2 cell. This cell implements the function of a half adder in drive strength 2.

Figure 235:
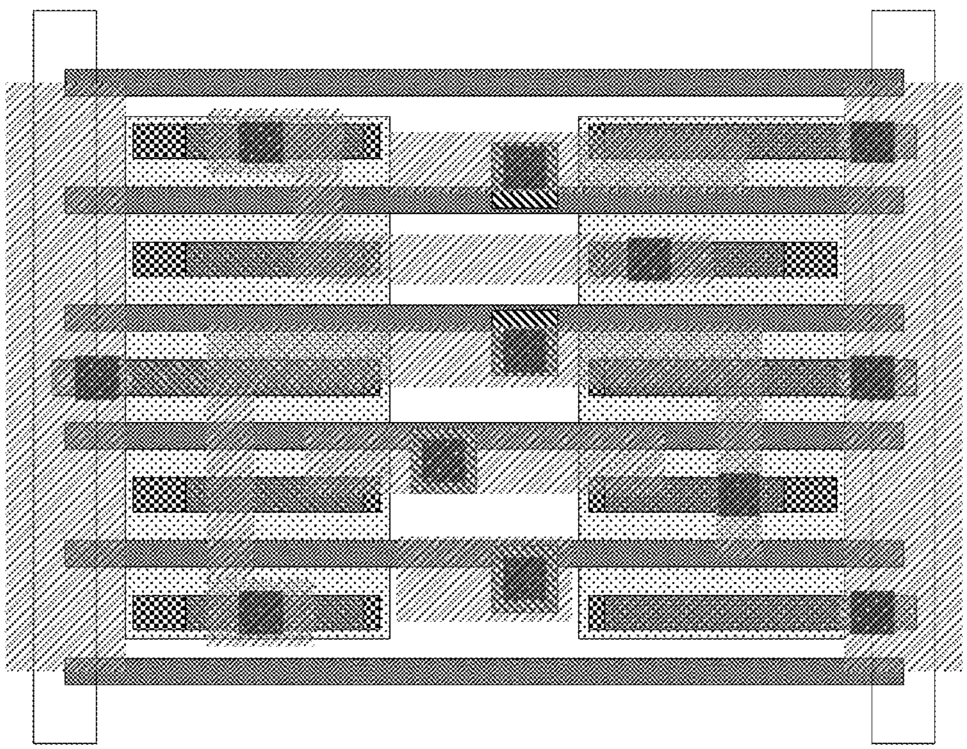
FIG. 235 depicts an IAO21D1 cell.

Reference is made to FIG. 235, which depicts an IAO21D1 cell. This cell implements the logic function nor(nor(A,B),C) in drive strength 1.

Figure 236:
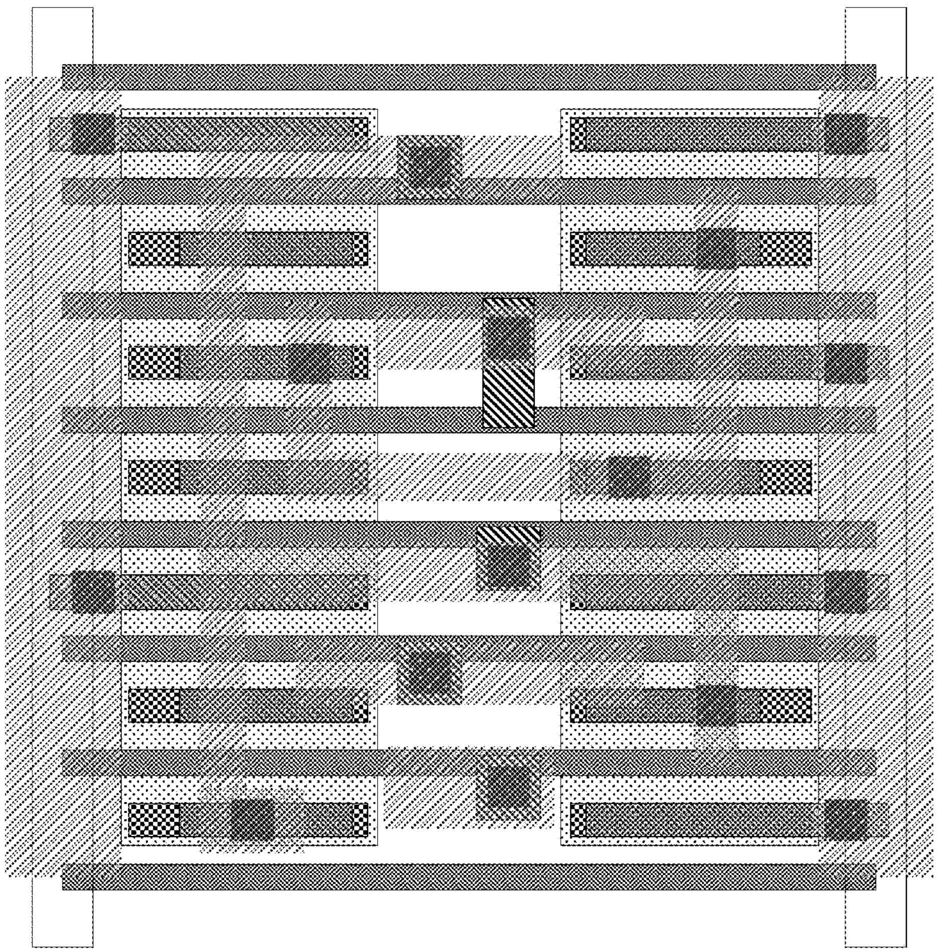
FIG. 236 depicts an IAO21D2 cell.

Reference is made to FIG. 236, which depicts an IAO21D2 cell. This cell implements the logic function nor(nor(A,B),C) in drive strength 2.

Figure 237:
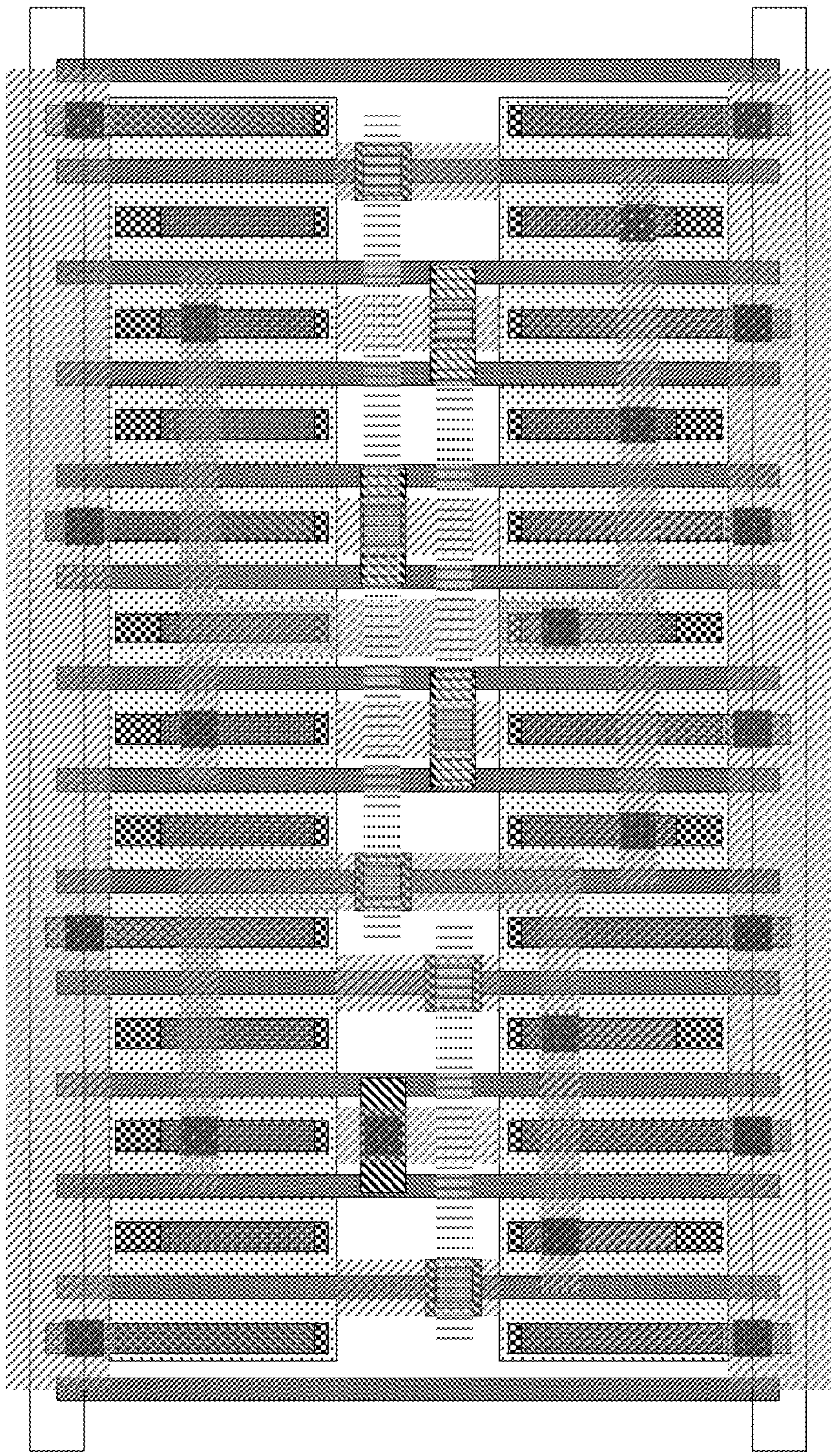
FIG. 237 depicts an IAO21D4 cell.

Reference is made to FIG. 237, which depicts an IAO21D4 cell. This cell implements the logic function nor(nor(A,B),C) in drive strength 4.

Figure 238:
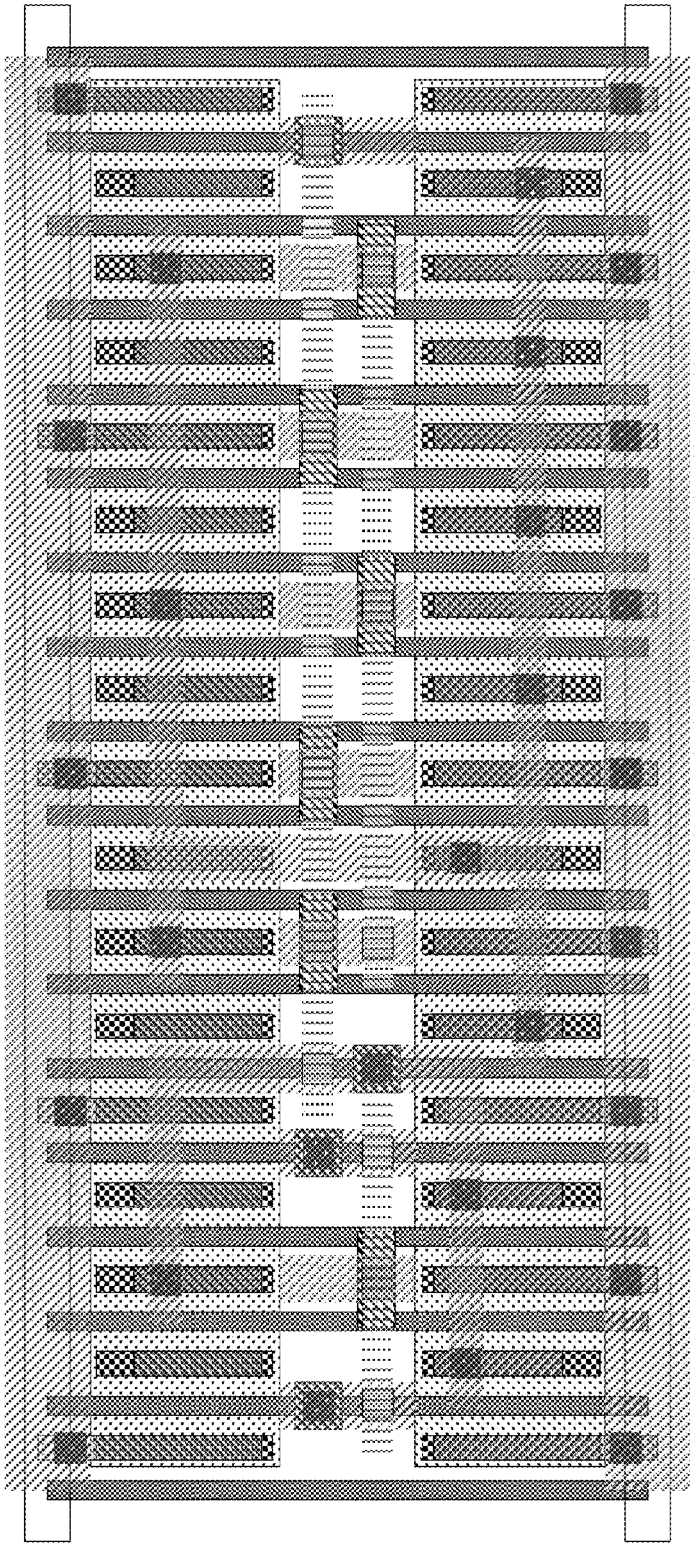
FIG. 238 depicts an IAO21D6 cell.

Reference is made to FIG. 238, which depicts an IAO21D6 cell. This cell implements the logic function nor(nor(A,B),C) in drive strength 6.

Figure 239:
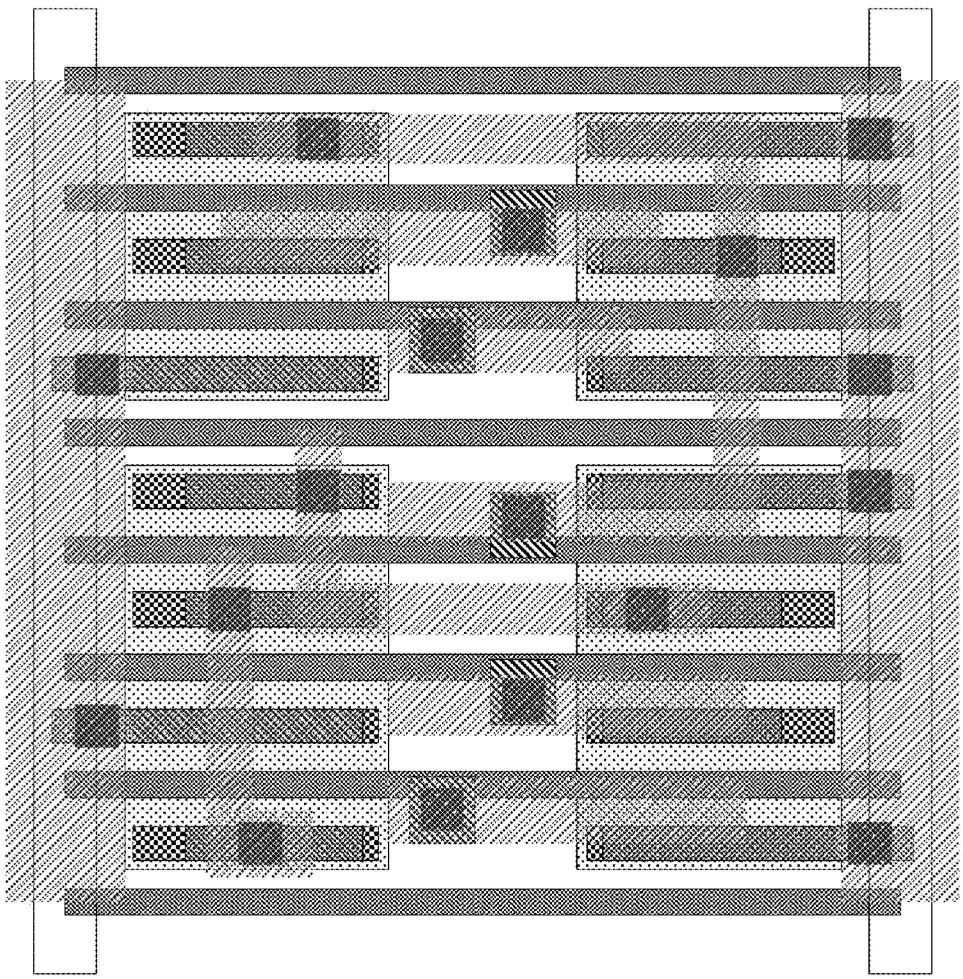
FIG. 239 depicts an IAO22D1 cell.

Reference is made to FIG. 239, which depicts an IAO22D1 cell. This cell implements the logic function nor(nor(A,B),nor(C,D)) in drive strength 1.

Figure 240:
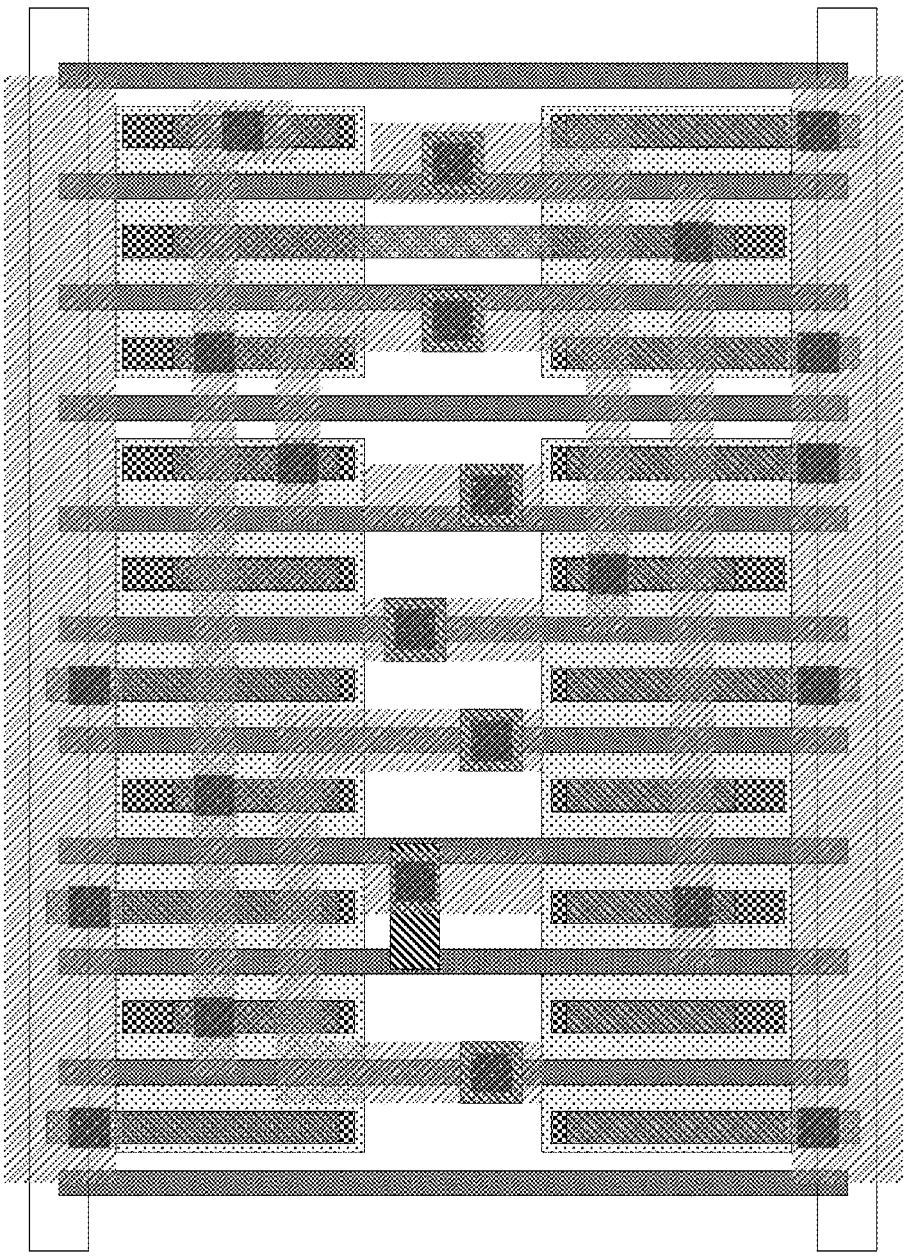
FIG. 240 depicts an IAO22D2 cell.

Reference is made to FIG. 240, which depicts an IAO22D2 cell. This cell implements the logic function nor(nor(A,B),nor(C,D)) in drive strength 2.

Figure 241:
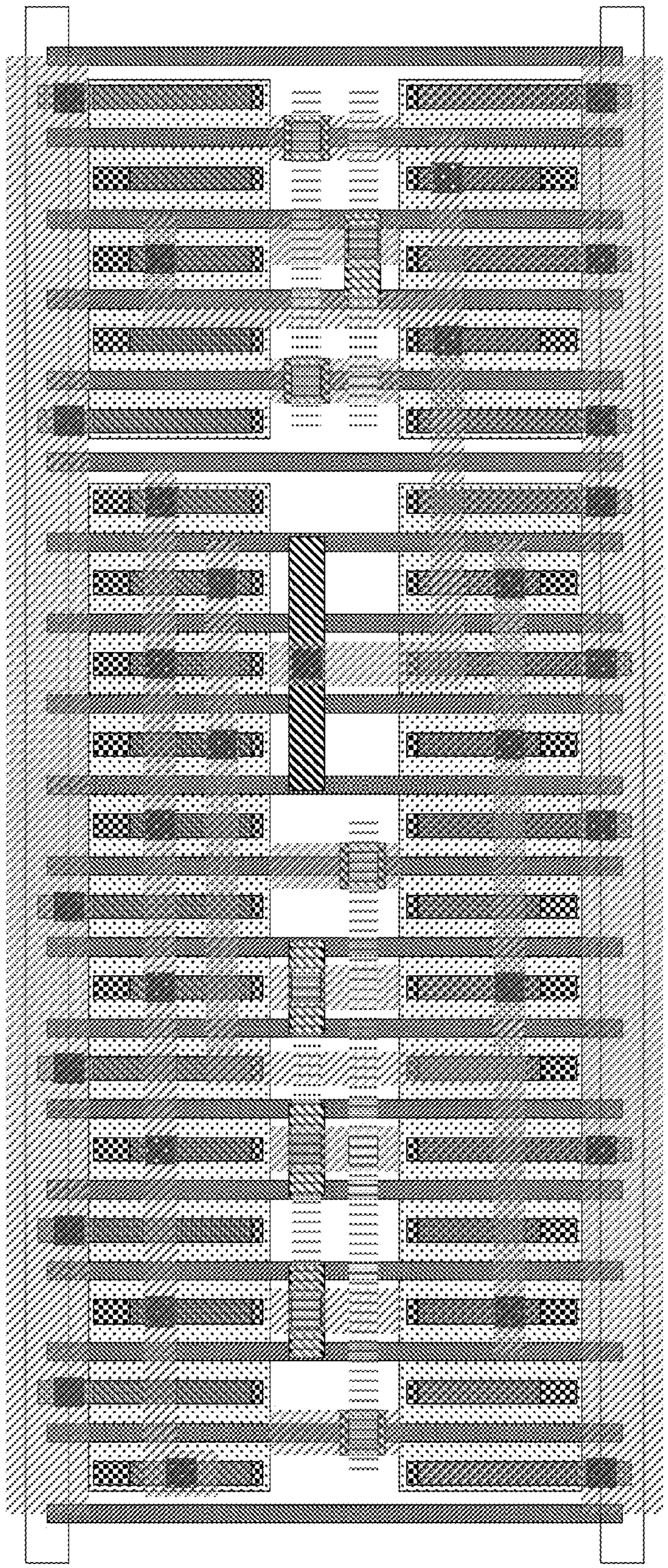
FIG. 241 depicts an IAO22D4 cell.

Reference is made to FIG. 241, which depicts an IAO22D4 cell. This cell implements the logic function nor(nor(A,B),nor(C,D)) in drive strength 4.

Figure 242:
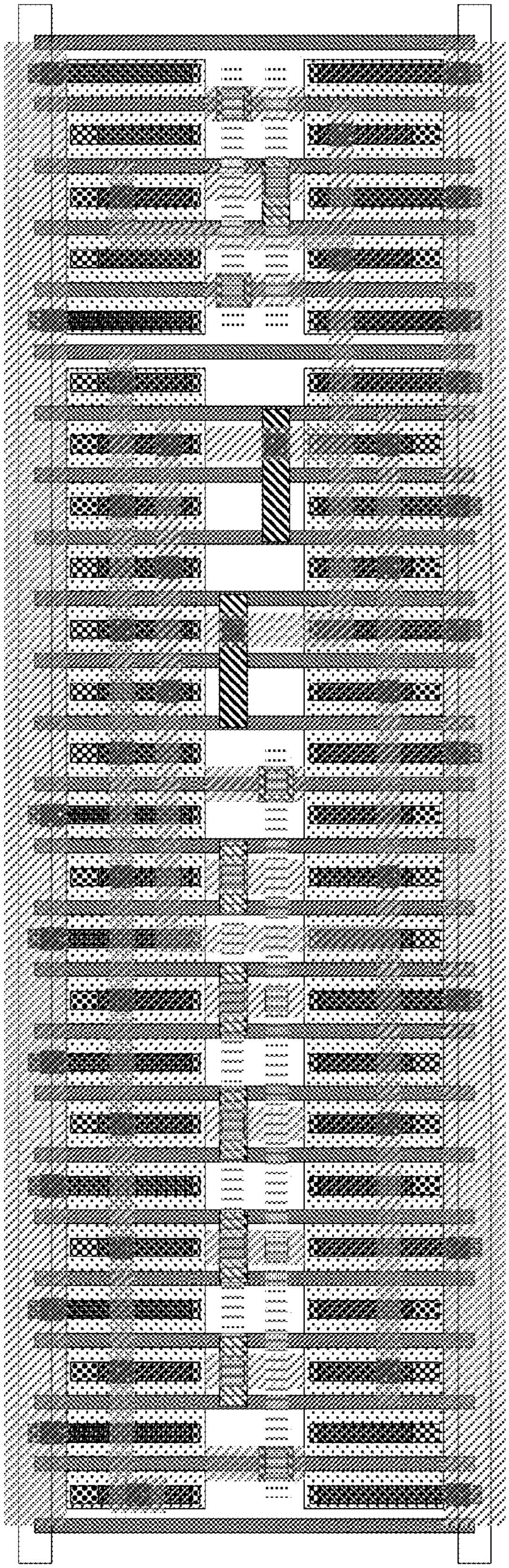
FIG. 242 depicts an IAO22D6.

Reference is made to FIG. 242, which depicts an IAO22D6 cell. This cell implements the logic function nor(nor(A,B),nor(C,D)) in drive strength 6.

Figure 243:
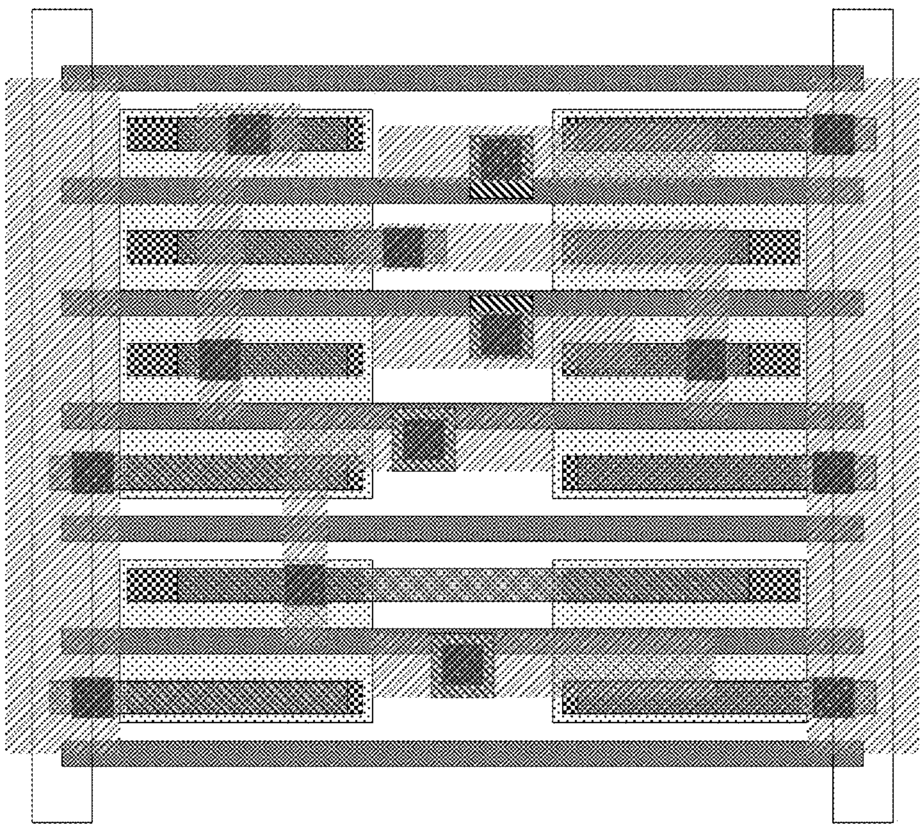
FIG. 243 depicts an IAOI21D1 cell.

Reference is made to FIG. 243, which depicts an IAOI21D1 cell. This cell implements the logic function nor(and(not(A),B),C) in drive strength 1.

Figure 244:
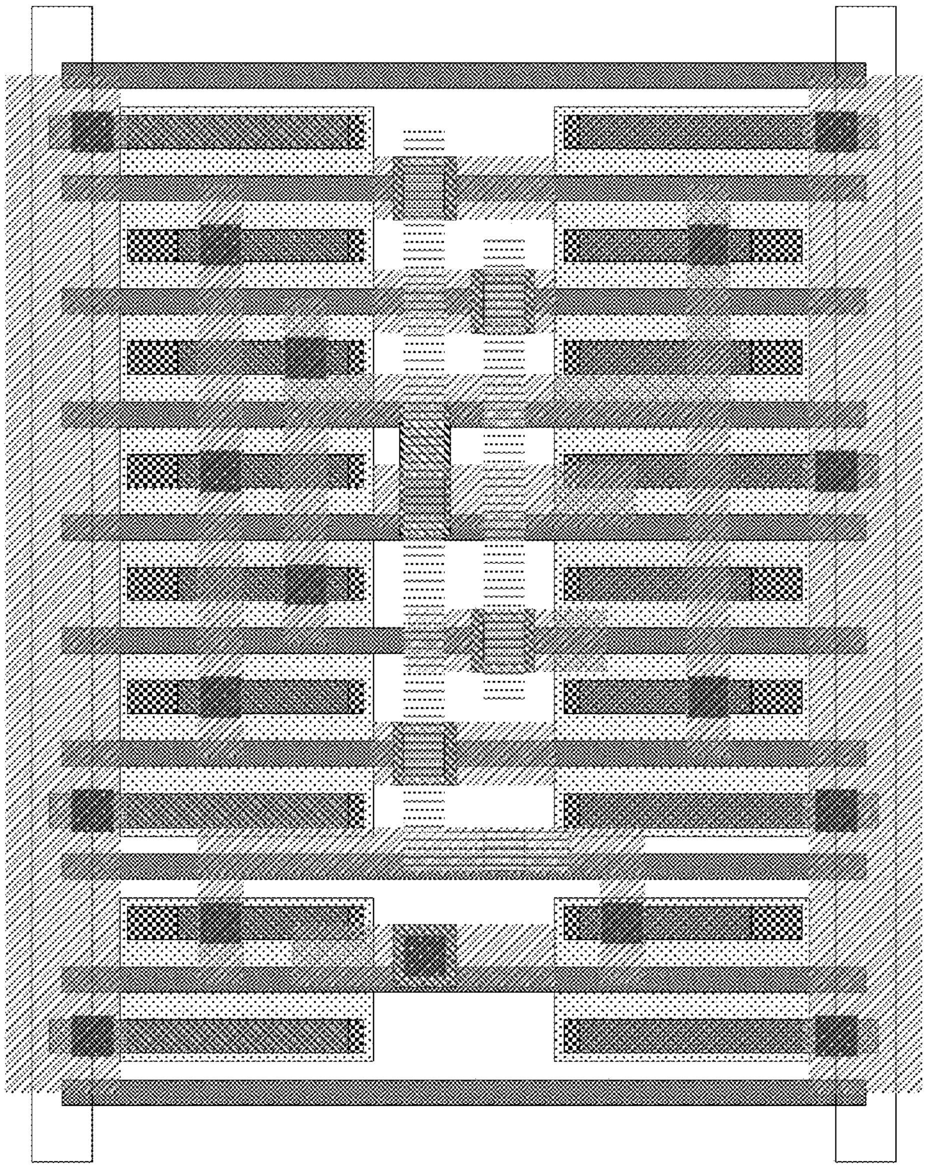
FIG. 244 depicts an IAOI21D2 cell.

Reference is made to FIG. 244, which depicts an IAOI21D2 cell. This cell implements the logic function nor(and(not(A),B),C) in drive strength 2.

Figure 245:
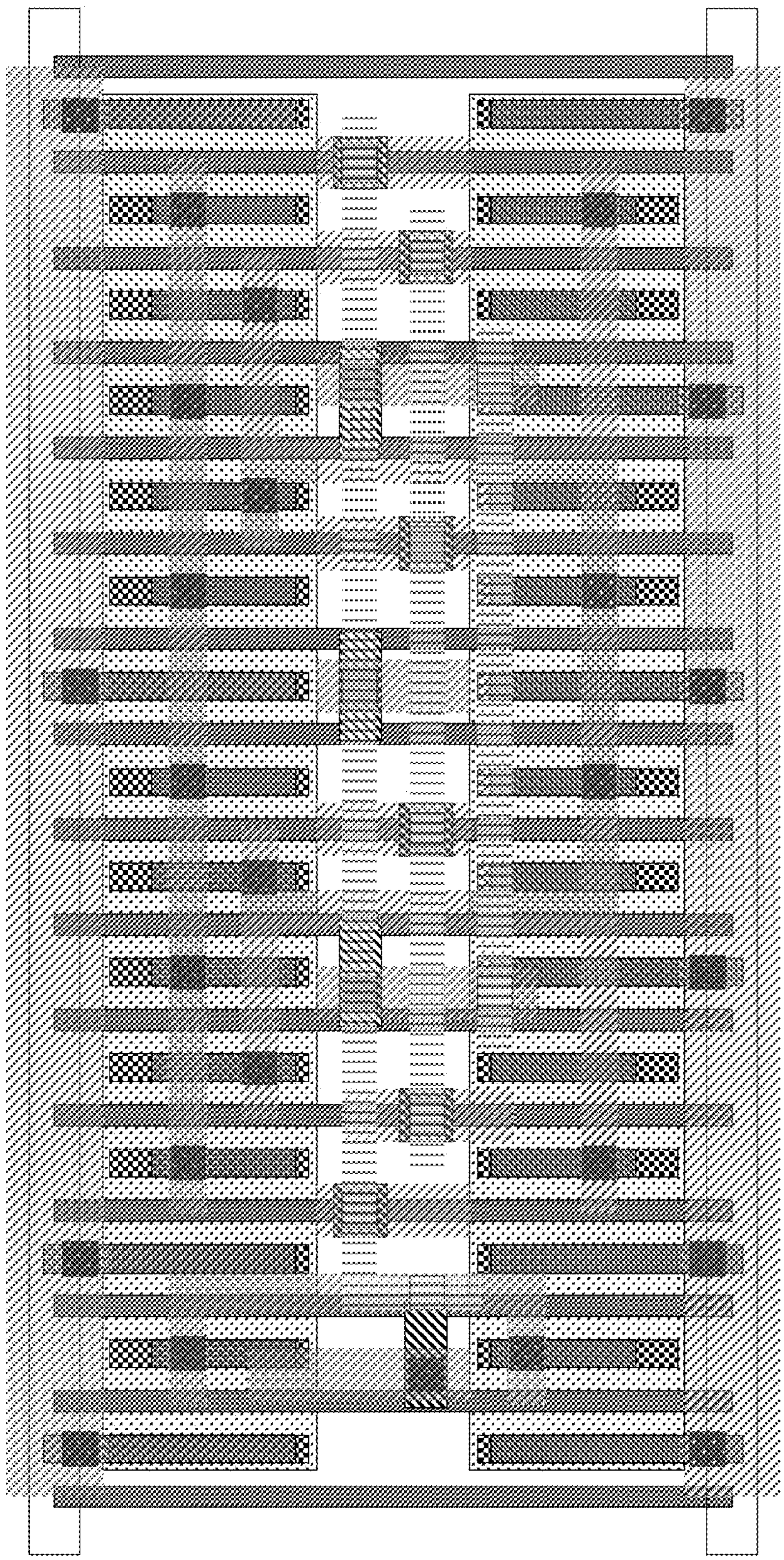
FIG. 245 depicts an IAOI21D4 cell.

Reference is made to FIG. 245, which depicts an IAOI21D4 cell. This cell implements the logic function nor(and(not(A),B),C) in drive strength 4.

Figure 246:
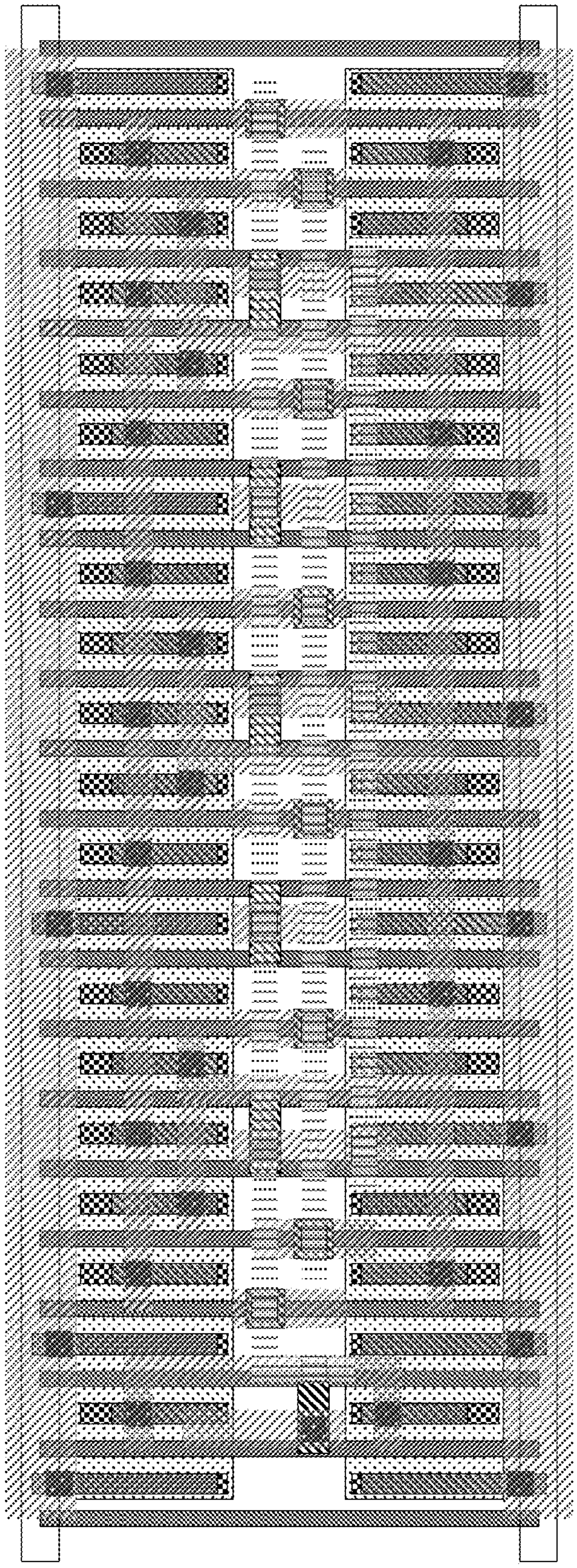
FIG. 246 depicts an IAOI21D6 cell.

Reference is made to FIG. 246, which depicts an IAOI21D6 cell. This cell implements the logic function nor(and(not(A),B),C) in drive strength 6.

Figure 247:
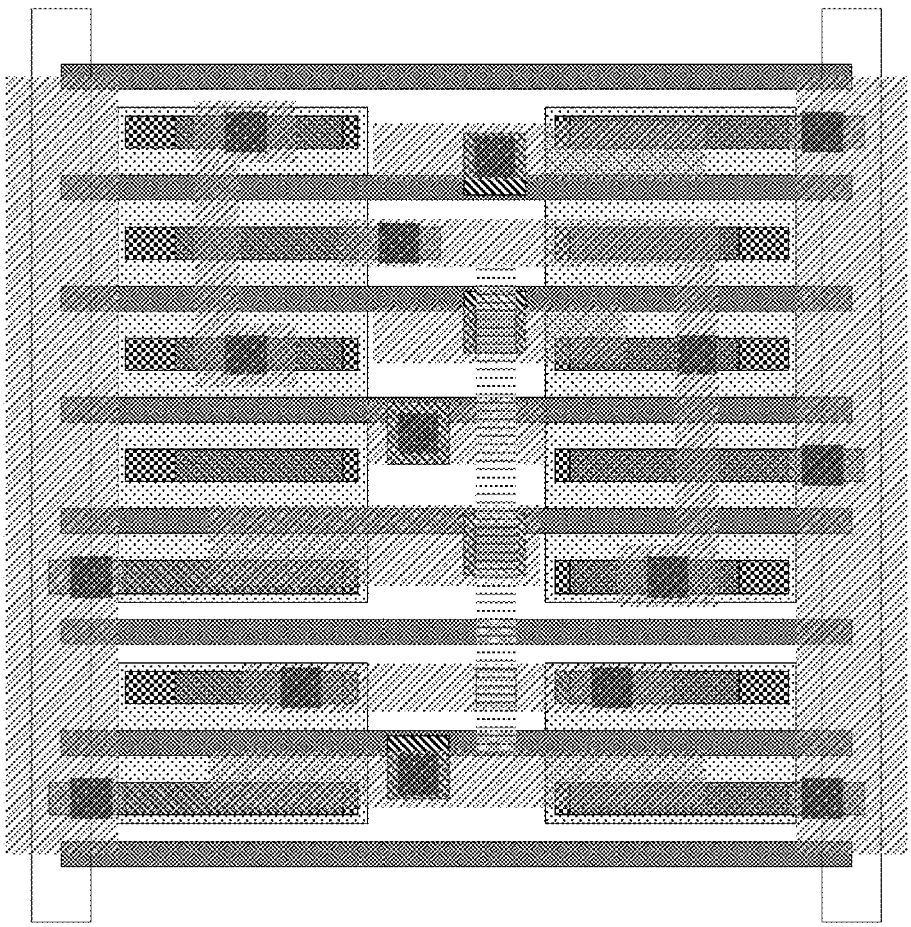
FIG. 247 depicts an IAOI211D1 cell.

Reference is made to FIG. 247, which depicts an IAOI211D1 cell. This cell implements the logic function nor(and(not(A),B),C,D) in drive strength 1.

Figure 248:
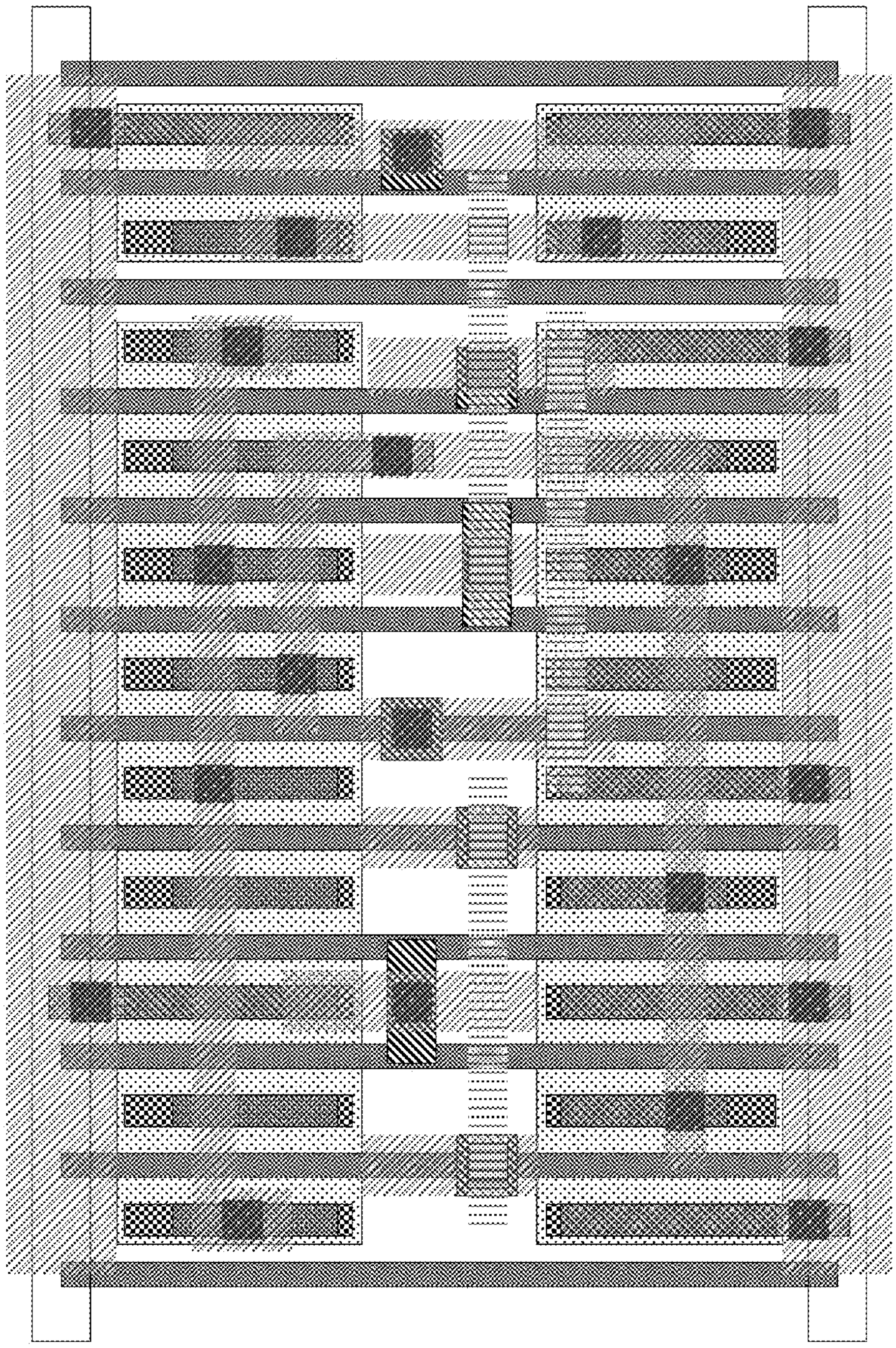
FIG. 248 depicts an IAOI211D2 cell.

Reference is made to FIG. 248, which depicts an IAOI211D2 cell. This cell implements the logic function nor(and(not(A),B),C,D) in drive strength 2.

Figure 249:
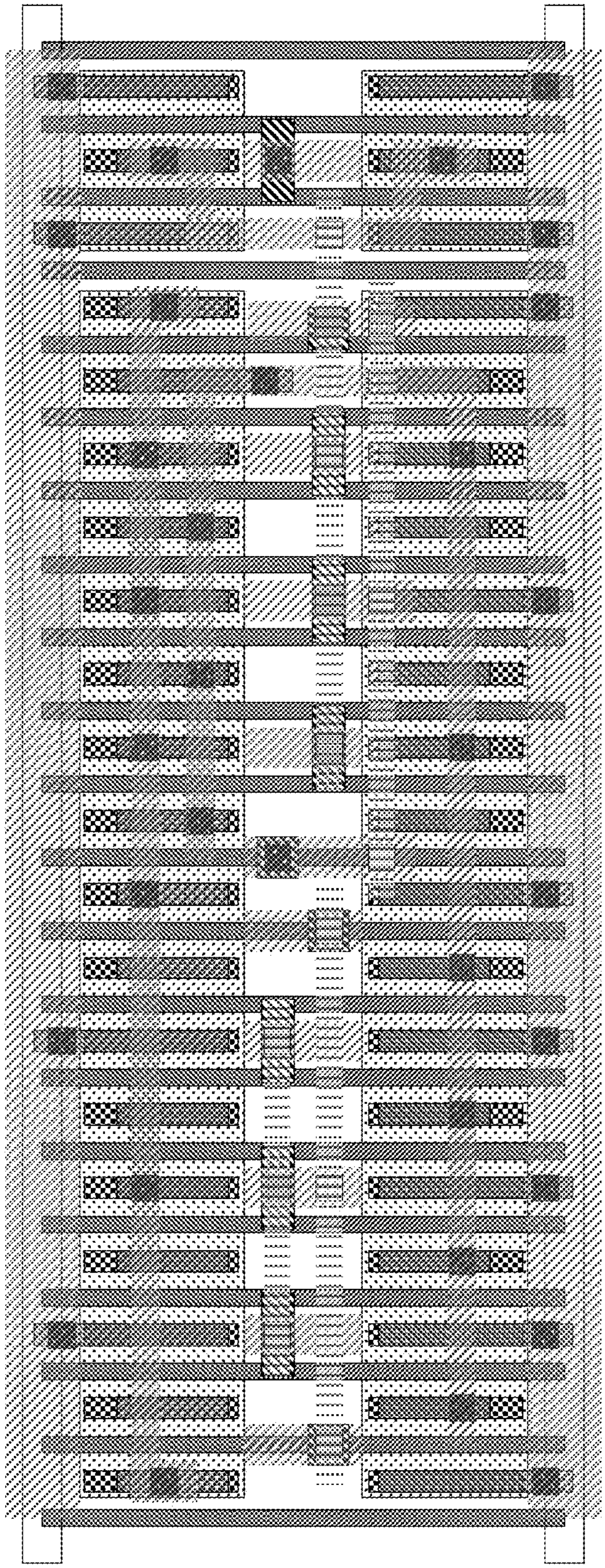
FIG. 249 depicts an IAOI211D4 cell.

Reference is made to FIG. 249, which depicts an IAOI211D4 cell. This cell implements the logic function nor(and(not(A),B),C,D) in drive strength 4.

Figure 250:
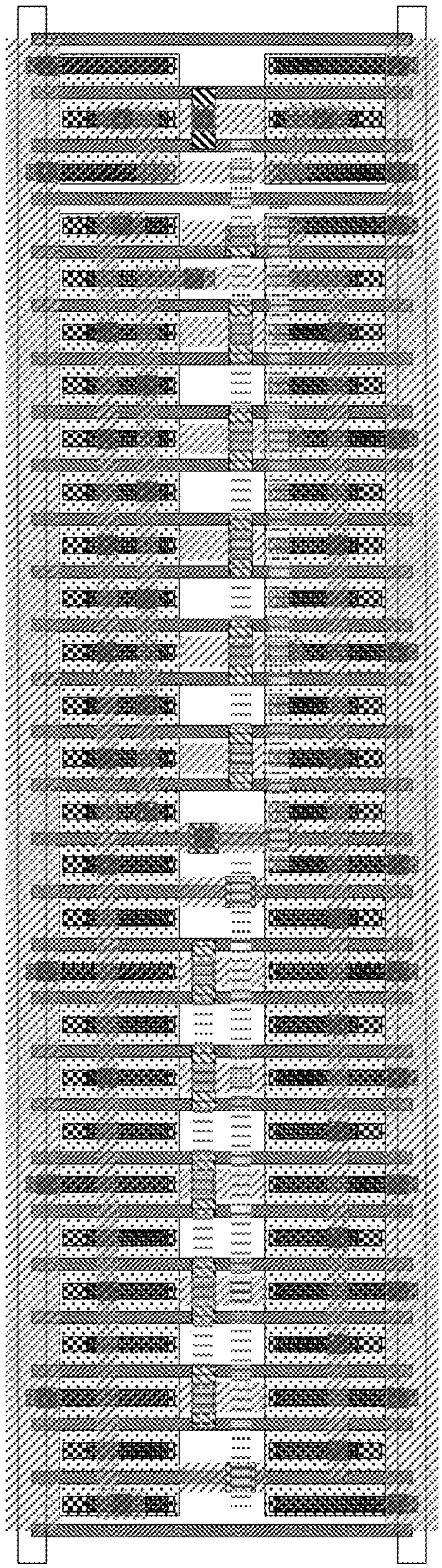
FIG. 250 depicts an IAOI211D6 cell.

Reference is made to FIG. 250, which depicts an IAOI211D6 cell. This cell implements the logic function nor(and(not(A),B),C,D) in drive strength 6.

Figure 251:
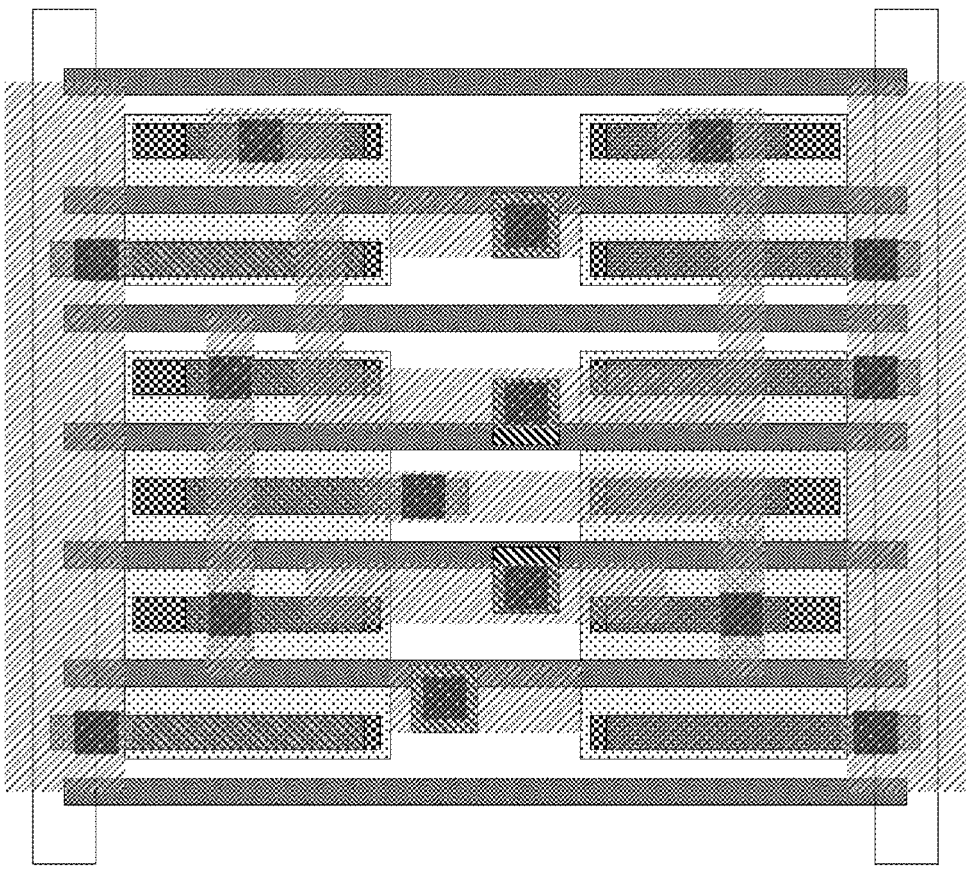
FIG. 251 depicts an IIAOI21D1 cell.

Reference is made to FIG. 251, which depicts an IIAOI21D1 cell. This cell implements the logic function nor(and(not(A),not(B)),C) in drive strength 1.

Figure 252:
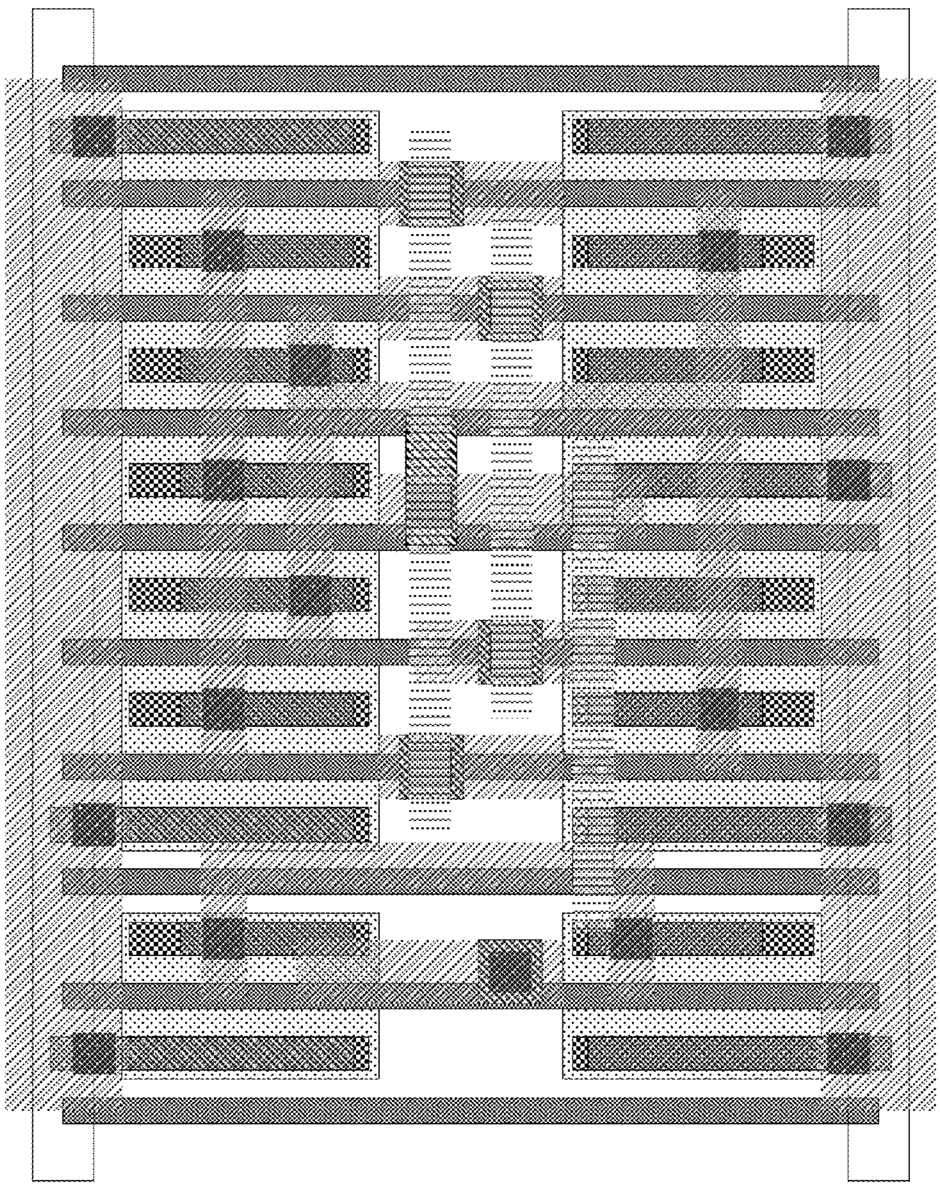
FIG. 252 depicts an IIAOI21D2 cell.

Reference is made to FIG. 252, which depicts an IIAOI21D2 cell. This cell implements the logic function nor(and(not(A),not(B)),C) in drive strength 2.

Figure 253:
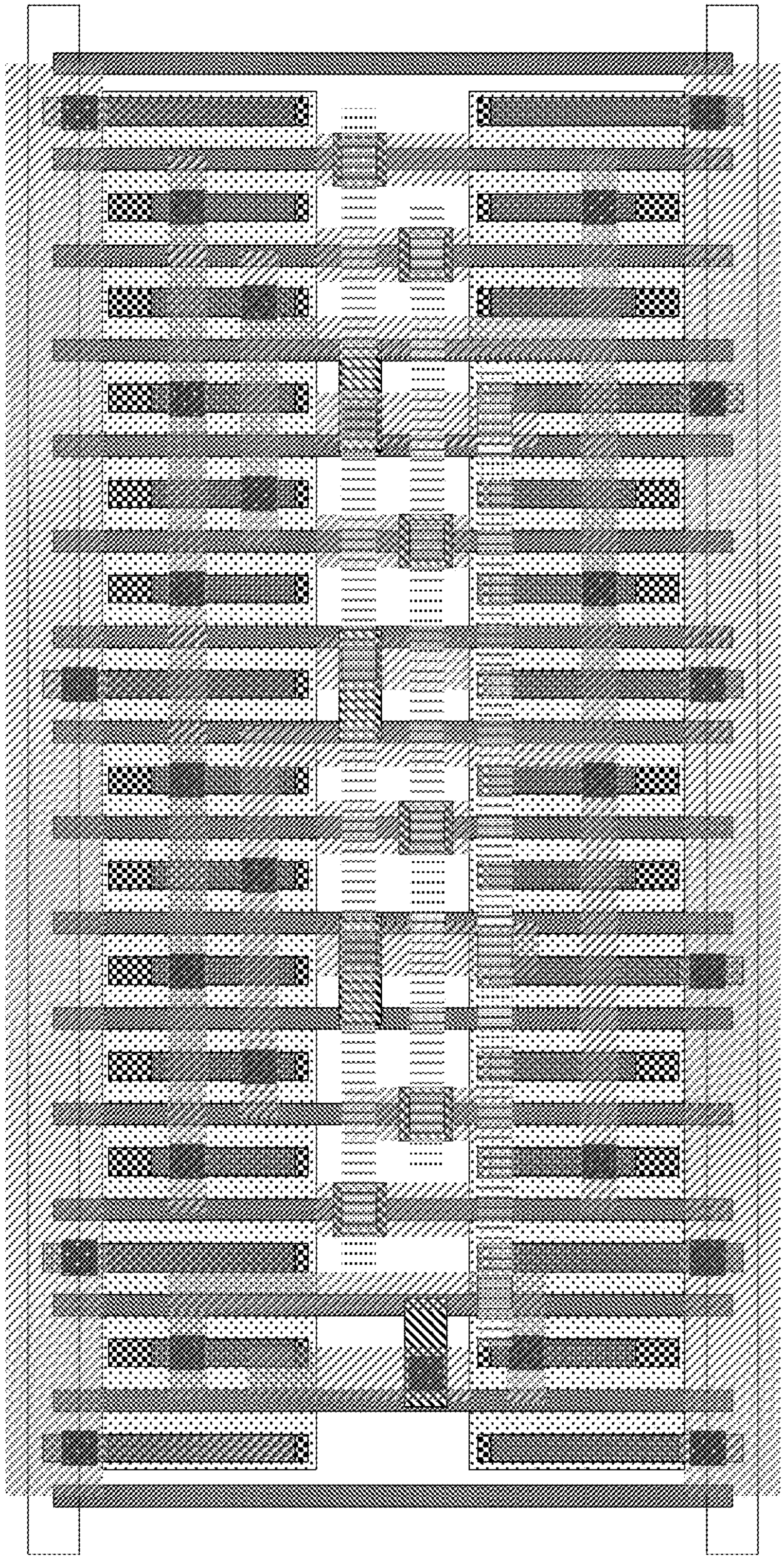
FIG. 253 depicts an IIAOI21D4 cell.

Reference is made to FIG. 253, which depicts an IIAOI21D4 cell. This cell implements the logic function nor(and(not(A),not(B)),C) in drive strength 4.

Figure 254:
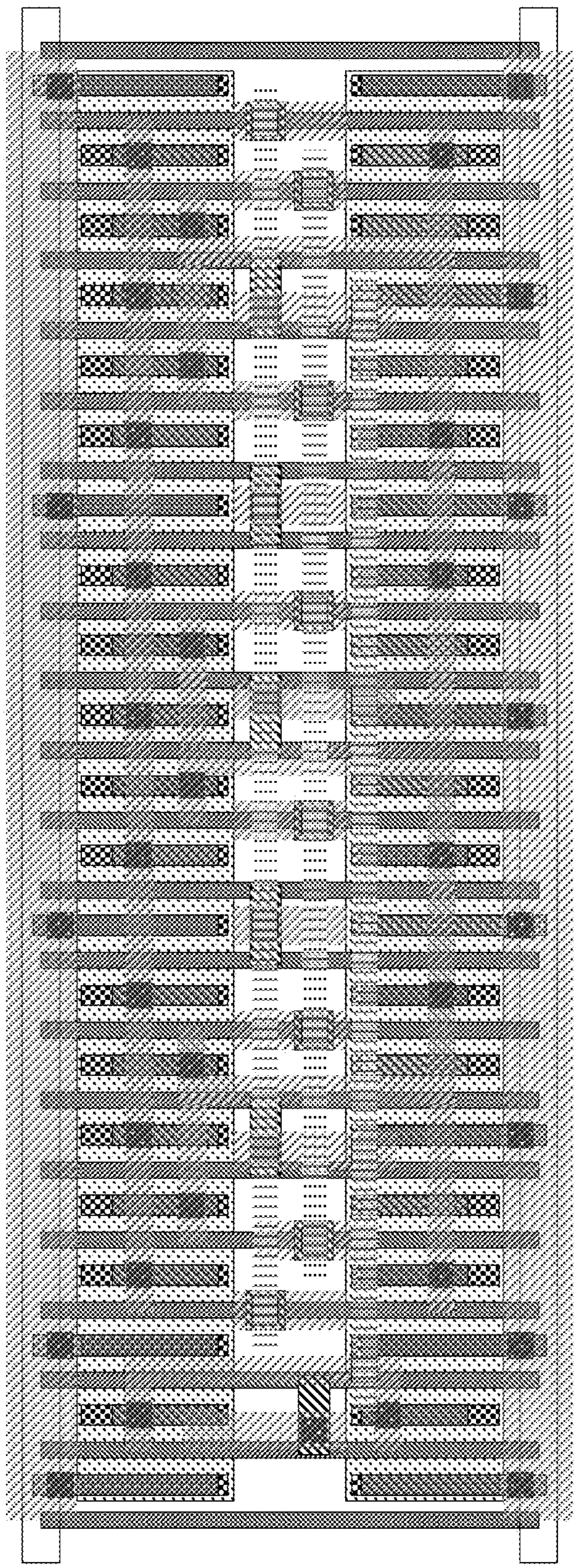
FIG. 254 depicts an IIAOI21D6 cell.

Reference is made to FIG. 254, which depicts an IIAOI21D6 cell. This cell implements the logic function nor(and(not(A),not(B)),C) in drive strength 6.

Figure 255:
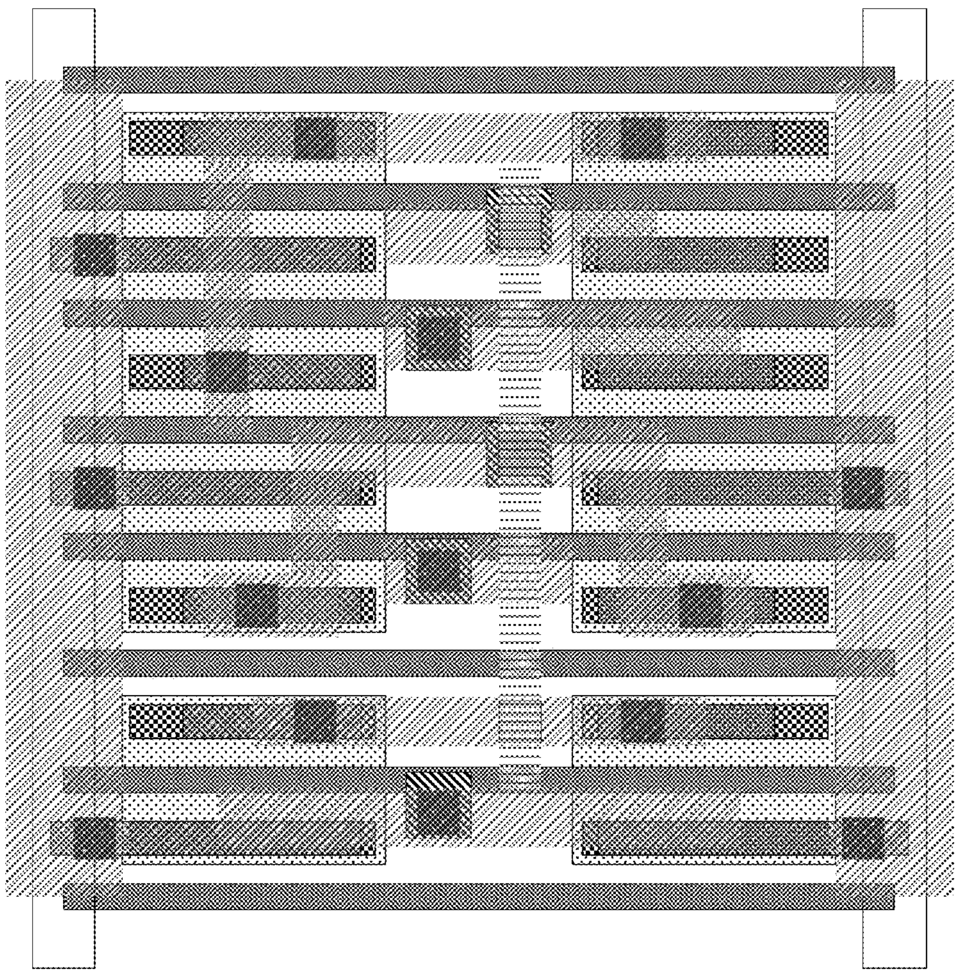
FIG. 255 depicts an IIND3D1 cell.

Reference is made to FIG. 255, which depicts an IIND3D1 cell. This cell implements the logic function nand(not(A),not(B),C) in drive strength 1.

Figure 256:
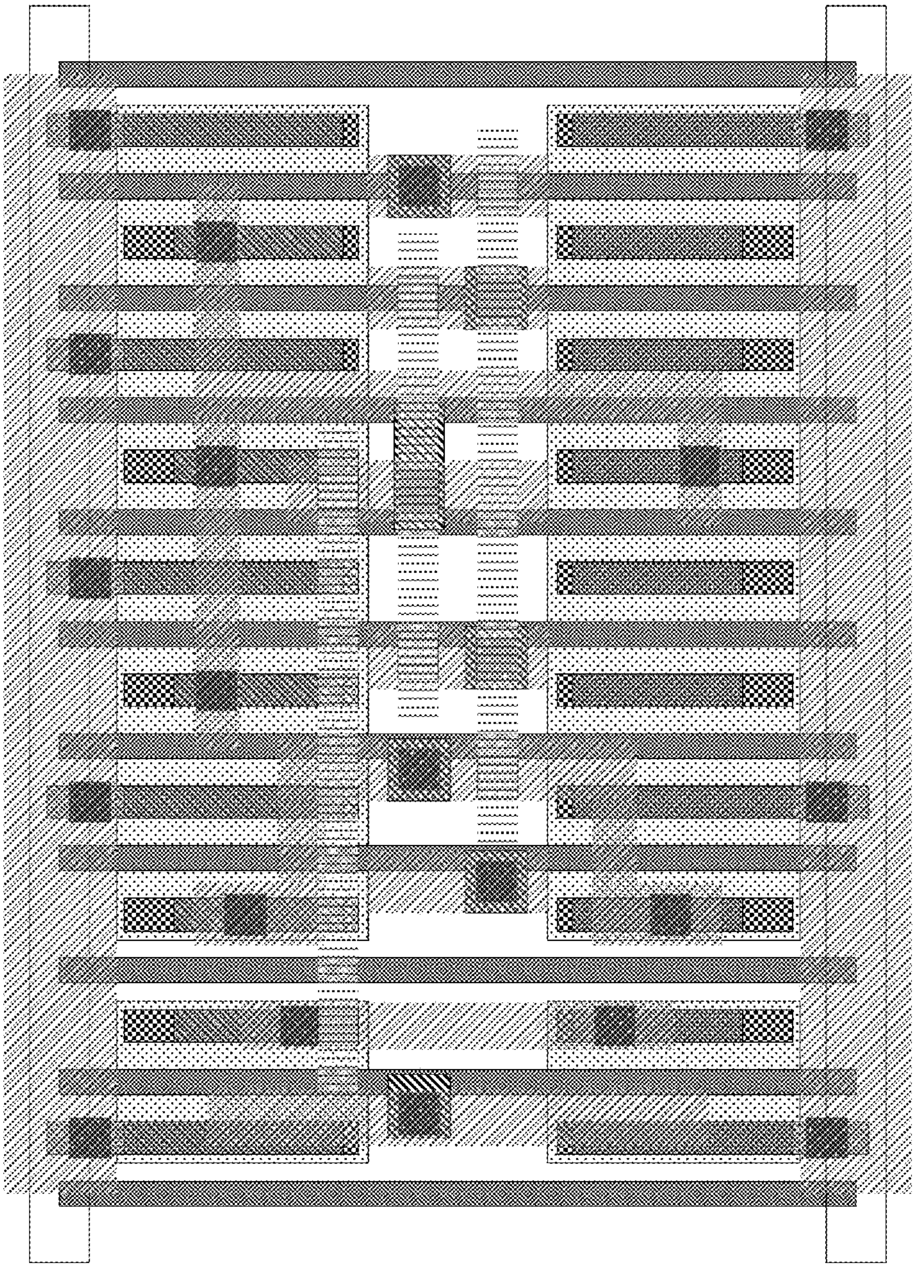
FIG. 256 depicts an IIND3D2 cell.

Reference is made to FIG. 256, which depicts an IIND3D2 cell. This cell implements the logic function nand(not(A),not(B),C) in drive strength 2.

Figure 257:
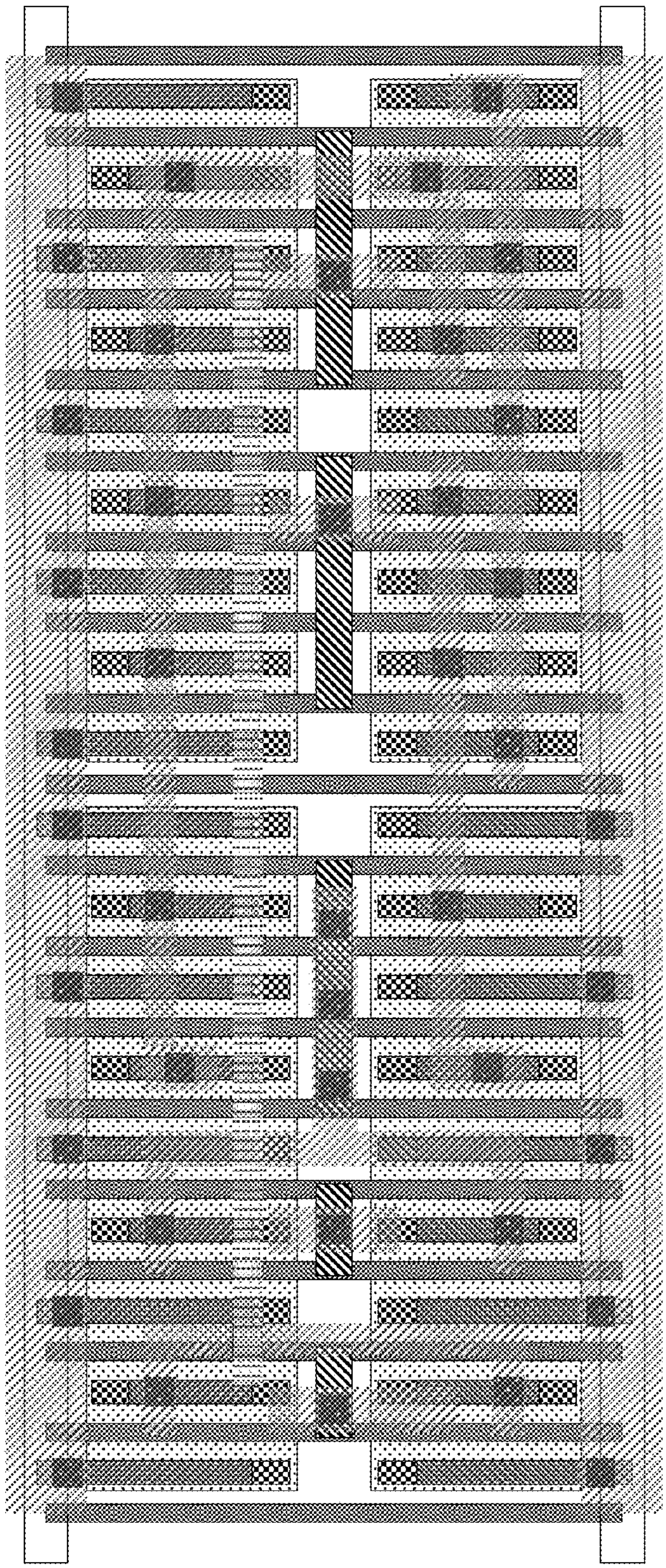
FIG. 257 depicts an IIND3D4 cell.

Reference is made to FIG. 257, which depicts an IIND3D4 cell. This cell implements the logic function nand(not(A),not(B),C) in drive strength 4.

Figure 258:
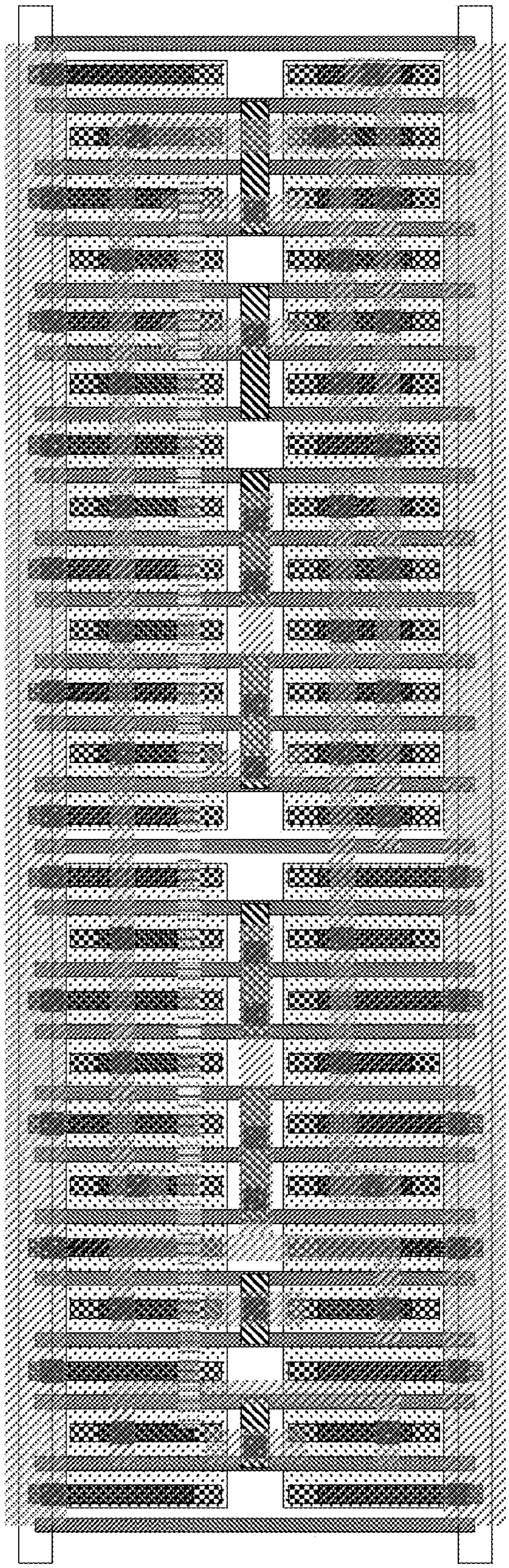
FIG. 258 depicts an IIND3D6 cell.

Reference is made to FIG. 258, which depicts an IIND3D6 cell. This cell implements the logic function nand(not(A),not(B),C) in drive strength 6.

Figure 259:
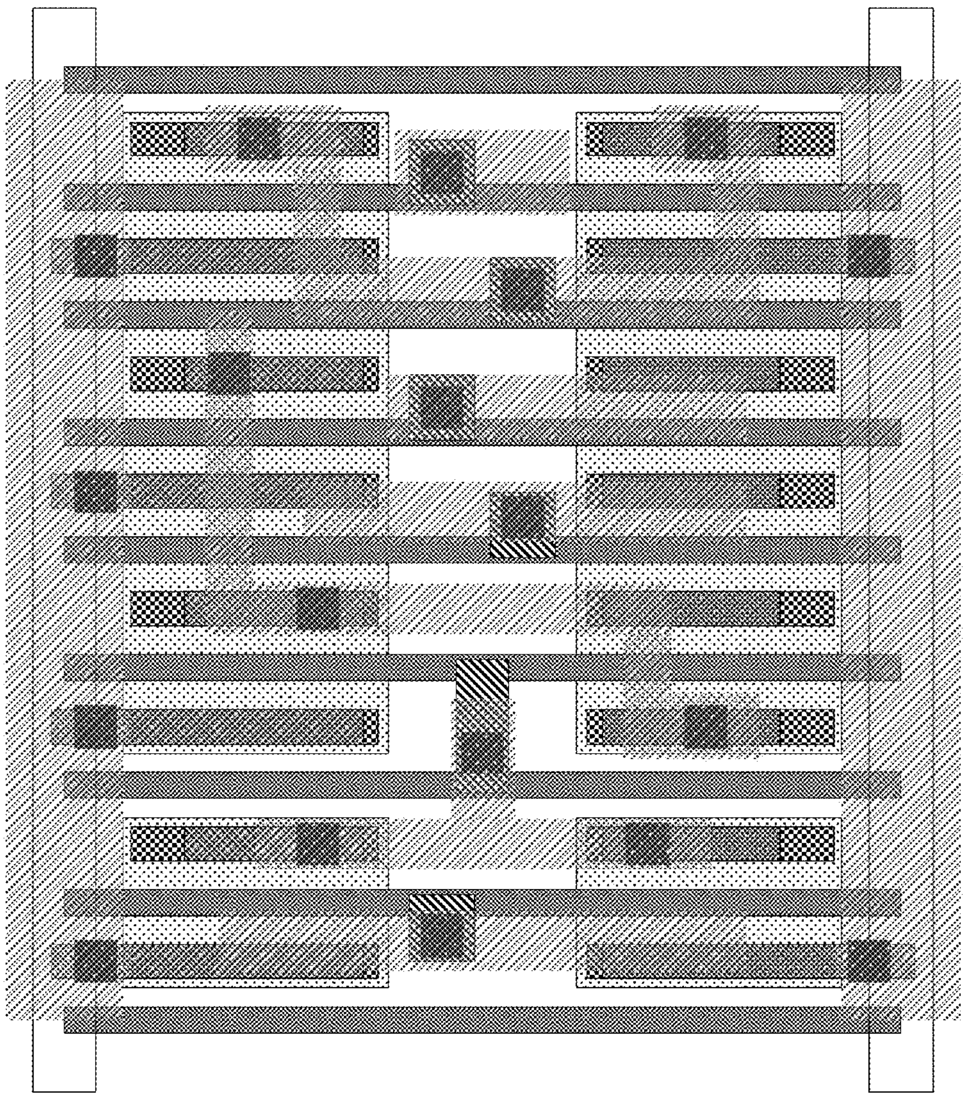
FIG. 259 depicts an IIND4D1 cell.

Reference is made to FIG. 259, which depicts an IIND4D1 cell. This cell implements the logic function nand(not(A),not(B),C,D) in drive strength 1.

Figure 260:
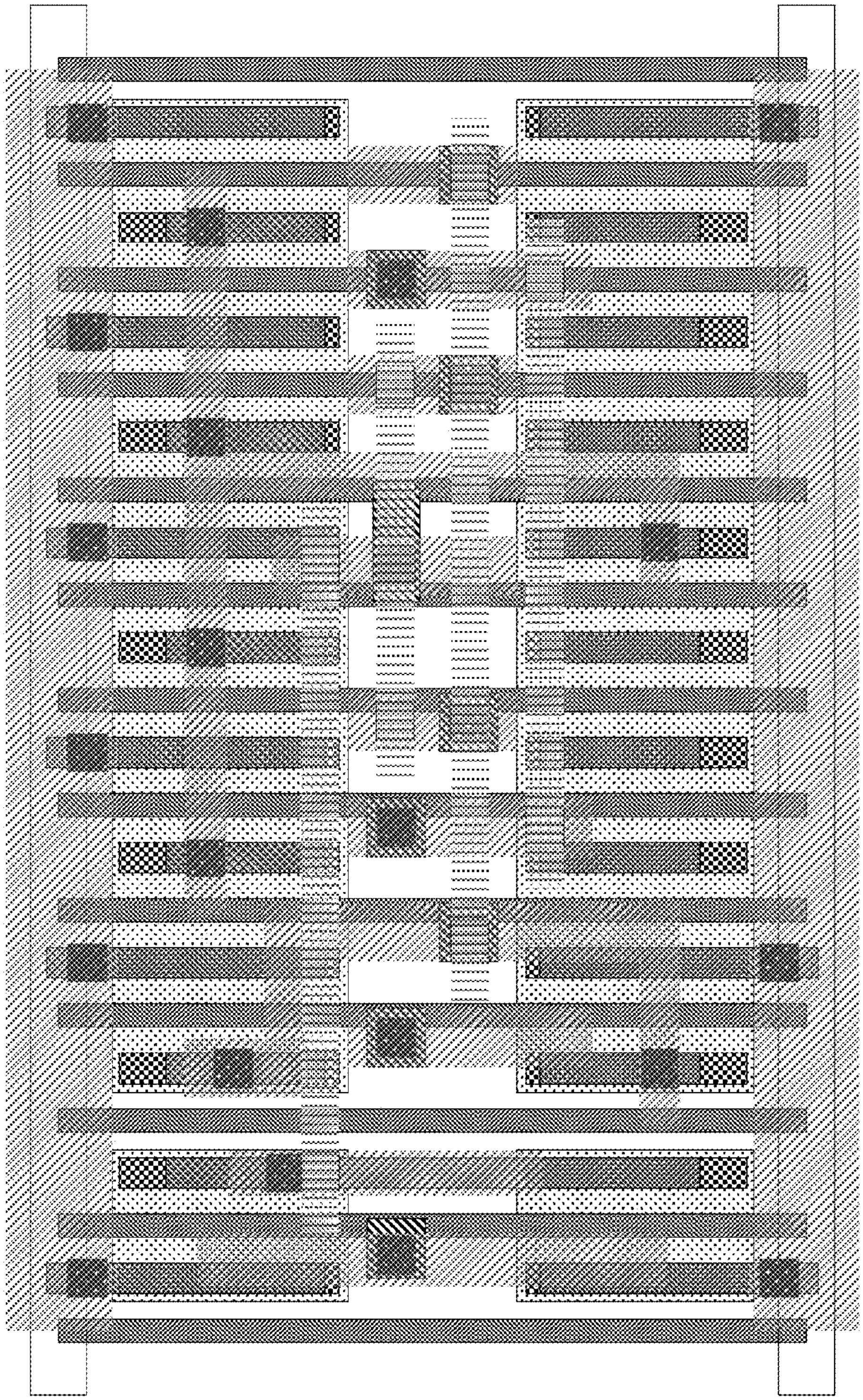
FIG. 260 depicts an IIND4D2 cell.

Reference is made to FIG. 260, which depicts an IIND4D2 cell. This cell implements the logic function nand(not(A),not(B),C,D) in drive strength 2.

Figure 261:
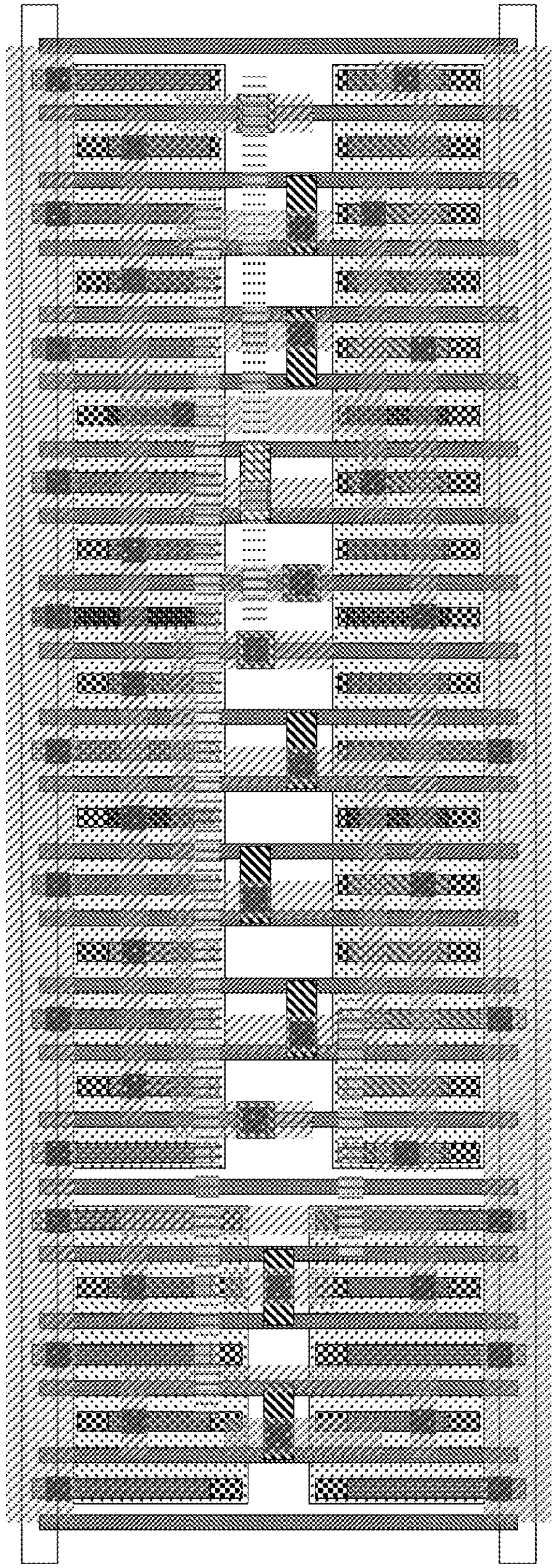
FIG. 261 depicts an IIND4D4 cell.

Reference is made to FIG. 261, which depicts an IIND4D4 cell. This cell implements the logic function nand(not(A),not(B),C,D) in drive strength 4.

Figure 262:
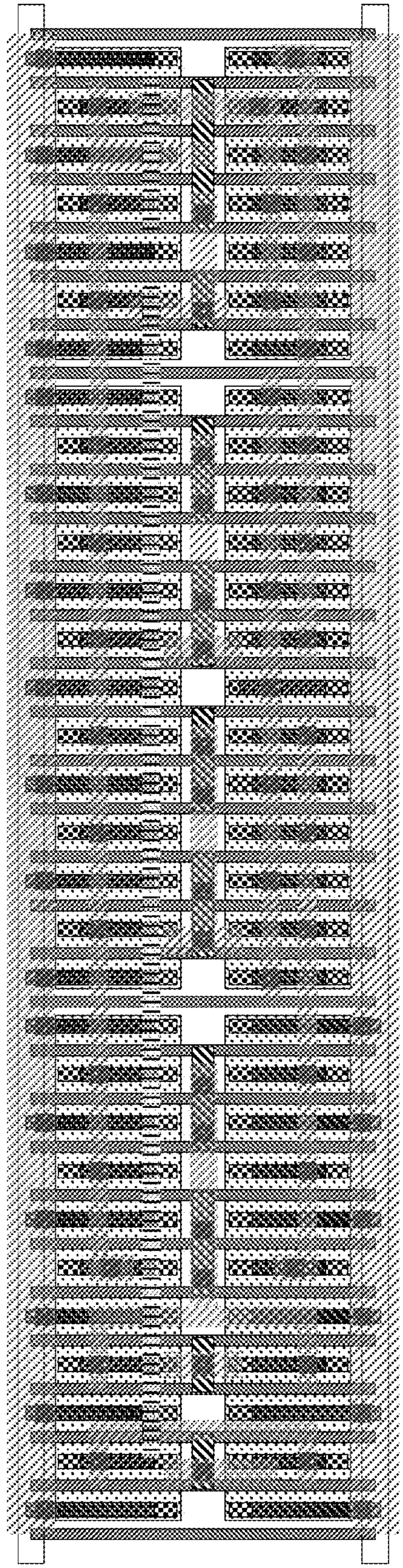
FIG. 262 depicts an IIND4D6 cell.

Reference is made to FIG. 262, which depicts an IIND4D6 cell. This cell implements the logic function nand(not(A),not(B),C,D) in drive strength 6.

Figure 263:
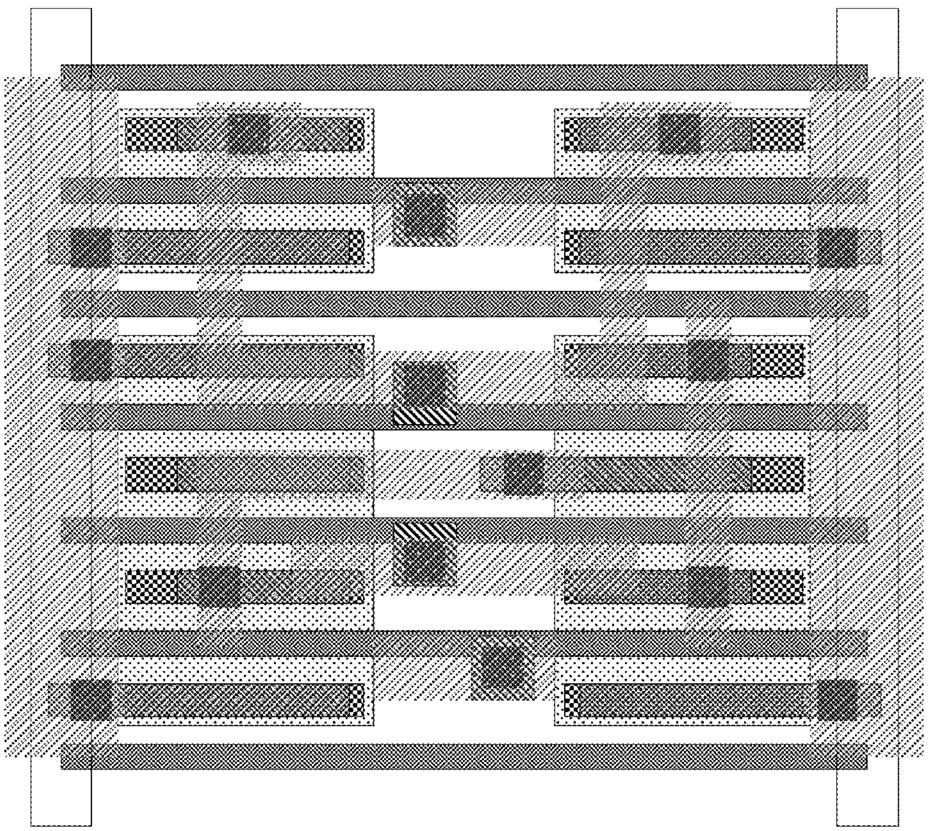
FIG. 263 depicts an IIOAI21D1 cell.

Reference is made to FIG. 263, which depicts an IIOAI21D1 cell. This cell implements the logic function nand(or(not(A),not(B)),C) in drive strength 1.

Figure 264:
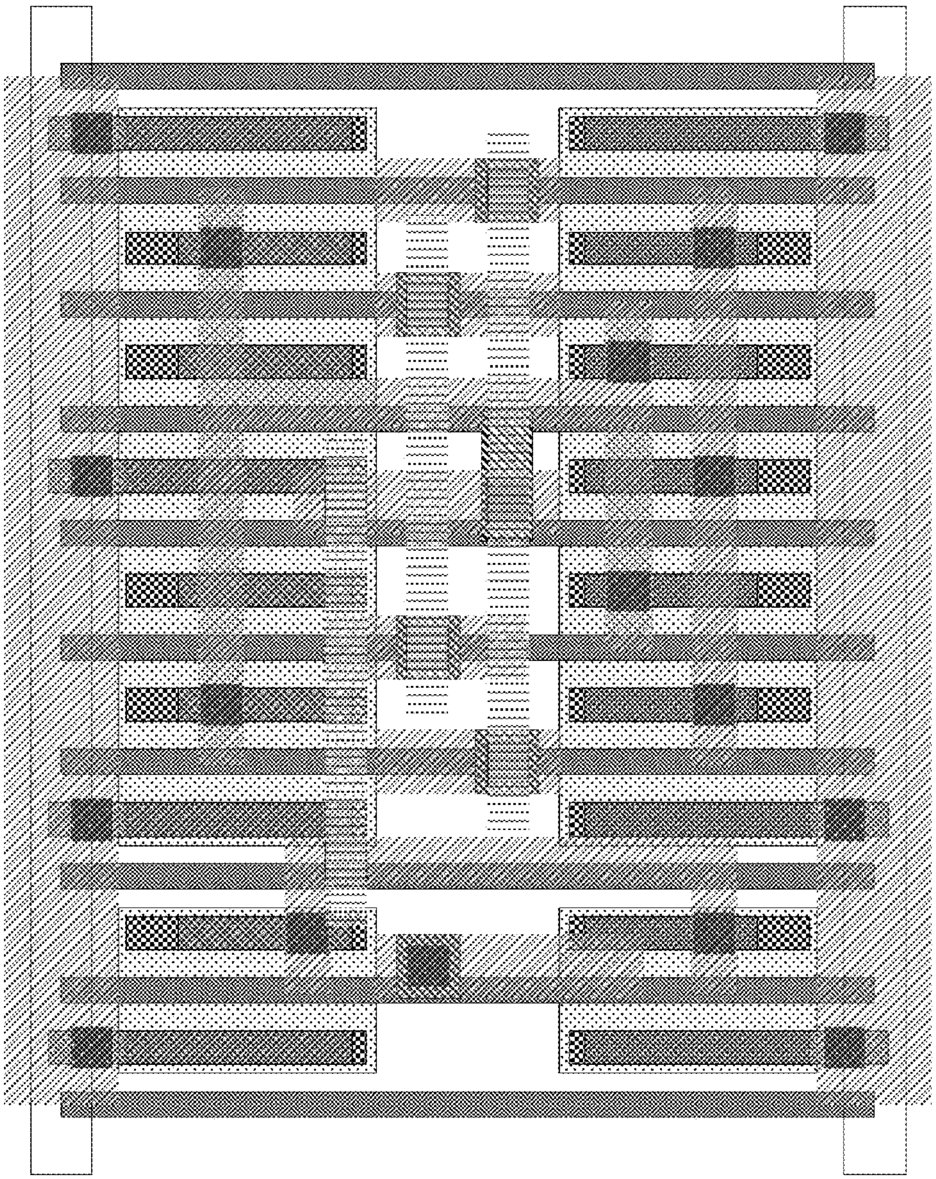
FIG. 264 depicts an IIOAI21D2 cell.

Reference is made to FIG. 264, which depicts an IIOAI21D2 cell. This cell implements the logic function nand(or(not(A),not(B)),C) in drive strength 2.

Figure 265:
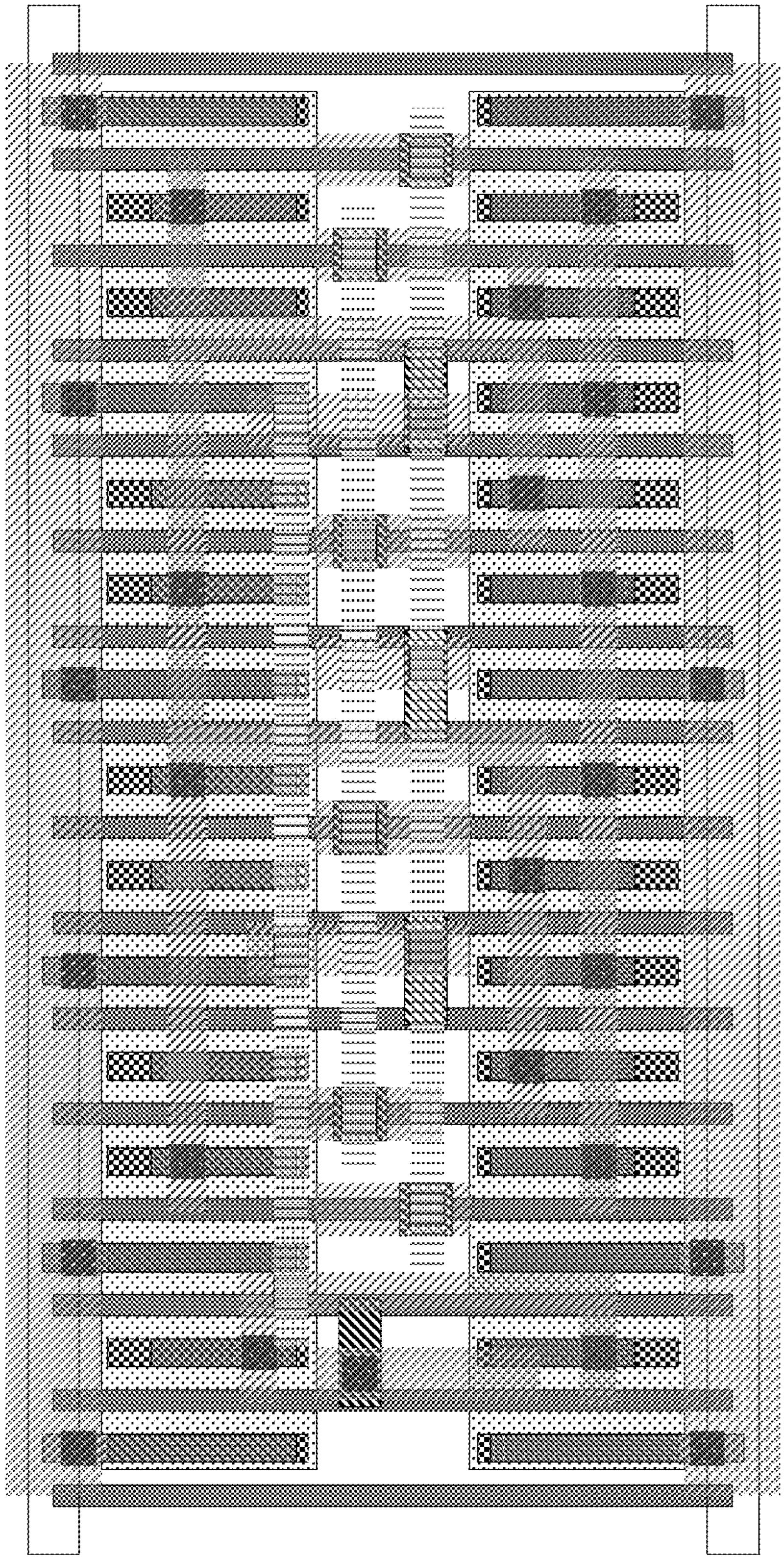
FIG. 265 depicts an IIOAI21D4 cell.

Reference is made to FIG. 265, which depicts an IIOAI21D4 cell. This cell implements the logic function nand(or(not(A),not(B)),C) in drive strength 4.

Figure 266:
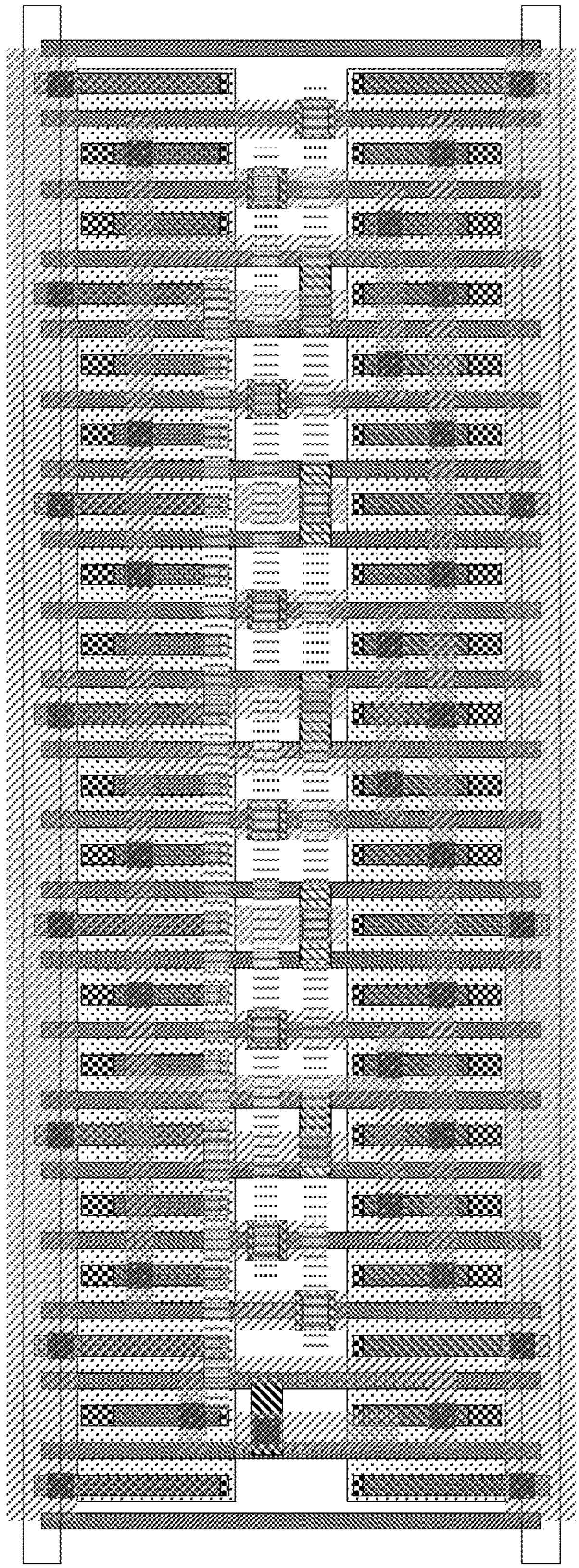
FIG. 266 depicts an IIOAI21D6 cell.

Reference is made to FIG. 266, which depicts an IIOAI21D6 cell. This cell implements the logic function nand(or(not(A),not(B)),C) in drive strength 6.

Figure 267:
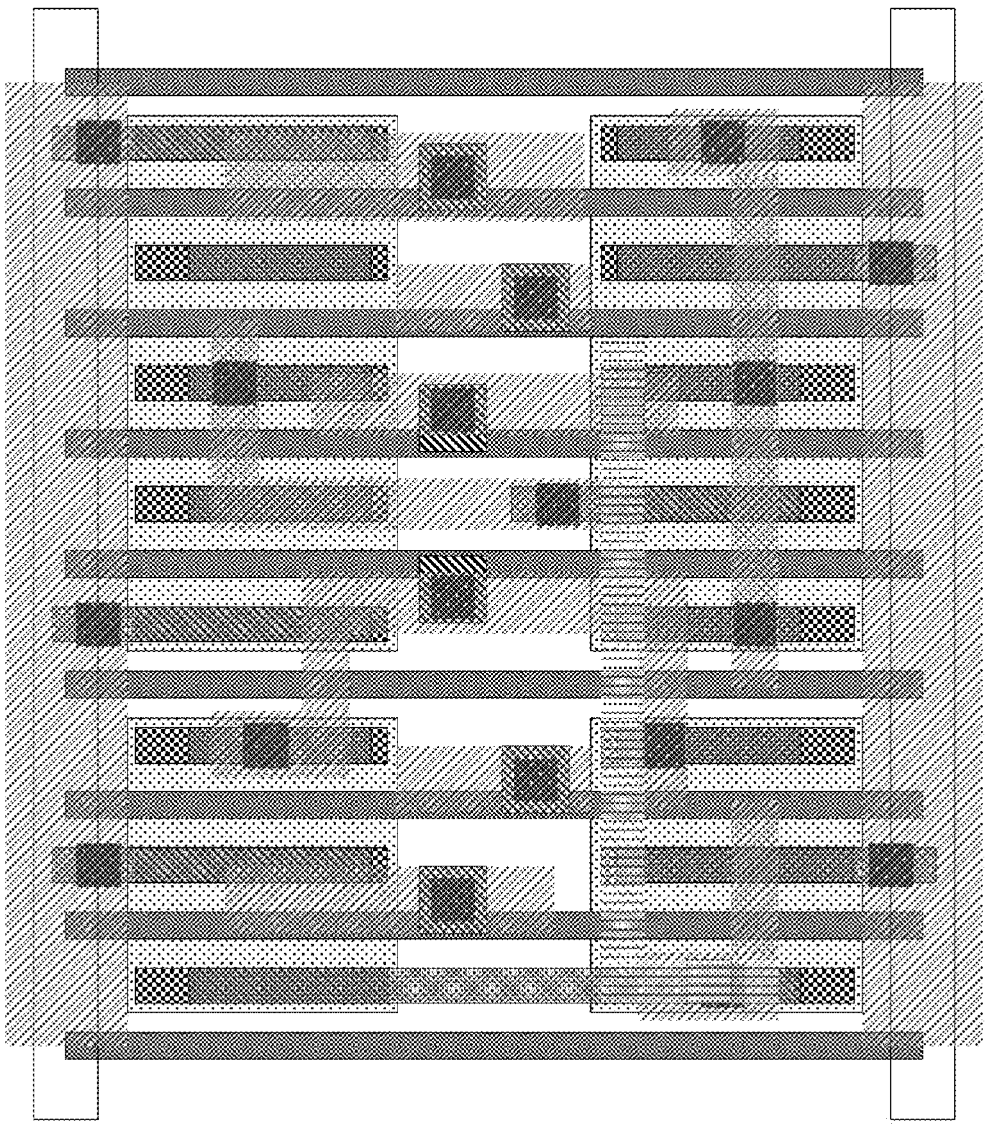
FIG. 267 depicts an IIOAI22D1 cell.

Reference is made to FIG. 267, which depicts an IIOAI22D1 cell. This cell implements the logic function nand(or(not(A),not(B)),or(C,D)) in drive strength 1.

Figure 268:
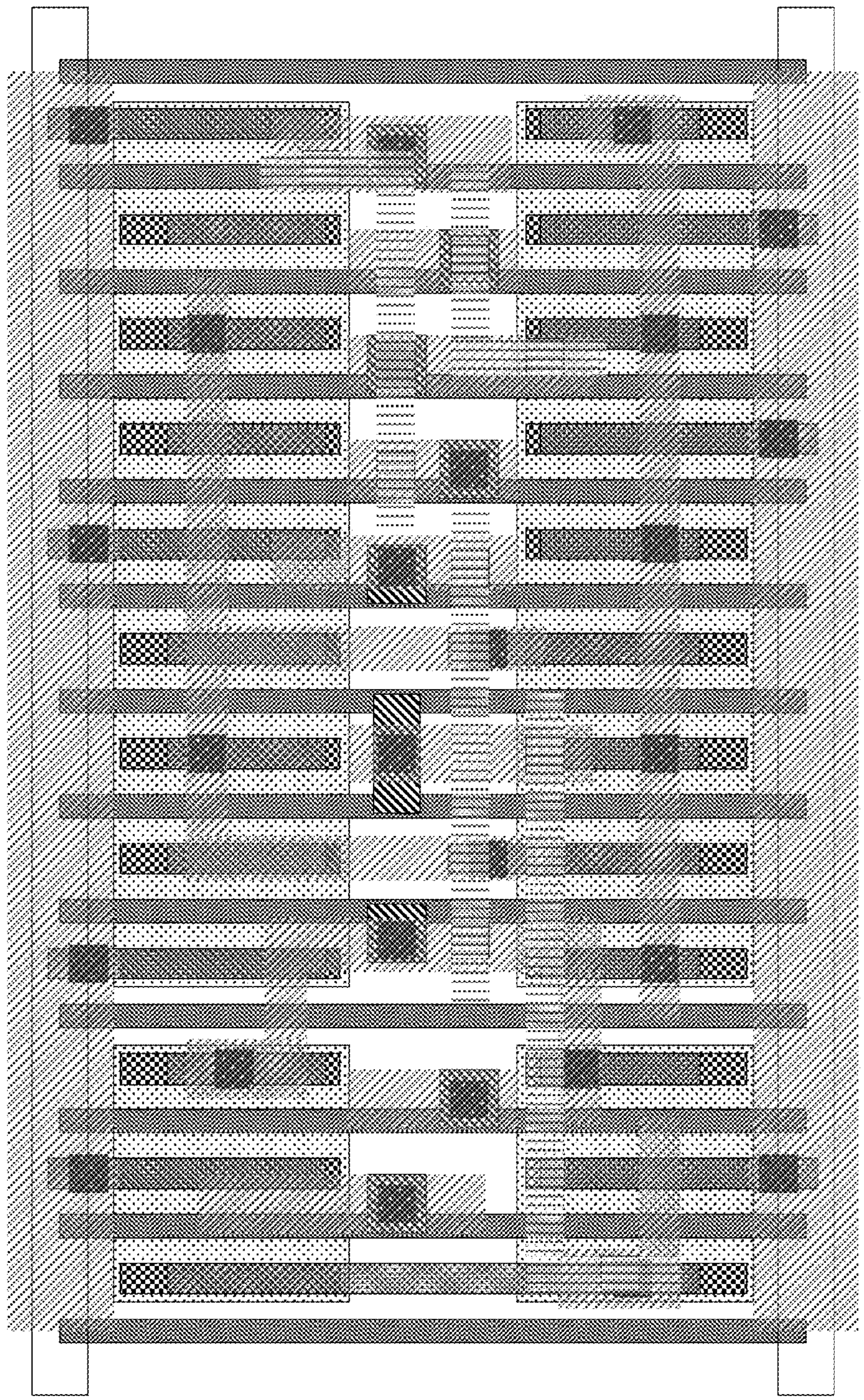
FIG. 268 depicts an IIOAI22D2 cell.

Reference is made to FIG. 268, which depicts an IIOAI22D2 cell. This cell implements the logic function nand(or(not(A),not(B)),or(C,D)) in drive strength 2.

Figure 269:
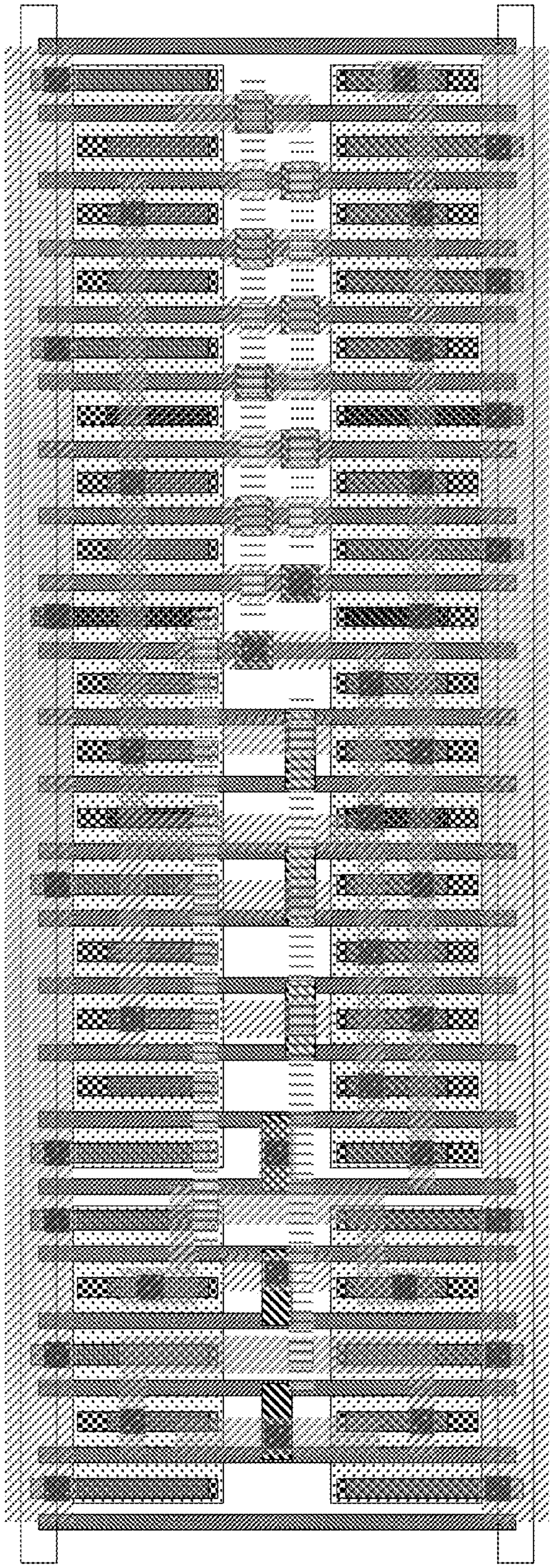
FIG. 269 depicts an IIOAI22D4 cell.

Reference is made to FIG. 269, which depicts an IIOAI22D4 cell. This cell implements the logic function nand(or(not(A),not(B)),or(C,D)) in drive strength 4.

Figure 270:
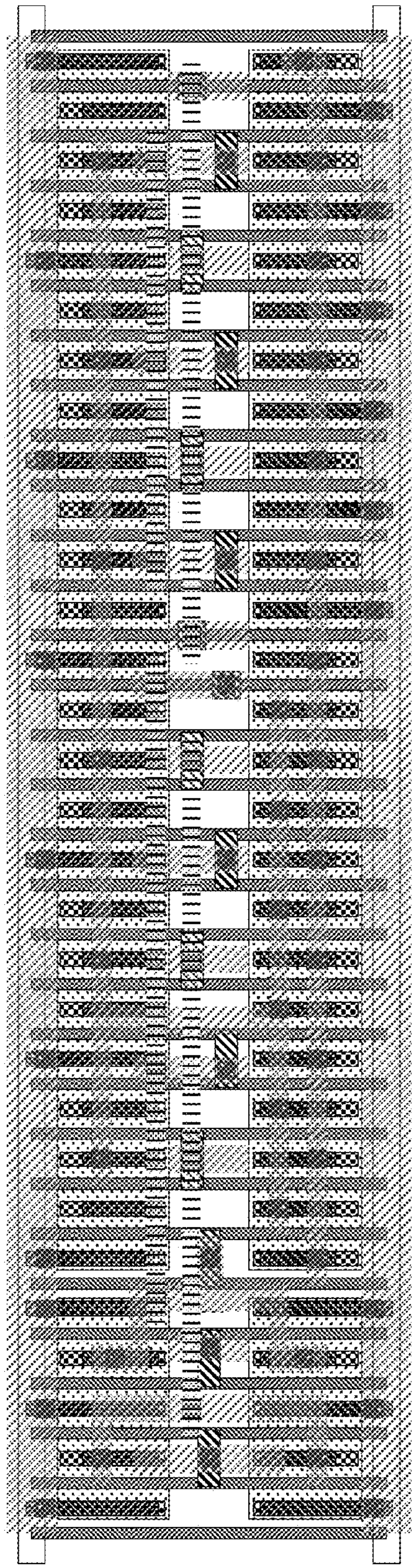
FIG. 270 depicts an IIOAI22D6 cell.

Reference is made to FIG. 270, which depicts an IIOAI22D6 cell. This cell implements the logic function nand(or(not(A),not(B)),or(C,D)) in drive strength 6.

Figure 271:
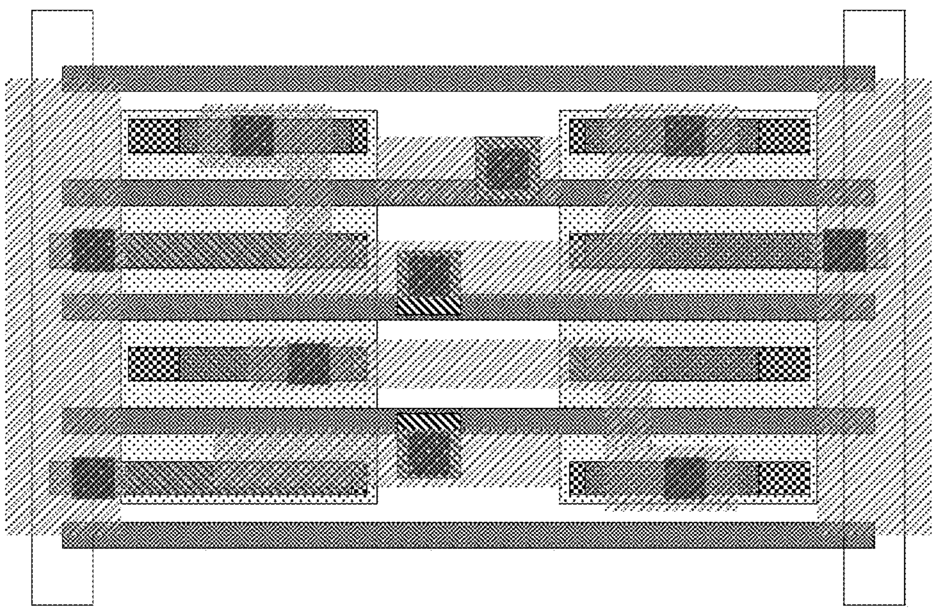
FIG. 271 depicts an IND2D1 cell.

Reference is made to FIG. 271, which depicts an IND2D1 cell. This cell implements the logic function nand(not(A),B) in drive strength 1.

Figure 272:
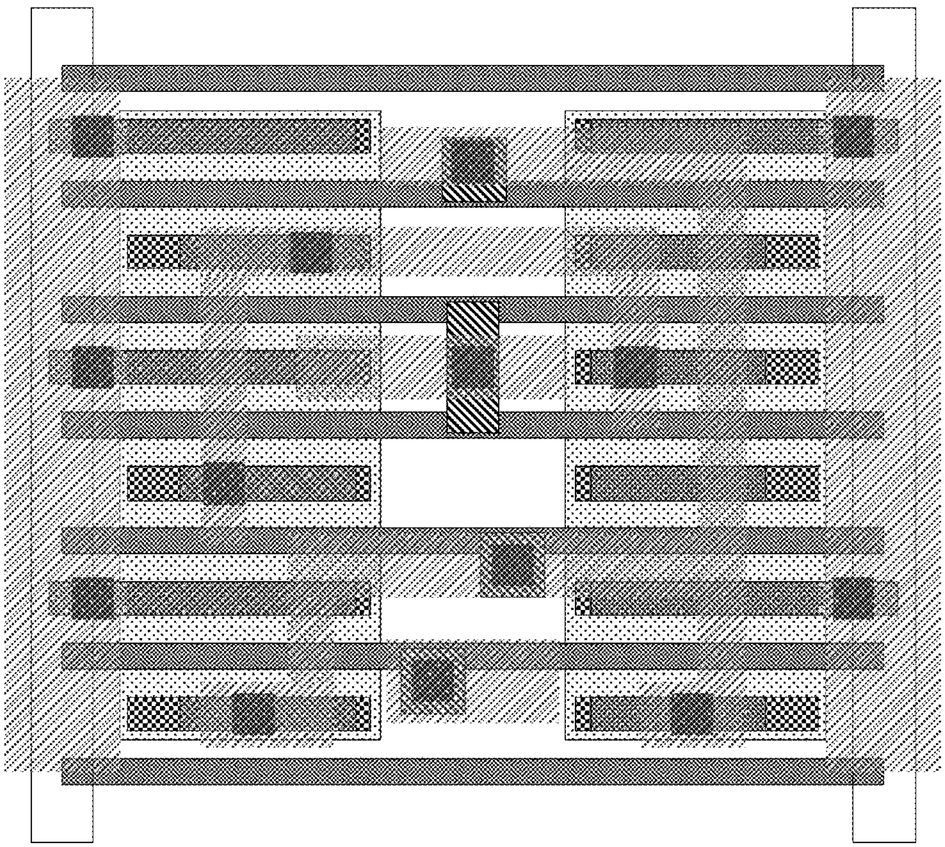
FIG. 272 depicts an IND2D2 cell.

Reference is made to FIG. 272, which depicts an IND2D2 cell. This cell implements the logic function nand(not(A),B) in drive strength 2.

Figure 273:
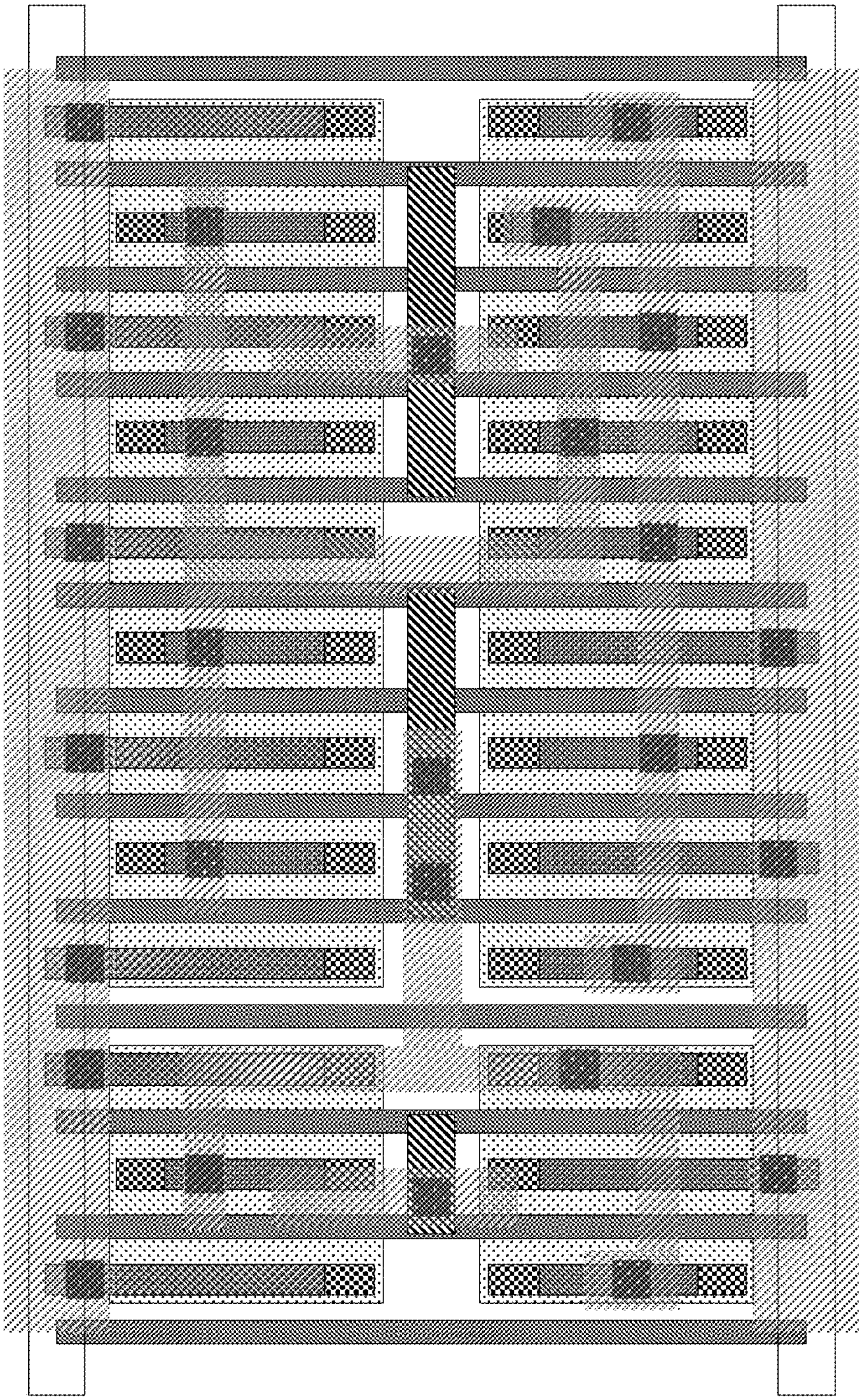
FIG. 273 depicts an IND2D4 cell.

Reference is made to FIG. 273, which depicts an IND2D4 cell. This cell implements the logic function nand(not(A),B) in drive strength 4.

Figure 274:
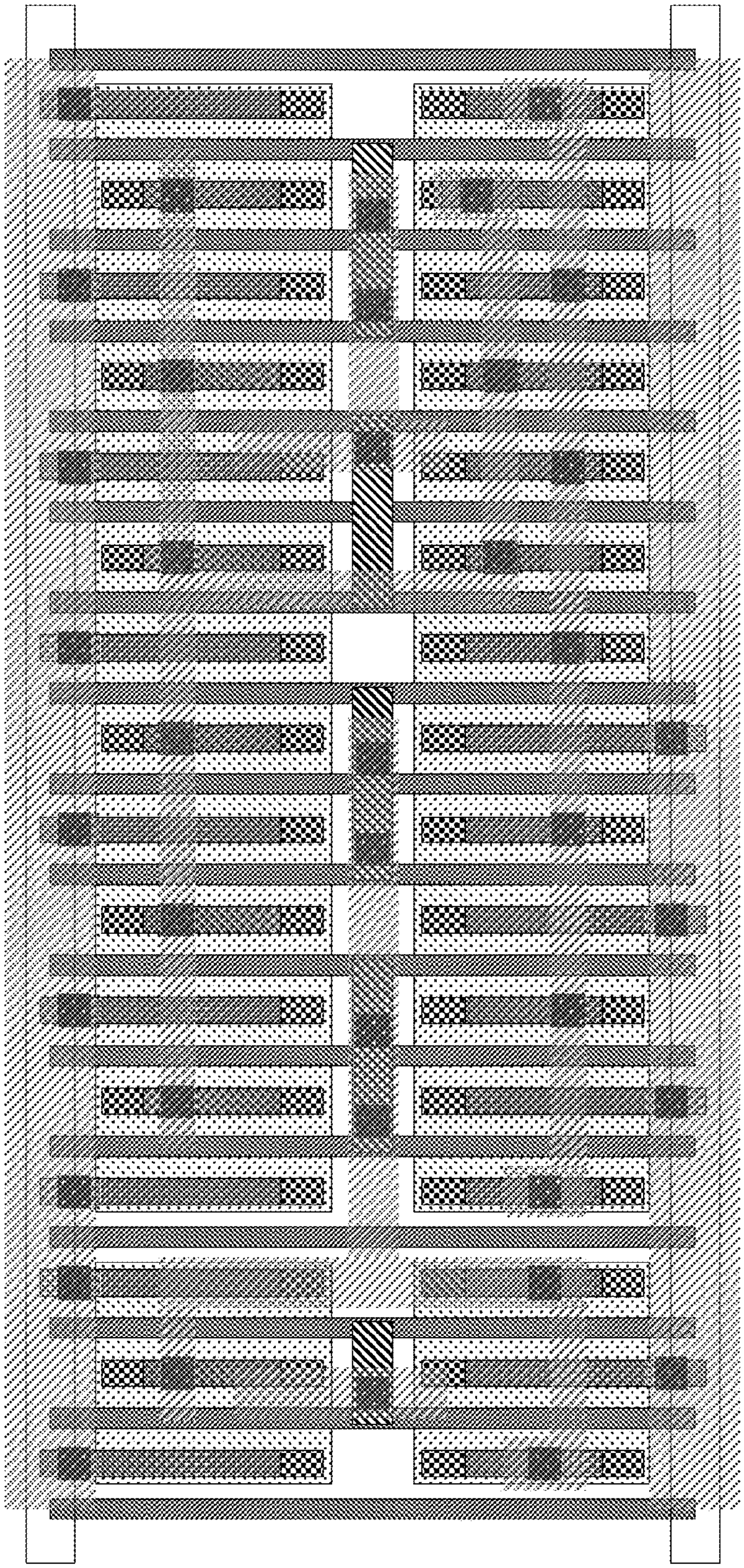
FIG. 274 depicts an IND2D6 cell.

Reference is made to FIG. 274, which depicts an IND2D6 cell. This cell implements the logic function nand(not(A),B) in drive strength 6.

Figure 275:
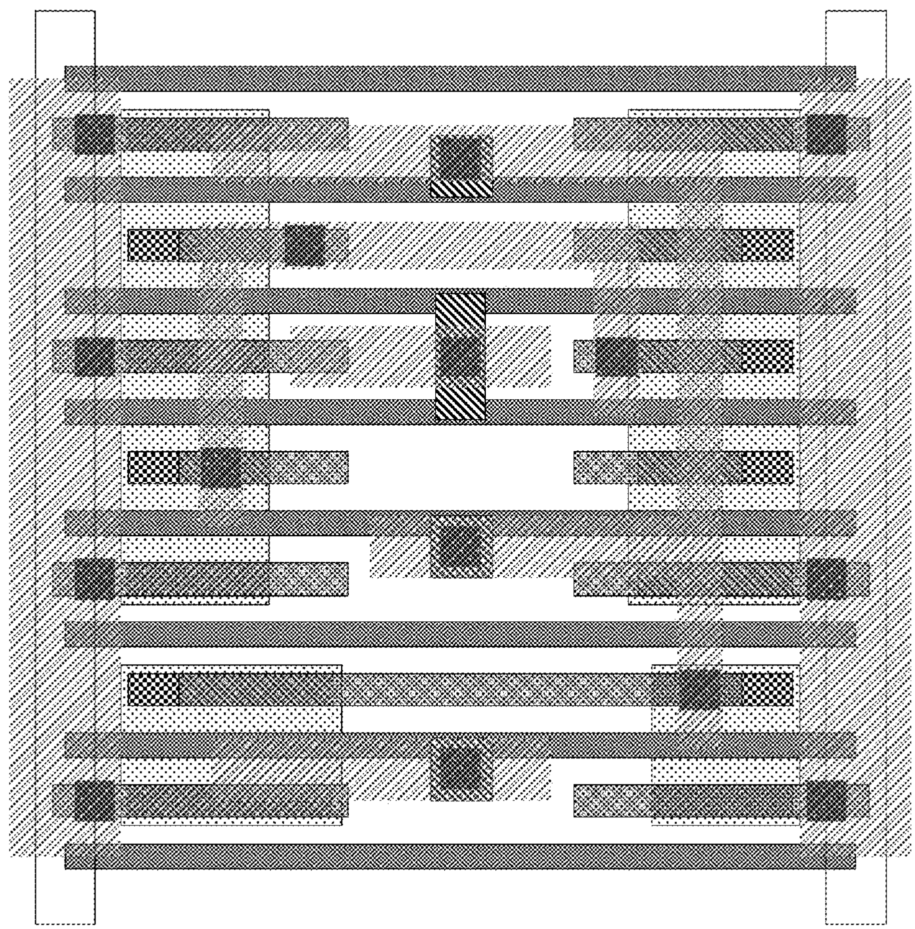
FIG. 275 depicts an IND2XD1 cell.

Reference is made to FIG. 275, which depicts an IND2XD1 cell. This is an alternative embodiment of the IND2D1 cell.

Figure 276:
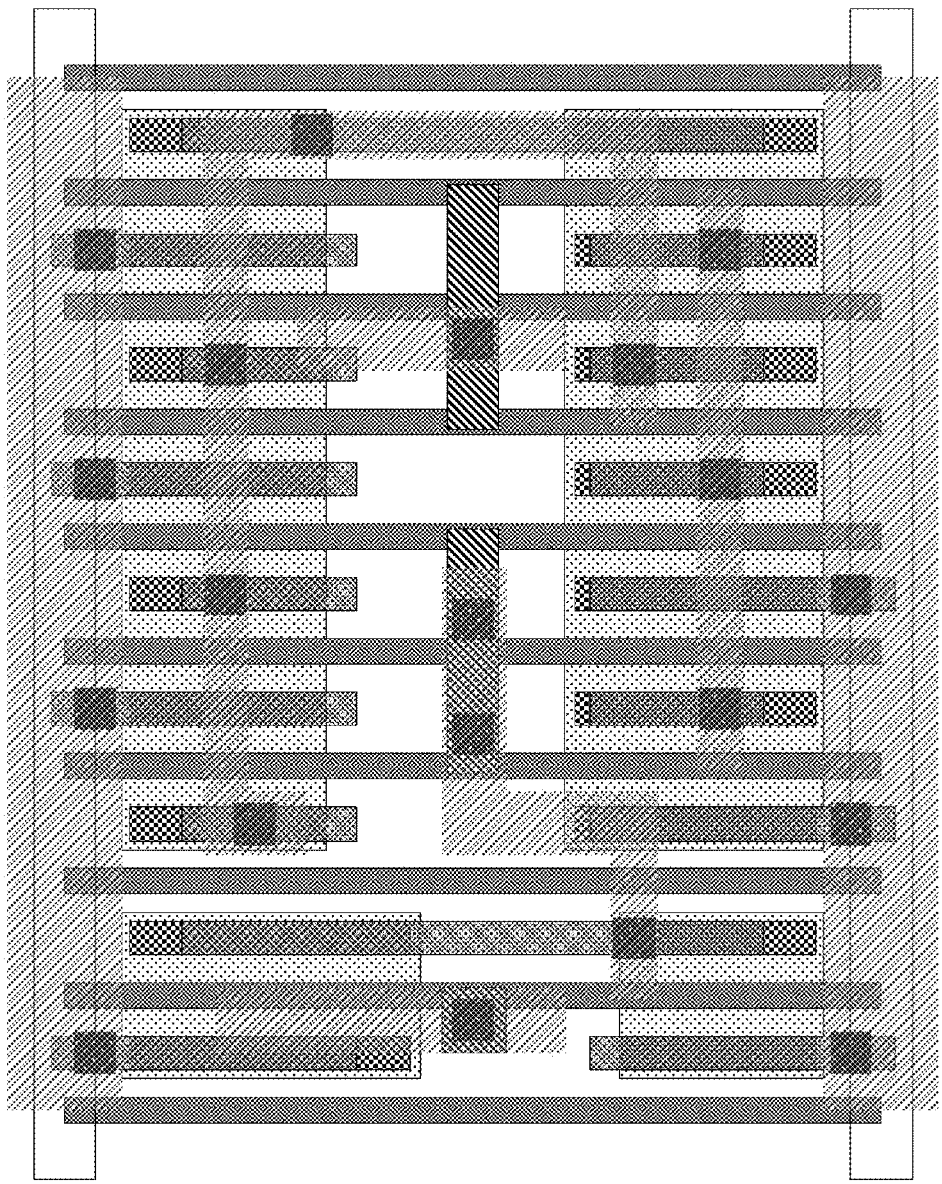
FIG. 276 depicts an IND2XD2 cell.

Reference is made to FIG. 276, which depicts an IND2XD2 cell. This is an alternative embodiment of the IND2D2 cell.

Figure 277:
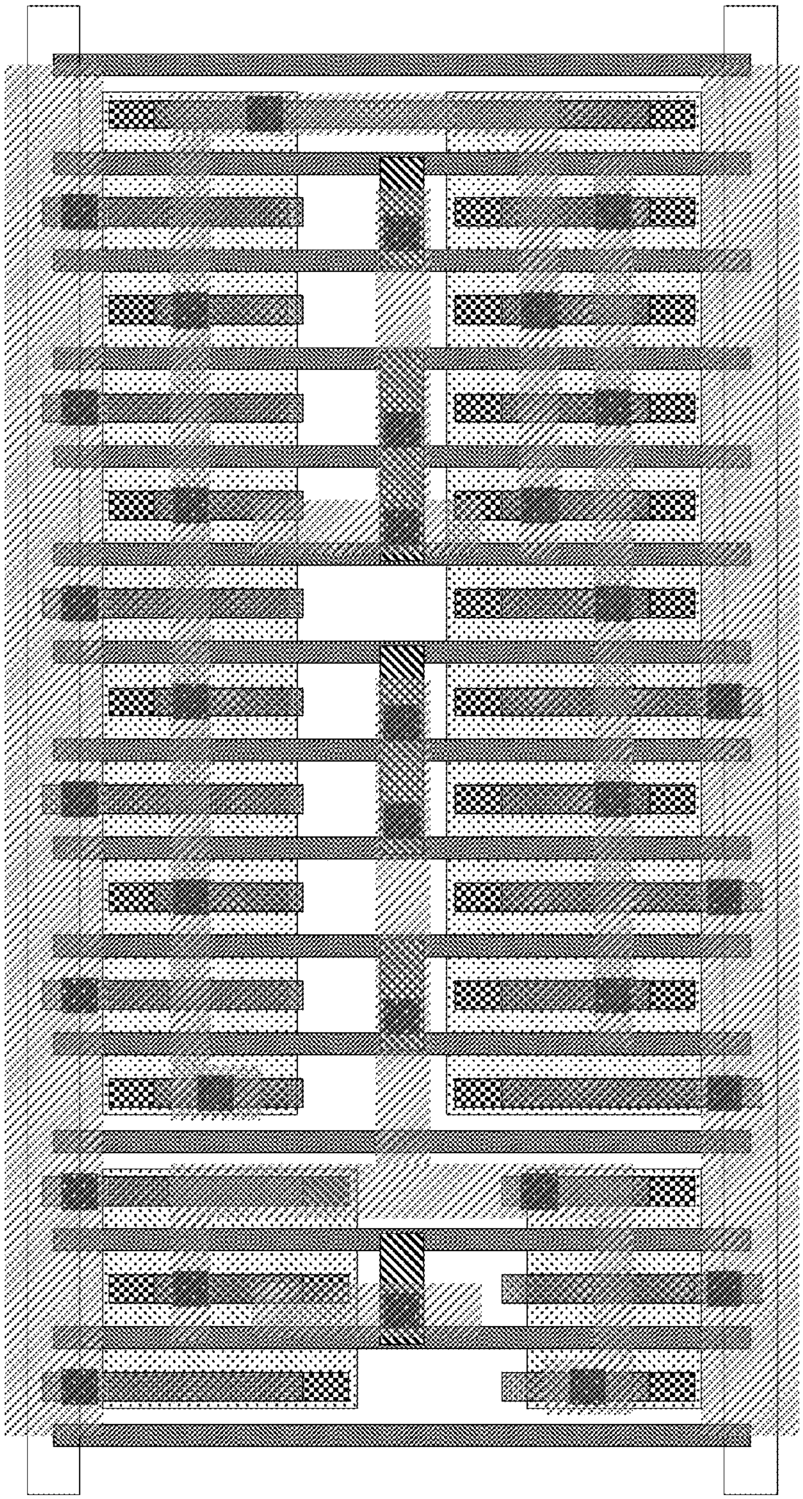
FIG. 277 depicts an IND2XD4 cell.

Reference is made to FIG. 277, which depicts an IND2XD4 cell. This is an alternative embodiment of the IND2D4 cell.

Figure 278:
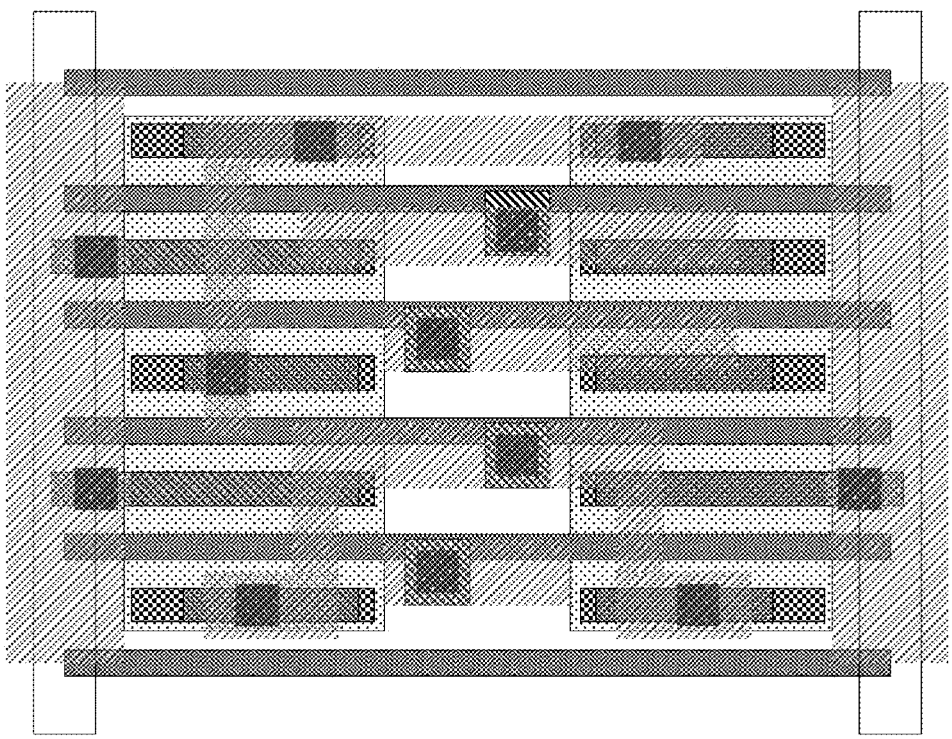
FIG. 278 depicts an IND3D1 cell.

Reference is made to FIG. 278, which depicts an IND3D1 cell. This cell implements the logic function nand(not(A),B,C) in drive strength 1.

Figure 279:
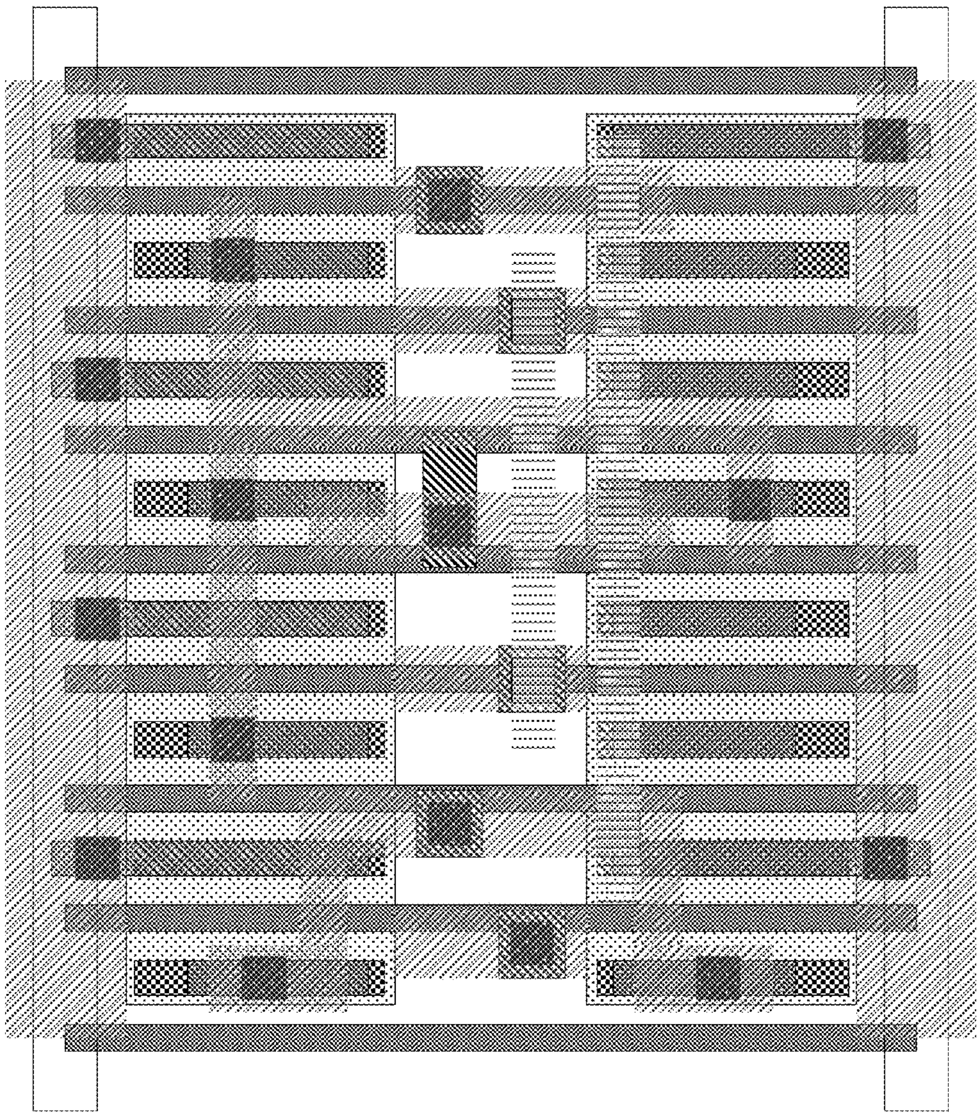
FIG. 279 depicts an IND3D2 cell.

Reference is made to FIG. 279, which depicts an IND3D2 cell. This cell implements the logic function nand(not(A),B,C) in drive strength 2.

Figure 280:
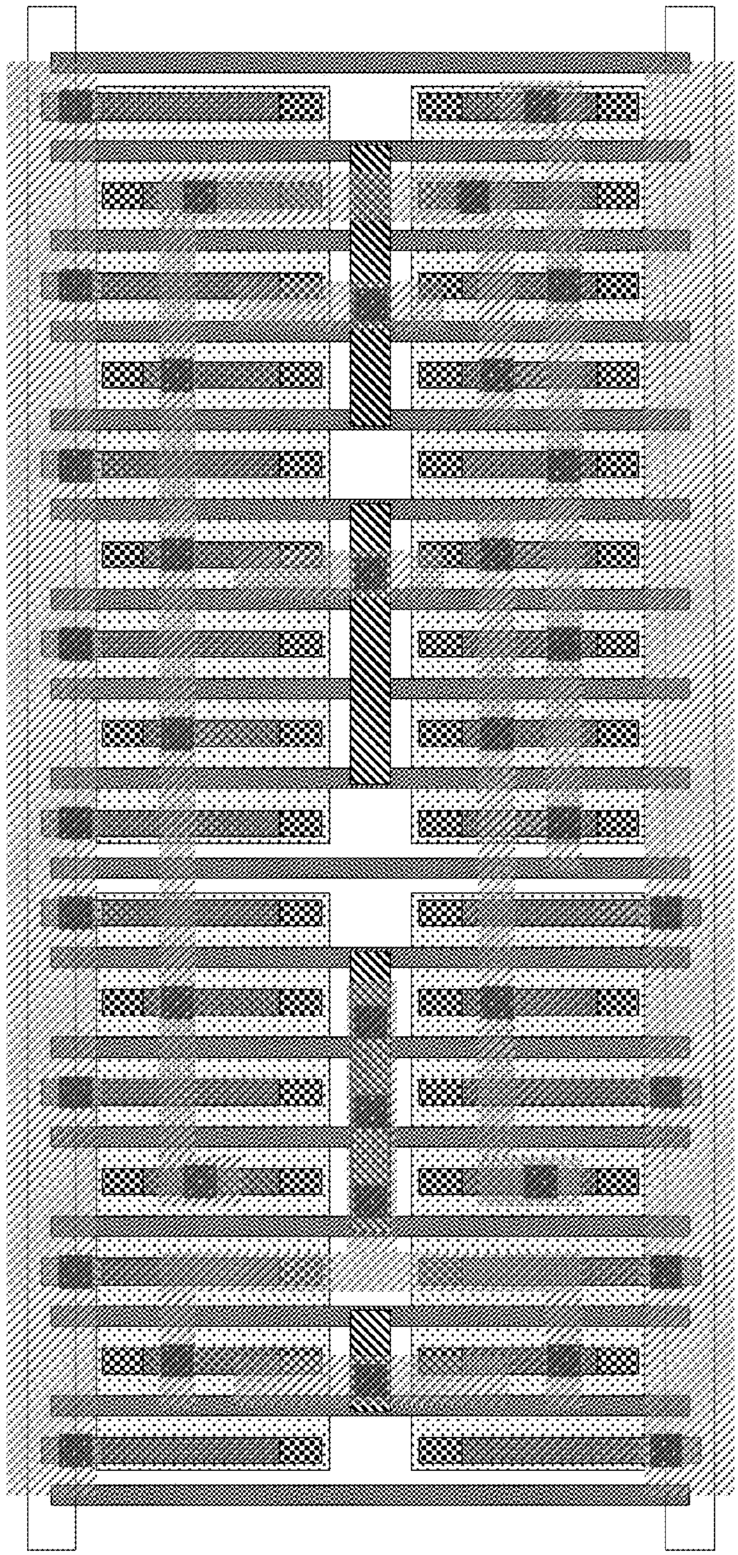
FIG. 280 depicts an IND3D4 cell.

Reference is made to FIG. 280, which depicts an IND3D4 cell. This cell implements the logic function nand(not(A),B,C) in drive strength 4.

Figure 281:
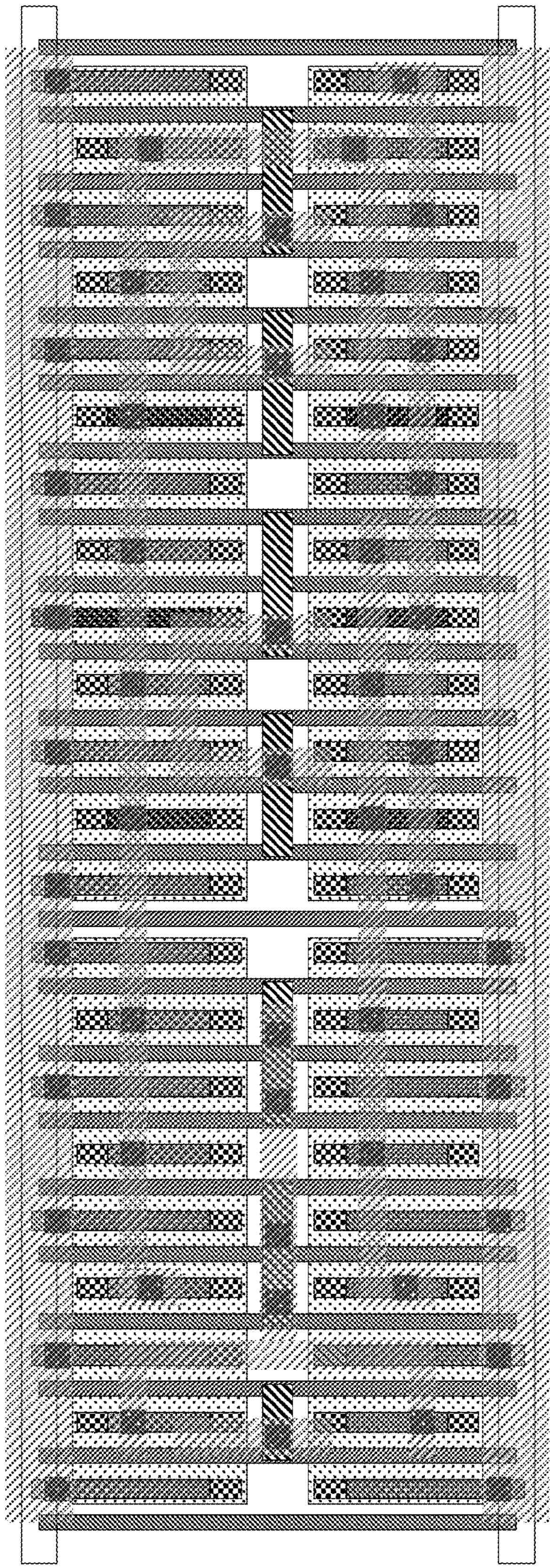
FIG. 281 depicts an IND3D6 cell.

Reference is made to FIG. 281, which depicts an IND3D6 cell. This cell implements the logic function nand(not(A),B,C) in drive strength 6.

Figure 282:
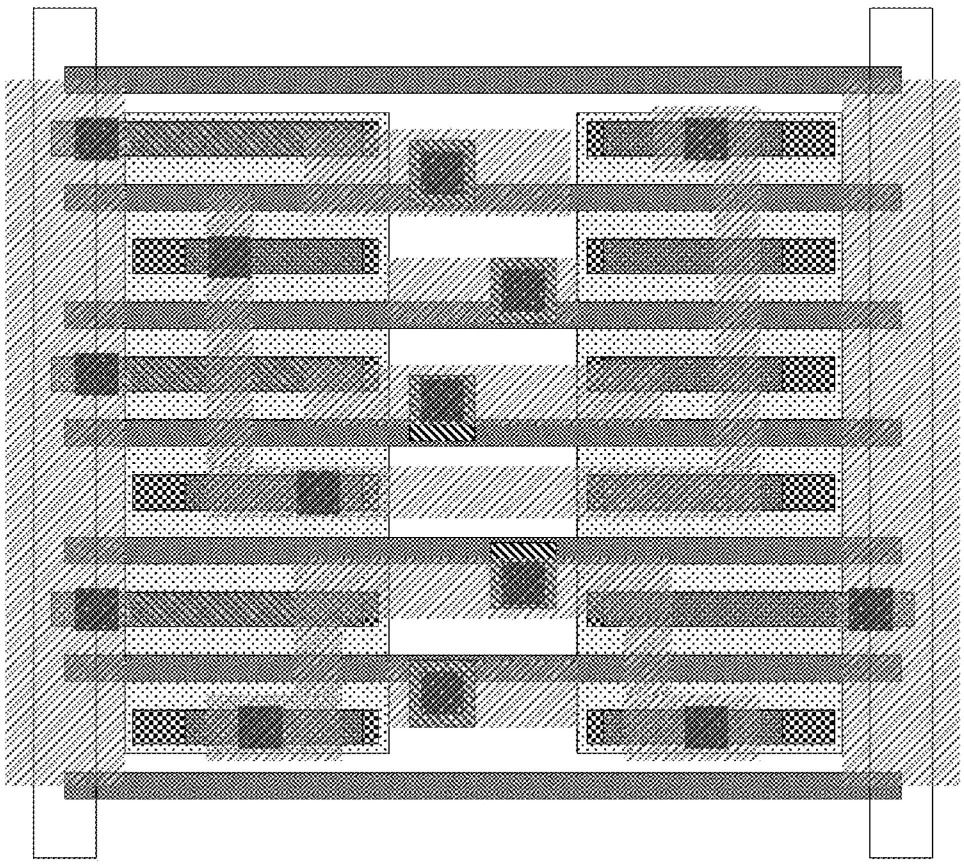
FIG. 282 depicts an IND4D1 cell.

Reference is made to FIG. 282, which depicts an IND4D1 cell. This cell implements the logic function nand(not(A),B,C,D) in drive strength 1.

Figure 283:
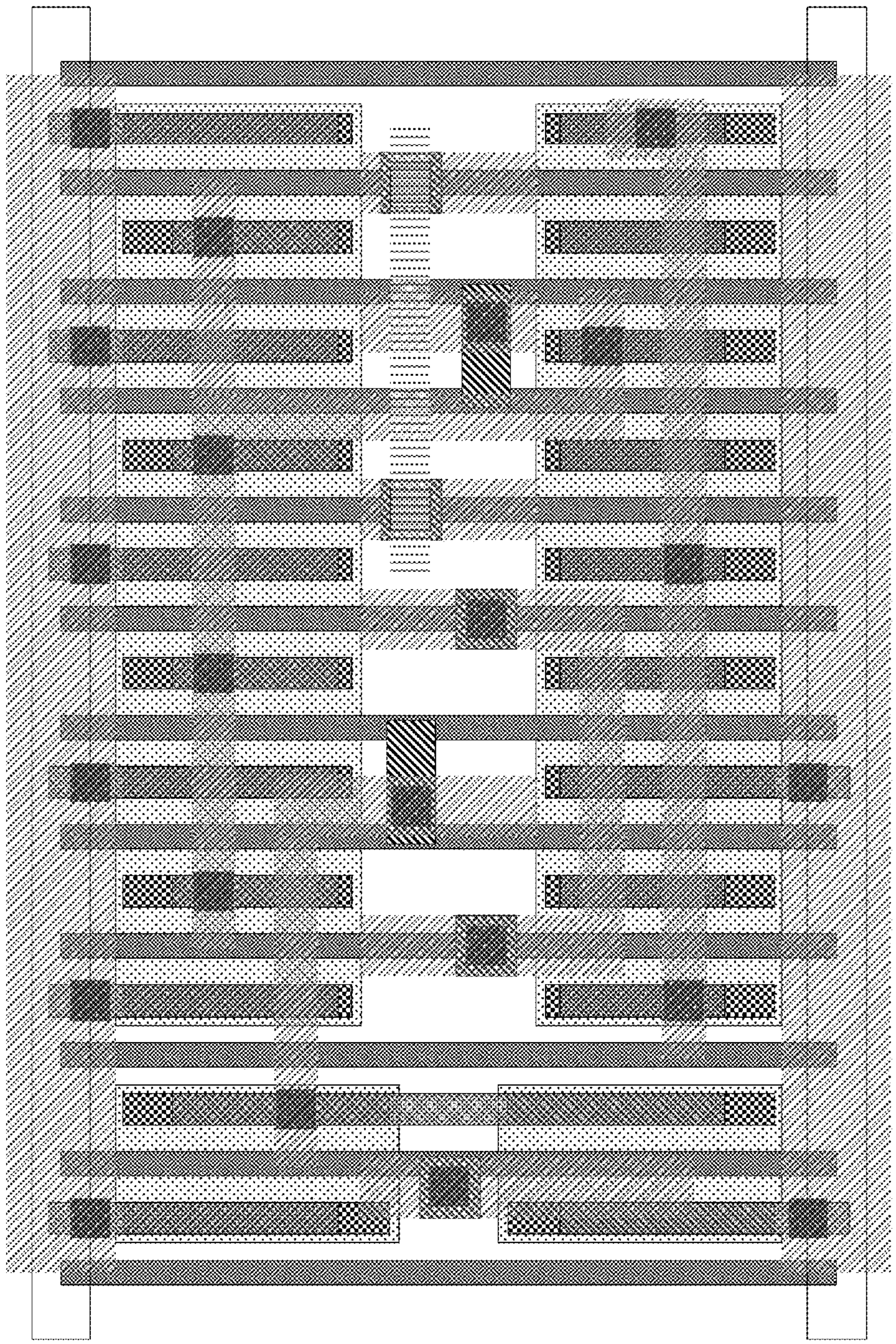
FIG. 283 depicts an IND4D2 cell.

Reference is made to FIG. 283, which depicts an IND4D2 cell. This cell implements the logic function nand(not(A),B,C,D) in drive strength 2.

Figure 284:
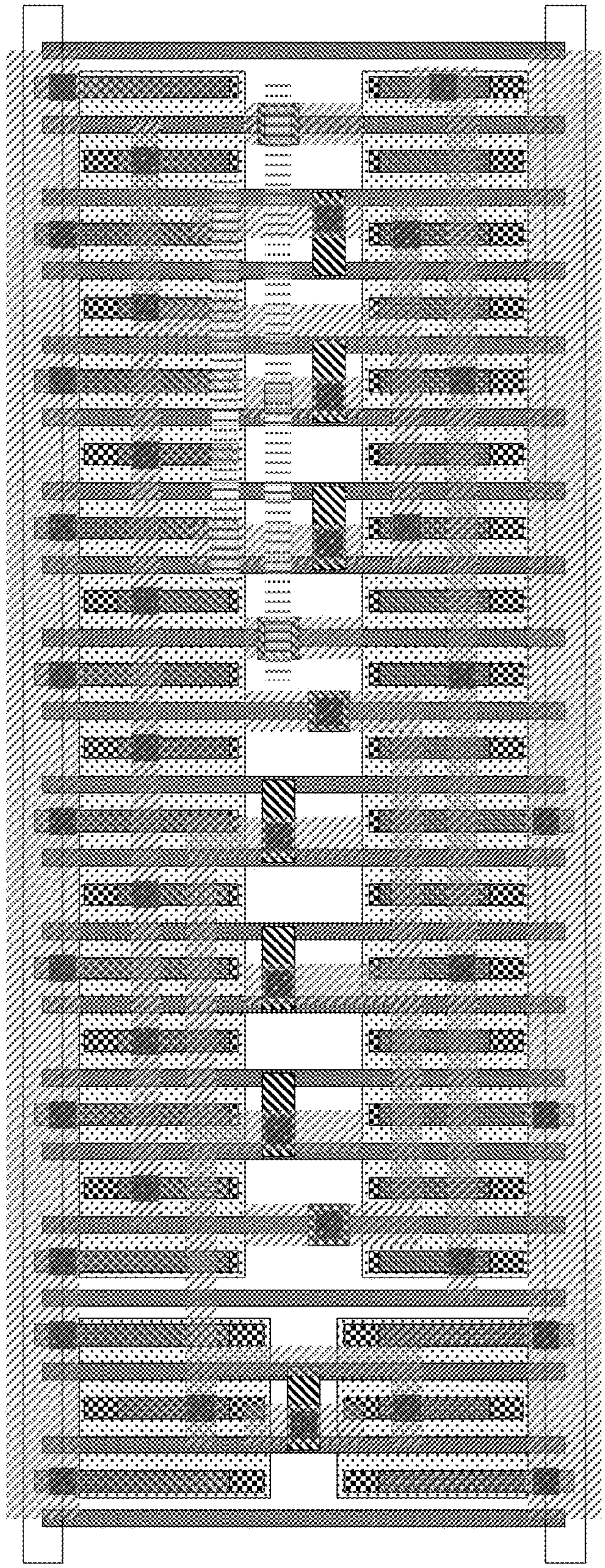
FIG. 284 depicts an IND4D4 cell.

Reference is made to FIG. 284, which depicts an IND4D4 cell. This cell implements the logic function nand(not(A),B,C,D) in drive strength 4.

Figure 285:
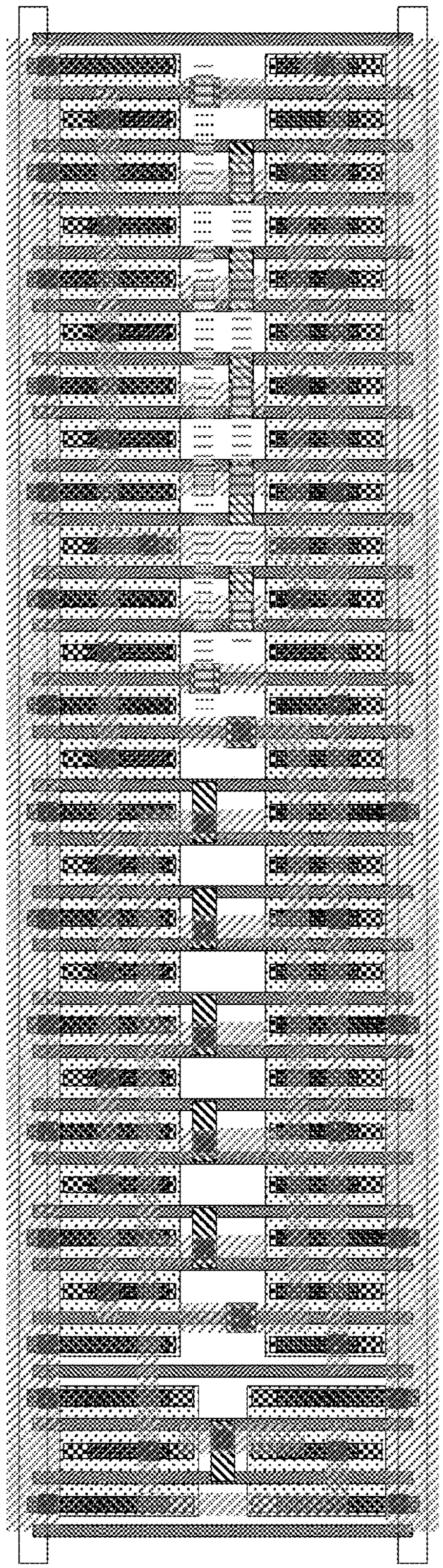
FIG. 285 depicts an IND4D6 cell.

Reference is made to FIG. 285, which depicts an IND4D6 cell. This cell implements the logic function nand(not(A),B,C,D) in drive strength 6.

Figure 286:
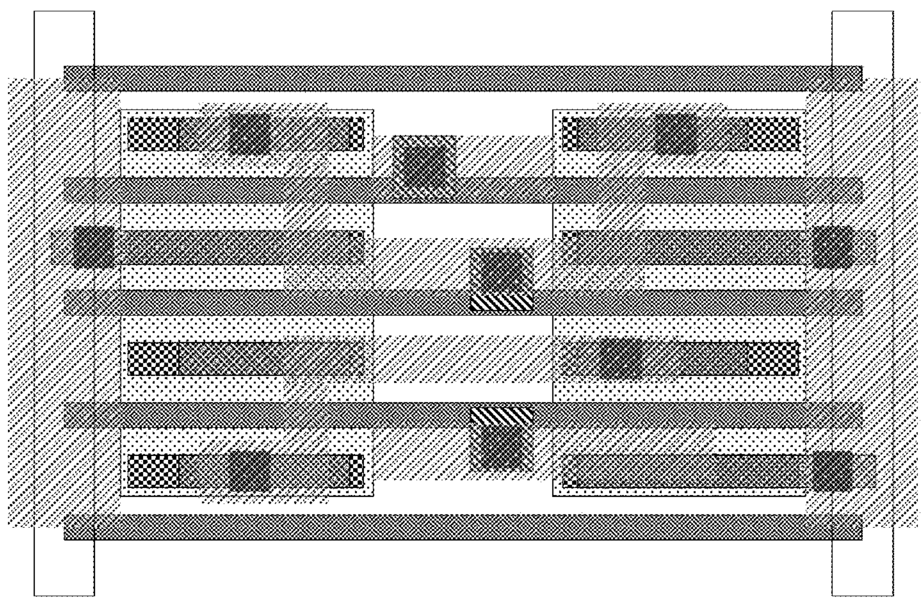
FIG. 286 depicts an INR2D1 cell.

Reference is made to FIG. 286, which depicts an INR2D1 cell. This cell implements the logic function nor(not(A),B) in drive strength 1.

Figure 287:
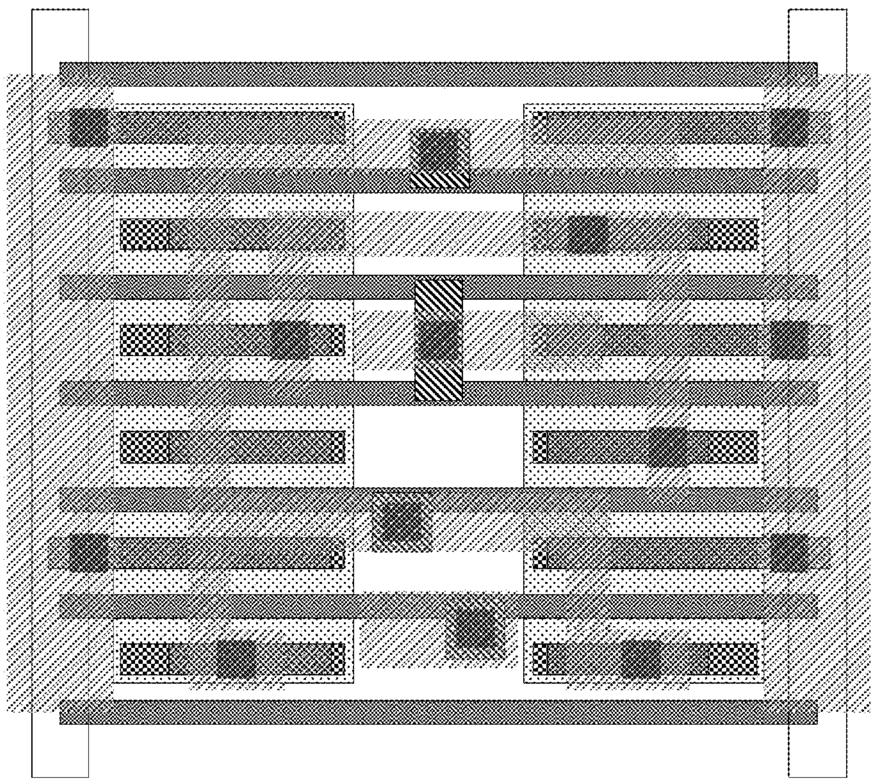
FIG. 287 depicts an INR2D2 cell.

Reference is made to FIG. 287, which depicts an INR2D2 cell. This cell implements the logic function nor(not(A),B) in drive strength 2.

Figure 288:
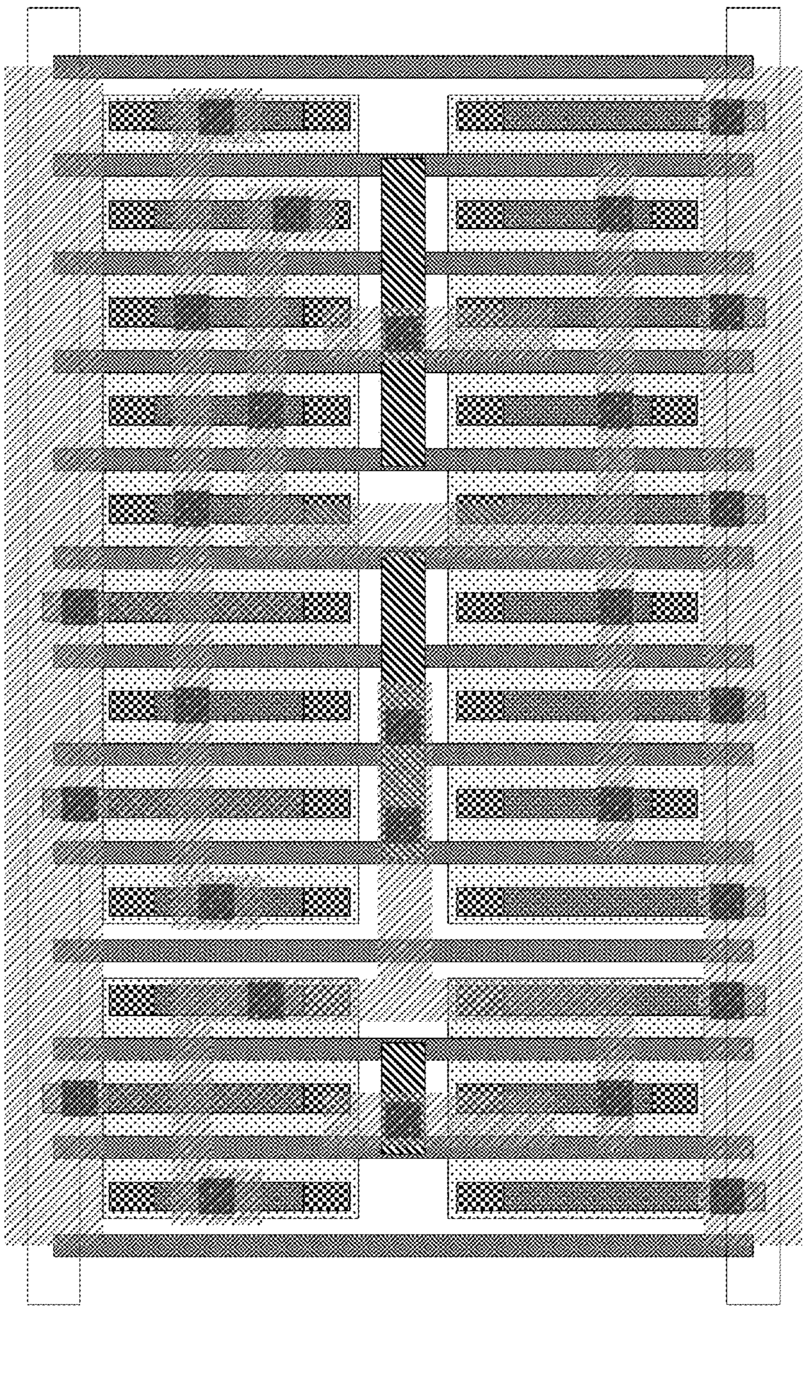
FIG. 288 depicts an INR2D4 cell.

Reference is made to FIG. 288, which depicts an INR2D4 cell. This cell implements the logic function nor(not(A),B) in drive strength 4.

Figure 289:
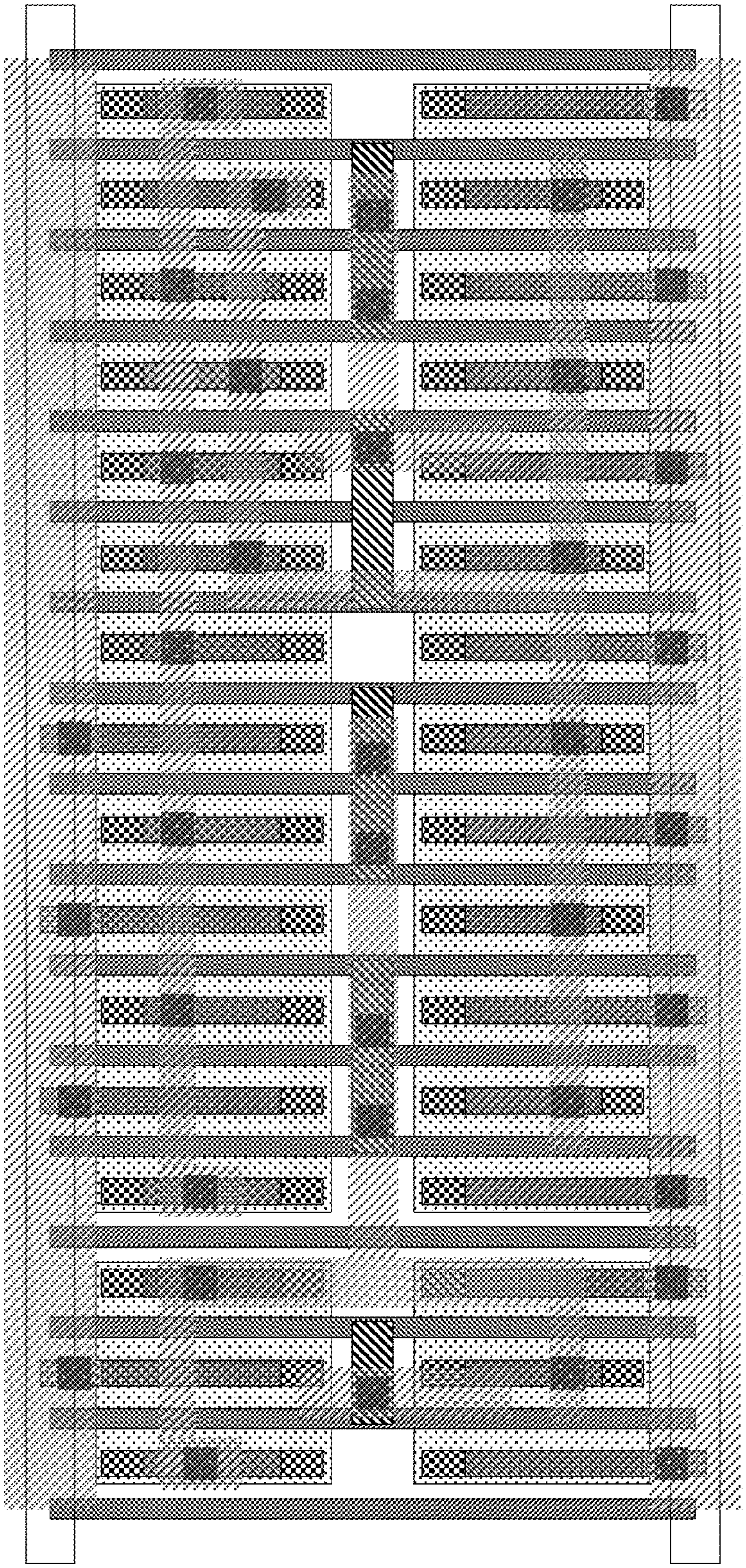
FIG. 289 depicts an INR2D6 cell.

Reference is made to FIG. 289, which depicts an INR2D6 cell. This cell implements the logic function nor(not(A),B) in drive strength 6.

Figure 290:
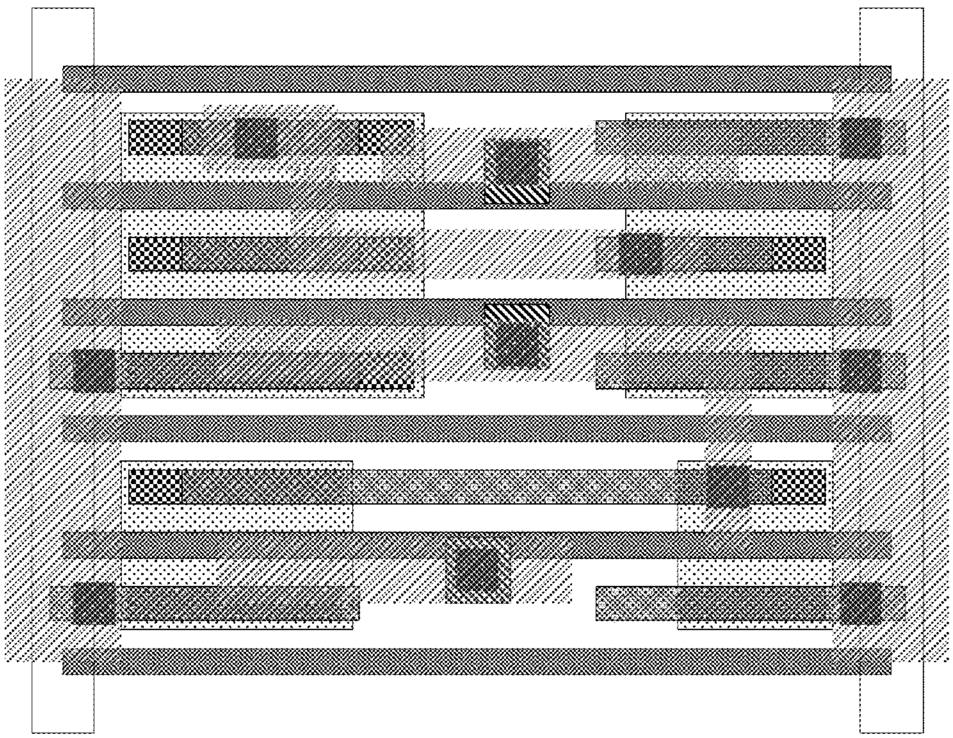
FIG. 290 depicts an INR2XD1 cell.

Reference is made to FIG. 290, which depicts an INR2XD1 cell. This is an alternative embodiment of the INR2D1 cell.

Figure 291:
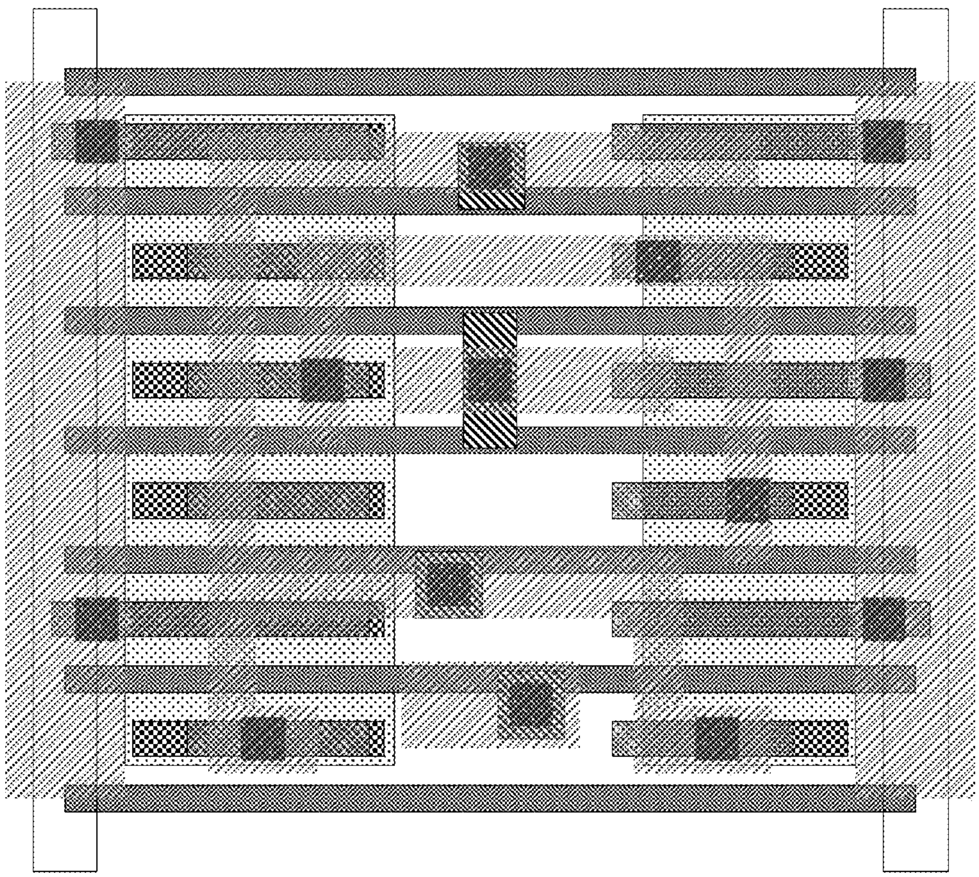
FIG. 291 depicts an INR2XD2 cell.

Reference is made to FIG. 291, which depicts an INR2XD2 cell. This is an alternative embodiment of the INR2D2 cell.

Figure 292:
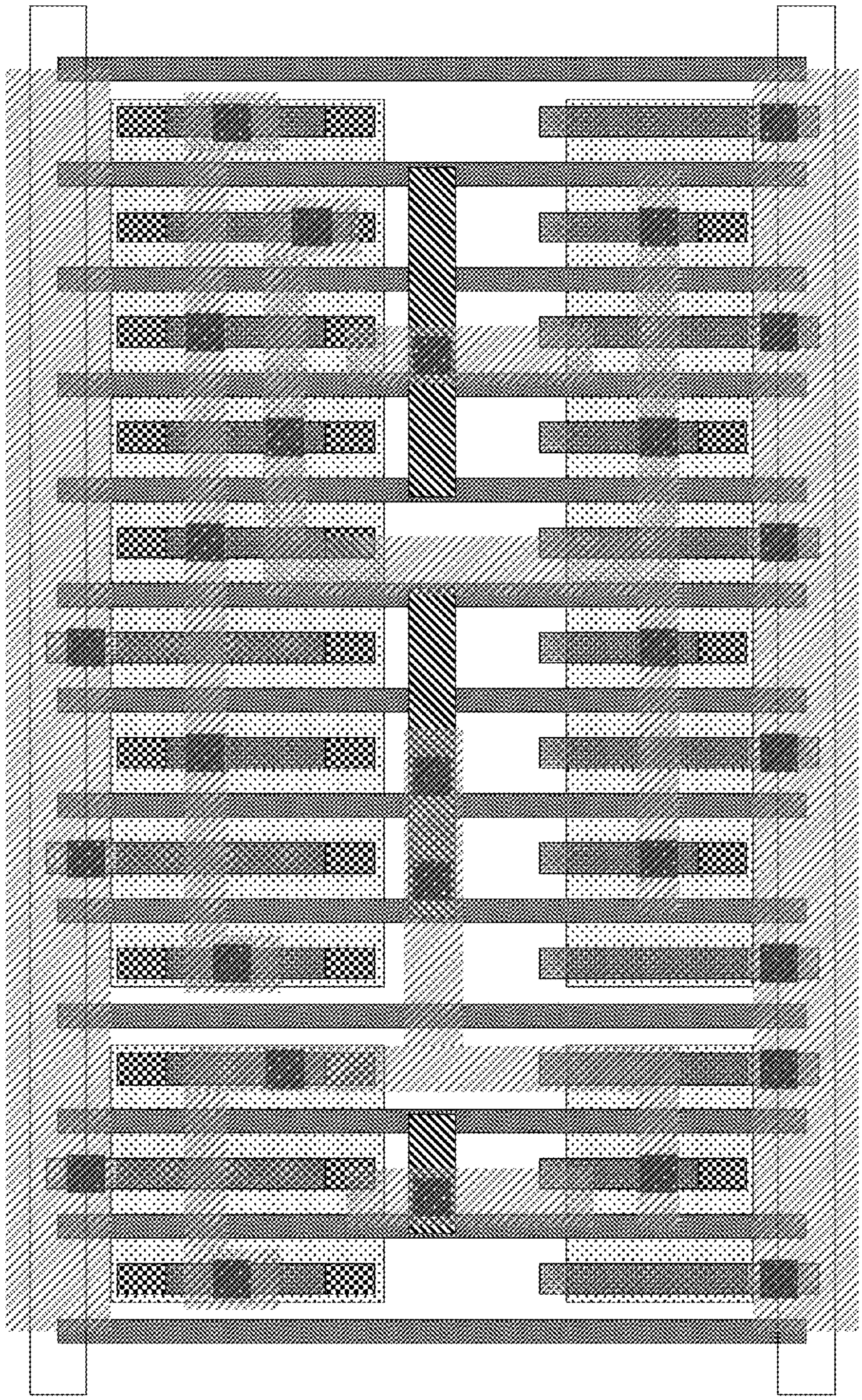
FIG. 292 depicts an INR2XD4 cell.

Reference is made to FIG. 292, which depicts an INR2XD4 cell. This is an alternative embodiment of the INR2D4 cell.

Figure 293:
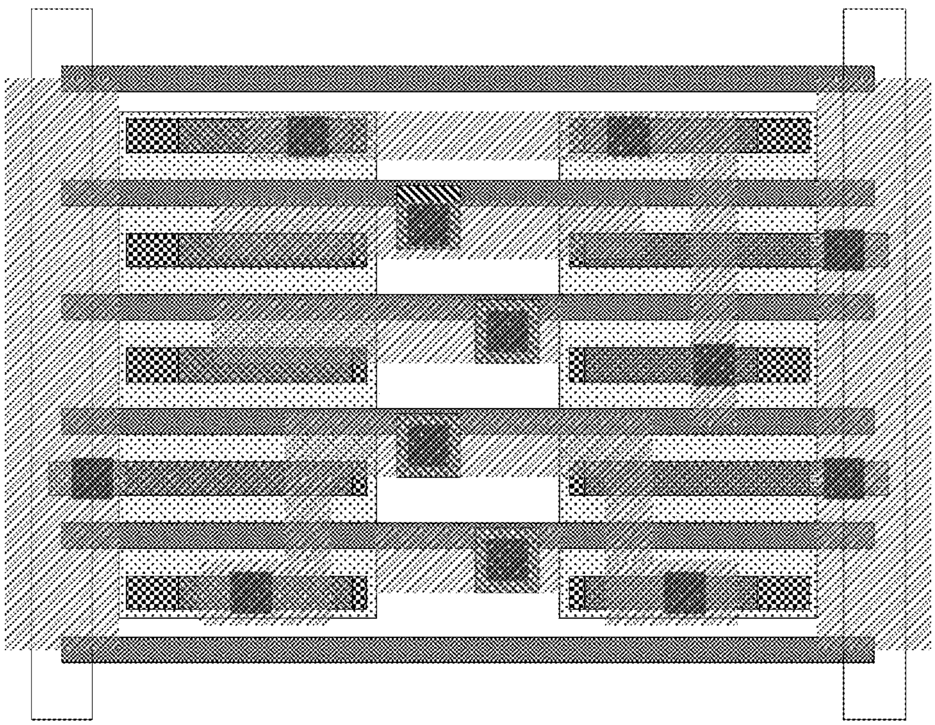
FIG. 293 depicts an INR3D1 cell.

Reference is made to FIG. 293, which depicts an INR3D1 cell. This cell implements the logic function nor(not(A),B,C) in drive strength 1.

Figure 294:
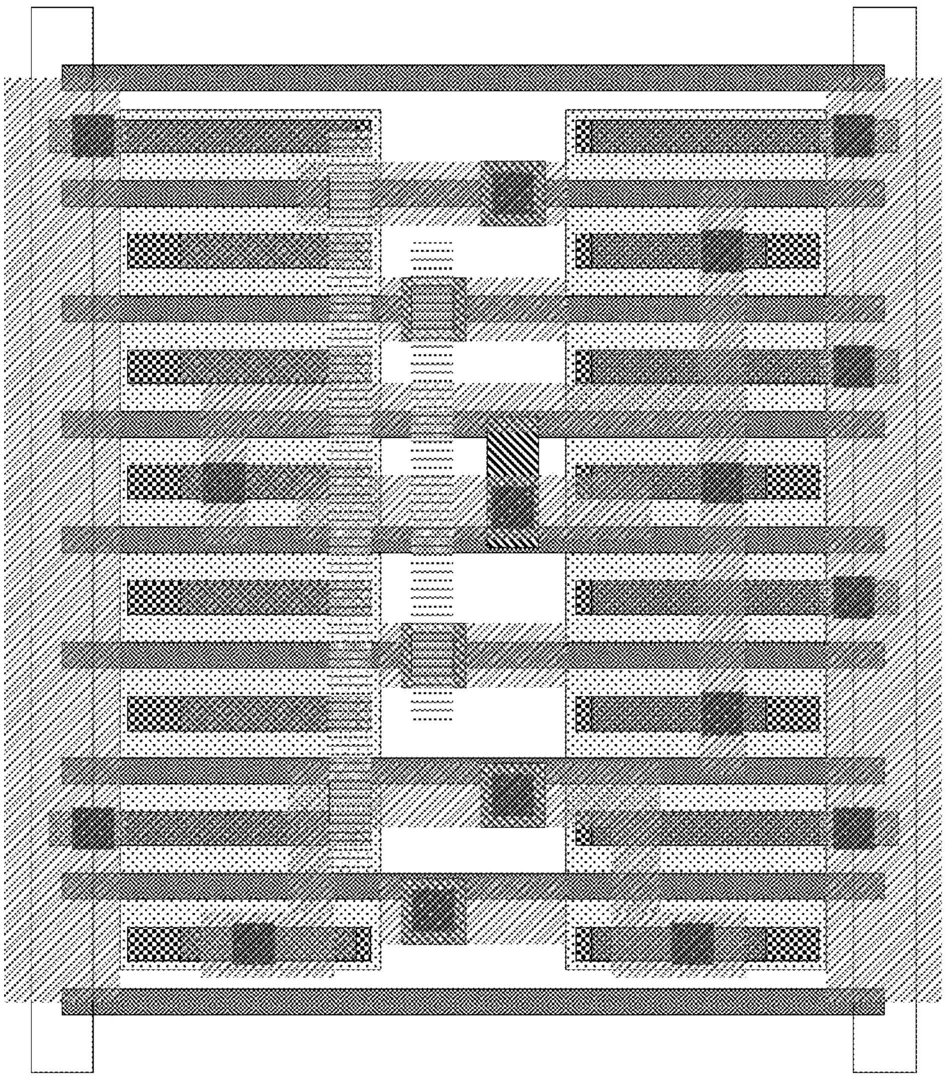
FIG. 294 depicts an INR3D2 cell.

Reference is made to FIG. 294, which depicts an INR3D2 cell. This cell implements the logic function nor(not(A),B,C) in drive strength 2.

Figure 295:
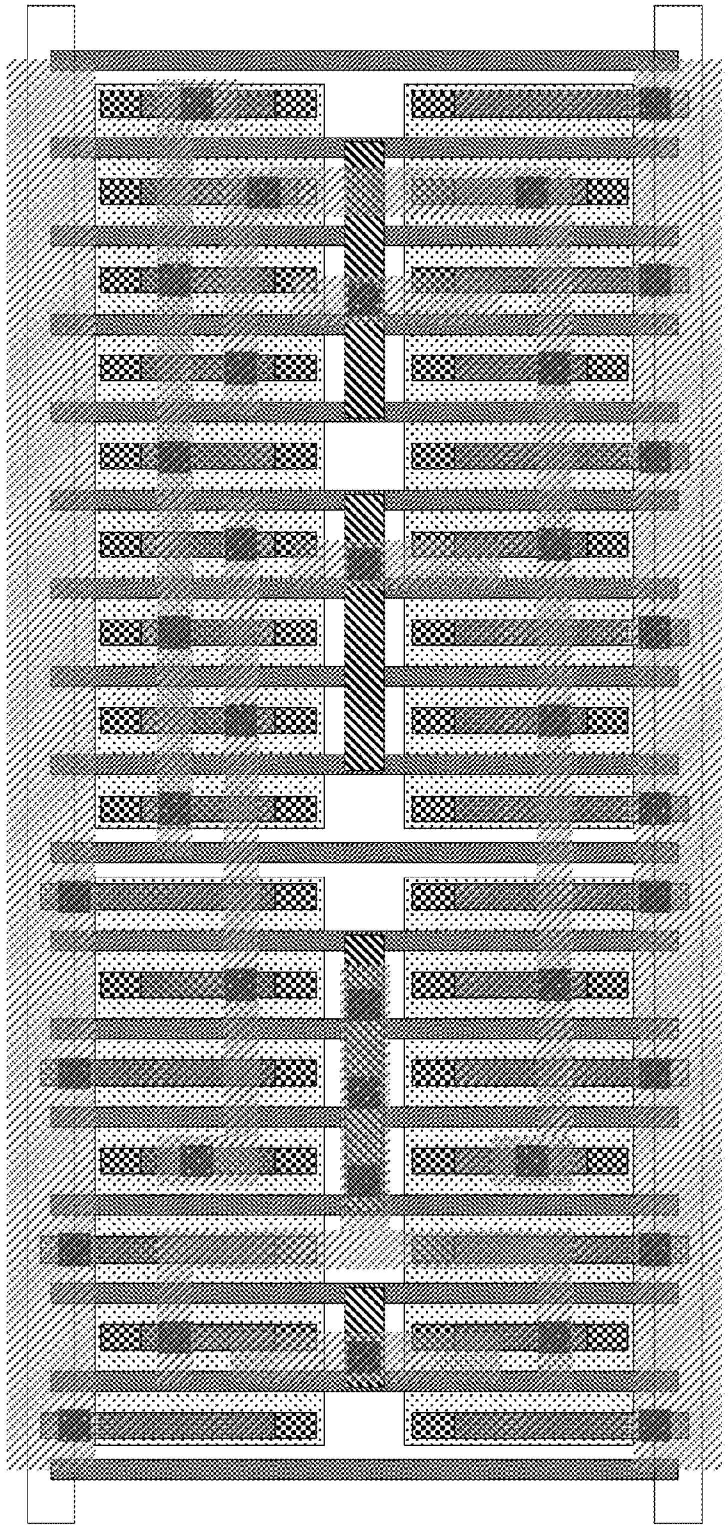
FIG. 295 depicts an INR3D4 cell.

Reference is made to FIG. 295, which depicts an INR3D4 cell. This cell implements the logic function nor(not(A),B,C) in drive strength 4.

Figure 296:
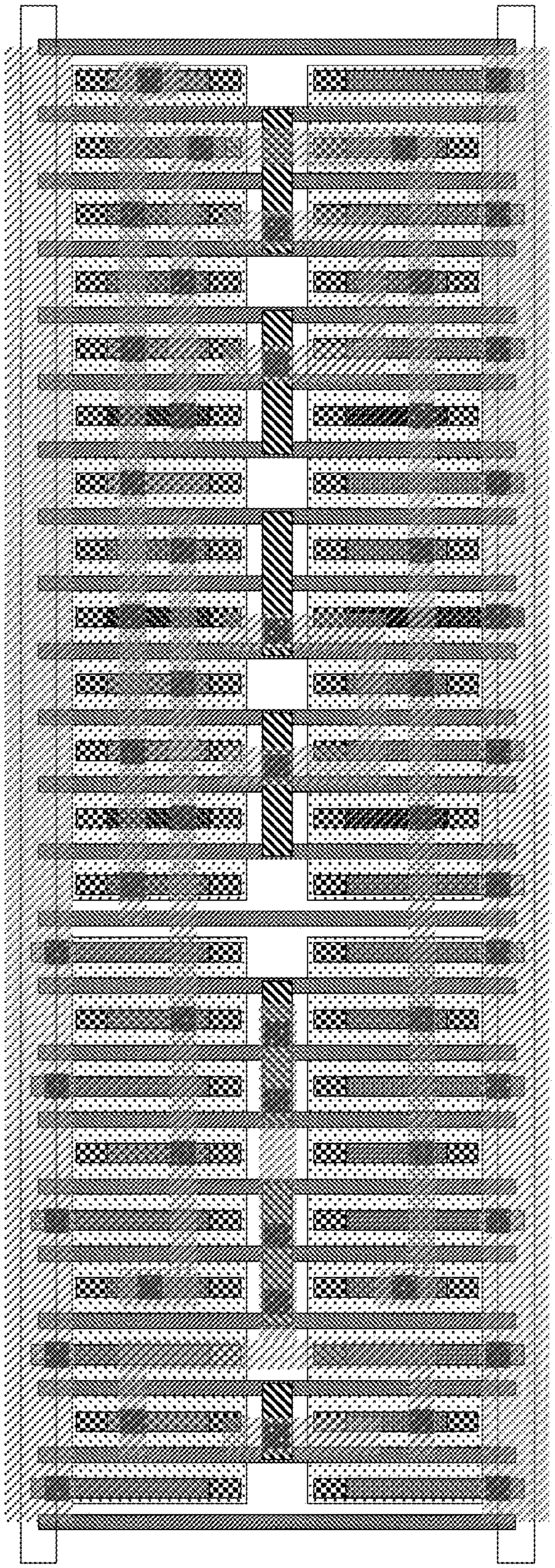
FIG. 296 depicts an INR3D6 cell.

Reference is made to FIG. 296, which depicts an INR3D6 cell. This cell implements the logic function nor(not(A),B,C) in drive strength 6.

Figure 297:
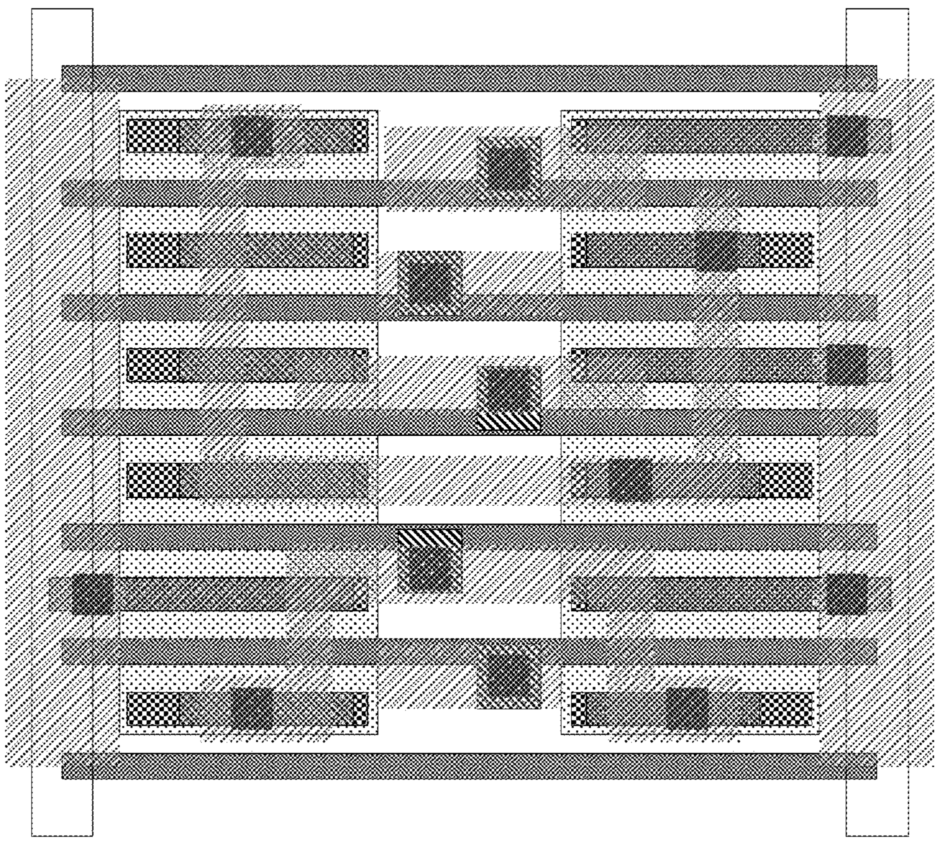
FIG. 297 depicts an INR4D1 cell.

Reference is made to FIG. 297, which depicts an INR4D1 cell. This cell implements the logic function nor(not(A),B,C,D) in drive strength 1.

Figure 298:
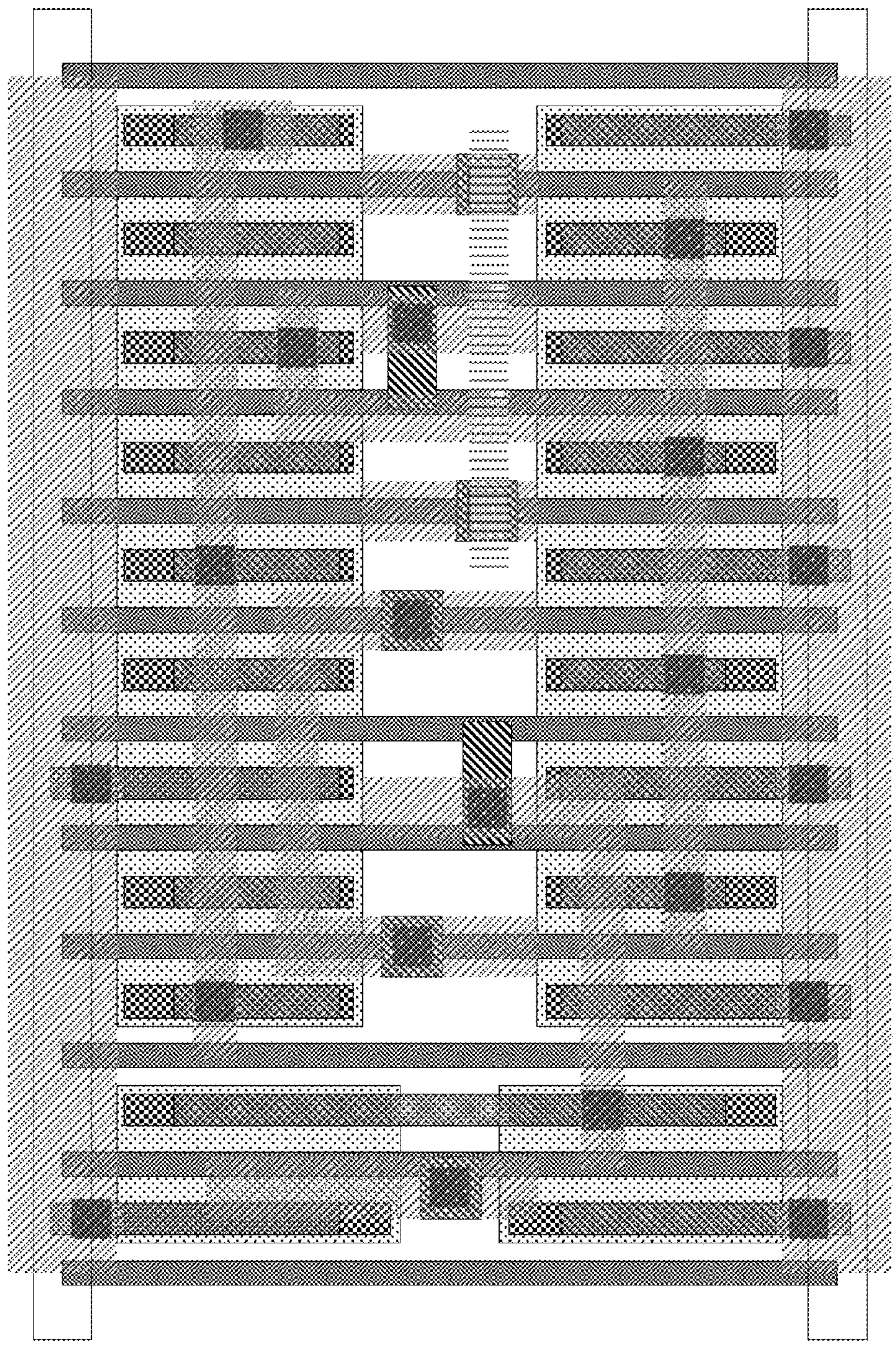
FIG. 298 depicts an INR4D2 cell.

Reference is made to FIG. 298, which depicts an INR4D2 cell. This cell implements the logic function nor(not(A),B,C,D) in drive strength 2.

Figure 299:
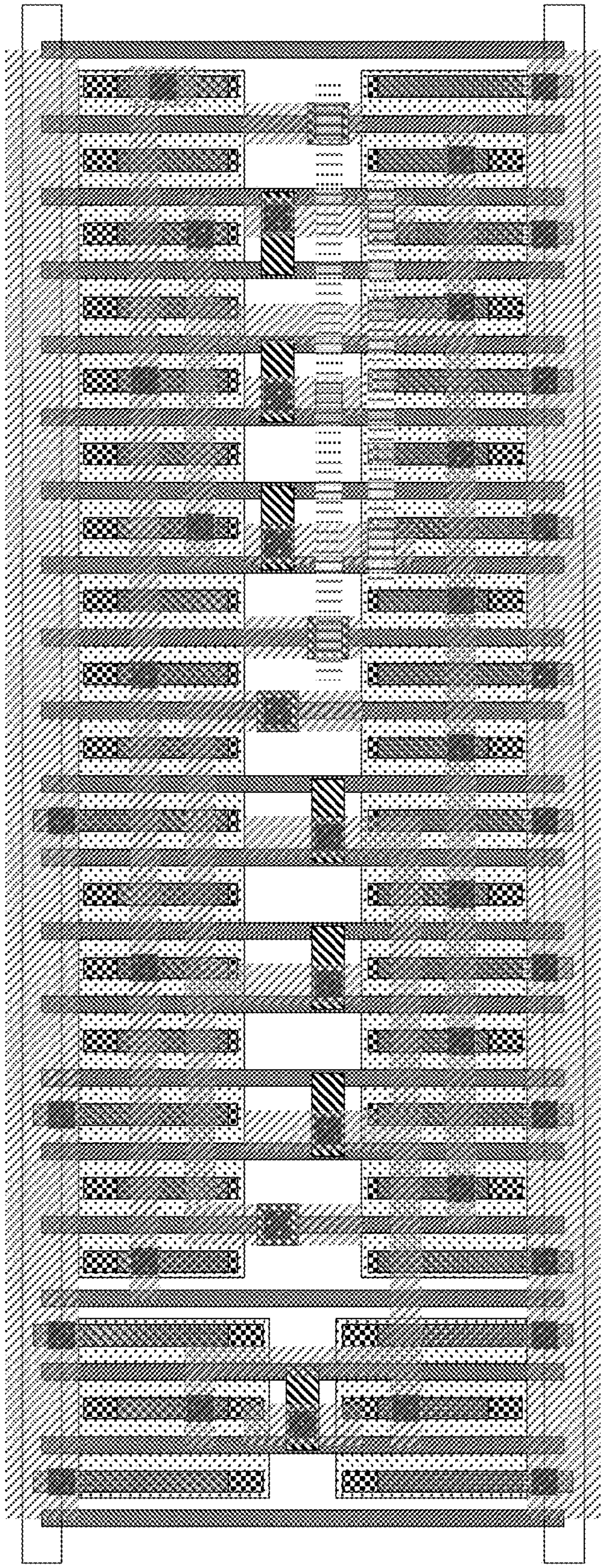
FIG. 299 depicts an INR4D4 cell.

Reference is made to FIG. 299, which depicts an INR4D4 cell. This cell implements the logic function nor(not(A),B,C,D) in drive strength 4.

Figure 300:
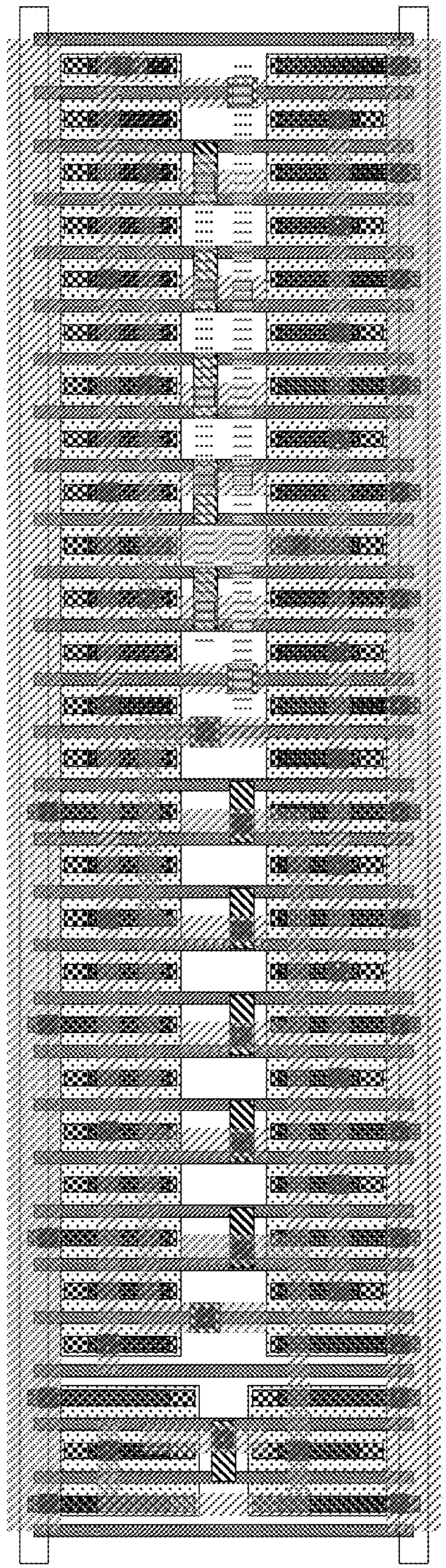
FIG. 300 depicts an INR4D6 cell.

Reference is made to FIG. 300, which depicts an INR4D6 cell. This cell implements the logic function nor(not(A),B,C,D) in drive strength 6.

Figure 301:
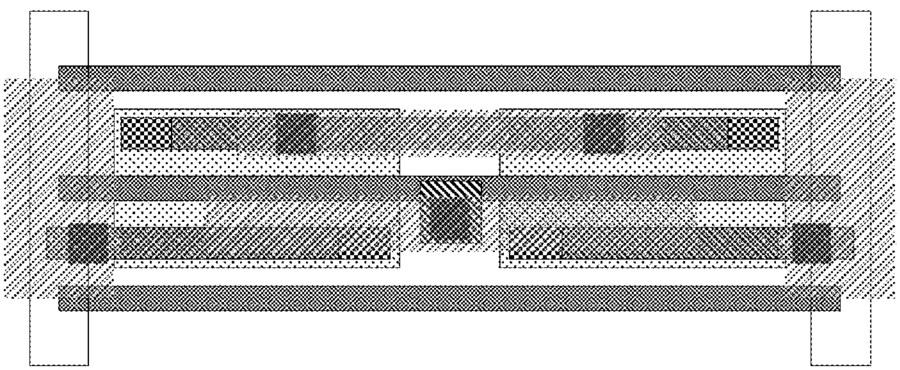
FIG. 301 depicts an INVD1 cell.

Reference is made to FIG. 301, which depicts an INVD1 cell. This cell implements the logic function not(A) in drive strength 1.

Figure 302:
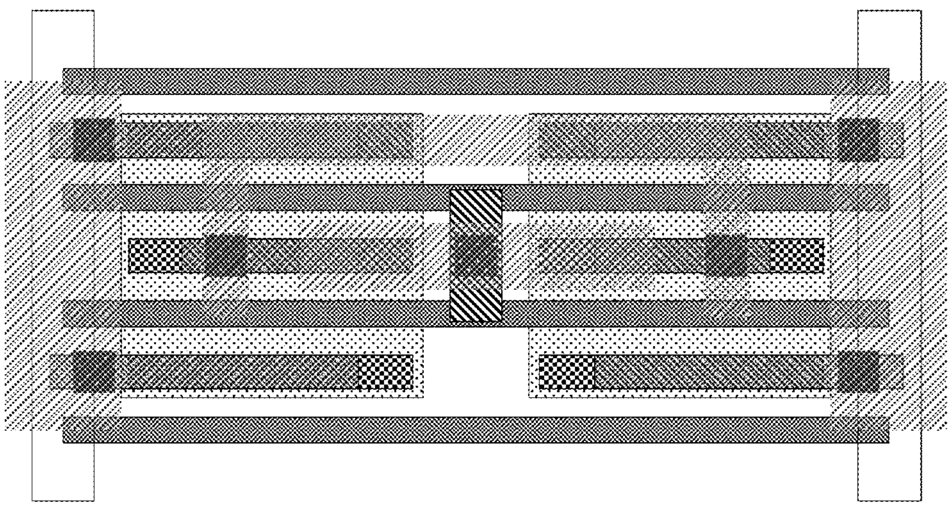
FIG. 302 depicts an INVD2 cell.

Reference is made to FIG. 302, which depicts an INVD2 cell. This cell implements the logic function not(A) in drive strength 2.

Figure 303:
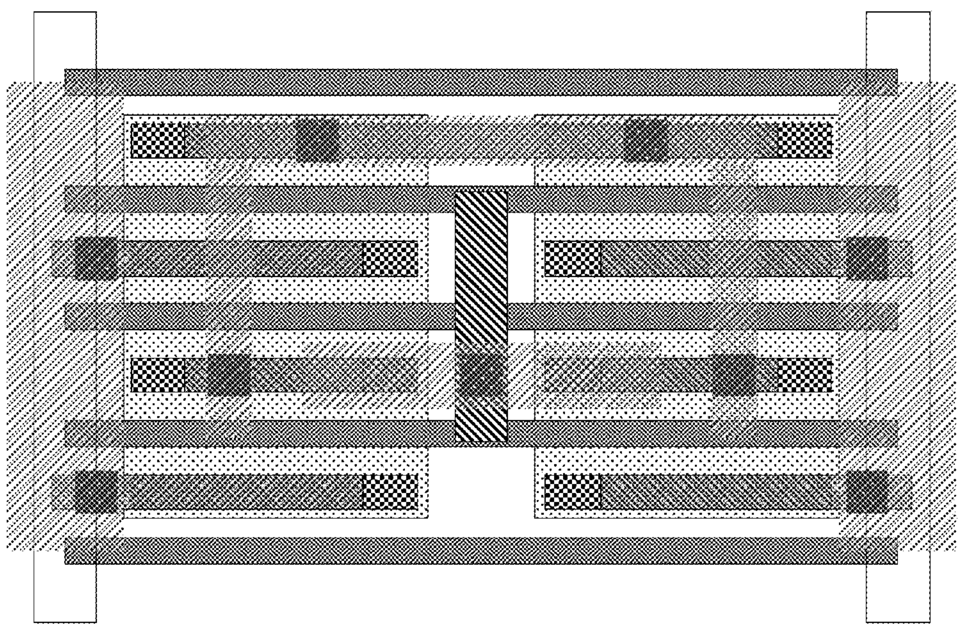
FIG. 303 depicts an INVD3 cell.

Reference is made to FIG. 303, which depicts an INVD3 cell. This cell implements the logic function not(A) in drive strength 3.

Figure 304:
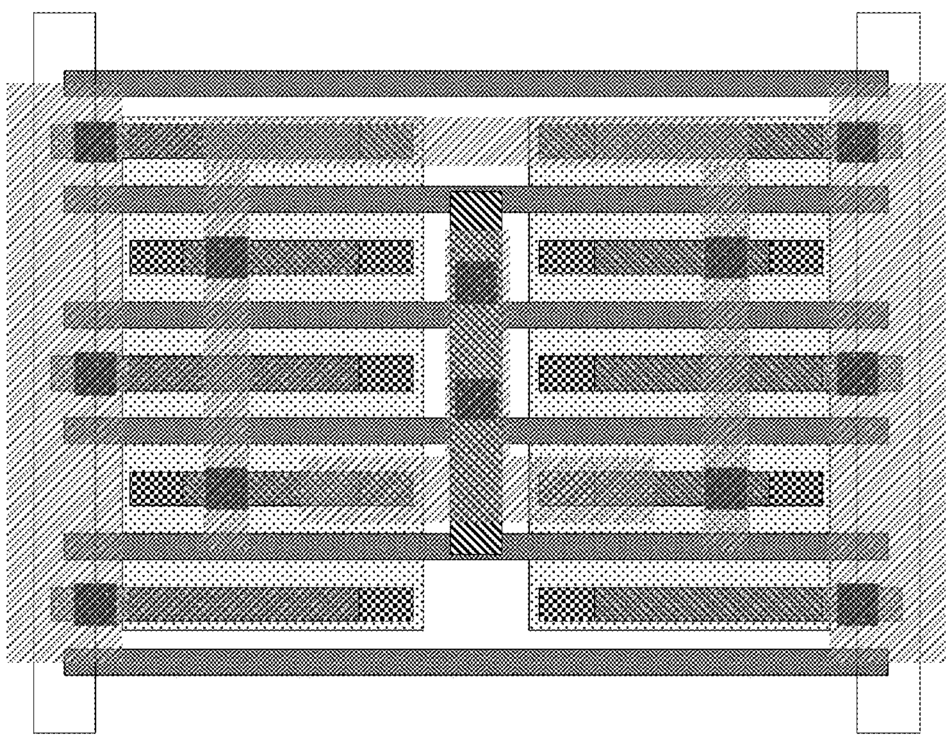
FIG. 304 depicts an INVD4 cell.

Reference is made to FIG. 304, which depicts an INVD4 cell. This cell implements the logic function not(A) in drive strength 4.

Figure 305:
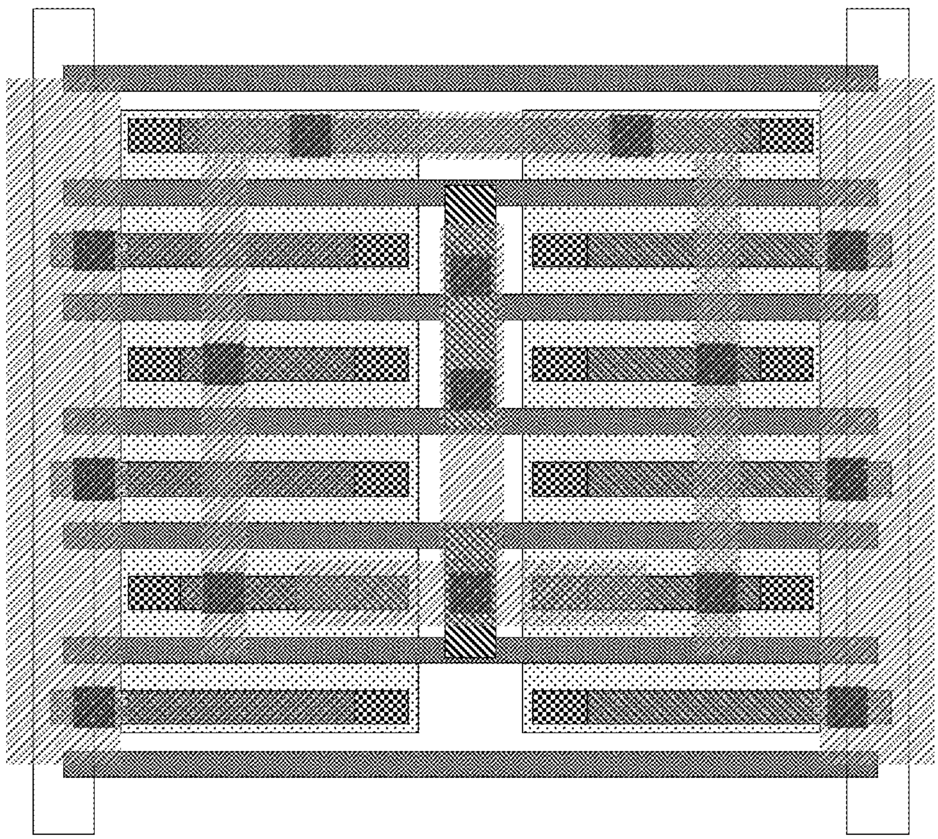
FIG. 305 depicts an INVD5 cell.

Reference is made to FIG. 305, which depicts an INVD5 cell. This cell implements the logic function not(A) in drive strength 5.

Figure 306:
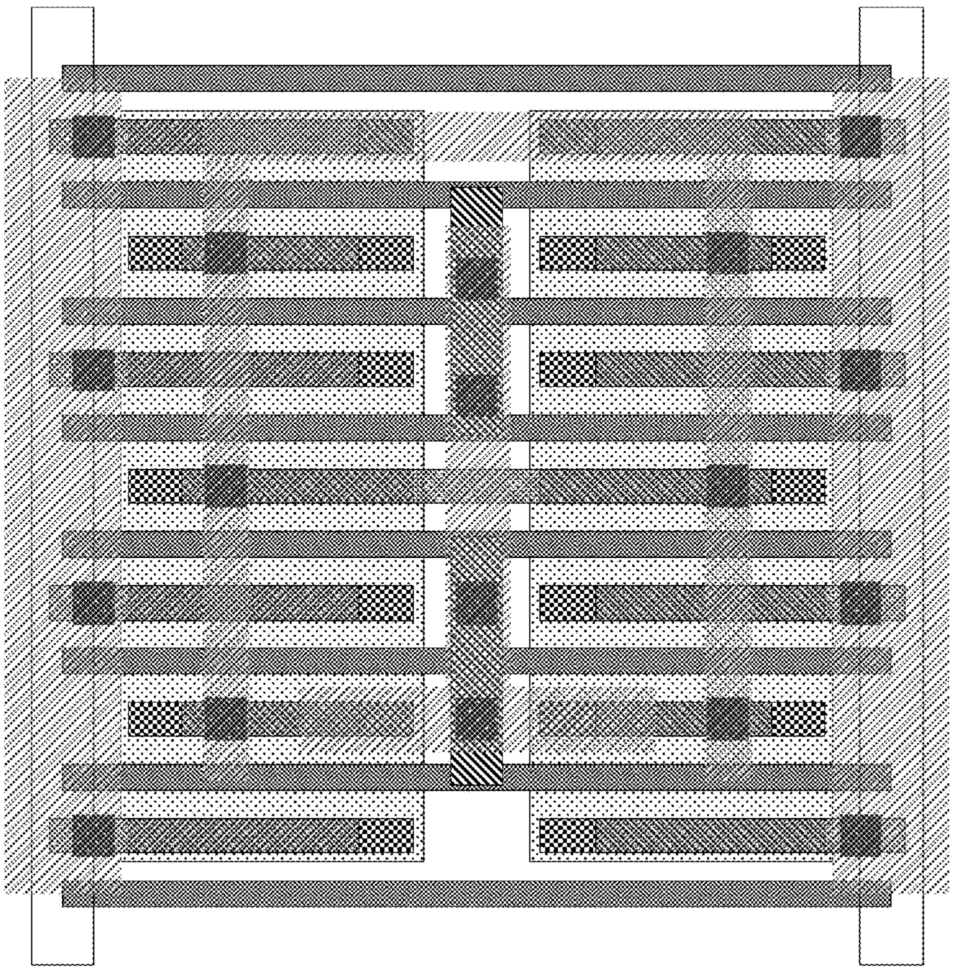
FIG. 306 depicts an INVD6 cell.

Reference is made to FIG. 306, which depicts an INVD6 cell. This cell implements the logic function not(A) in drive strength 6.

Figure 307:
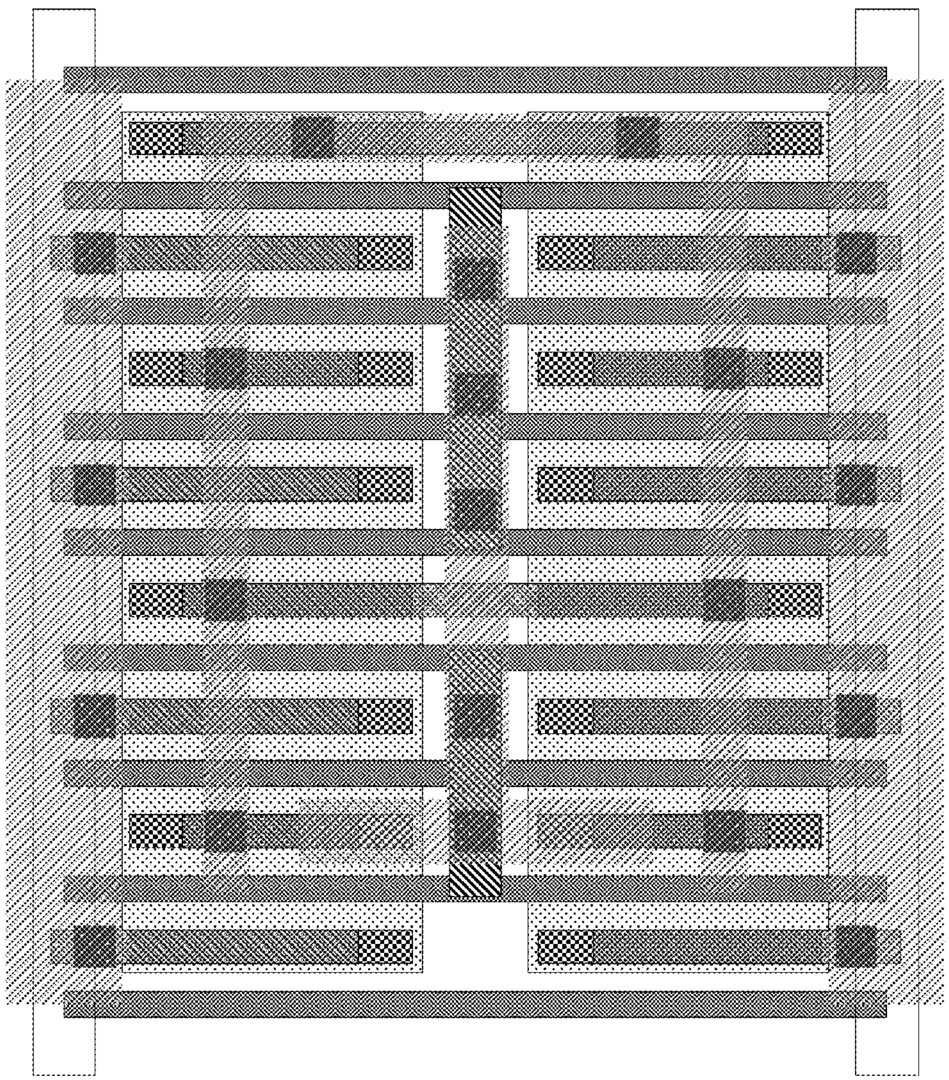
FIG. 307 depicts an INVD7 cell.

Reference is made to FIG. 307, which depicts an INVD7 cell. This cell implements the logic function not(A) in drive strength 7.

Figure 308:
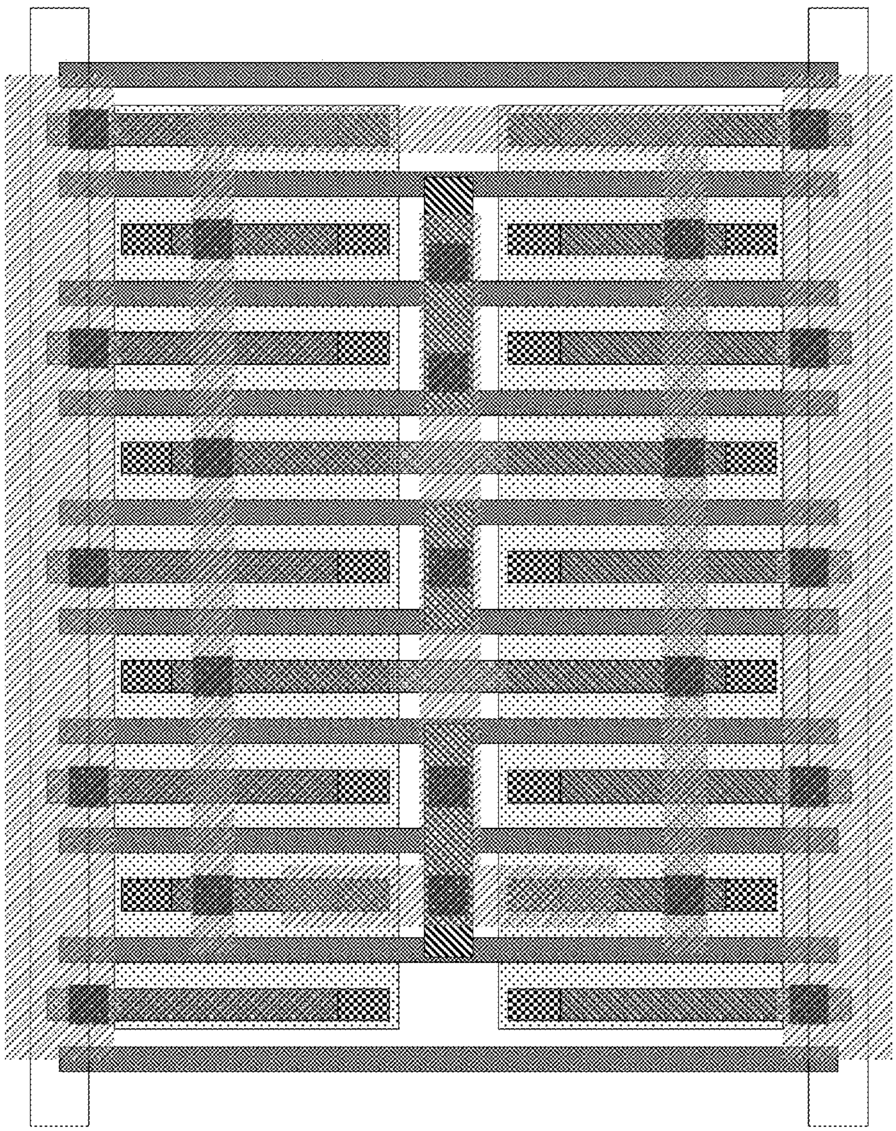
FIG. 308 depicts an INVD8 cell.

Reference is made to FIG. 308, which depicts an INVD8 cell. This cell implements the logic function not(A) in drive strength 8.

Figure 309:
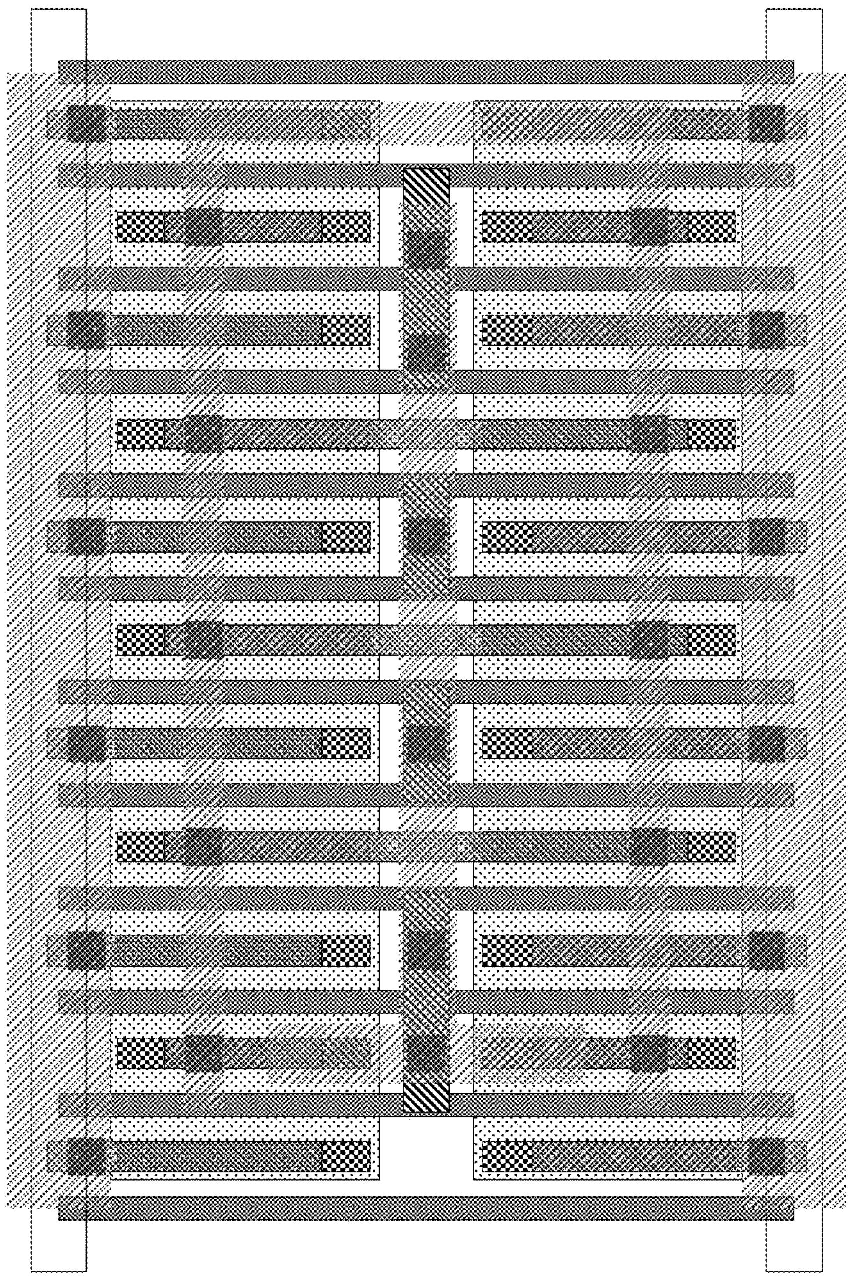
FIG. 309 depicts an INVD10 cell.

Reference is made to FIG. 309, which depicts an INVD10 cell. This cell implements the logic function not(A) in drive strength 10.

Figure 310:
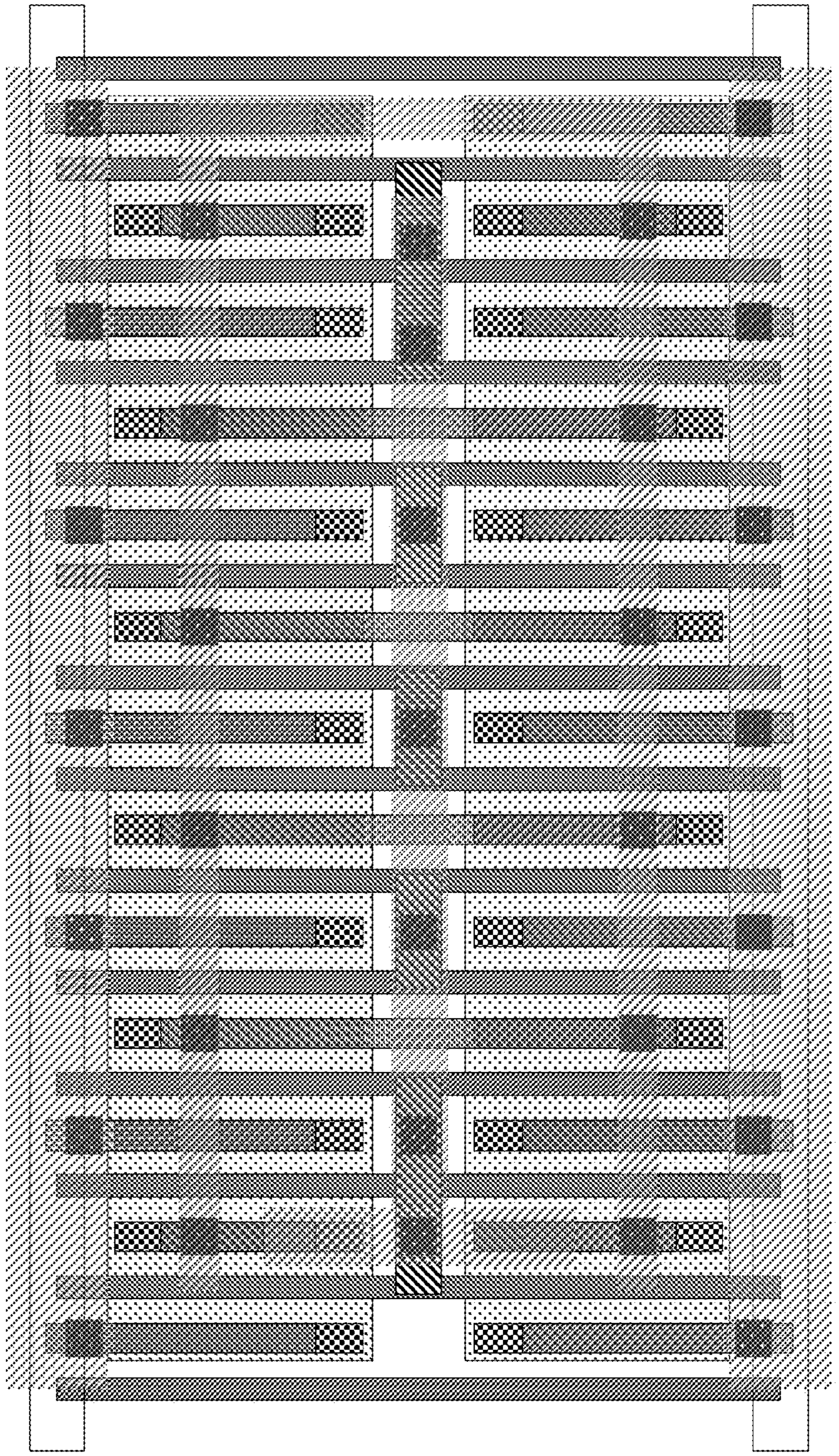
FIG. 310 depicts an INVD12 cell.

Reference is made to FIG. 310, which depicts an INVD12 cell. This cell implements the logic function not(A) in drive strength 12.

Figure 311:
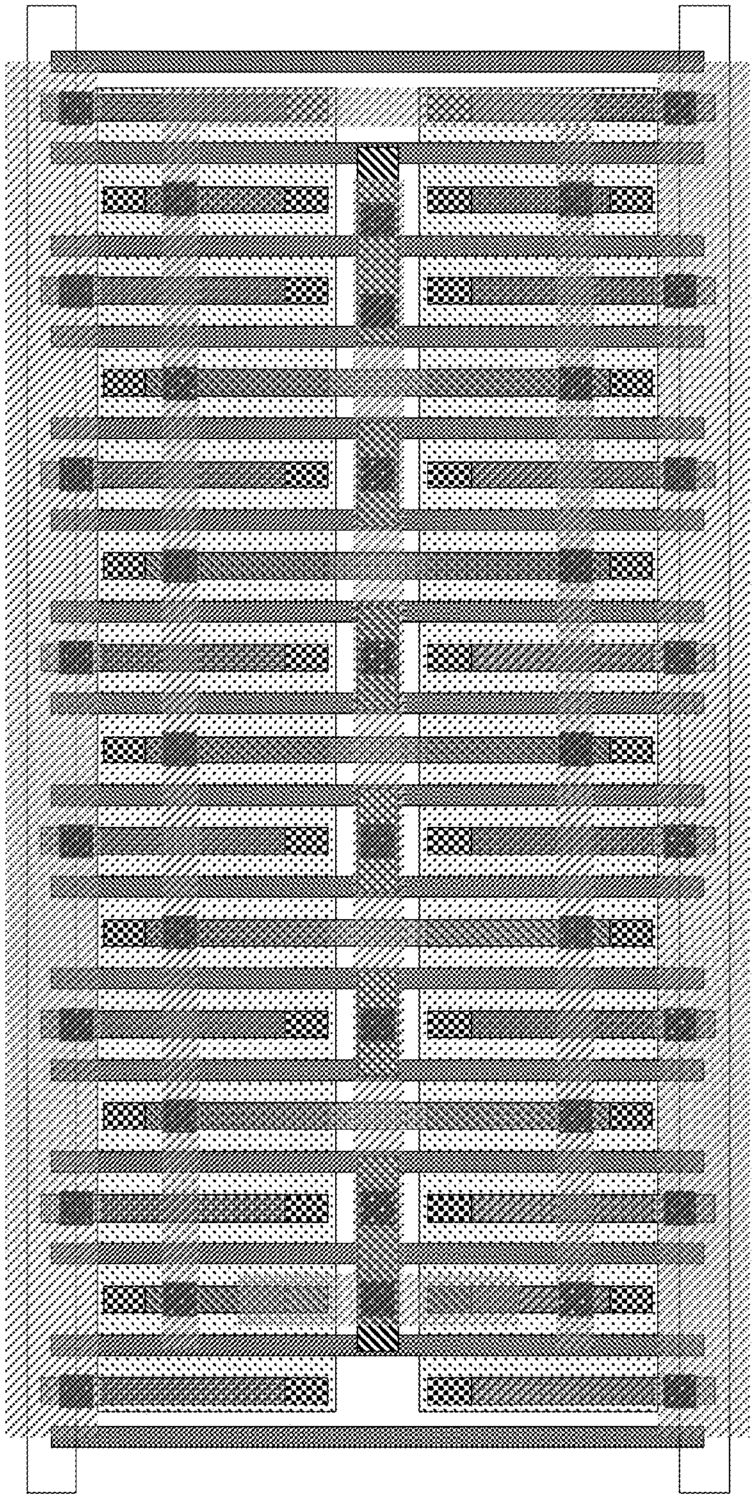
FIG. 311 depicts an INVD14 cell.

Reference is made to FIG. 311, which depicts an INVD14 cell. This cell implements the logic function not(A) in drive strength 14.

Figure 312:
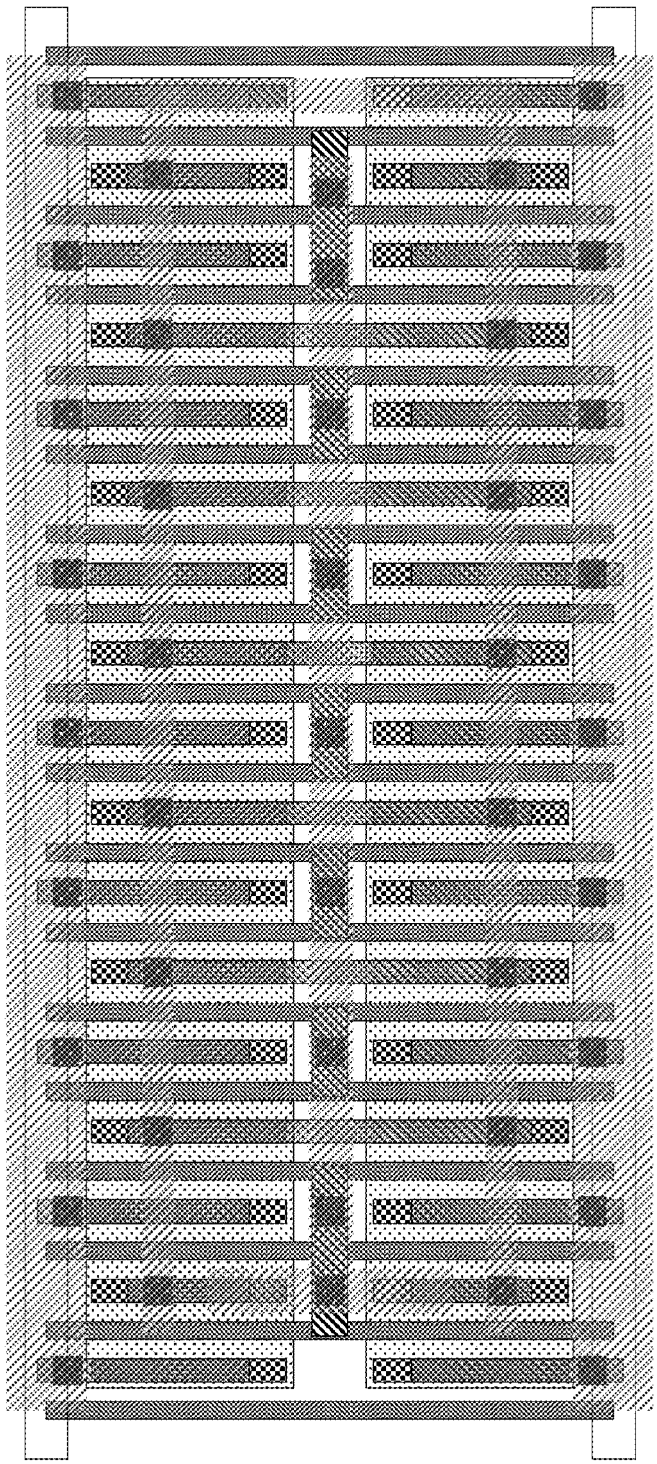
FIG. 312 depicts an INVD16 cell.

Reference is made to FIG. 312, which depicts an INVD16 cell. This cell implements the logic function not(A) in drive strength 16.

Figure 313:
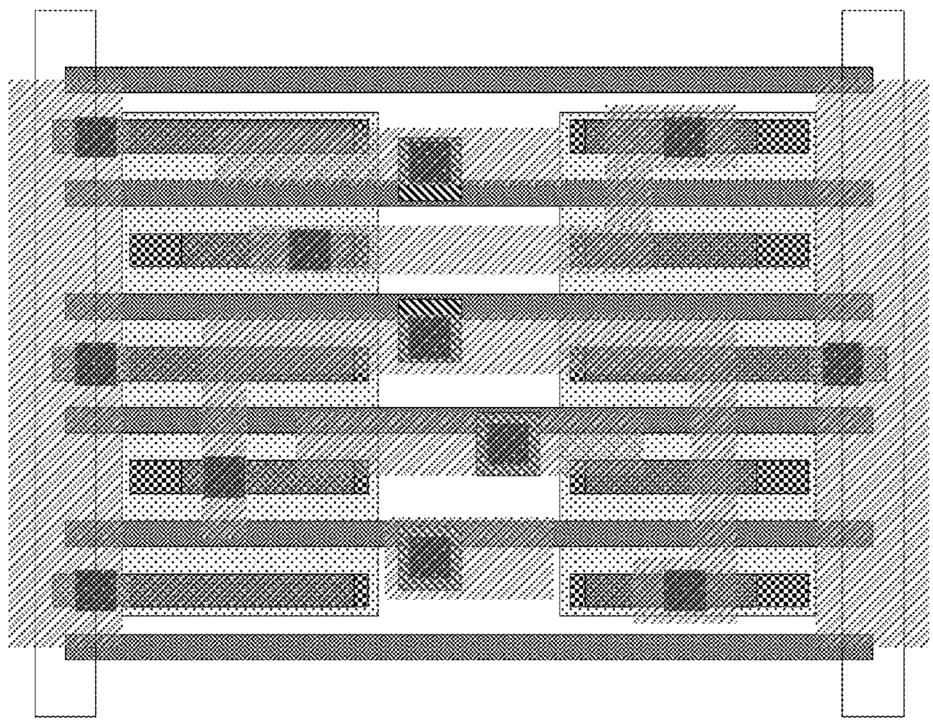
FIG. 313 depicts an IOA21D1 cell.

Reference is made to FIG. 313, which depicts an IOA21D1 cell. This cell implements the logic function and(or(not(A),B),C) in drive strength 1.

Figure 314:
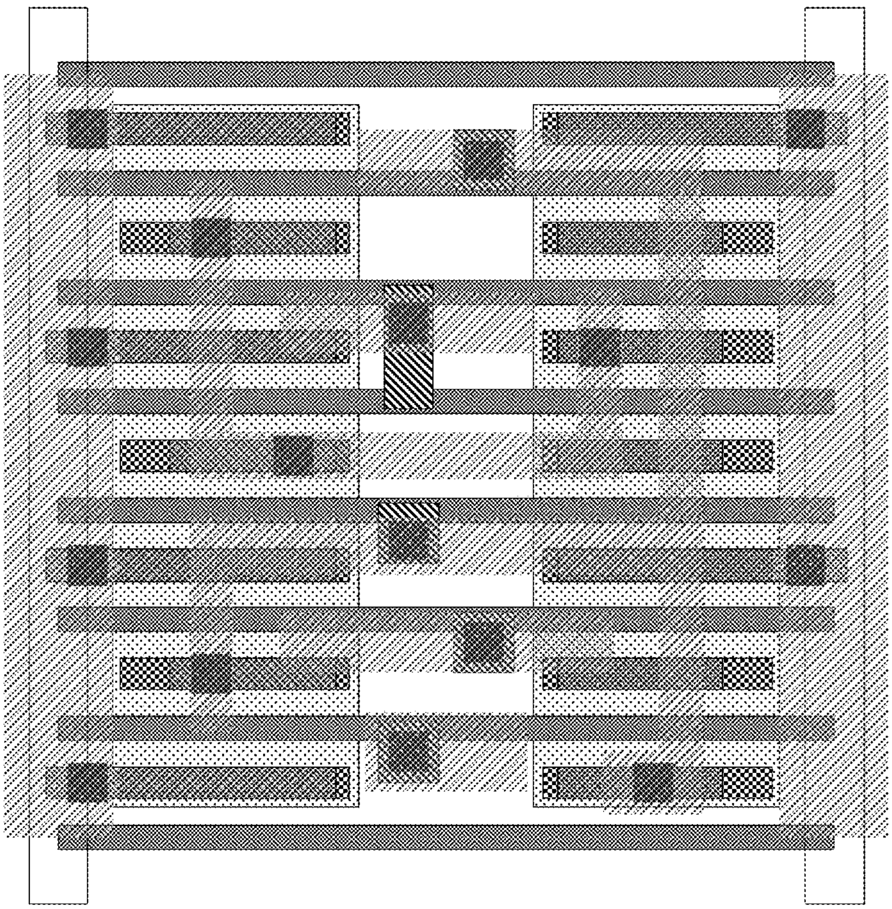
FIG. 314 depicts an IOA21D2 cell.

Reference is made to FIG. 314, which depicts an IOA21D2 cell. This cell implements the logic function and(or(not(A),B),C) in drive strength 2.

Figure 315:
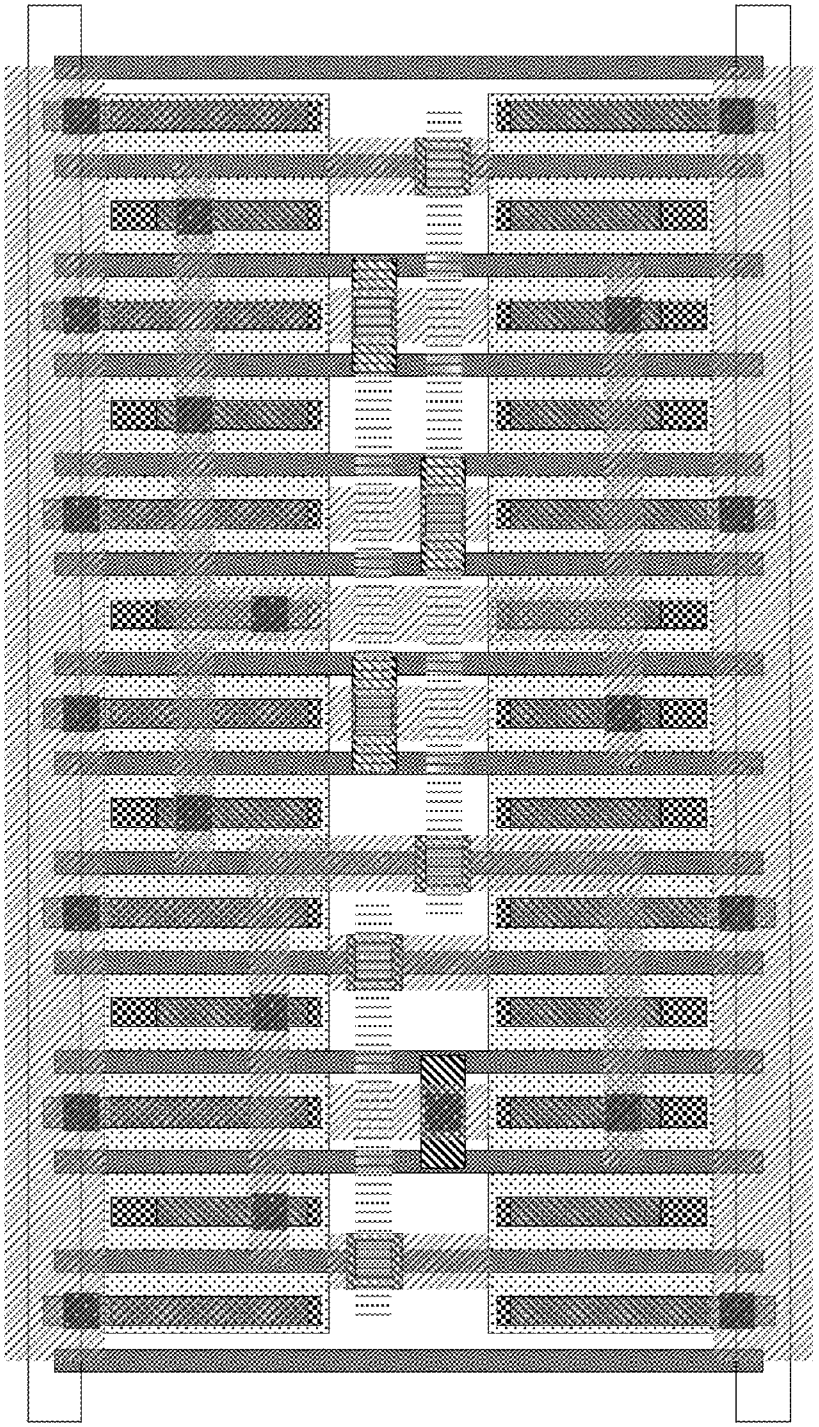
FIG. 315 depicts an IOA21D4 cell.

Reference is made to FIG. 315, which depicts an IOA21D4 cell. This cell implements the logic function and(or(not(A),B),C) in drive strength 4.

Figure 316:
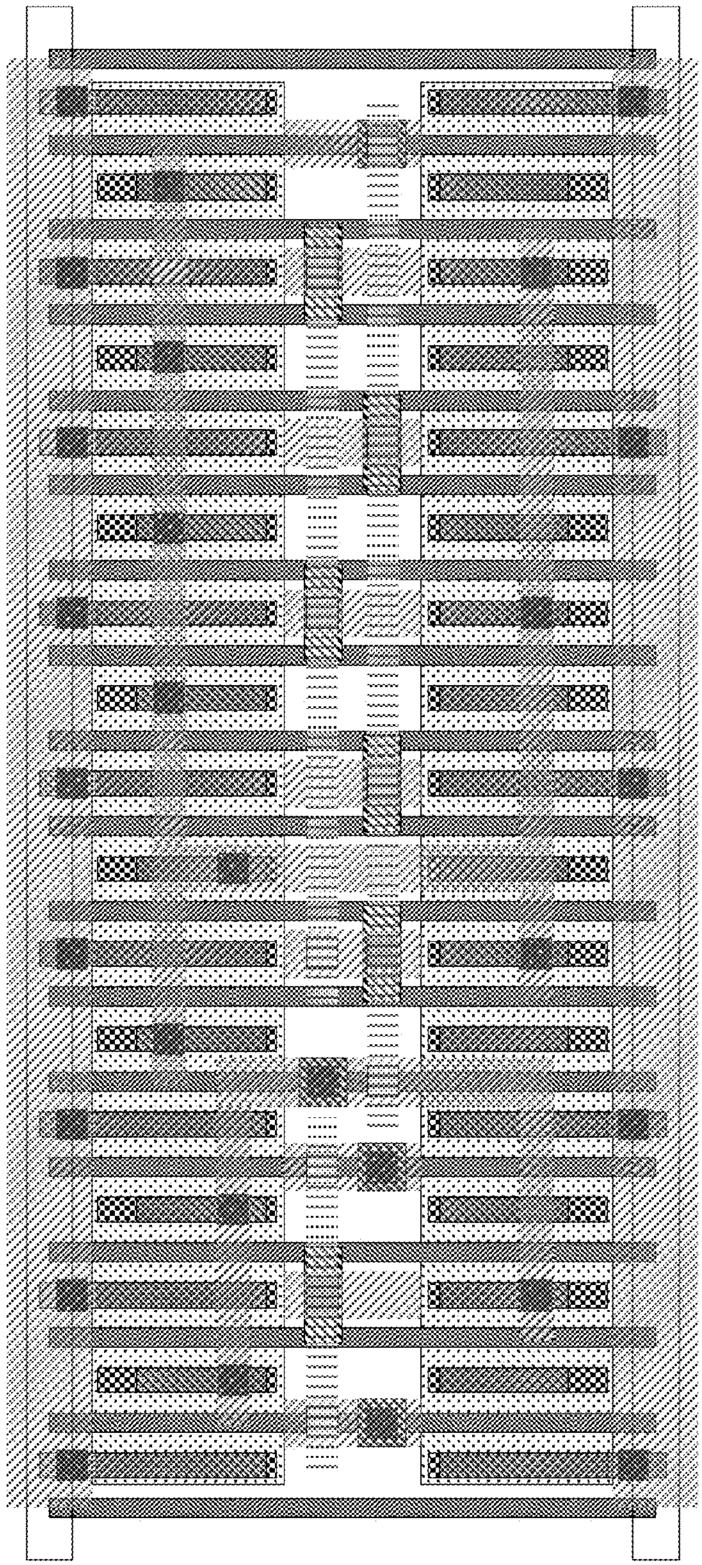
FIG. 316 depicts an IOA21D6 cell.

Reference is made to FIG. 316, which depicts an IOA21D6 cell. This cell implements the logic function and(or(not(A),B),C) in drive strength 6.

Figure 317:
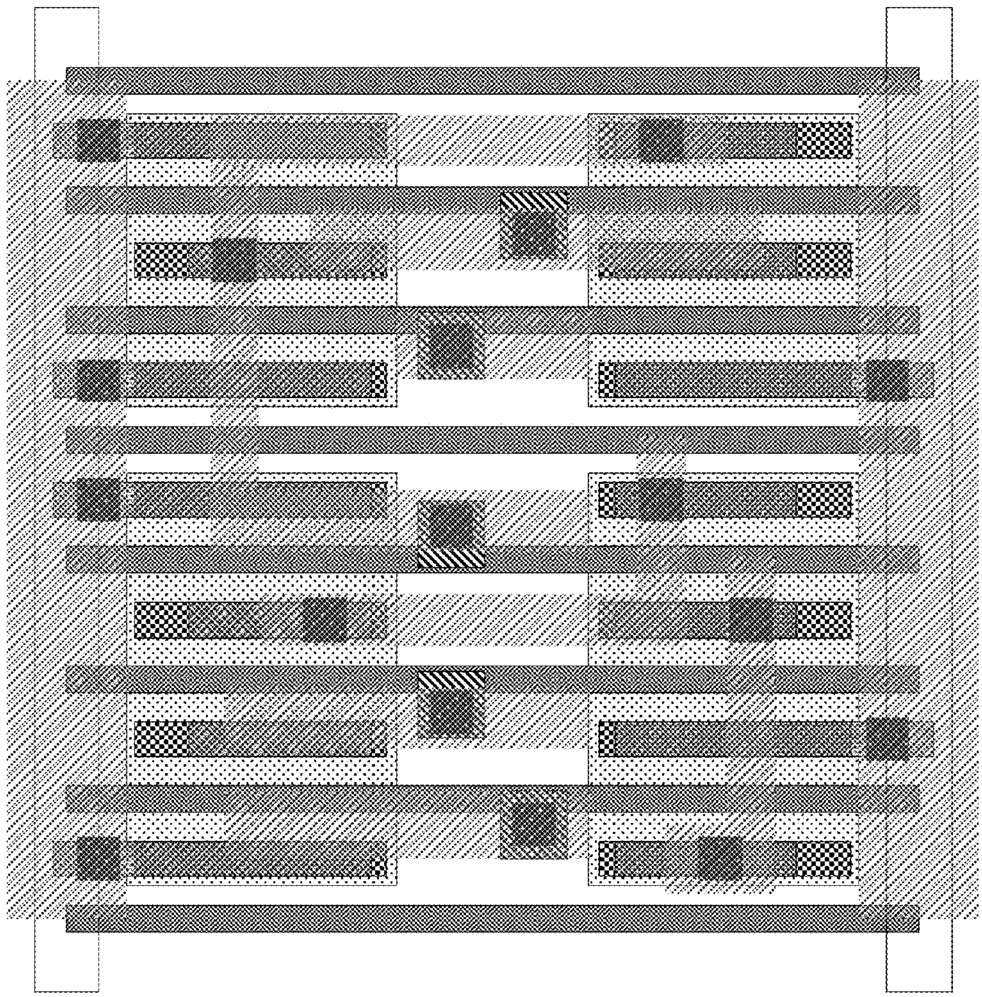
FIG. 317 depicts an IOA22D1 cell.

Reference is made to FIG. 317, which depicts an IOA22D1 cell. This cell implements the logic function and(or(not(A),B),or(C,D)) in drive strength 1.

Figure 318:
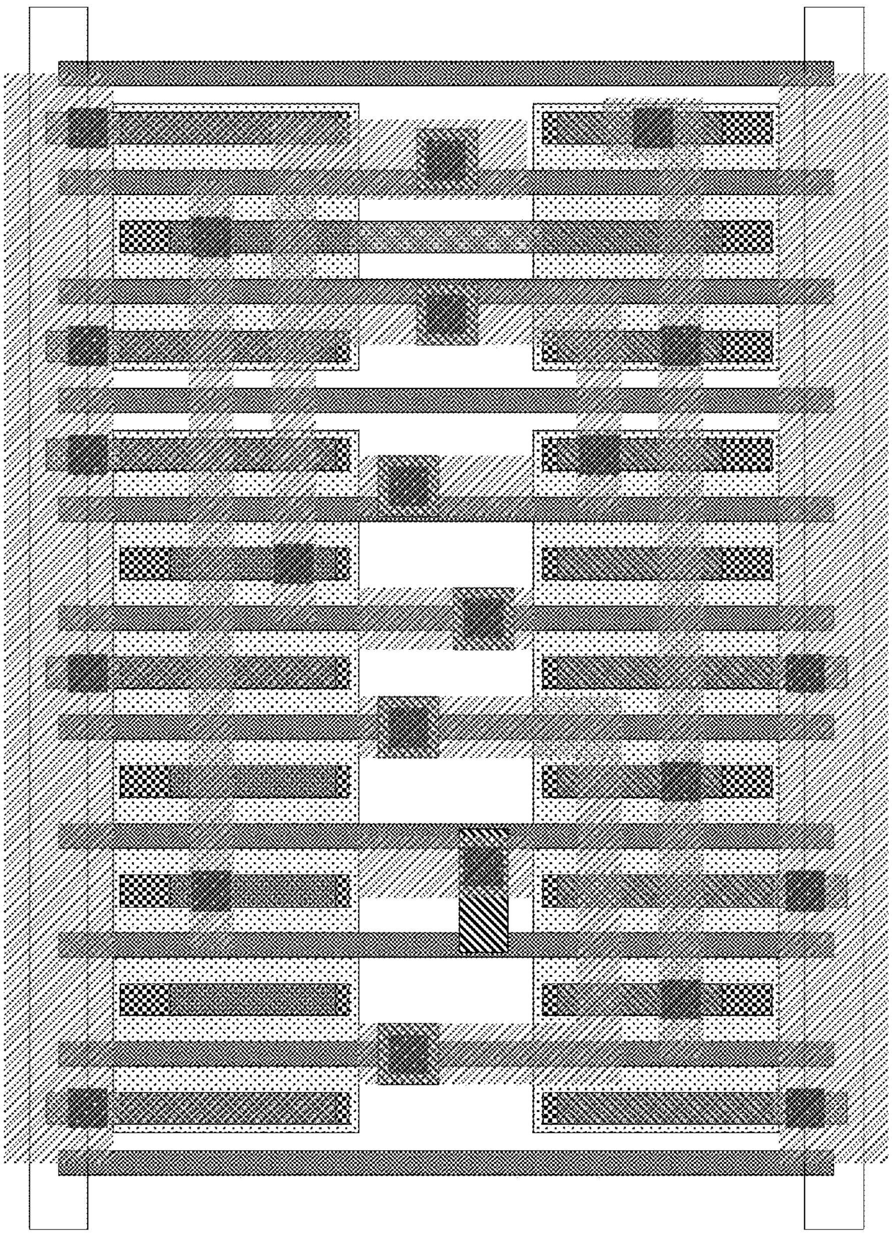
FIG. 318 depicts an IOA22D2 cell.

Reference is made to FIG. 318, which depicts an IOA22D2 cell. This cell implements the logic function and(or(not(A),B),or(C,D)) in drive strength 2.

Figure 319:
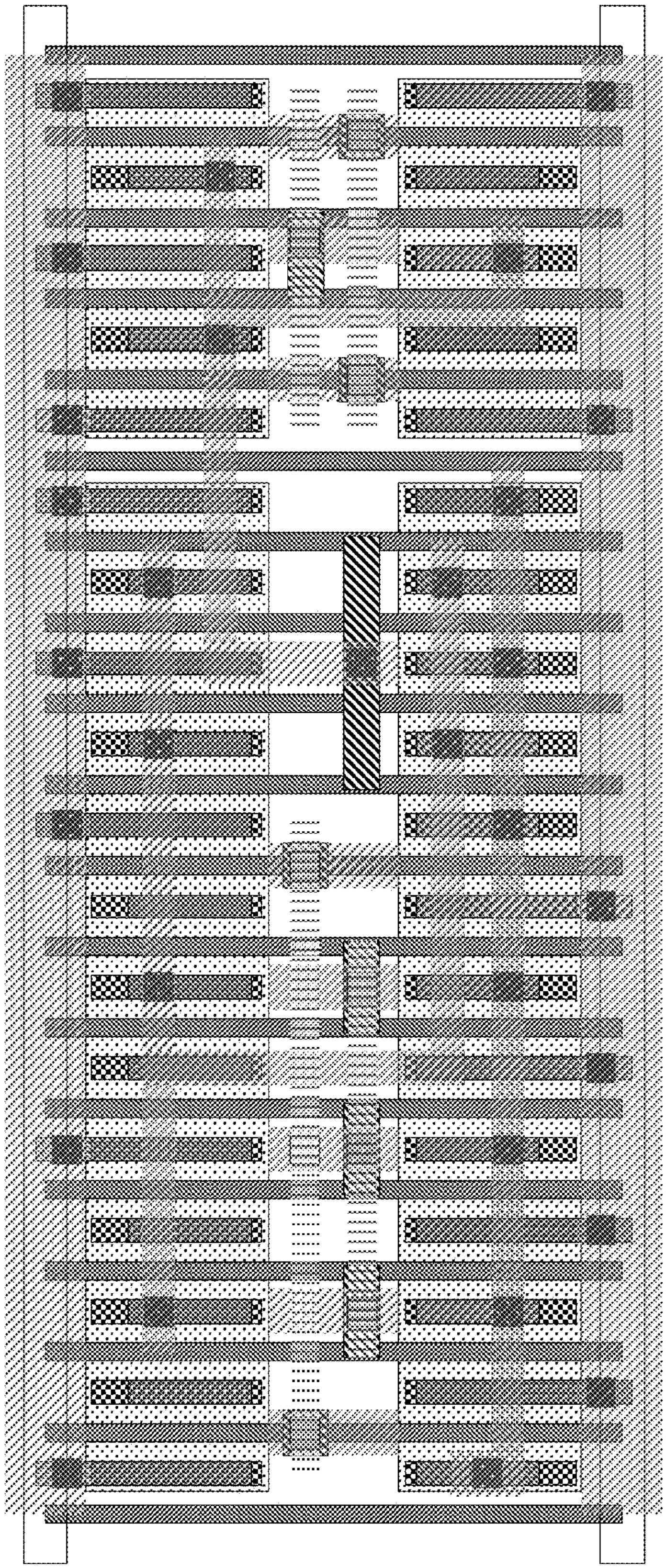
FIG. 319 depicts an IOA22D4 cell.

Reference is made to FIG. 319, which depicts an IOA22D4 cell. This cell implements the logic function and(or(not(A),B),or(C,D)) in drive strength 4.

Figure 320:
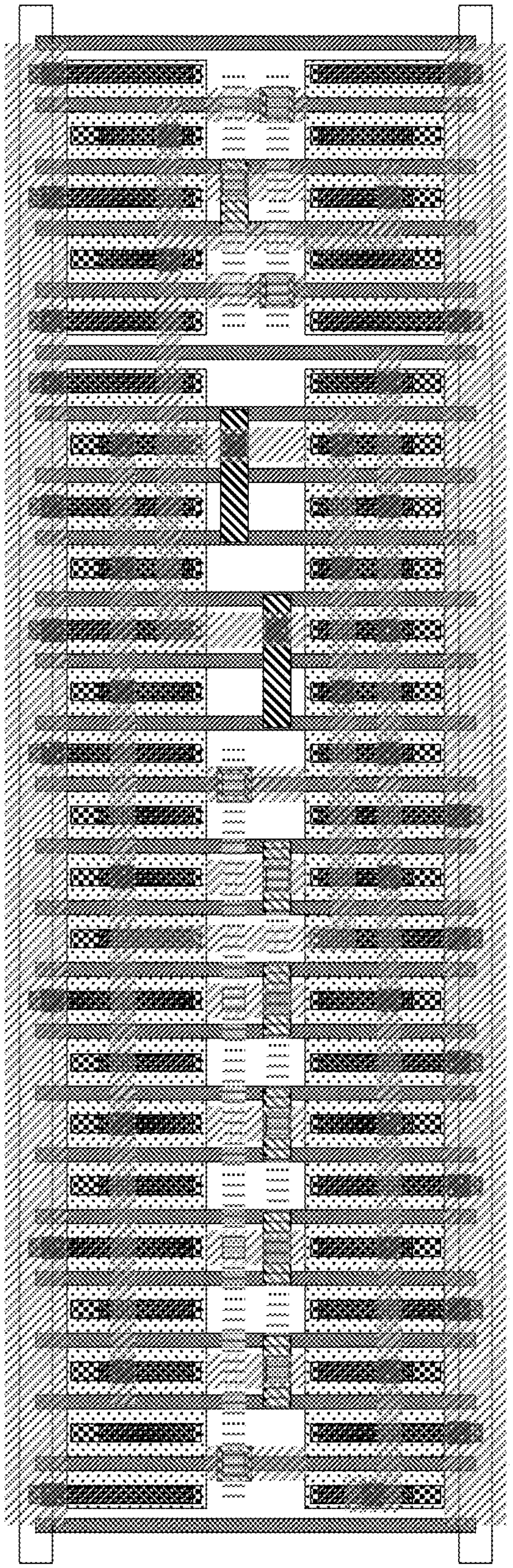
FIG. 320 depicts an IOA22D6 cell.

Reference is made to FIG. 320, which depicts an IOA22D6 cell. This cell implements the logic function and(or(not(A),B),or(C,D)) in drive strength 6.

Figure 321:
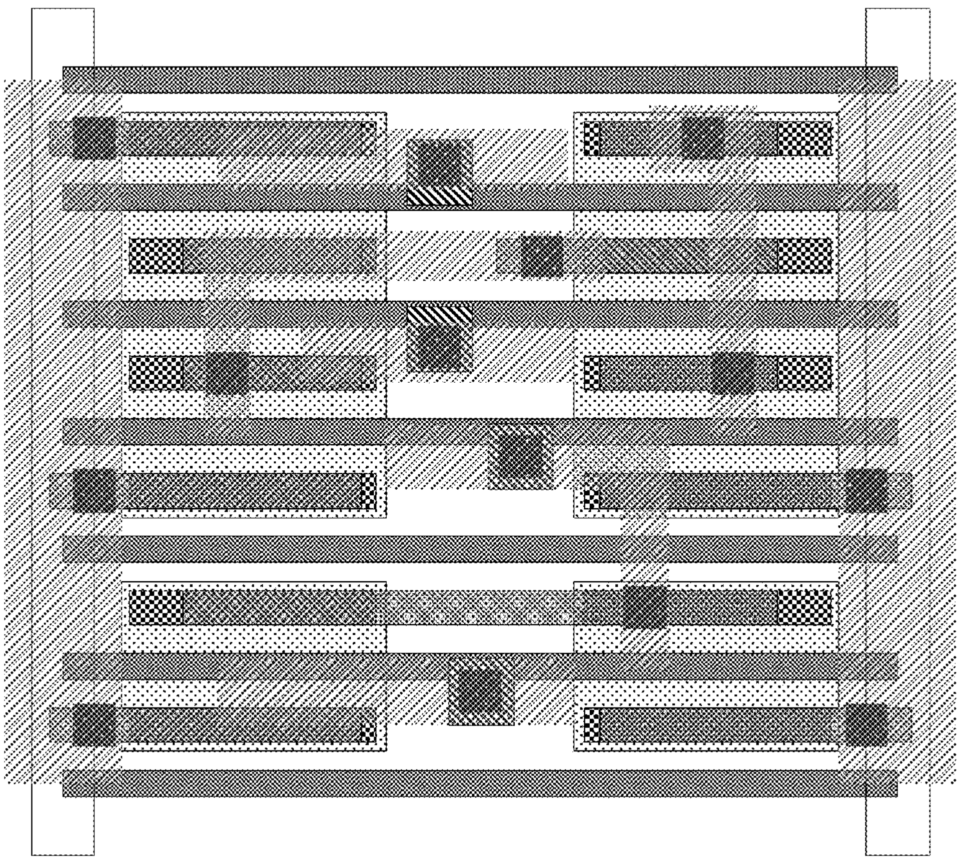
FIG. 321 depicts an IOAI21D1 cell.

Reference is made to FIG. 321, which depicts an IOAI21D1 cell. This cell implements the logic function nand(or(not(A),B),C) in drive strength 1.

Figure 322:
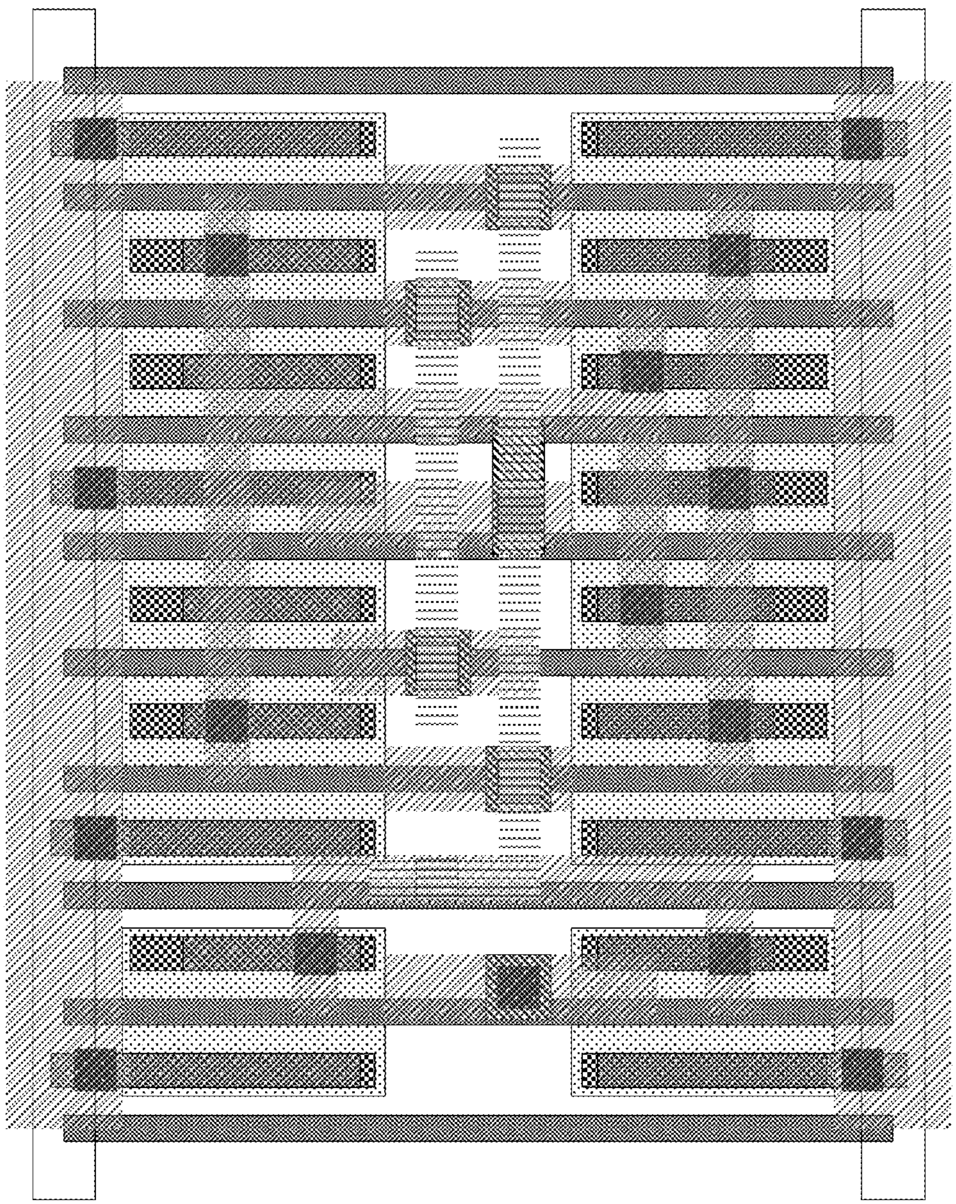
FIG. 322 depicts an IOAI21D2 cell.

Reference is made to FIG. 322, which depicts an IOAI21D2 cell. This cell implements the logic function nand(or(not(A),B),C) in drive strength 2.

Figure 323:
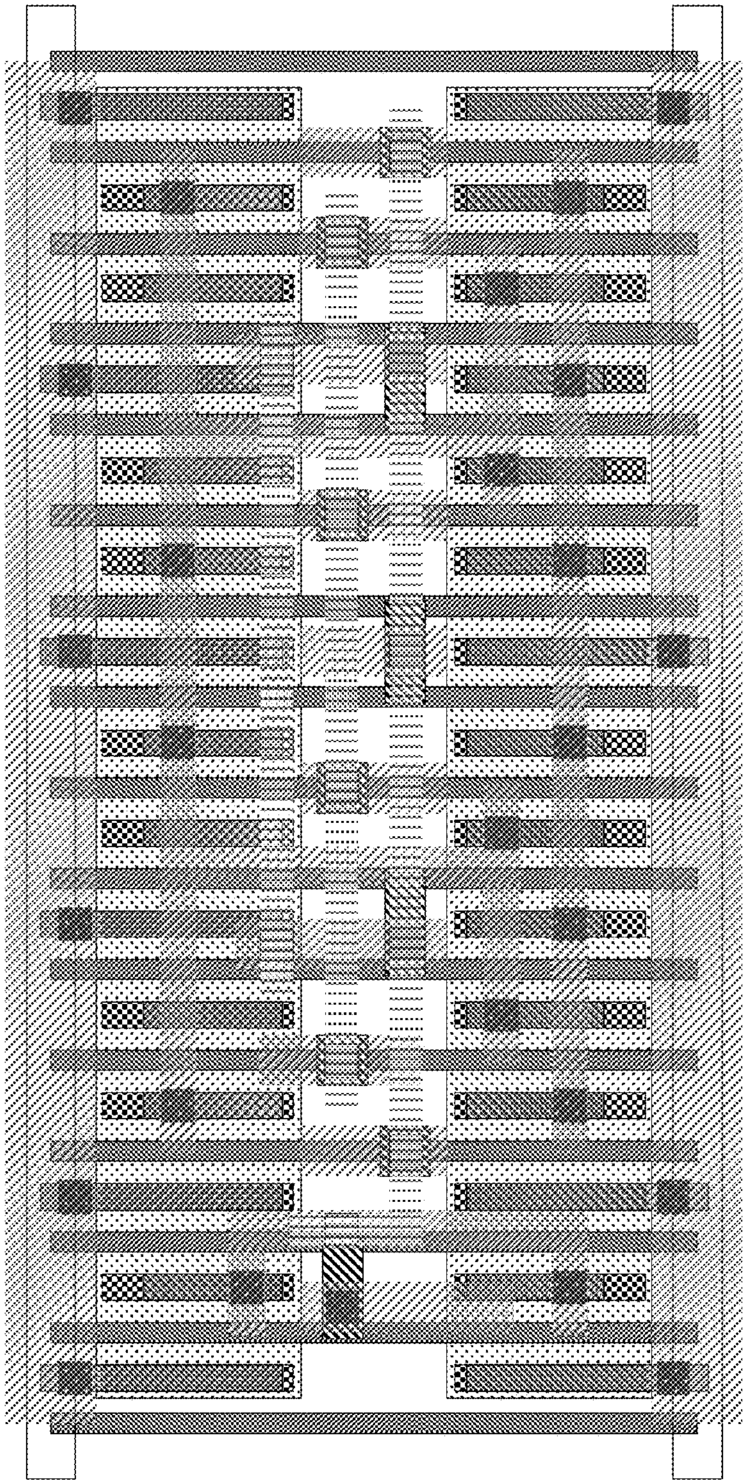
FIG. 323 depicts an IOAI21D4 cell.

Reference is made to FIG. 323, which depicts an IOAI21D4 cell. This cell implements the logic function nand(or(not(A),B),C) in drive strength 4.

Figure 324:
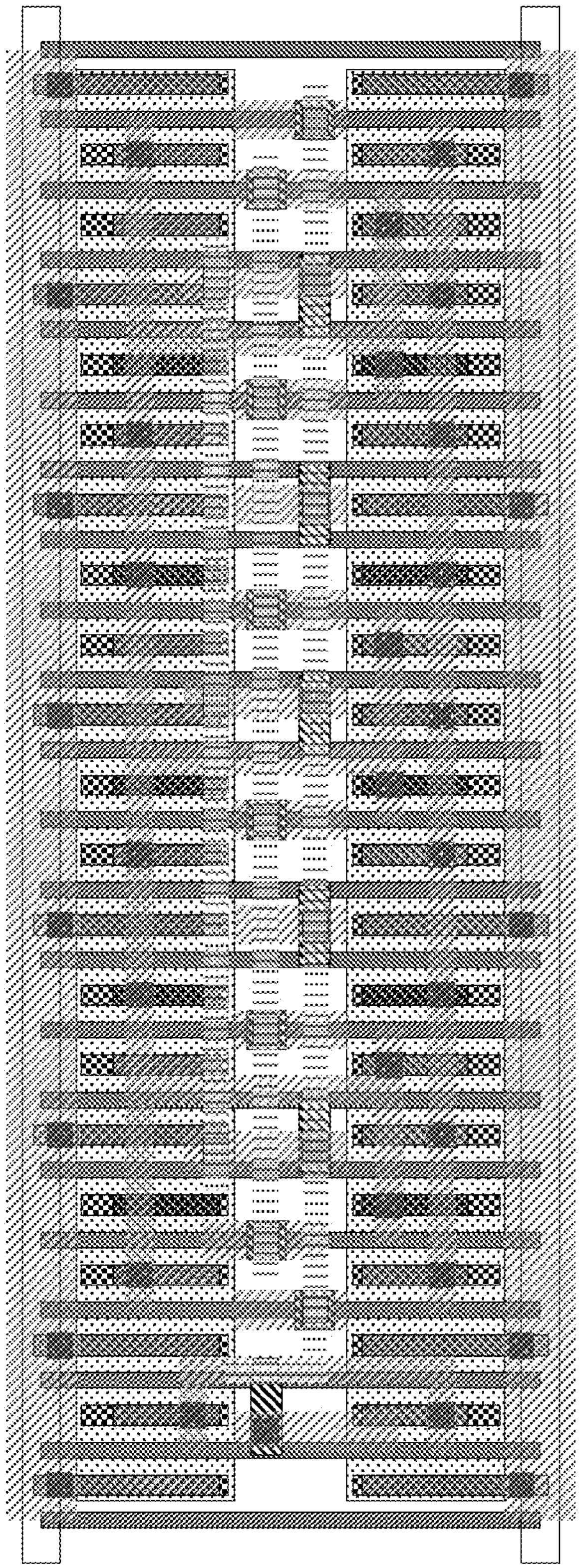
FIG. 324 depicts an IOAI21D6 cell.

Reference is made to FIG. 324, which depicts an IOAI21D6 cell. This cell implements the logic function nand(or(not(A),B),C) in drive strength 6.

Figure 325:
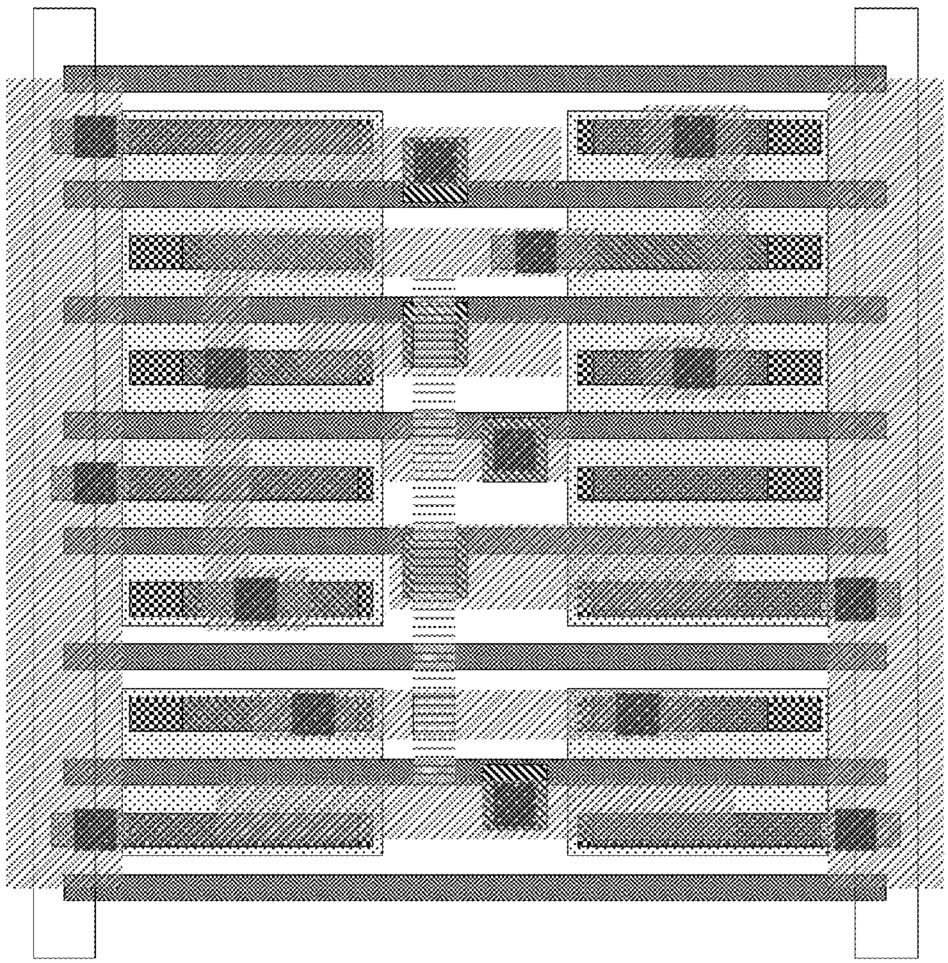
FIG. 325 depicts an IOAI211D1 cell.

Reference is made to FIG. 325, which depicts an IOAI211D1 cell. This cell implements the logic function nand(or(not(A),B),C,D) in drive strength 1.

Figure 326:
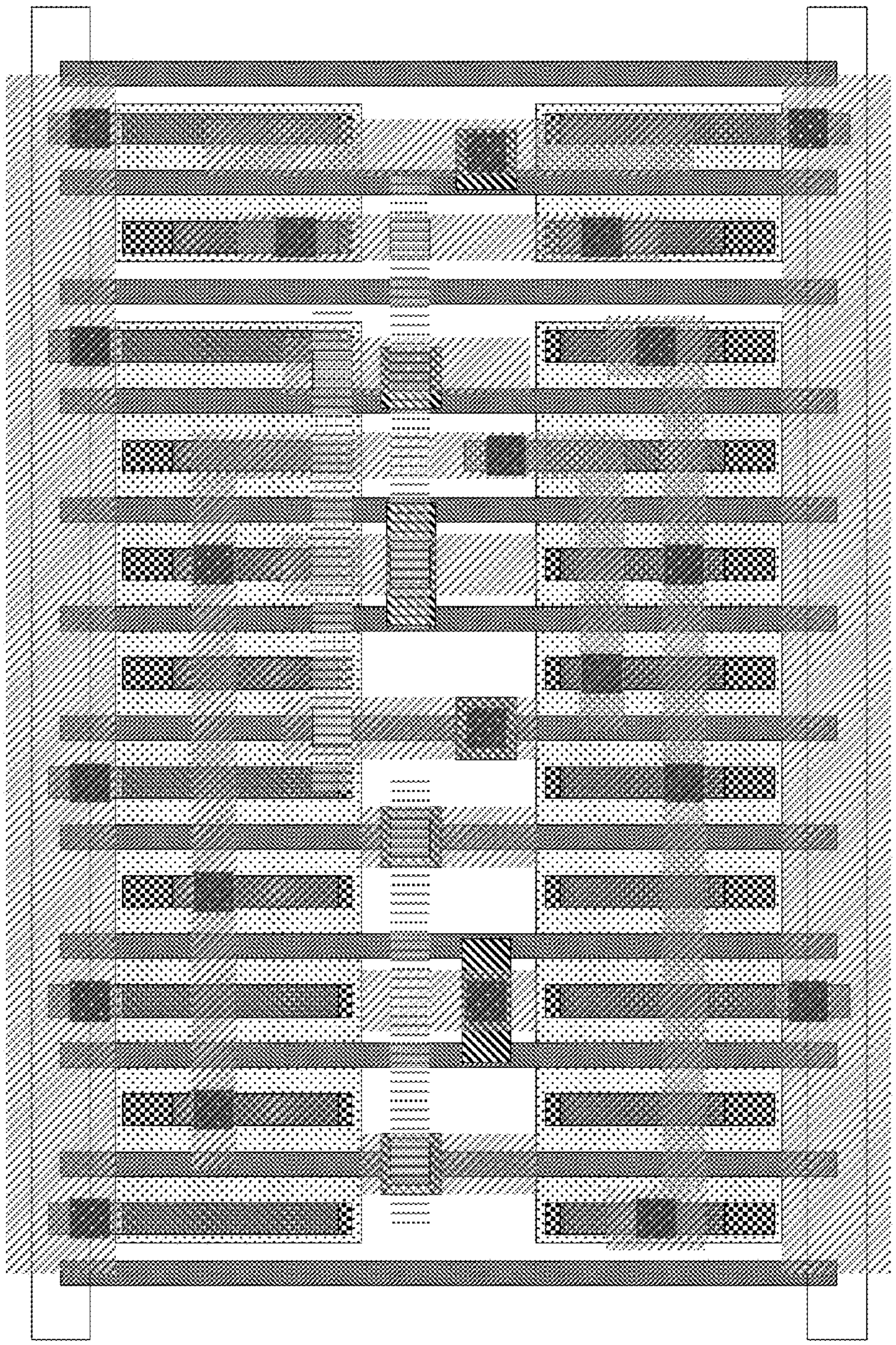
FIG. 326 depicts an IOAI211D2 cell.

Reference is made to FIG. 326, which depicts an IOAI211D2 cell. This cell implements the logic function nand(or(not(A),B),C,D) in drive strength 2.

Figure 327:
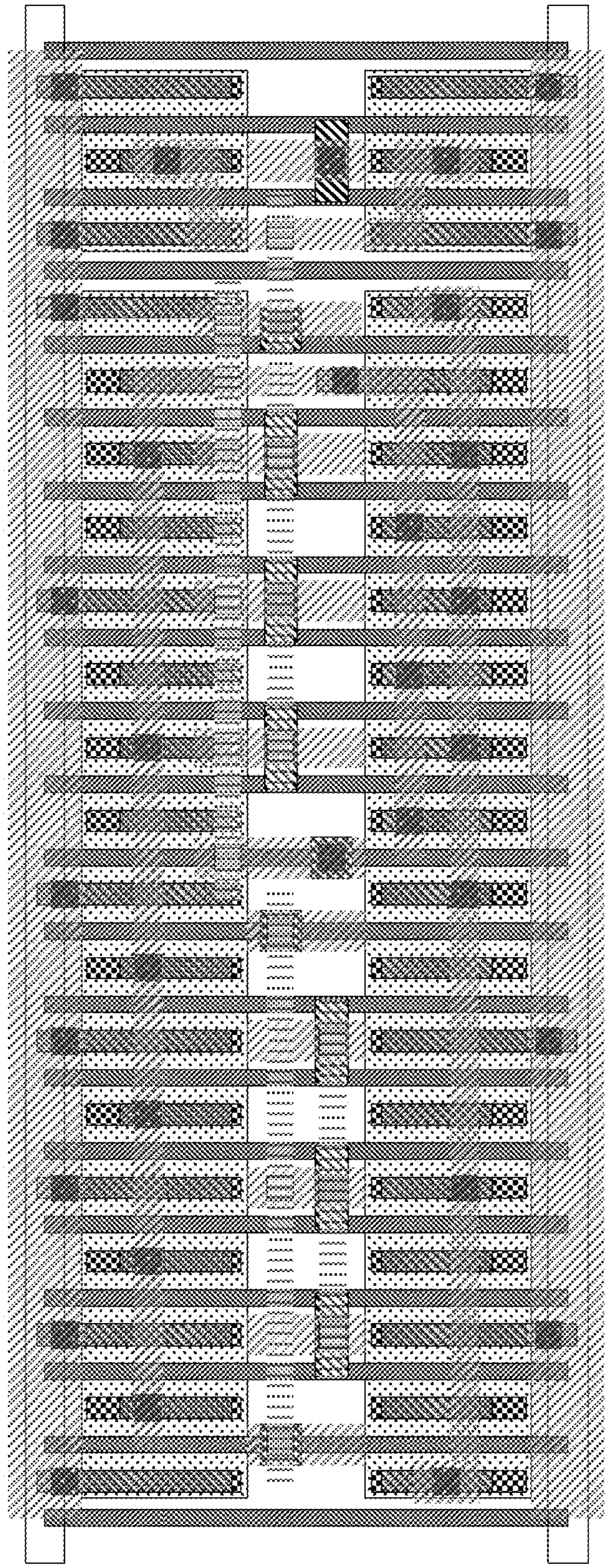
FIG. 327 depicts an IOAI211D4 cell.

Reference is made to FIG. 327, which depicts an IOAI211D4 cell. This cell implements the logic function nand(or(not(A),B),C,D) in drive strength 4.

Figure 328:
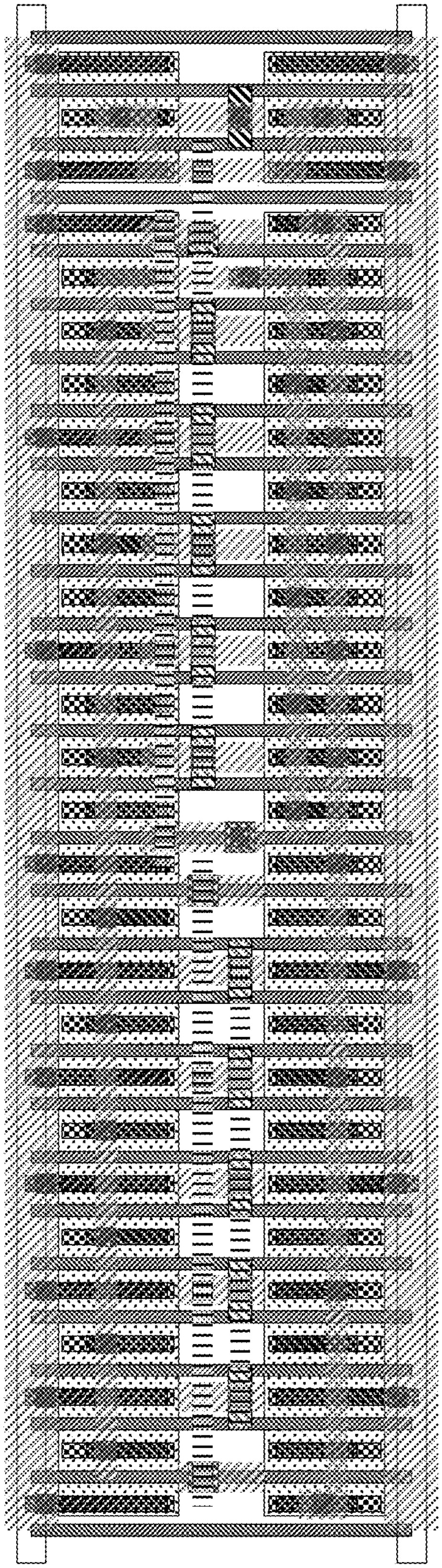
FIG. 328 depicts an IOAI211D6 cell.

Reference is made to FIG. 328, which depicts an IOAI211D6 cell. This cell implements the logic function nand(or(not(A),B),C,D) in drive strength 6.

Figure 329:
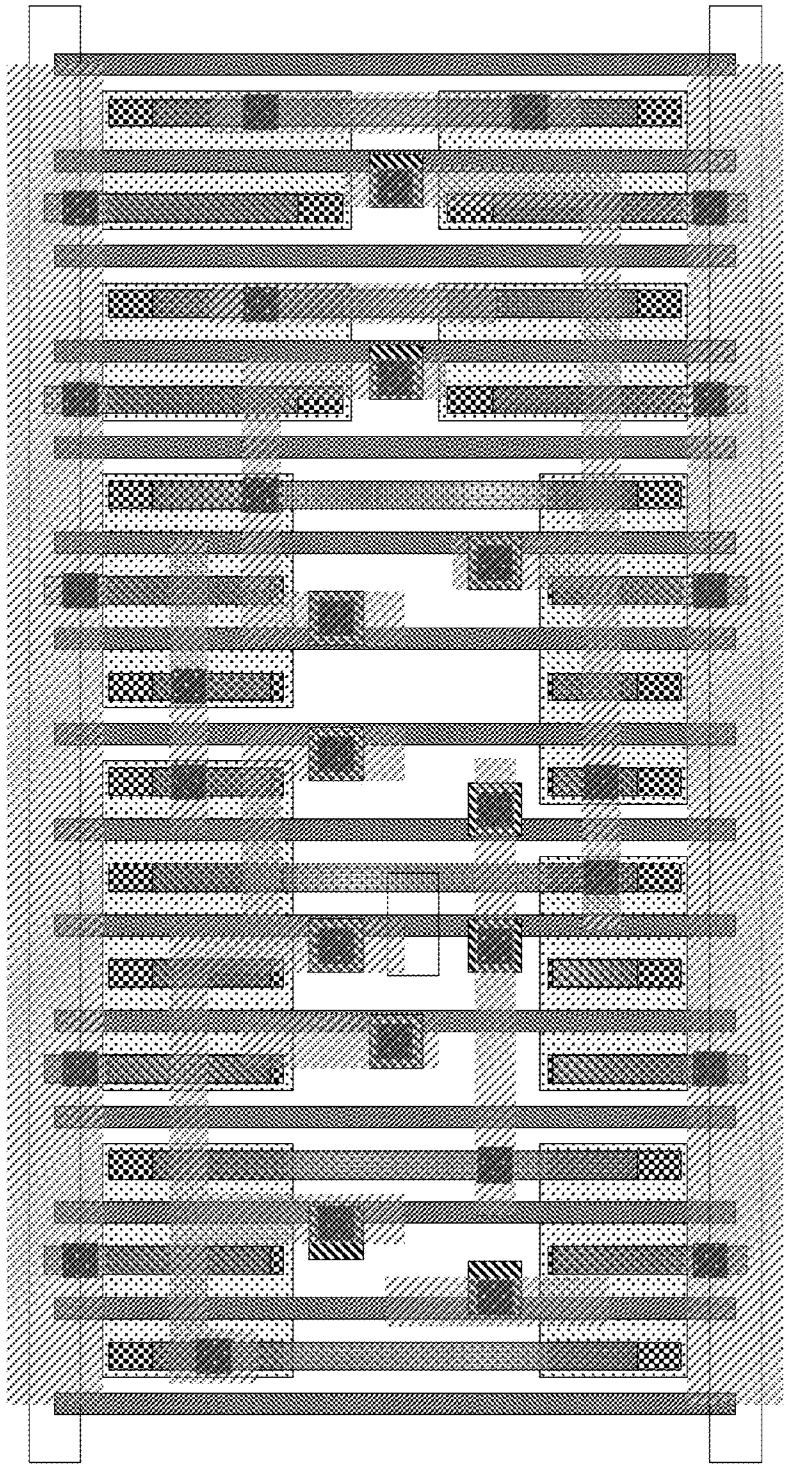
FIG. 329 depicts an LHD1 cell.

Reference is made to FIG. 329, which depicts an LHD1 cell. This cell implements the function of a latch in drive strength 1.

Figure 330:
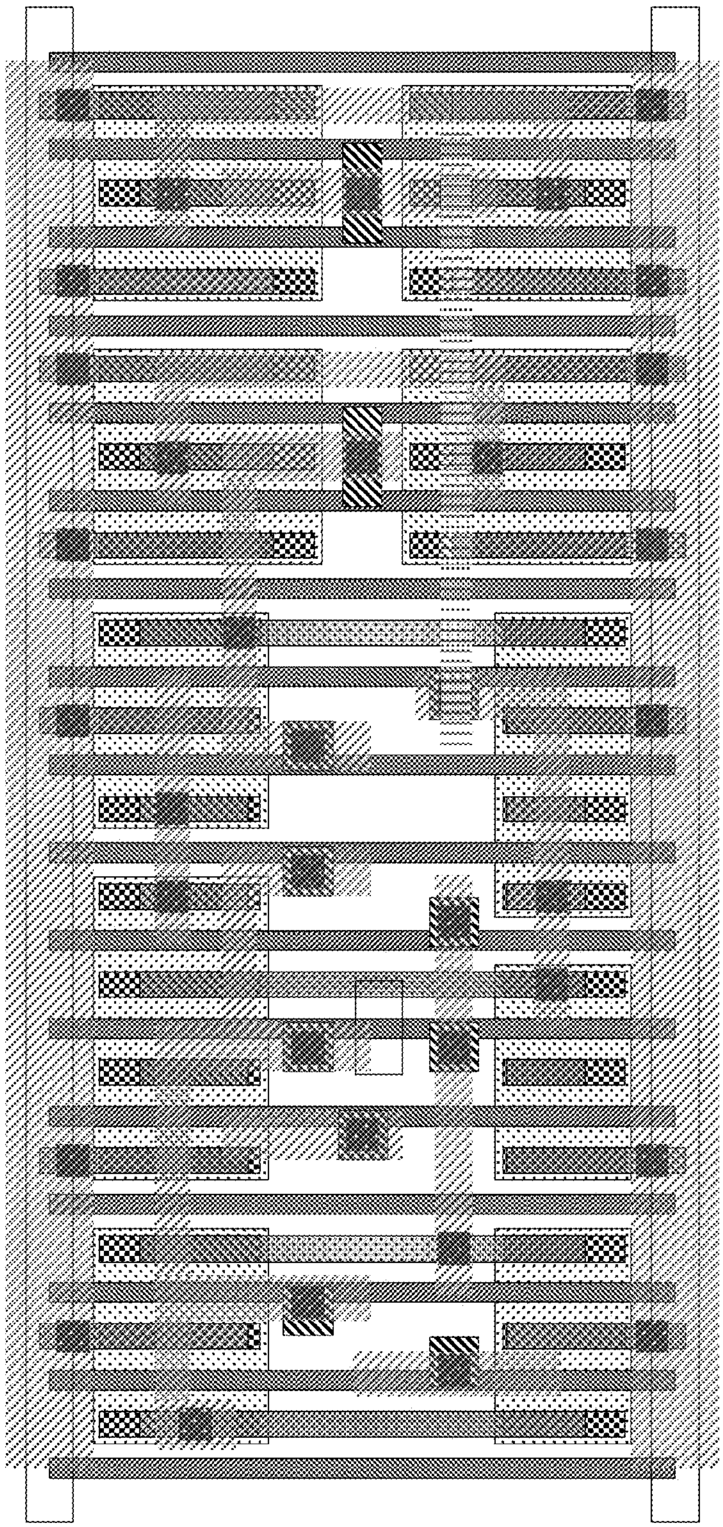
FIG. 330 depicts an LHD2 cell.

Reference is made to FIG. 330, which depicts an LHD2 cell. This cell implements the function of a latch in drive strength 2.

Figure 331:
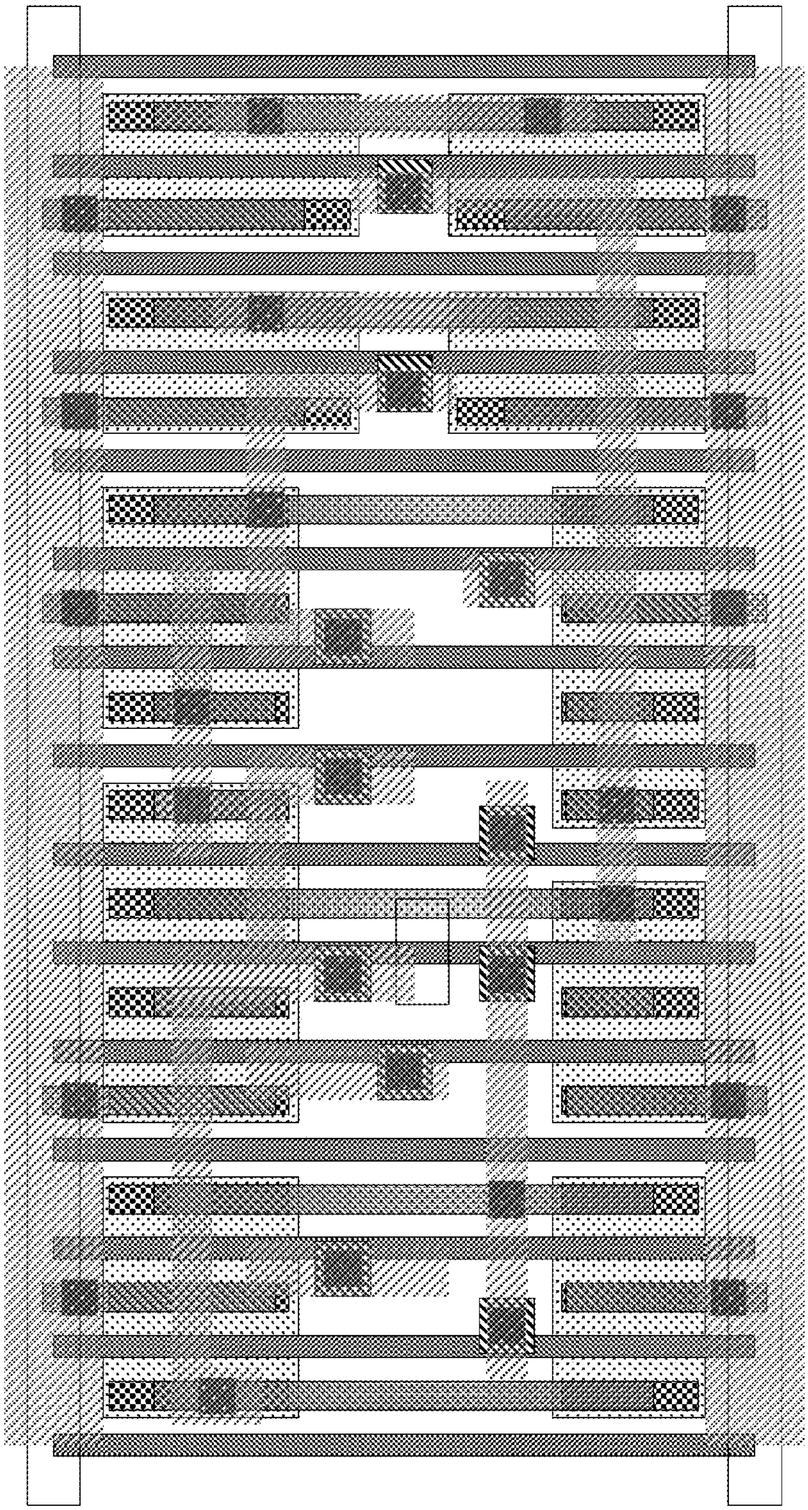
FIG. 331 depicts an LND1 cell.

Reference is made to FIG. 331, which depicts an LND1 cell. This cell implements the function of a latch in drive strength 1.

Figure 332:
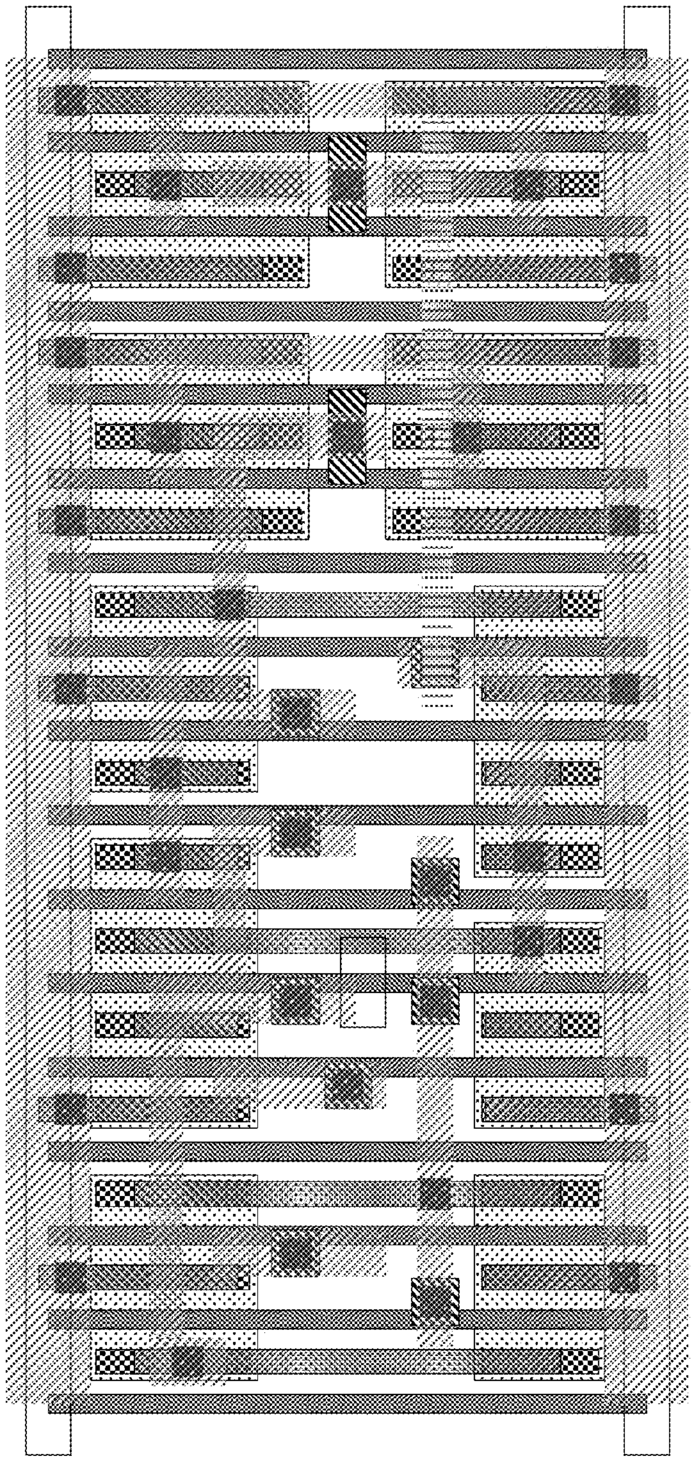
FIG. 332 depicts an LND2 cell.

Reference is made to FIG. 332, which depicts an LND2 cell. This cell implements the function of a latch in drive strength 2.

Figure 333:
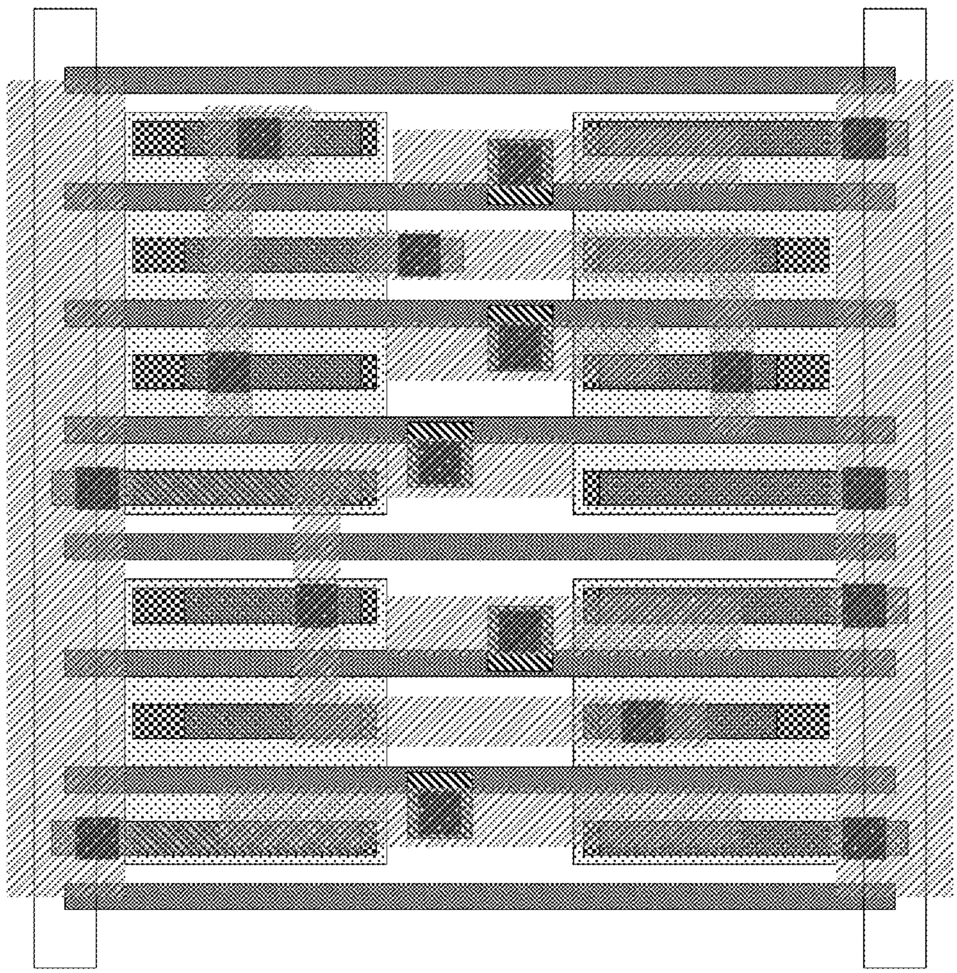
FIG. 333 depicts an MAOI22D1 cell.

Reference is made to FIG. 333, which depicts an MAOI22D1 cell. This cell implements the logic function nor(and(A,B),and(C,D)) in drive strength 1.

Figure 334:
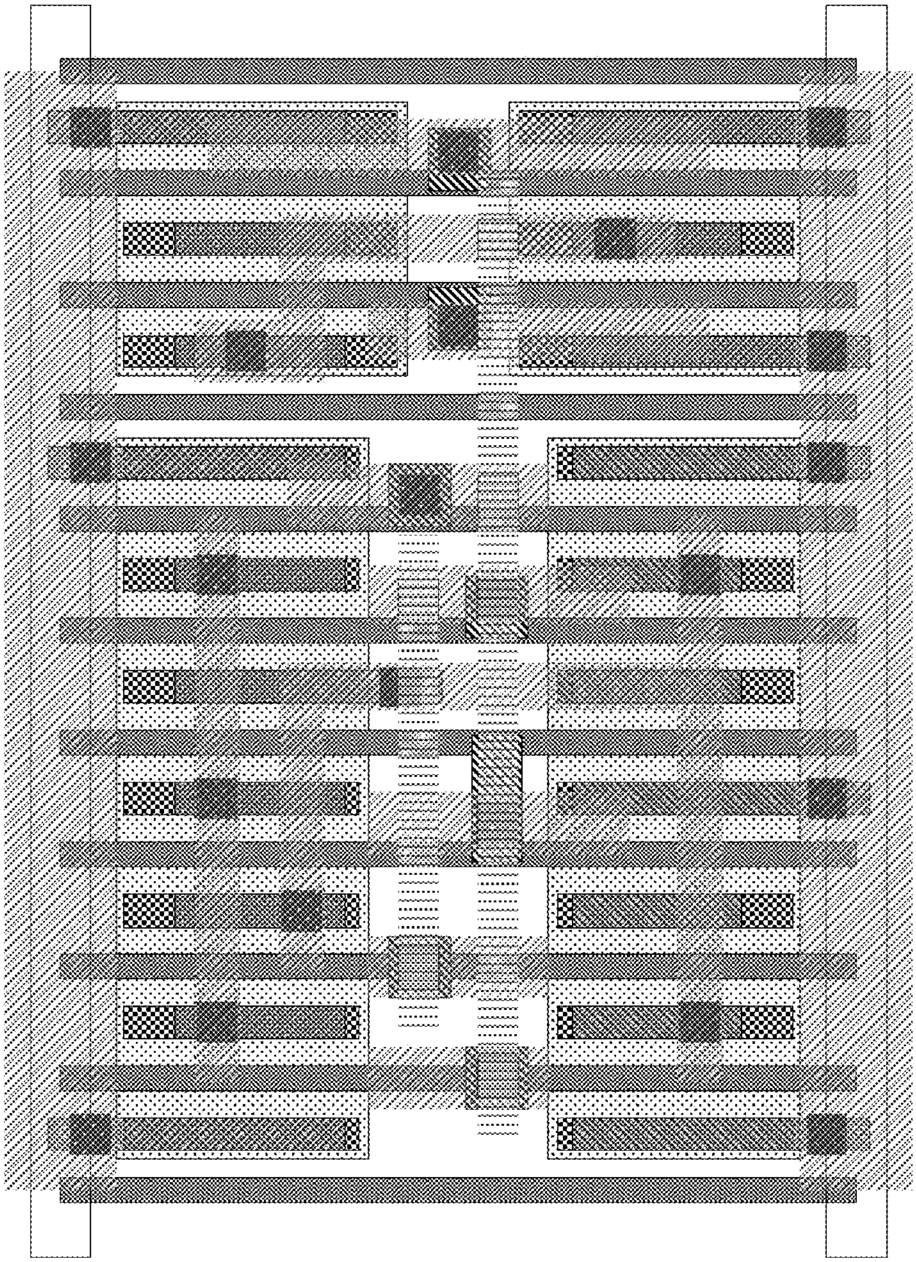
FIG. 334 depicts an MAOI22D2 cell.

Reference is made to FIG. 334, which depicts an MAOI22D2 cell. This cell implements the logic function nor(and(A,B),and(C,D)) in drive strength 2.

Figure 335:
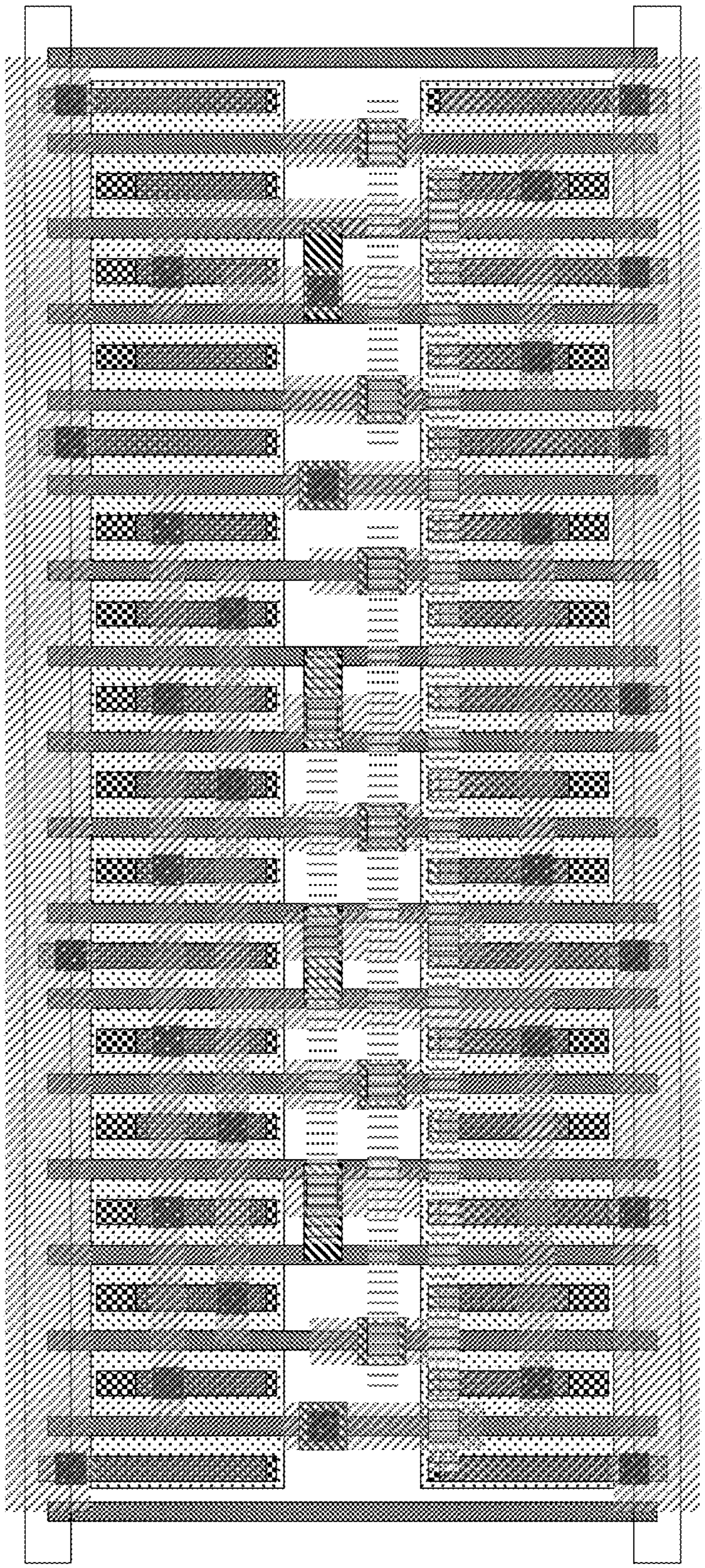
FIG. 335 depicts an MAOI22D4 cell.

Reference is made to FIG. 335, which depicts an MAOI22D4 cell. This cell implements the logic function nor(and(A,B),and(C,D)) in drive strength 4.

Figure 336:
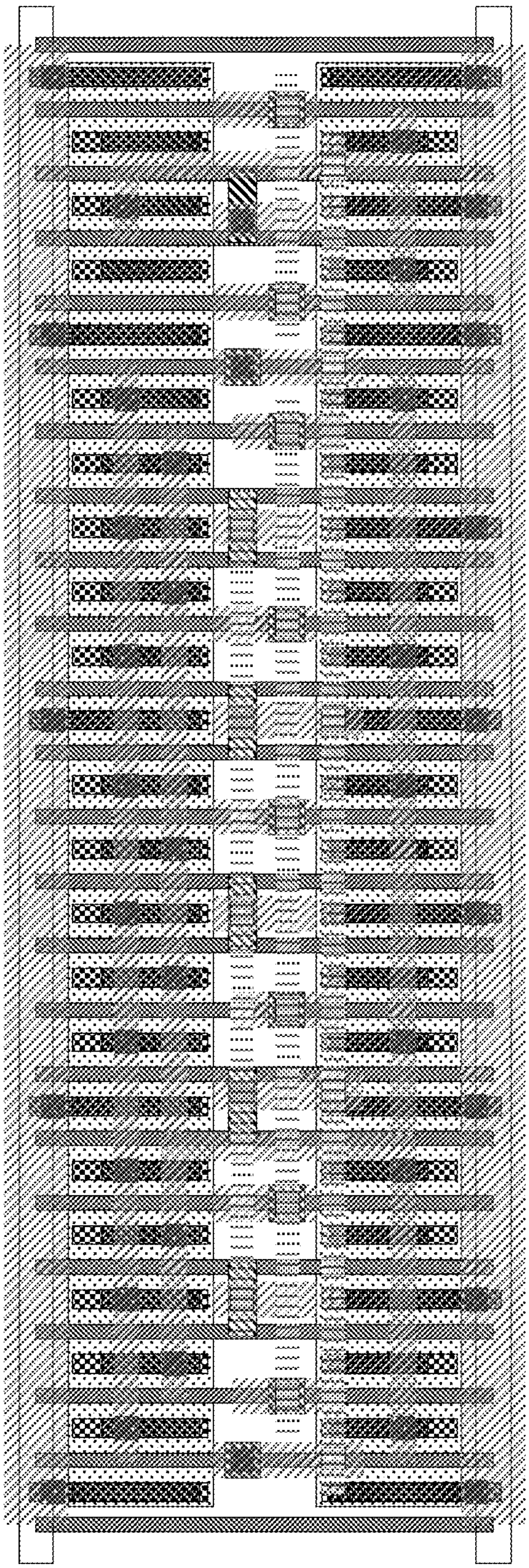
FIG. 336 depicts an MAOI22D6 cell.

Reference is made to FIG. 336, which depicts an MAOI22D6 cell. This cell implements the logic function nor(and(A,B),and(C,D)) in drive strength 6.

Figure 337:
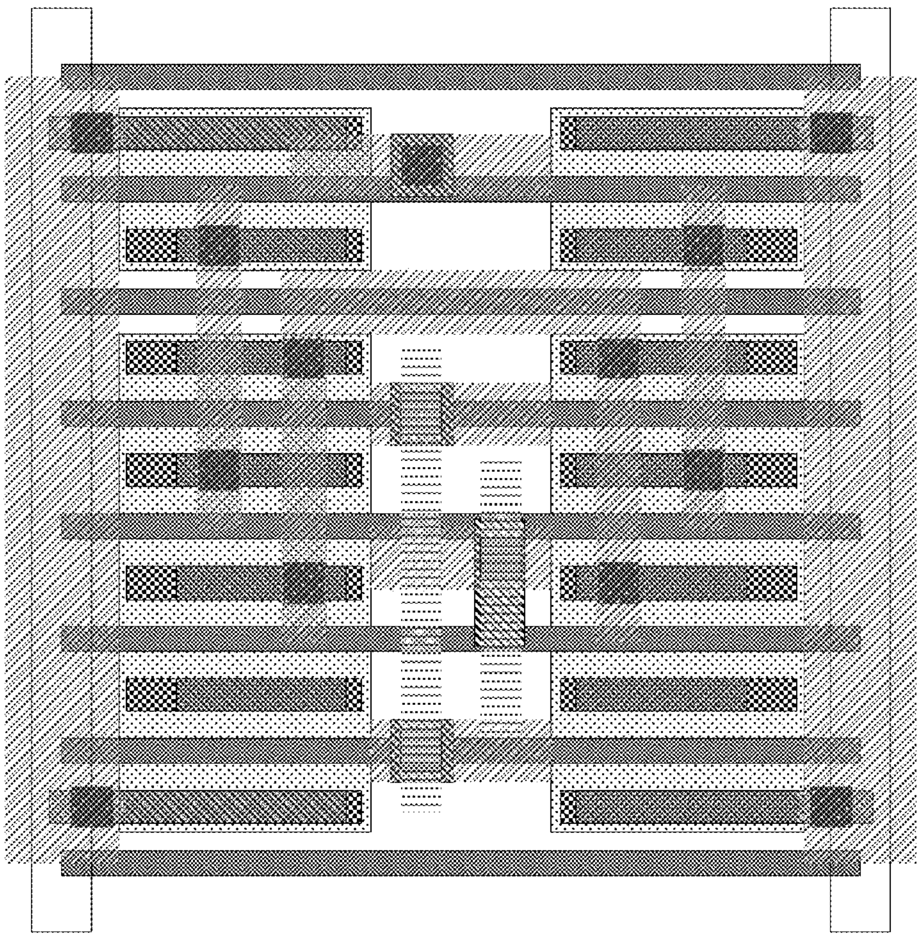
FIG. 337 depicts an MAOI222D1 cell.

Reference is made to FIG. 337, which depicts an MAOI222D1 cell. This cell implements the logic function nor(and(A,B),and(C,D),and(E,F)) in drive strength 1.

Figure 338:
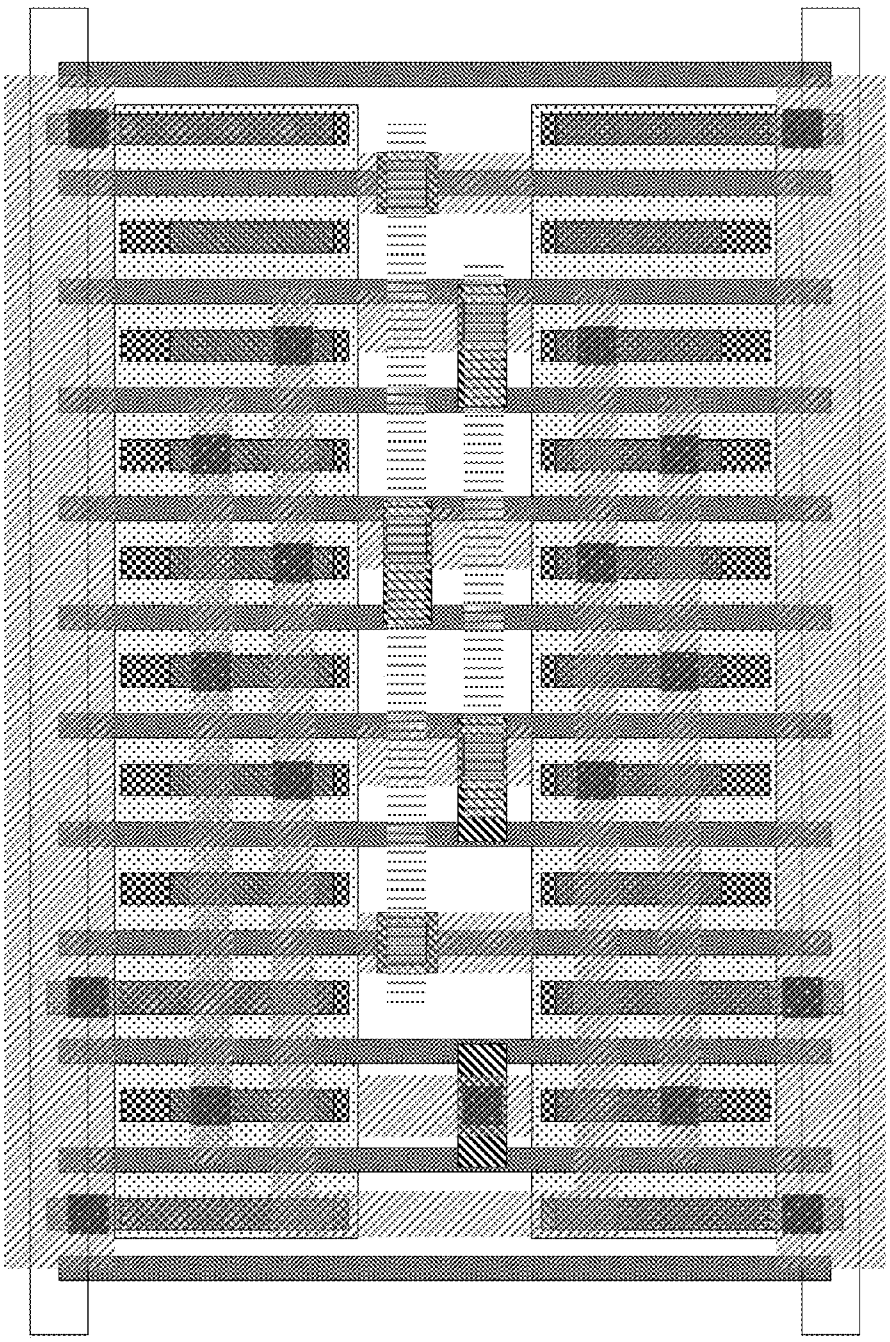
FIG. 338 depicts an MAOI222D2 cell.

Reference is made to FIG. 338, which depicts an MAOI222D2 cell. This cell implements the logic function nor(and(A,B),and(C,D),and(E,F)) in drive strength 2.

Figure 339:
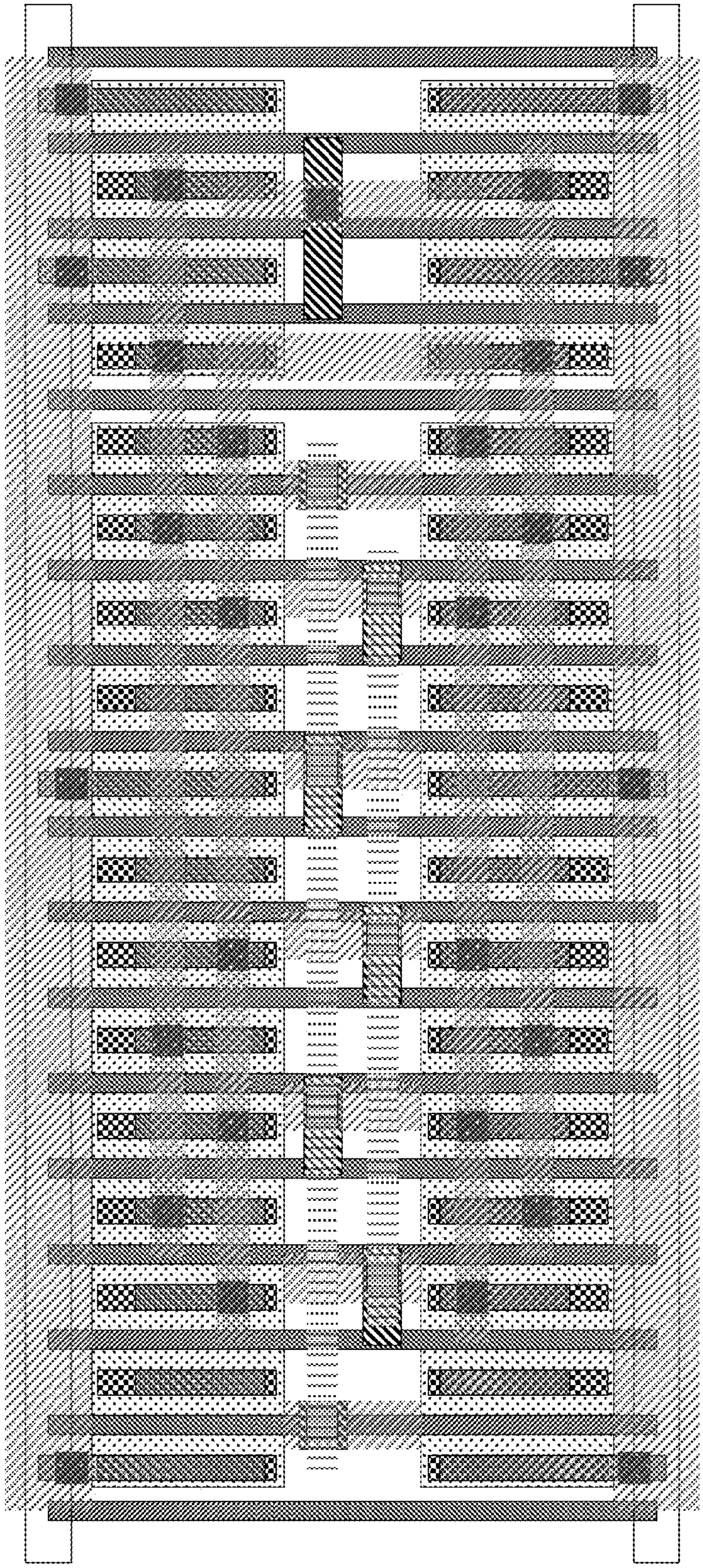
FIG. 339 depicts an MAOI222D3 cell.

Reference is made to FIG. 339, which depicts an MAOI222D3 cell. This cell implements the logic function nor(and(A,B),and(C,D),and(E,F)) in drive strength 3.

Figure 340:
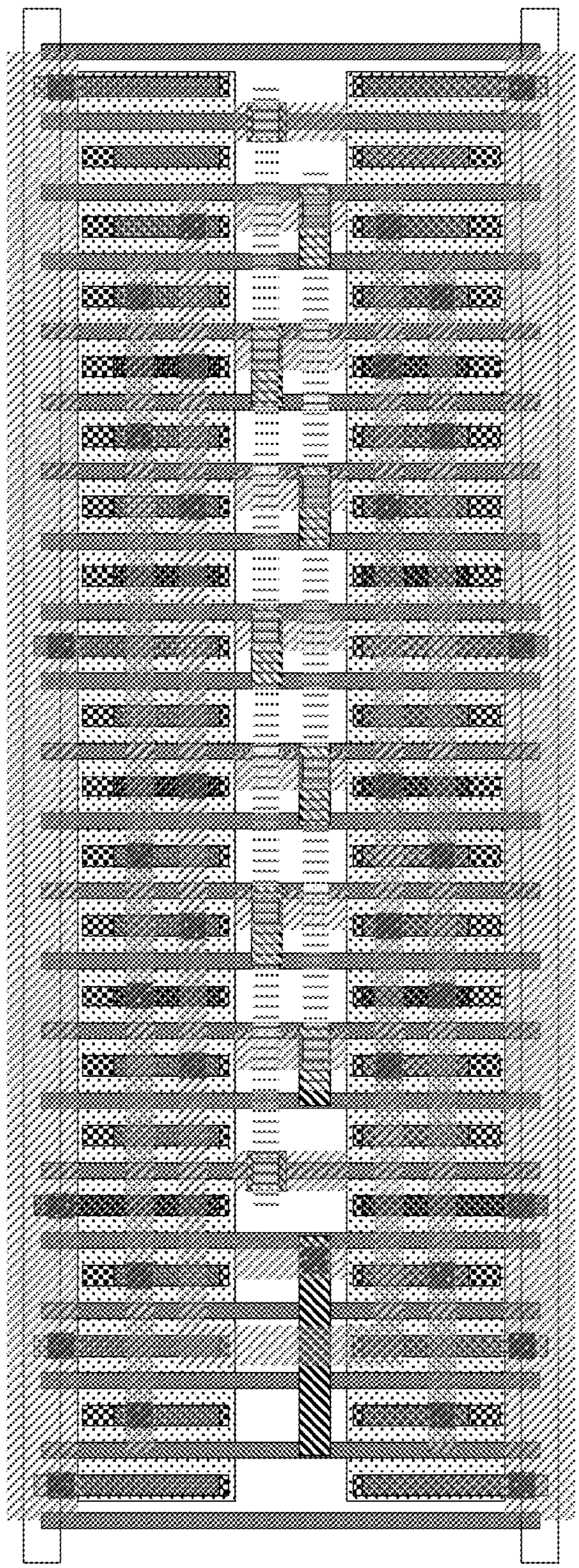
FIG. 340 depicts an MAOI222D4 cell.

Reference is made to FIG. 340, which depicts an MAOI222D4 cell. This cell implements the logic function nor(and(A,B),and(C,D),and(E,F)) in drive strength 4.

Figure 341:
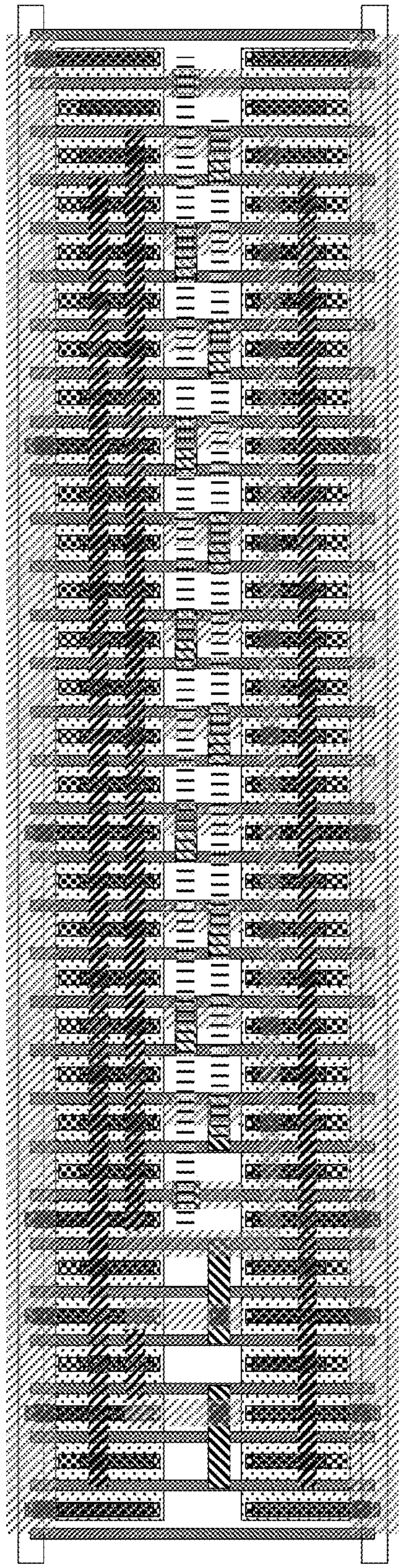
FIG. 341 depicts an MAOI222D6 cell.

Reference is made to FIG. 341, which depicts an MAOI222D6 cell. This cell implements the logic function nor(and(A,B),and(C,D),and(E,F)) in drive strength 6.

Figure 342:
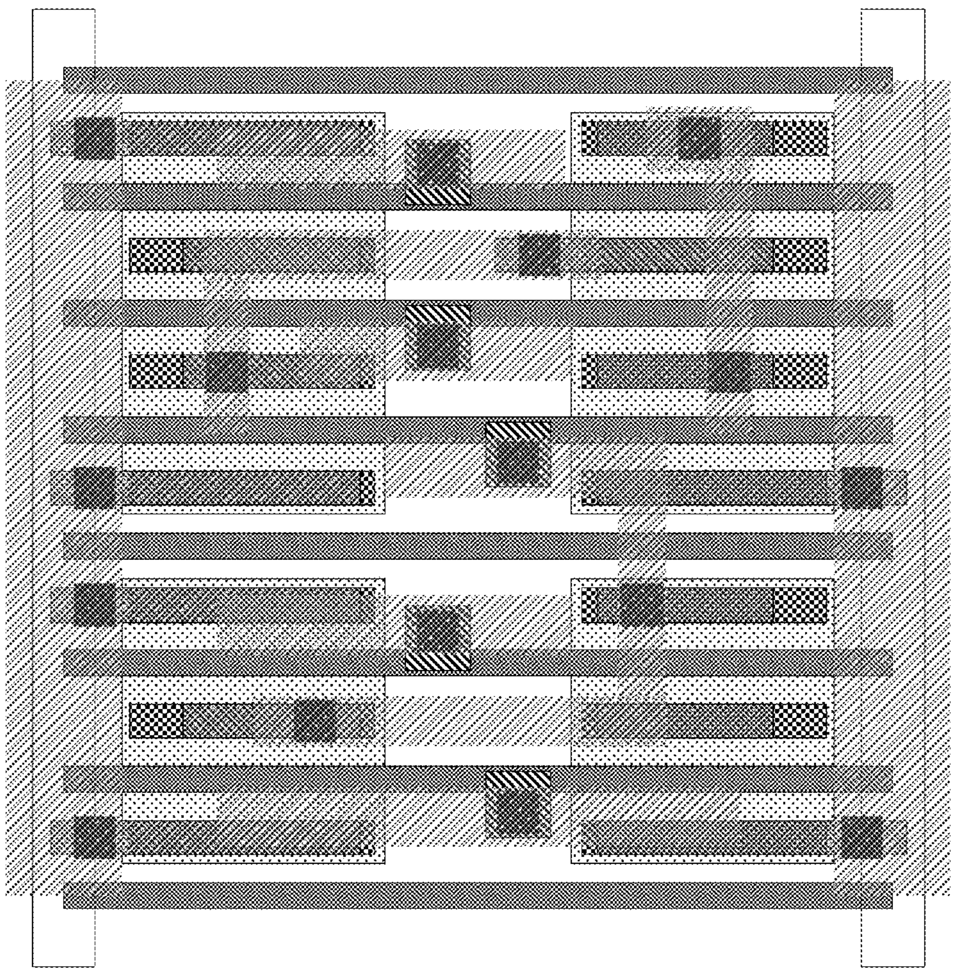
FIG. 342 depicts an MOAI22D1 cell.

Reference is made to FIG. 342, which depicts an MOAI22D1 cell. This cell implements the logic function nand(or(A,B),or(C,D)) in drive strength 1.

Figure 343:
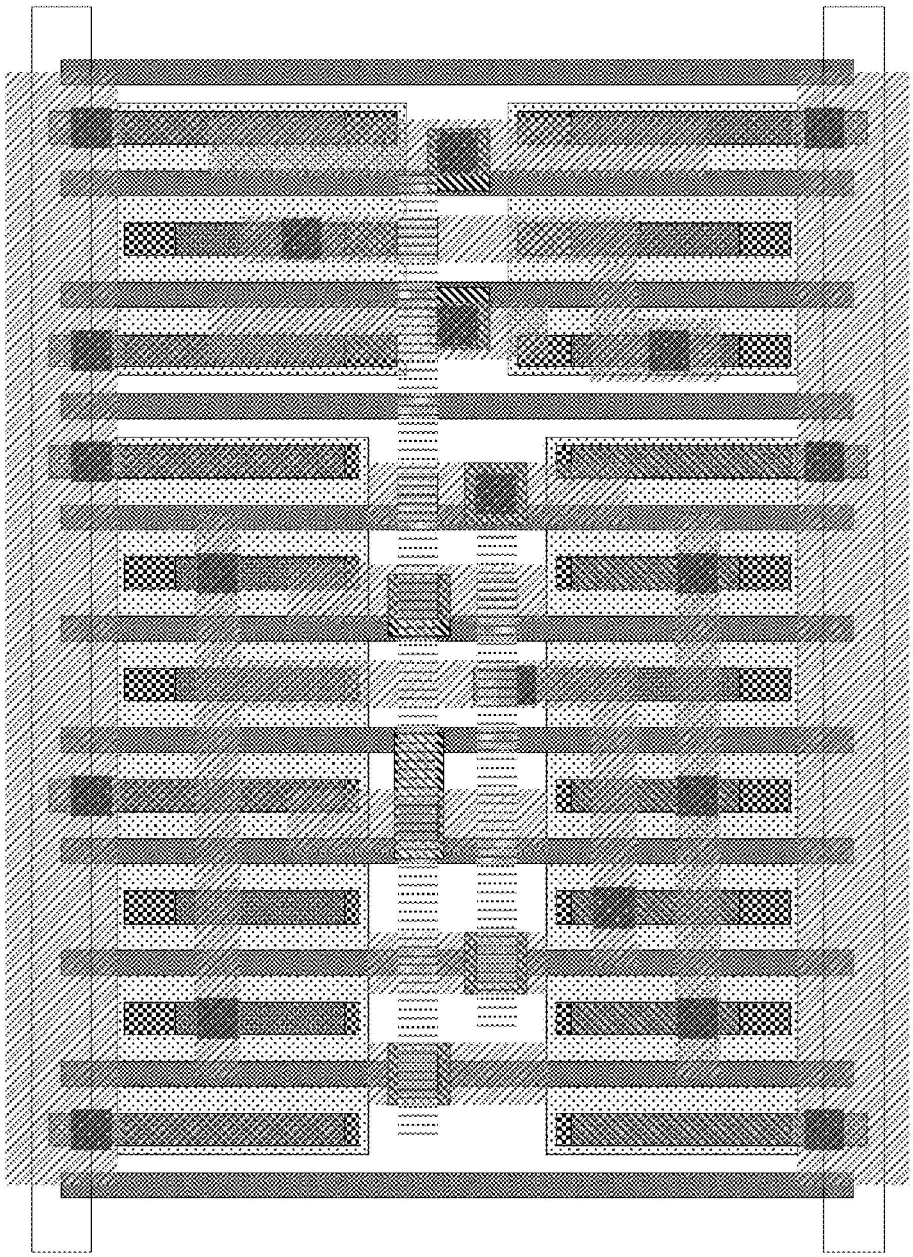
FIG. 343 depicts an MOAI22D2 cell.

Reference is made to FIG. 343, which depicts an MOAI22D2 cell. This cell implements the logic function nand(or(A,B),or(C,D)) in drive strength 2.

Figure 344:
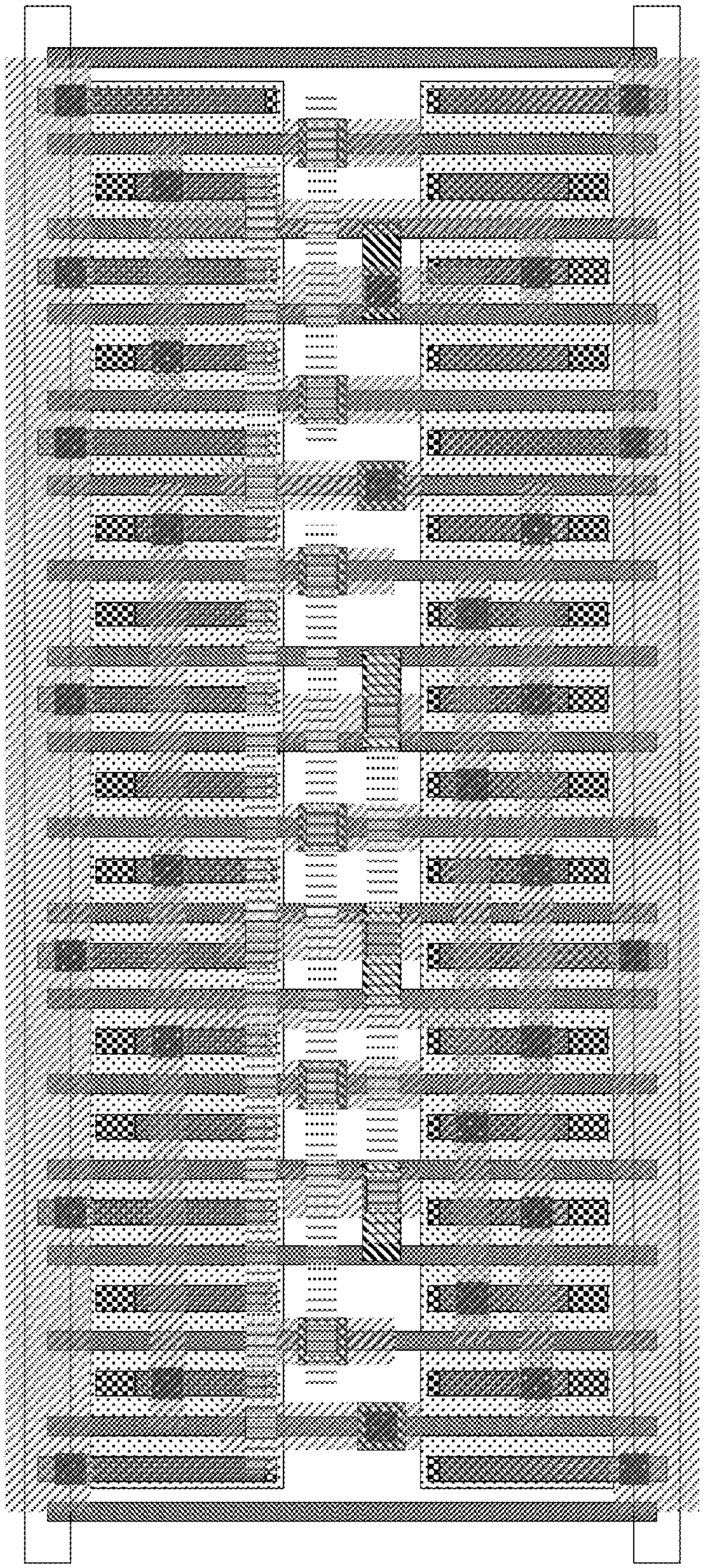
FIG. 344 depicts an MOAI22D4 cell.

Reference is made to FIG. 344, which depicts an MOAI22D4 cell. This cell implements the logic function nand(or(A,B),or(C,D)) in drive strength 4.

Figure 345:
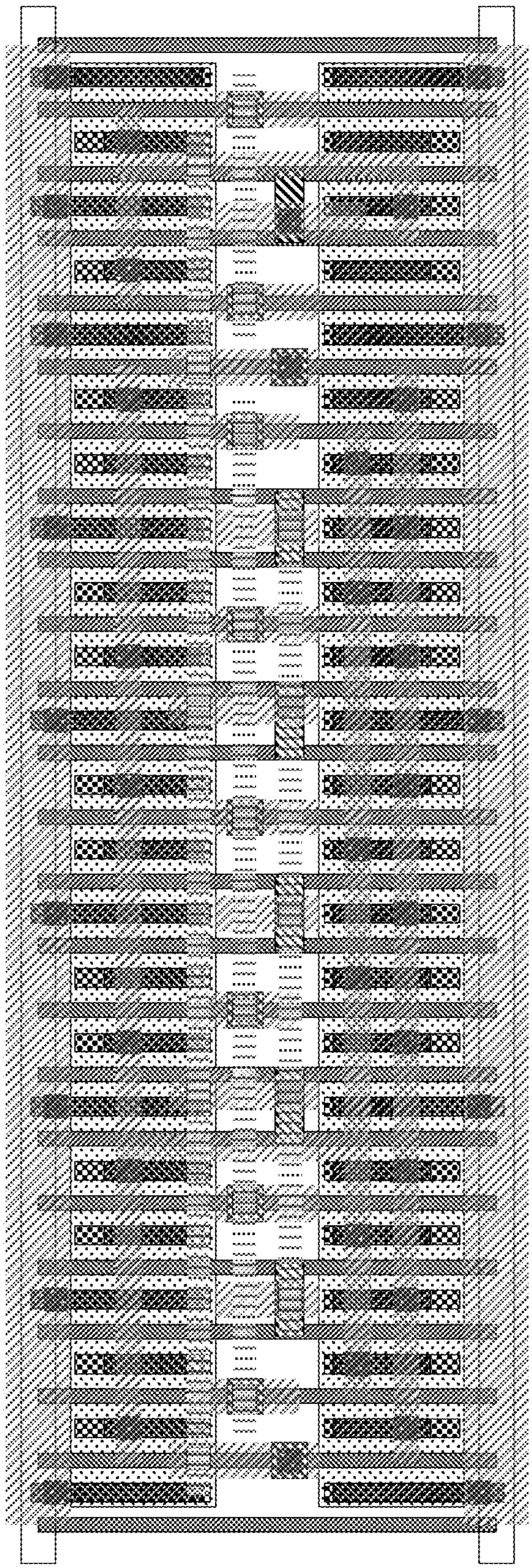
FIG. 345 depicts an MOAI22D6 cell.

Reference is made to FIG. 345, which depicts an MOAI22D6 cell. This cell implements the logic function nand(or(A,B),or(C,D)) in drive strength 6.

Figure 346:
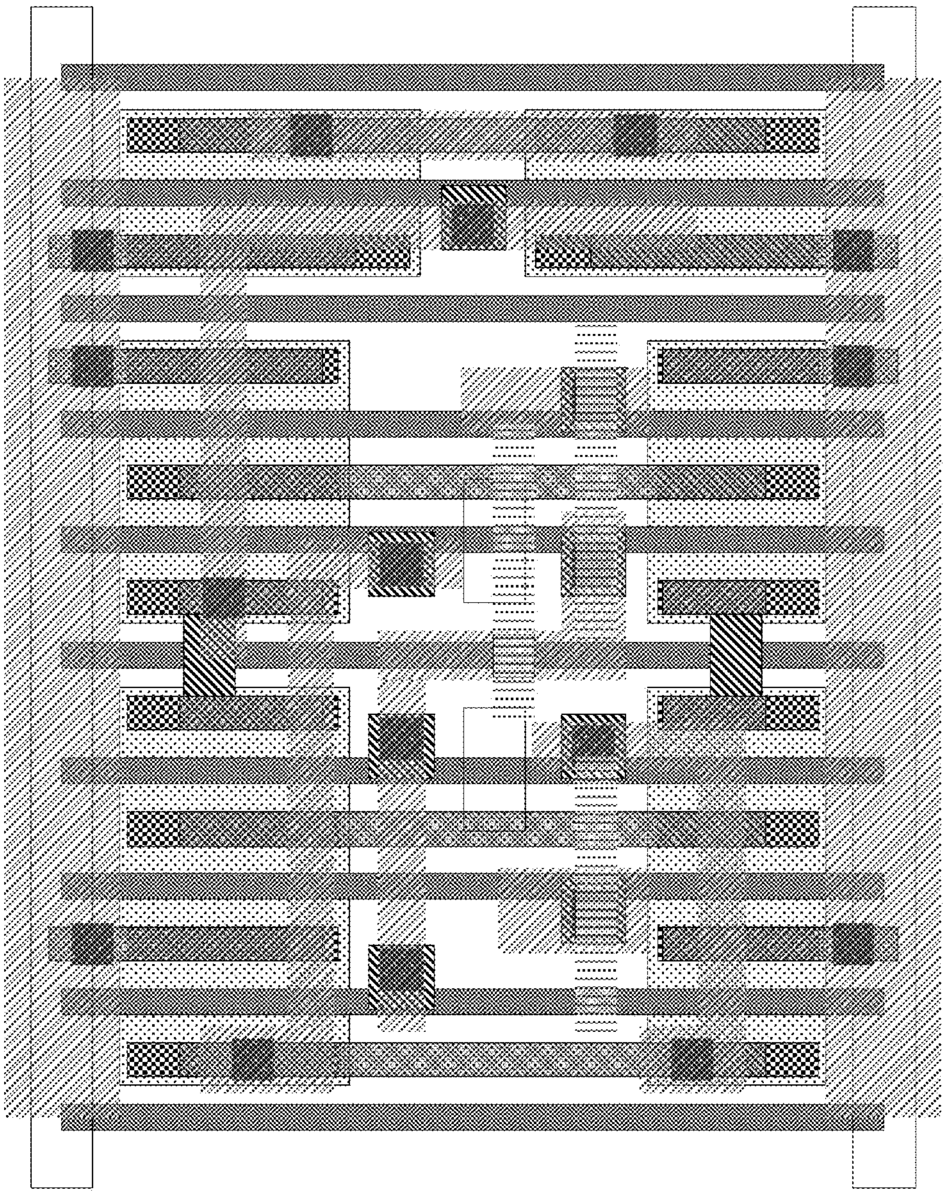
FIG. 346 depicts a MUX2D1 cell.

Reference is made to FIG. 346, which depicts a MUX2D1 cell. This cell implements a two-input multiplex function in drive strength 1.

Figure 347:
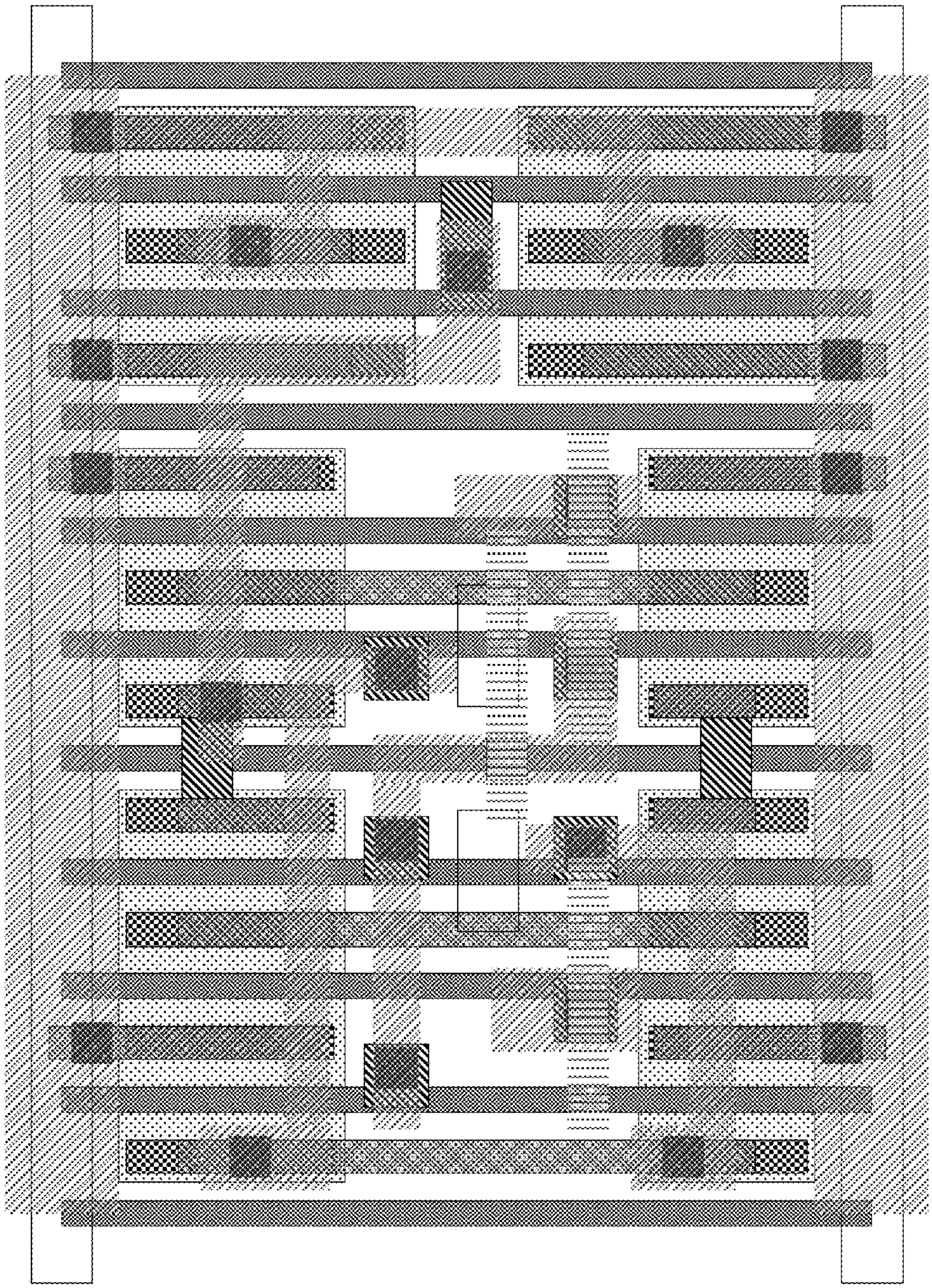
FIG. 347 depicts a MUX2D2 cell.

Reference is made to FIG. 347, which depicts a MUX2D2 cell. This cell implements a two-input multiplex function in drive strength 2.

Figure 348:
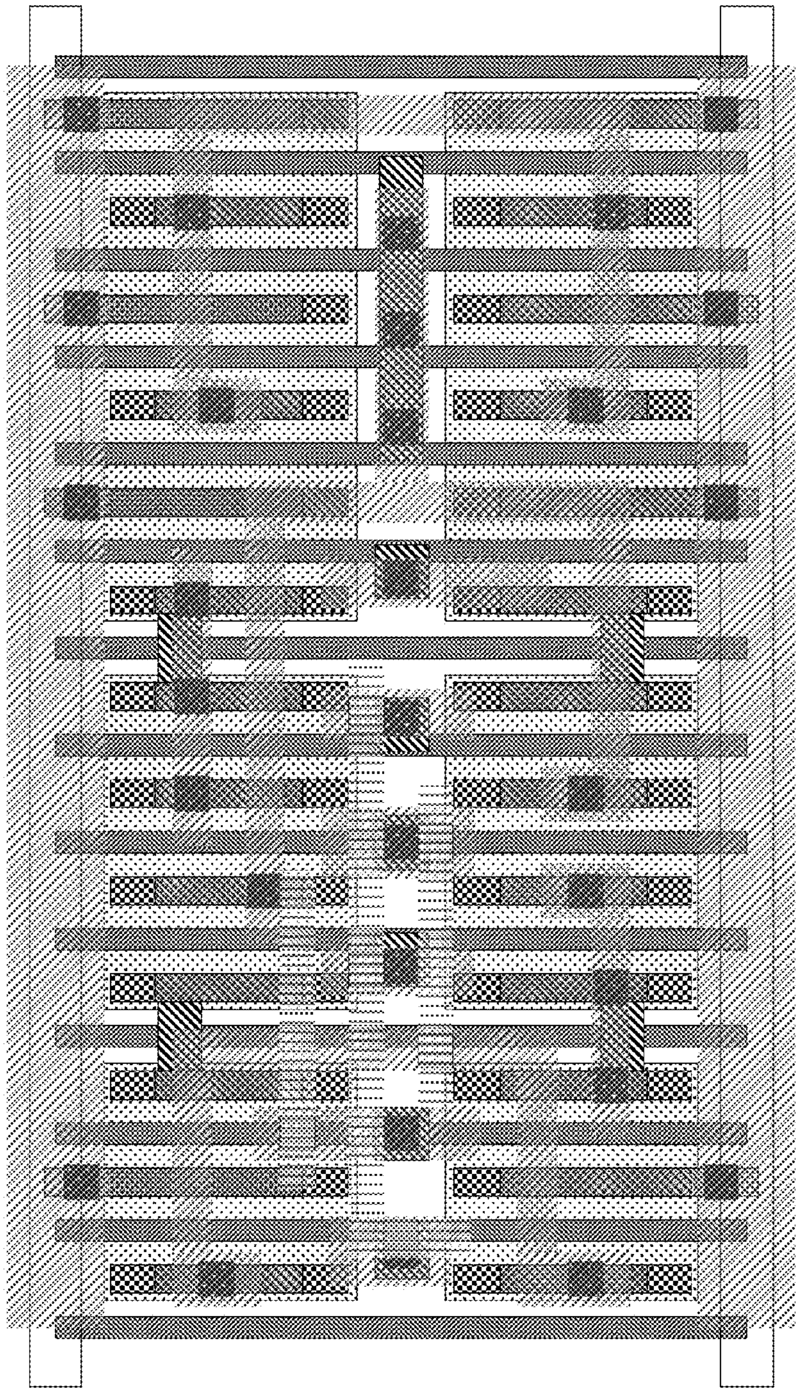
FIG. 348 depicts a MUX2D4 cell.

Reference is made to FIG. 348, which depicts a MUX2D4 cell. This cell implements a two-input multiplex function in drive strength 4.

Figure 349:
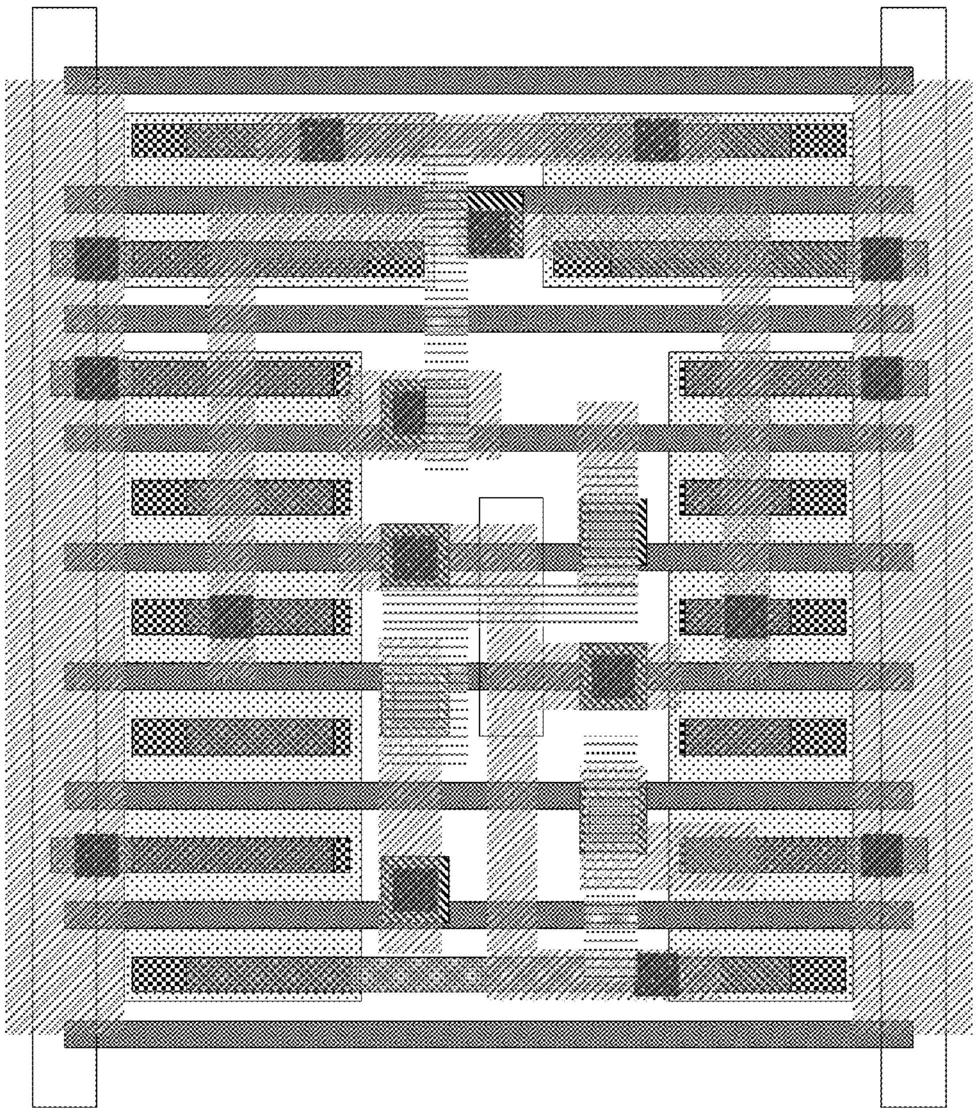
FIG. 349 depicts a MUX2HDD1 cell.

Reference is made to FIG. 349, which depicts a MUX2HDD1 cell. This cell implements a two-input multiplex function in drive strength 1.

Figure 350:
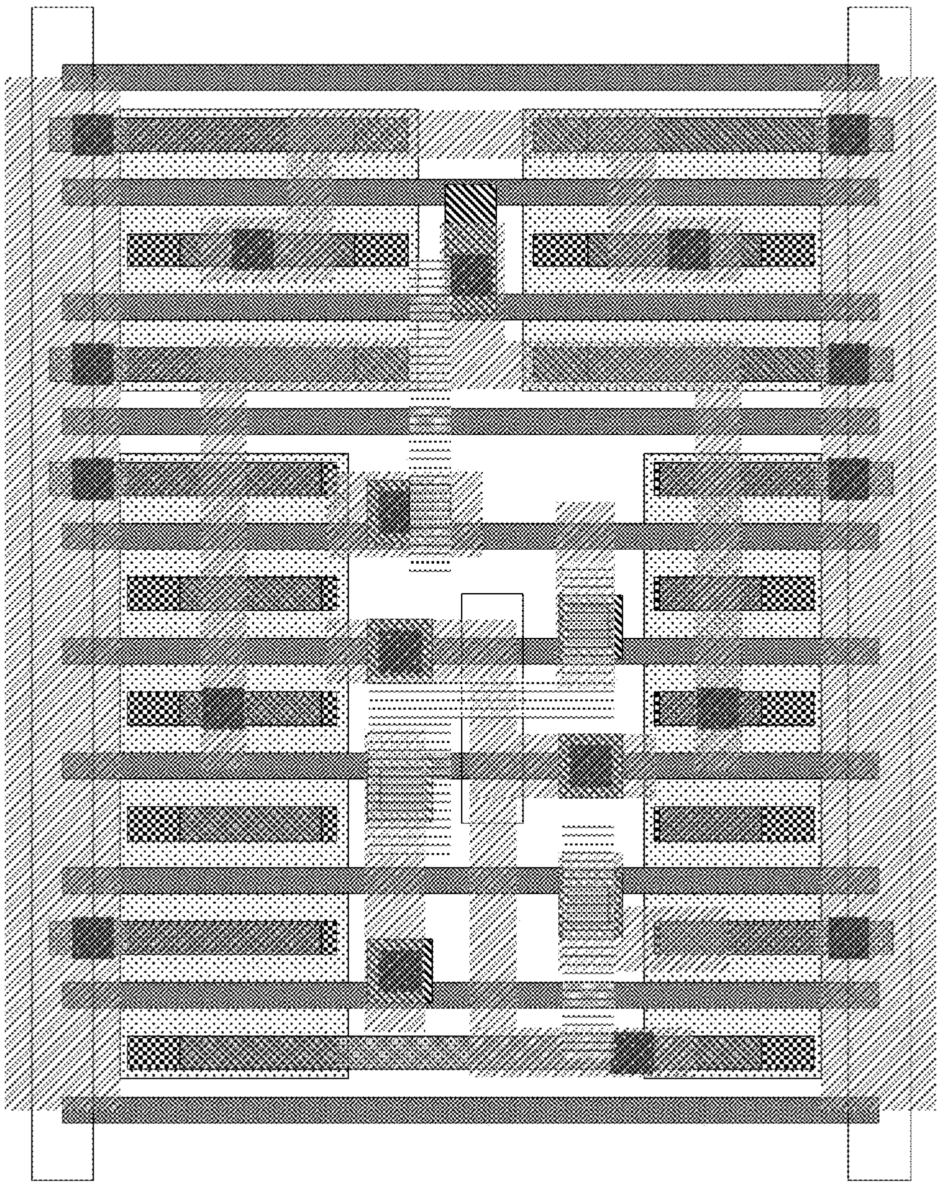
FIG. 350 depicts a MUX2HDD2 cell.

Reference is made to FIG. 350, which depicts a MUX2HDD2 cell. This cell implements a two-input multiplex function in drive strength 2.

Figure 351:
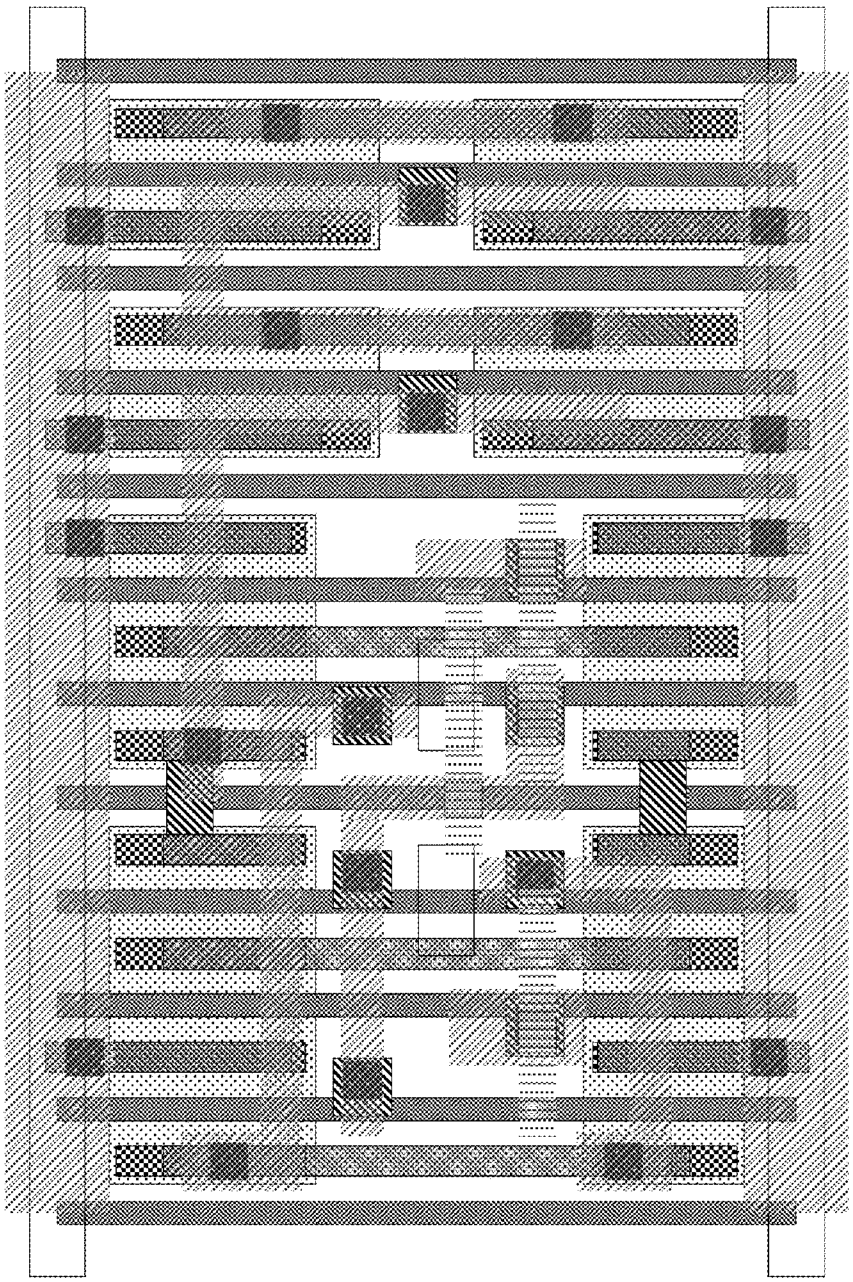
FIG. 351 depicts a MUX2ND1 cell.

Reference is made to FIG. 351, which depicts a MUX2ND1 cell. This cell implements a two-input inverting multiplex function in drive strength 1.

Figure 352:
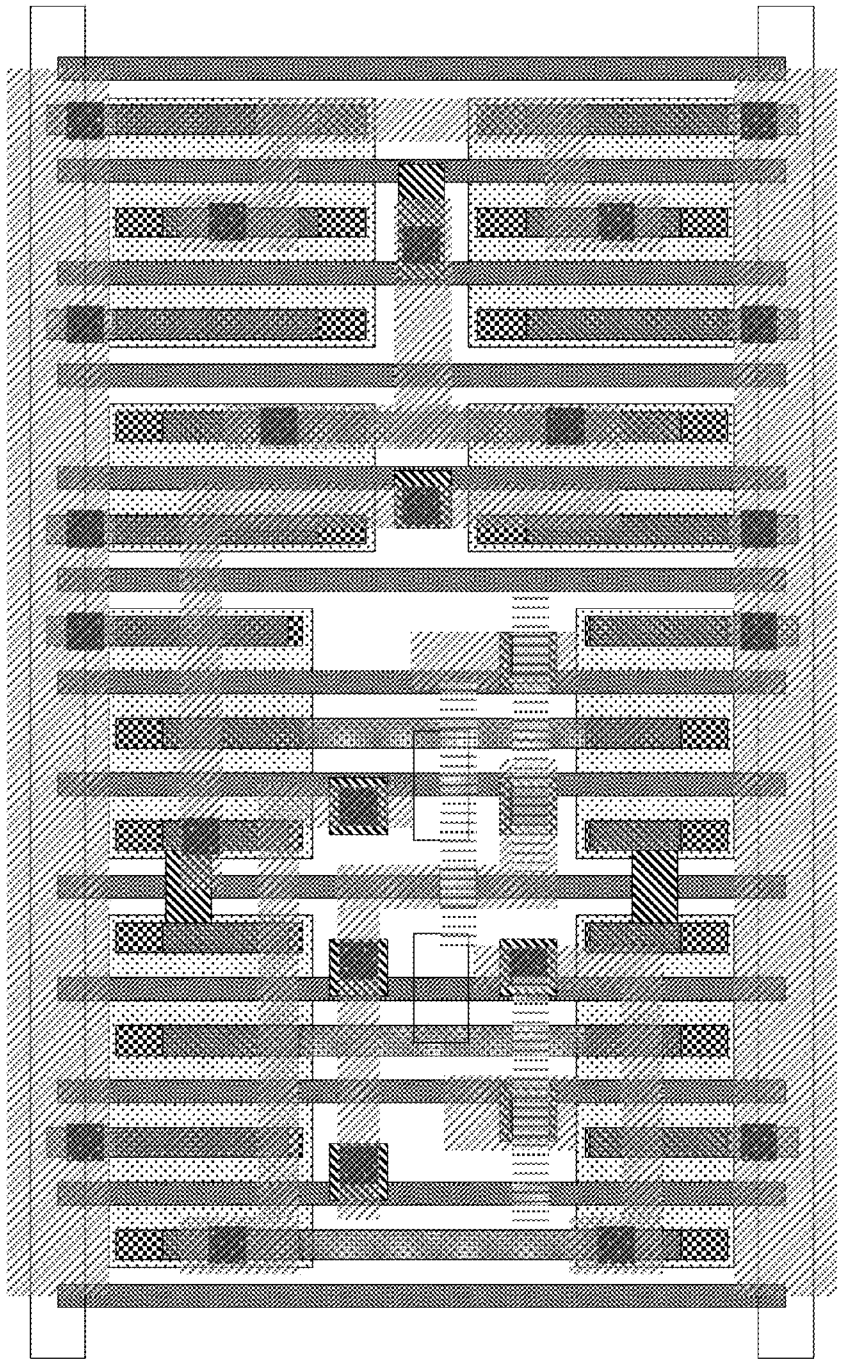
FIG. 352 depicts a MUX2ND2 cell.

Reference is made to FIG. 352, which depicts a MUX2ND2 cell. This cell implements a two-input inverting multiplex function in drive strength 2.

Figure 353:
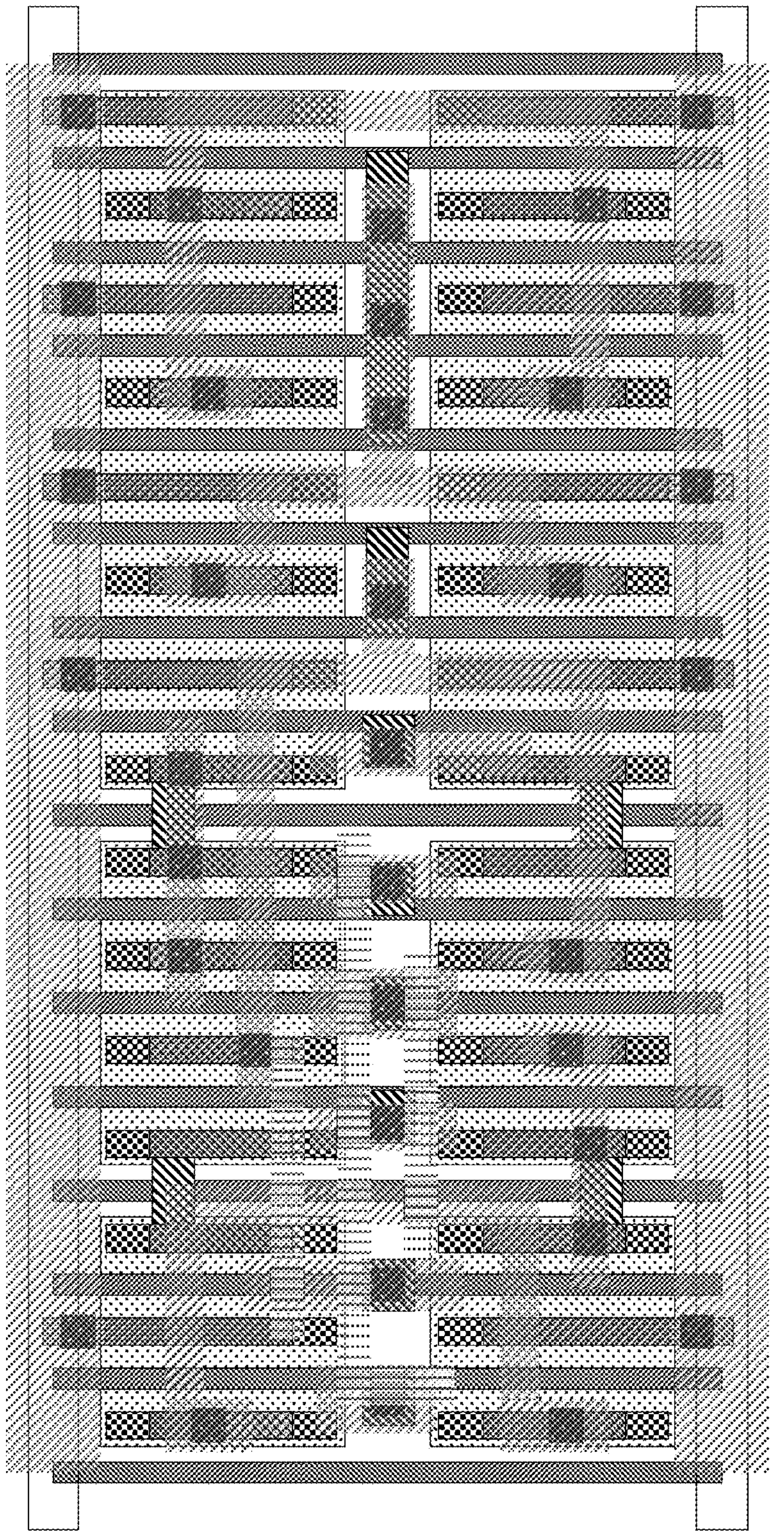
FIG. 353 depicts a MUX2ND4 cell.

Reference is made to FIG. 353, which depicts a MUX2ND4 cell. This cell implements a two-input inverting multiplex function in drive strength 4.

Figure 354:
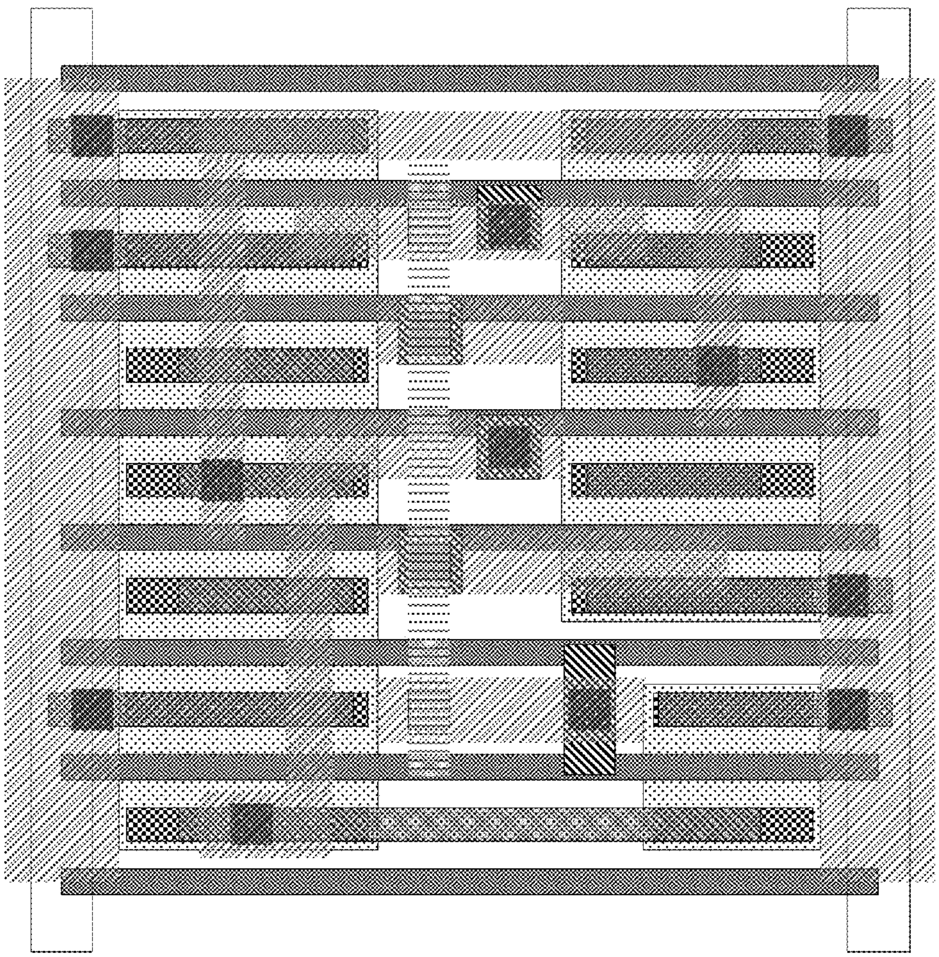
FIG. 354 depicts a MUX2NHDD1 cell.

Reference is made to FIG. 354, which depicts a MUX2NHDD1 cell. This cell implements a two-input inverting multiplex function in drive strength 1.

Figure 355:
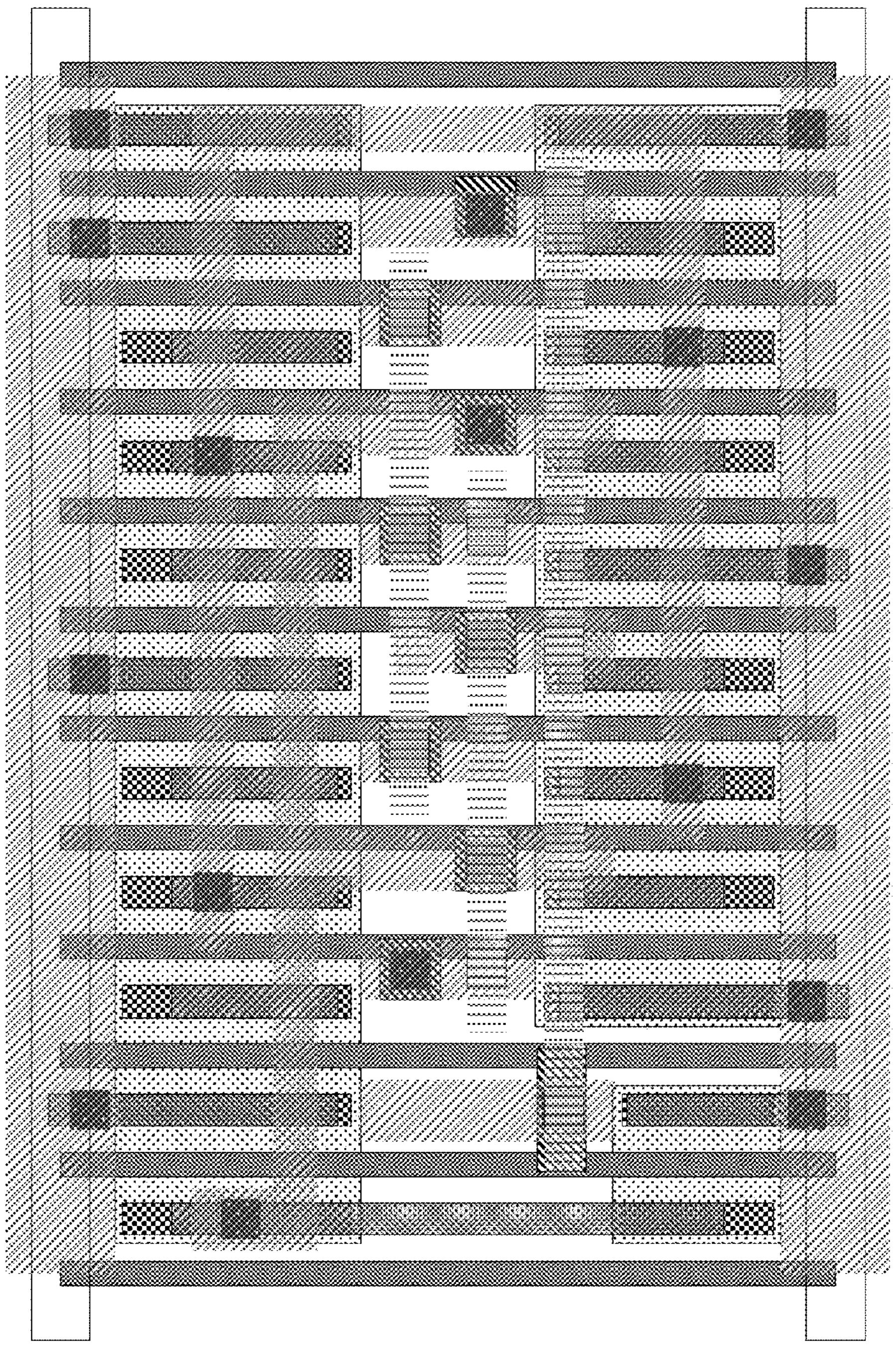
FIG. 355 depicts a MUX2NHDD2 cell.

Reference is made to FIG. 355, which depicts a MUX2NHDD2 cell. This cell implements a two-input inverting multiplex function in drive strength 2.

Figure 356:
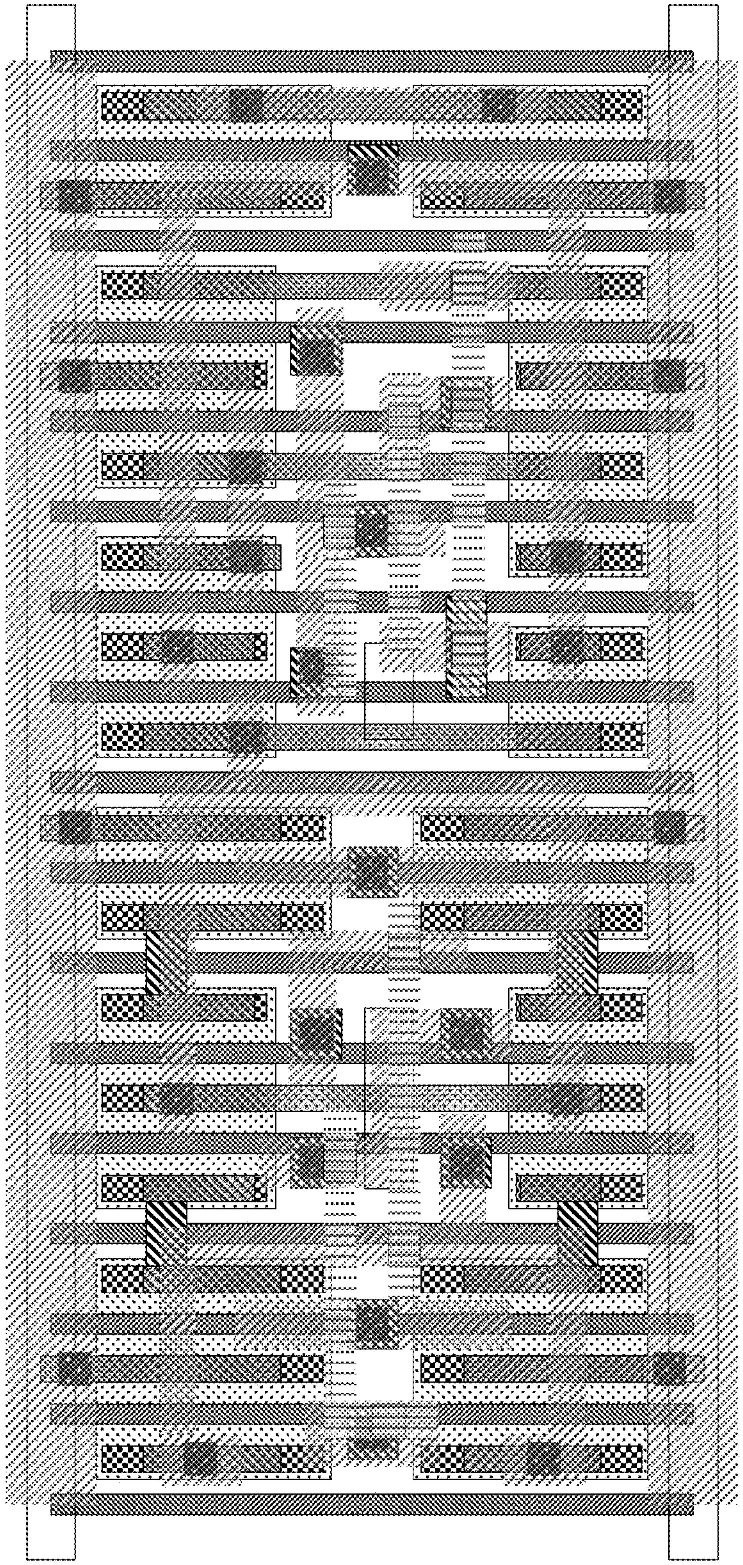
FIG. 356 depicts a MUX3D1 cell.

Reference is made to FIG. 356, which depicts a MUX3D1 cell. This cell implements a 3-input multiplex function in drive strength 1.

Figure 357:
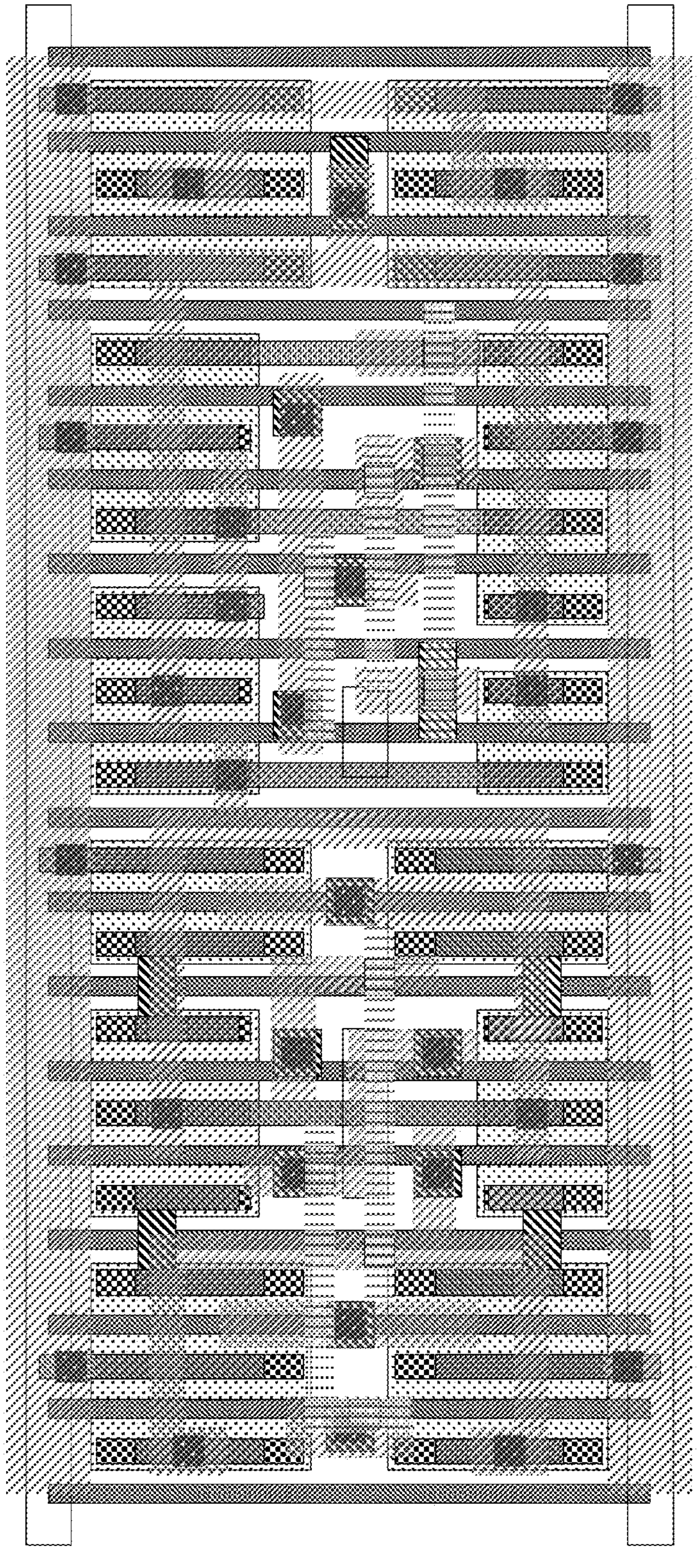
FIG. 357 depicts a MUX3D2 cell.

Reference is made to FIG. 357, which depicts a MUX3D2 cell. This cell implements a 3-input multiplex function in drive strength 2.

Figure 358:
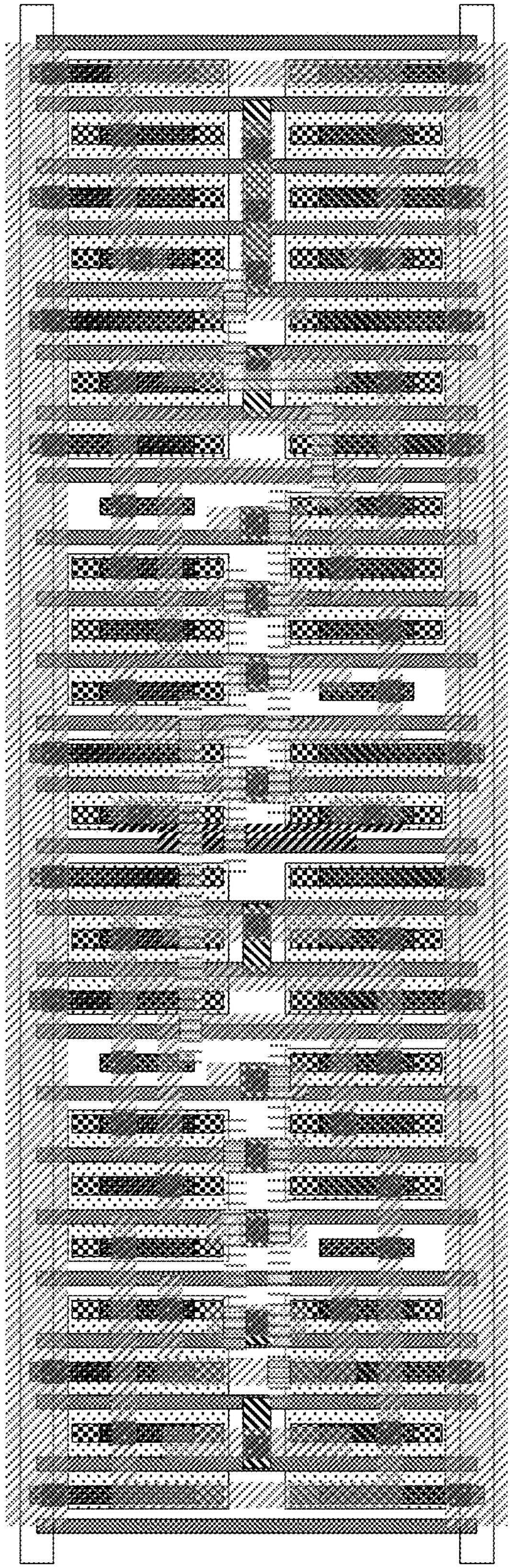
FIG. 358 depicts a MUX3D4 cell.

Reference is made to FIG. 358, which depicts a MUX3D4 cell. This cell implements a 3-input multiplex function in drive strength 4.

Figure 359:
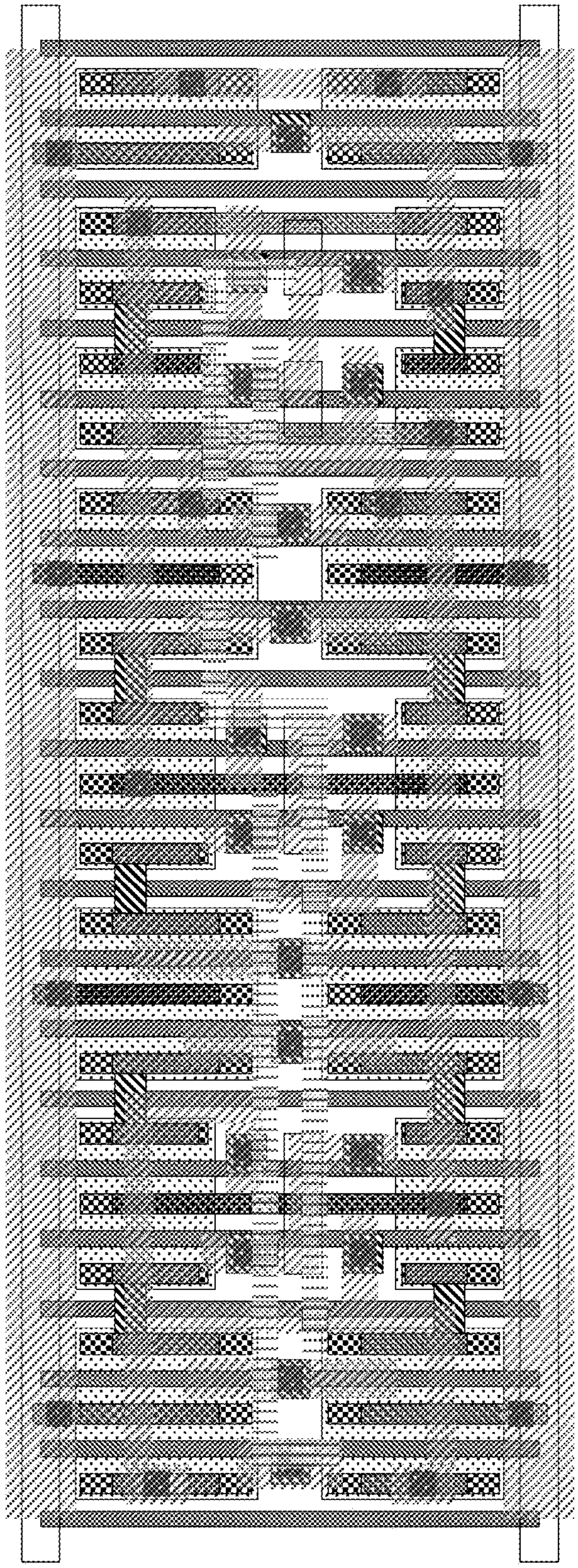
FIG. 359 depicts a MUX4D1 cell.

Reference is made to FIG. 359, which depicts a MUX4D1 cell. This cell implements a 4-input multiplex function in drive strength 1.

Figure 360:
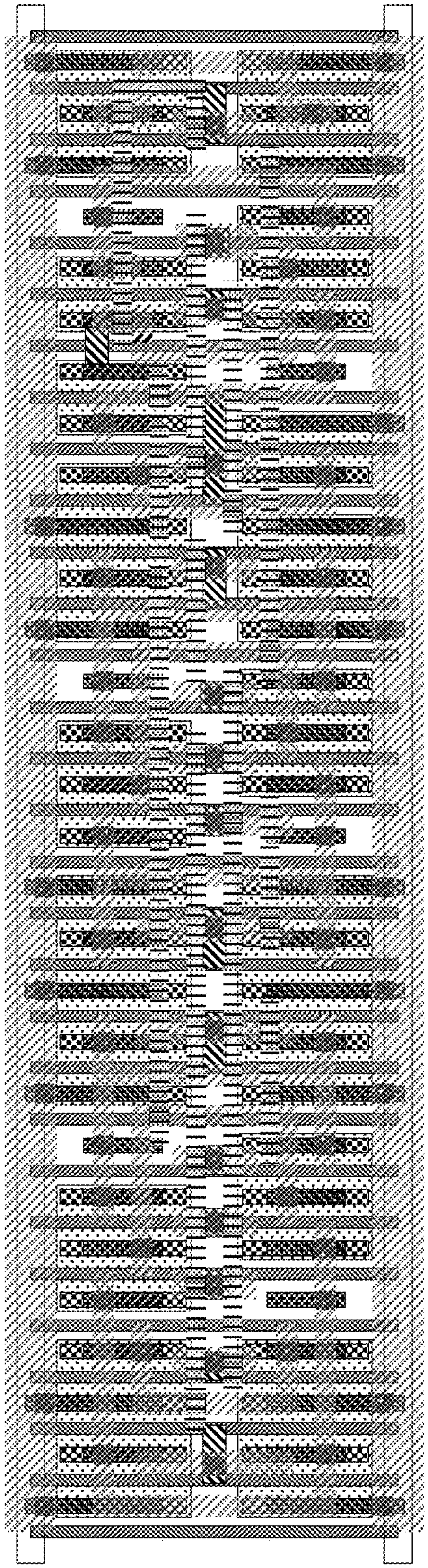
FIG. 360 depicts a MUX4D2 cell.

Reference is made to FIG. 360, which depicts a MUX4D2 cell. This cell implements a 4-input multiplex function in drive strength 2.

Figure 361:
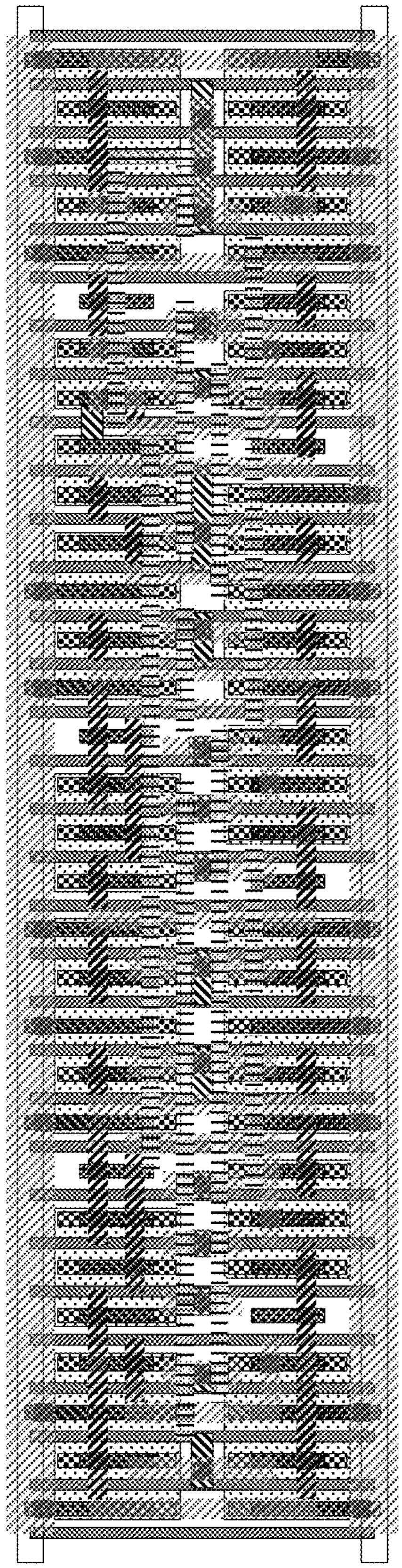
FIG. 361 depicts a MUX4D4 cell.

Reference is made to FIG. 361, which depicts a MUX4D4 cell. This cell implements a 4-input multiplex function in drive strength 4.

Figure 362:
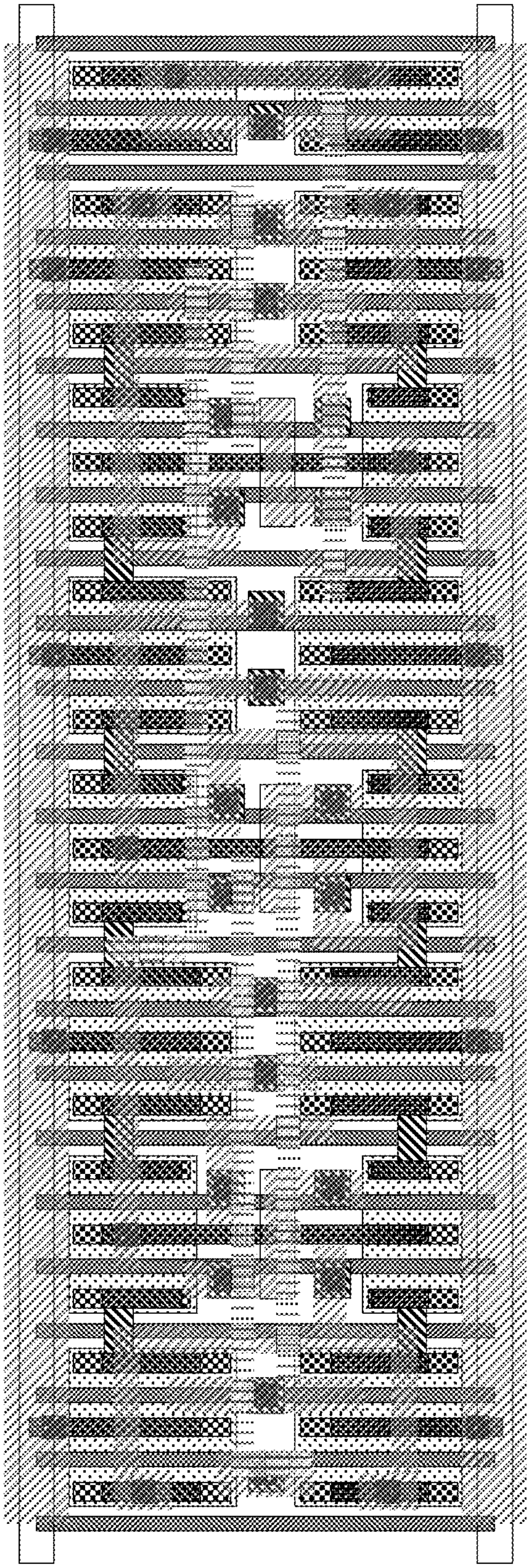
FIG. 362 depicts a MUX4ND1 cell.

Reference is made to FIG. 362, which depicts a MUX4ND1 cell. This cell implements a four-input inverting multiplex function in drive strength 1.

Figure 363:
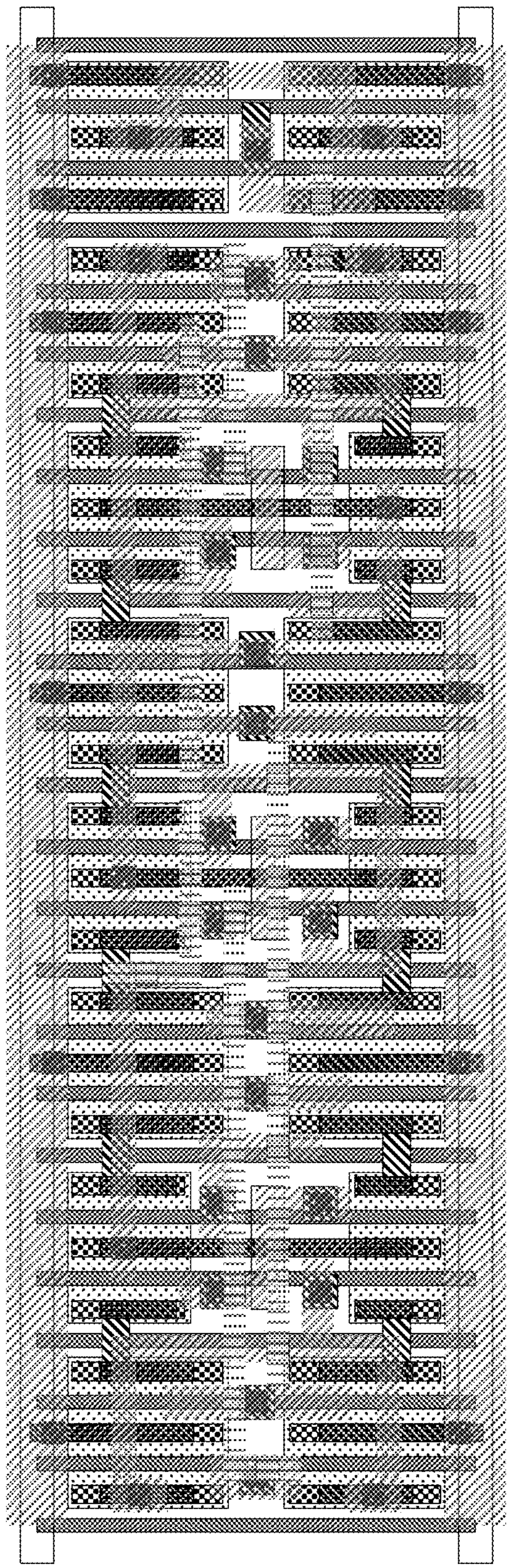
FIG. 363 depicts a MUX4ND2 cell.

Reference is made to FIG. 363, which depicts a MUX4ND2 cell. This cell implements a four-input inverting multiplex function in drive strength 2.

Figure 364:
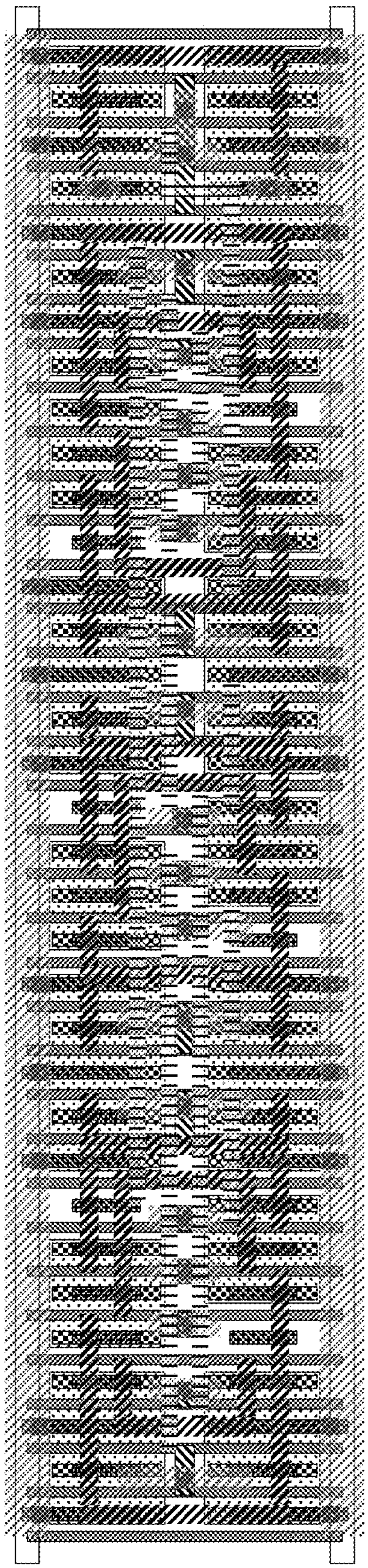
FIG. 364 depicts a MUX4ND4 cell.

Reference is made to FIG. 364, which depicts a MUX4ND4 cell. This cell implements a four-input inverting multiplex function in drive strength 4.

Figure 365:
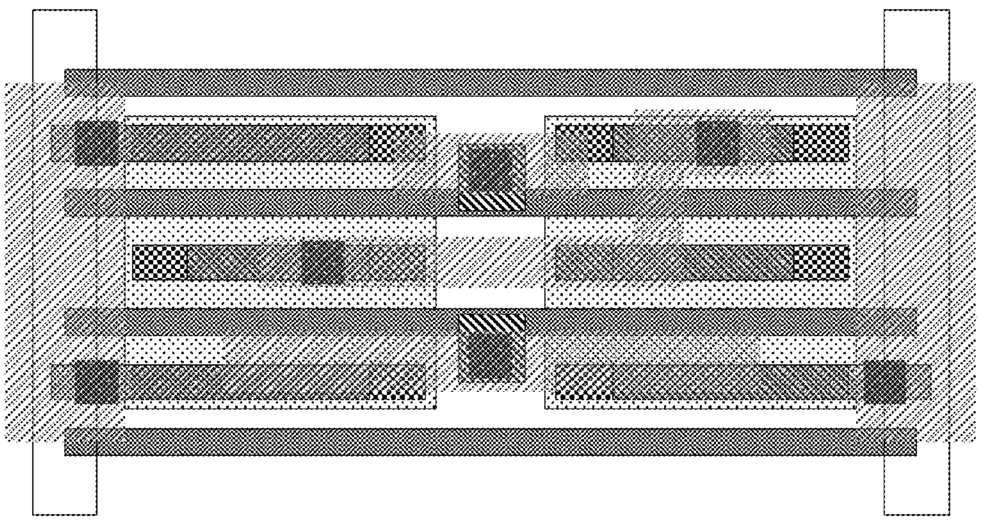
FIG. 365 depicts an ND2D1 cell.

Reference is made to FIG. 365, which depicts an ND2D1 cell. This cell implements the logic function nand(A,B) in drive strength 1.

Figure 366:
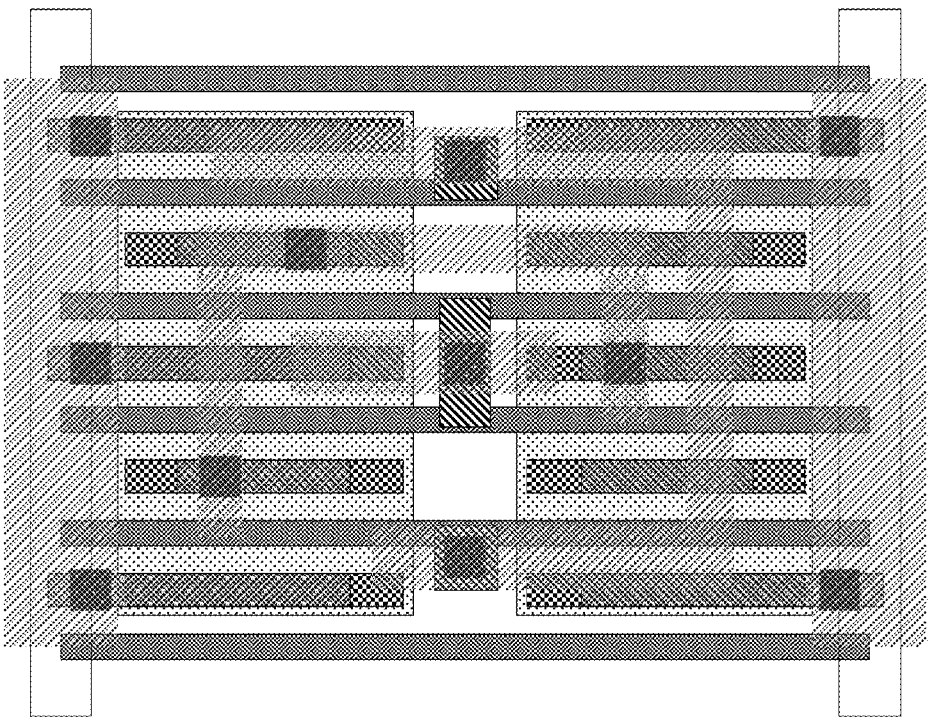
FIG. 366 depicts an ND2D2 cell.

Reference is made to FIG. 366, which depicts an ND2D2 cell. This cell implements the logic function nand(A,B) in drive strength 2.

Figure 367:
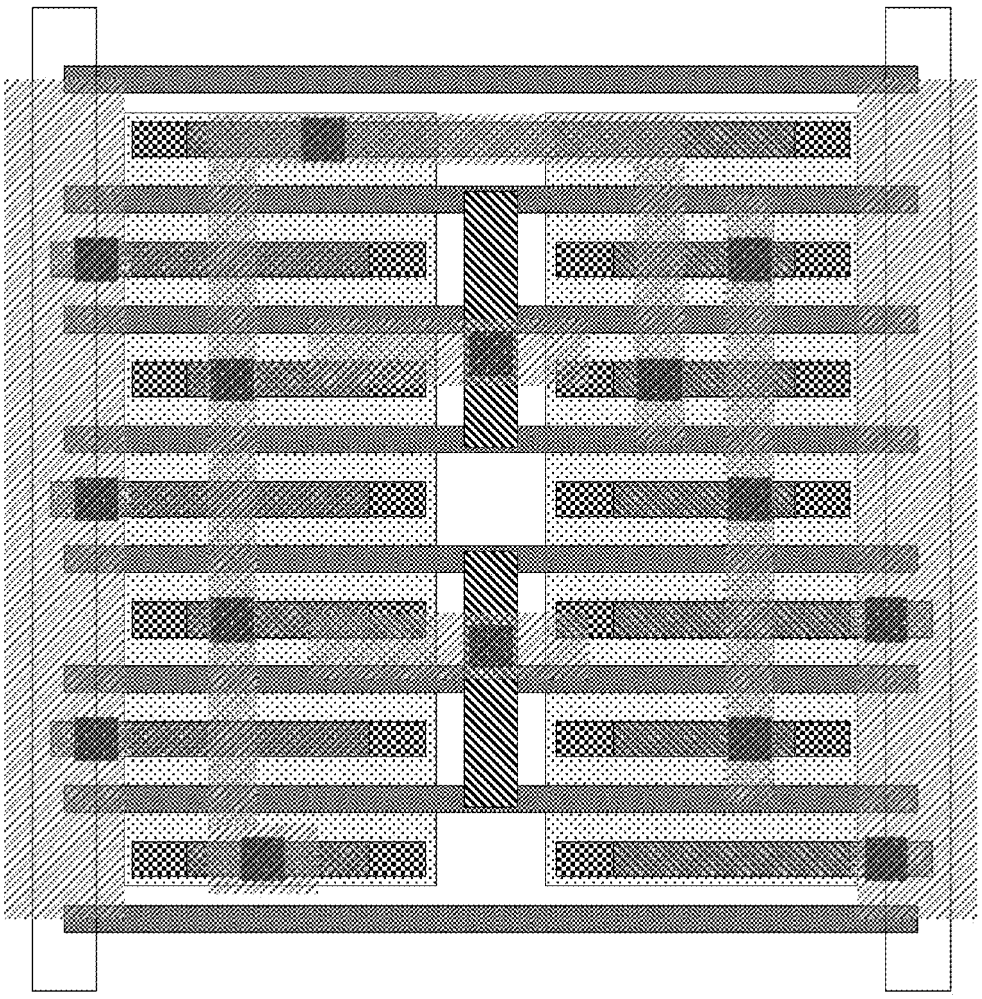
FIG. 367 depicts an ND2D3 cell.

Reference is made to FIG. 367, which depicts an ND2D3 cell. This cell implements the logic function nand(A,B) in drive strength 3.

Figure 368:
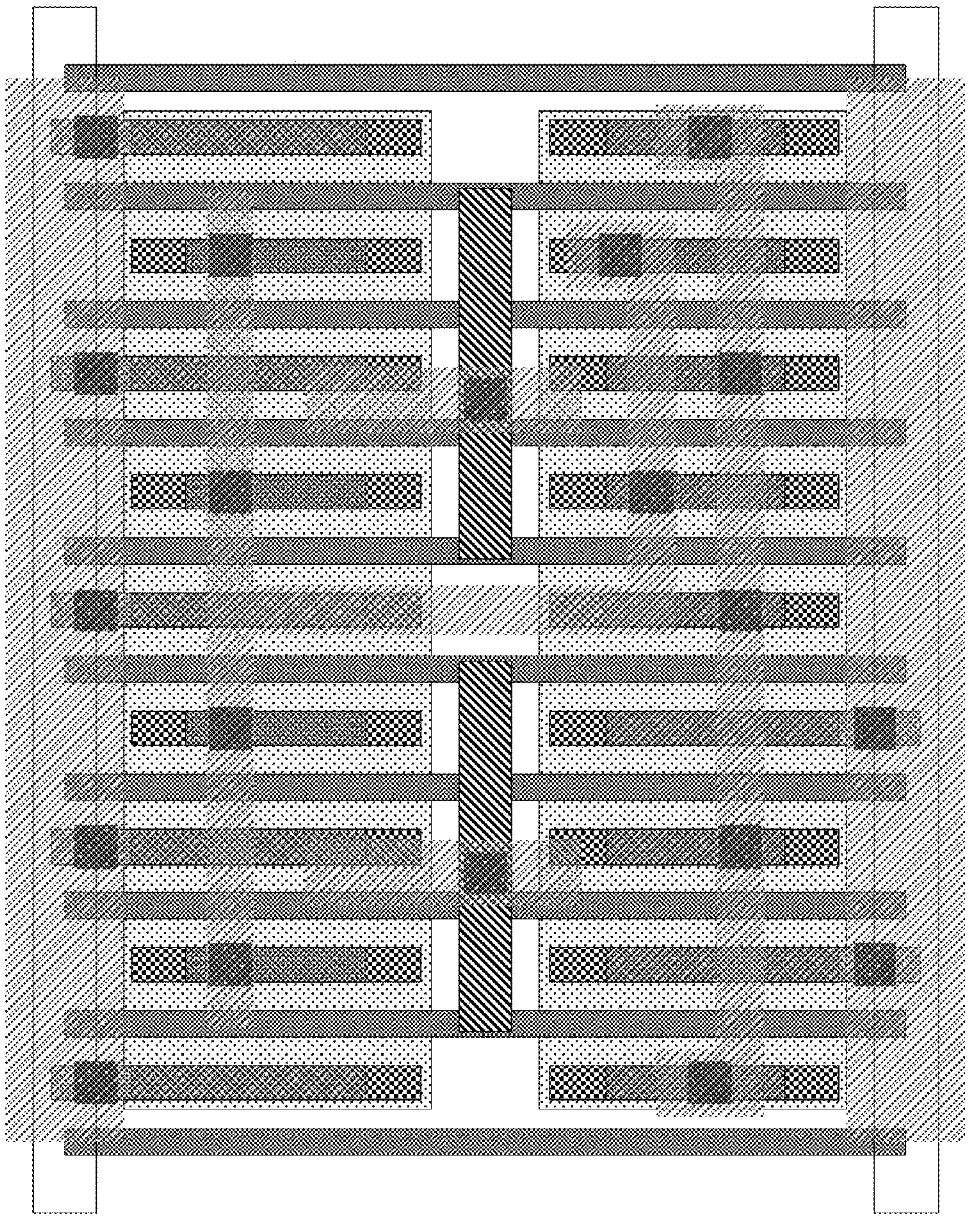
FIG. 368 depicts an ND2D4 cell.

Reference is made to FIG. 368, which depicts an ND2D4 cell. This cell implements the logic function nand(A,B) in drive strength 4.

Figure 369:
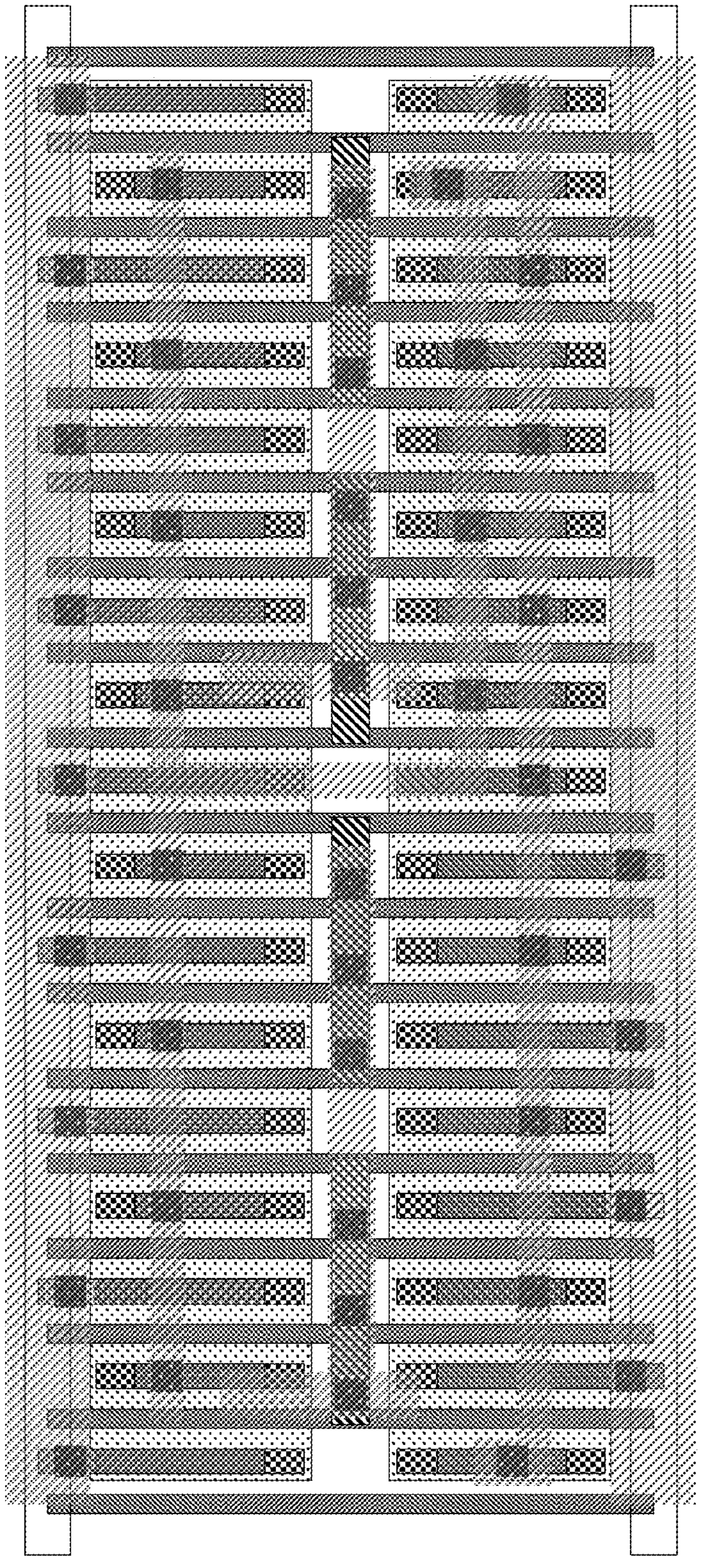
FIG. 369 depicts an ND2D8 cell.

Reference is made to FIG. 369, which depicts an ND2D8 cell. This cell implements the logic function nand(A,B) in drive strength 8.

Figure 370:
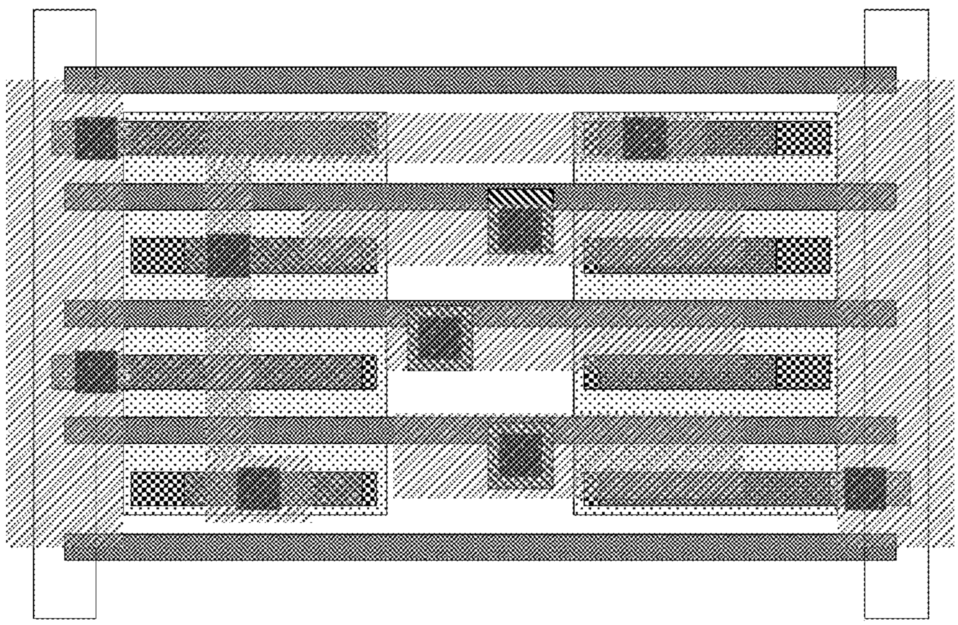
FIG. 370 depicts an ND3D1 cell.

Reference is made to FIG. 370, which depicts an ND3D1 cell. This cell implements the logic function nand(A,B,C) in drive strength 1.

Figure 371:
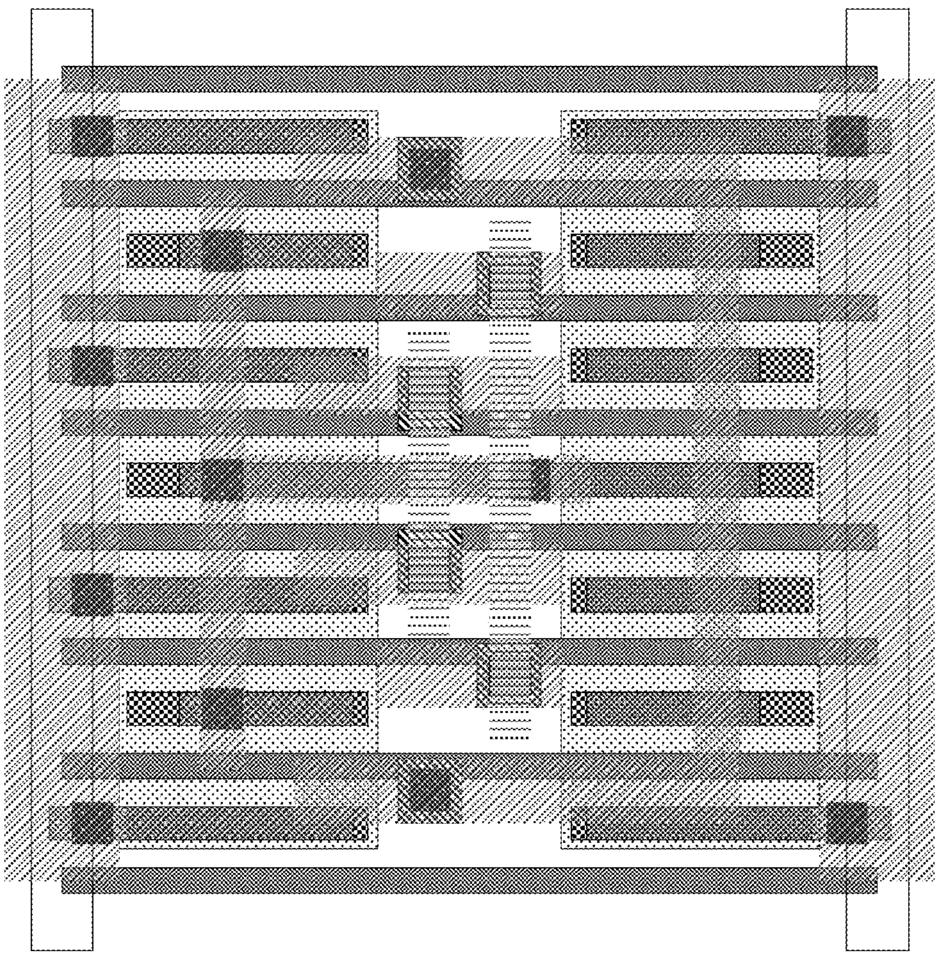
FIG. 371 depicts an ND3D2 cell.

Reference is made to FIG. 371, which depicts an ND3D2 cell. This cell implements the logic function nand(A,B,C) in drive strength 2.

Figure 372:
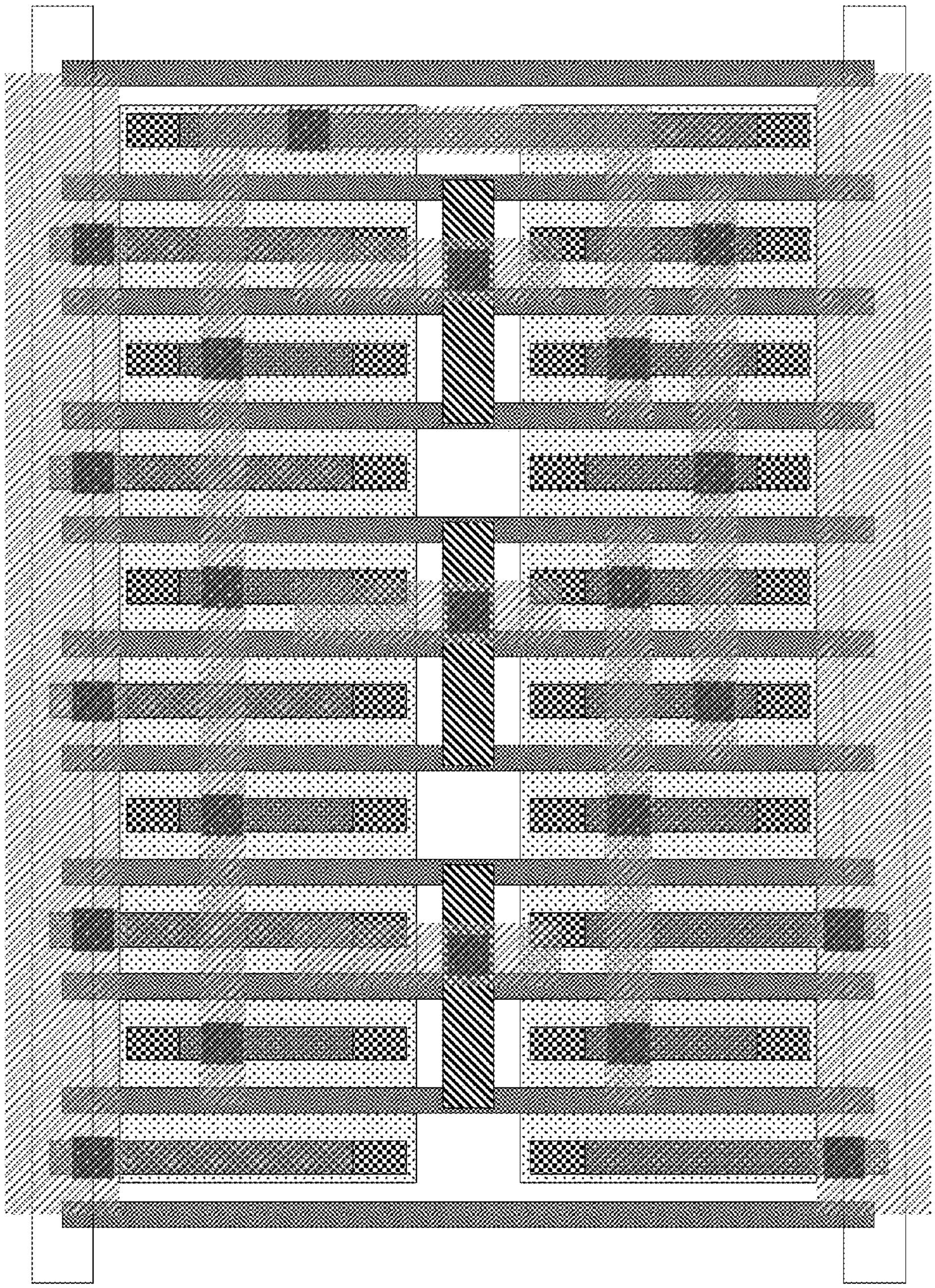
FIG. 372 depicts an ND3D3 cell.

Reference is made to FIG. 372, which depicts an ND3D3 cell. This cell implements the logic function nand(A,B,C) in drive strength 3.

Figure 373:
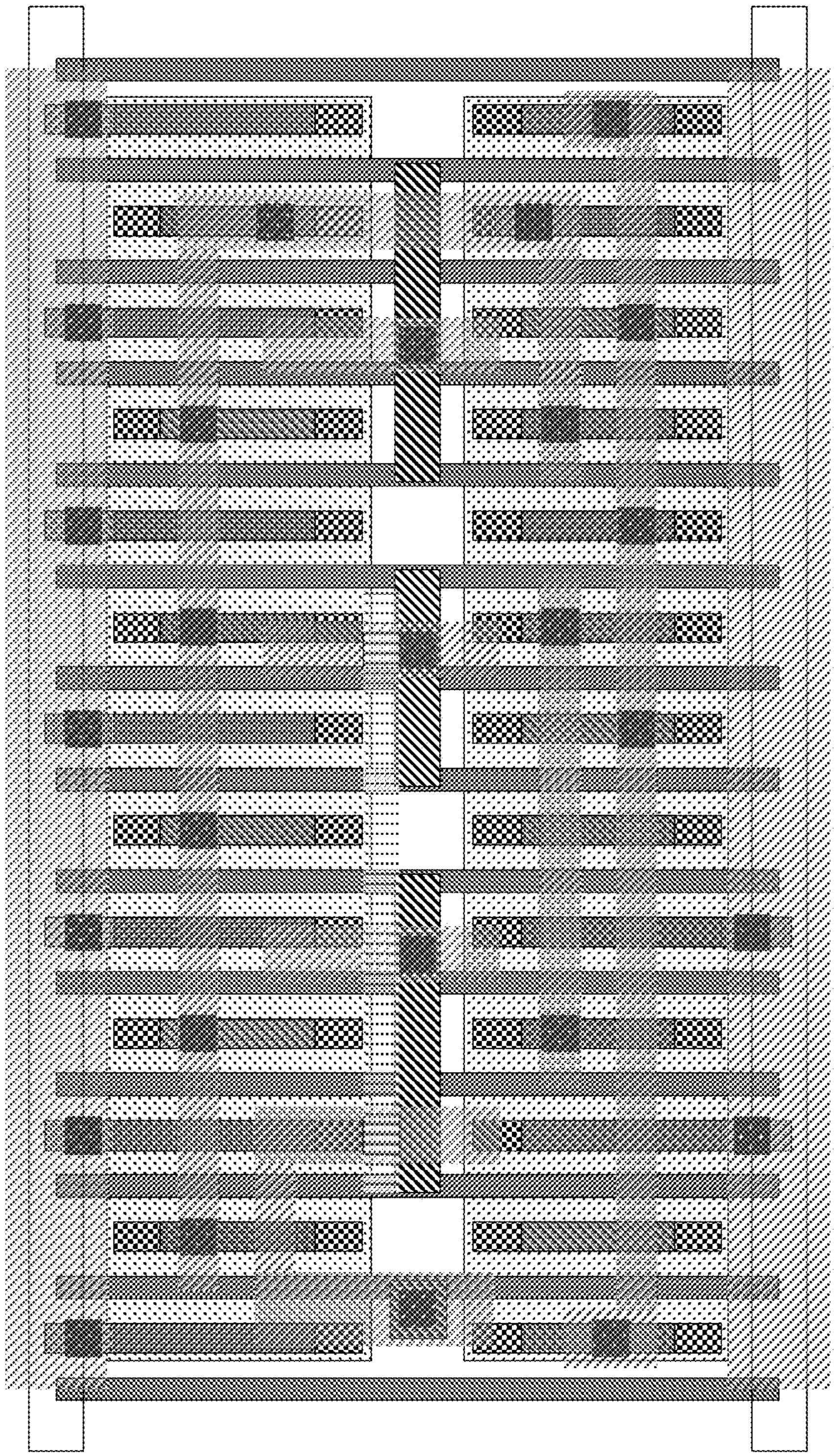
FIG. 373 depicts an ND3D4 cell.

Reference is made to FIG. 373, which depicts an ND3D4 cell. This cell implements the logic function nand(A,B,C) in drive strength 4.

Figure 374:
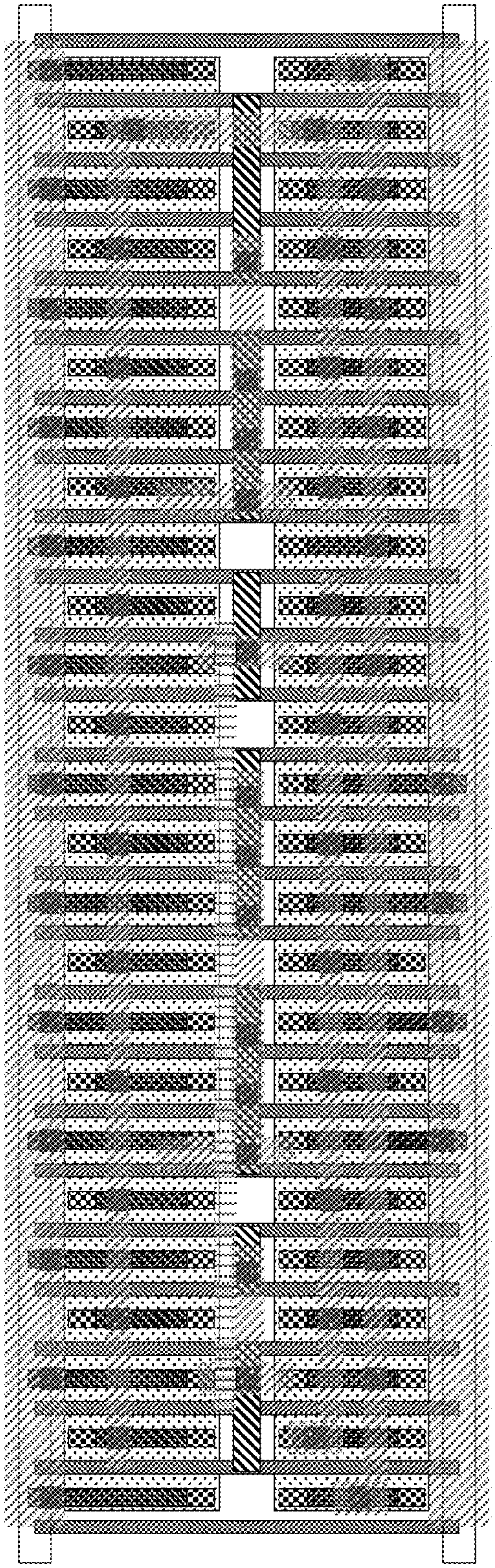
FIG. 374 depicts an ND3D8 cell.

Reference is made to FIG. 374, which depicts an ND3D8 cell. This cell implements the logic function nand(A,B,C) in drive strength 8.

Figure 375:
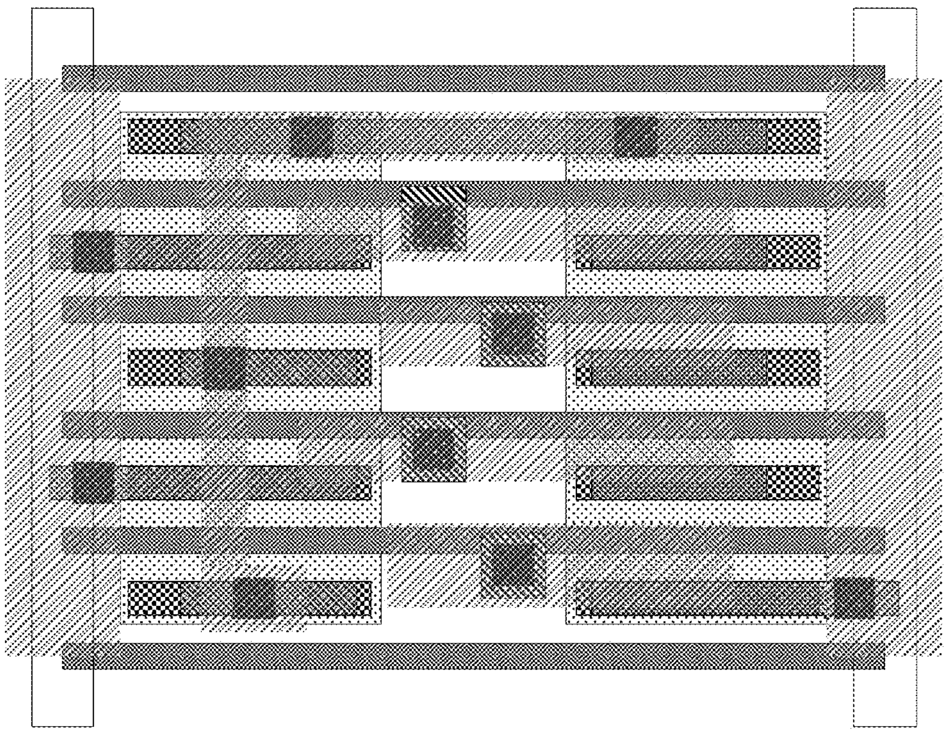
FIG. 375 depicts an ND4D1 cell.

Reference is made to FIG. 375, which depicts an ND4D1 cell. This cell implements the logic function nand(A,B,C,D) in drive strength 1.

Figure 376:
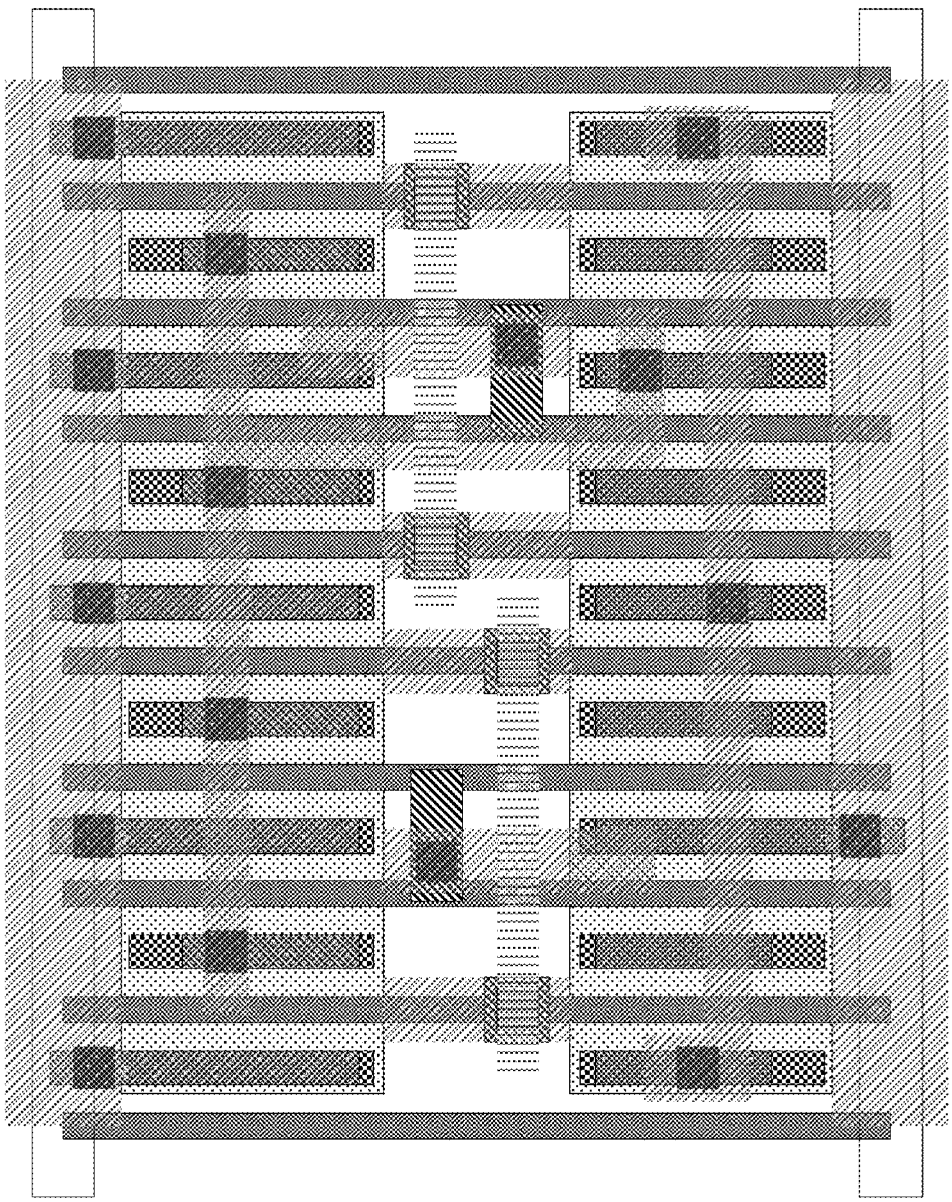
FIG. 376 depicts an ND4D2 cell.

Reference is made to FIG. 376, which depicts an ND4D2 cell. This cell implements the logic function nand(A,B,C,D) in drive strength 2.

Figure 377:
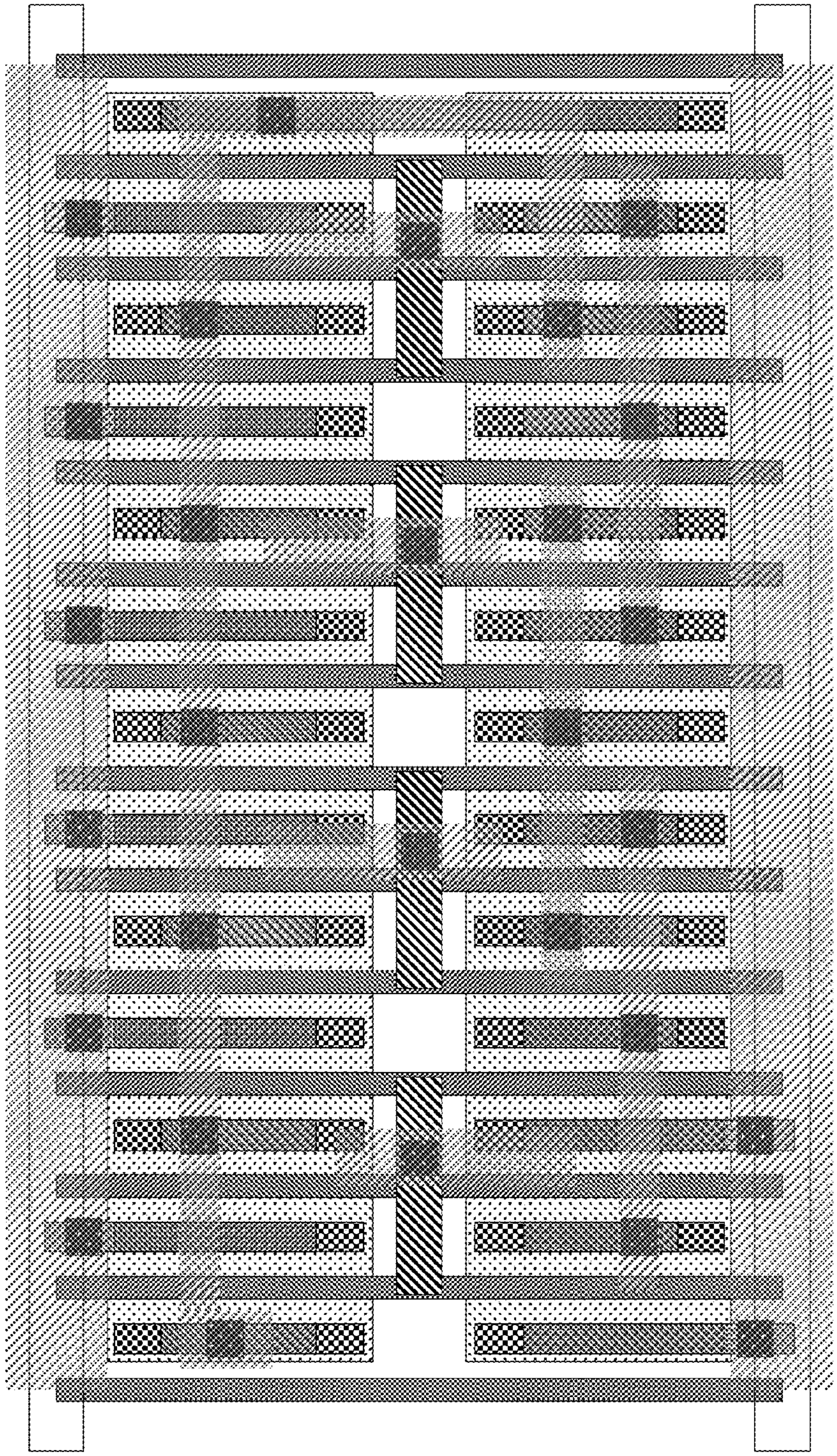
FIG. 377 depicts an ND4D3 cell.

Reference is made to FIG. 377, which depicts an ND4D3 cell. This cell implements the logic function nand(A,B,C,D) in drive strength 3.

Figure 378:
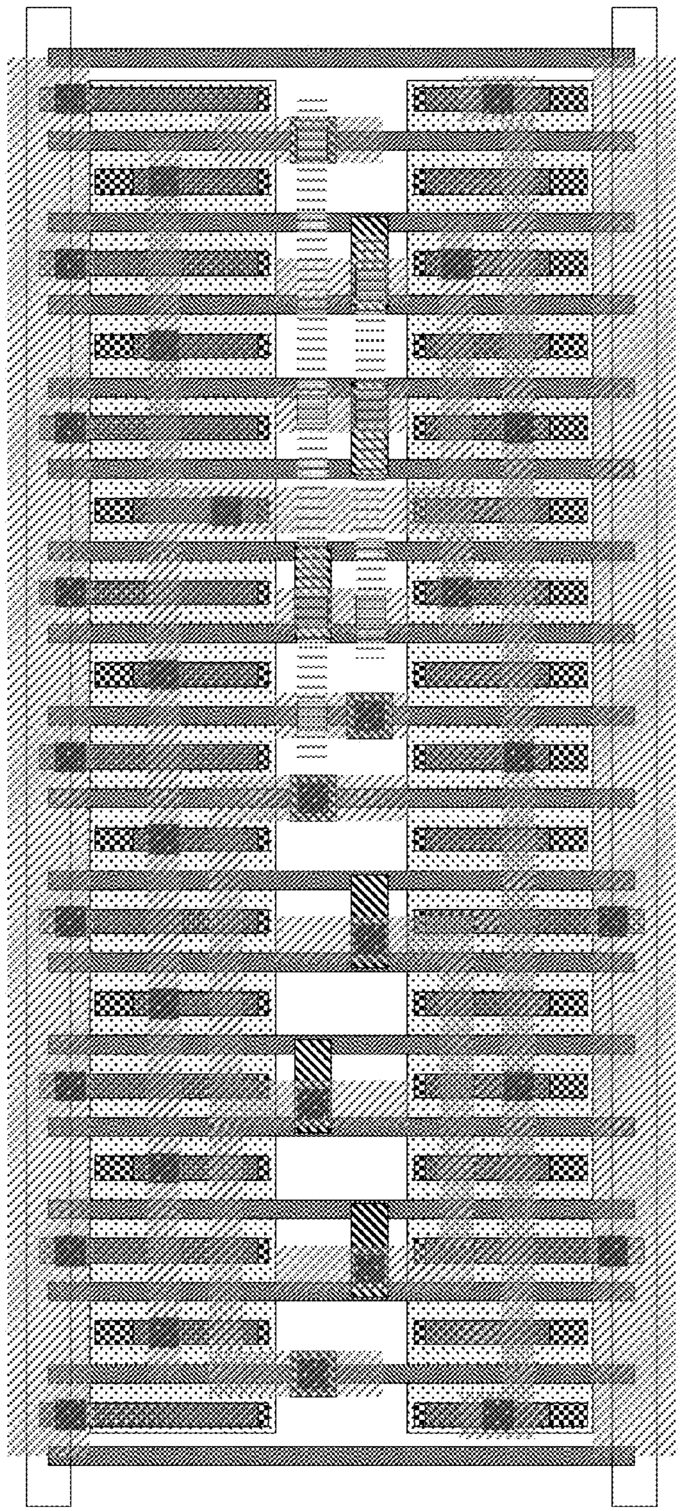
FIG. 378 depicts an ND4D4 cell.

Reference is made to FIG. 378, which depicts an ND4D4 cell. This cell implements the logic function nand(A,B,C,D) in drive strength 4.

Figure 379:
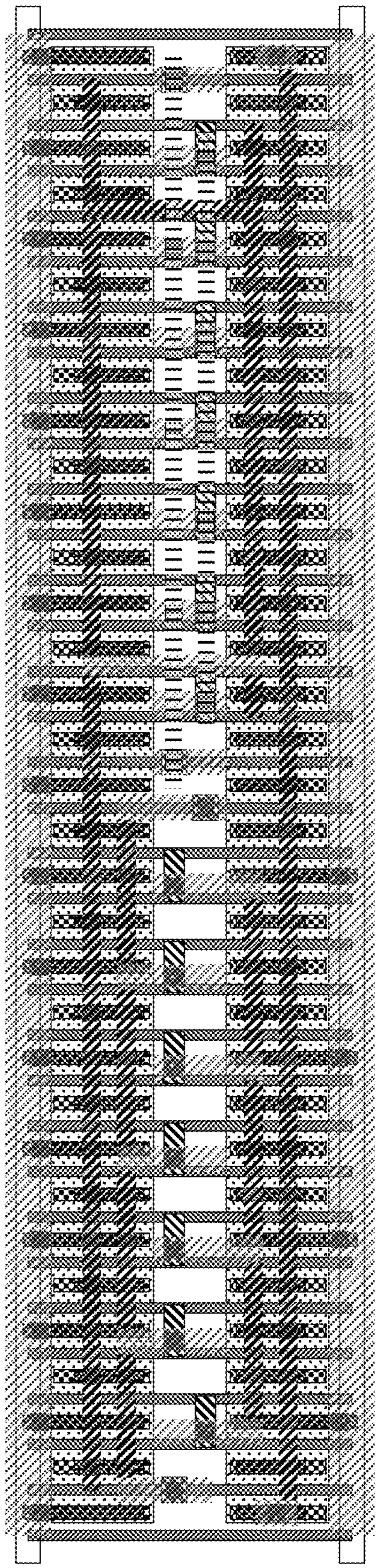
FIG. 379 depicts an ND4D8 cell.

Reference is made to FIG. 379, which depicts an ND4D8 cell. This cell implements the logic function nand(A,B,C,D) in drive strength 8.

Figure 380:
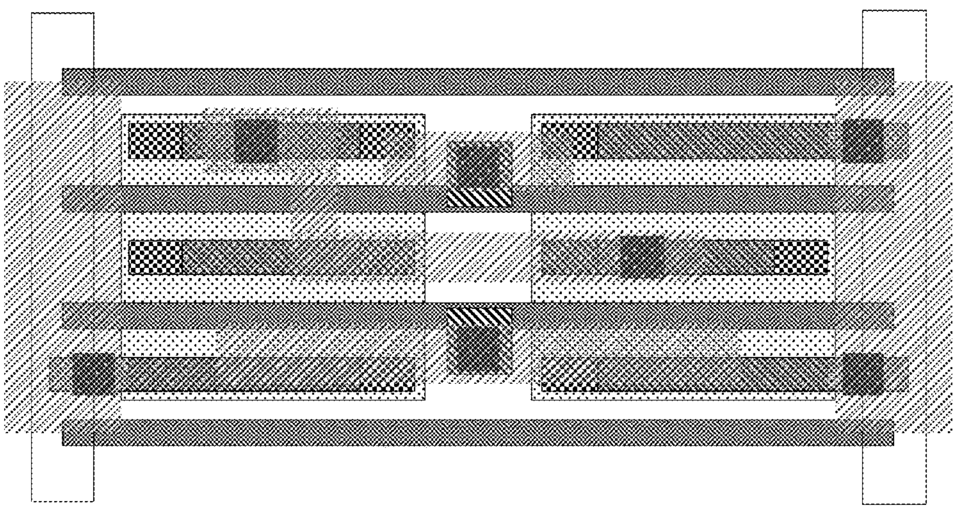
FIG. 380 depicts an NR2D1 cell.

Reference is made to FIG. 380, which depicts an NR2D1 cell. This cell implements the logic function nor(A,B) in drive strength 1.

Figure 381:
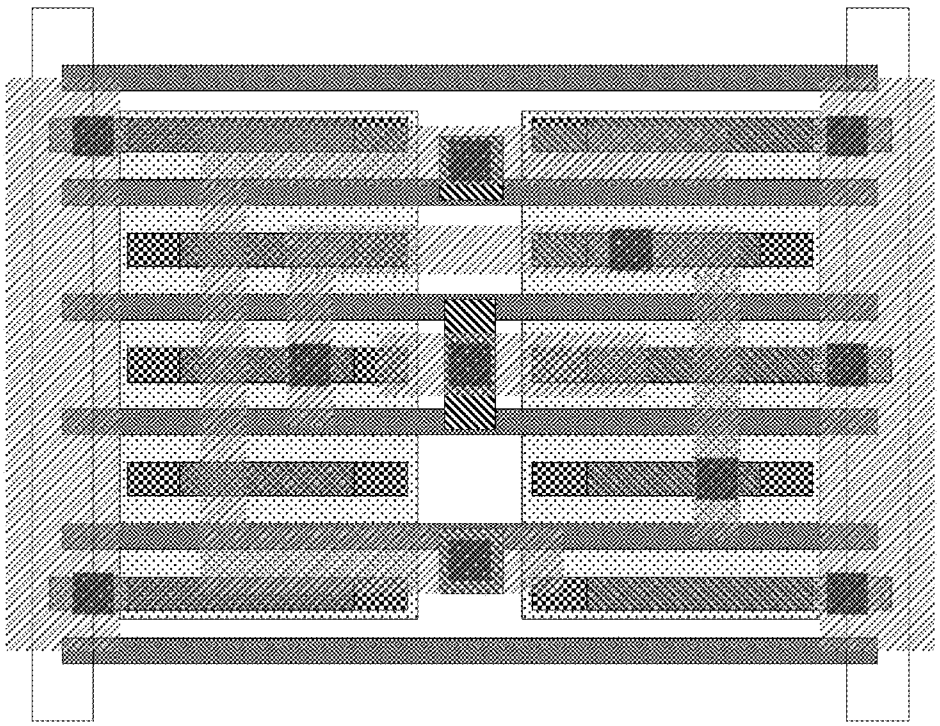
FIG. 381 depicts an NR2D2 cell.

Reference is made to FIG. 381, which depicts an NR2D2 cell. This cell implements the logic function nor(A,B) in drive strength 2.

Figure 382:
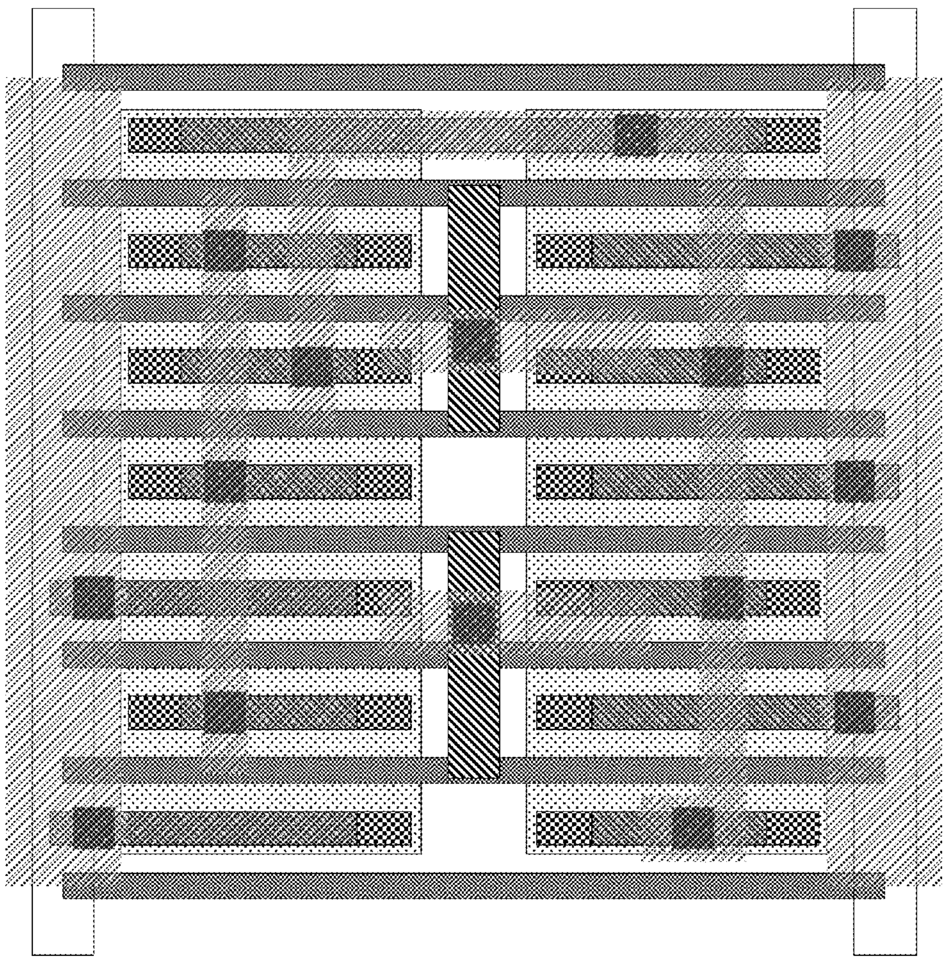
FIG. 382 depicts an NR2D3 cell.

Reference is made to FIG. 382, which depicts an NR2D3 cell. This cell implements the logic function nor(A,B) in drive strength 3.

Figure 383:
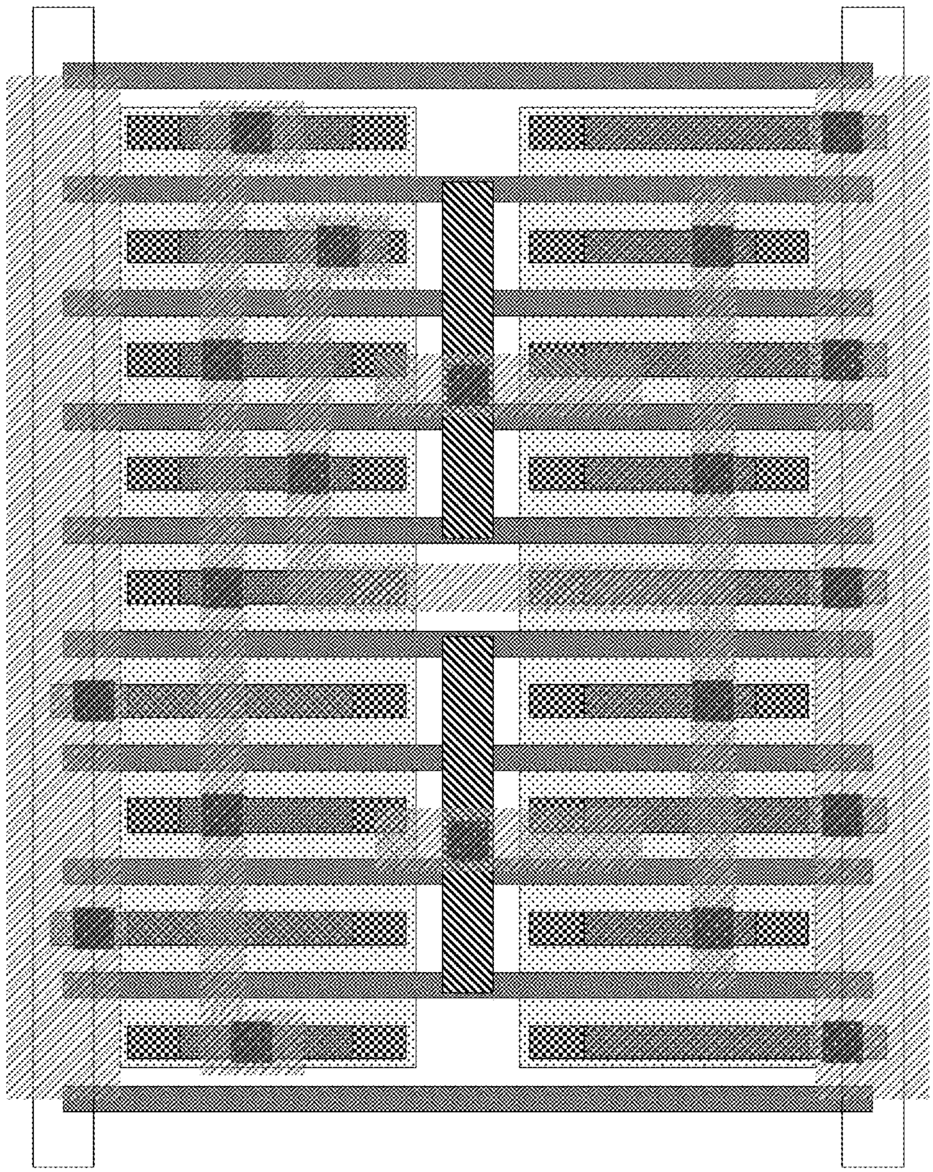
FIG. 383 depicts an NR2D4 cell.

Reference is made to FIG. 383, which depicts an NR2D4 cell. This cell implements the logic function nor(A,B) in drive strength 4.

Figure 384:
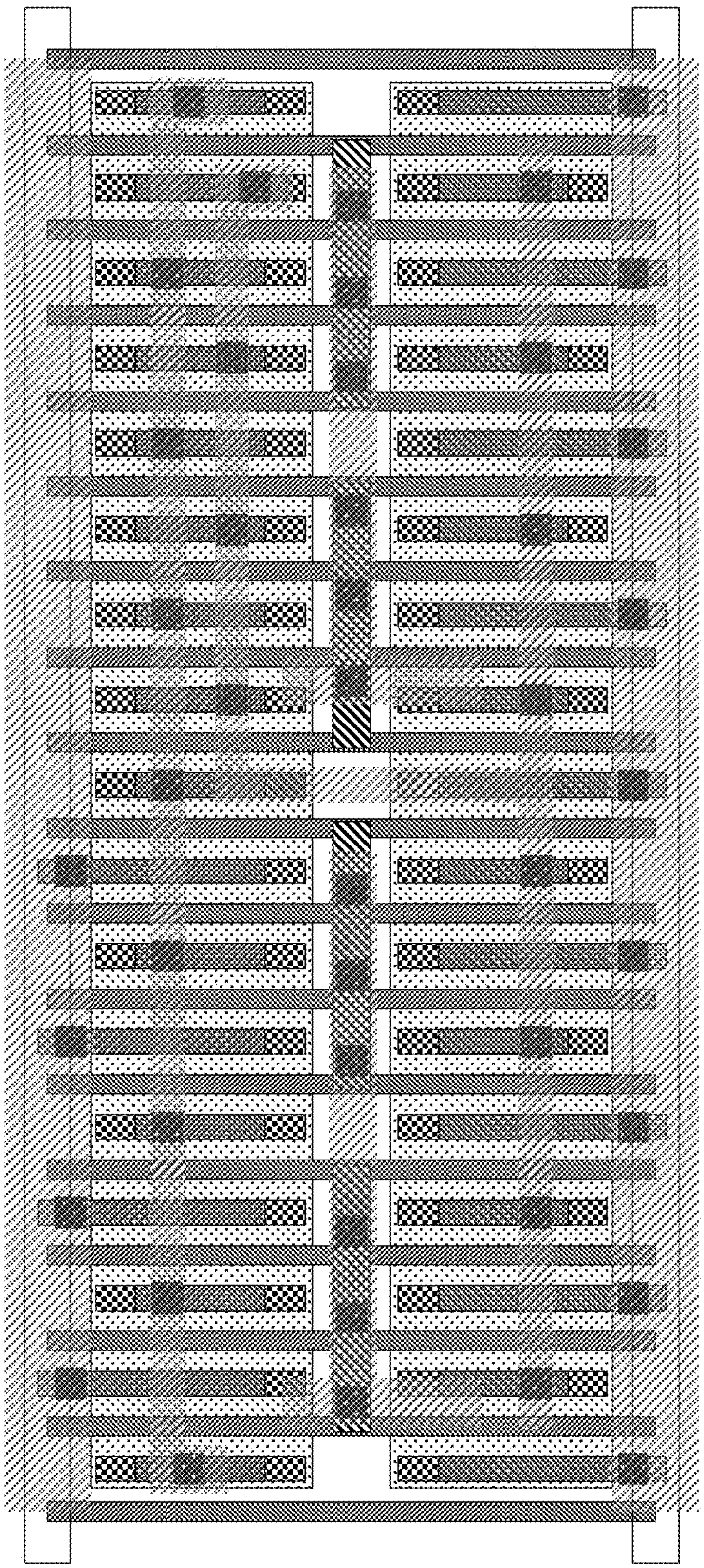
FIG. 384 depicts an NR2D8 cell.

Reference is made to FIG. 384, which depicts an NR2D8 cell. This cell implements the logic function nor(A,B) in drive strength 8.

Figure 385:
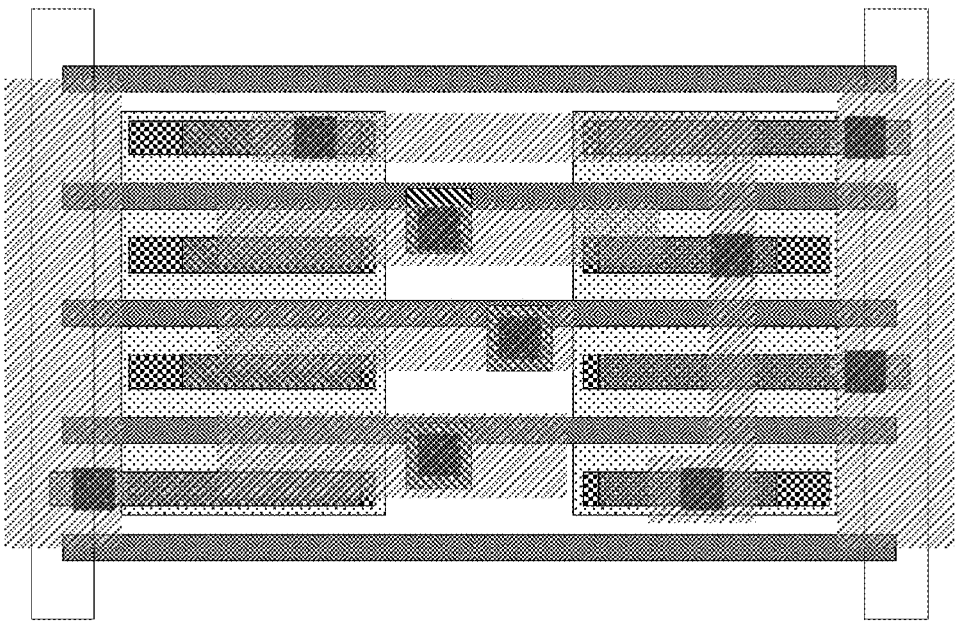
FIG. 385 depicts an NR3D1 cell.

Reference is made to FIG. 385, which depicts an NR3D1 cell. This cell implements the logic function nor(A,B,C) in drive strength 1.

Figure 386:
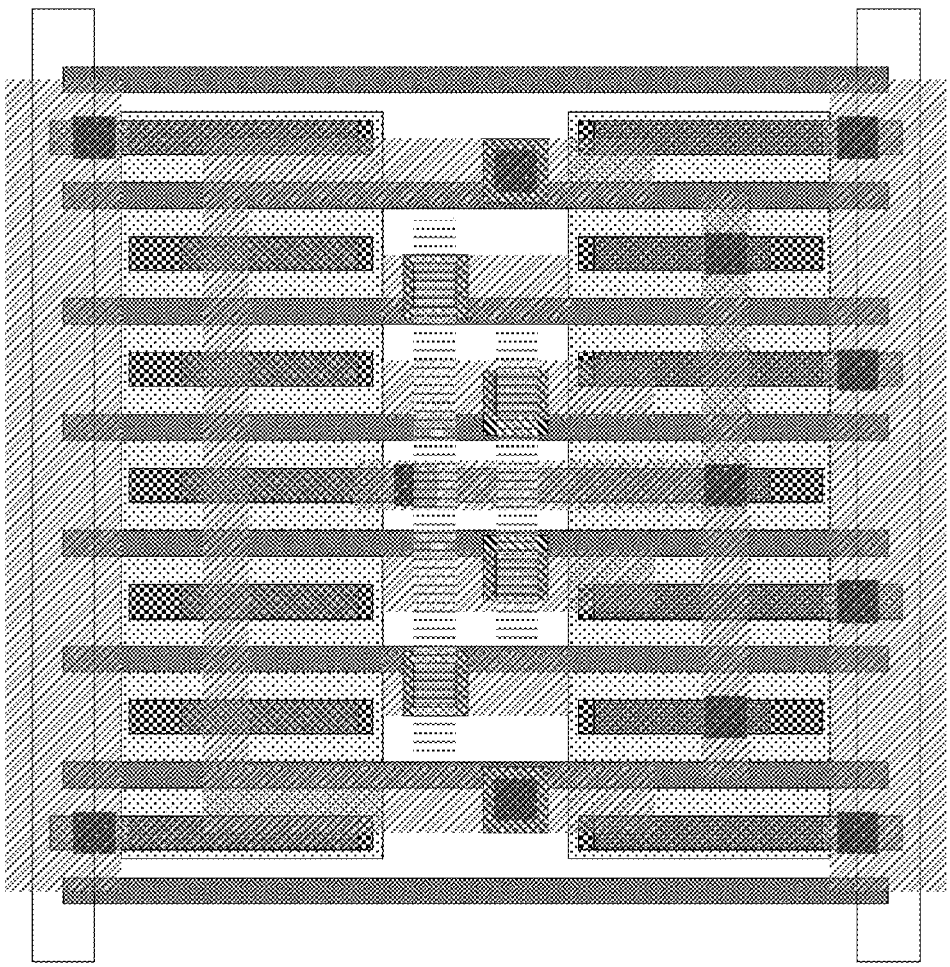
FIG. 386 depicts an NR3D2 cell.

Reference is made to FIG. 386, which depicts an NR3D2 cell. This cell implements the logic function nor(A,B,C) in drive strength 2.

Figure 387:
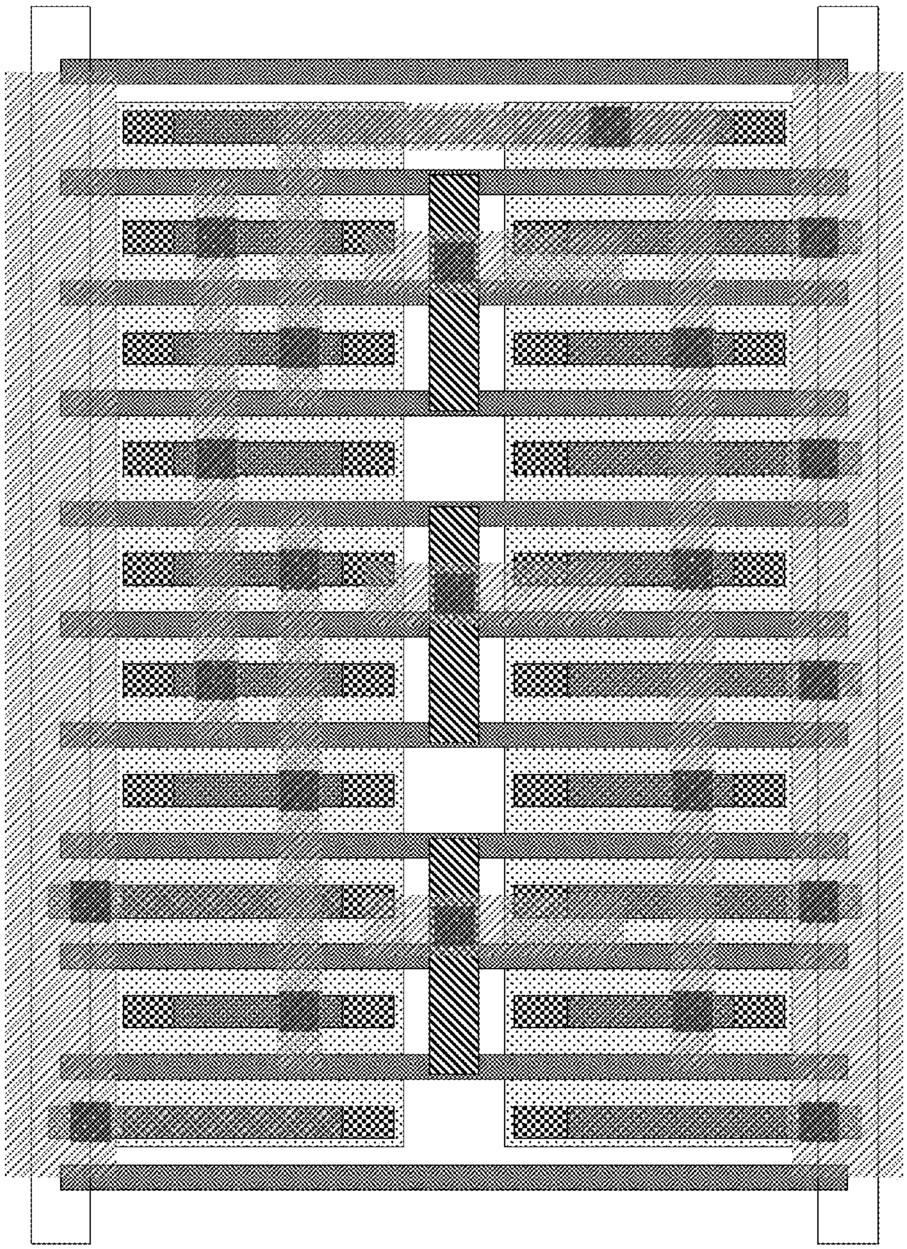
FIG. 387 depicts an NR3D3 cell.

Reference is made to FIG. 387, which depicts an NR3D3 cell. This cell implements the logic function nor(A,B,C) in drive strength 3.

Figure 388:
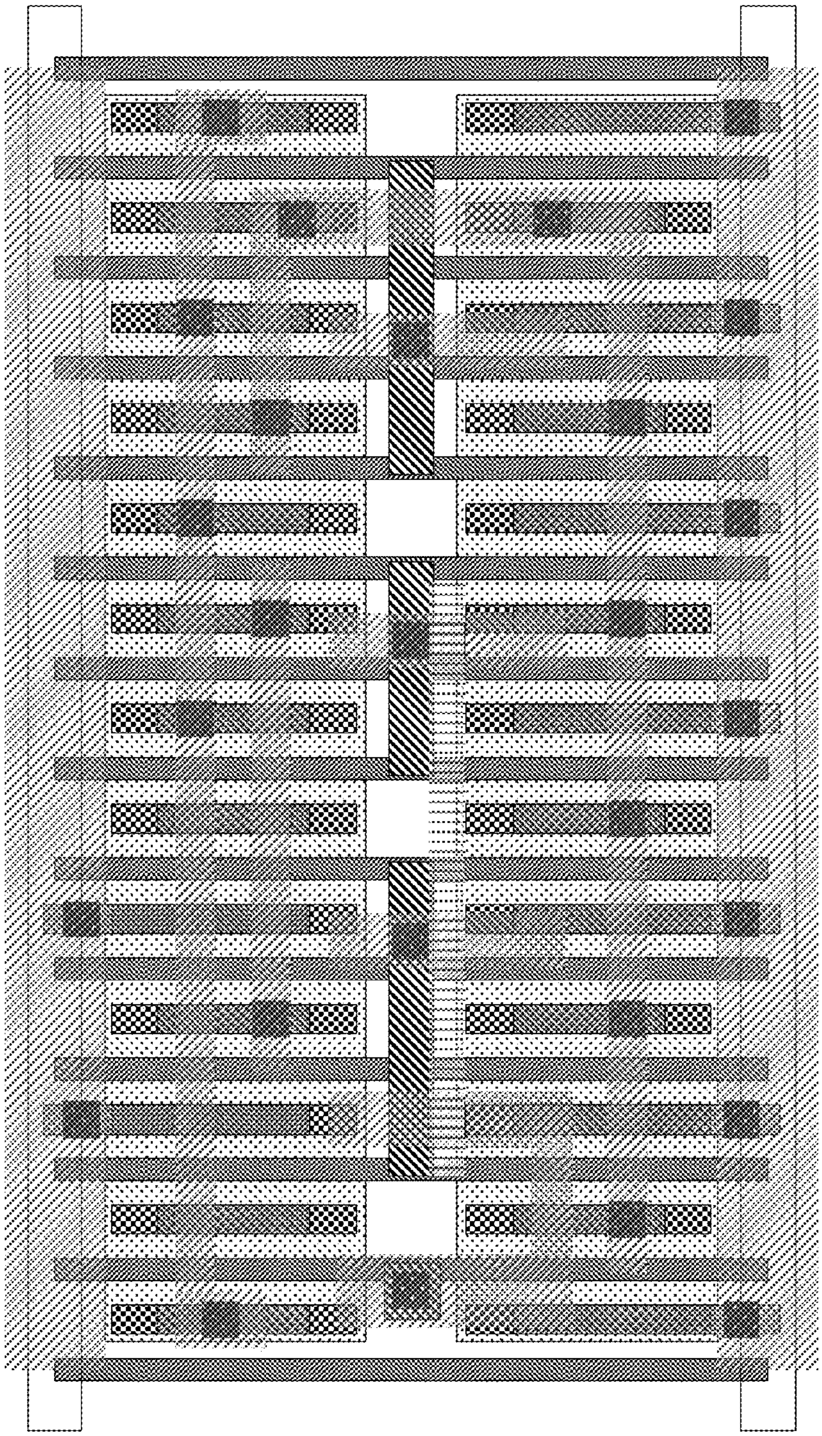
FIG. 388 depicts an NR3D4 cell.

Reference is made to FIG. 388, which depicts an NR3D4 cell. This cell implements the logic function nor(A,B,C) in drive strength 4.

Figure 389:
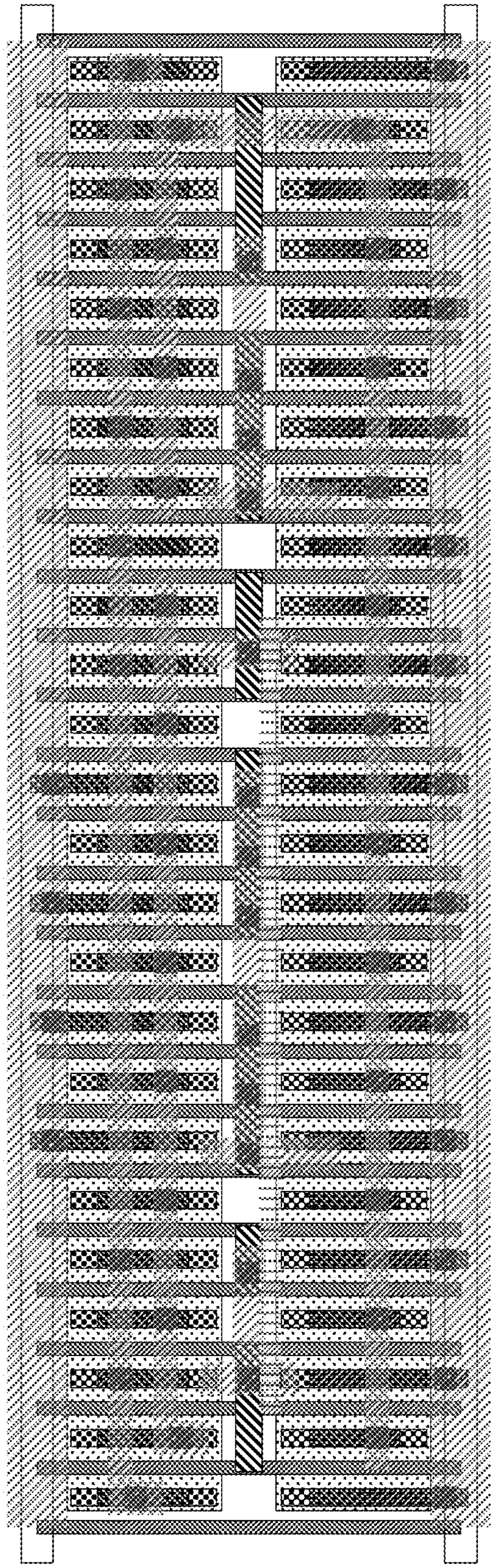
FIG. 389 depicts an NR3D8 cell.

Reference is made to FIG. 389, which depicts an NR3D8 cell. This cell implements the logic function nor(A,B,C) in drive strength 8.

Figure 390:
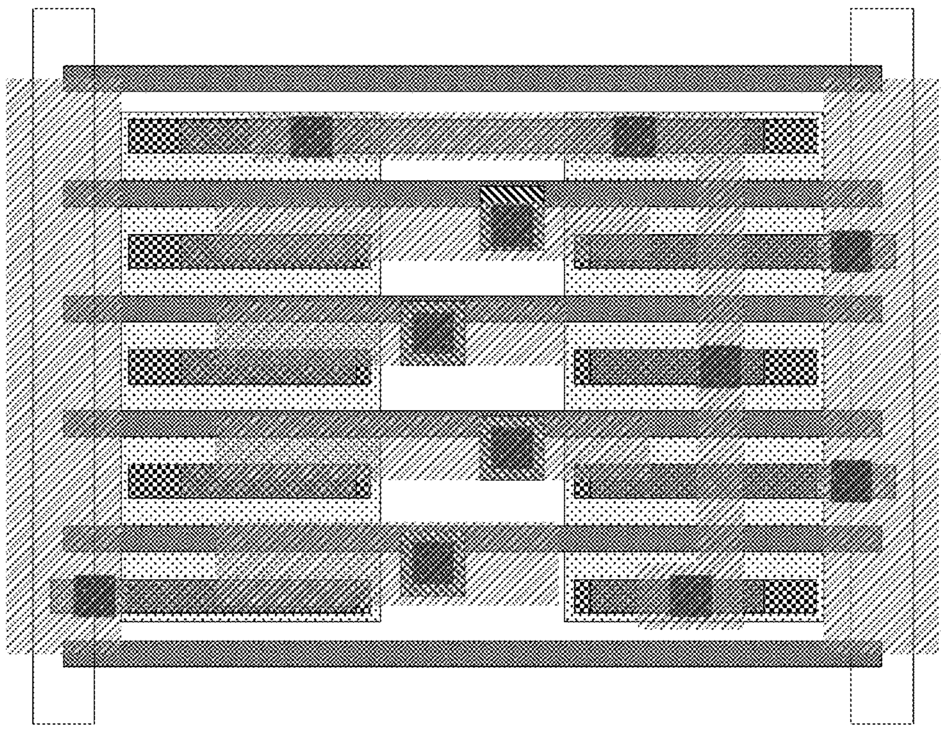
FIG. 390 depicts an NR4D1 cell.

Reference is made to FIG. 390, which depicts an NR4D1 cell. This cell implements the logic function nor(A,B,C,D) in drive strength 1.

Figure 391:
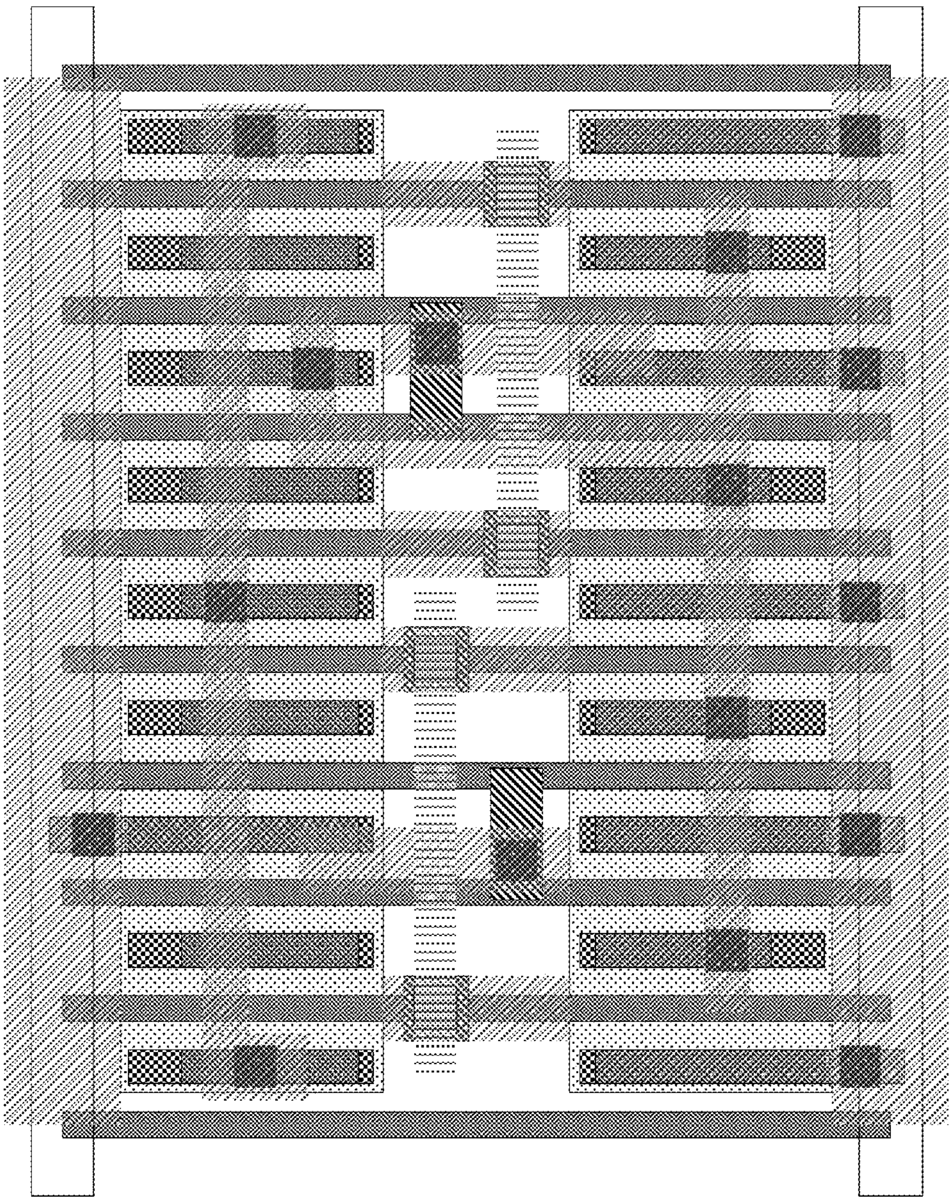
FIG. 391 depicts an NR4D2 cell.

Reference is made to FIG. 391, which depicts an NR4D2 cell. This cell implements the logic function nor(A,B,C,D) in drive strength 2.

Figure 392:
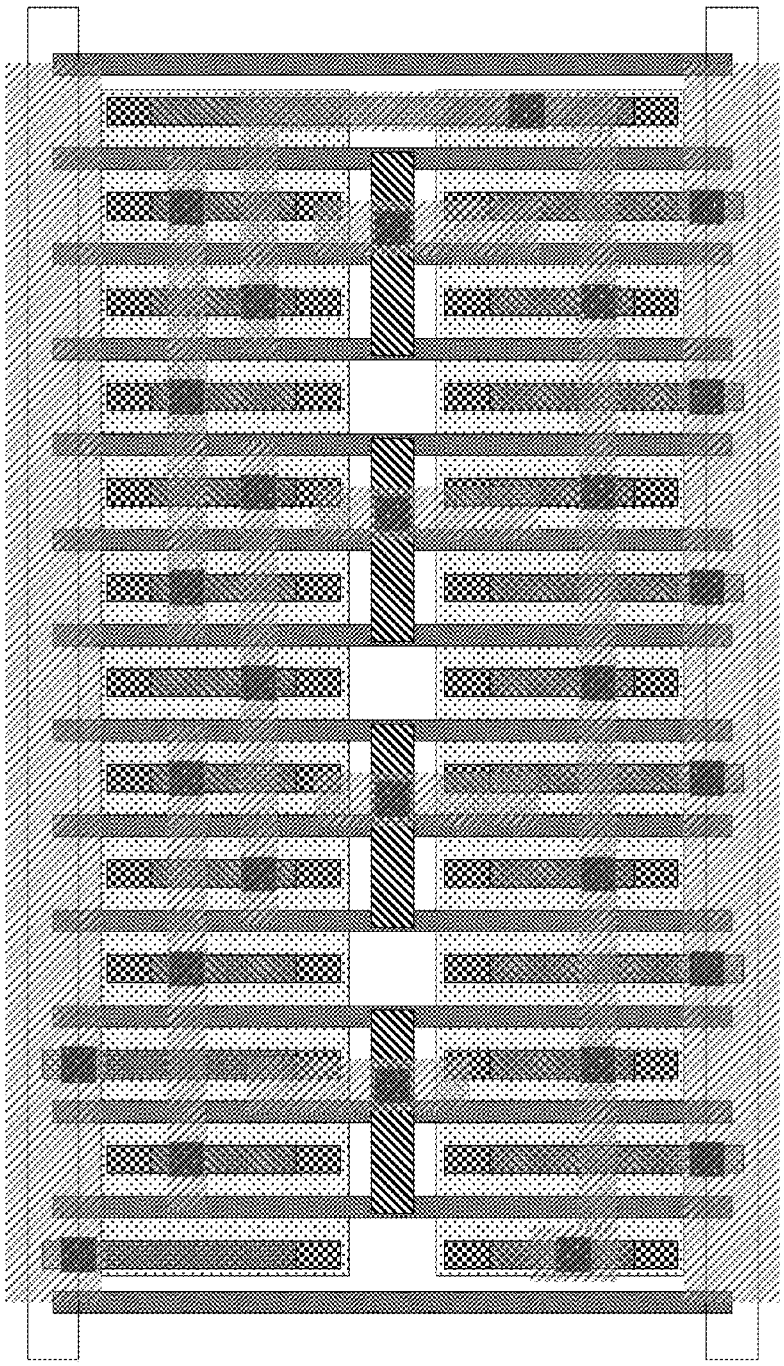
FIG. 392 depicts an NR4D3 cell.

Reference is made to FIG. 392, which depicts an NR4D3 cell. This cell implements the logic function nor(A,B,C,D) in drive strength 3.

Figure 393:
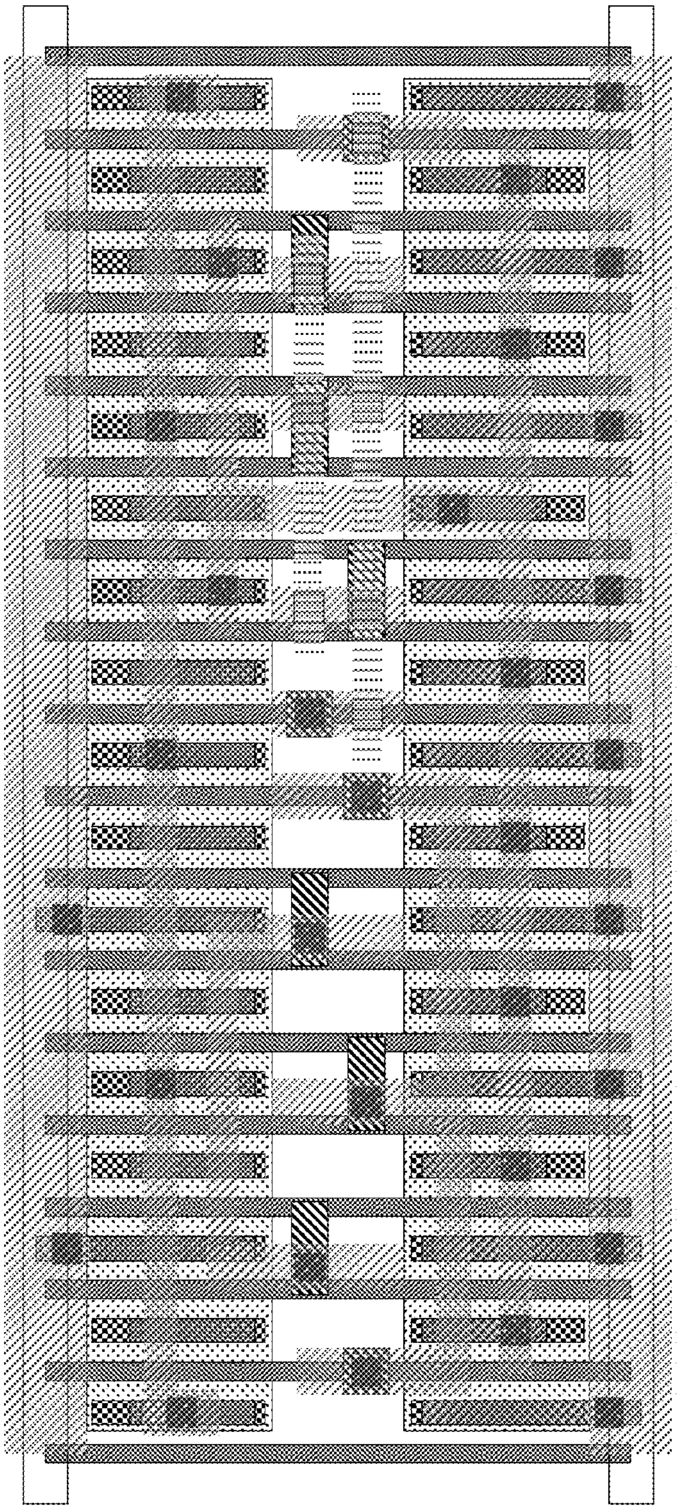
FIG. 393 depicts an NR4D4 cell.

Reference is made to FIG. 393, which depicts an NR4D4 cell. This cell implements the logic function nor(A,B,C,D) in drive strength 4.

Figure 394:
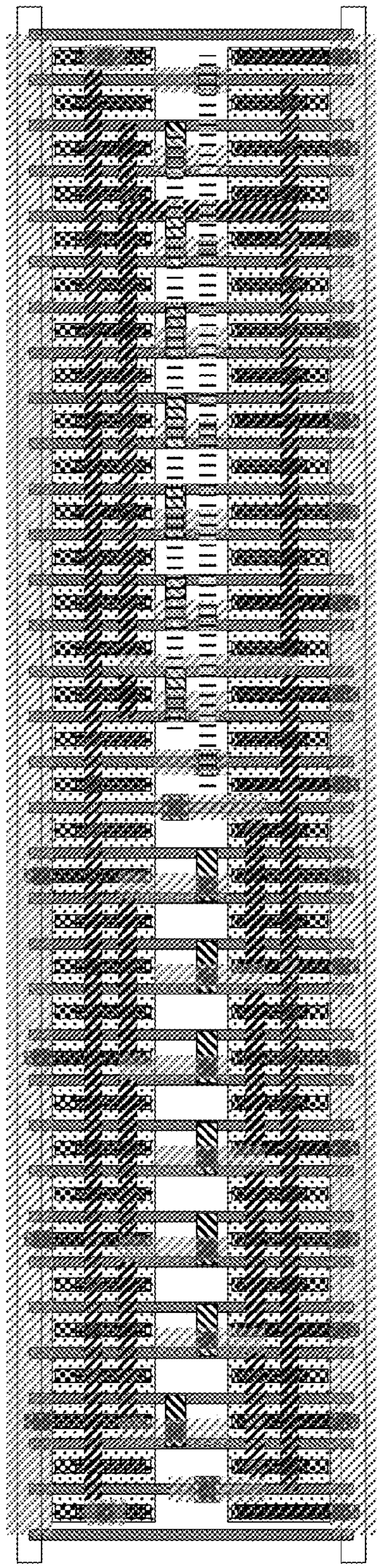
FIG. 394 depicts an NR4D8 cell.

Reference is made to FIG. 394, which depicts an NR4D8 cell. This cell implements the logic function nor(A,B,C,D) in drive strength 8.

Figure 395:
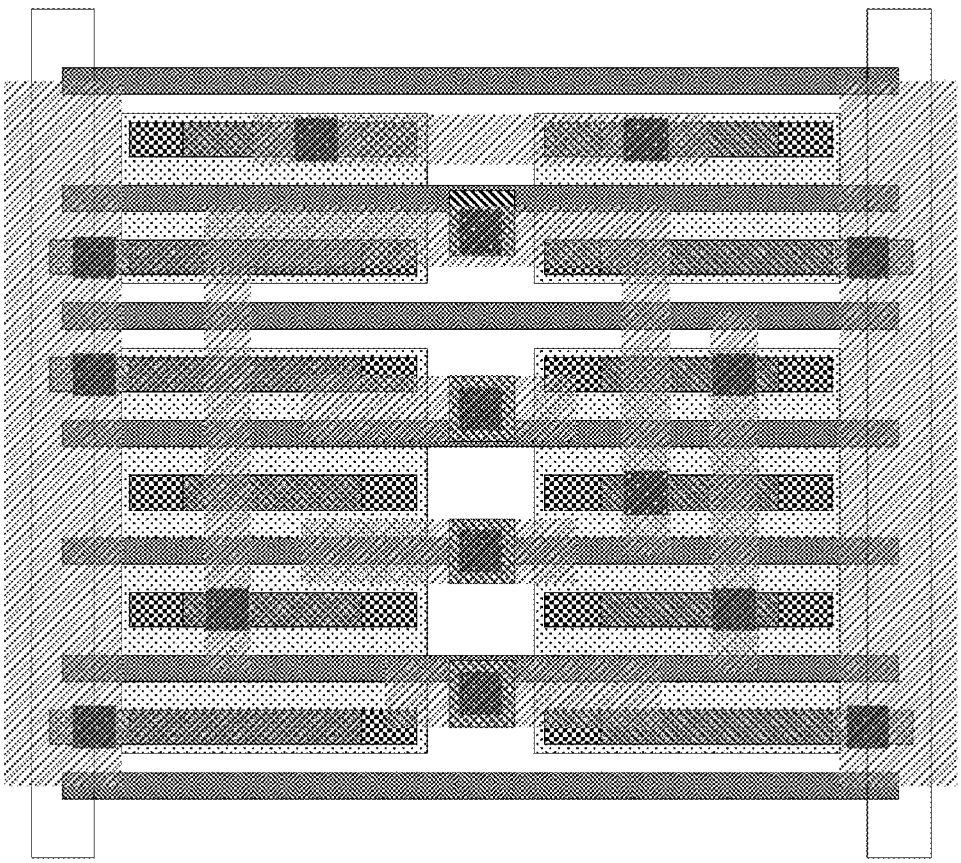
FIG. 395 depicts an OA21D1 cell.

Reference is made to FIG. 395, which depicts an OA21D1 cell. This cell implements the logic function and(or(A,B),C) in drive strength 1.

Figure 396:
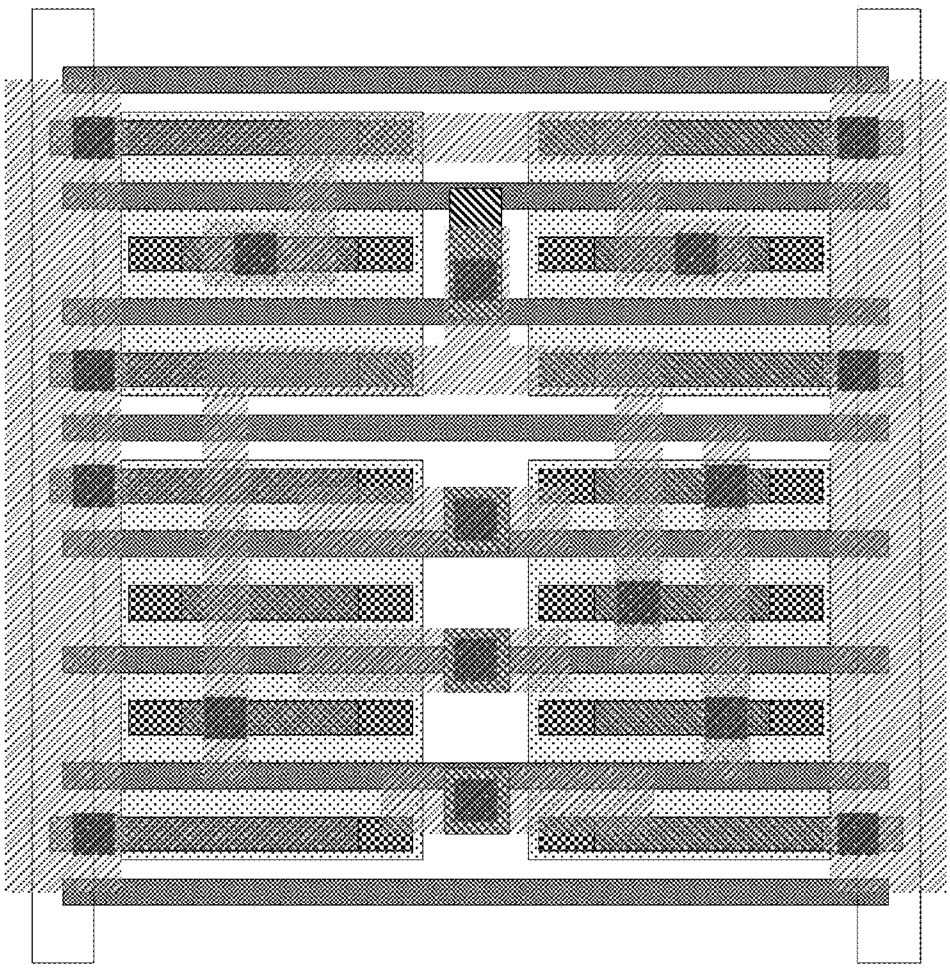
FIG. 396 depicts an OA21D2 cell.

Reference is made to FIG. 396, which depicts an OA21D2 cell. This cell implements the logic function and(or(A,B),C) in drive strength 2.

Figure 397:
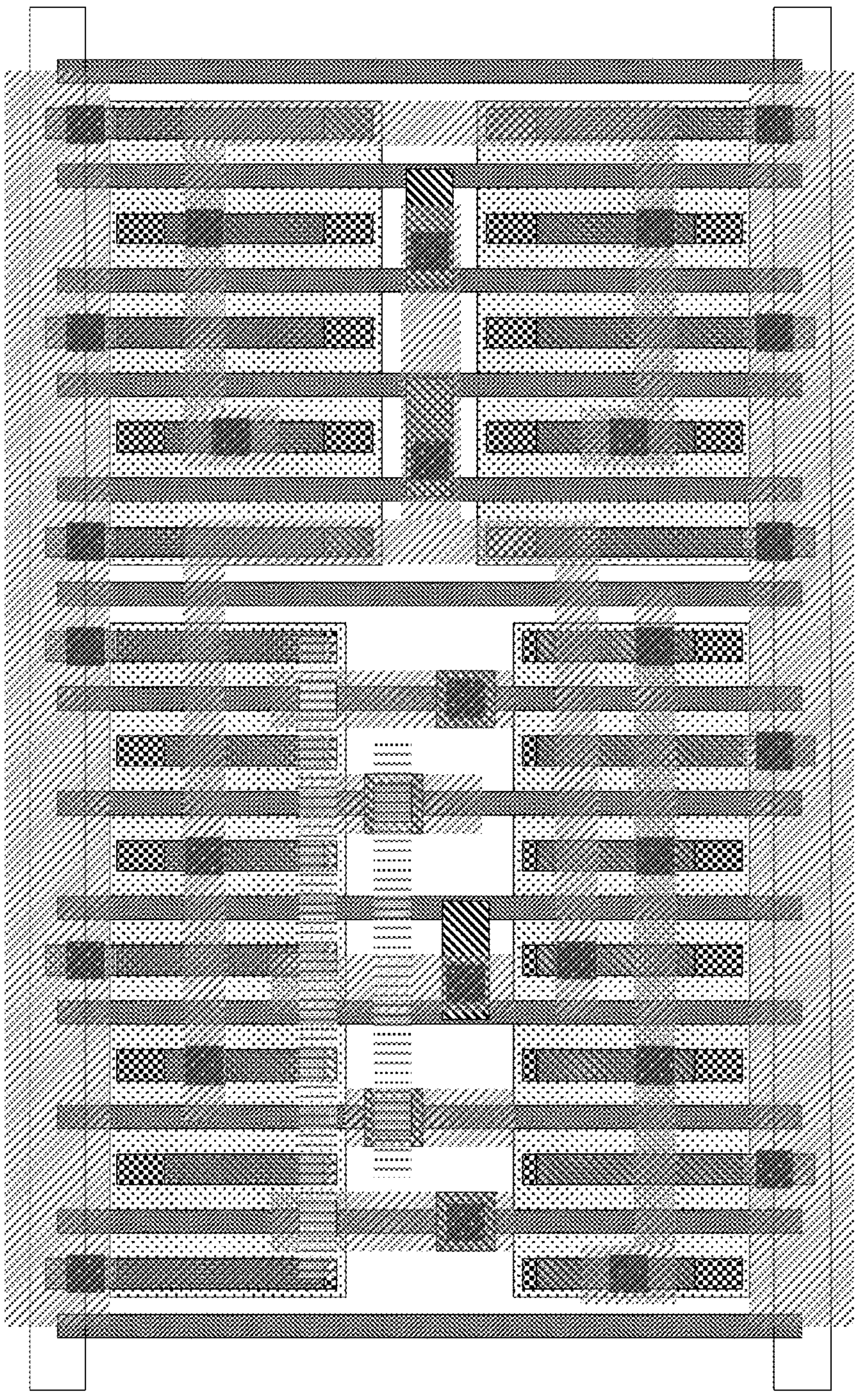
FIG. 397 depicts an OA21D4 cell.

Reference is made to FIG. 397, which depicts an OA21D4 cell. This cell implements the logic function and(or(A,B),C) in drive strength 4.

Figure 398:
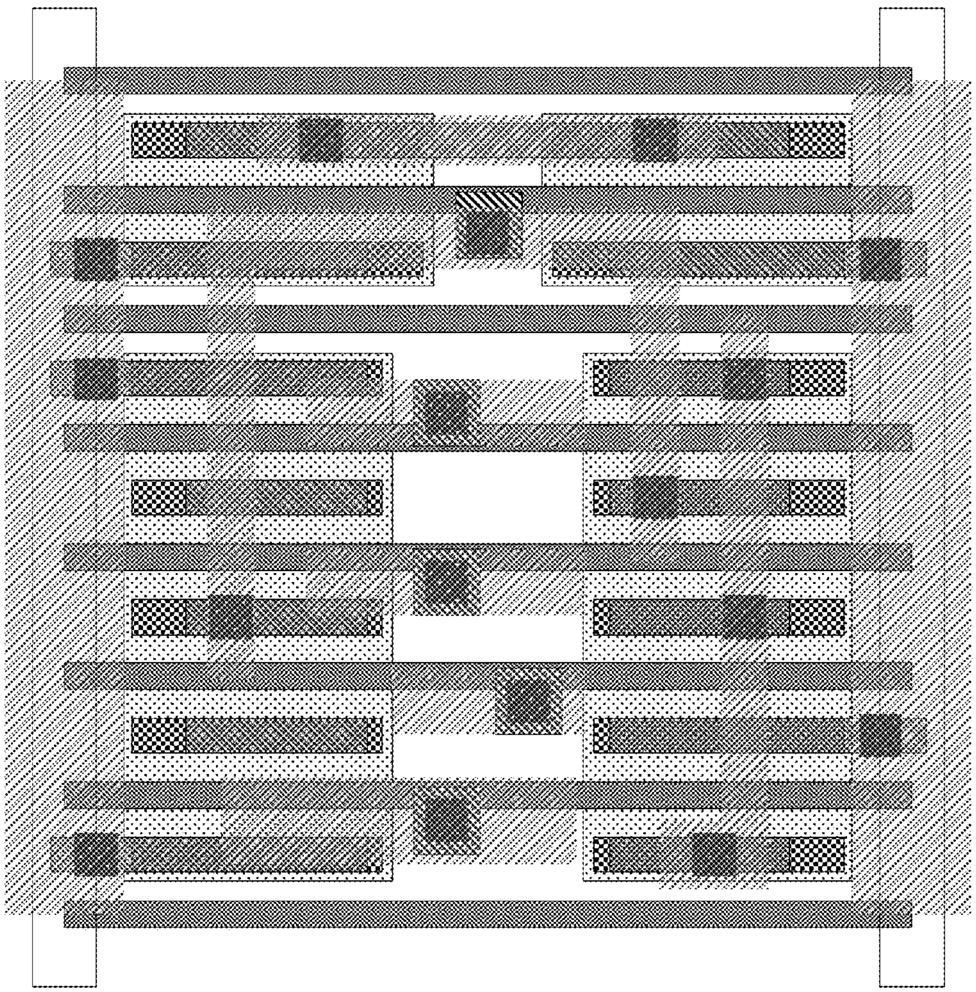
FIG. 398 depicts an OA22D1 cell.

Reference is made to FIG. 398, which depicts an OA22D1 cell. This cell implements the logic function and(or(A,B), or(C,D)) in drive strength 1.

Figure 399:
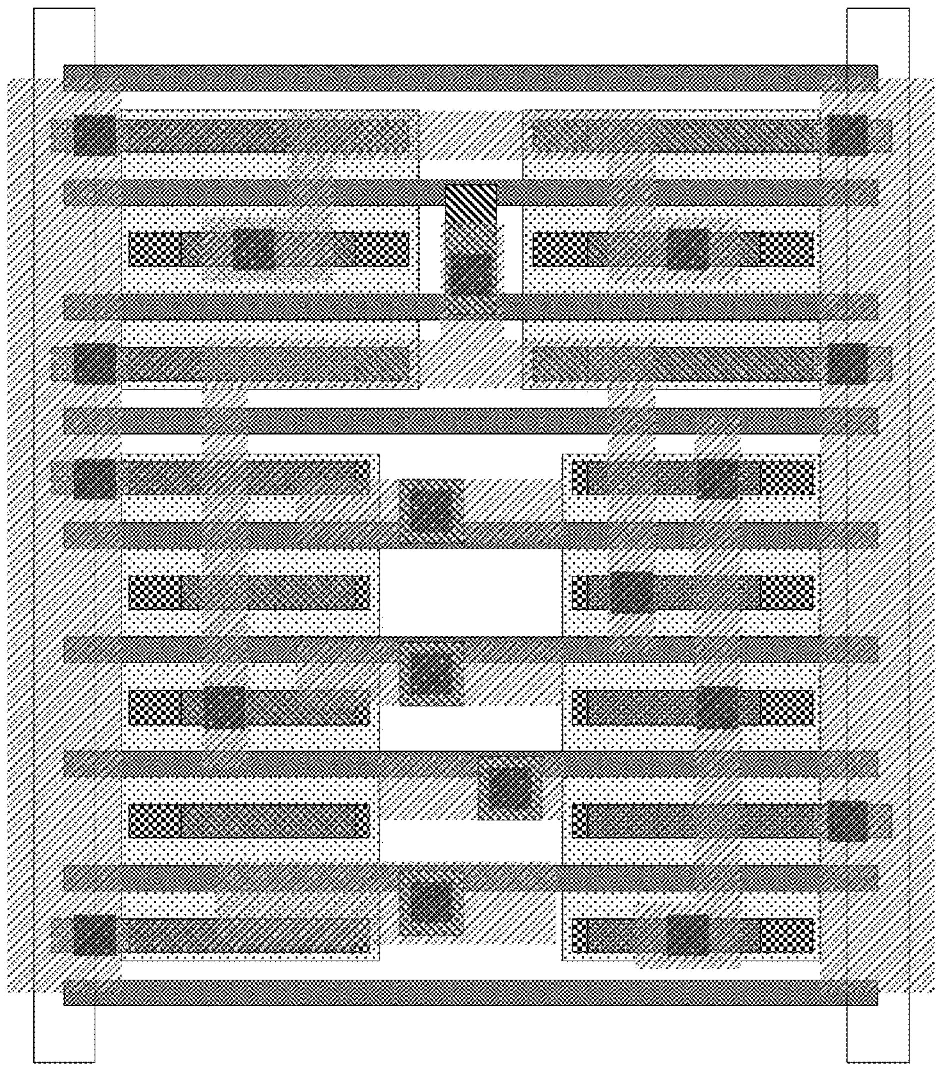
FIG. 399 depicts an OA22D2 cell.

Reference is made to FIG. 399, which depicts an OA22D2 cell. This cell implements the logic function and(or(A,B), or(C,D)) in drive strength 2.

Figure 400:
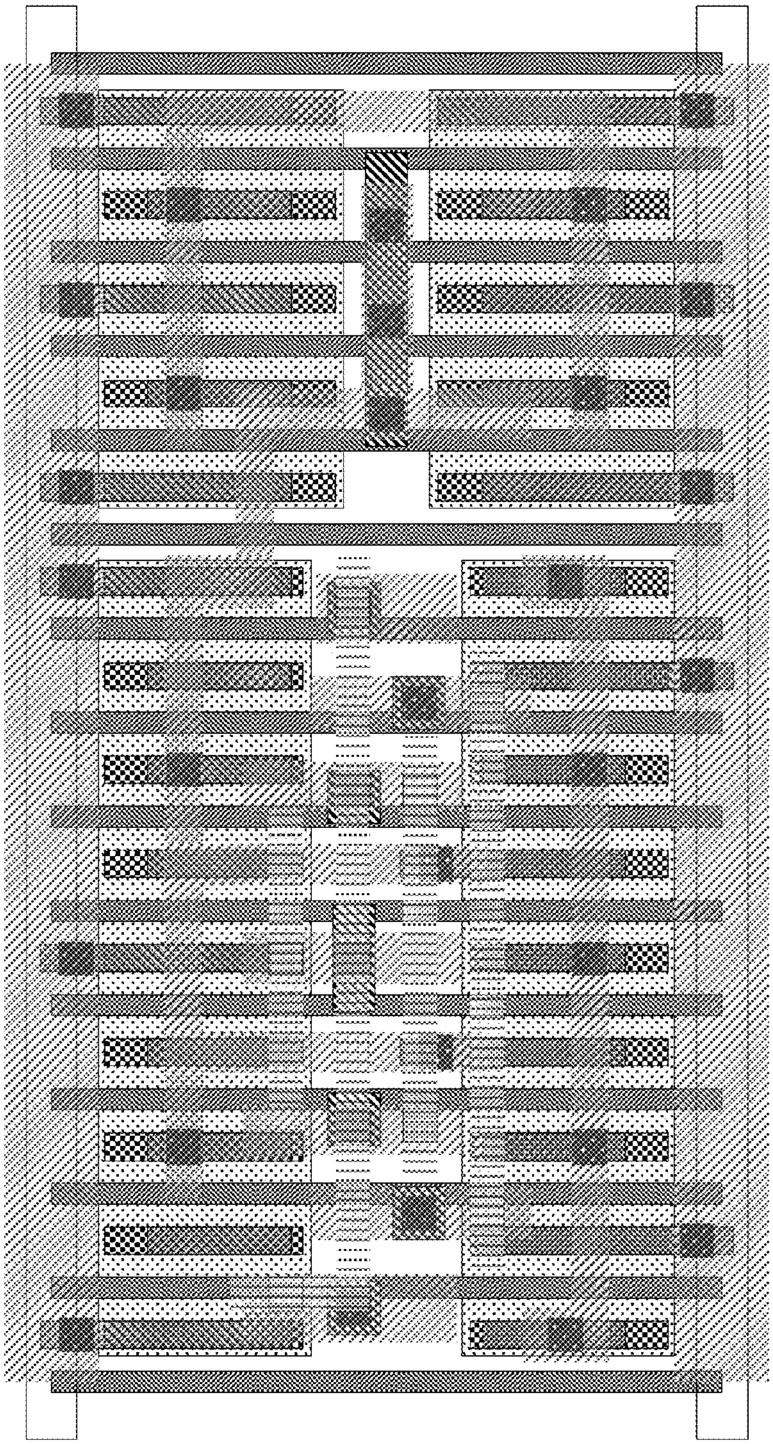
FIG. 400 depicts an OA22D4 cell.

Reference is made to FIG. 400, which depicts an OA22D4 cell. This cell implements the logic function and(or(A,B), or(C,D)) in drive strength 4.

Figure 401:
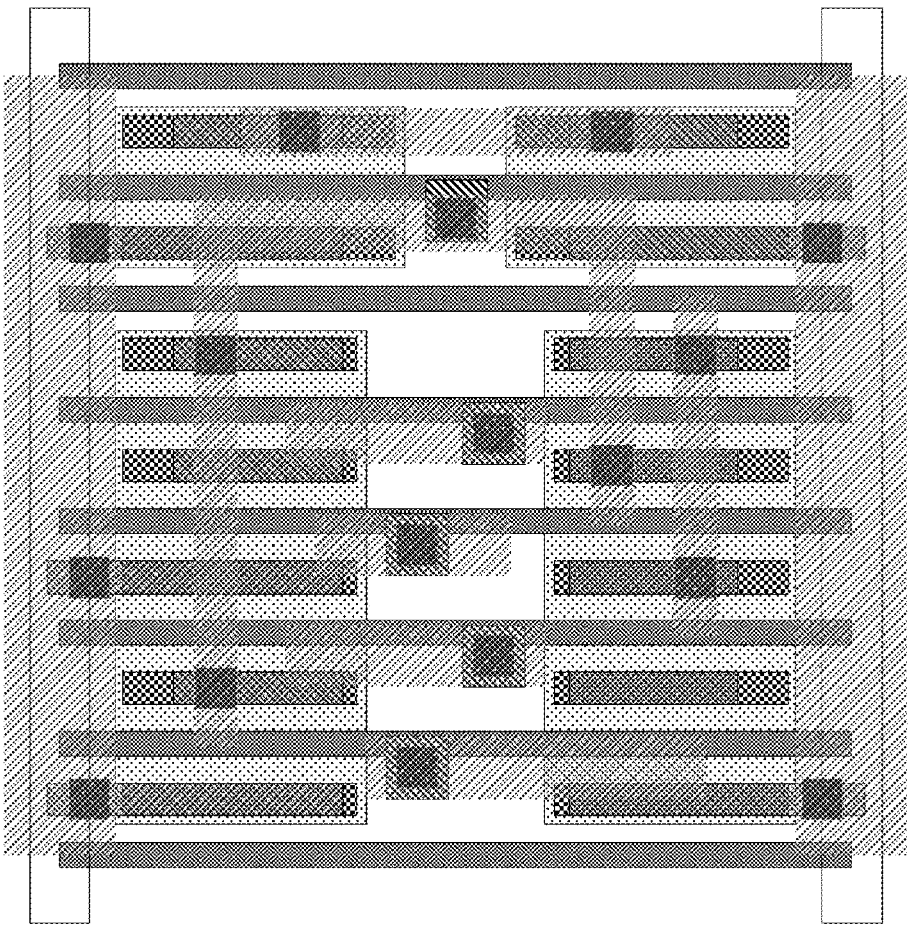
FIG. 401 depicts an OA211D1 cell.

Reference is made to FIG. 401, which depicts an OA211D1 cell. This cell implements the logic function and(or(A,B),C,D) in drive strength 1.

Figure 402:
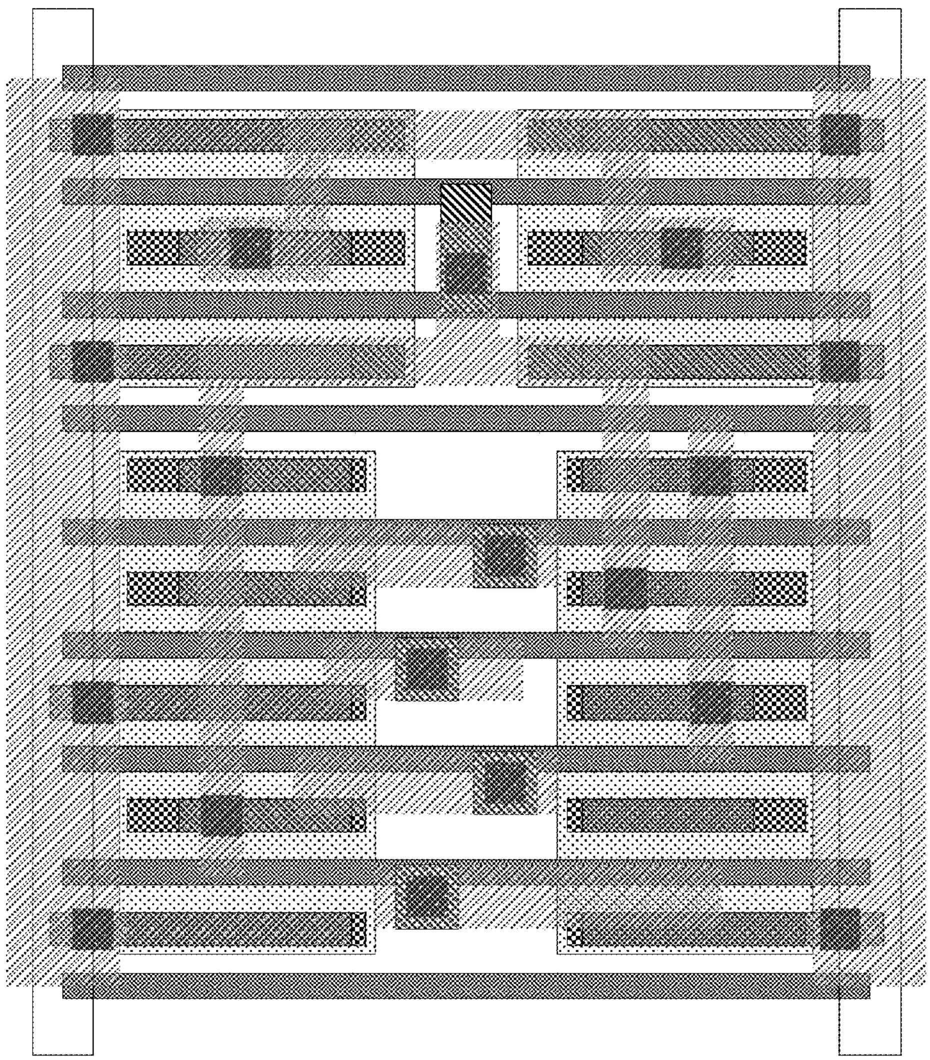
FIG. 402 depicts an OA211D2 cell.

Reference is made to FIG. 402, which depicts an OA211D2 cell. This cell implements the logic function and(or(A,B),C,D) in drive strength 2.

Figure 403:
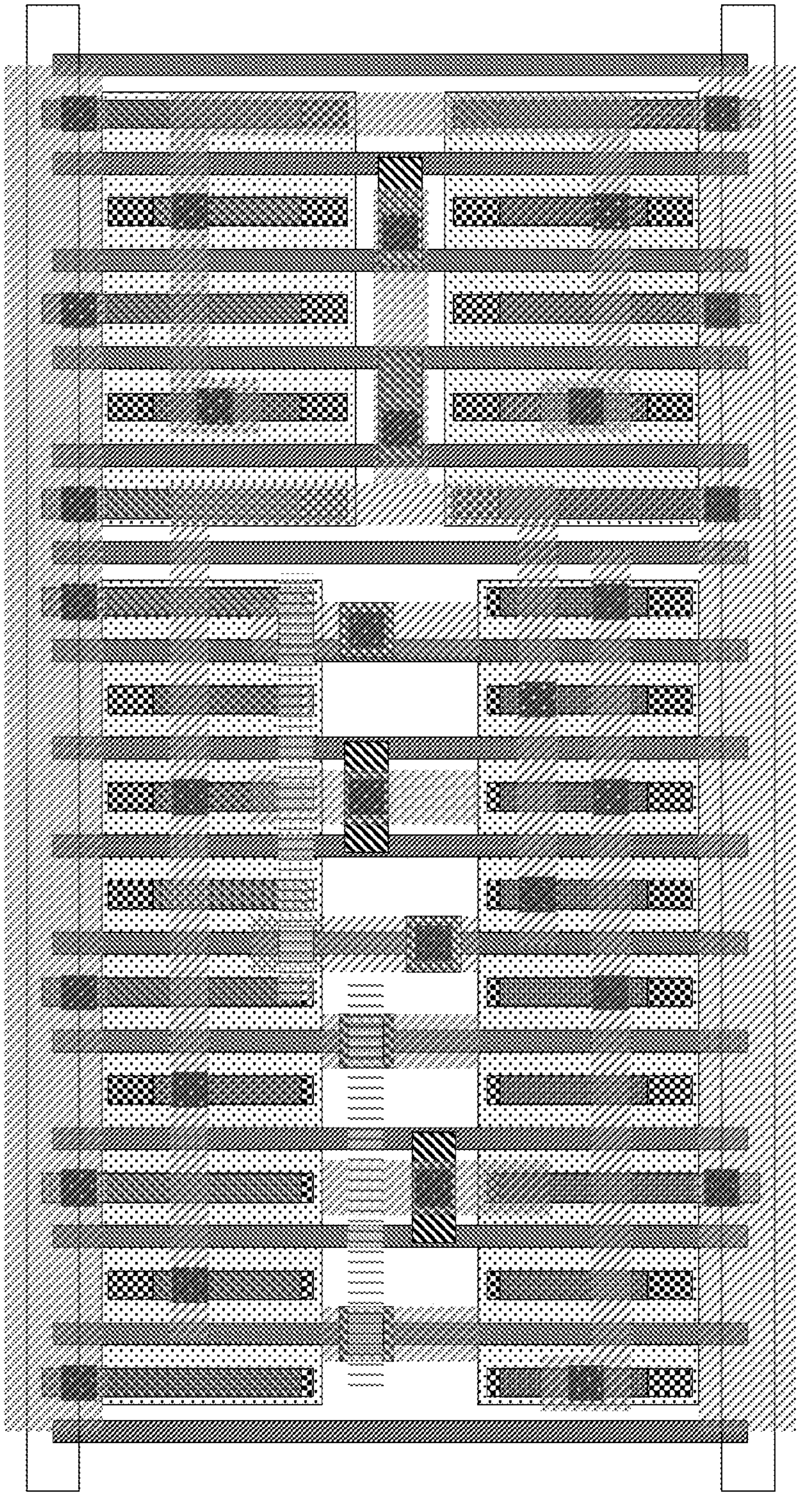
FIG. 403 depicts an OA211D4 cell.

Reference is made to FIG. 403, which depicts an OA211D4 cell. This cell implements the logic function and(or(A,B),C,D) in drive strength 4.

Figure 404:
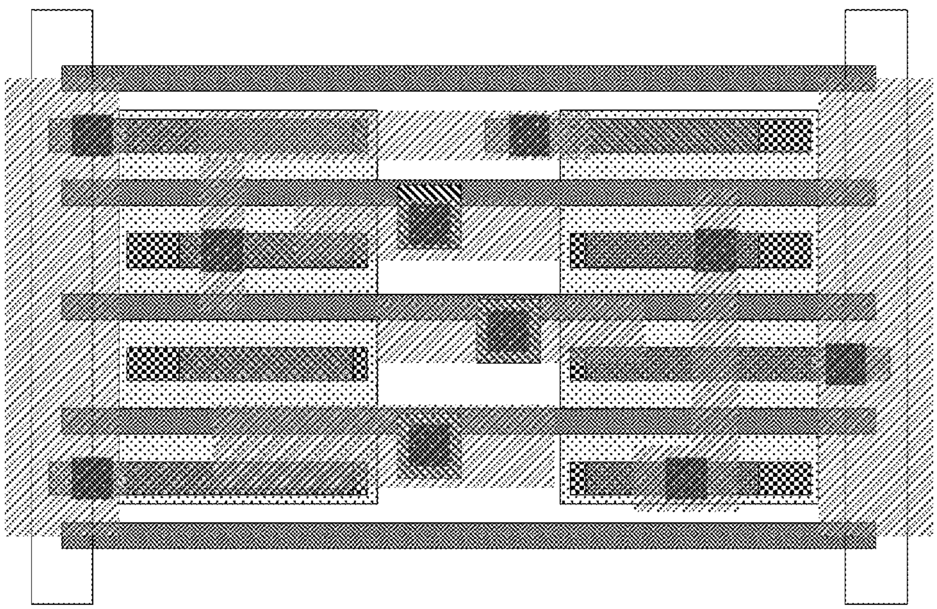
FIG. 404 depicts an OAI21D1 cell.

Reference is made to FIG. 404, which depicts an OAI21D1 cell. This cell implements the logic function nand(or(A,B),C) in drive strength 1.

Figure 405:
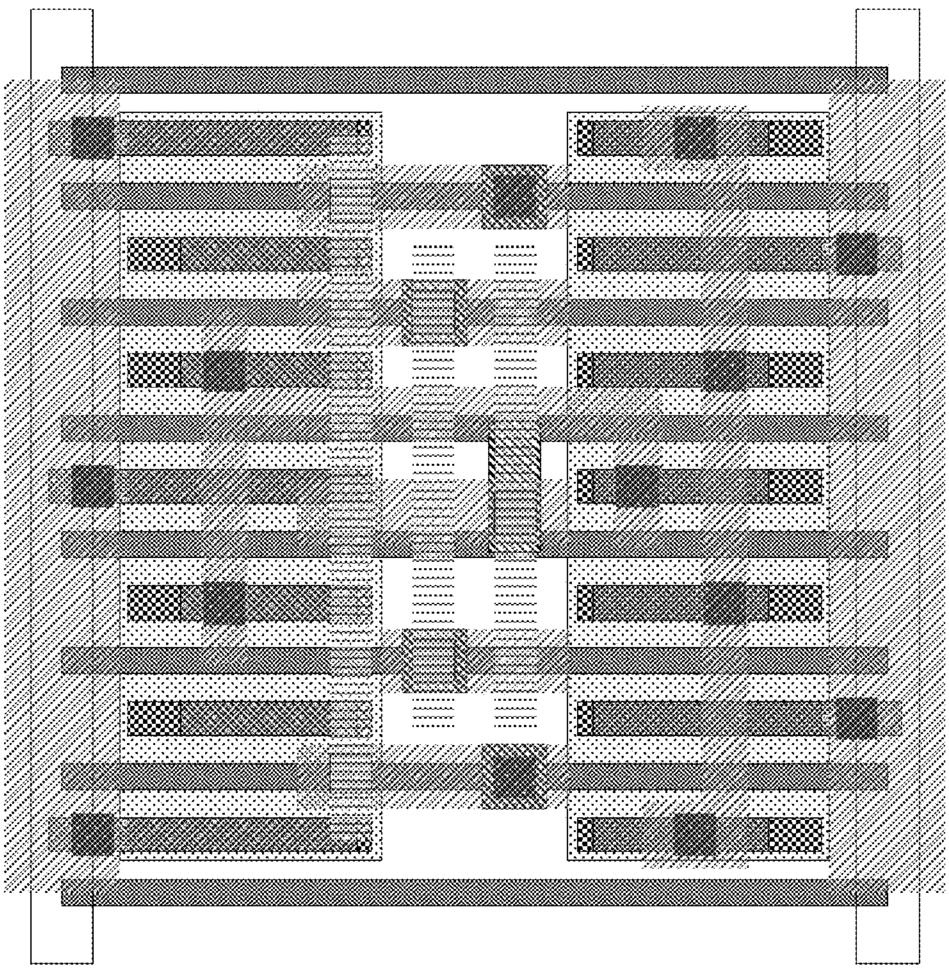
FIG. 405 depicts an OAI21D2 cell.

Reference is made to FIG. 405, which depicts an OAI21D2 cell. This cell implements the logic function nand(or(A,B),C) in drive strength 2.

Figure 406:
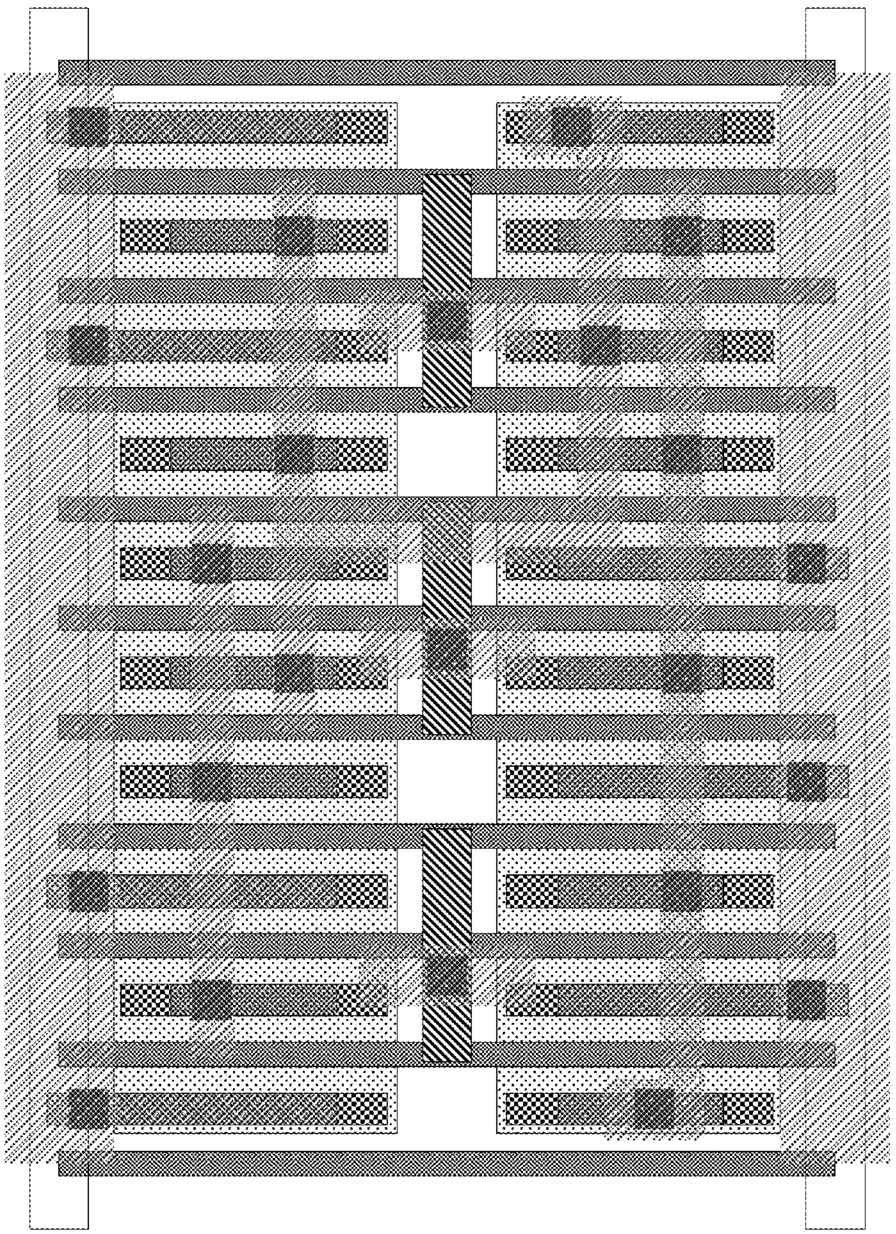
FIG. 406 depicts an OAI21D3 cell.

Reference is made to FIG. 406, which depicts an OAI21D3 cell. This cell implements the logic function nand(or(A,B),C) in drive strength 3.

Figure 407:
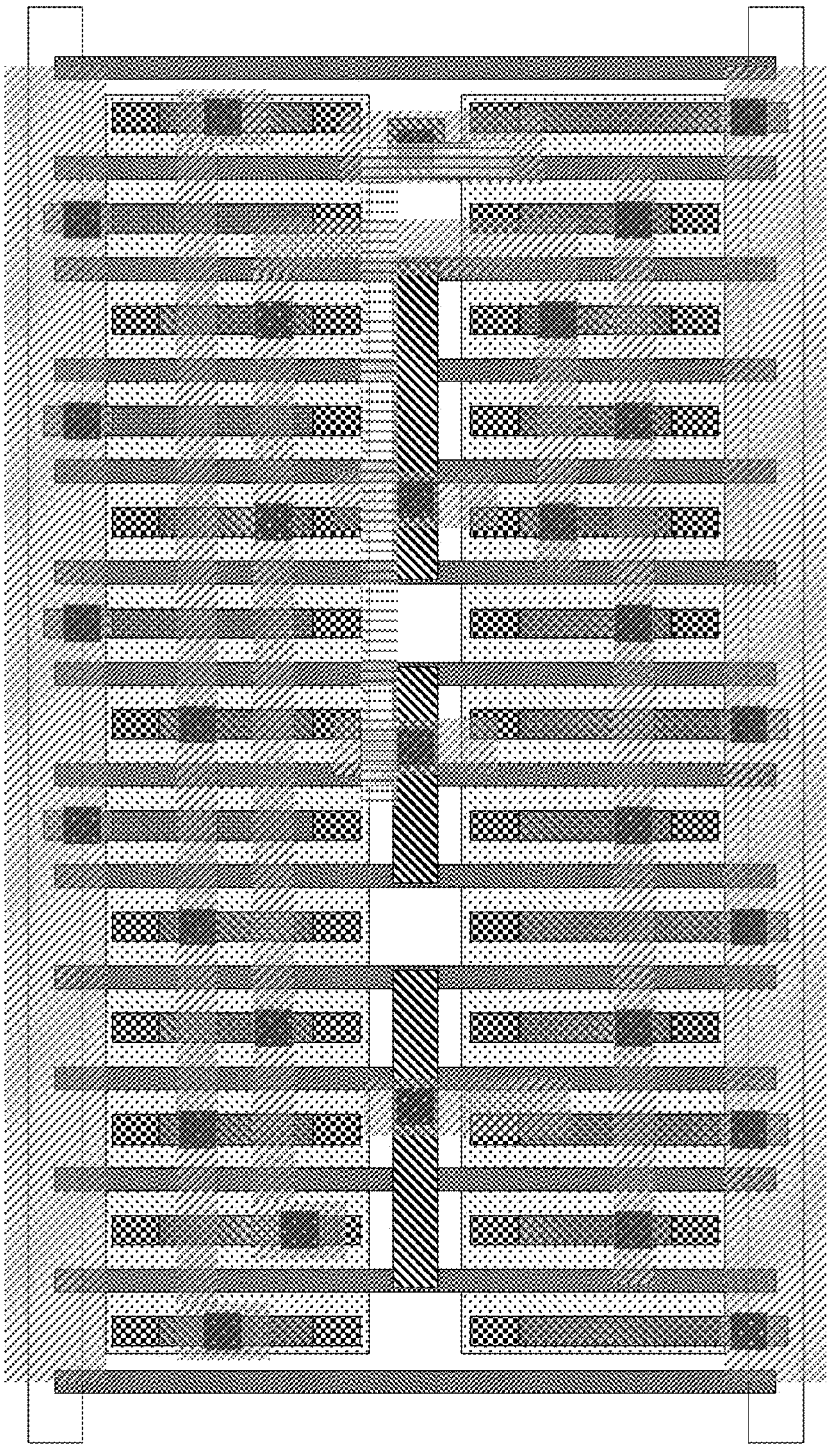
FIG. 407 depicts an OAI21D4 cell.

Reference is made to FIG. 407, which depicts an OAI21D4 cell. This cell implements the logic function nand(or(A,B),C) in drive strength 4.

Figure 408:
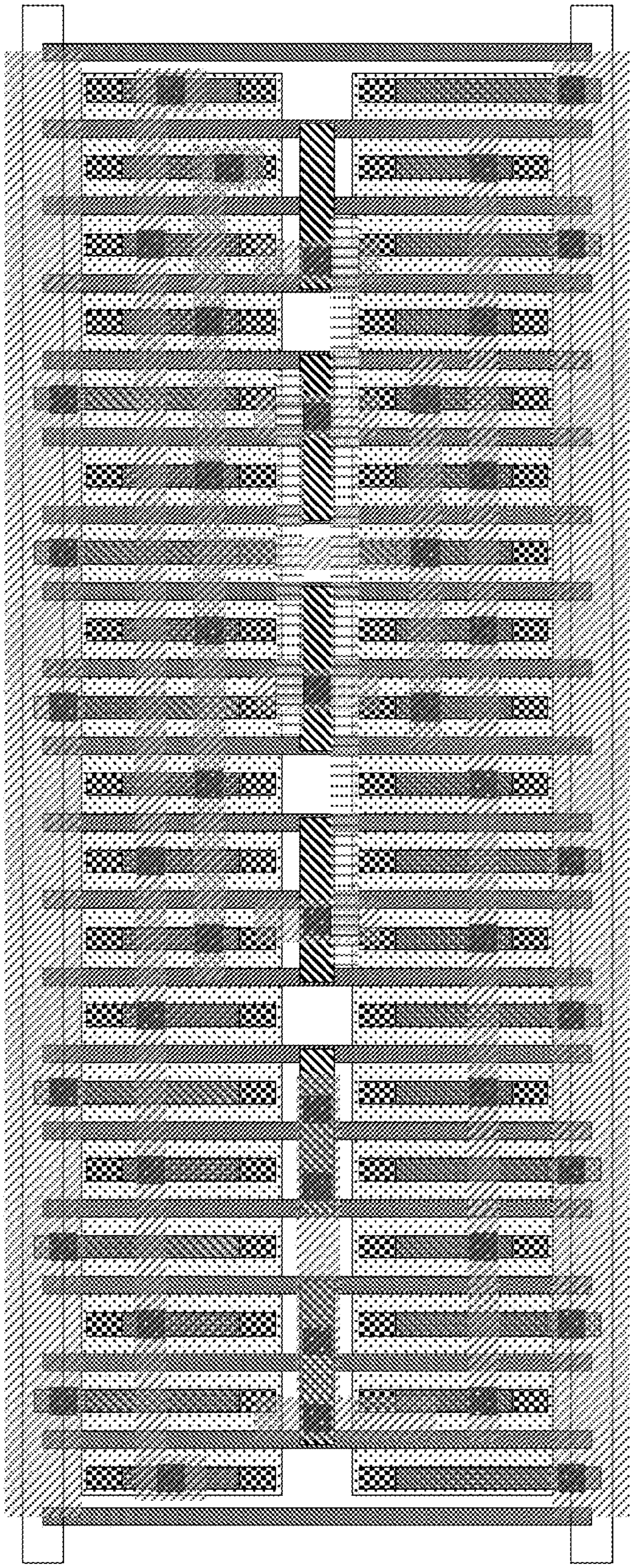
FIG. 408 depicts an OAI21D6 cell.

Reference is made to FIG. 408, which depicts an OAI21D6 cell. This cell implements the logic function nand(or(A,B),C) in drive strength 6.

Figure 409:
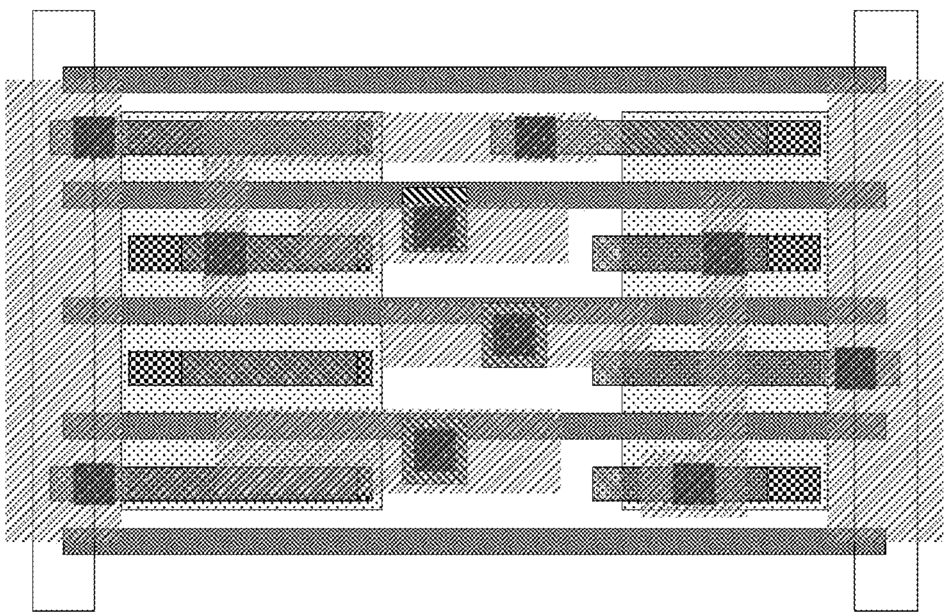
FIG. 409 depicts an OAI21XD1 cell.

Reference is made to FIG. 409, which depicts an OAI21XD1 cell. This is an alternative embodiment of the OAI21D1 cell.

Figure 410:
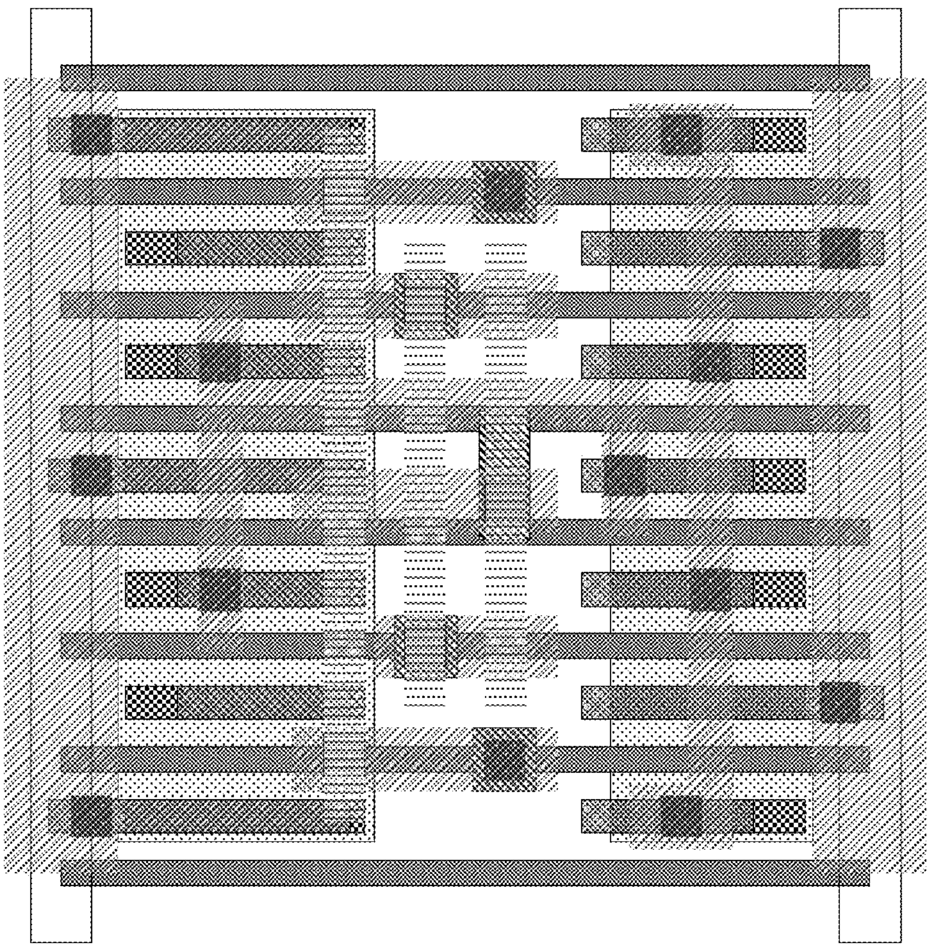
FIG. 410 depicts an OAI21XD2 cell.

Reference is made to FIG. 410, which depicts an OAI21XD2 cell. This is an alternative embodiment of the OAI21D2 cell.

Figure 411:
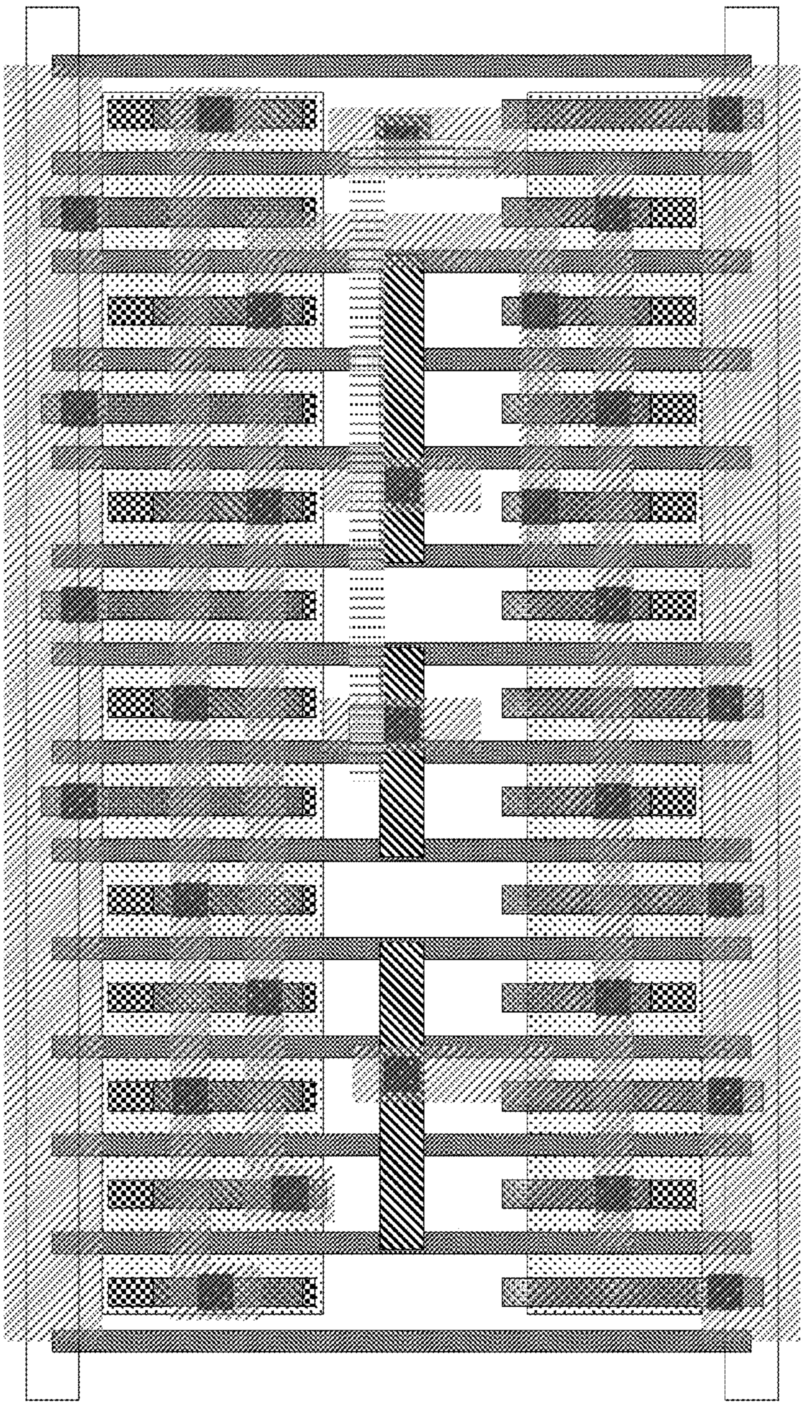
FIG. 411 depicts an OAI21XD4 cell.

Reference is made to FIG. 411, which depicts an OAI21XD4 cell. This is an alternative embodiment of the OAI21D4 cell.

Figure 412:
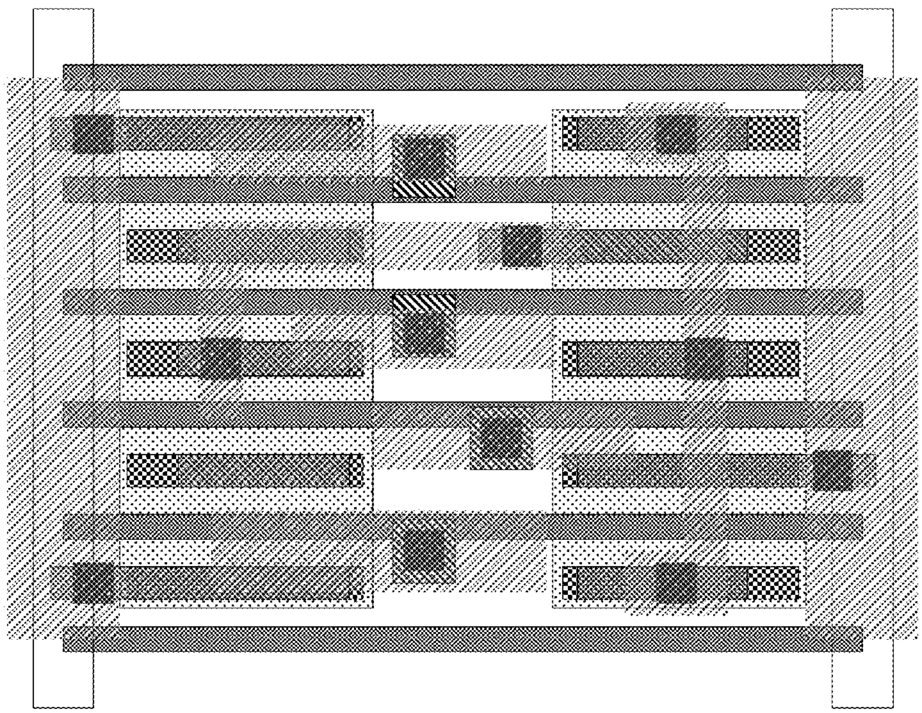
FIG. 412 depicts an OAI22D1 cell.

Reference is made to FIG. 412, which depicts an OAI22D1 cell. This cell implements the logic function nand(or(A,B),or(C,D)) in drive strength 1.

Figure 413:
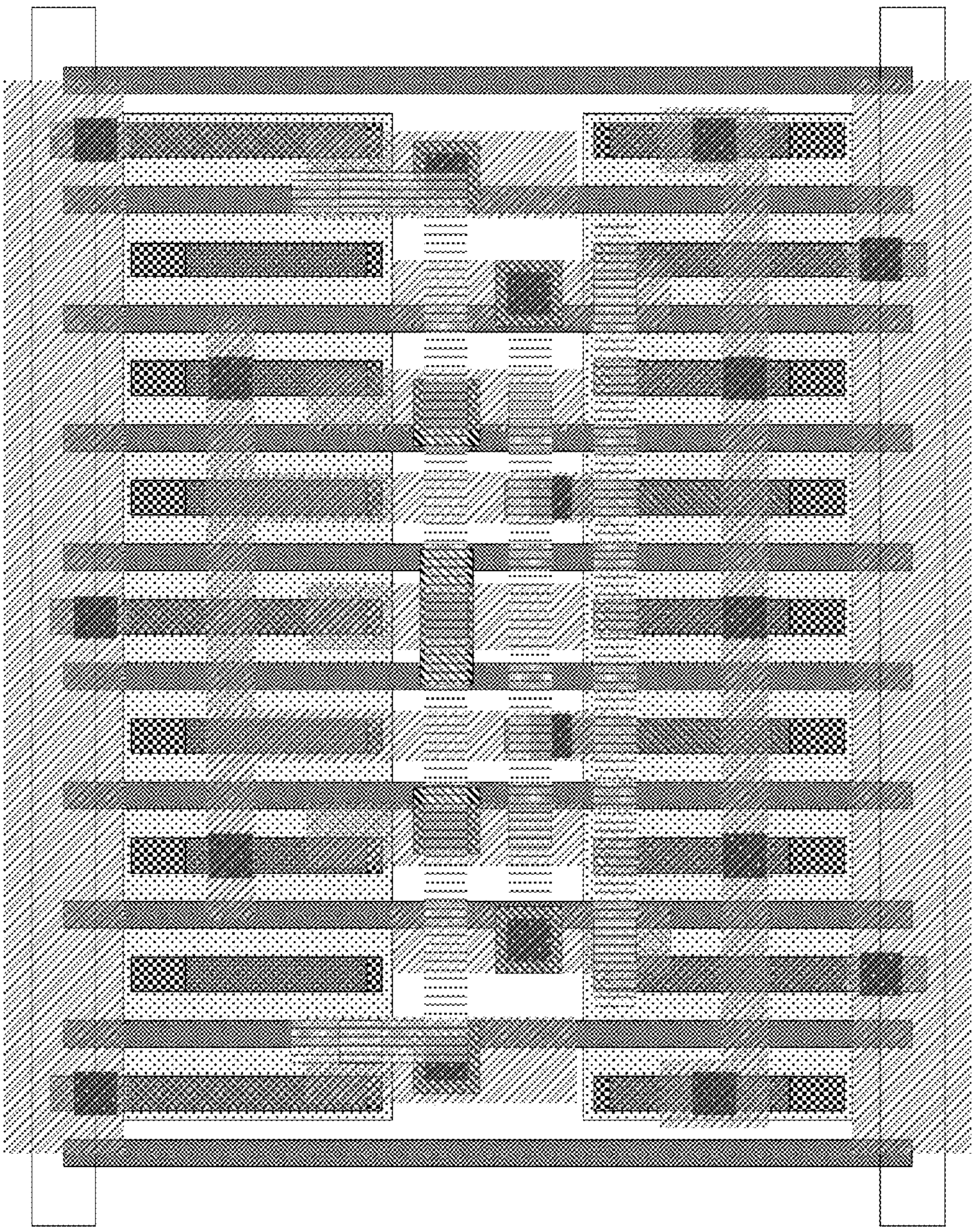
FIG. 413 depicts an OAI22D2 cell.

Reference is made to FIG. 413, which depicts an OAI22D2 cell. This cell implements the logic function nand(or(A,B),or(C,D)) in drive strength 2.

Figure 414:
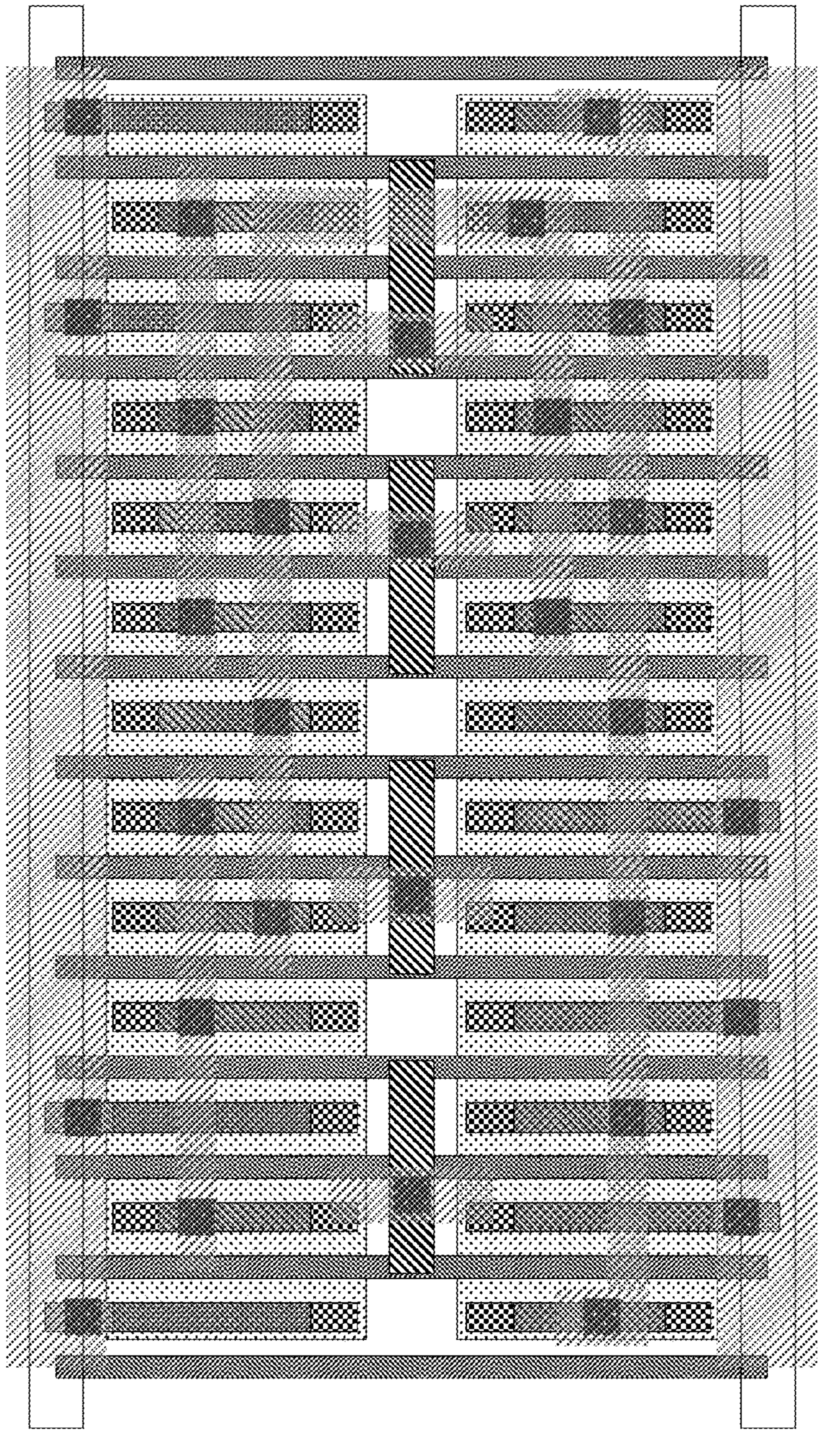
FIG. 414 depicts an OAI22D3 cell.

Reference is made to FIG. 414, which depicts an OAI22D3 cell. This cell implements the logic function nand(or(A,B),or(C,D)) in drive strength 3.

Figure 415:
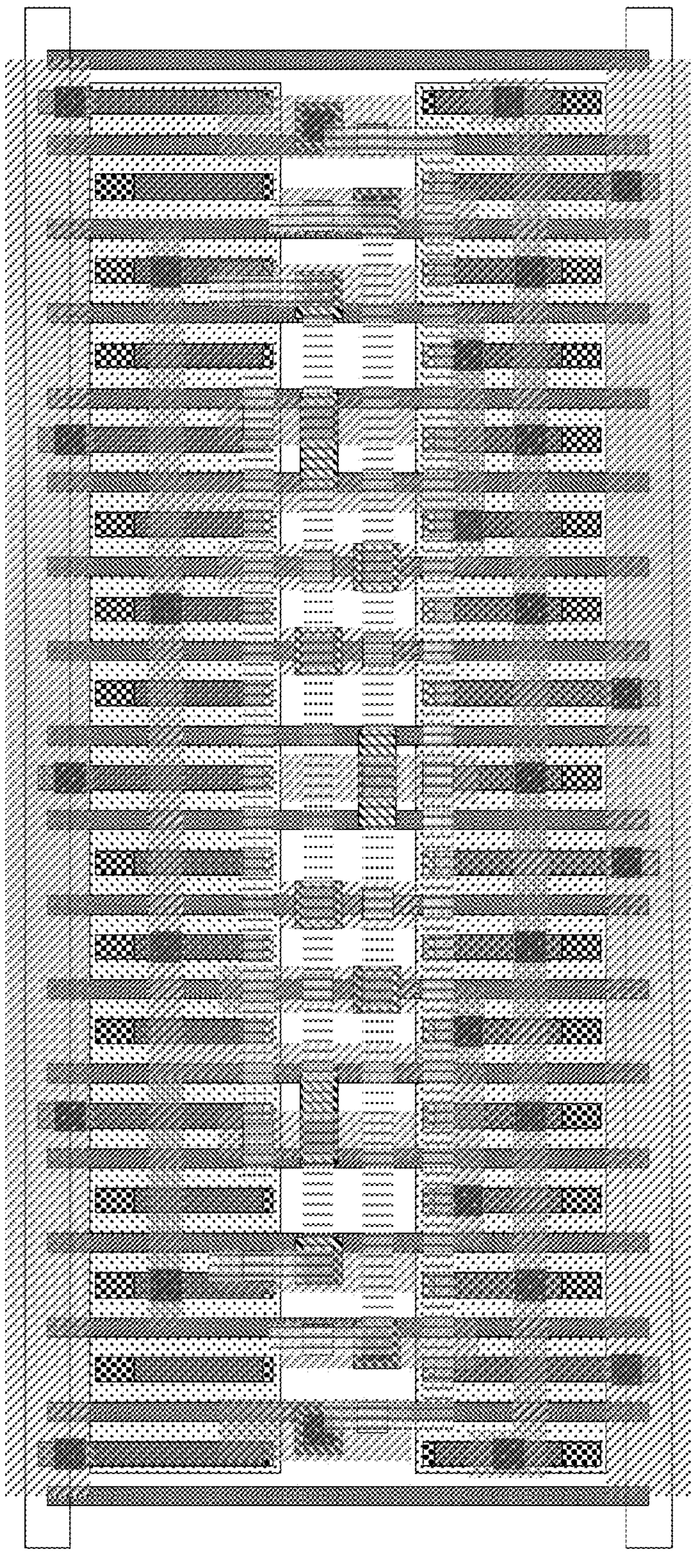
FIG. 415 depicts an OAI22D4 cell.

Reference is made to FIG. 415, which depicts an OAI22D4 cell. This cell implements the logic function nand(or(A,B),or(C,D)) in drive strength 4.

Figure 416:
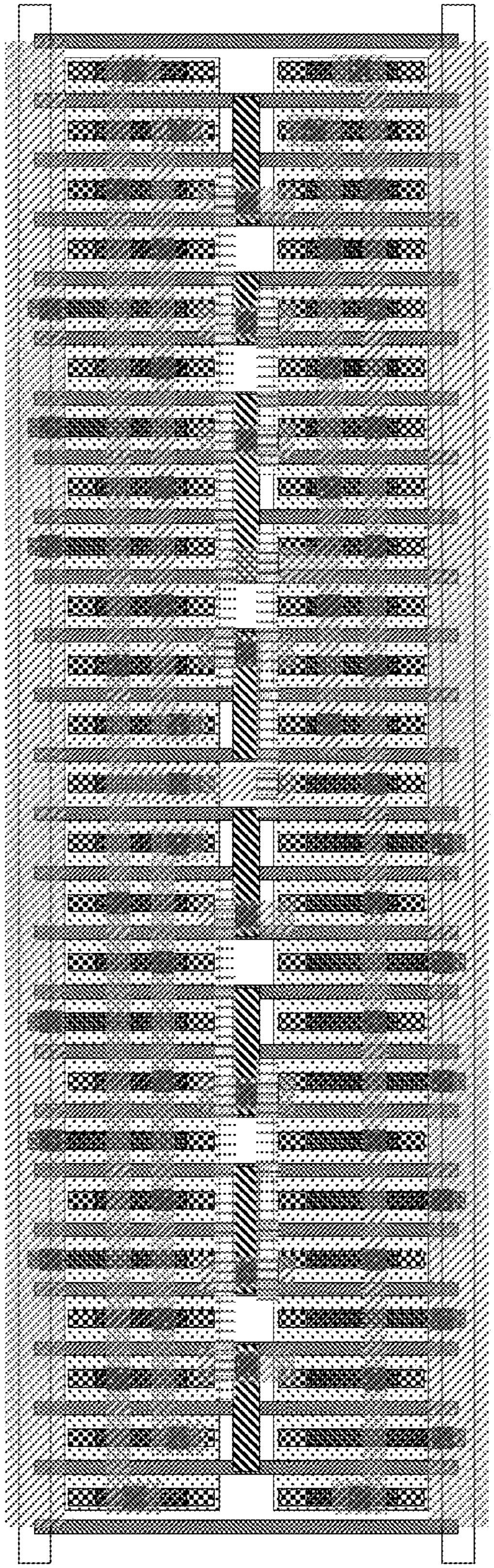
FIG. 416 depicts an OAI22D6 cell.

Reference is made to FIG. 416, which depicts an OAI22D6 cell. This cell implements the logic function nand(or(A,B),or(C,D)) in drive strength 6.

Figure 417:
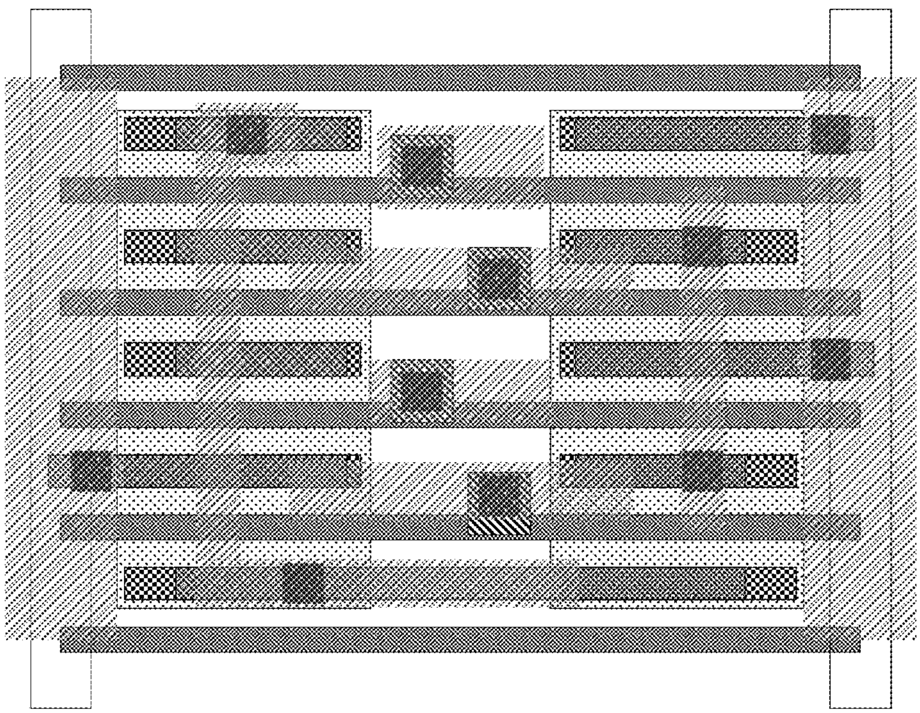
FIG. 417 depicts an OAI31D1 cell.

Reference is made to FIG. 417, which depicts an OAI31D1 cell. This cell implements the logic function nand(or(A,B,C),D) in drive strength 1.

Figure 418:
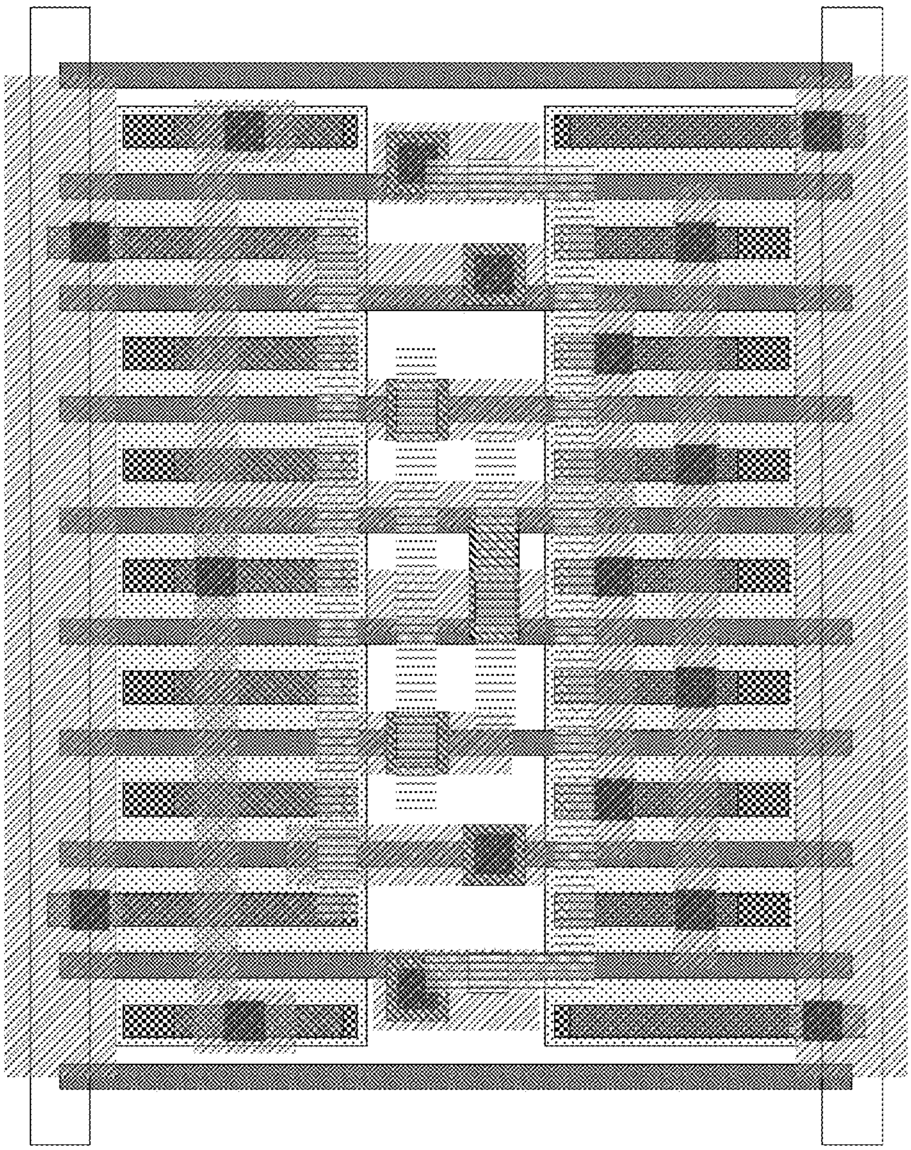
FIG. 418 depicts an OAI31D2 cell.

Reference is made to FIG. 418, which depicts an OAI31D2 cell. This cell implements the logic function nand(or(A,B,C),D) in drive strength 2.

Figure 419:
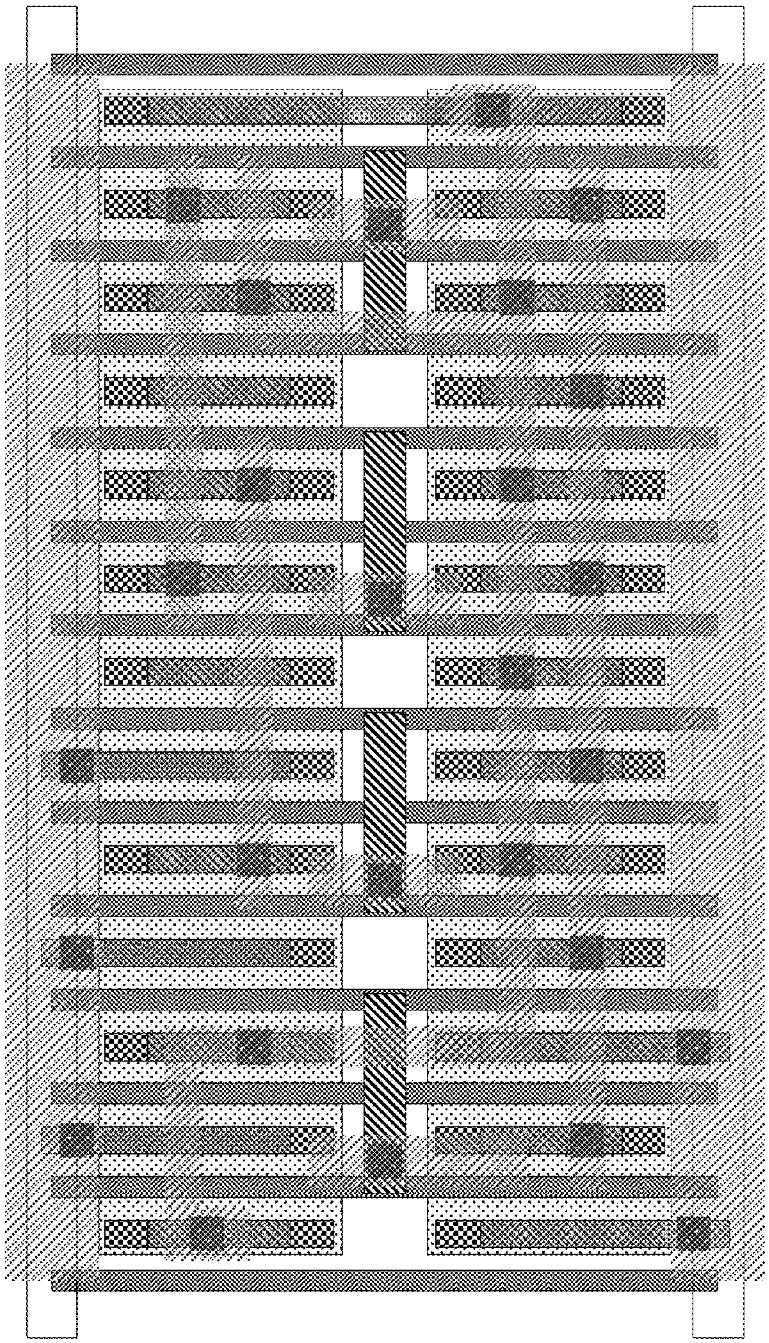
FIG. 419 depicts an OAI31D3 cell.

Reference is made to FIG. 419, which depicts an OAI31D3 cell. This cell implements the logic function nand(or(A,B,C),D) in drive strength 3.

Figure 420:
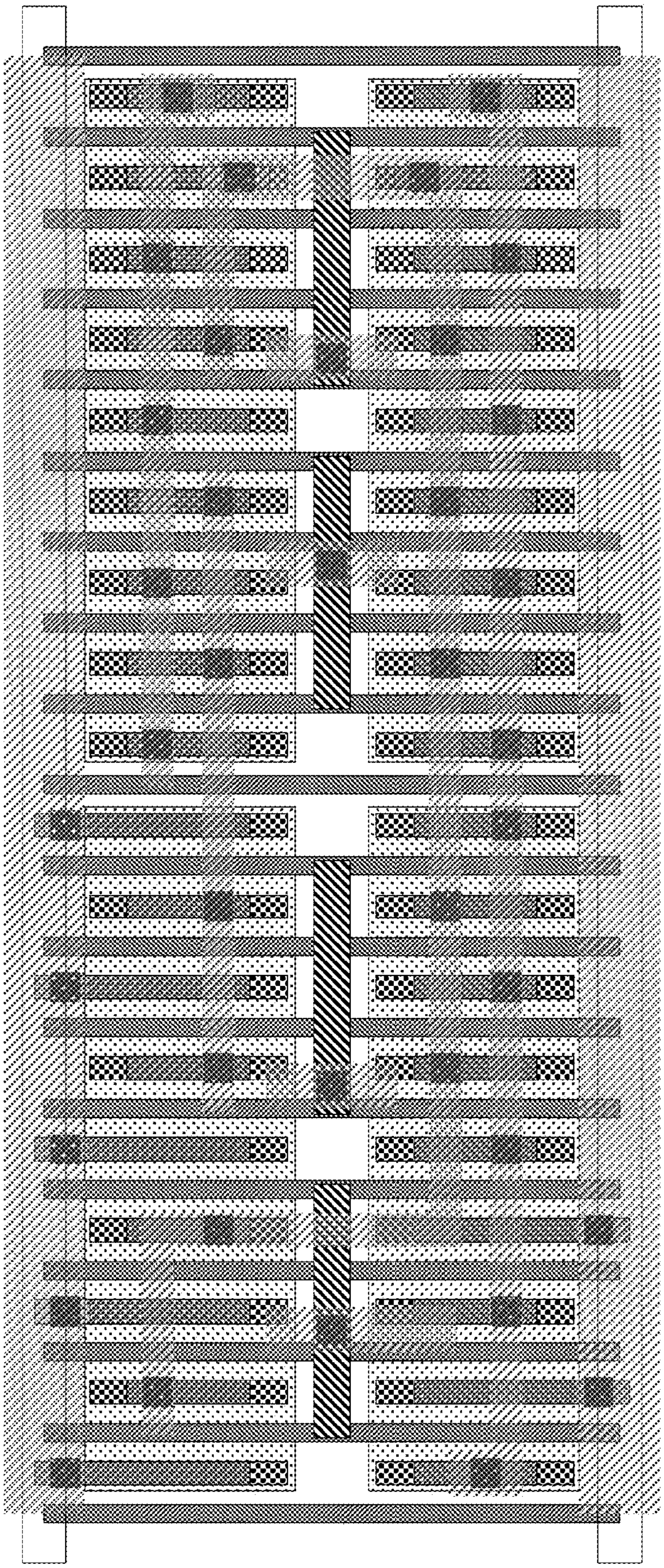
FIG. 420 depicts an OAI31D4 cell.

Reference is made to FIG. 420, which depicts an OAI31D4 cell. This cell implements the logic function nand(or(A,B,C),D) in drive strength 4.

Figure 421:
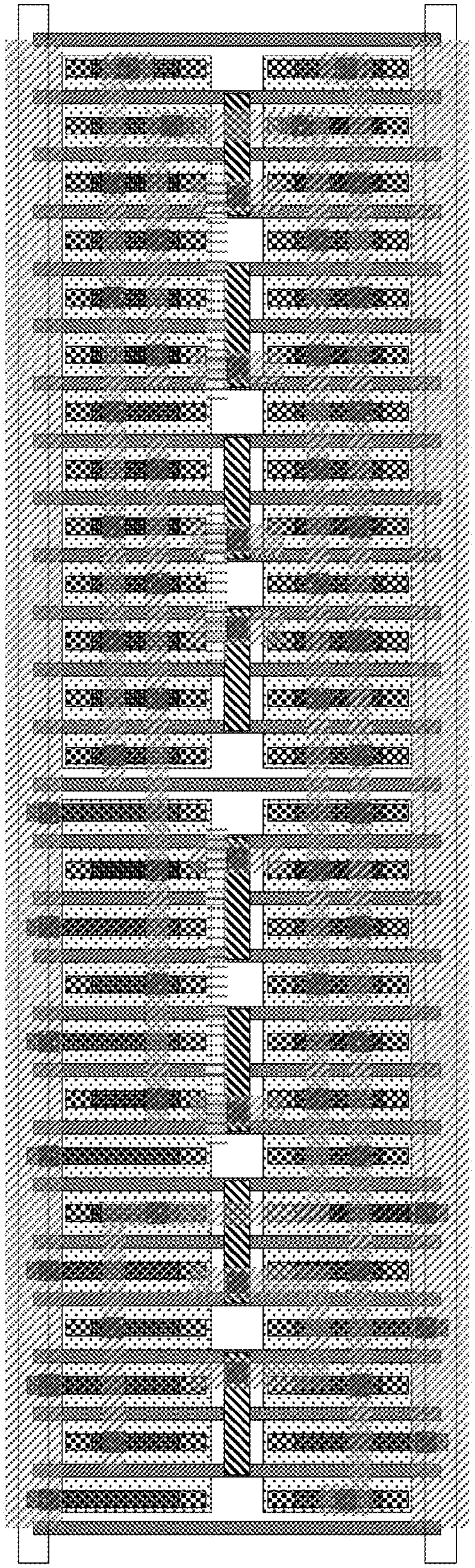
FIG. 421 depicts an OAI31D6 cell.

Reference is made to FIG. 421, which depicts an OAI31D6 cell. This cell implements the logic function nand(or(A,B,C),D) in drive strength 6.

Figure 422:
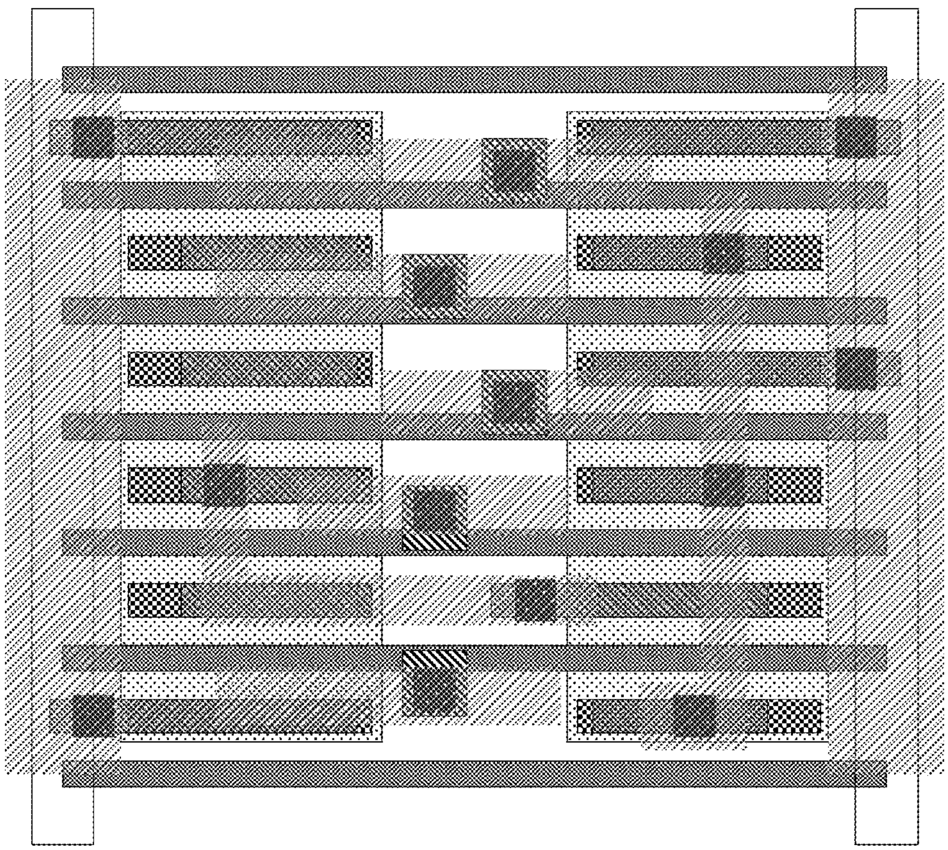
FIG. 422 depicts an OAI32D1 cell.

Reference is made to FIG. 422, which depicts an OAI32D1 cell. This cell implements the logic function nand(or(A,B,C),or(D,E)) in drive strength 1.

Figure 423:
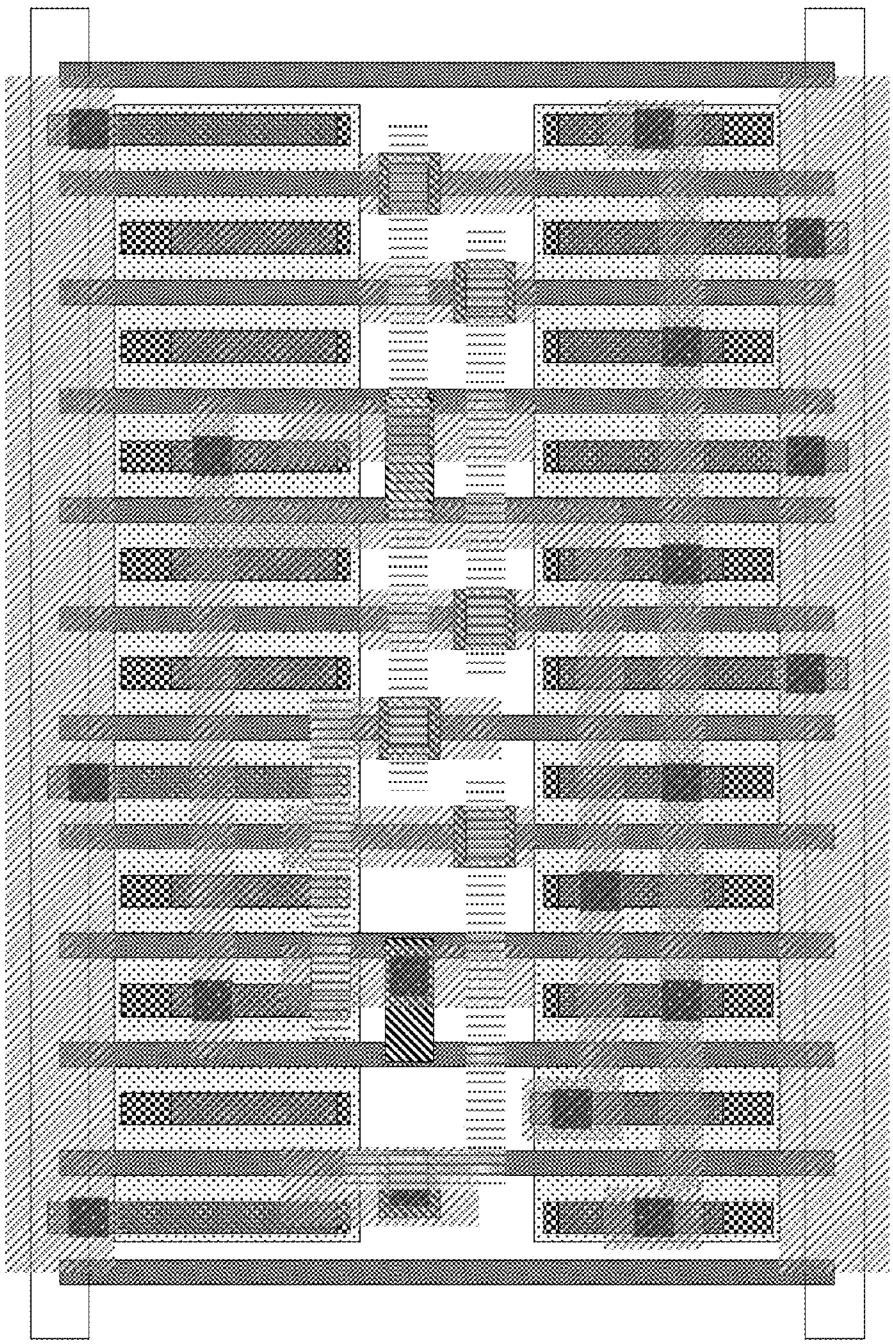
FIG. 423 depicts an OAI32D2 cell.

Reference is made to FIG. 423, which depicts an OAI32D2 cell. This cell implements the logic function nand(or(A,B,C),or(D,E)) in drive strength 2.

Figure 424:
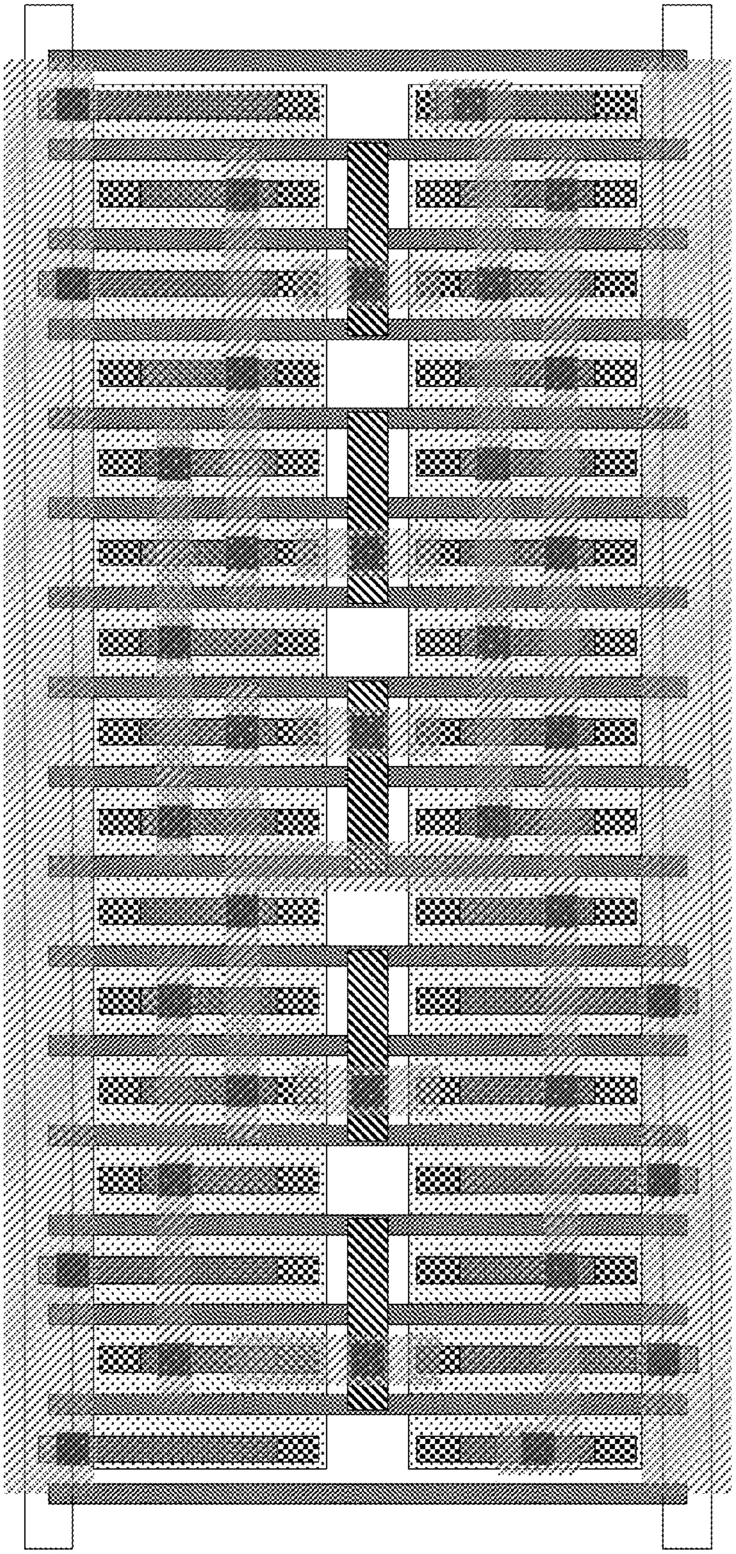
FIG. 424 depicts an OAI32D3 cell.

Reference is made to FIG. 424, which depicts an OAI32D3 cell. This cell implements the logic function nand(or(A,B,C),or(D,E)) in drive strength 3.

Figure 425:
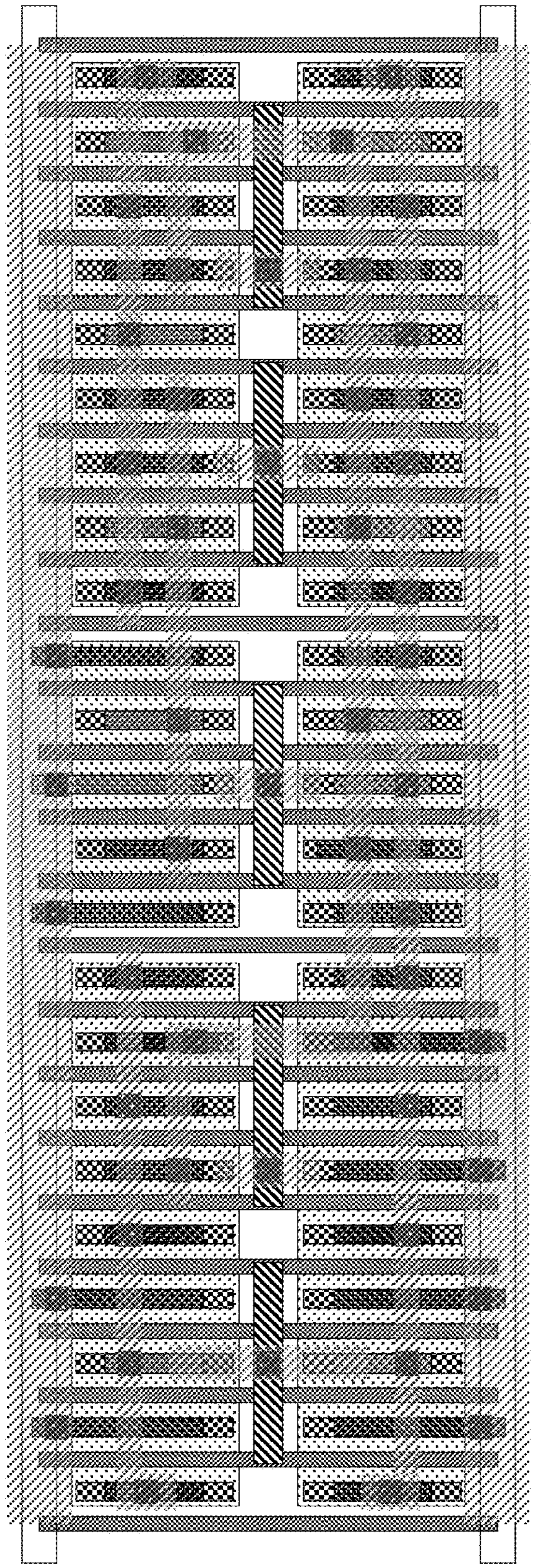
FIG. 425 depicts an OAI32D4 cell.

Reference is made to FIG. 425, which depicts an OAI32D4 cell. This cell implements the logic function nand(or(A,B,C),or(D,E)) in drive strength 4.

Figure 426:
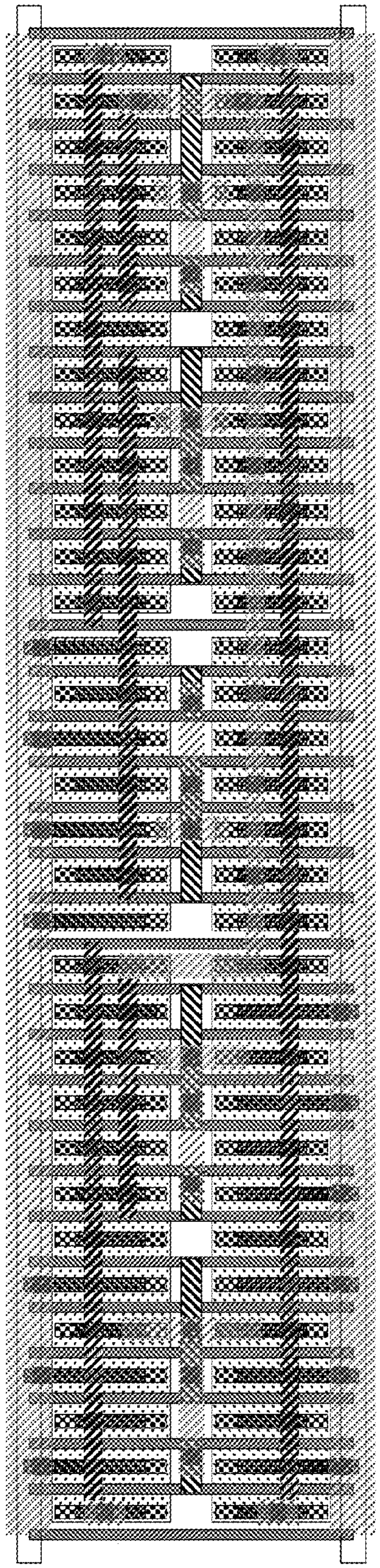
FIG. 426 depicts an OAI32D6 cell.

Reference is made to FIG. 426, which depicts an OAI32D6 cell. This cell implements the logic function nand(or(A,B,C),or(D,E)) in drive strength 6.

Figure 427:
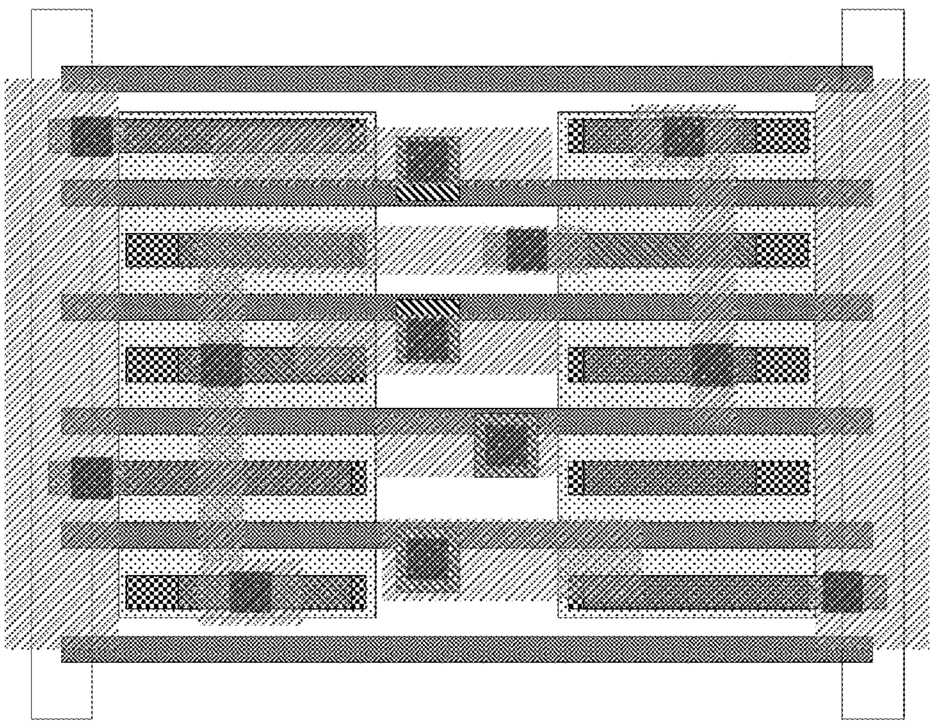
FIG. 427 depicts an OAI211D1 cell.

Reference is made to FIG. 427, which depicts an OAI211D1 cell. This cell implements the logic function nand(or(A,B),C,D) in drive strength 1.

Figure 428:
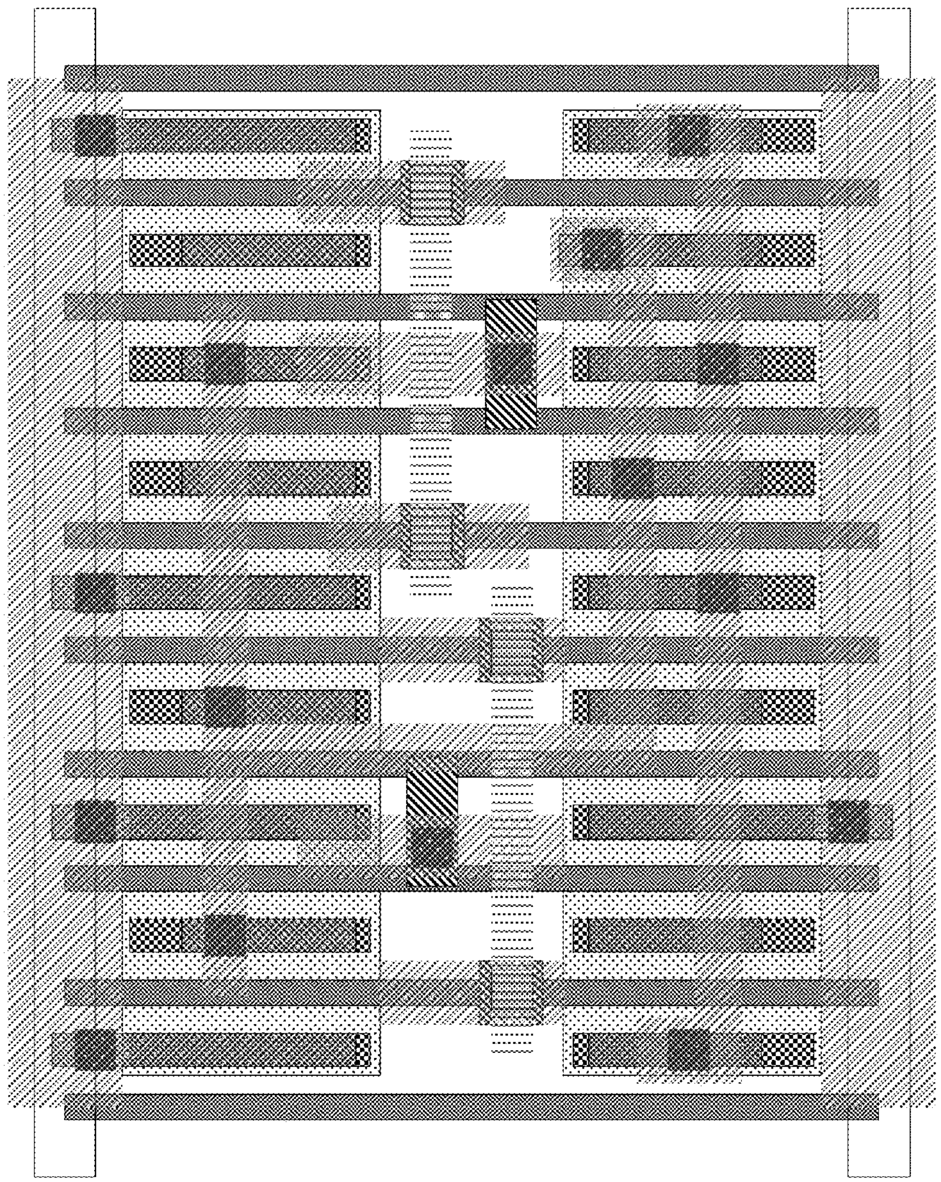
FIG. 428 depicts an OAI211D2 cell.

Reference is made to FIG. 428, which depicts an OAI211D2 cell. This cell implements the logic function nand(or(A,B),C,D) in drive strength 2.

Figure 429:
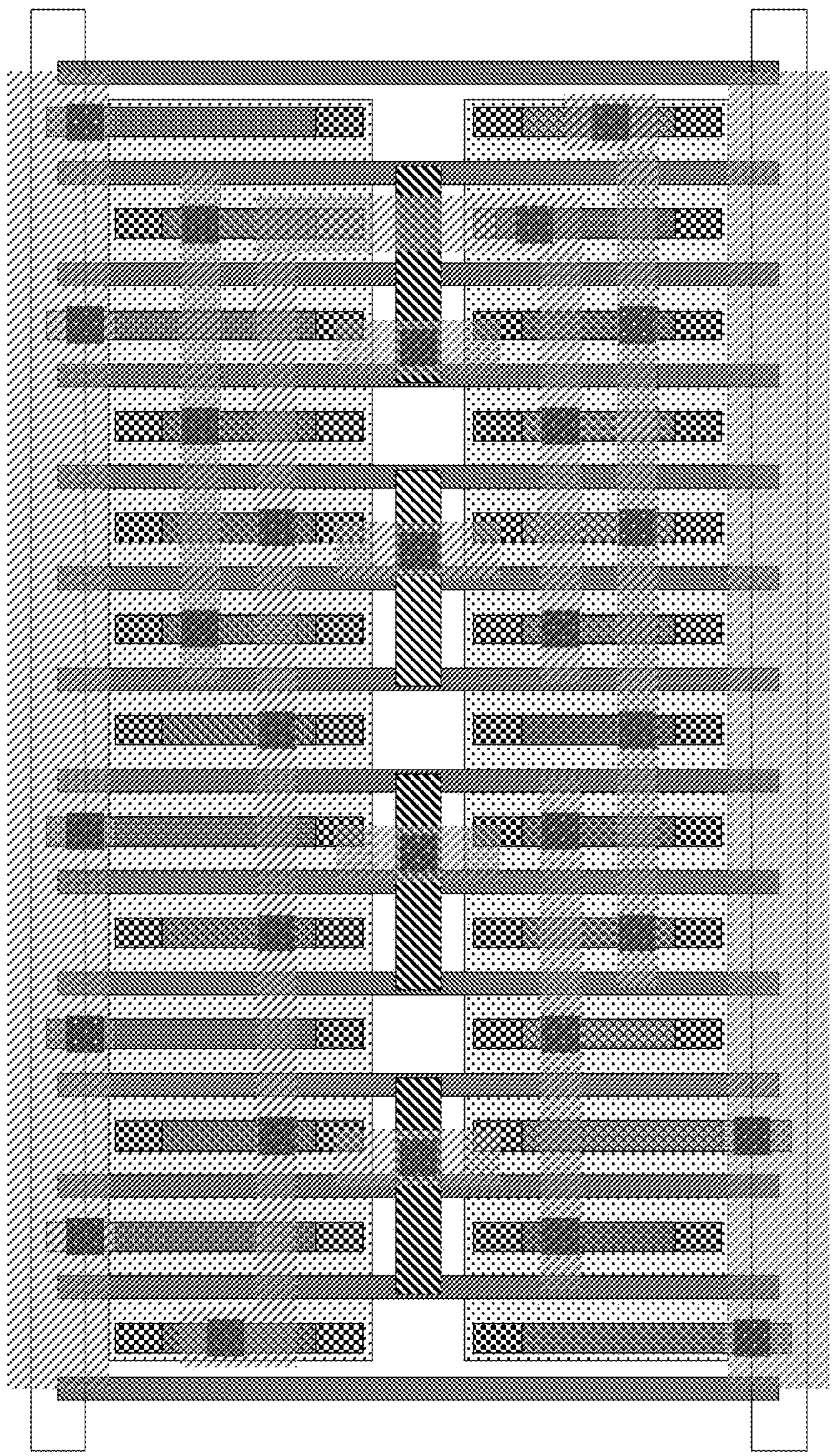
FIG. 429 depicts an OAI211D3 cell.

Reference is made to FIG. 429, which depicts an OAI211D3 cell. This cell implements the logic function nand(or(A,B),C,D) in drive strength 3.

Figure 430:
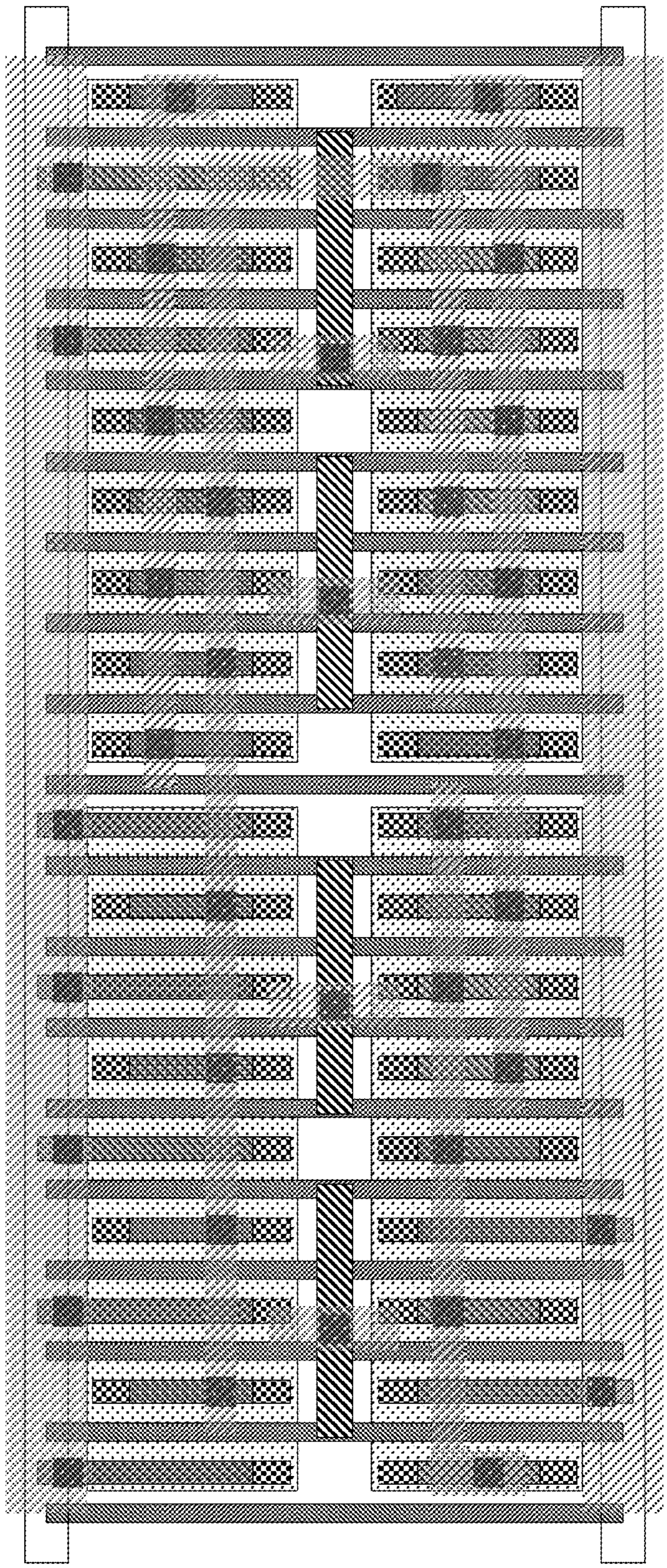
FIG. 430 depicts an OAI211D4 cell.

Reference is made to FIG. 430, which depicts an OAI211D4 cell. This cell implements the logic function nand(or(A,B),C,D) in drive strength 4.

Figure 431:
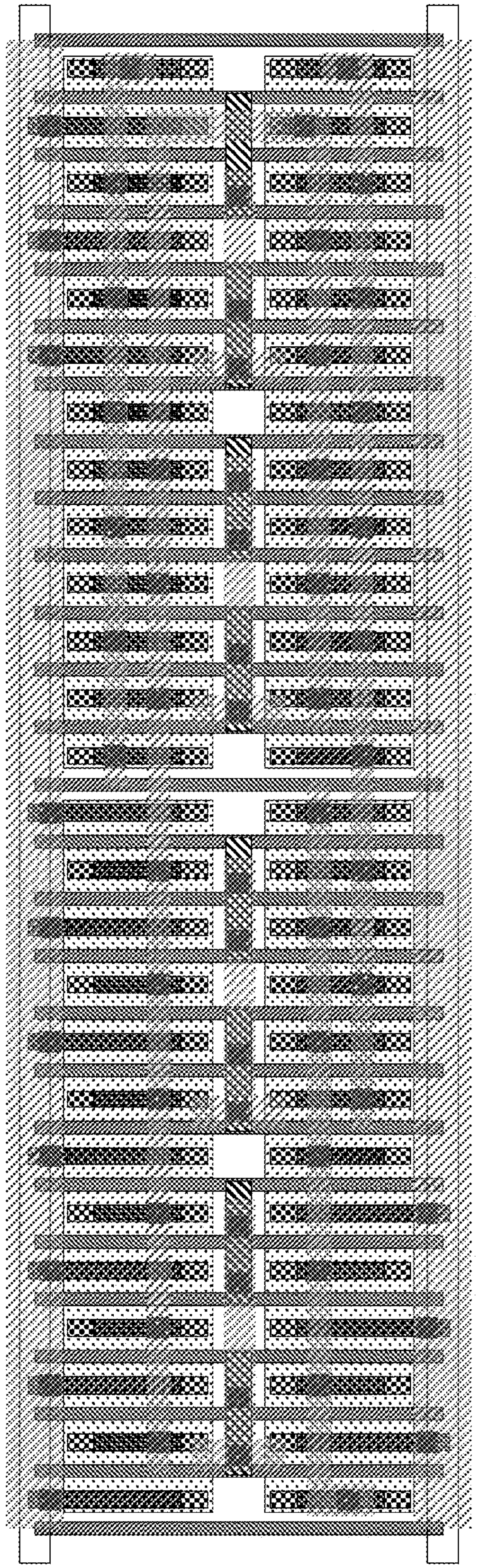
FIG. 431 depicts an OAI211D6 cell.

Reference is made to FIG. 431, which depicts an OAI211D6 cell. This cell implements the logic function nand(or(A,B),C,D) in drive strength 6.

Figure 432:
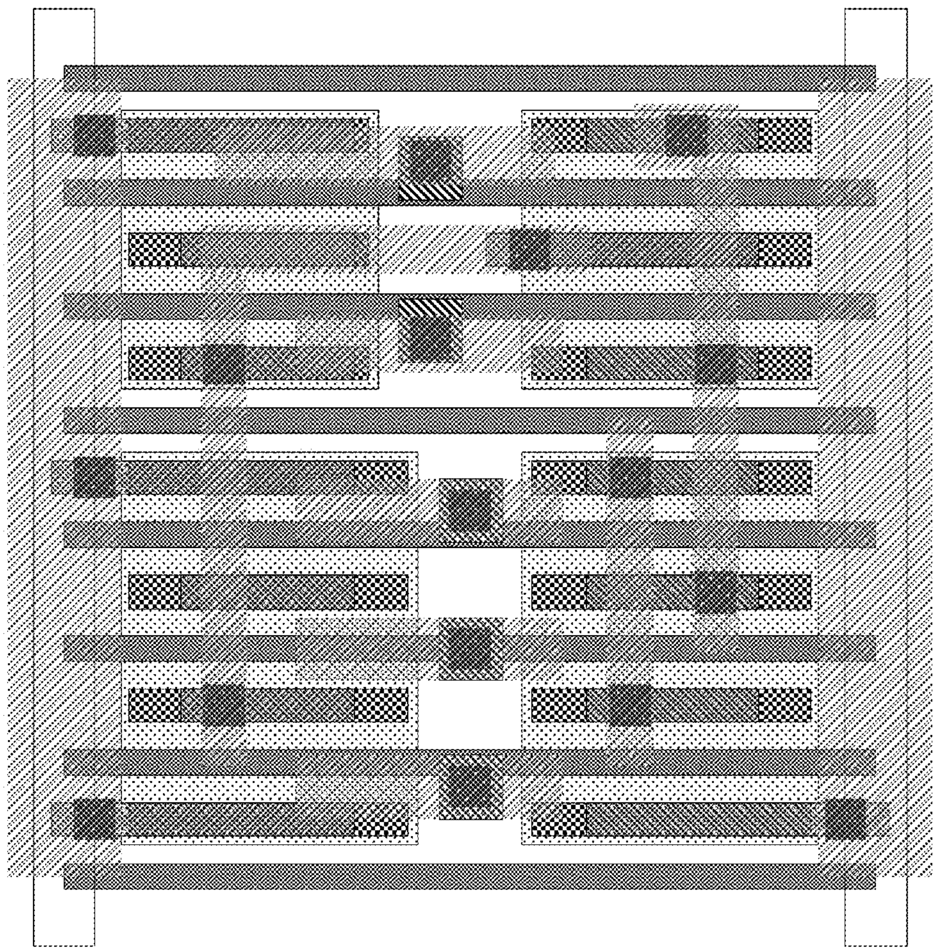
FIG. 432 depicts an OAI221D1 cell.

Reference is made to FIG. 432, which depicts an OAI221D1 cell. This cell implements the logic function nand(or(A,B),or(C,D),E) in drive strength 1.

Figure 433:
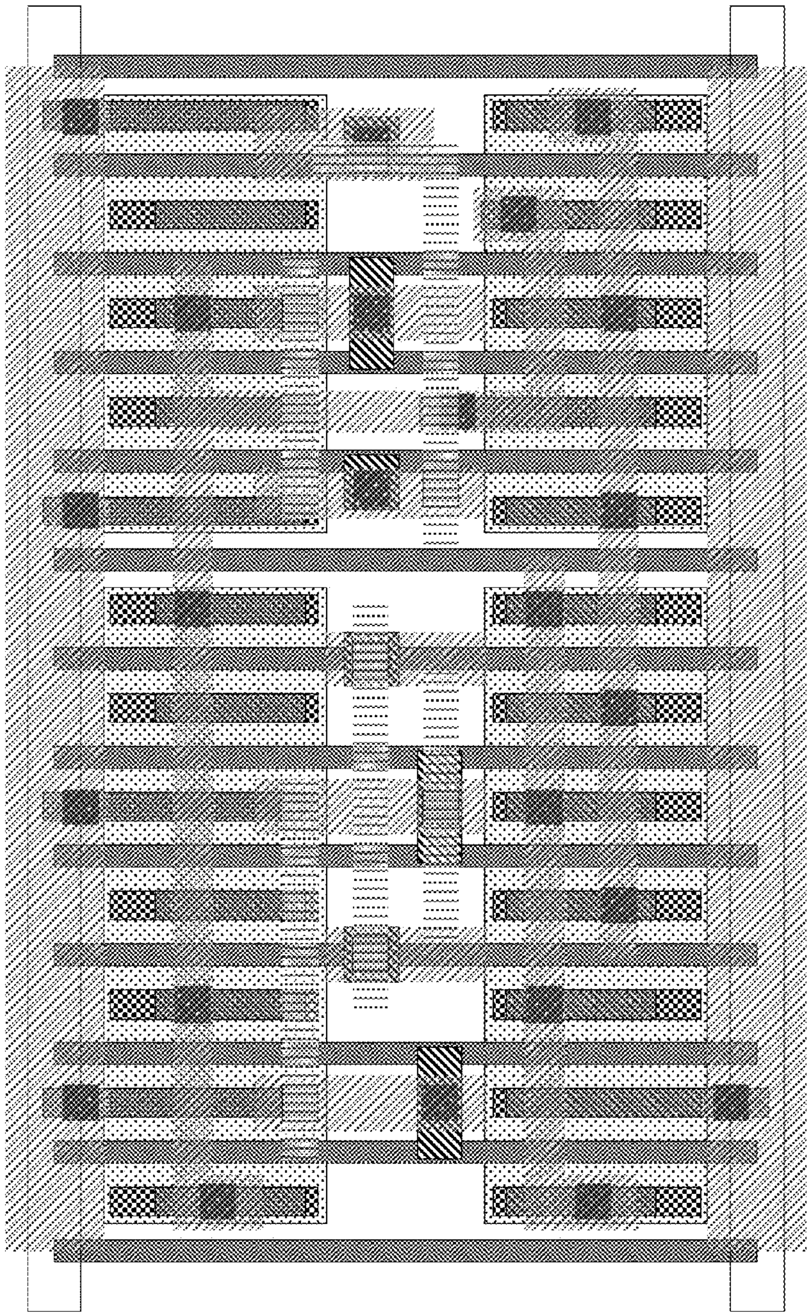
FIG. 433 depicts an OAI221D2 cell.

Reference is made to FIG. 433, which depicts an OAI221D2 cell. This cell implements the logic function nand(or(A,B),or(C,D),E) in drive strength 2.

Figure 434:
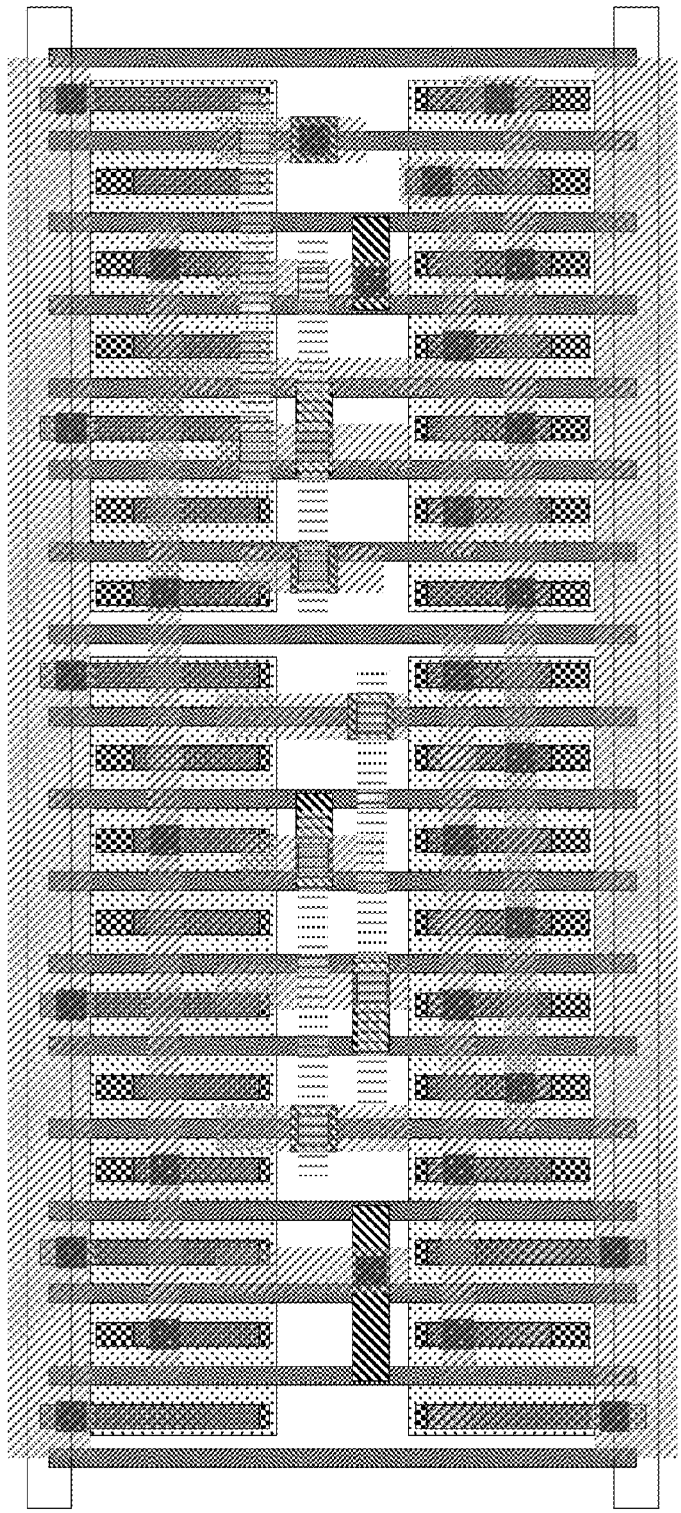
FIG. 434 depicts an OAI221D3 cell.

Reference is made to FIG. 434, which depicts an OAI221D3 cell. This cell implements the logic function nand(or(A,B),or(C,D),E) in drive strength 3.

Figure 435:
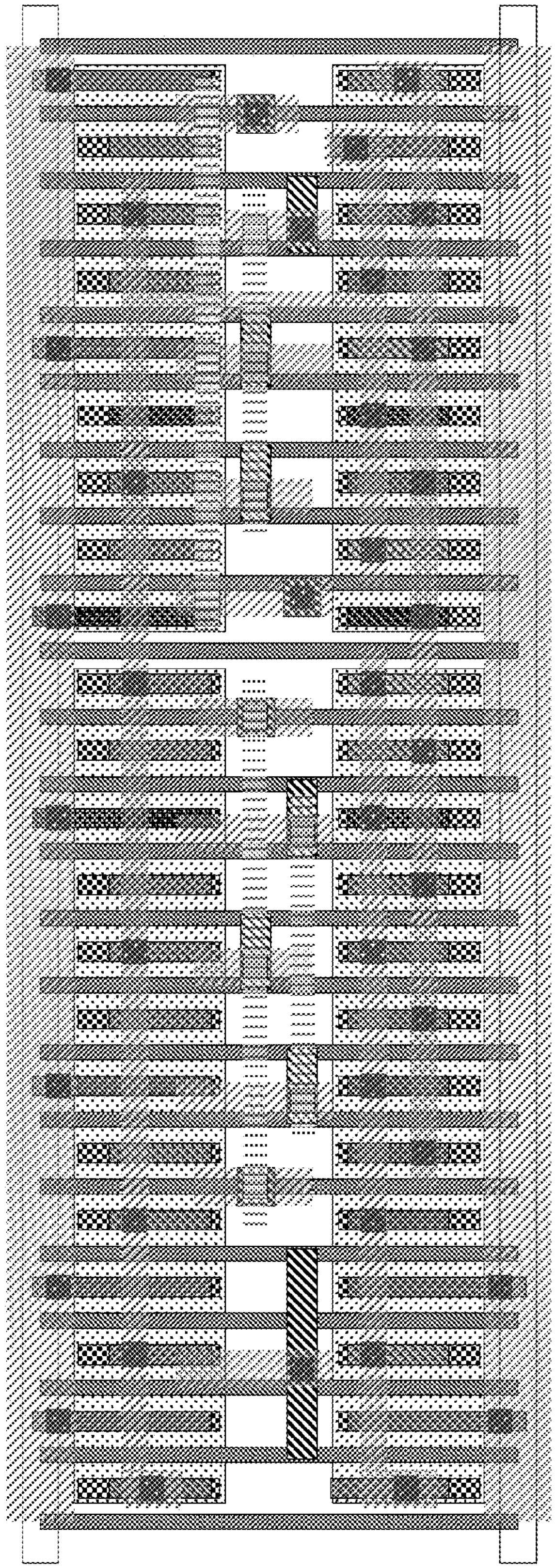
FIG. 435 depicts an OAI221D4 cell.

Reference is made to FIG. 435, which depicts an OAI221D4 cell. This cell implements the logic function nand(or(A,B),or(C,D),E) in drive strength 4.

Figure 436:
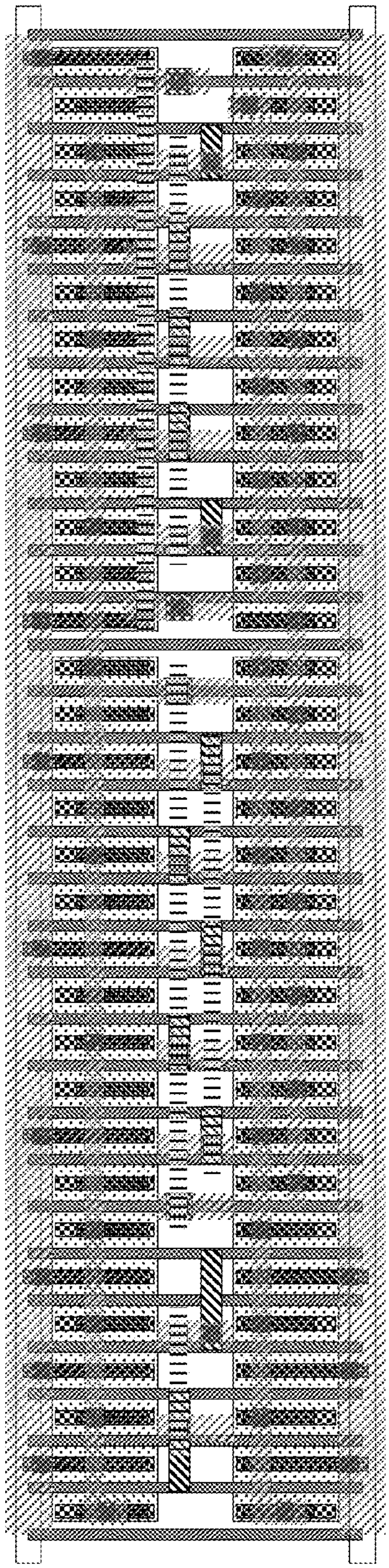
FIG. 436 depicts an OAI221D6 cell.

Reference is made to FIG. 436, which depicts an OAI221D6 cell. This cell implements the logic function nand(or(A,B),or(C,D),E) in drive strength 6.

Figure 437:
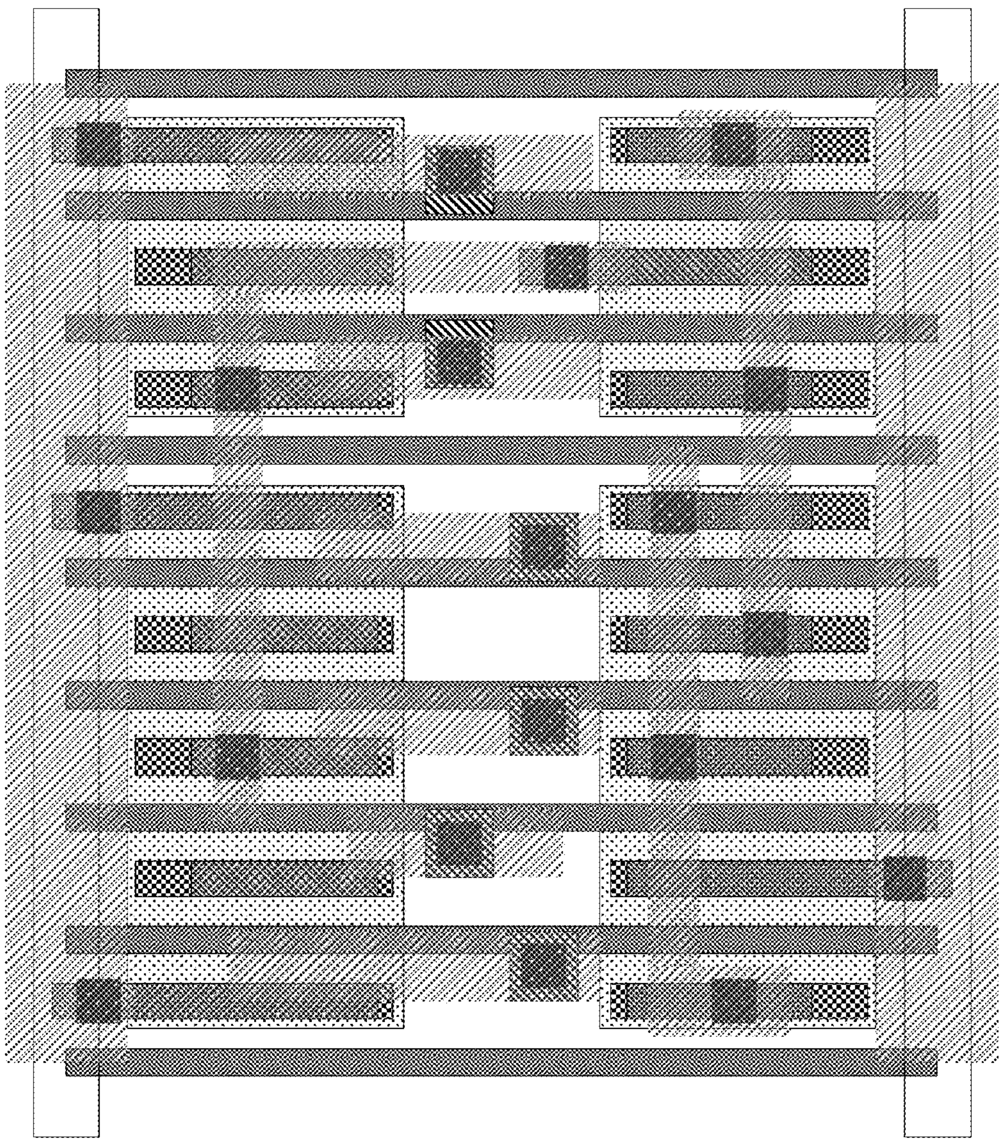
FIG. 437 depicts an OAI222D1 cell.

Reference is made to FIG. 437, which depicts an OAI222D1 cell. This cell implements the logic function nand(or(A,B),or(C,D),or(E,F)) in drive strength 1.

Figure 438:
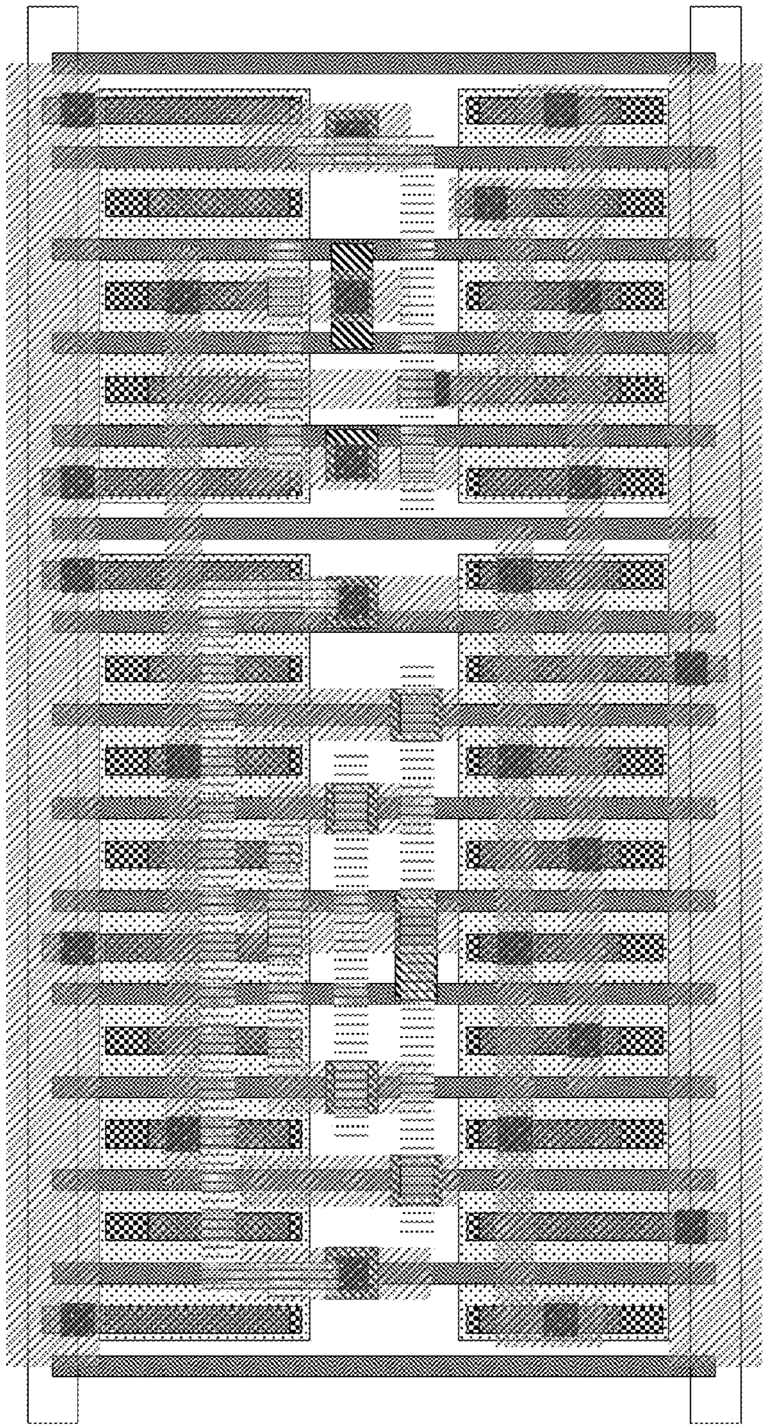
FIG. 438 depicts an OAI222D2 cell.

Reference is made to FIG. 438, which depicts an OAI222D2 cell. This cell implements the logic function nand(or(A,B),or(C,D),or(E,F)) in drive strength 2.

Figure 439:
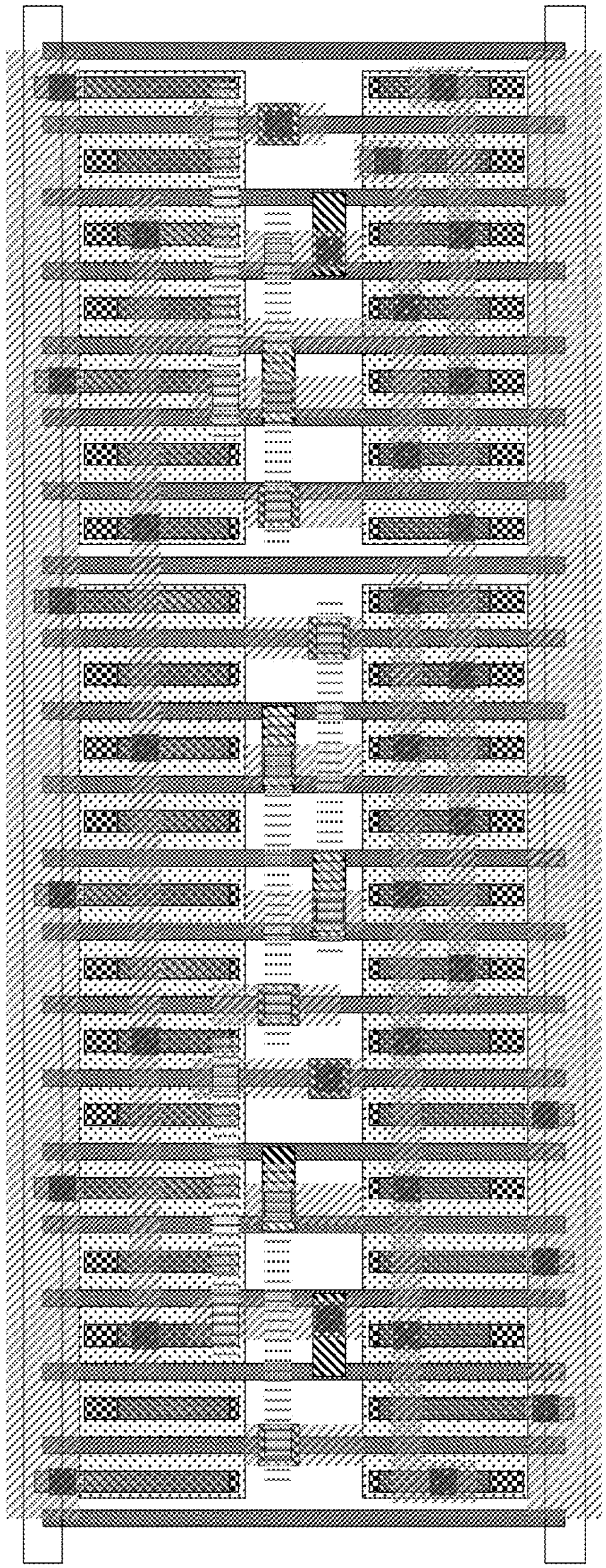
FIG. 439 depicts an OAI222D3 cell.

Reference is made to FIG. 439, which depicts an OAI222D3 cell. This cell implements the logic function nand(or(A,B),or(C,D),or(E,F)) in drive strength 3.

Figure 440:
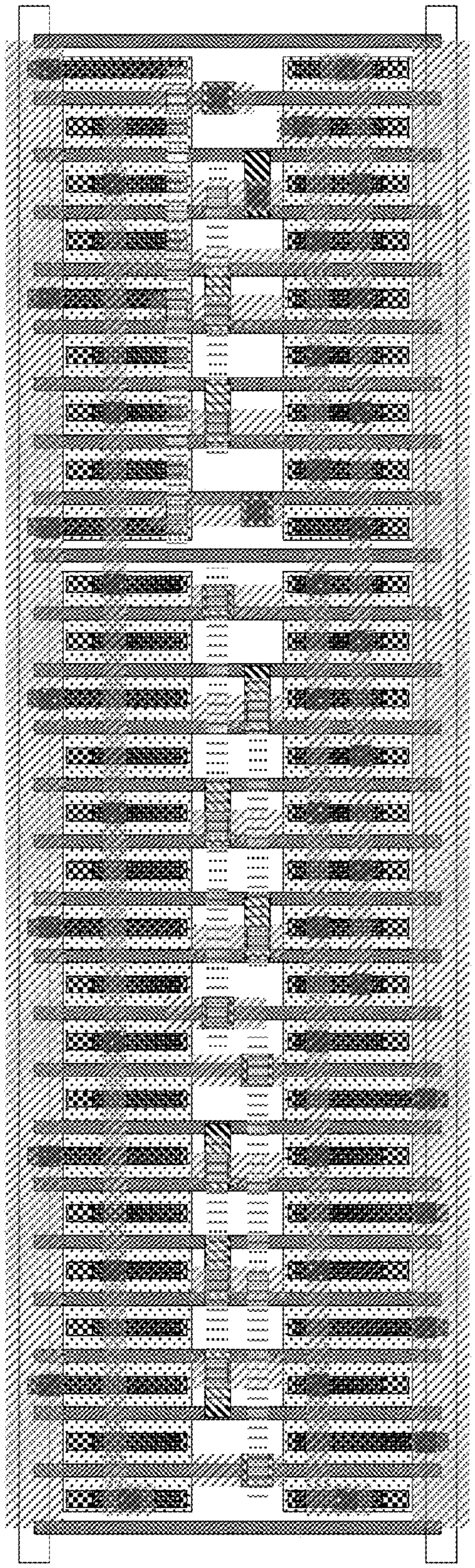
FIG. 440 depicts an OAI222D4 cell.

Reference is made to FIG. 440, which depicts an OAI222D4 cell. This cell implements the logic function nand(or(A,B),or(C,D),or(E,F)) in drive strength 4.

Figure 441:
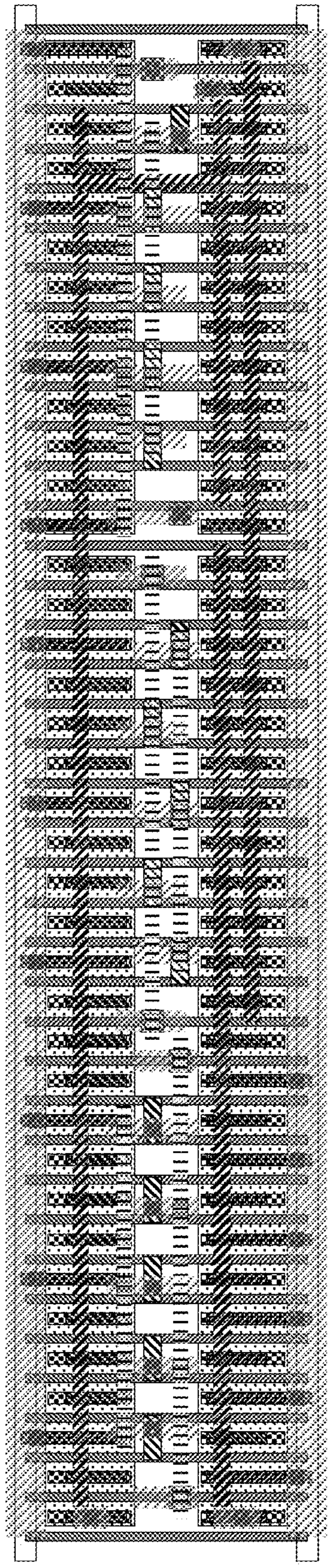
FIG. 441 depicts an OAI222D6 cell.

Reference is made to FIG. 441, which depicts an OAI222D6 cell. This cell implements the logic function nand(or(A,B),or(C,D),or(E,F)) in drive strength 6.

Figure 442:
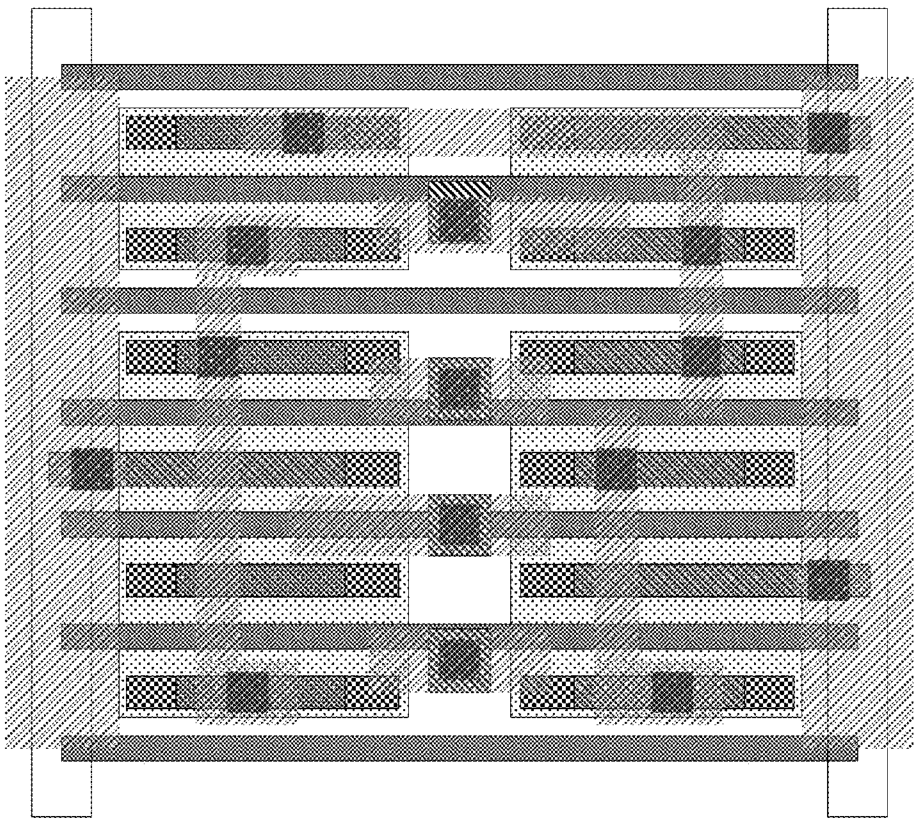
FIG. 442 depicts an OAOI211D1 cell.

Reference is made to FIG. 442, which depicts an OAOI211D1 cell. This cell implements the logic function nor(D,and(C,or(A,B))) in drive strength 1.

Figure 443:
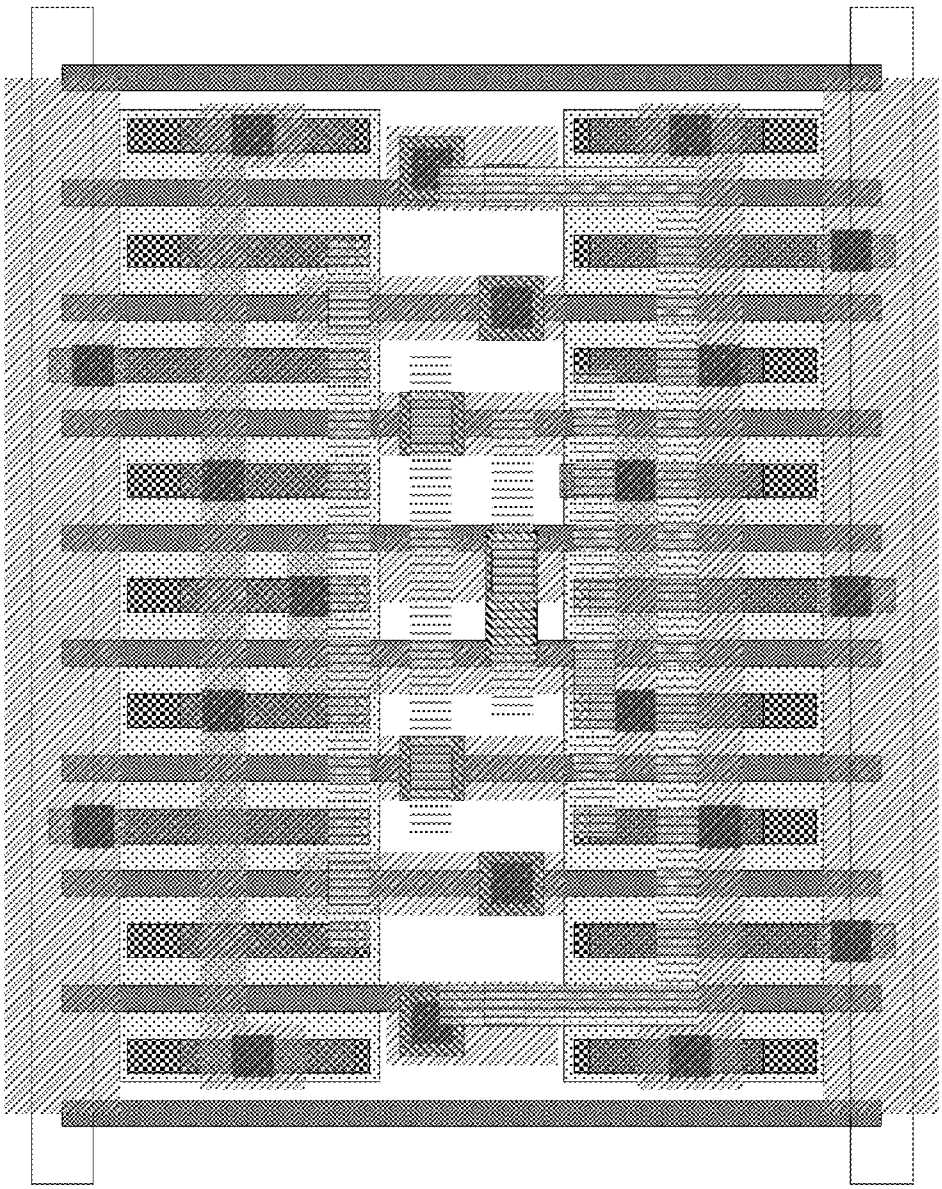
FIG. 443 depicts an OAOI211D2 cell.

Reference is made to FIG. 443, which depicts an OAOAI211D2 cell. This cell implements the logic function nor(D,and(C,or(A,B))) in drive strength 2.

Figure 444:
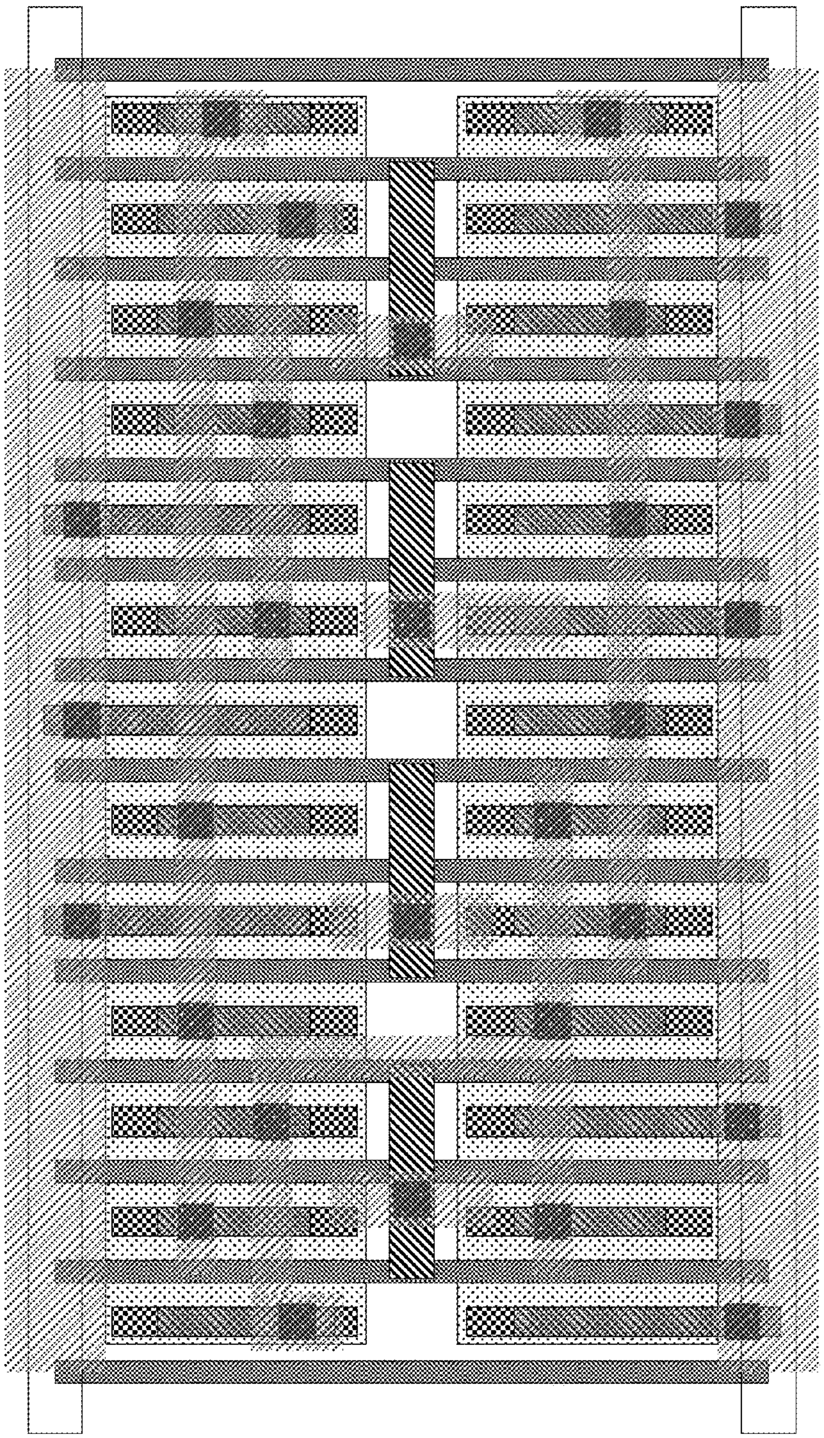
FIG. 444 depicts an OAOI211D3 cell.

Reference is made to FIG. 444, which depicts an OAOAI211D3 cell. This cell implements the logic function nor(D,and(C,or(A,B))) in drive strength 3.

Figure 445:
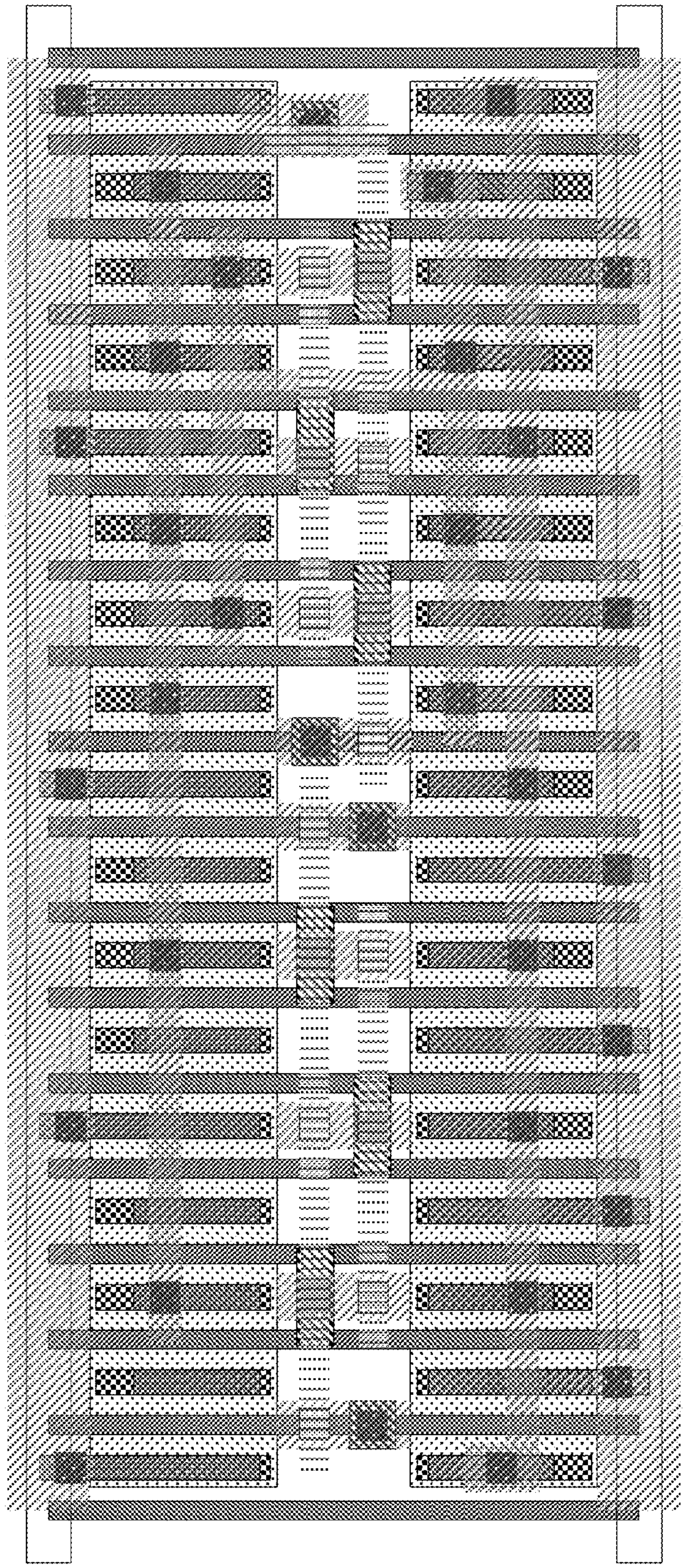
FIG. 445 depicts an OAOI211D4 cell.

Reference is made to FIG. 445, which depicts an OAOAI211D4 cell. This cell implements the logic function nor(D,and(C,or(A,B))) in drive strength 4.

Figure 446:
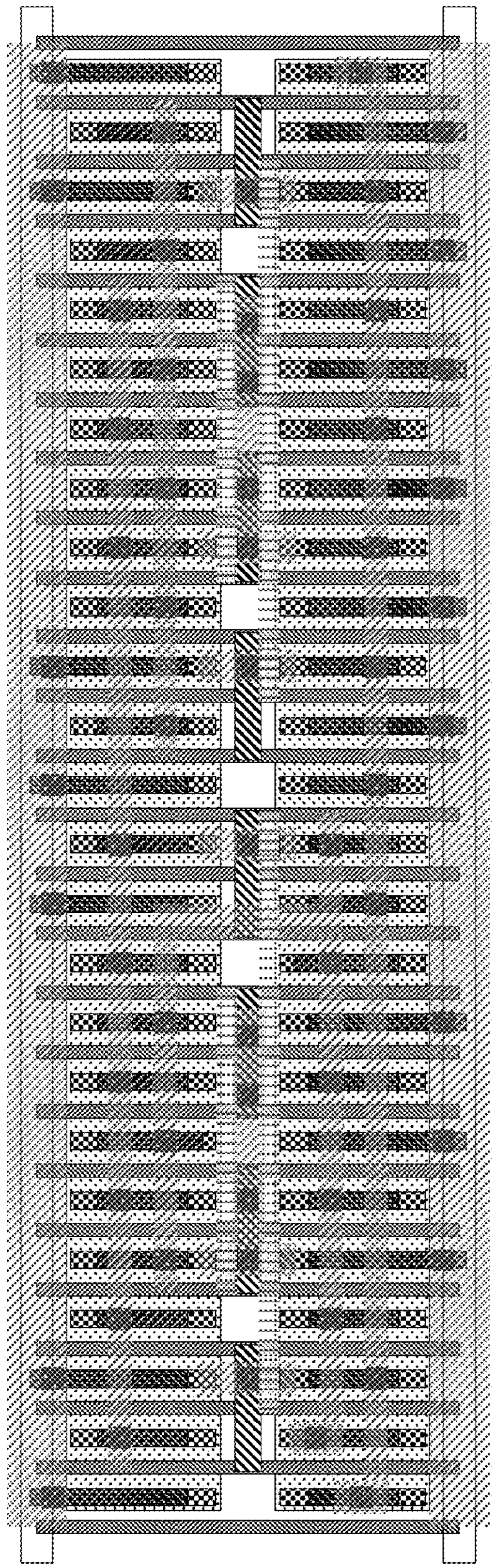
FIG. 446 depicts an OAOI211D6 cell.

Reference is made to FIG. 446, which depicts an OAOAI211D6 cell. This cell implements the logic function nor(D,and(C,or(A,B))) in drive strength 6.

Figure 447:
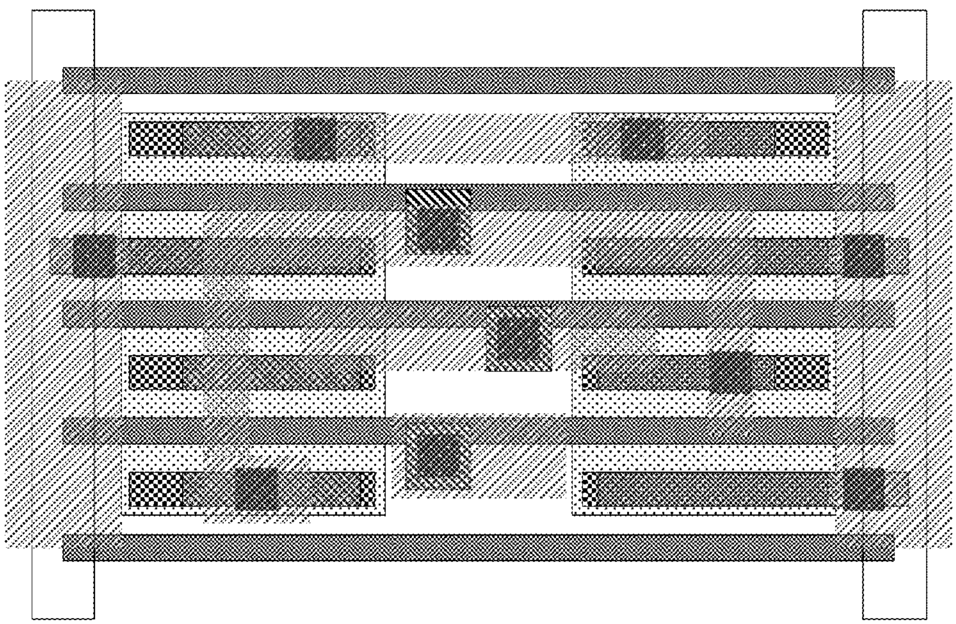
FIG. 447 depicts an OR2D1 cell.

Reference is made to FIG. 447, which depicts an OR2D1 cell. This cell implements the logic function or(A,B) in drive strength 1.

Figure 448:
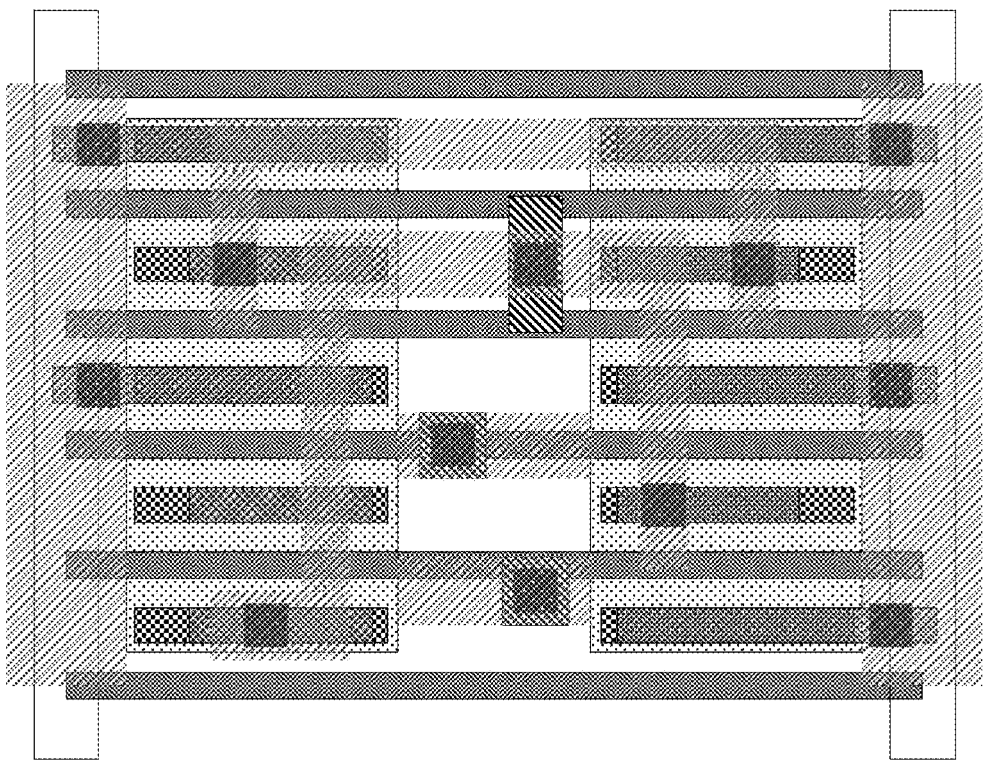
FIG. 448 depicts an OR2D2 cell.

Reference is made to FIG. 448, which depicts an OR2D2 cell. This cell implements the logic function or(A,B) in drive strength 2.

Figure 449:
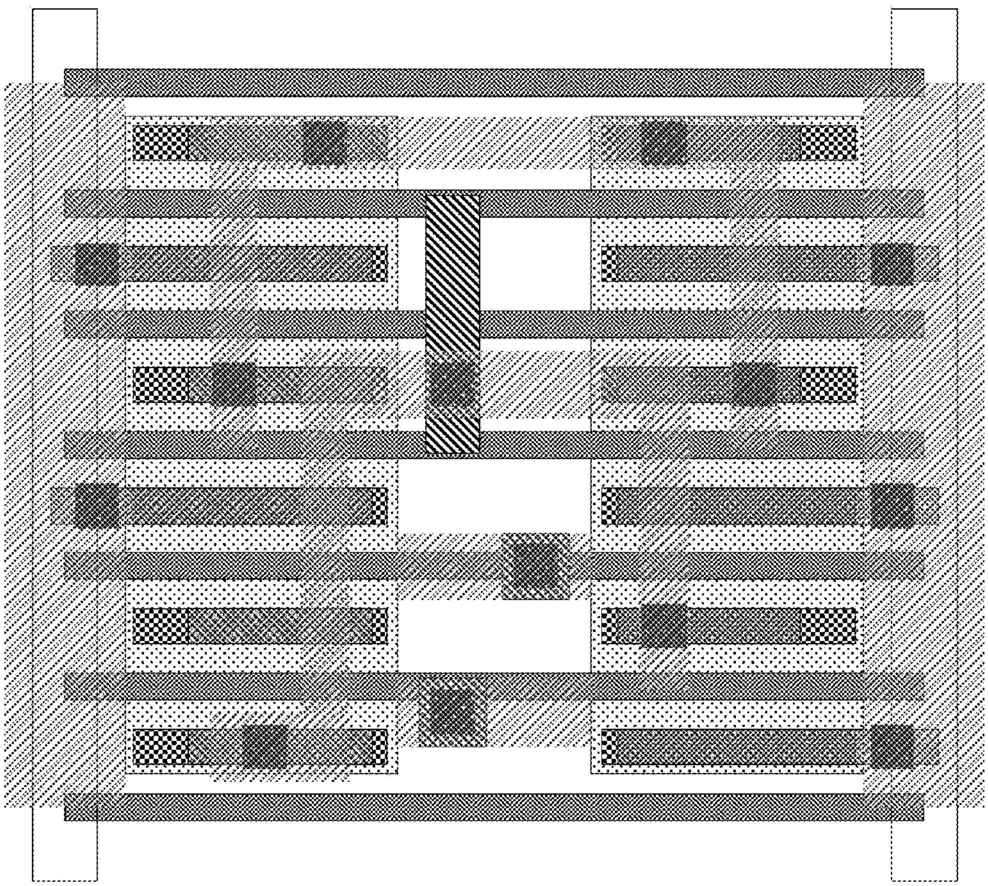
FIG. 449 depicts an OR2D3 cell.

Reference is made to FIG. 449, which depicts an OR2D3 cell. This cell implements the logic function or(A,B) in drive strength 3.

Figure 450:
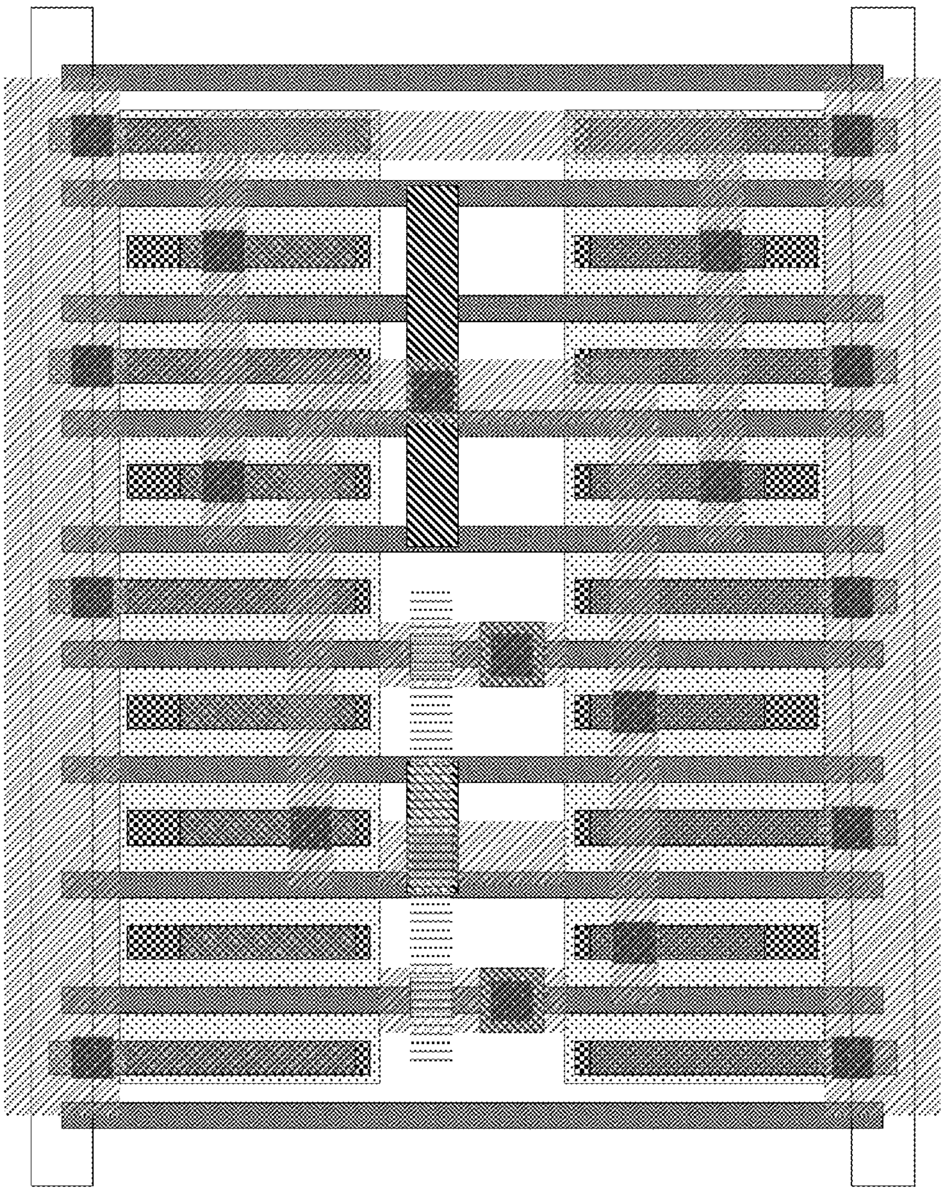
FIG. 450 depicts an OR2D4 cell.

Reference is made to FIG. 450, which depicts an OR2D4 cell. This cell implements the logic function or(A,B) in drive strength 4.

Figure 451:
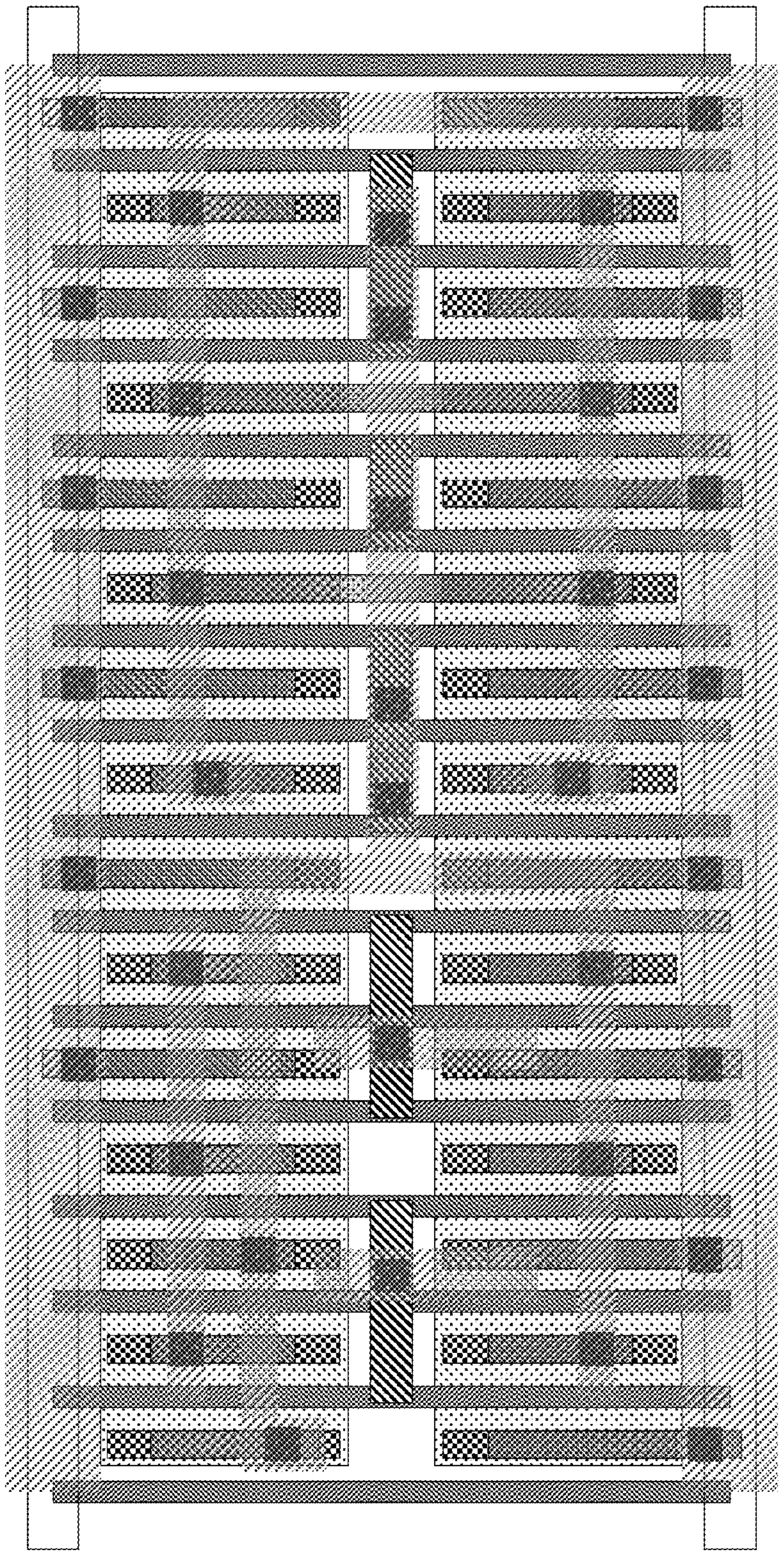
FIG. 451 depicts an OR2D8 cell.

Reference is made to FIG. 451, which depicts an OR2D8 cell. This cell implements the logic function or(A,B) in drive strength 8.

Figure 452:
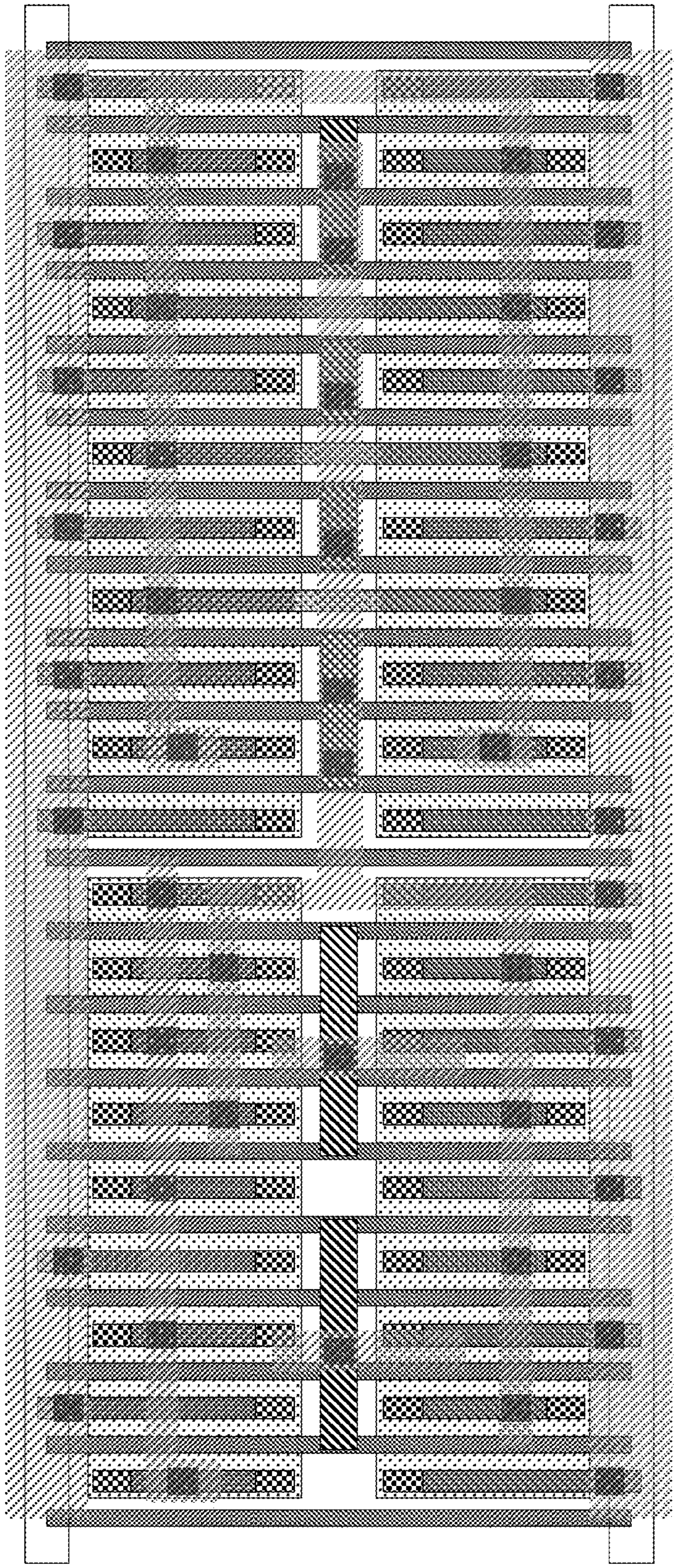
FIG. 452 depicts an OR2D10 cell.

Reference is made to FIG. 452, which depicts an OR2D10 cell. This cell implements the logic function or(A,B) in drive strength 10.

Figure 453:
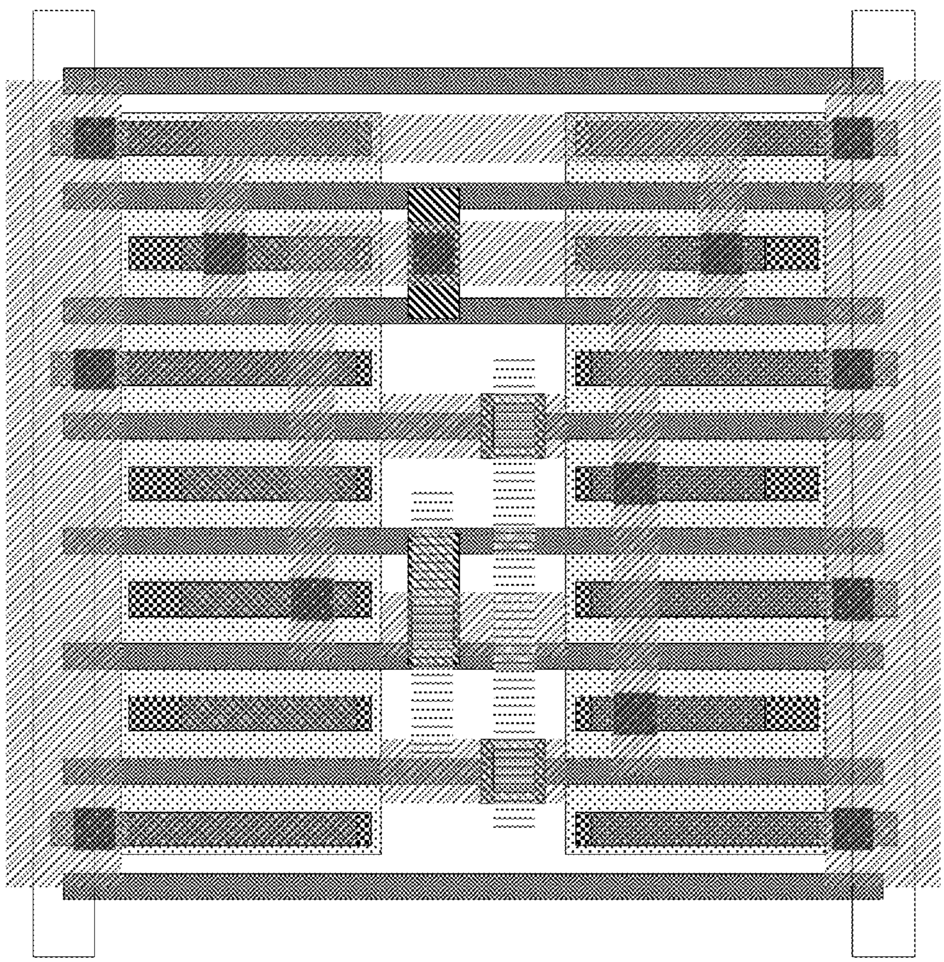
FIG. 453 depicts an OR2XD2 cell.

Reference is made to FIG. 453, which depicts an OR2XD2 cell. This is an alternative embodiment of the OR2D2 cell.

Figure 454:
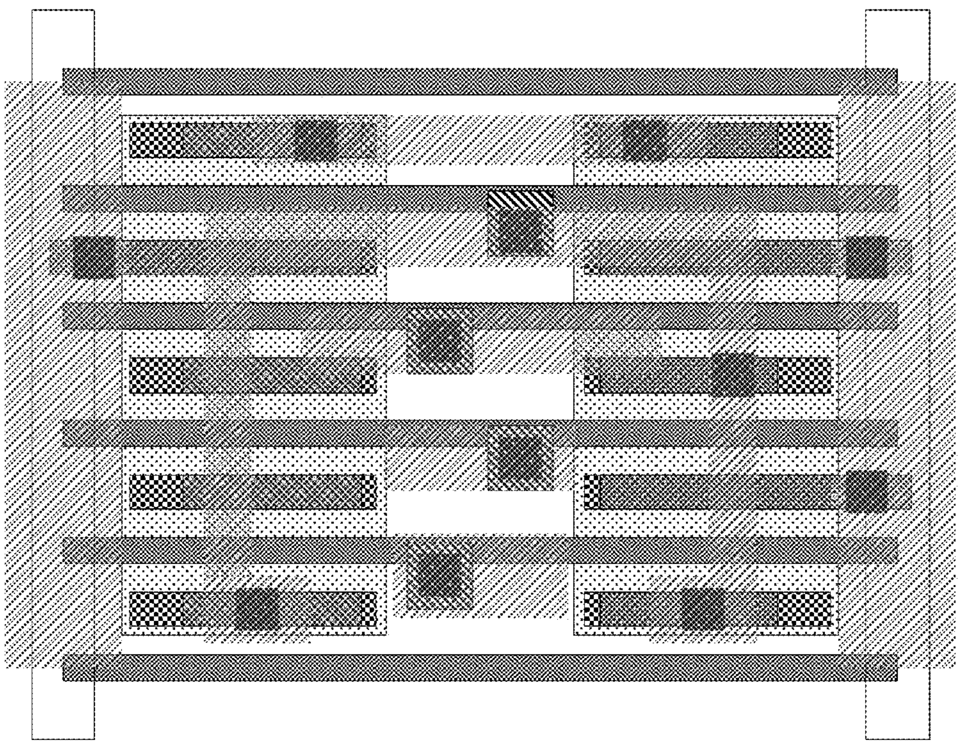
FIG. 454 depicts an OR3D1 cell.

Reference is made to FIG. 454, which depicts an OR3D1 cell. This cell implements the logic function or(A,B,C) in drive strength 1.

Figure 455:
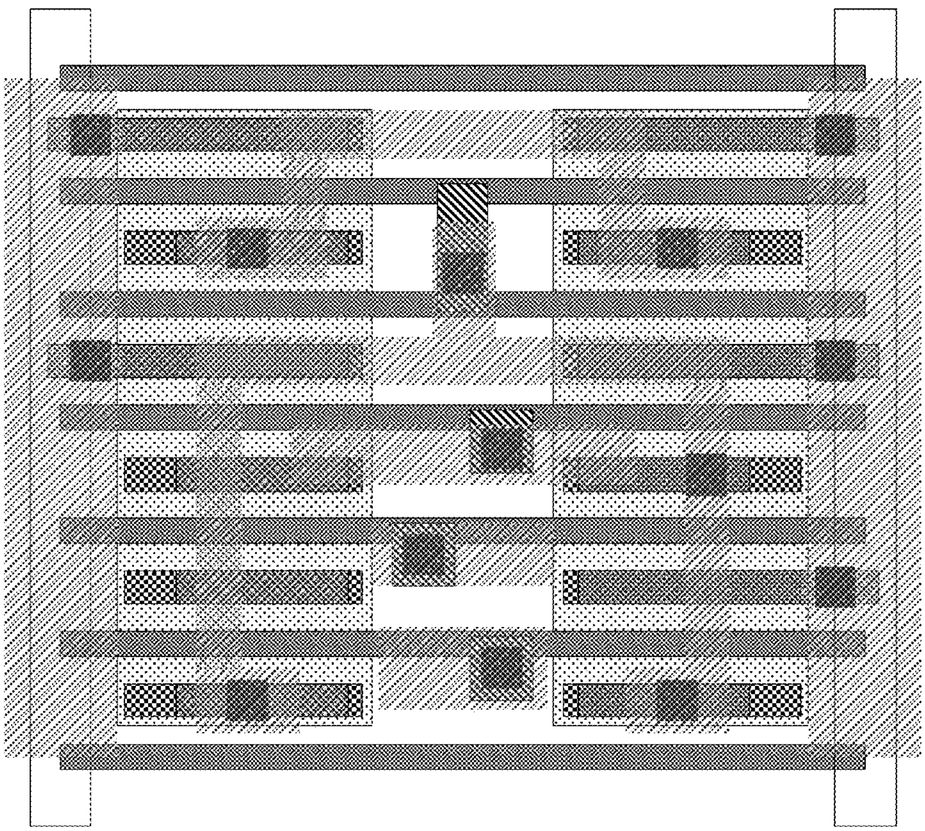
FIG. 455 depicts an OR3D2 cell.

Reference is made to FIG. 455, which depicts an OR3D2 cell. This cell implements the logic function or(A,B,C) in drive strength 2.

Figure 456:
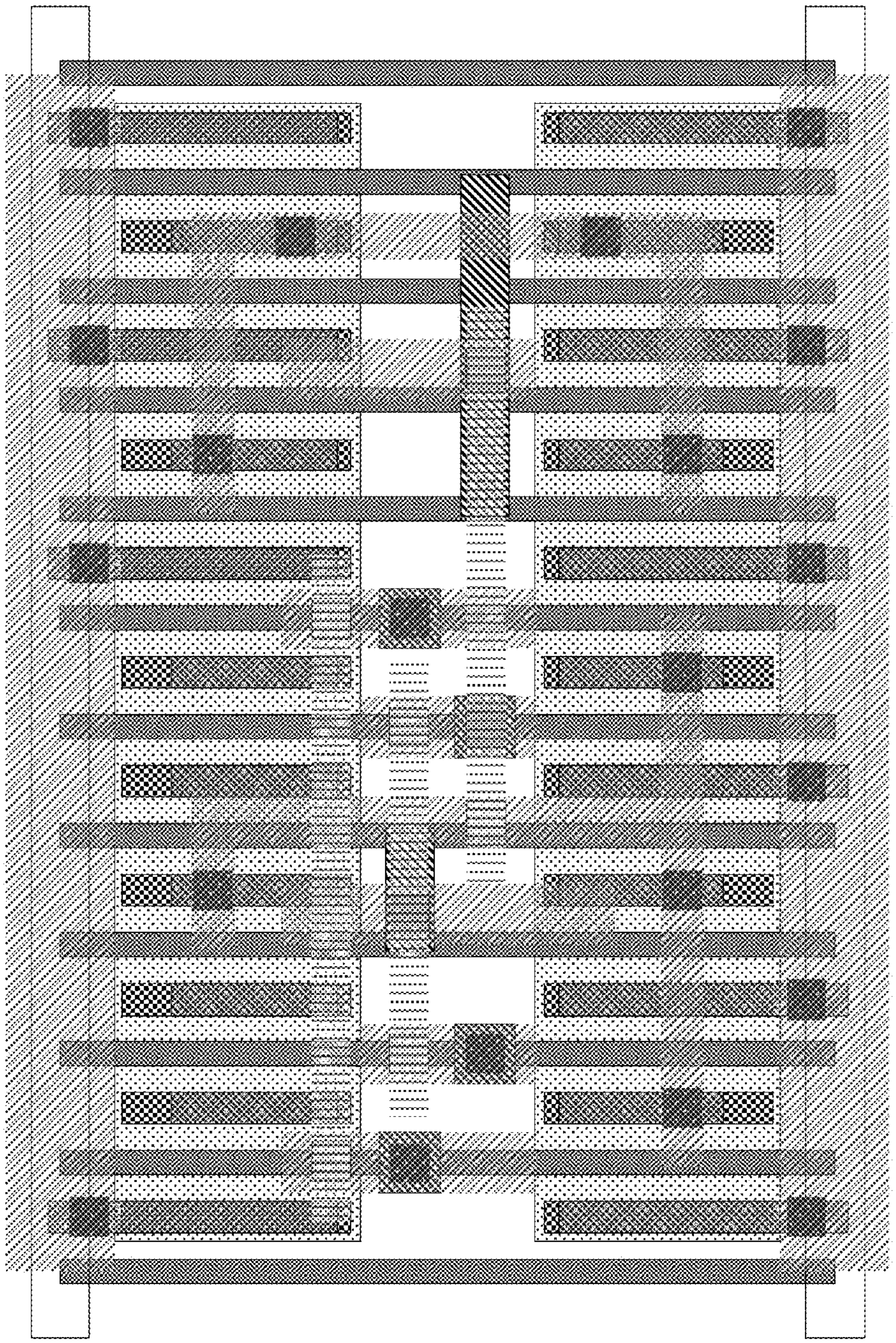
FIG. 456 depicts an OR3D4 cell.

Reference is made to FIG. 456, which depicts an OR3D4 cell. This cell implements the logic function or(A,B,C) in drive strength 3.

Figure 457:
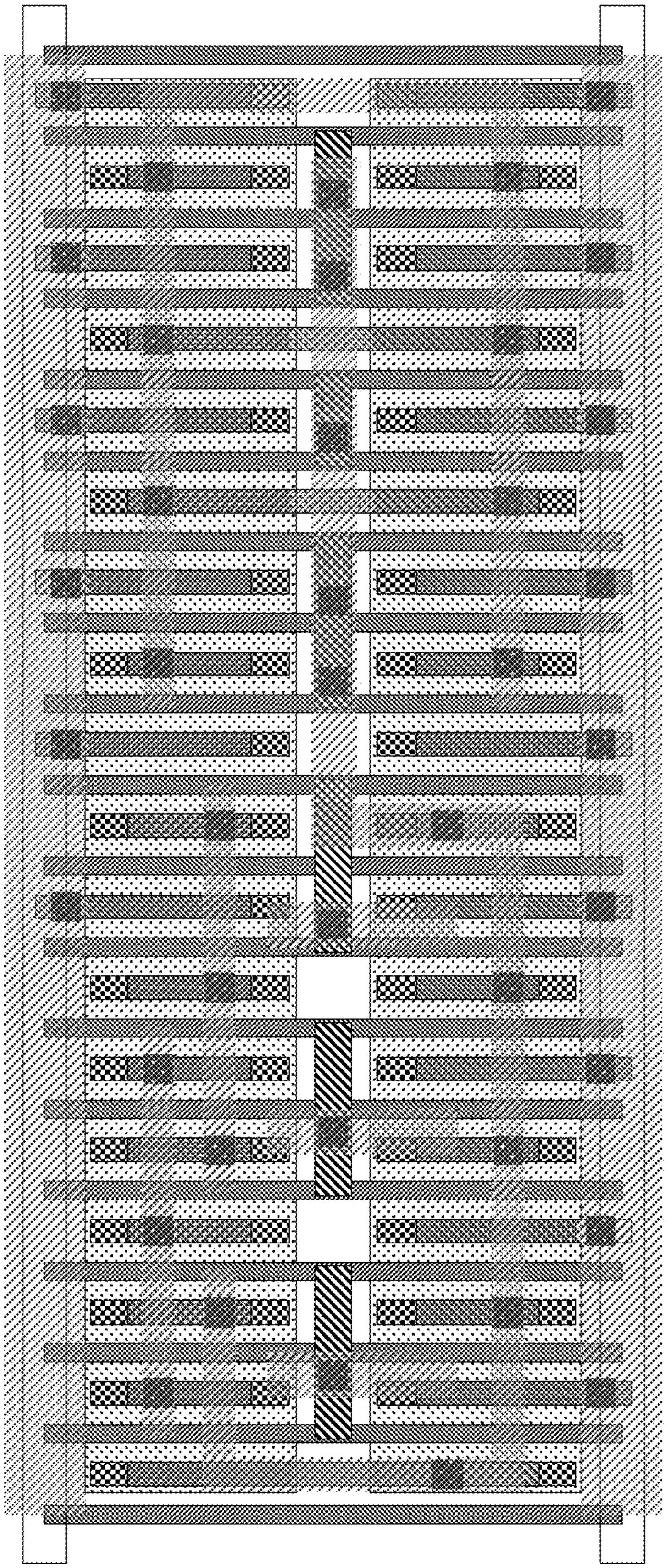
FIG. 457 depicts an OR3D8 cell.

Reference is made to FIG. 457, which depicts an OR3D8 cell. This cell implements the logic function or(A,B,C) in drive strength 8.

Figure 458:
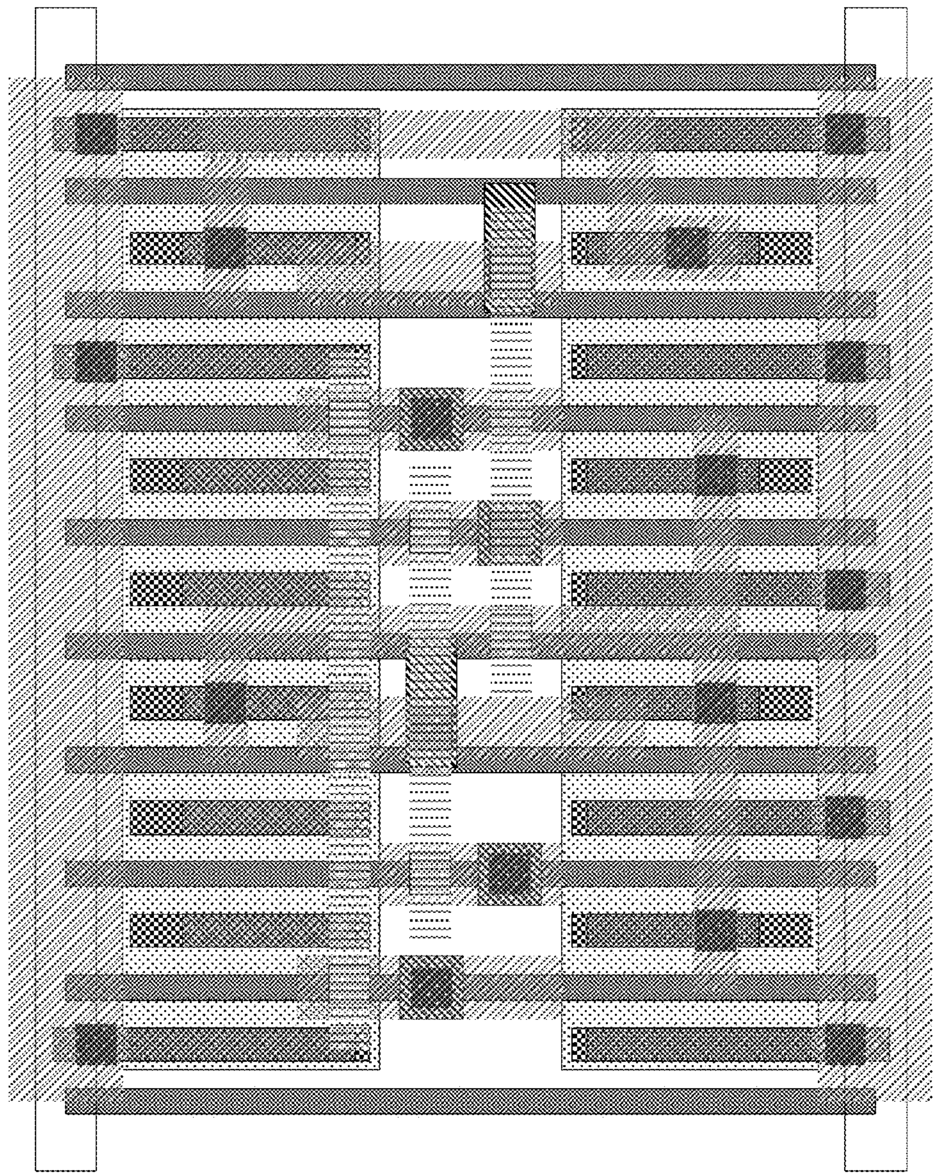
FIG. 458 depicts an OR3XD2 cell.

Reference is made to FIG. 458, which depicts an OR3XD2 cell. This an alternative embodiment of the OR3D2 cell.

Figure 459:
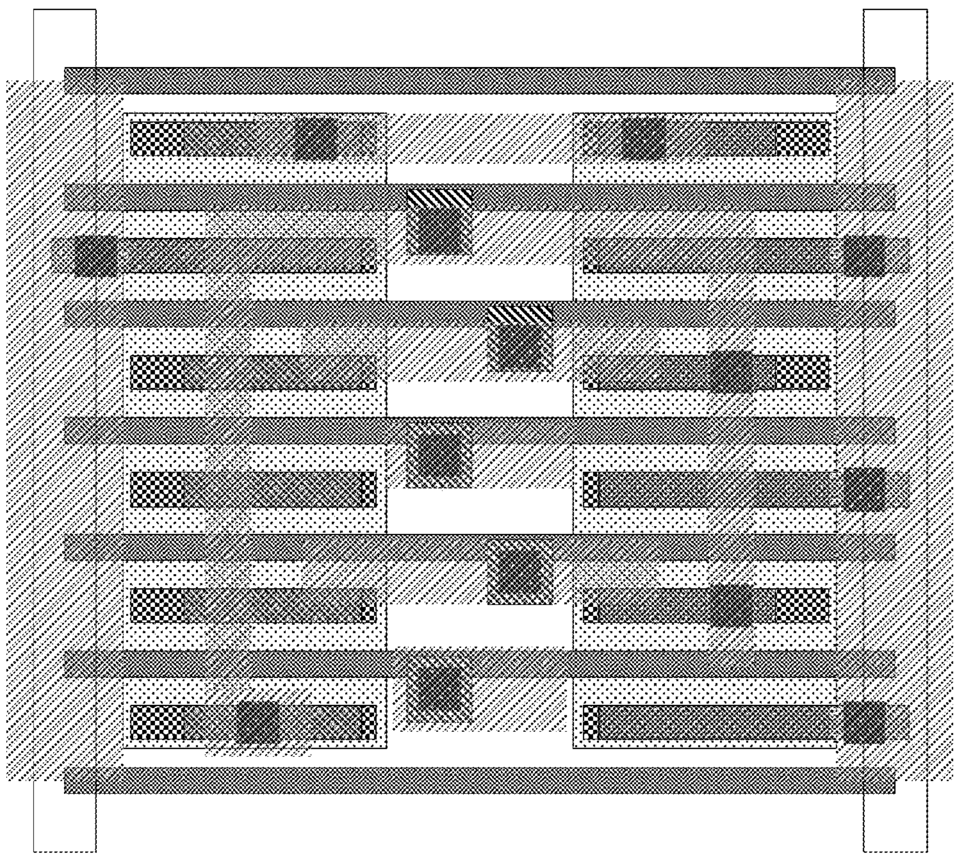
FIG. 459 depicts an OR4D1 cell.

Reference is made to FIG. 459, which depicts an OR4D1 cell. This cell implements the logic function or(A,B,C,D) in drive strength 1.

Figure 460:
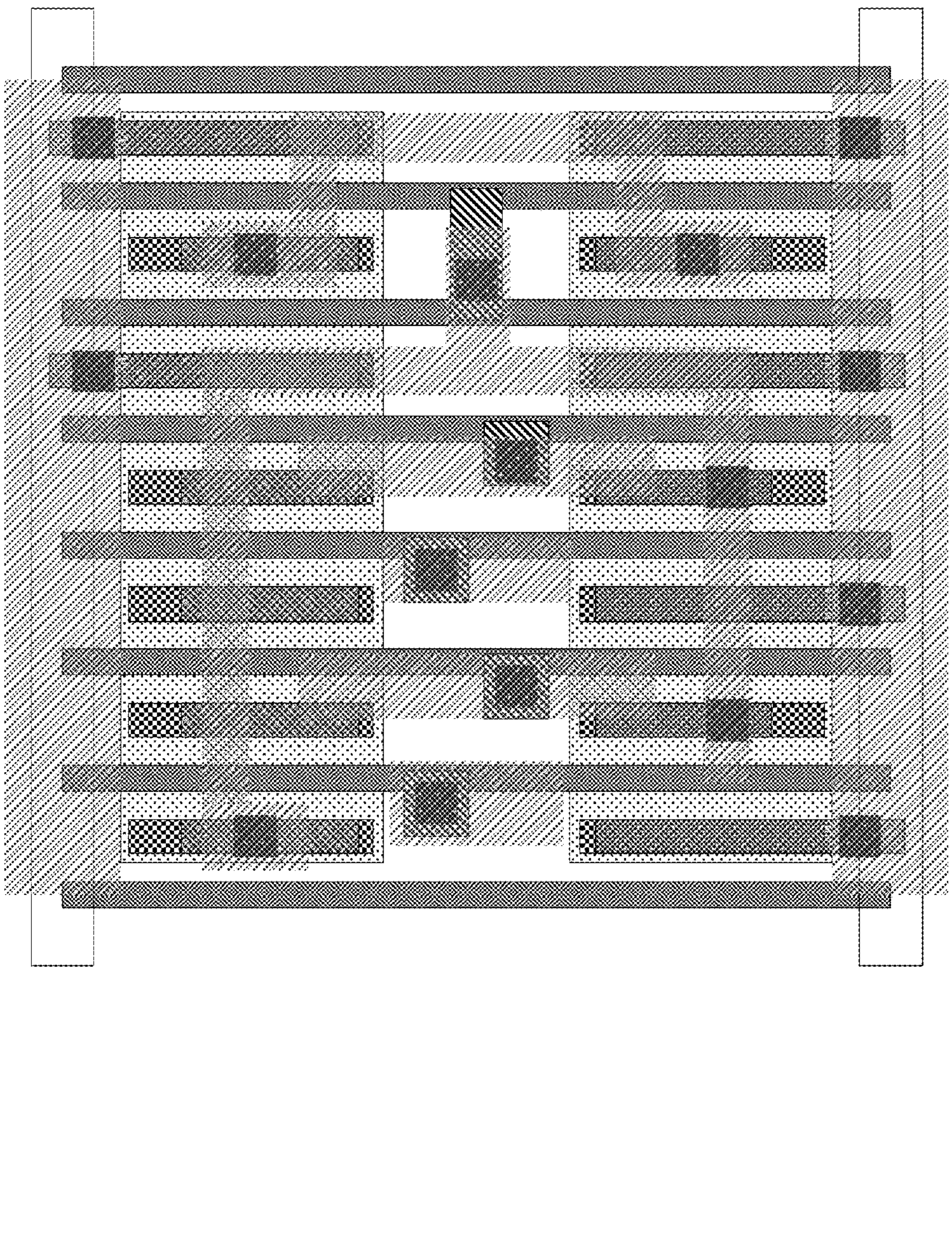
FIG. 460 depicts an OR4D2 cell.

Reference is made to FIG. 460, which depicts an OR4D2 cell. This cell implements the logic function or(A,B,C,D) in drive strength 2.

Figure 461:
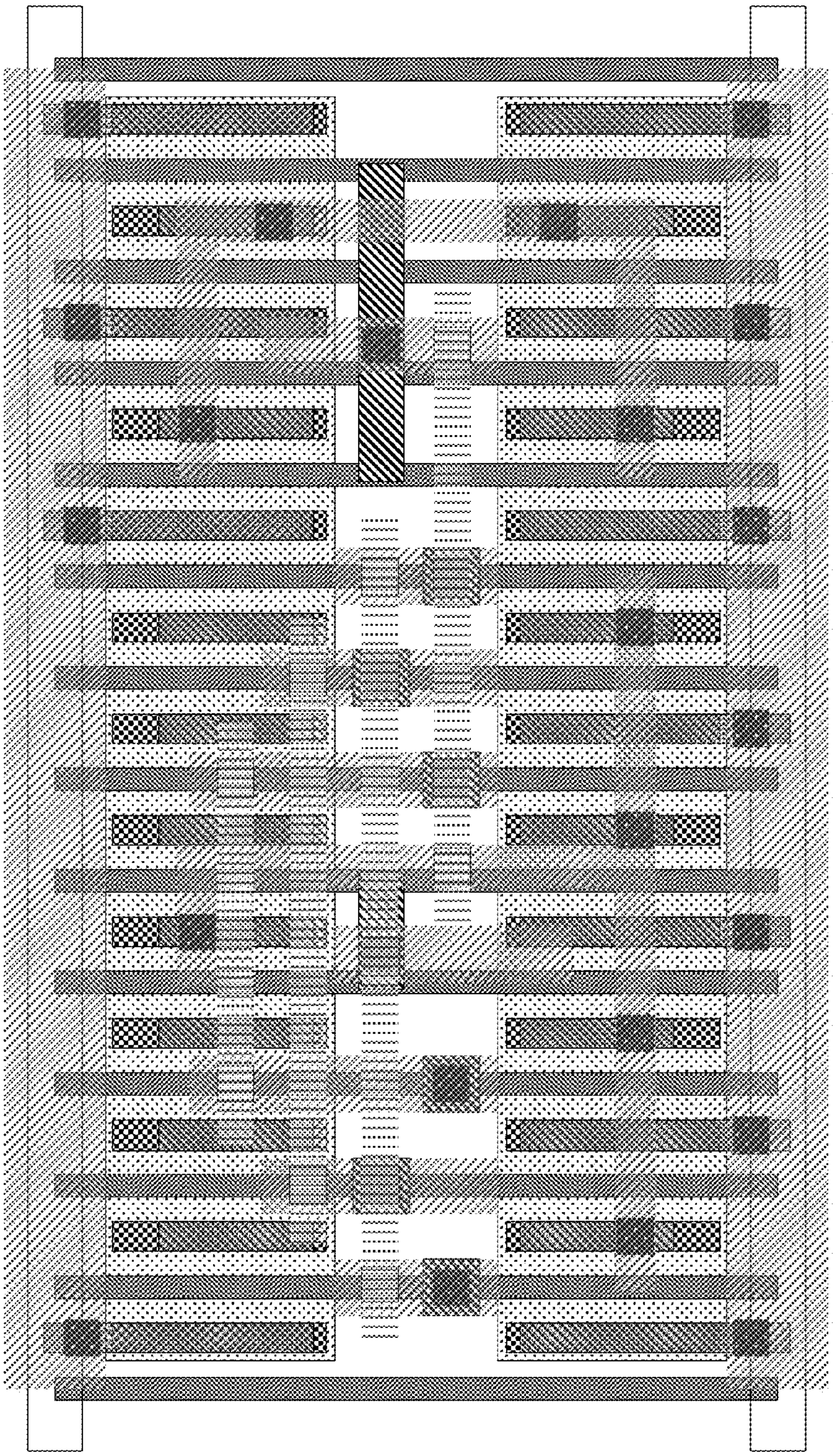
FIG. 461 depicts an OR4D4 cell.

Reference is made to FIG. 461, which depicts an OR4D4 cell. This cell implements the logic function or(A,B,C,D) in drive strength 4.

Figure 462:
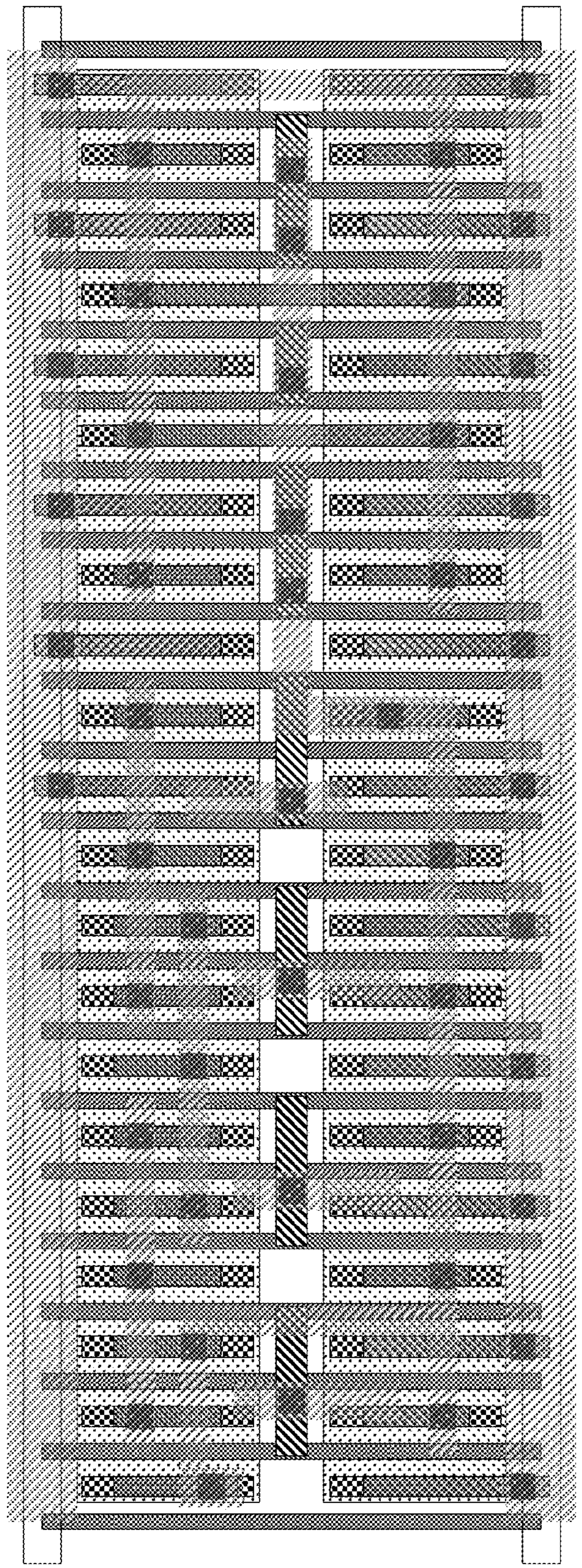
FIG. 462 depicts an OR4D8 cell.

Reference is made to FIG. 462, which depicts an OR4D8 cell. This cell implements the logic function or(A,B,C,D) in drive strength 8.

Reference is made to FIG. 463, which depicts an OR4XD2 cell. This is an alternative embodiment of the OR4D2 cell.

Figure 464:
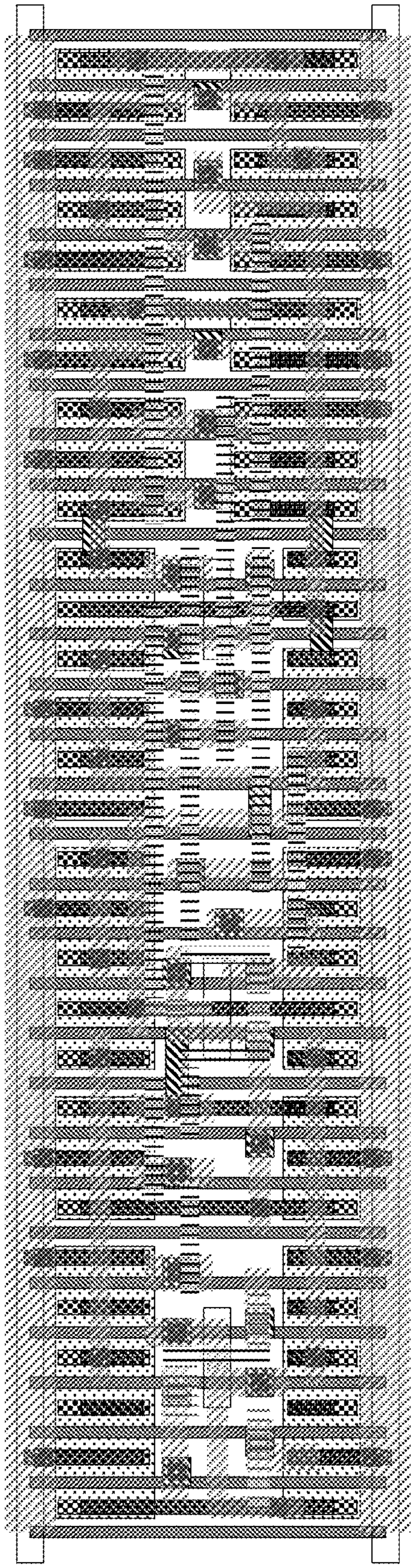
FIG. 464 depicts a SDFCSND1 cell.

Reference is made to FIG. 464, which depicts a SDFC-SND1 cell. This cell implements the function of a scan-enabled D-flip-flop in drive strength 1.

Figure 465:
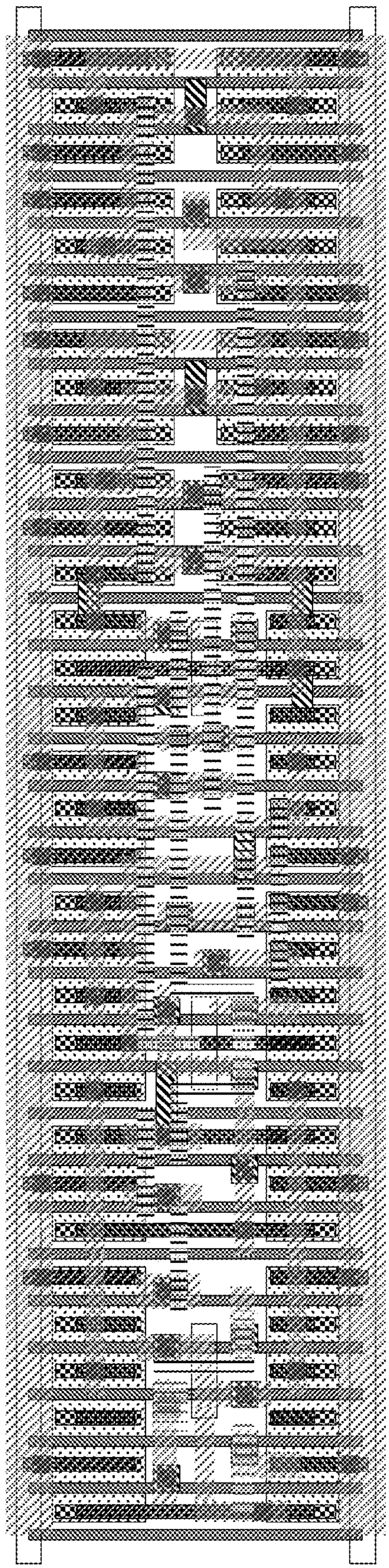
FIG. 465 depicts a SDFCSND2 cell.

Reference is made to FIG. 465, which depicts a SDFC-SND2 cell. This cell implements the function of a scan-enabled D-flip-flop in drive strength 2.

Figure 466:
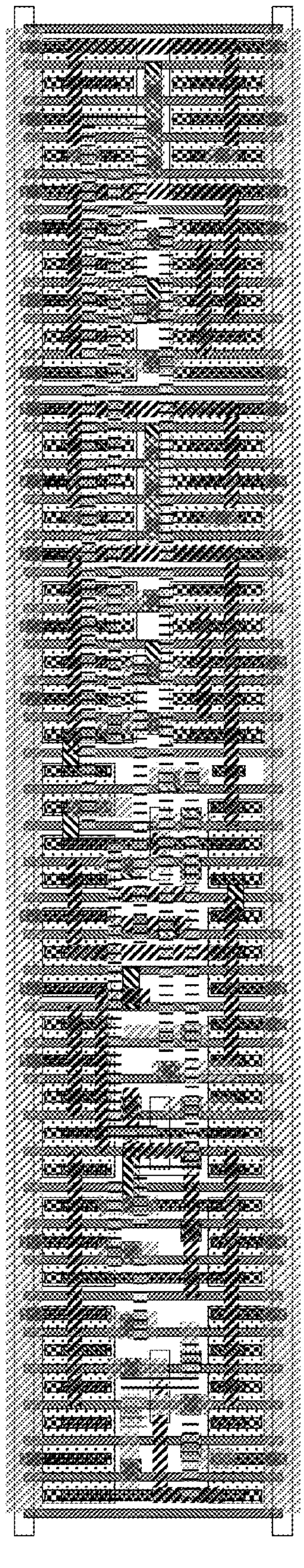
FIG. 466 depicts a SDFCSND4 cell.

Reference is made to FIG. 466, which depicts a SDFC-SND4 cell. This cell implements the function of a scan-enabled D-flip-flop in drive strength 4.

Figure 467:
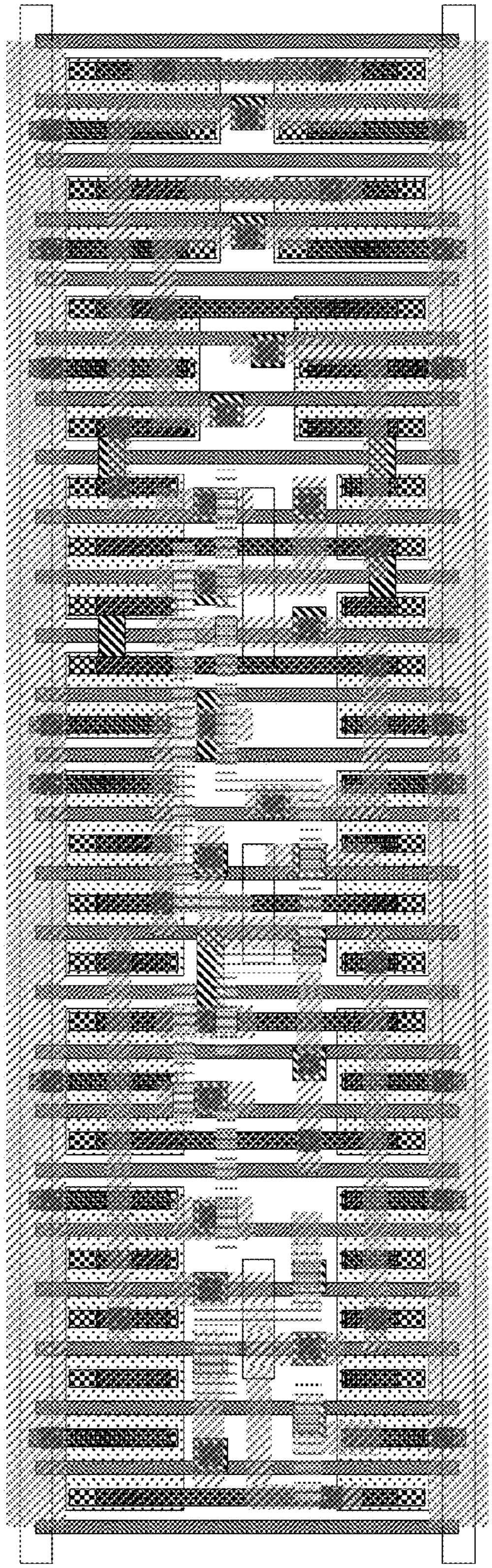
FIG. 467 depicts a SDFD1 cell.

Reference is made to FIG. 467, which depicts a SDFD1 cell. This cell implements the function of a scan-enabled D-flip-flop in drive strength 1.

Figure 468:
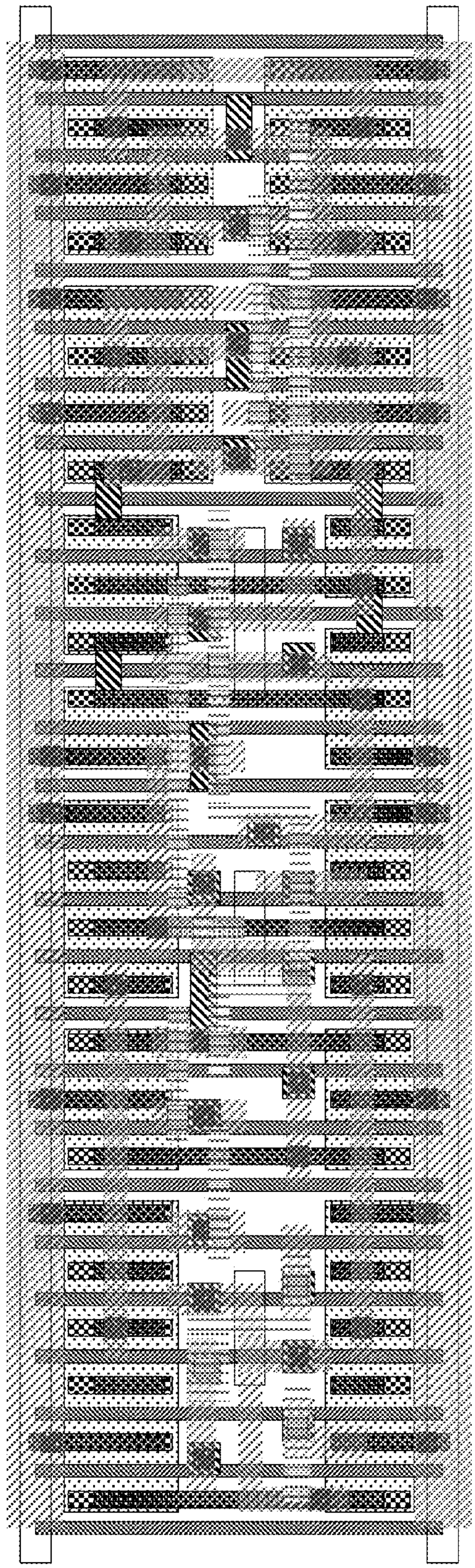
FIG. 468 depicts a SDFD2 cell.

Reference is made to FIG. 468, which depicts a SDFD2 cell. This cell implements the function of a scan-enabled D-flip-flop in drive strength 2.

Figure 469:
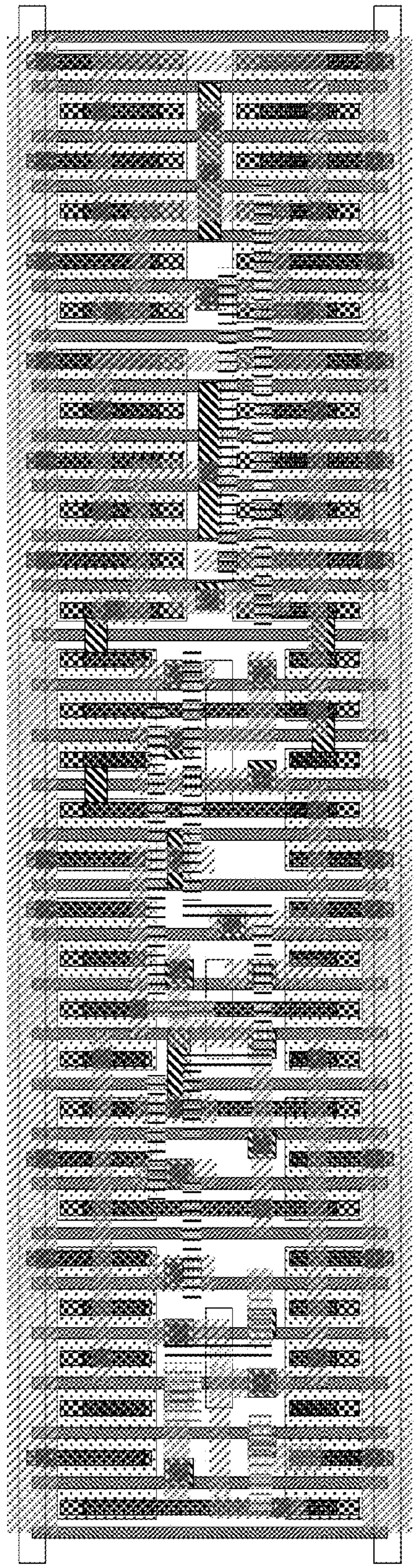
FIG. 469 depicts a SDFD4 cell.

Reference is made to FIG. 469, which depicts a SDFD4 cell. This cell implements the function of a scan-enabled D-flip-flop in drive strength 4.

Figure 470:
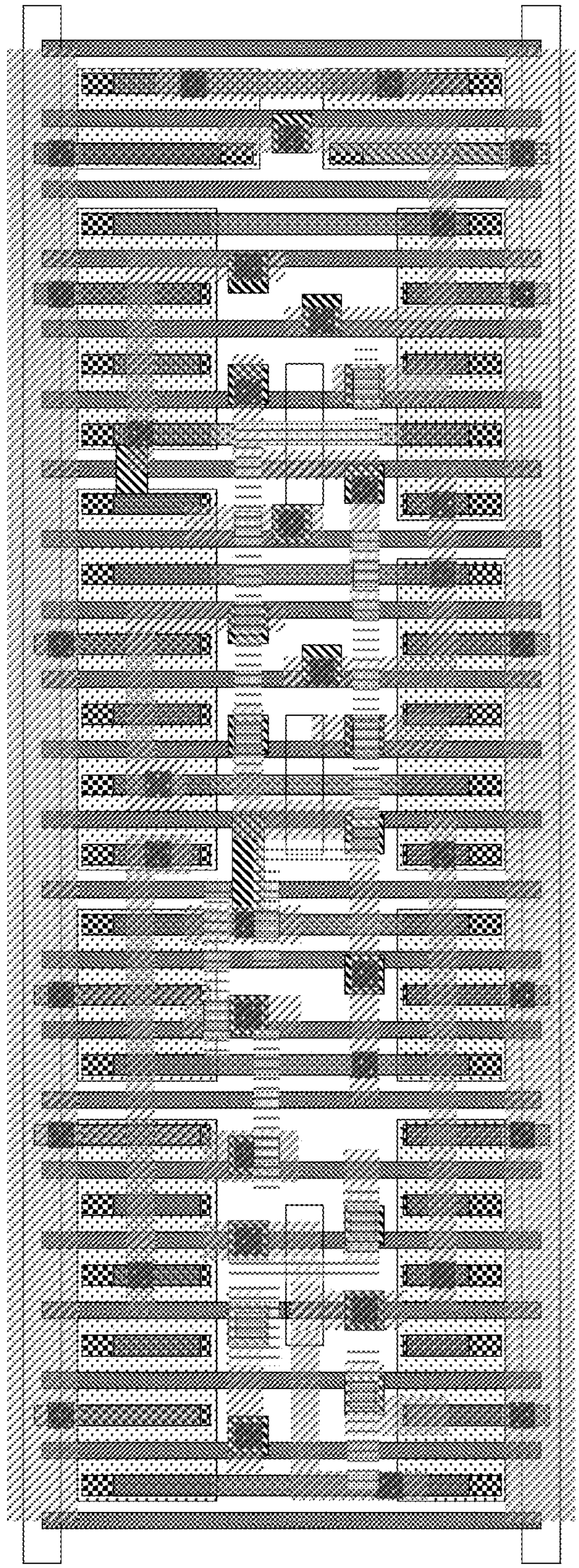
FIG. 470 depicts a SDFQD1 cell.

Reference is made to FIG. 470, which depicts a SDFQD1 cell. This cell implements the function of a scan-enabled D-flip-flop in drive strength 1.

Figure 471:
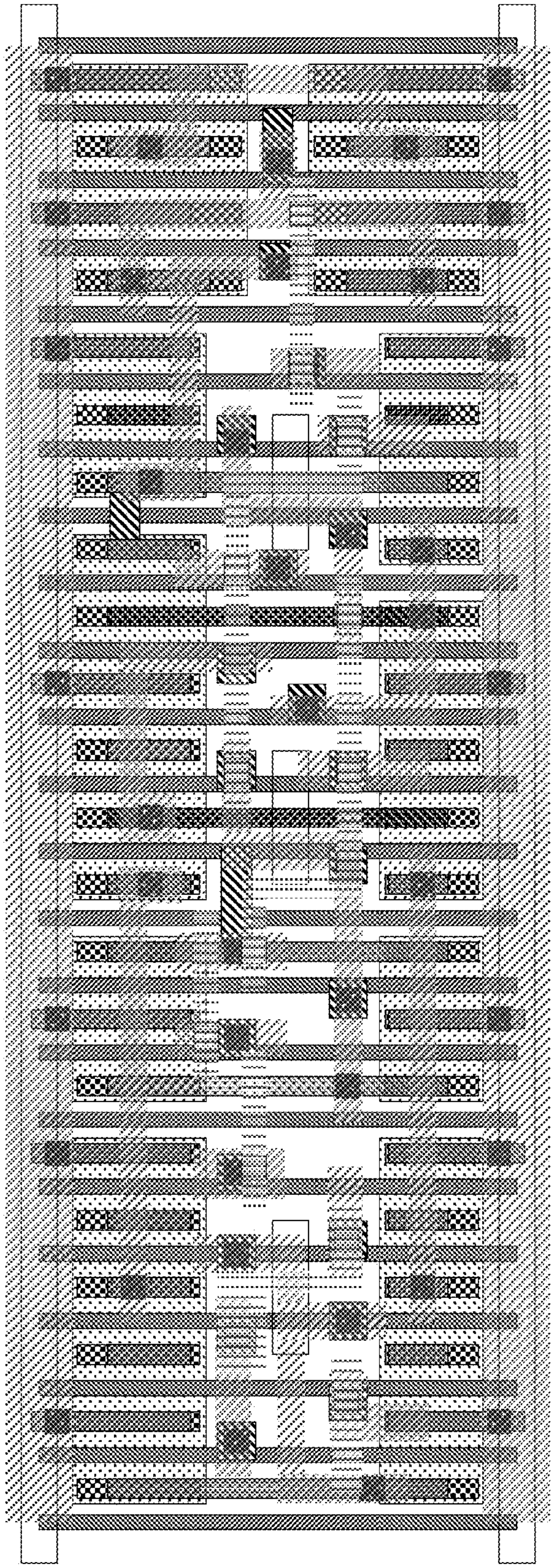
FIG. 471 depicts a SDFQD2 cell.

Reference is made to FIG. 471, which depicts a SDFQD2 cell. This cell implements the function of a scan-enabled D-flip-flop in drive strength 2.

Figure 472:
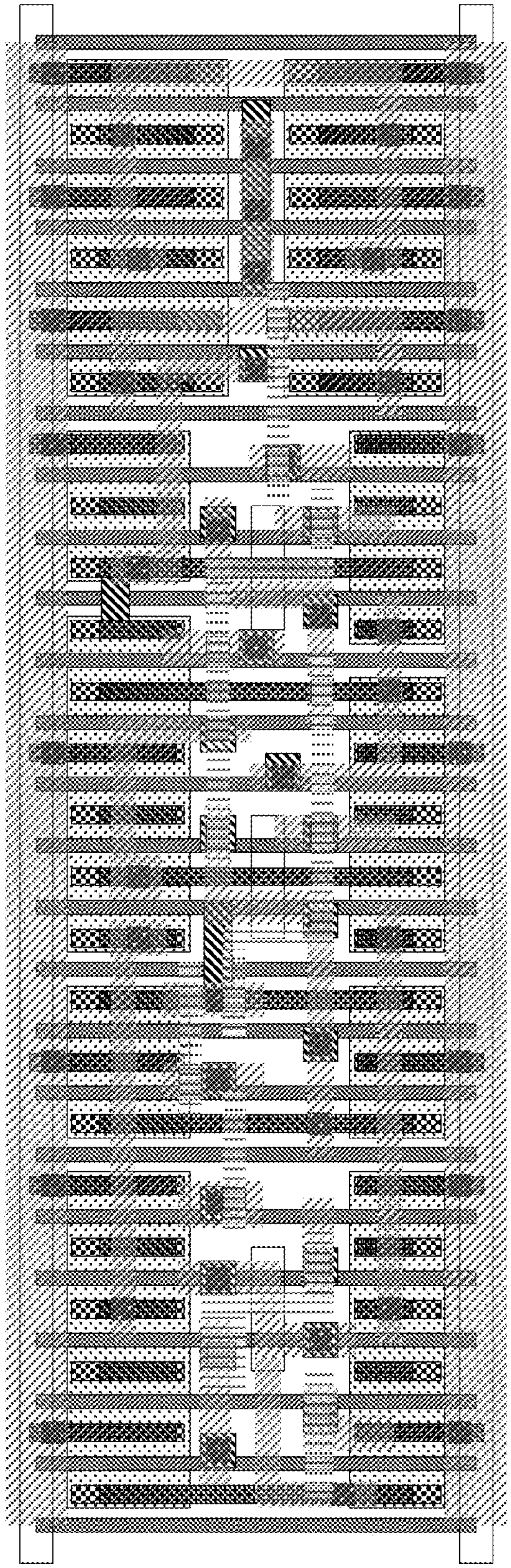
FIG. 472 depicts a SDFQD4 cell.

Reference is made to FIG. 472, which depicts a SDFQD4 cell. This cell implements the function of a scan-enabled D-flip-flop in drive strength 4.

Figure 473:
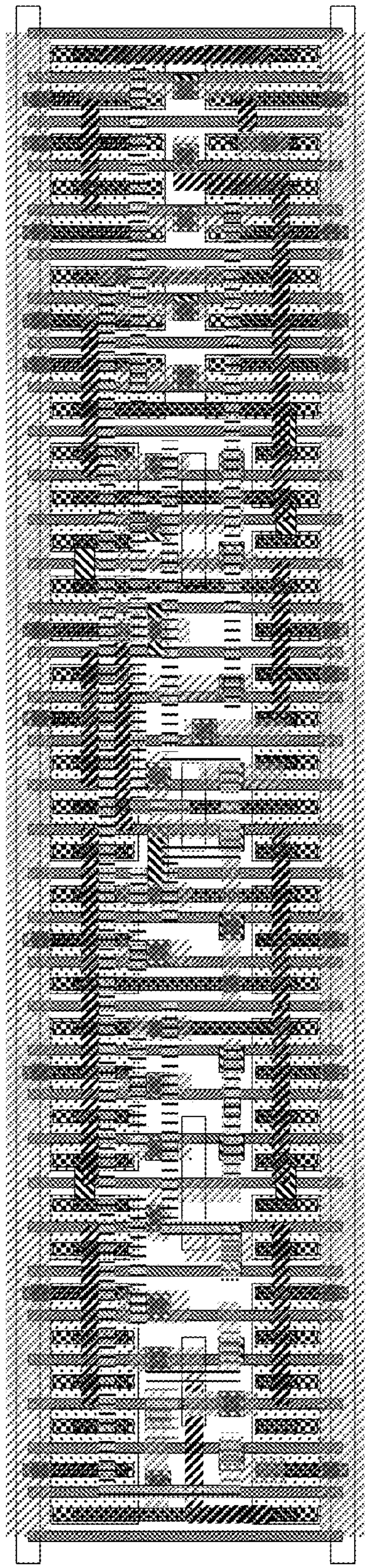
FIG. 473 depicts a SEDFCND1 cell.

Reference is made to FIG. 473, which depicts a SED-FCND1 cell. This cell implements the function of a scan-enabled E-flip-flop in drive strength 1.

Figure 474:
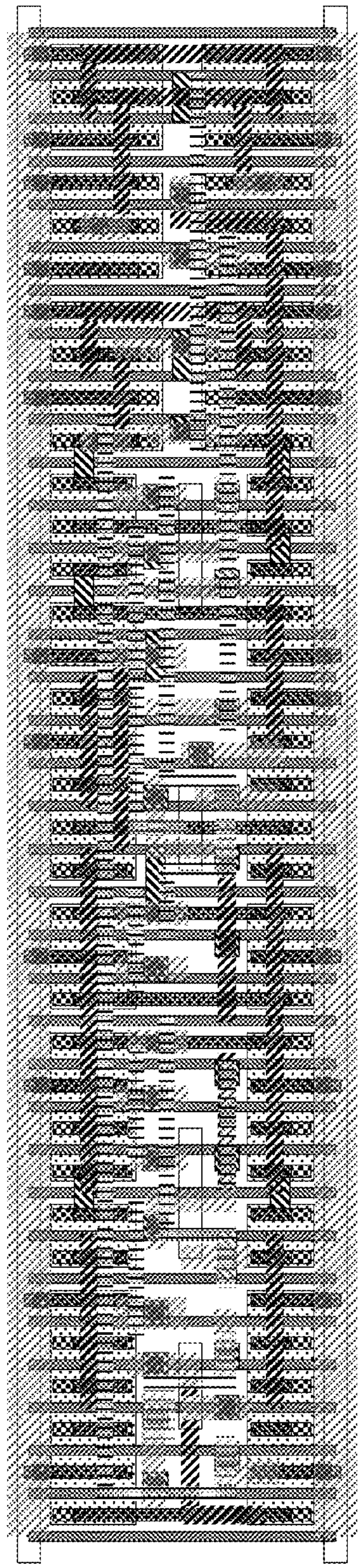
FIG. 474 depicts a SEDFCND2 cell.

Reference is made to FIG. 474, which depicts a SED-FCND2 cell. This cell implements the function of a scan-enabled E-flip-flop in drive strength 2.

Figure 475:
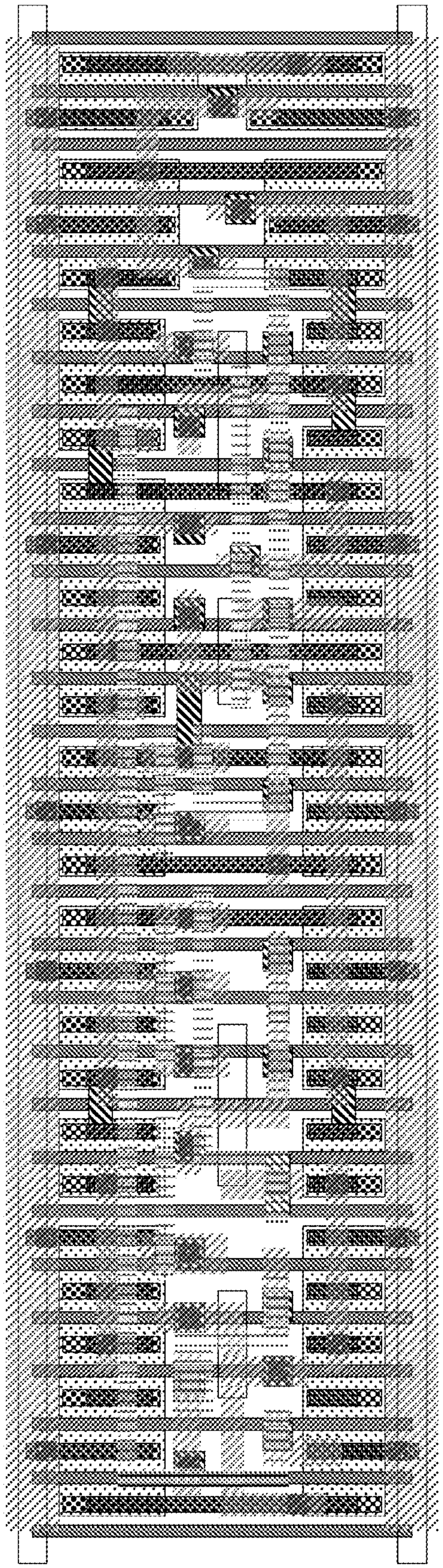
FIG. 475 depicts a SEDFQD1 cell.

Reference is made to FIG. 475, which depicts a SED-FQD1 cell. This cell implements the function of a scan-enabled E-flip-flop in drive strength 1.

Figure 476:
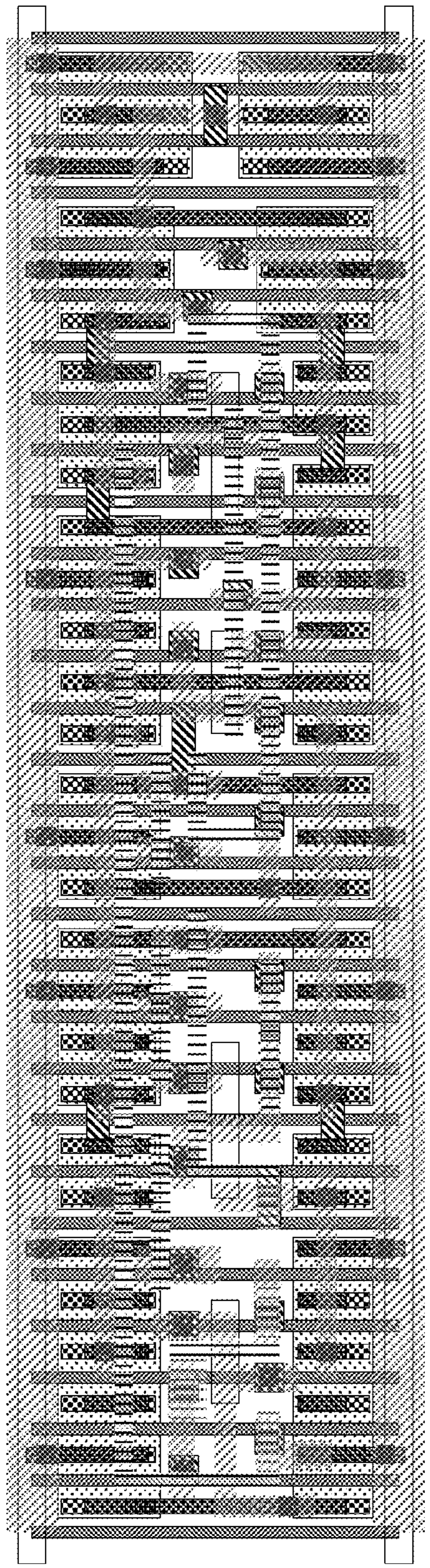
FIG. 476 depicts a SEDFQD2 cell.

Reference is made to FIG. 476, which depicts a SED-FQD2 cell. This cell implements the function of a scan-enabled E-flip-flop in drive strength 2.

Figure 477:
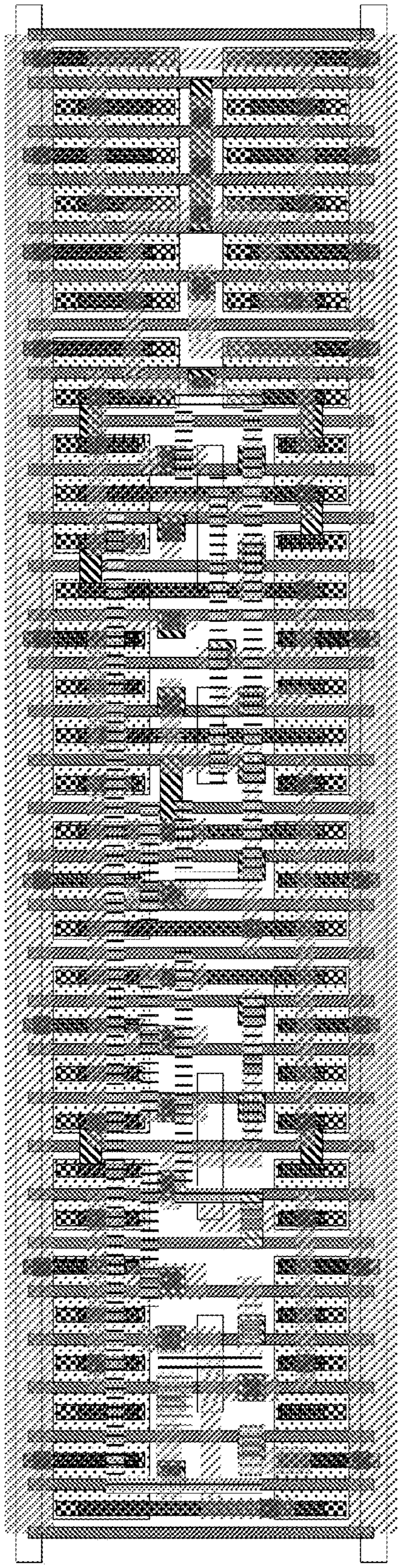
FIG. 477 depicts a SEDFQD4 cell.

Reference is made to FIG. 477, which depicts a SEDFQD4 cell. This cell implements the function of a scan-enabled E-flip-flop in drive strength 4.

Figure 478:
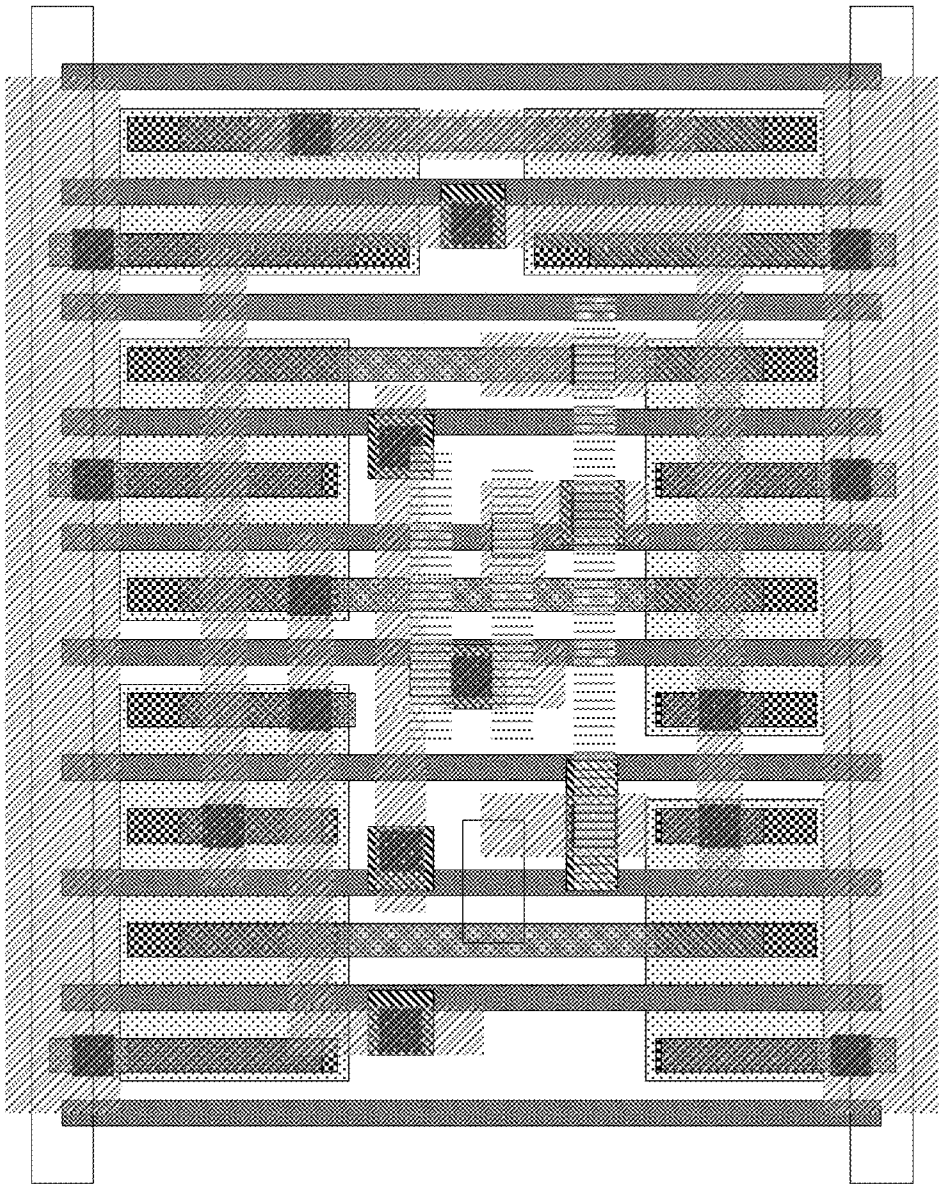
FIG. 478 depicts an XNR2D1 cell.

Reference is made to FIG. 478, which depicts an XNR2D1 cell. This cell implements the logic function xnor(A,B) in drive strength 1.

Figure 479:
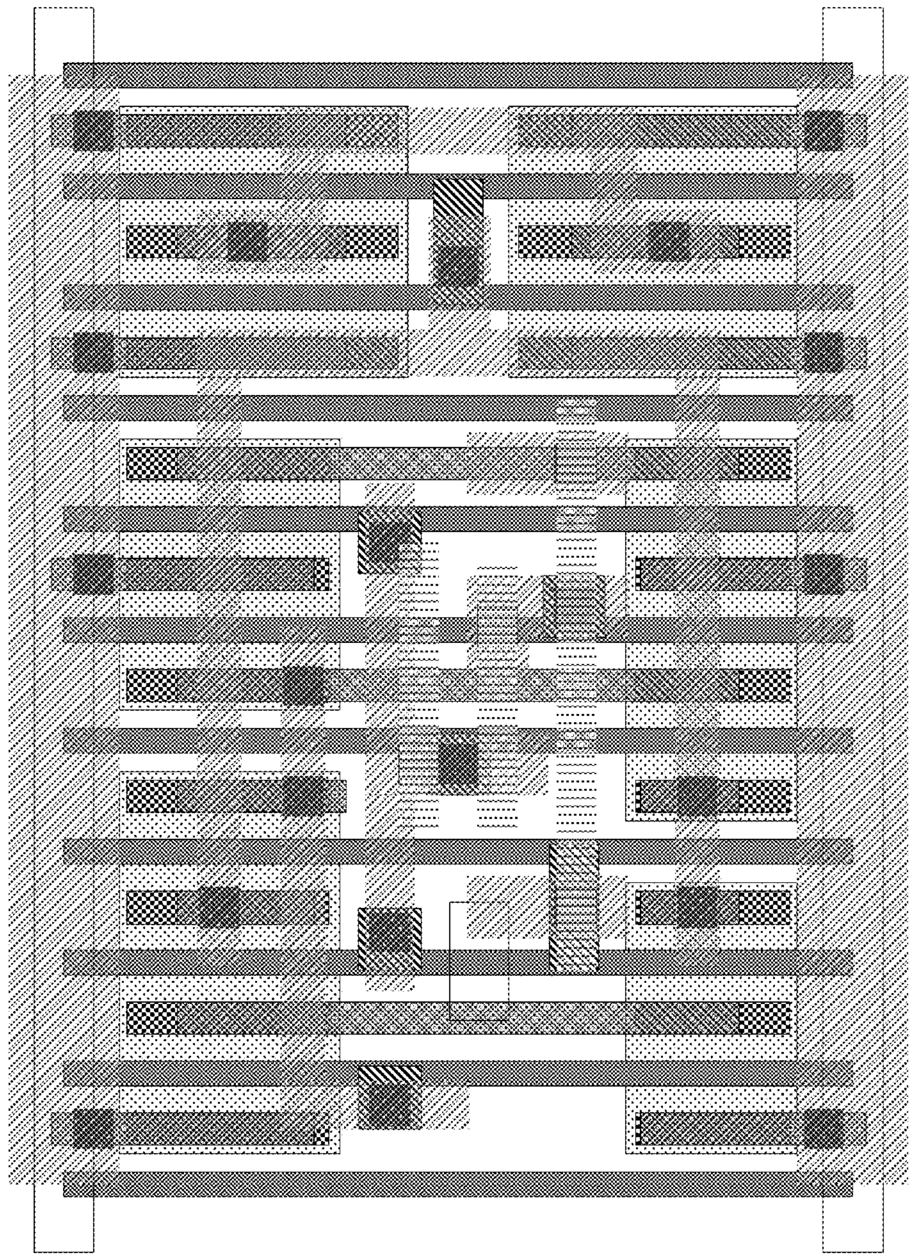
FIG. 479 depicts an XNR2D2 cell.

Reference is made to FIG. 479, which depicts an XNR2D2 cell. This cell implements the logic function xnor(A,B) in drive strength 2.

Figure 480:
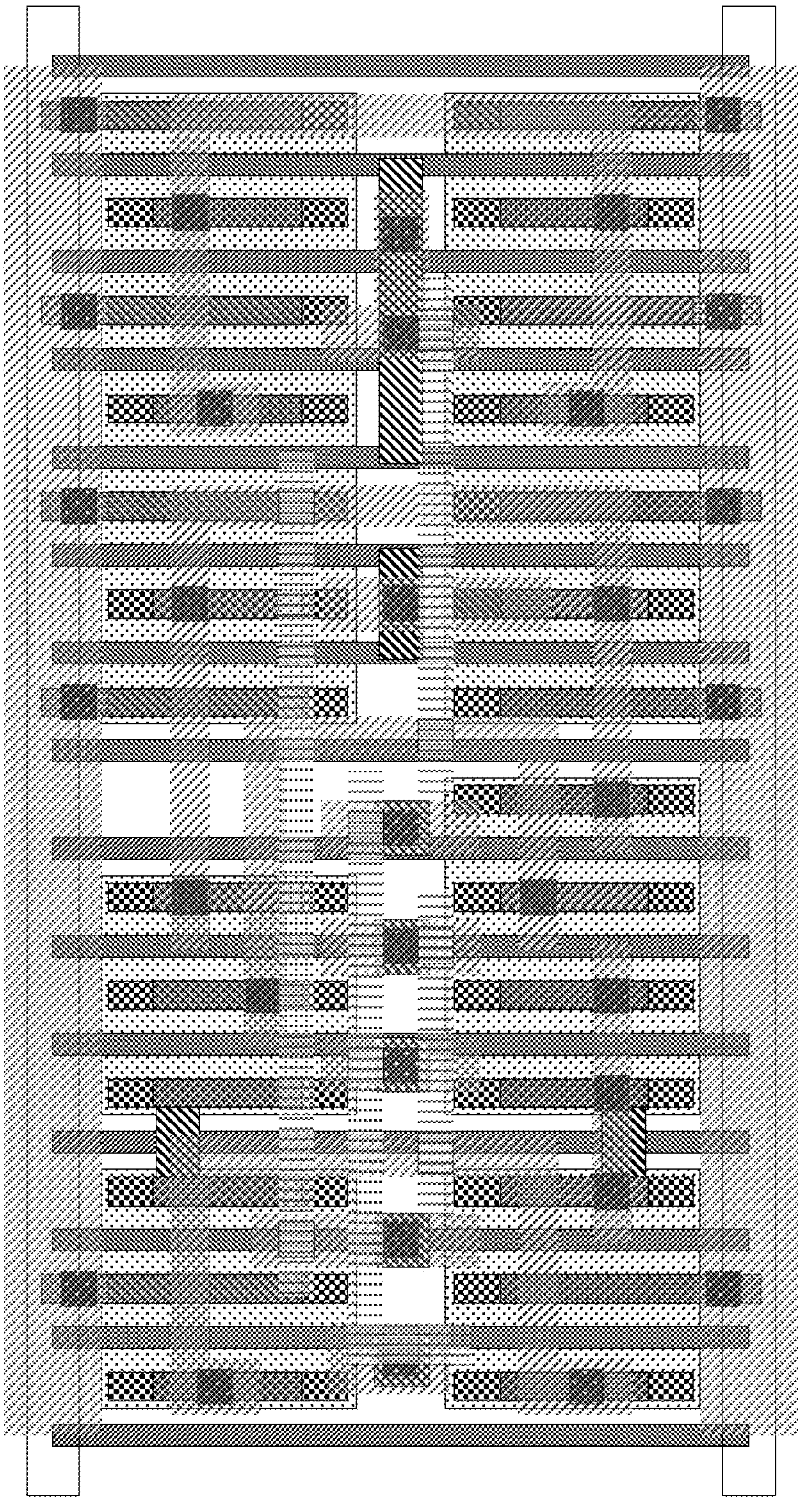
FIG. 480 depicts an XNR2D4 cell.

Reference is made to FIG. 480, which depicts an XNR2D4 cell. This cell implements the logic function xnor(A,B) in drive strength 4.

Figure 481:
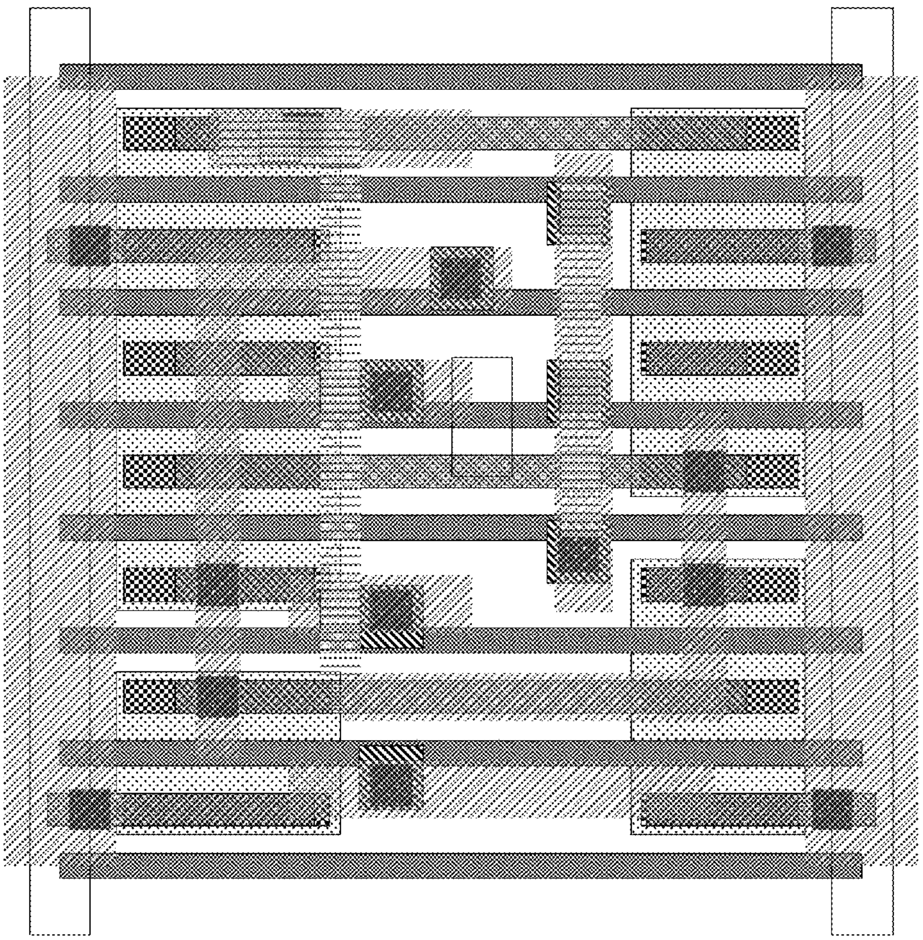
FIG. 481 depicts an XNR2HDD1 cell.

Reference is made to FIG. 481, which depicts an XNR2HDD1 cell. This cell implements the logic function xnor(A,B) in drive strength 1.

Figure 482:
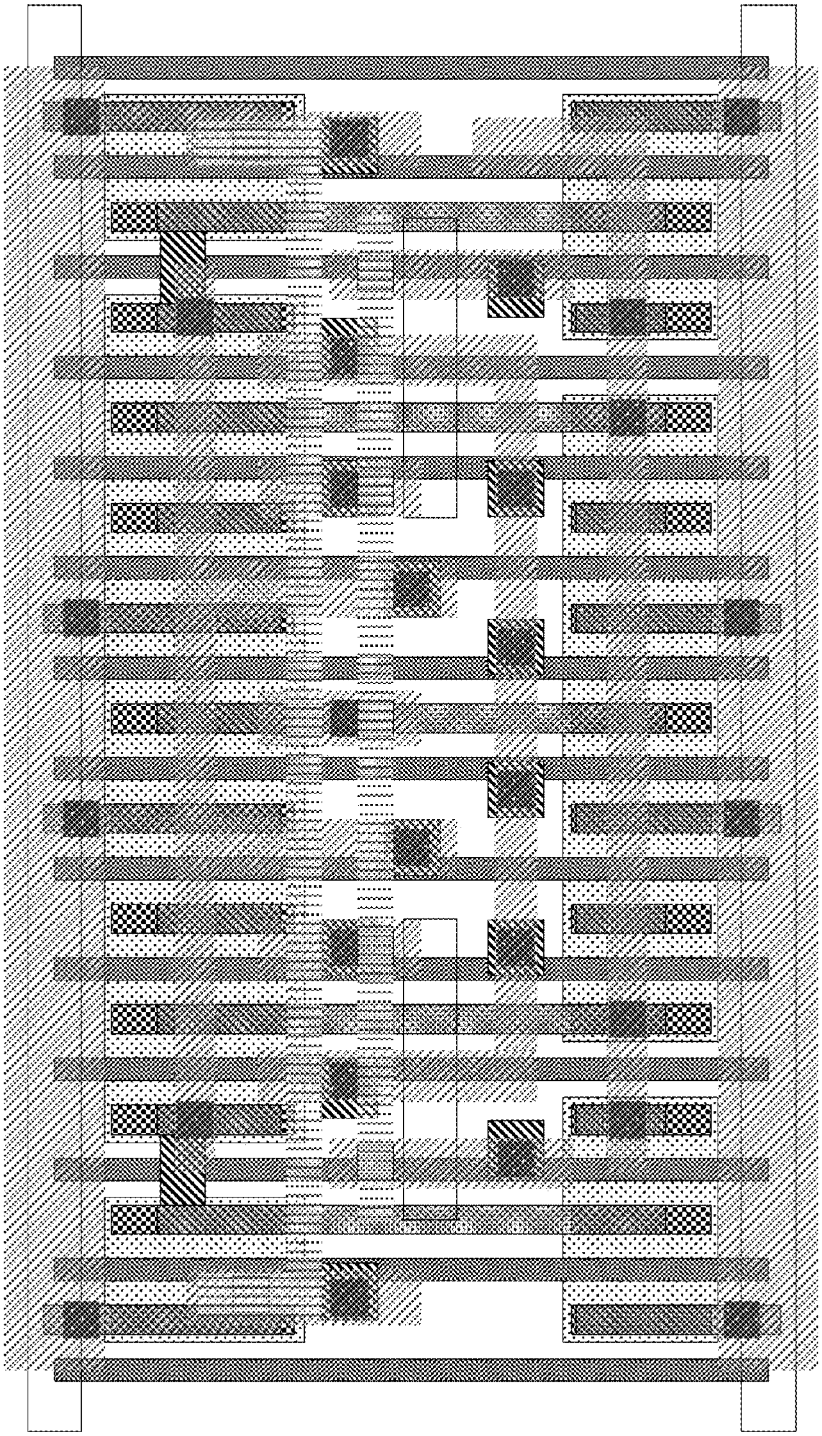
FIG. 482 depicts an XNR2HDD2 cell.

Reference is made to FIG. 482, which depicts an XNR2HDD2 cell. This cell implements the logic function xnor(A,B) in drive strength 2.

Figure 483:
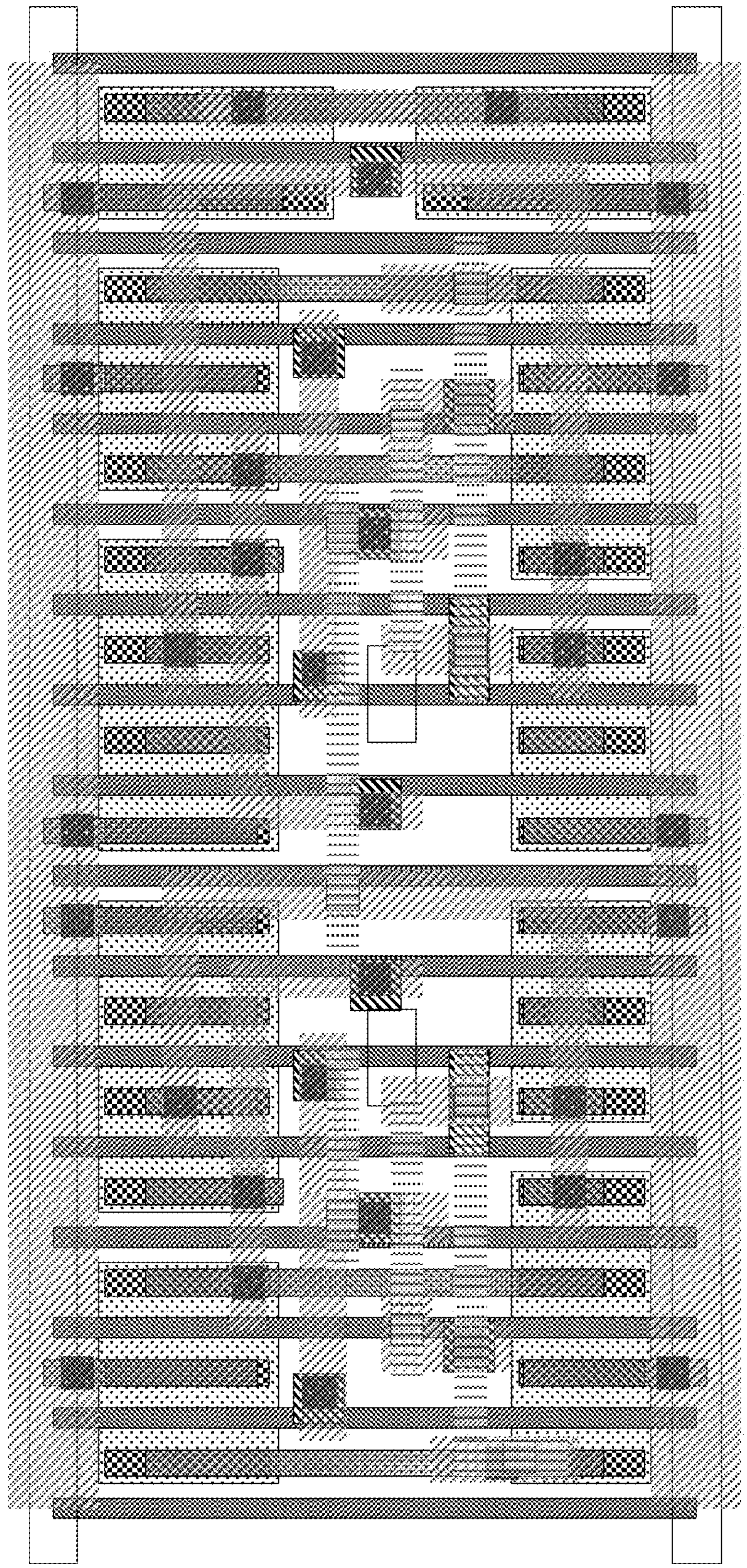
FIG. 483 depicts an XNR3D1 cell.

Reference is made to FIG. 483, which depicts an XNR3D1 cell. This cell implements the logic function xnor(A,B,C) in drive strength 1.

Figure 484:
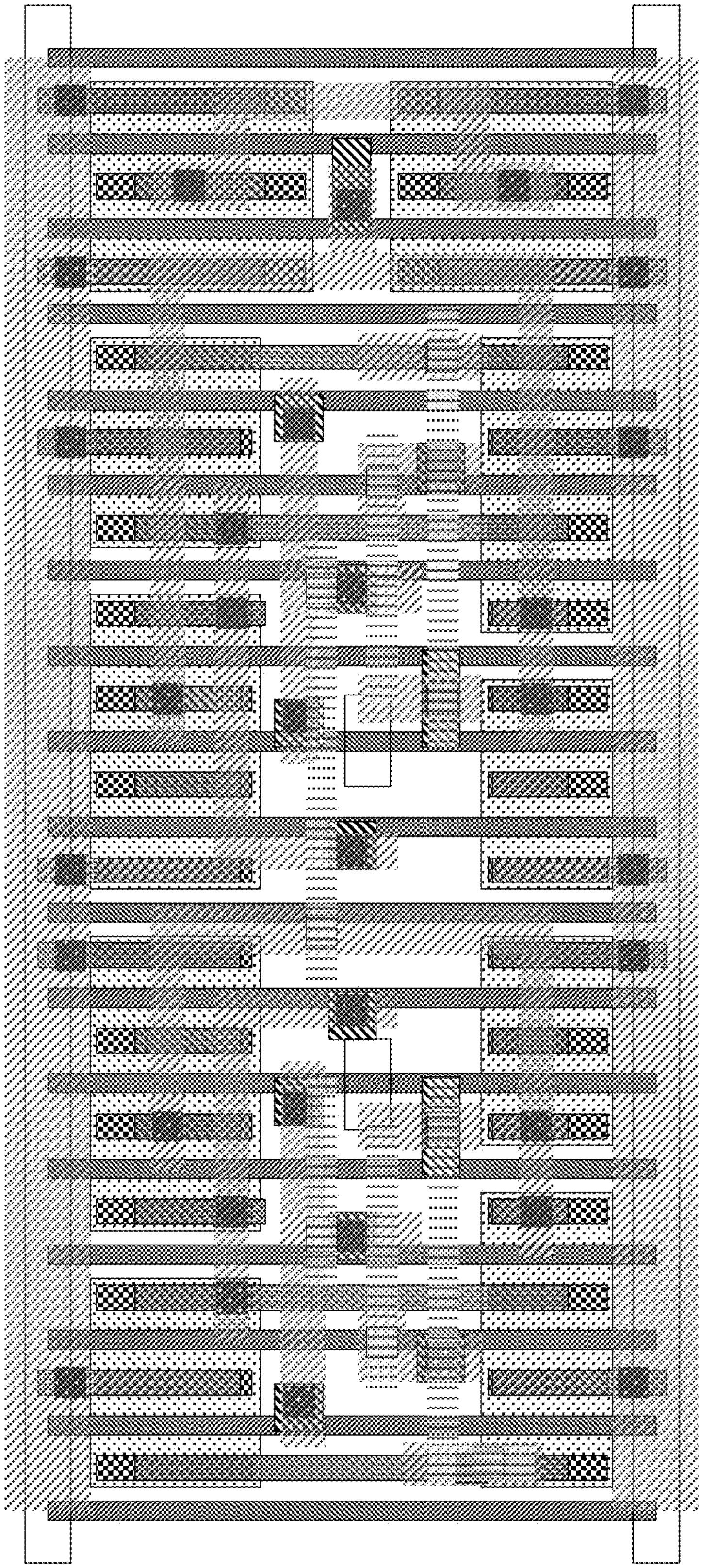
FIG. 484 depicts an XNR3D2 cell.

Reference is made to FIG. 484, which depicts an XNR3D2 cell. This cell implements the logic function xnor(A,B,C) in drive strength 2.

Figure 485:
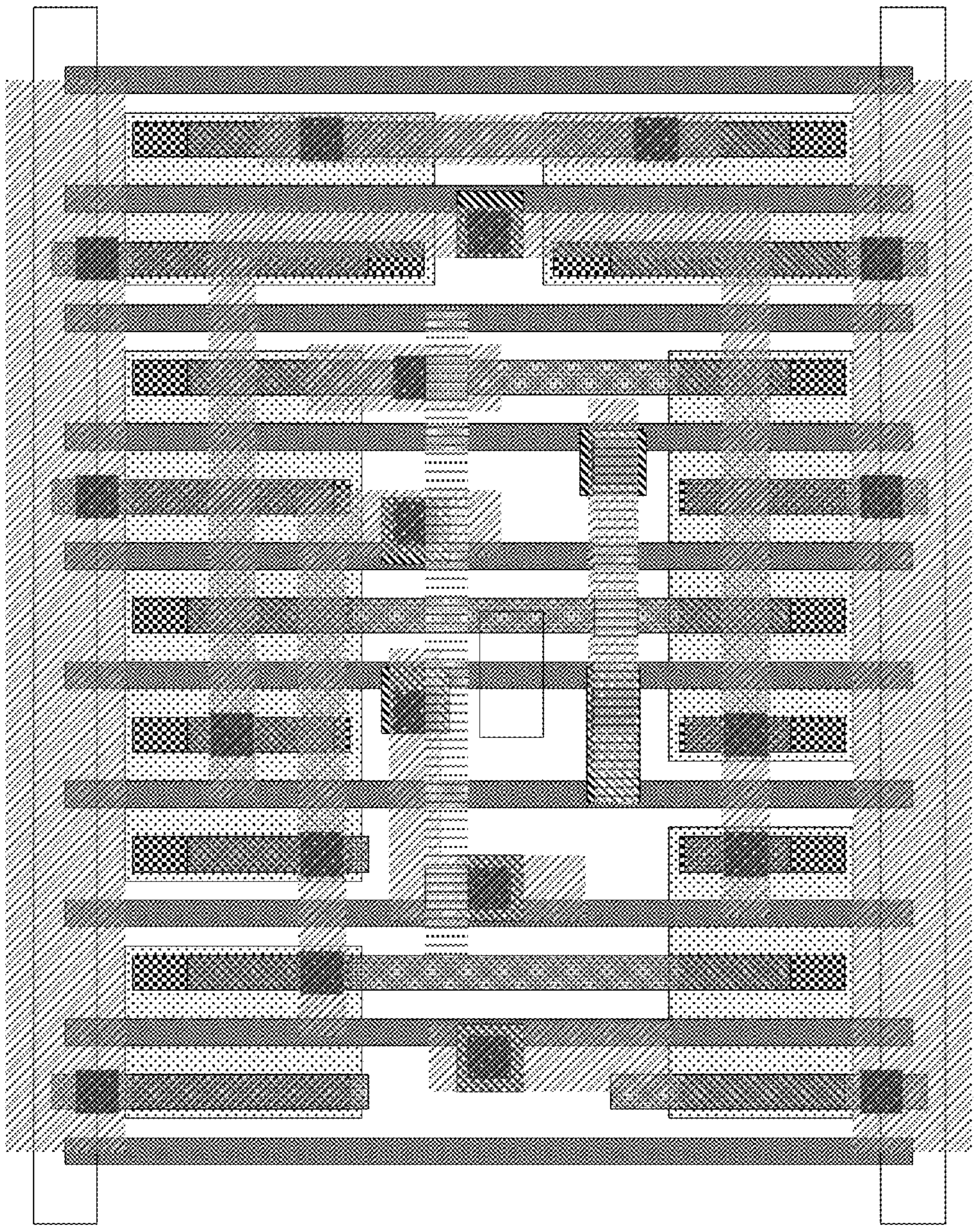
FIG. 485 depicts an XOR2D1 cell.

Reference is made to FIG. 485, which depicts an XOR2D1 cell. This cell implements the logic function xor(A,B) in drive strength 1.

Figure 486:
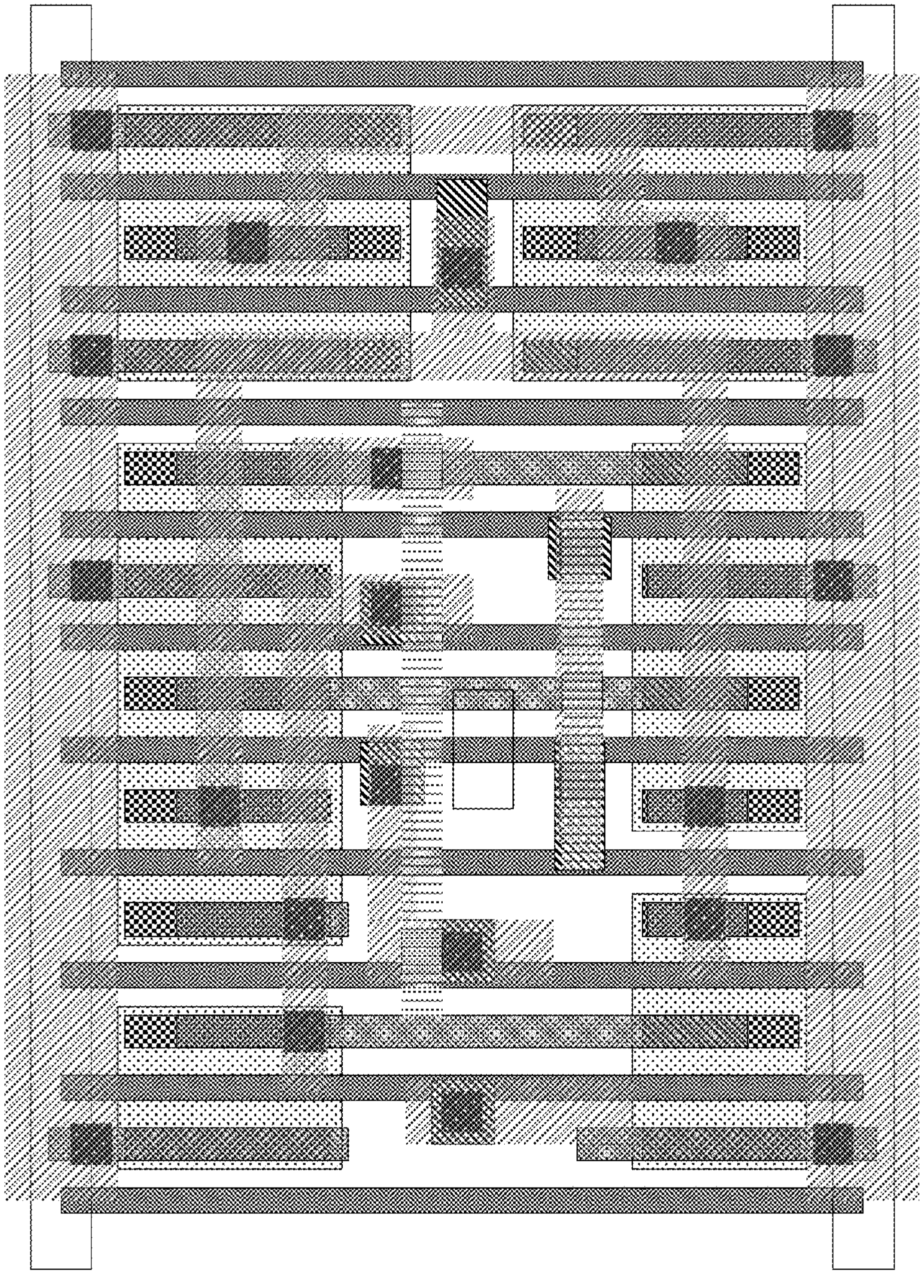
FIG. 486 depicts an XOR2D2 cell.

Reference is made to FIG. 486, which depicts an XOR2D2 cell. This cell implements the logic function xor(A,B) in drive strength 2.

Figure 487:
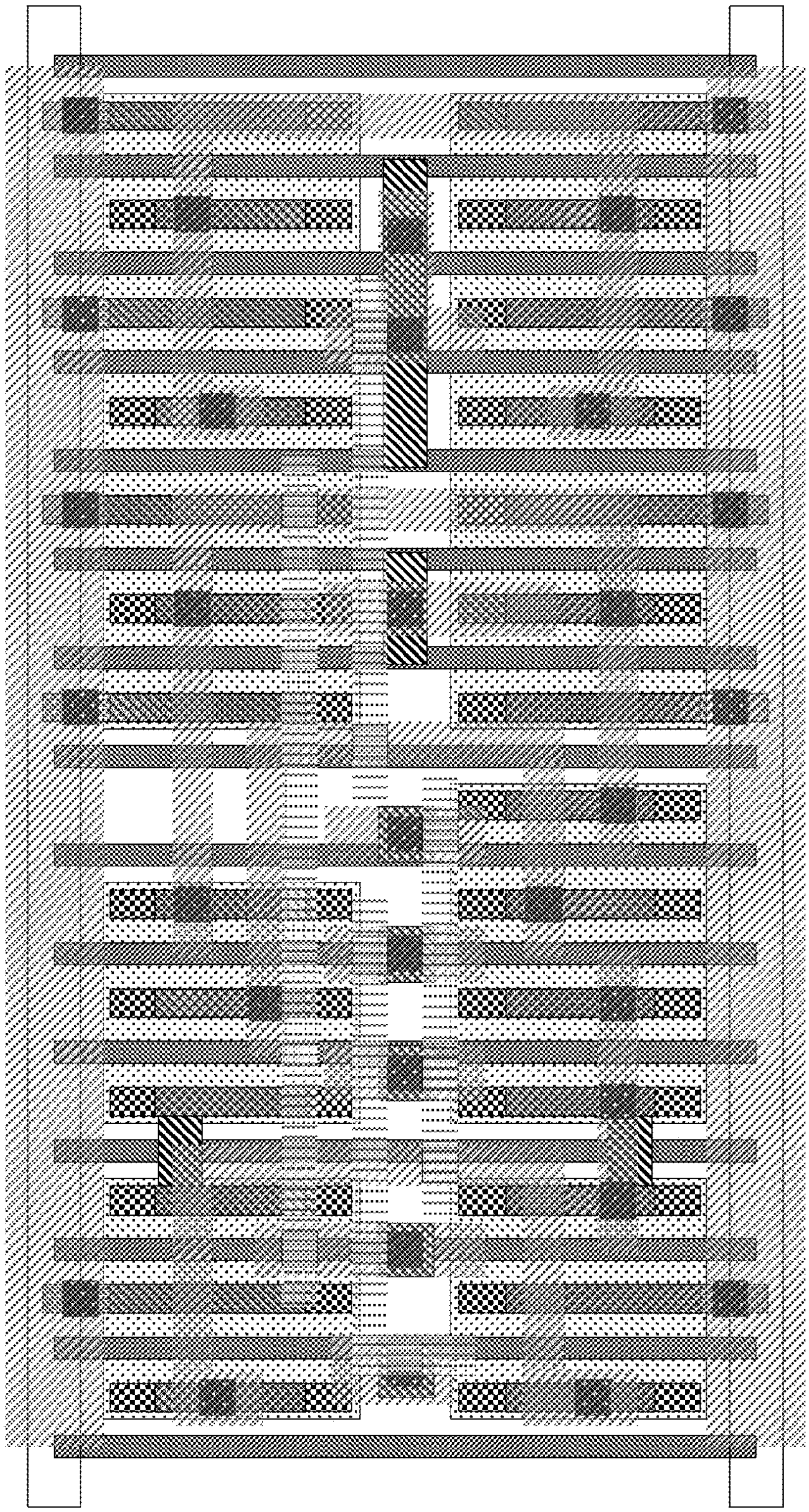
FIG. 487 depicts an XOR2D4 cell.

Reference is made to FIG. 487, which depicts an XOR2D4 cell. This cell implements the logic function xor(A,B) in drive strength 4.

Figure 488:
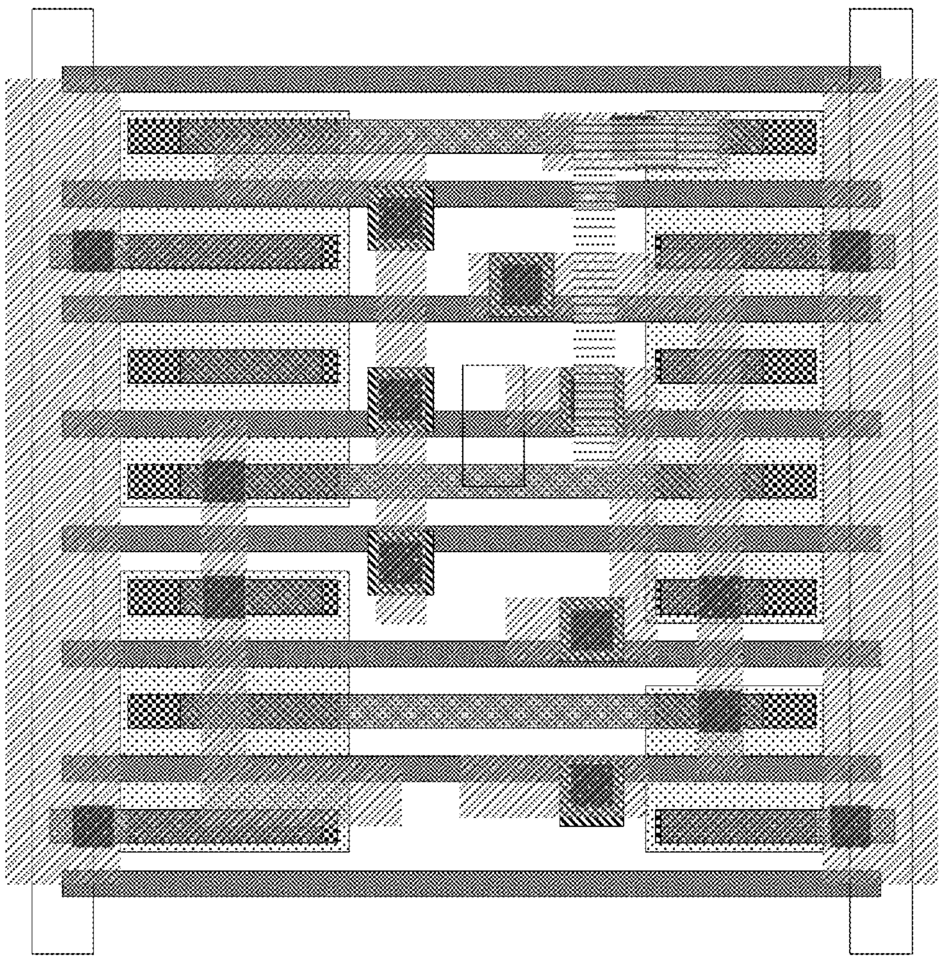
FIG. 488 depicts an XOR2HDD1 cell.

Reference is made to FIG. 488, which depicts an XOR2HDD1 cell. This cell implements the logic function xor(A,B) in drive strength 1.

Figure 489:
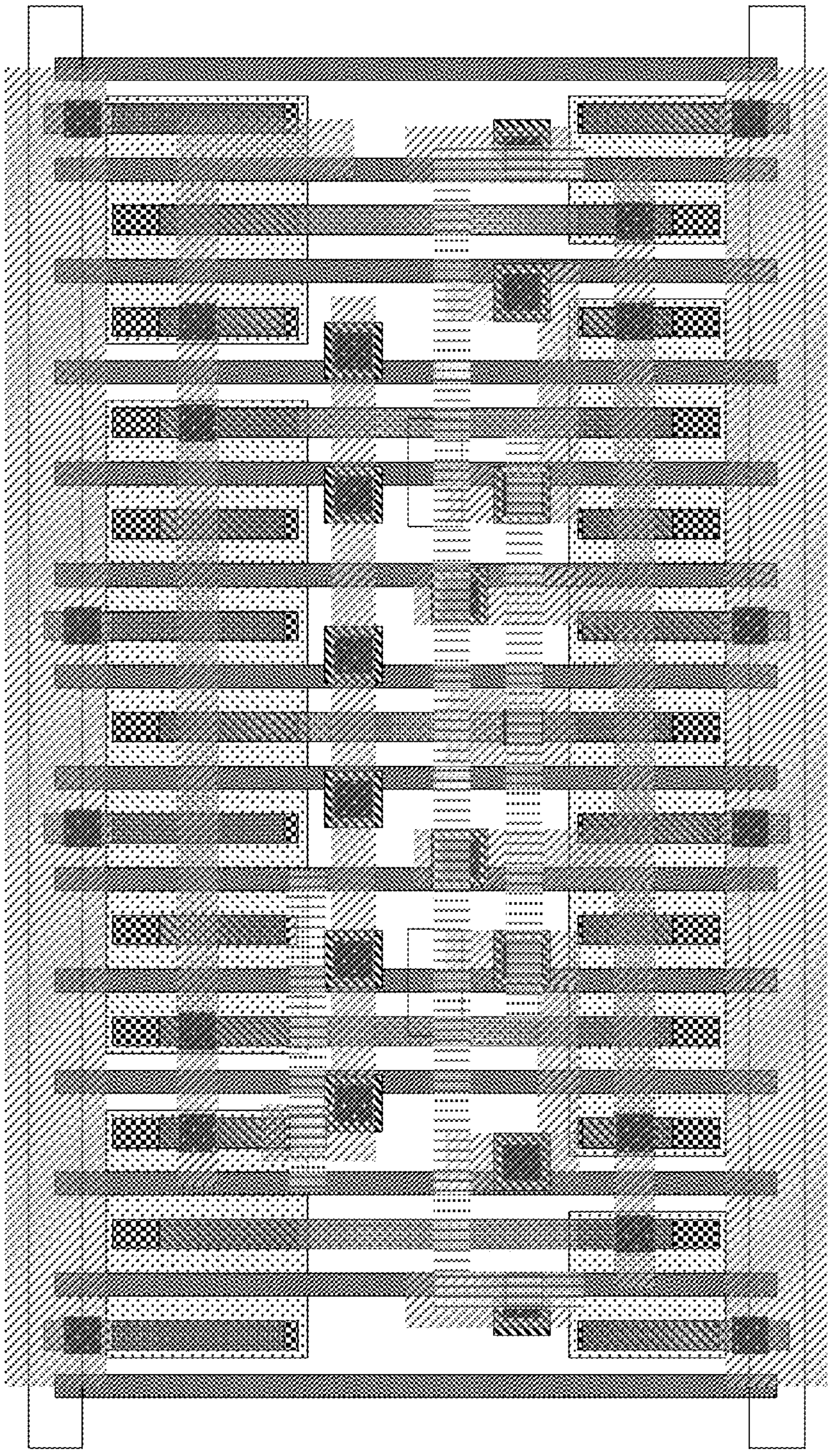
FIG. 489 depicts an XOR2HDD2 cell.

Reference is made to FIG. 489, which depicts an XOR2HDD2 cell. This cell implements the logic function xor(A,B) in drive strength 2.

Figure 490:
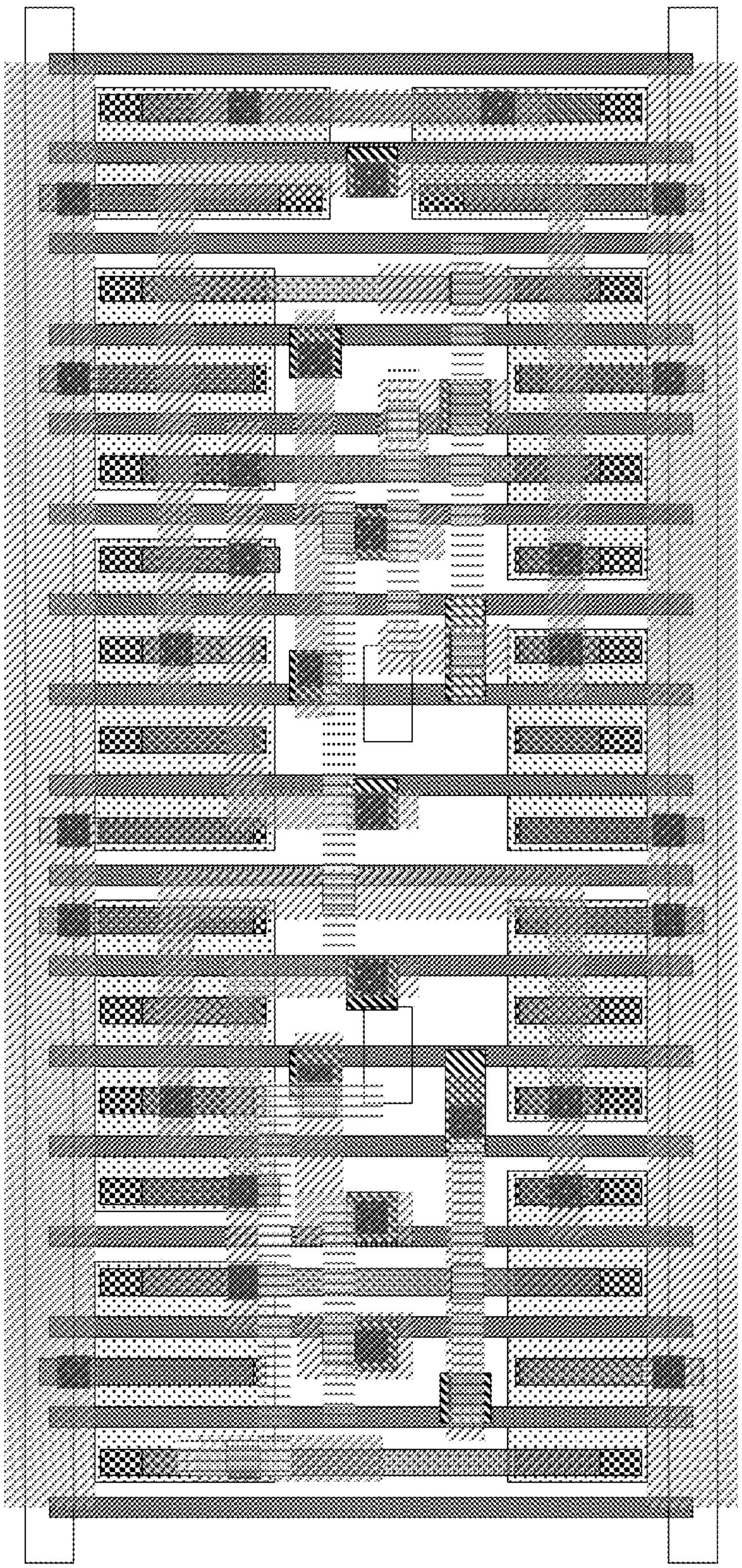
FIG. 490 depicts an XOR3D1 cell; and,
FIG. 491 depicts an XOR3D2 cell.

Reference is made to FIG. 490, which depicts an XOR3D1 cell. This cell implements the logic function xor(A,B,C) in drive strength 1.

Reference is made to FIG. 491, which depicts an XOR3D2 cell. This cell implements the logic function xor(A,B,C) in drive strength 2.

What we claim in this application is:

1. A product integrated circuit, comprising:

at least two different means for performing a logical AND function;

at least two different means for performing a logical AND-OR-INVERT function;

at least two different means for performing a logical MUX function;

at least two different means for performing a logical NAND function;

at least two different means for performing a logical OR-AND-INVERT function; and, at least two different means for performing a logical NOR function.

2. A product integrated circuit, as defined in claim 1, further comprising:

at least two different means for performing a logical OR function; and, at least two different means for performing a logical XOR function.

3. A product integrated circuit, as defined in claim 1, further comprising:

at least two different means for performing a logical XNOR function.

4. A product integrated circuit, as defined in claim 1, wherein at least two of said means for performing a logical AND function support at least three inputs.

5. A product integrated circuit, as defined in claim 1, wherein at least two of said means for performing a logical NAND function support at least three inputs.

6. A product integrated circuit, as defined in claim 1, wherein at least two of said means for performing a logical NOR function support at least three inputs.

7. A product integrated circuit, comprising at least twenty-five distinct cells selected from the set consisting of:

an AN2D1 cell; an AN2D2 cell; an AN2D3 cell; an AN2D4 cell; an AN2D8 cell; an AN2D10 cell; an AN2XD2 cell; an AN3D1 cell; an AN3D2 cell; an AN3D4 cell; an AN3D8 cell; an AN3XD2 cell; an AN4D1 cell; an AN4D2 cell; an AN4D4 cell; an AN4D8 cell; an AN4XD2 cell; an AO21D1 cell; an AO21D2 cell; an AO21D4 cell; an AO22D1 cell; an AO22D2 cell; an AO22D4 cell; an AO31D1 cell; an AO31D2 cell; an AO31D4 cell; an AO211D1 cell; an AO211D2 cell; an AO211D4 cell; an AO222D1 cell; an AO222D2 cell; an AO222D4 cell; an AOAI211D1 cell; an AOAI211D2 cell; an AOAI211D3 cell; an AOAI211D4 cell; an AOAI211D6 cell; an AOI21D1 cell; an AOI21D2 cell; an AOI21D3 cell; an AOI21D4 cell; an AOI21D6 cell; an AOI21XD2 cell; an AOI21XD4 cell; an AOI22D1 cell; an AOI22D2 cell; an AOI22D3 cell; an AOI22D4 cell; an AOI22D6 cell; an AOI22XD1 cell; an AOI22XD2 cell; an AOI22XD4 cell; an AOI31D1 cell; an AOI31D2 cell; an AOI31D3 cell; an AOI31D4 cell; an AOI31D6 cell; an AOI32D1 cell; an AOI32D2 cell; an AOI32D3 cell; an AOI32D4 cell; an AOI32D6 cell; an AOI211D1 cell; an AOI211D2 cell; an AOI211D3 cell; an AOI211D4 cell; an AOI211D6 cell; an AOI211XD1 cell; an AOI211XD2 cell; an AOI211XD4 cell; an AOI221D1 cell; an AOI221D2 cell; an AOI221D3 cell; an AOI221D4 cell; an AOI221D6 cell; an AOI222D1 cell; an AOI222D2 cell; an AOI222D3 cell; an AOI222D4 cell; an AOI222D6 cell; an AOI222XD1 cell; an AOI222XD2 cell; an AOI222XD4 cell; a BUFFD1 cell; a BUFFD2 cell; a BUFFD3 cell; a BUFFD4 cell; a BUFFD5 cell; a BUFFD6 cell; a BUFFD7 cell; a BUFFD8 cell; a BUFFD9 cell; a BUFFD10 cell; a BUFFD12 cell; a BUFFD14 cell; a BUFFD16 cell; a BUFFD20 cell; a BUFFD24 cell; a BUFFXD3 cell; a BUFFXD6 cell; a BUFFXD9 cell; a BUFFXXD2 cell; a BUFFXXD4 cell; a BUFFXXD6 cell; a CKAN2D0P5 cell; a CKAN2D1 cell; a CKAN2D1P5 cell; a CKAN2D2 cell; a CKAN2D2P5 cell; a CKAN2D3 cell; a CKAN2D3P5 cell; a CKAN2D4 cell; a CKAN2D4P5 cell; a CKAN2D5 cell; a CKAN2D5P5 cell; a CKAN2D6 cell; a CKAN2D7 cell; a CKAN2D8 cell; a CKAN2D9 cell; a CKAN2D10 cell; a CKBD0P5 cell; a CKBD1 cell; a CKBD1P5 cell; a CKBD2 cell; a CKBD2P5 cell; a CKBD3 cell; a CKBD3P5 cell; a CKBD4 cell; a CKBD4P5 cell; a CKBD5 cell; a CKBD5P5 cell; a CKBD6 cell; a CKBD7 cell; a CKBD8 cell; a CKBD9 cell; a CKBD10 cell; a CKBD11 cell; a CKBD12 cell; a CKBD14 cell; a CKBD16 cell; a CKBD20 cell; a CKBD24 cell; a CKBD32 cell; a CKLNQD1 cell; a CKLNQD2 cell; a CKLNQD4 cell; a CKLNQD6 cell; a CKLNQD8 cell; a CKLNQD12 cell; a CKLNQD16 cell; a CKMUX2D1 cell; a CKMUX2D2 cell; a CKMUX2D4 cell; a CKND0P5 cell; a CKND1 cell; a CKND1P5 cell; a CKND2 cell; a CKND2D0P5 cell; a CKND2D1 cell; a CKND2D1P5 cell; a CKND2D2 cell; a CKND2D2P5 cell; a CKND2D3 cell; a CKND2D3P5 cell; a CKND2D4 cell; a CKND2D4P5 cell; a CKND2D5 cell; a CKND2D5P5 cell; a CKND2D6 cell; a CKND2D7 cell; a CKND2D8 cell; a CKND2D9 cell; a CKND2D10 cell; a CKND2P5 cell; a CKND3 cell; a CKND3P5 cell; a CKND4 cell; a CKND4P5 cell; a CKND5 cell; a CKND5P5 cell; a CKND6 cell; a CKND7 cell; a CKND8 cell; a CKND9 cell; a CKND10 cell; a CKND11 cell; a CKND12 cell; a CKND14 cell; a CKND16 cell; a CKND20 cell; a CKND24 cell; a CKNR2D1 cell; a CKNR2D2 cell; a CKNR2D3 cell; a CKNR2D4 cell; a CKNR2D6 cell; a CKNR2D8 cell; a CKNR2D10 cell; a CKOR2D1 cell; a CKOR2D2 cell; a CKOR2D3 cell; a CKOR2D4 cell; a CKOR2D6 cell; a CKOR2D8 cell; a CKOR2D10 cell; a DEL010D1 cell; a DEL020D1 cell; a DEL030D1 cell; a DEL040D1 cell; a DEL060D1 cell; a DEL100D1 cell; a DEL200D1 cell; a DFCSND1 cell; a DFCSND2 cell; a DFCSND4 cell; a DFD1 cell; a DFD2 cell; a DFD4 cell; a DFNCSND1 cell; a DFNCSND2 cell; a DFNCSND4 cell; a DFQD1 cell; a DFQD2 cell; a DFQD4 cell; an EDFCND1 cell; a FA1D1 cell; a FA1D2 cell; a FA1HDD1 cell; a FA1HSD1 cell; a FICOND1 cell; FILL1 cell; a HA1D1 cell; a HA1D2 cell; an IAO21D1 cell; an IAO21D2 cell; an IAO21D4 cell; an IAO21D6 cell; an IAO22D1 cell; an IAO22D2 cell; an IAO22D4 cell; an IAO22D6; an IAOI21D1 cell; an IAOI21D2 cell; an IAOI21D4 cell; an IAOI21D6 cell; an IAOI211D1 cell; an IAOI211D2 cell; an IAOI211D4 cell; an IAOI211D6 cell; an IIAOI21D1 cell; an IIAOI21D2 cell; an IIAOI21D4 cell; an IIAOI21D6 cell; an IIND3D1 cell; an IIND3D2 cell; an IIND3D4 cell; an IIND3D6 cell; an IIND4D1 cell; an IIND4D2 cell; an IIND4D4 cell; an IIND4D6 cell; an IIOAI21D1 cell; an IIOAI21D2 cell; an IIOAI21D4 cell; an IIOAI21D6 cell; an IIOAI22D1 cell; an IIOAI22D2 cell; an IIOAI22D4 cell; an IIOAI22D6 cell; an IND2D1 cell; an IND2D2 cell; an IND2D4 cell; an IND2D6 cell; an IND2XD1 cell; an IND2XD2 cell; an IND2XD4 cell; an IND3D1 cell; an IND3D2 cell; an IND3D4 cell; an IND3D6 cell; an IND4D1 cell; an IND4D2 cell; an IND4D4 cell; an IND4D6 cell; an INR2D1 cell; an INR2D2 cell; an INR2D4 cell; an INR2D6 cell; an INR2XD1 cell; an INR2XD2 cell; an INR2XD4 cell; an INR3D1 cell; an INR3D2 cell; an INR3D4 cell; an INR3D6 cell; an INR4D1 cell; an INR4D2 cell; an INR4D4 cell; an INR4D6 cell; an INVD1 cell; an INVD2 cell; an INVD3 cell; an INVD4 cell; an INVD5 cell; an INVD6 cell; an INVD7 cell; an INVD8 cell; an INVD10 cell; an INVD12 cell; an INVD14 cell; an INVD16 cell; an IOA21D1 cell; an IOA21D2 cell; an IOA21D4 cell; an IOA21D6 cell; an IOA22D1 cell; an IOA22D2 cell; an IOA22D4 cell; an IOA22D6 cell; an IOAI21D1 cell; an IOAI21D2 cell; an IOAI21D4 cell; an IOAI21D6 cell; an IOAI211D1 cell; an IOAI211D2 cell; an IOAI211D4 cell; an IOAI211D6 cell; an LHD1 cell; an LHD2 cell; an LND1 cell; an LND2 cell; an MAOI22D1 cell; an MAOI22D2 cell; MAOI22D4 cell; MAOI22D6 cell; an MAOI222D1 cell; an MAOI222D2 cell; an MAOI222D3 cell; an MAOI222D4 cell; an MAOI222D6 cell; an MOAI22D1 cell; an MOAI22D2 cell; an MOAI22D4 cell; an MOAI22D6 cell; a MUX2D1 cell; a MUX2D2 cell; a MUX2D4 cell; a MUX2HDD1 cell; a MUX2HDD2 cell; a MUX2ND1 cell; a MUX2ND2 cell; a MUX2ND4 cell; a MUX2NHDD1 cell; a MUX2NHDD2 cell; a MUX3D1 cell; a MUX3D2 cell; a MUX3D4 cell; a MUX4D1 cell; a MUX4D2 cell; a MUX4D4 cell; a MUX4ND1 cell; a MUX4ND2 cell; a MUX4ND4 cell; an ND2D1 cell; an ND2D2 cell; an ND2D3 cell; an ND2D4 cell; an ND2D8 cell; an ND3D1 cell; an ND3D2 cell; an ND3D3 cell; an ND3D4 cell; an ND3D8 cell; an ND4D1 cell; an ND4D2 cell; an ND4D3 cell; an ND4D4 cell; an ND4D8 cell; an NR2D1 cell; an NR2D2 cell; an NR2D3 cell; an NR2D4 cell; an NR2D8 cell; an NR3D1 cell; an NR3D2 cell; an NR3D3 cell; an NR3D4 cell; an NR3D8 cell; an NR4D1 cell; an NR4D2 cell; an NR4D3 cell; an NR4D4 cell; an NR4D8 cell; an OA21D1 cell; an OA21D2 cell; an OA21D4 cell; an OA22D1 cell; an OA22D2 cell; an OA22D4 cell; an OA211D1 cell; an OA211 D2 cell; an OA211 D4 cell; an OAI21D1 cell; an OAI21D2 cell; an OAI21D3 cell; an OAI21D4 cell; an OAI21D6 cell; an OAI21XD1 cell; an OAI21XD2 cell; an OAI21XD4 cell; an OAI22D1 cell; an OAI22D2 cell; an OAI22D3 cell; an OAI22D4 cell; an OAI22D6 cell; an OAI31D1 cell; an OAI31D2 cell; an OAI31D3 cell; an OAI31D4 cell; an OAI31D6 cell; an OAI32D1 cell; an OAI32D2 cell; an OAI32D3 cell; an OAI32D4 cell; an OAI32D6 cell; an OAI211D1 cell; an OAI211D2 cell; an OAI211D3 cell; an OAI211D4 cell; an OAI211D6 cell; an OAI221D1 cell; an OAI221D2 cell; an OAI221D3 cell; an OAI221D4 cell; an OAI221D6 cell; an OAI222D1 cell; an OAI222D2 cell; an OAI222D3 cell; an OAI222D4 cell; an OAI222D6 cell; an OAOI211D1 cell; an OAOI211D2 cell; an OAOI211D3 cell; an OAOI211D4 cell; an OAOI211D6 cell; an OR2D1 cell; an OR2D2 cell; an OR2D3 cell; an OR2D4 cell; an OR2D8 cell; an OR2D10 cell; an OR2XD2 cell; an OR3D1 cell; an OR3D2 cell; an OR3D4 cell; an OR3D8 cell; an OR3XD2 cell; an OR4D1 cell; an OR4D2 cell; an OR4D4 cell; an OR4D8 cell; an OR4XD2 cell; a SDFCSND1 cell; a SDFCSND2 cell; a SDFCSND4 cell; a SDFD1 cell; a SDFD2 cell; a SDFD4 cell; a SDFQD1 cell; a SDFQD2 cell; a SDFQD4 cell; a SEDFCND1 cell; a SEDFCND2 cell; a SEDFQD1 cell; a SEDFQD2 cell; a SEDFQD4 cell; an XNR2D1 cell; an XNR2D2 cell; an XNR2D4 cell; an XNR2HDD1 cell; an XNR2HDD2 cell; an XNR3D1 cell; an XNR3D2 cell; an XOR2D1 cell; an XOR2D2 cell; an XOR2D4 cell; an XOR2HDD1 cell; an XOR2HDD2 cell; an XOR3D1 cell; and, an XOR3D2 cell.

8. A product integrated circuit, as defined in claim 7, wherein said product IC comprises:

at least fifteen distinct cells selected from the set consisting of: an AN2D1 cell; an AN2D2 cell; an AN2D3 cell; an AN2D4 cell; an AN2D8 cell; an AN2D10 cell; an AN2XD2 cell; an AN3D1 cell; an AN3D2 cell; an AN3D4 cell; an AN3D8 cell; an AN3XD2 cell; an AN4D1 cell; an AN4D2 cell; an AN4D4 cell; an AN4D8 cell; an AN4XD2 cell; an ND2D1 cell; an ND2D2 cell; an ND2D3 cell; an ND2D4 cell; an ND2D8 cell; an ND3D1 cell; an ND3D2 cell; an ND3D3 cell; an ND3D4 cell; an ND3D8 cell; an ND4D1 cell; an ND4D2 cell; an ND4D3 cell; an ND4D4 cell; an ND4D8 cell; an NR2D1 cell; an NR2D2 cell; an NR2D3 cell; an NR2D4 cell; an NR2D8 cell; an NR3D1 cell; an NR3D2 cell; an NR3D3 cell; an NR3D4 cell; an NR3D8 cell; an NR4D1 cell; an NR4D2 cell; an NR4D3 cell; an NR4D4 cell; an NR4D8 cell; an OR2D1 cell; an OR2D2 cell; an OR2D3 cell; an OR2D4 cell; an OR2D8 cell; an OR2D10 cell; an OR2XD2 cell; an OR3D1 cell; an OR3D2 cell; an OR3D4 cell; an OR3D8 cell; an OR3XD2 cell; an OR4D1 cell; an OR4D2 cell; an OR4D4 cell; an OR4D8 cell; an OR4XD2 cell; an XNR2D1 cell; an XNR2D2 cell; an XNR2D4 cell; an XNR2HDD1 cell; an XNR2HDD2 cell; an XNR3D1 cell; an XNR3D2 cell; an XOR2D1 cell; an XOR2D2 cell; an XOR2D4 cell; an XOR2HDD1 cell; an XOR2HDD2 cell; an XOR3D1 cell; and, an XOR3D2 cell;

at least eight distinct cells selected from the set consisting of: an AO21D1 cell; an AO21D2 cell; an AO21D4 cell; an AO22D1 cell; an AO22D2 cell; an AO22D4 cell; an AO31D1 cell; an AO31D2 cell; an AO31D4 cell; an AO211D1 cell; an AO211D2 cell; an AO211D4 cell; an AO222D1 cell; an AO222D2 cell; an AO222D4 cell; an AOAI211D1 cell; an AOAI211D2 cell; an AOAI211D3 cell; an AOAI211D4 cell; an AOAI211D6 cell; an AOI21D1 cell; an AOI21D2 cell; an AOI21D3 cell; an AOI21D4 cell; an AOI21D6 cell; an AOI21XD2 cell; an AOI21XD4 cell; an AOI22D1 cell; an AOI22D2 cell; an AOI22D3 cell; an AOI22D4 cell; an AOI22D6 cell; an AOI22XD1 cell; an AOI22XD2 cell; an AOI22XD4 cell; an AOI31D1 cell; an AOI31D2 cell; an AOI31D3 cell; an AOI31D4 cell; an AOI31D6 cell; an AOI32D1 cell; an AOI32D2 cell; an AOI32D3 cell; an AOI32D4 cell; an AOI32D6 cell; an AOI211D1 cell; an AOI211D2 cell; an AOI211D3 cell; an AOI211D4 cell; an AOI211D6 cell; an AOI211XD1 cell; an AOI211XD2 cell; an AOI211XD4 cell; an AOI221D1 cell; an AOI221D2 cell; an AOI221D3 cell; an AOI221D4 cell; an AOI221D6 cell; an AOI222D1 cell; an AOI222D2 cell; an AOI222D3 cell; an AOI222D4 cell; an AOI222D6 cell; an AOI222XD1 cell; an AOI222XD2 cell; an AOI222XD4 cell; a FA1D1 cell; a FA1D2 cell; a FA1HDD1 cell; a FA1HSD1 cell; a FICOND1 cell; FILL1 cell; a HA1D1 cell; a HA1D2 cell; an IAO21D1 cell; an IAO21D2 cell; an IAO21D4 cell; an IAO21D6 cell; an IAO22D1 cell; an IAO22D2 cell; an IAO22D4 cell; an IAO22D6; an IAOI21D1 cell; an IAOI21D2 cell; an IAOI21D4 cell; an IAOI21D6 cell; an IAOI211D1 cell; an IAOI211D2 cell; an IAOI211D4 cell; an IAOI211D6 cell; an IIAOI21D1 cell; an IIAOI21D2 cell; an IIAOI21D4 cell; an IIAOI21D6 cell; an IIND3D1 cell; an IIND3D2 cell; an IIND3D4 cell; an IIND3D6 cell; an IIND4D1 cell; an IIND4D2 cell; an IIND4D4 cell; an IIND4D6 cell; an IIOAI21D1 cell; an IIOAI21D2 cell; an IIOAI21D4 cell; an IIOAI21D6 cell; an IIOAI22D1 cell; an IIOAI22D2 cell; an IIOAI22D4 cell; an IIOAI22D6 cell; an IND2D1 cell; an IND2D2 cell; an IND2D4 cell; an IND2D6 cell; an IND2XD1 cell; an IND2XD2 cell; an IND2XD4 cell; an IND3D1 cell; an IND3D2 cell; an IND3D4 cell; an IND3D6 cell; an IND4D1 cell; an IND4D2 cell; an IND4D4 cell; an IND4D6 cell; an INR2D1 cell; an INR2D2 cell; an INR2D4 cell; an INR2D6 cell; an INR2XD1 cell; an INR2XD2 cell; an INR2XD4 cell; an INR3D1 cell; an INR3D2 cell; an INR3D4 cell; an INR3D6 cell; an INR4D1 cell; an INR4D2 cell; an INR4D4 cell; an INR4D6 cell; an OA21D1 cell; an OA21D2 cell; an OA21D4 cell; an OA22D1 cell; an OA22D2 cell; an OA22D4 cell; an OA211D1 cell; an OA211 D2 cell; an OA211D4 cell; an OAI21D1 cell; an OAI21D2 cell; an OAI21D3 cell; an OAI21D4 cell; an OAI21D6 cell; an OAI21XD1 cell; an OAI21XD2 cell; an OAI21XD4 cell; an OAI22D1 cell; an OAI22D2 cell; an OAI22D3 cell; an OAI22D4 cell; an OAI22D6 cell; an OAI31D1 cell; an OAI31D2 cell; an OAI31D3 cell; an OAI31D4 cell; an OAI31D6 cell; an OAI32D1 cell; an OAI32D2 cell; an OAI32D3 cell; an OAI32D4 cell; an OAI32D6 cell; an OAI211D1 cell; an OAI211D2 cell; an OAI211D3 cell; an OAI211D4 cell; an OAI211D6 cell; an OAI221D1 cell; an OAI221D2 cell; an OAI221D3 cell; an OAI221D4 cell; an OAI221D6 cell; an OAI222D1 cell; an OAI222D2 cell; an OAI222D3 cell; an OAI222D4 cell; an OAI222D6 cell; an OAOI211D1 cell; an OAOI211D2 cell; an OAOI211D3 cell; an OAOI211D4 cell; an OAOI211D6 cell; an IOA21D1 cell; an IOA21D2 cell; an IOA21D4 cell; an IOA21D6 cell; an IOA22D1 cell; an IOA22D2 cell; an IOA22D4 cell; an IOA22D6 cell; an IOAI21D1 cell; an IOAI21D2 cell; an IOAI21D4 cell; an IOAI21D6 cell; an IOAI211D1 cell; an IOAI211D2 cell; an IOAI211D4 cell; an IOAI211D6 cell; an LHD1 cell; an LHD2 cell; an LND1 cell; an LND2 cell; an MAOI22D1 cell; an MAOI22D2 cell; MAOI22D4 cell; MAOI22D6 cell; an MAOI222D1 cell; an MAOI222D2 cell; an MAOI222D3 cell; an MAOI222D4 cell; an MAOI222D6 cell; an MOAI22D1 cell; an MOAI22D2 cell; an MOAI22D4 cell; and, an MOAI22D6 cell;

at least five distinct cells selected from the group consisting of: a BUFFD1 cell; a BUFFD2 cell; a BUFFD3 cell; a BUFFD4 cell; a BUFFD5 cell; a BUFFD6 cell; a BUFFD7 cell; a BUFFD8 cell; a BUFFD9 cell; a BUFFD10 cell; a BUFFD12 cell; a BUFFD14 cell; a BUFFD16 cell; a BUFFD20 cell; a BUFFD24 cell; a BUFFXD3 cell; a BUFFXD6 cell; a BUFFXD9 cell; a BUFFXXD2 cell; a BUFFXXD4 cell; a BUFFXXD6 cell; an INVD1 cell; an INVD2 cell; an INVD3 cell; an INVD4 cell; an INVD5 cell; an INVD6 cell; an INVD7 cell; an INVD8 cell; an INVD10 cell; an INVD12 cell; an INVD14 cell; and, an INVD16 cell;

at least five distinct cells selected from the group consisting of: a CKAN2D0P5 cell; a CKAN2D1 cell; a CKAN2D1P5 cell; a CKAN2D2 cell; a CKAN2D2P5 cell; a CKAN2D3 cell; a CKAN2D3P5 cell; a CKAN2D4 cell; a CKAN2D4P5 cell; a CKAN2D5 cell; a CKAN2D5P5 cell; a CKAN2D6 cell; a CKAN2D7 cell; a CKAN2D8 cell; a CKAN2D9 cell; a CKAN2D10 cell; a CKBD0P5 cell; a CKBD1 cell; a CKBD1P5 cell; a CKBD2 cell; a CKBD2P5 cell; a CKBD3 cell; a CKBD3P5 cell; a CKBD4 cell; a CKBD4P5 cell; a CKBD5 cell; a CKBD5P5 cell; a CKBD6 cell; a CKBD7 cell; a CKBD8 cell; a CKBD9 cell; a CKBD10 cell; a CKBD11 cell; a CKBD12 cell; a CKBD14 cell; a CKBD16 cell; a CKBD20 cell; a CKBD24 cell; a CKBD32 cell; a CKLNQD1 cell; a CKLNQD2 cell; a CKLNQD4 cell; a CKLNQD6 cell; a CKLNQD8 cell; a CKLNQD12 cell; a CKLNQD16 cell; a CKMUX2D1 cell; a CKMUX2D2 cell; a CKMUX2D4 cell; a CKND0P5 cell; a CKND1 cell; a CKND1P5 cell; a CKND2 cell; a CKND2D0P5 cell; a CKND2D1 cell; a CKND2D1P5 cell; a CKND2D2 cell; a CKND2D2P5 cell; a CKND2D3 cell; a CKND2D3P5 cell; a CKND2D4 cell; a CKND2D4P5 cell; a CKND2D5 cell; a CKND2D5P5 cell; a CKND2D6 cell; a CKND2D7 cell; a CKND2D8 cell; a CKND2D9 cell; a CKND2D10 cell; a CKND2P5 cell; a CKND3 cell; a CKND3P5 cell; a CKND4 cell; a CKND4P5 cell; a CKND5 cell; a CKND5P5 cell; a CKND6 cell; a CKND7 cell; a CKND8 cell; a CKND9 cell; a CKND10 cell; a CKND11 cell; a CKND12 cell; a CKND14 cell; a CKND16 cell; a CKND20 cell; a CKND24 cell; a CKNR2D1 cell; a CKNR2D2 cell; a CKNR2D3 cell; a CKNR2D4 cell; a CKNR2D6 cell; a CKNR2D8 cell; a CKNR2D10 cell; a CKOR2D1 cell; a CKOR2D2 cell; a CKOR2D3 cell; a CKOR2D4 cell; a CKOR2D6 cell; a CKOR2D8 cell; and, a CKOR2D10 cell;

at least three distinct cells selected from the set consisting of: a DEL010D1 cell; a DEL020D1 cell; a DEL030D1 cell; a DEL040D1 cell; a DEL060D1 cell; a DEL100D1 cell; a DEL200D1 cell; a DFCSND1 cell; a DFCSND2 cell; a DFCSND4 cell; a DFD1 cell; a DFD2 cell; a DFD4 cell; a DFNCSND1 cell; a DFNCSND2 cell; a DFNCSND4 cell; a DFQD1 cell; a DFQD2 cell; a DFQD4 cell; an EDFCND1 cell; a SDFCSND1 cell; a SDFCSND2 cell; a SDFCSND4 cell; a SDFD1 cell; a SDFD2 cell; a SDFD4 cell; a SDFQD1 cell; a SDFQD2 cell; a SDFQD4 cell; a SEDFCND1 cell; a SEDFCND2 cell; a SEDFQD1 cell; a SEDFQD2 cell; and, a SEDFQD4 cell; and, at least one cell selected from the set consisting of: a MUX2D1 cell; a MUX2D2 cell; a MUX2D4 cell; a MUX2HDD1 cell; a MUX2HDD2 cell; a MUX2ND1 cell; a MUX2ND2 cell; a MUX2ND4 cell; a MUX2NHDD1 cell; a MUX2NHDD2 cell; a MUX3D1 cell; a MUX3D2 cell; a MUX3D4 cell; a MUX4D1 cell; a MUX4D2 cell; a MUX4D4 cell; a MUX4ND1 cell; a MUX4ND2 cell; and, a MUX4ND4 cell.

9. An electronic system that includes at least two integrated circuits of the type defined in claim 7.

10. A hand-held electronic system that includes:

at least one integrated circuit of the type defined in claim 8; and, a rechargeable power source.

11. A product integrated circuit, said product IC comprising at least thirty distinct means selected from the set consisting of:

an AN2D1 means; an AN2D2 means; an AN2D3 means; an AN2D4 means; an AN2D8 means; an AN2D10 means; an AN2XD2 means; an AN3D1 means; an AN3D2 means; an AN3D4 means; an AN3D8 means; an AN3XD2 means; an AN4D1 means; an AN4D2 means; an AN4D4 means; an AN4D8 means; an AN4XD2 means; an AO21D1 means; an AO21D2 means; an AO21D4 means; an AO22D1 means; an AO22D2 means; an AO22D4 means; an AO31D1 means; an AO31D2 means; an AO31D4 means; an AO211D1 means; an AO211D2 means; an AO211D4 means; an AO222D1 means; an AO222D2 means; an AO222D4 means; an AOAI211D1 means; an AOAI211D2 means; an AOAI211D3 means; an AOAI211D4 means; an AOAI211D6 means; an AOI21D1 means; an AOI21D2 means; an AOI21D3 means; an AOI21D4 means; an AOI21D6 means; an AOI21XD2 means; an AOI21XD4 means; an AOI22D1 means; an AOI22D2 means; an AOI22D3 means; an AOI22D4 means; an AOI22D6 means; an AOI22XD1 means; an AO122XD2 means; an AO122XD4 means; an AOI31D1 means; an AOI31D2 means; an AOI31D3 means; an AOI31D4 means; an AOI31D6 means; an AOI32D1 means; an AOI32D2 means; an AOI32D3 means; an AOI32D4 means; an AOI32D6 means; an AOI211D1 means; an AOI211D2 means; an AOI211D3 means; an AOI211D4 means; an AOAI211D6 means; an AOI211XD1 means; an AOI211XD2 means; an AOI211XD4 means; an AOI221D1 means; an AOI221D2 means; an AOI221D3 means; an AOI221D4 means; an AOI221D6 means; an AOI222D1 means; an AOI222D2 means; an AOI222D3 means; an AOI222D4 means; an AOI222D6 means; an AOI222XD1 means; an AOI222XD2 means; an AOI222XD4 means; a BUFFD1 means; a BUFFD2 means; a BUFFD3 means; a BUFFD4 means; a BUFFD5 means; a BUFFD6 means; a BUFFD7 means; a BUFFD8 means; a BUFFD9 means; a BUFFD10 means; a BUFFD12 means; a BUFFD14 means; a BUFFD16 means; a BUFFD20 means; a BUFFD24 means; a BUFFXD3 means; a BUFFXD6 means; a BUFFXD9 means; a BUFFXXD2 means; a BUFFXXD4 means; a BUFFXXD6 means; a CKAN2D0P5 means; a CKAN2D1 means; a CKAN2D1P5 means; a CKAN2D2 means; a CKAN2D2P5 means; a CKAN2D3 means; a CKAN2D3P5 means; a CKAN2D4 means; a CKAN2D4P5 means; a CKAN2D5 means; a CKAN2D5P5 means; a CKAN2D6 means; a CKAN2D7 means; a CKAN2D8 means; a CKAN2D9 means; a CKAN2D10 means; a CKBD0P5 means; a CKBD1 means; a CKBD1P5 means; a CKBD2 means; a CKBD2P5 means; a CKBD3 means; a CKBD3P5 means; a CKBD4 means; a CKBD4P5 means; a CKBD5 means; a CKBD5P5 means; a CKBD6 means; a CKBD7 means; a CKBD8 means; a CKBD9 means; a CKBD10 means; a CKBD11 means; a CKBD12 means; a CKBD14 means; a CKBD16 means; a CKBD20 means; a CKBD24 means; a CKBD32 means; a CKLNQD1 means; a CKLNQD2 means; a CKLNQD4 means; a CKLNQD6 means; a CKLNQD8 means; a CKLNQD12 means; a CKLNQD16 means; a CKMUX2D1 means; a CKMUX2D2 means; a CKMUX2D4 means; a CKND0P5 means; a CKND1 means; a CKND1P5 means; a CKND2 means; a CKND2D0P5 means; a CKND2D1 means; a CKND2D1P5 means; a CKND2D2 means; a CKND2D2P5 means; a CKND2D3 means; a CKND2D3P5 means; a CKND2D4 means; a CKND2D4P5 means; a CKND2D5 means; a CKND2D5P5 means; a CKND2D6 means; a CKND2D7 means; a CKND2D8 means; a CKND2D9 means; a CKND2D10 means; a CKND2P5 means; a CKND3 means; a CKND3P5 means; a CKND4 means; a CKND4P5 means; a CKND5 means; a CKND5P5 means; a CKND6 means; a CKND7 means; a CKND8 means; a CKND9 means; a CKND10 means; a CKND11 means; a CKND12 means; a CKND14 means; a CKND16 means; a CKND20 means; a CKND24 means; a CKNR2D1 means; a CKNR2D2 means; a CKNR2D3 means; a CKNR2D4 means; a CKNR2D6 means; a CKNR2D8 means; a CKNR2D10 means; a CKOR2D1 means; a CKOR2D2 means; a CKOR2D3 means; a CKOR2D4 means; a CKOR2D6 means; a CKOR2D8 means; a CKOR2D10 means; a DEL010D1 means; a DEL020D1 means; a DEL030D1 means; a DEL040D1 means; a DEL060D1 means; a DEL100D1 means; a DEL200D1 means; a DFCSND1 means; a DFCSND2 means; a DFCSND4 means; a DFD1 means; a DFD2 means; a DFD4 means; a DFNCSND1 means; a DFNCSND2 means; a DFNC- SND4 means; a DFQD1 means; a DFQD2 means; a DFQD4 means; an EDFCND1 means; a FA1D1 means; a FA1D2 means; a FA1HDD1 means; a FA1HSD1 means; a FICOND1 means; FILL1 means; a HA1D1 means; a HA1D2 means; an IAO21D1 means; an IAO21D2 means; an IAO21D4 means; an IAO21D6 means; an IAO22D1 means; an IAO22D2 means; an IAO22D4 means; an IAO22D6; an IAOI21D1 means; an IAOI21D2 means; an IAOI21D4 means; an IAOI21D6 means; an IAOI211D1 means; an IAOI211D2 means; an IAOI211D4 means; an IAOI211D6 means; an IIAOI21D1 means; an IIAOI21D2 means; an IIAOI21D4 means; an IIAOI21D6 means; an IIND3D1 means; an IIND3D2 means; an IIND3D4 means; an IIND3D6 means; an IIND4D1 means; an IIND4D2 means; an IIND4D4 means; an IIND4D6 means; an IIOAI21D1 means; an IIOAI21D2 means; an IIOAI21D4 means; an IIOAI21D6 means; an IIOAI22D1 means; an IIOAI22D2 means; an IIOAI22D4 means; an IIOAI22D6 means; an IND2D1 means; an IND2D2 means; an IND2D4 means; an IND2D6 means; an IND2XD1 means; an IND2XD2 means; an IND2XD4 means; an IND3D1 means; an IND3D2 means; an IND3D4 means; an IND3D6 means; an IND4D1 means; an IND4D2 means; an IND4D4 means; an IND4D6 means; an INR2D1 means; an INR2D2 means; an INR2D4 means; an INR2D6 means; an INR2XD1 means; an INR2XD2 means; an INR2XD4 means; an INR3D1 means; an INR3D2 means; an INR3D4 means; an INR3D6 means; an INR4D1 means; an INR4D2 means; an INR4D4 means; an INR4D6 means; an INVD1 means; an INVD2 means; an INVD3 means; an INVD4 means; an INVD5 means; an INVD6 means; an INVD7 means; an INVD8 means; an INVD10 means; an INVD12 means; an INVD14 means; an INVD16 means; an IOA21D1 means; an IOA21D2 means; an IOA21D4 means; an IOA21D6 means; an IOA22D1 means; an IOA22D2 means; an IOA22D4 means; an IOA22D6 means; an IOAI21D1 means; an IOAI21D2 means; an IOAI21D4 means; an IOAI21D6 means; an IOAI211D1 means; an IOAI211D2 means; an IOAI211D4 means; an IOAI211D6 means; an LHD1 means; an LHD2 means; an LND1 means; an LND2 means; an MAOI22D1 means; an MAOI22D2 means; MAOI22D4 means; MAOI22D6 means; an MAOI222D1 means; an MAOI222D2 means; an MAOI222D3 means; an MAOI222D4 means; an MAOI222D6 means; an MOAI22D1 means; an MOAI22D2 means; an MOAI22D4 means; an MOAI22D6 means; a MUX2D1 means; a MUX2D2 means; a MUX2D4 means; a MUX2HDD1 means; a MUX2HDD2 means; a MUX2ND1 means; a MUX2ND2 means; a MUX2ND4 means; a MUX2NHDD1 means; a MUX2NHDD2 means; a MUX3D1 means; a MUX3D2 means; a MUX3D4 means; a MUX4D1 means; a MUX4D2 means; a MUX4D4 means; a MUX4ND1 means; a MUX4ND2 means; a MUX4ND4 means; an ND2D1 means; an ND2D2 means; an ND2D3 means; an ND2D4 means; an ND2D8 means; an ND3D1 means; an ND3D2 means; an ND3D3 means; an ND3D4 means; an ND3D8 means; an ND4D1 means; an ND4D2 means; an ND4D3 means; an ND4D4 means; an ND4D8 means; an NR2D1 means; an NR2D2 means; an NR2D3 means; an NR2D4 means; an NR2D8 means; an NR3D1 means; an NR3D2 means; an NR3D3 means; an NR3D4 means; an NR3D8 means; an NR4D1 means; an NR4D2 means; an NR4D3 means; an NR4D4 means; an NR4D8 means; an OA21D1 means; an OA21D2 means; an OA21D4 means; an OA22D1 means; an OA22D2 means; an OA22D4 means; an OA211D1 means; an OA211D2 means; an OA211D4 means; an OAI21D1 means; an OAI21D2 means; an OAI21D3 means; an OAI21D4 means; an OAI21D6 means; an OAI21XD1 means; an OAI21XD2 means; an OAI21XD4 means; an OAI22D1 means; an OAI22D2 means; an OAI22D3 means; an OAI22D4 means; an OAI22D6 means; an OAI31D1 means; an OA131D2 means; an OA131D3 means; an OA131D4 means; an OA131D6 means; an OA132D1 means; an OA132D2 means; an OA132D3 means; an OA132D4 means; an OA132D6 means; an OAI211D1 means; an OAI211D2 means; an OAI211D3 means; an OAI211D4 means; an OAI211D6 means; an OAI221D1 means; an OAI221D2 means; an OAI221D3 means; an OAI221D4 means; an OAI221D6 means; an OAI222D1 means; an OAI222D2 means; an OAI222D3 means; an OAI222D4 means; an OAI222D6 means; an OAOI211D1 means; an OAOAI211D2 means; an OAOAI211D3 means; an OAOAI211D4 means; an OAOAI211D6 means; an OR2D1 means; an OR2D2 means; an OR2D3 means; an OR2D4 means; an OR2D8 means; an OR2D10 means; an OR2XD2 means; an OR3D1 means; an OR3D2 means; an OR3D4 means; an OR3D8 means; an OR3XD2 means; an OR4D1 means; an OR4D2 means; an OR4D4 means; an OR4D8 means; an OR4XD2 means; a SDFCSND1 means; a SDFCSND2 means; a SDFC-SND4 means; a SDFD1 means; a SDFD2 means; a SDFD4 means; a SDFQD1 means; a SDFQD2 means; a SDFQD4 means; a SEDFCND1 means; a SED-FCND2 means; a SEDFQD1 means; a SEDFQD2 means; a SEDFQD4 means; an XNR2D1 means; an XNR2D2 means; an XNR2D4 means; an XNR2HDD1 means; an XNR2HDD2 means; an XNR3D1 means; an XNR3D2 means; an XOR2D1 means; an XOR2D2 means; an XOR2D4 means; an XOR2HDD1 means; an XOR2HDD2 means; an XOR3D1 means; and, an XOR3D2 means.

12. A product integrated circuit as defined in claim 11, said product IC comprising at least sixty distinct means selected from the set consisting of:

an AN2D1 means; an AN2D2 means; an AN2D3 means; an AN2D4 means; an AN2D8 means; an AN2D10 means; an AN2XD2 means; an AN3D1 means; an AN3D2 means; an AN3D4 means; an AN3D8 means; an AN3XD2 means; an AN4D1 means; an AN4D2 means; an AN4D4 means; an AN4D8 means; an AN4XD2 means; an AO21D1 means; an AO21D2 means; an AO21D4 means; an AO22D1 means; an AO22D2 means; an AO22D4 means; an AO31D1 means; an AO31D2 means; an AO31D4 means; an AO211D1 means; an AO211D2 means; an AO211D4 means; an AO222D1 means; an AO222D2 means; an AO222D4 means; an AOAI211D1 means; an AOAI211D2 means; an AOAI211D3 means; an AOAI211D4 means; an AOAI211D6 means; an AOI21D1 means; an AOI21D2 means; an AOI21D3 means; an AOI21D4 means; an AOI21D6 means; an AOI21XD2 means; an AOI21XD4 means; an AOI22D1 means; an AOI22D2 means; an AOI22D3 means; an AOI22D4 means; an AOI22D6 means; an AOI22XD1 means; an AO122XD2 means; an AO122XD4 means; an AOI31D1 means; an AOI31D2 means; an AOI31D3 means; an AOI31D4 means; an AOI31D6 means; an AOI32D1 means; an AOI32D2 means; an AOI32D3 means; an AOI32D4 means; an AOI32D6 means; an AOI211D1 means; an AOI211D2 means; an AOI211D3 means; an AOI211D4 means; an AOAI211D6 means; an AOI211XD1 means; an AOI211XD2 means; an AOI211XD4 means; an AOI221D1 means; an AOI221 D2 means; an AOI221 D3 means; an AOI221 D4 means; an AOI221 D6 means; an AOI222D1 means; an AOI222D2 means; an AOI222D3 means; an AOI222D4 means; an AOI222D6 means; an AOI222XD1 means; an AOI222XD2 means; an AOI222XD4 means; a BUFFD1 means; a BUFFD2 means; a BUFFD3 means; a BUFFD4 means; a BUFFD5 means; a BUFFD6 means; a BUFFD7 means; a BUFFD8 means; a BUFFD9 means; a BUFFD10 means; a BUFFD12 means; a BUFFD14 means; a BUFFD16 means; a BUFFD20 means; a BUFFD24 means; a BUFFXD3 means; a BUFFXD6 means; a BUFFXD9 means; a BUFFXXD2 means; a BUFFXXD4 means; a BUFFXXD6 means; a CKAN2D0P5 means; a CKAN2D1 means; a CKAN2D1P5 means; a CKAN2D2 means; a CKAN2D2P5 means; a CKAN2D3 means; a CKAN2D3P5 means; a CKAN2D4 means; a CKAN2D4P5 means; a CKAN2D5 means; a CKAN2D5P5 means; a CKAN2D6 means; a CKAN2D7 means; a CKAN2D8 means; a CKAN2D9 means; a CKAN2D10 means; a CKBD0P5 means; a CKBD1 means; a CKBD1P5 means; a CKBD2 means; a CKBD2P5 means; a CKBD3 means; a CKBD3P5 means; a CKBD4 means; a CKBD4P5 means; a CKBD5 means; a CKBD5P5 means; a CKBD6 means; a CKBD7 means; a CKBD8 means; a CKBD9 means; a CKBD10 means; a CKBD11 means; a CKBD12 means; a CKBD14 means; a CKBD16 means; a CKBD20 means; a CKBD24 means; a CKBD32 means; a CKLNQD1 means; a CKLNQD2 means; a CKLNQD4 means; a CKLNQD6 means; a CKLNQD8 means; a CKLNQD12 means; a CKLNQD16 means; a CKMUX2D1 means; a CKMUX2D2 means; a CKMUX2D4 means; a CKND0P5 means; a CKND1 means; a CKND1P5 means; a CKND2 means; a CKND2D0P5 means; a CKND2D1 means; a CKND2D1P5 means; a CKND2D2 means; a CKND2D2P5 means; a CKND2D3 means; a CKND2D3P5 means; a CKND2D4 means; a CKND2D4P5 means; a CKND2D5 means; a CKND2D5P5 means; a CKND2D6 means; a CKND2D7 means; a CKND2D8 means; a CKND2D9 means; a CKND2D10 means; a CKND2P5 means; a CKND3 means; a CKND3P5 means; a CKND4 means; a CKND4P5 means; a CKND5 means; a CKND5P5 means; a CKND6 means; a CKND7 means; a CKND8 means; a CKND9 means; a CKND10 means; a CKND11 means; a CKND12 means; a CKND14 means; a CKND16 means; a CKND20 means; a CKND24 means; a CKNR2D1 means; a CKNR2D2 means; a CKNR2D3 means; a CKNR2D4 means; a CKNR2D6 means; a CKNR2D8 means; a CKNR2D10 means; a CKOR2D1 means; a CKOR2D2 means; a CKOR2D3 means; a CKOR2D4 means; a CKOR2D6 means; a CKOR2D8 means; a CKOR2D10 means; a DEL010D1 means; a DEL020D1 means; a DEL030D1 means; a DEL040D1 means; a DEL060D1 means; a DEL100D1 means; a DEL200D1 means; a DFCSND1 means; a DFCSND2 means; a DFCSND4 means; a DFD1 means; a DFD2 means; a DFD4 means; a DFNCSND1 means; a DFNCSND2 means; a DFNCSND4 means; a DFQD1 means; a DFQD2 means; a DFQD4 means; an EDFCND1 means; a FA1D1 means; a FA1D2 means; a FA1HDD1 means; a FA1HSD1 means; a FICOND1 means; FILL1 means; a HA1D1 means; a HA1D2 means; an IAO21D1 means; an IAO21D2 means; an IAO21D4 means; an IAO21D6 means; an IAO22D1 means; an IAO22D2 means; an IAO22D4 means; an IAO22D6; an IAOI21D1 means; an IAOI21D2 means; an IAOI21D4 means; an IAOI21D6 means; an IAOI211D1 means; an IAOI211D2 means; an IAOI211D4 means; an IAOI211D6 means; an IIAOI21D1 means; an IIAOI21D2 means; an IIAOI21D4 means; an IIAOI21D6 means; an IIND3D1 means; an IIND3D2 means; an IIND3D4 means; an IIND3D6 means; an IIND4D1 means; an IIND4D2 means; an IIND4D4 means; an IIND4D6 means; an IIOAI21D1 means; an IIOAI21D2 means; an IIOAI21D4 means; an IIOAI21D6 means; an IIOAI22D1 means; an IIOAI22D2 means; an IIOAI22D4 means; an IIOAI22D6 means; an IND2D1 means; an IND2D2 means; an IND2D4 means; an IND2D6 means; an IND2XD1 means; an IND2XD2 means; an IND2XD4 means; an IND3D1 means; an IND3D2 means; an IND3D4 means; an IND3D6 means; an IND4D1 means; an IND4D2 means; an IND4D4 means; an IND4D6 means; an INR2D1 means; an INR2D2 means; an INR2D4 means; an INR2D6 means; an INR2XD1 means; an INR2XD2 means; an INR2XD4 means; an INR3D1 means; an INR3D2 means; an INR3D4 means; an INR3D6 means; an INR4D1 means; an INR4D2 means; an INR4D4 means; an INR4D6 means; an INVD1 means; an INVD2 means; an INVD3 means; an INVD4 means; an INVD5 means; an INVD6 means; an INVD7 means; an INVD8 means; an INVD10 means; an INVD12 means; an INVD14 means; an INVD16 means; an IOA21D1 means; an IOA21D2 means; an IOA21D4 means; an IOA21D6 means; an IOA22D1 means; an IOA22D2 means; an IOA22D4 means; an IOA22D6 means; an IOAI21D1 means; an IOAI21D2 means; an IOAI21D4 means; an IOAI21D6 means; an IOAI211D1 means; an IOAI211D2 means; an IOAI211D4 means; an IOAI211D6 means; an LHD1 means; an LHD2 means; an LND1 means; an LND2 means; an MAOI22D1 means; an MAOI22D2 means; MAOI22D4 means; MAOI22D6 means; an MAOI222D1 means; an MAOI222D2 means; an MAOI222D3 means; an MAOI222D4 means; an MAOI222D6 means; an MOAI22D1 means; an MOAI22D2 means; an MOAI22D4 means; an MOAI22D6 means; a MUX2D1 means; a MUX2D2 means; a MUX2D4 means; a MUX2HDD1 means; a MUX2HDD2 means; a MUX2ND1 means; a MUX2ND2 means; a MUX2ND4 means; a MUX2NHDD1 means; a MUX2NHDD2 means; a MUX3D1 means; a MUX3D2 means; a MUX3D4 means; a MUX4D1 means; a MUX4D2 means; a MUX4D4 means; a MUX4ND1 means; a MUX4ND2 means; a MUX4ND4 means; an ND2D1 means; an ND2D2 means; an ND2D3 means; an ND2D4 means; an ND2D8 means; an ND3D1 means; an ND3D2 means; an ND3D3 means; an ND3D4 means; an ND3D8 means; an ND4D1 means; an ND4D2 means; an ND4D3 means; an ND4D4 means; an ND4D8 means; an NR2D1 means; an NR2D2 means; an NR2D3 means; an NR2D4 means; an NR2D8 means; an NR3D1 means; an NR3D2 means; an NR3D3 means; an NR3D4 means; an NR3D8 means; an NR4D1 means; an NR4D2 means; an NR4D3 means; an NR4D4 means; an NR4D8 means; an OA21D1 means; an OA21D2 means; an OA21D4 means; an OA22D1 means; an OA22D2 means; an OA22D4 means; an OA211D1 means; an OA211D2 means; an OA211D4 means; an OAI21D1 means; an OAI21D2 means; an OAI21D3 means; an OAI21D4 means; an OAI21D6 means; an OAI21XD1 means; an OAI21XD2 means; an OAI21XD4 means; an OAI22D1 means; an OAI22D2 means; an OAI22D3 means; an OAI22D4 means; an OAI22D6 means; an OAI31D1 means; an OA131D2 means; an OA131D3 means; an OA131D4 means; an OA131D6 means; an OA132D1 means; an OAI32D2 means; an OAI32D3 means; an OAI32D4 means; an OAI32D6 means; an OAI211D1 means; an OAI211D2 means; an OAI211D3 means; an OAI211D4 means; an OAI211D6 means; an OAI221D1 means; an OAI221D2 means; an OAI221D3 means; an OAI221D4 means; an OAI221D6 means; an OAI222D1 means; an OAI222D2 means; an OAI222D3 means; an OAI222D4 means; an OAI222D6 means; an OAOI211D1 means; an OAOI211D2 means; an OAOI211D3 means; an OAOI211D4 means; an OAOI211D6 means; an OR2D1 means; an OR2D2 means; an OR2D3 means; an OR2D4 means; an OR2D8 means; an OR2D10 means; an OR2XD2 means; an OR3D1 means; an OR3D2 means; an OR3D4 means; an OR3D8 means; an OR3XD2 means; an OR4D1 means; an OR4D2 means; an OR4D4 means; an OR4D8 means; an OR4XD2 means; a SDFCSND1 means; a SDFCSND2 means; a SDFCSND4 means; a SDFD1 means; a SDFD2 means; a SDFD4 means; a SDFQD1 means; a SDFQD2 means; a SDFQD4 means; a SEDFCND1 means; a SEDFCND2 means; a SEDFQD1 means; a SEDFQD2 means; a SEDFQD4 means; an XNR2D1 means; an XNR2D2 means; an XNR2D4 means; an XNR2HDD1 means; an XNR2HDD2 means; an XNR3D1 means; an XNR3D2 means; an XOR2D1 means; an XOR2D2 means; an XOR2D4 means; an XOR2HDD1 means; an XOR2HDD2 means; an XOR3D1 means; and, an XOR3D2 means.

13. A product integrated circuit as defined in claim 12, wherein said product IC includes at least twenty distinct means selected from the set consisting of: an AN2D1 means; an AN2D2 means; an AN2D3 means; an AN2D4 means; an AN2D8 means; an AN2D10 means; an AN2XD2 means; an AN3D1 means; an AN3D2 means; an AN3D4 means; an AN3D8 means; an AN3XD2 means; an AN4D1 means; an AN4D2 means; an AN4D4 means; an AN4D8 means; an AN4XD2 means; an ND2D1 means; an ND2D2 means; an ND2D3 means; an ND2D4 means; an ND2D8 means; an ND3D1 means; an ND3D2 means; an ND3D3 means; an ND3D4 means; an ND3D8 means; an ND4D1 means; an ND4D2 means; an ND4D3 means; an ND4D4 means; an ND4D8 means; an NR2D1 means; an NR2D2 means; an NR2D3 means; an NR2D4 means; an NR2D8 means; an NR3D1 means; an NR3D2 means; an NR3D3 means; an NR3D4 means; an NR3D8 means; an NR4D1 means; an NR4D2 means; an NR4D3 means; an NR4D4 means; an NR4D8 means; an OR2D1 means; an OR2D2 means; an OR2D3 means; an OR2D4 means; an OR2D8 means; an OR2D10 means; an OR2XD2 means; an OR3D1 means; an OR3D2 means; an OR3D4 means; an OR3D8 means; an OR3XD2 means; an OR4D1 means; an OR4D2 means; an OR4D4 means; an OR4D8 means; an OR4XD2 means; an XNR2D1 means; an XNR2D2 means; an XNR2D4 means; an XNR2HDD1 means; an XNR2HDD2 means; an XNR3D1 means; an XNR3D2 means; an XOR2D1 means; an XOR2D2 means; an XOR2D4 means; an XOR2HDD1 means; an XOR2HDD2 means; an XOR3D1 means; and, an XOR3D2 means.

14. A product integrated circuit as defined in claim 12, wherein said product IC includes at least fifteen distinct means selected from the set consisting of: an AO21D1 means; an AO21D2 means; an AO21D4 means; an AO22D1 means; an AO22D2 means; an AO22D4 means; an AO31D1 means; an AO31D2 means; an AO31D4 means; an AO211D1 means; an AO211D2 means; an AO211D4 means; an AO222D1 means; an AO222D2 means; an AO222D4 means; an AOAI211D1 means; an AOAI211D2 means; an AOAI211D3 means; an AOAI211D4 means; an AOAI211D6 means; an AOI21D1 means; an AOI21D2 means; an AOI21D3 means; an AOI21D4 means; an AOI21D6 means; an AOI21XD2 means; an AOI21XD4 means; an AOI22D1 means; an AOI22D2 means; an AOI22D3 means; an AOI22D4 means; an AOI22D6 means; an AOI22XD1 means; an AO122XD2 means; an AO122XD4 means; an AOI31D1 means; an AOI31D2 means; an AOI31D3 means; an AOI31D4 means; an AOI31D6 means; an AOI32D1 means; an AOI32D2 means; an AOI32D3 means; an AOI32D4 means; an AOI32D6 means; an AOI211D1 means; an AOI211D2 means; an AOI211D3 means; an AOI211D4 means; an AOI211D6 means; an AOI211XD1 means; an AOI211XD2 means; an AOI211XD4 means; an AOI221D1 means; an AOI221 D2 means; an AOI221 D3 means; an AOI221 D4 means; an AOI221 D6 means; an AOI222D1 means; an AOI222D2 means; an AOI222D3 means; an AOI222D4 means; an AOI222D6 means; an AOI222XD1 means; an AOI222XD2 means; an AOI222XD4 means; a FA1D1 means; a FA1D2 means; a FA1HDD1 means; a FA1HSD1 means; a FICOND1 means; FILL1 means; a HA1D1 means; a HA1D2 means; an IAO21D1 means; an IAO21D2 means; an IAO21D4 means; an IAO21D6 means; an IAO22D1 means; an IAO22D2 means; an IAO22D4 means; an IAO22D6; an IAOI21D1 means; an IAOI21D2 means; an IAOI21D4 means; an IAOI21D6 means; an IAOI211D1 means; an IAOI211D2 means; an IAOI211D4 means; an IAOI211D6 means; an IIAOI21D1 means; an IIAOI21D2 means; an IIAOI21D4 means; an IIAOI21D6 means; an IIND3D1 means; an IIND3D2 means; an IIND3D4 means; an IIND3D6 means; an IIND4D1 means; an IIND4D2 means; an IIND4D4 means; an IIND4D6 means; an IIOAI21D1 means; an IIOAI21D2 means; an IIOAI21D4 means; an IIOAI21D6 means; an IIOAI22D1 means; an IIOAI22D2 means; an IIOAI22D4 means; an IIOAI22D6 means; an IND2D1 means; an IND2D2 means; an IND2D4 means; an IND2D6 means; an IND2XD1 means; an IND2XD2 means; an IND2XD4 means; an IND3D1 means; an IND3D2 means; an IND3D4 means; an IND3D6 means; an IND4D1 means; an IND4D2 means; an IND4D4 means; an IND4D6 means; an INR2D1 means; an INR2D2 means; an INR2D4 means; an INR2D6 means; an INR2XD1 means; an INR2XD2 means; an INR2XD4 means; an INR3D1 means; an INR3D2 means; an INR3D4 means; an INR3D6 means; an INR4D1 means; an INR4D2 means; an INR4D4 means; an INR4D6 means; an OA21D1 means; an OA21D2 means; an OA21D4 means; an OA22D1 means; an OA22D2 means; an OA22D4 means; an OA211D1 means; an OA211 D2 means; an OA211 D4 means; an OAI21D1 means; an OAI21D2 means; an OAI21D3 means; an OAI21D4 means; an OAI21D6 means; an OAI21XD1 means; an OAI21XD2 means; an OAI21XD4 means; an OAI22D1 means; an OAI22D2 means; an OAI22D3 means; an OAI22D4 means; an OAI22D6 means; an OAI31D1 means; an OA131D2 means; an OA131D3 means; an OA131D4 means; an OA131D6 means; an OA132D1 means; an OA132D2 means; an OA132D3 means; an OA132D4 means; an OA132D6 means; an OAI211D1 means; an OAI211D2 means; an OAI211D3 means; an OAI211D4 means; an OAI211D6 means; an OAI221D1 means; an OAI221D2 means; an OAI221D3 means; an OAI221D4 means; an OAI221D6 means; an OAI222D1 means; an OAI222D2 means; an OAI222D3 means; an OAI222D4 means; an OAI222D6 means; an OAOI211D1 means; an OAOI211D2 means; an OAOI211D3 means; an OAOI211D4 means; an OAOI211D6 means; an IOA21D1 means; an IOA21D2 means; an IOA21D4 means; an IOA21D6 means; an IOA22D1 means; an IOA22D2 means; an IOA22D4 means; an IOA22D6 means; an IOAI21D1 means; an IOAI21D2 means; an IOAI21D4 means; an IOAI21D6 means; an IOAI211D1 means; an IOAI211D2 means; an IOAI211D4 means; an IOAI211D6 means; an LHD1 means; an LHD2 means; an LND1 means; an LND2 means; an MAOI22D1 means; an MAOI22D2 means; MAOI22D4 means; MAOI22D6 means; an MAOI222D1 means; an MAOI222D2 means; an MAOI222D3 means; an MAOI222D4 means; an MAOI222D6 means; an MOAI22D1 means; an MOAI22D2 means; an MOAI22D4 means; and, an MOAI22D6 means.

15. A product integrated circuit as defined in claim 12, wherein said product IC includes at least ten distinct means selected from the set consisting of: a BUFFD1 means; a BUFFD2 means; a BUFFD3 means; a BUFFD4 means; a BUFFD5 means; a BUFFD6 means; a BUFFD7 means; a BUFFD8 means; a BUFFD9 means; a BUFFD10 means; a BUFFD12 means; a BUFFD14 means; a BUFFD16 means; a BUFFD20 means; a BUFFD24 means; a BUFFXD3 means; a BUFFXD6 means; a BUFFXD9 means; a BUFFXXD2 means; a BUFFXXD4 means; a BUFFXXD6 means; an INVD1 means; an INVD2 means; an INVD3 means; an INVD4 means; an INVD5 means; an INVD6 means; an INVD7 means; an INVD8 means; an INVD10 means; an INVD12 means; an INVD14 means; and, an INVD16 means.

16. A product integrated circuit as defined in claim 12, wherein said product IC includes at least ten distinct means selected from the set consisting of: a CKAN2D0P5 means; a CKAN2D1 means; a CKAN2D1P5 means; a CKAN2D2 means; a CKAN2D2P5 means; a CKAN2D3 means; a CKAN2D3P5 means; a CKAN2D4 means; a CKAN2D4P5 means; a CKAN2D5 means; a CKAN2D5P5 means; a CKAN2D6 means; a CKAN2D7 means; a CKAN2D8 means; a CKAN2D9 means; a CKAN2D10 means; a CKBD0P5 means; a CKBD1 means; a CKBD1P5 means; a CKBD2 means; a CKBD2P5 means; a CKBD3 means; a CKBD3P5 means; a CKBD4 means; a CKBD4P5 means; a CKBD5 means; a CKBD5P5 means; a CKBD6 means; a CKBD7 means; a CKBD8 means; a CKBD9 means; a CKBD10 means; a CKBD11 means; a CKBD12 means; a CKBD14 means; a CKBD16 means; a CKBD20 means; a CKBD24 means; a CKBD32 means; a CKLNQD1 means; a CKLNQD2 means; a CKLNQD4 means; a CKLNQD6 means; a CKLNQD8 means; a CKLNQD12 means; a CKLNQD16 means; a CKMUX2D1 means; a CKMUX2D2 means; a CKMUX2D4 means; a CKND0P5 means; a CKND1 means; a CKND1P5 means; a CKND2 means; a CKND2D0P5 means; a CKND2D1 means; a CKND2D1P5 means; a CKND2D2 means; a CKND2D2P5 means; a CKND2D3 means; a CKND2D3P5 means; a CKND2D4 means; a CKND2D4P5 means; a CKND2D5 means; a CKND2D5P5 means; a CKND2D6 means; a CKND2D7 means; a CKND2D8 means; a CKND2D9 means; a CKND2D10 means; a CKND2P5 means; a CKND3 means; a CKND3P5 means; a CKND4 means; a CKND4P5 means; a CKND5 means; a CKND5P5 means; a CKND6 means; a CKND7 means; a CKND8 means; a CKND9 means; a CKND10 means; a CKND11 means; a CKND12 means; a CKND14 means; a CKND16 means; a CKND20 means; a CKND24 means; a CKNR2D1 means; a CKNR2D2 means; a CKNR2D3 means; a CKNR2D4 means; a CKNR2D6 means; a CKNR2D8 means; a CKNR2D10 means; a CKOR2D1 means; a CKOR2D2 means; a CKOR2D3 means; a CKOR2D4 means; a CKOR2D6 means; a CKOR2D8 means; and, a CKOR2D10 means.

17. A product integrated circuit as defined in claim 12, wherein said product IC includes at least five distinct means selected from the set consisting of: a DEL010D1 means; a DEL020D1 means; a DEL030D1 means; a DEL040D1 means; a DEL060D1 means; a DEL100D1 means; a DEL200D1 means; a DFCSND1 means; a DFCSND2 means; a DFCSND4 means; a DFD1 means; a DFD2 means; a DFD4 means; a DFNCSND1 means; a DFNCSND2 means; a DFNCSND4 means; a DFQD1 means; a DFQD2 means; a DFQD4 means; an EDFCND1 means; a SDFCSND1 means; a SDFCSND2 means; a SDFCSND4 means; a SDFD1 means; a SDFD2 means; a SDFD4 means; a SDFQD1 means; a SDFQD2 means; a SDFQD4 means; a SEDFCND1 means; a SEDFCND2 means; a SEDFQD1 means; a SEDFQD2 means; and, a SEDFQD4 means.

18. A product integrated circuit as defined in claim 12, wherein said product IC includes at least four distinct means selected from the set consisting of: a MUX2D1 means; a MUX2D2 means; a MUX2D4 means; a MUX2HDD1 means; a MUX2HDD2 means; a MUX2ND1 means; a MUX2ND2 means; a MUX2ND4 means; a MUX2NHDD1 means; a MUX2NHDD2 means; a MUX3D1 means; a MUX3D2 means; a MUX3D4 means; a MUX4D1 means; a MUX4D2 means; a MUX4D4 means; a MUX4ND1 means; a MUX4ND2 means; and, a MUX4ND4 cell.

* * * * *